US012448406B2

(12) United States Patent
Li et al.

(10) Patent No.: US 12,448,406 B2
(45) Date of Patent: Oct. 21, 2025

(54) FUSED RING CARBAZOLE TETRADENTATE METAL PLATINUM (II) COMPLEX AND USE THEREOF

(71) Applicants: ZHEJIANG UNIVERSITY OF TECHNOLOGY, Hangzhou (CN); ZHEJIANG HUAXIAN PHOTOELECTRICITY TECHNOLOGY CO., LTD, Jiaxing (CN)

(72) Inventors: Guijie Li, Hangzhou (CN); Qingshan Chu, Hangzhou (CN); Yuanbin She, Hangzhou (CN); Jieying Tong, Hangzhou (CN); Yunqi Lu, Hangzhou (CN); Xiaoyu Zhao, Jiaxing (CN)

(73) Assignee: ZHEJIANG UNIVERSITY OF TECHNOLOGY, Hangzhou (CN)

(*) Notice: Subject to any disclaimer, the term of this patent is extended or adjusted under 35 U.S.C. 154(b) by 0 days.

(21) Appl. No.: 18/792,957

(22) Filed: Aug. 2, 2024

(65) Prior Publication Data

US 2025/0059223 A1 Feb. 20, 2025

(30) Foreign Application Priority Data

Aug. 3, 2023 (CN) ........................ 202310972976.4

(51) Int. Cl.

| | |
|---|---|
| ***C07F 15/00*** | (2006.01) |
| ***C07B 59/00*** | (2006.01) |
| ***C09K 11/06*** | (2006.01) |
| ***H10K 85/30*** | (2023.01) |
| ***H10K 85/40*** | (2023.01) |
| ***H10K 85/60*** | (2023.01) |

(52) U.S. Cl.

CPC ........ *C07F 15/0086* (2013.01); *C07B 59/004* (2013.01); *C09K 11/06* (2013.01); *H10K 85/346* (2023.02); *H10K 85/40* (2023.02); *H10K 85/654* (2023.02); *H10K 85/6572* (2023.02); *H10K 85/6574* (2023.02); *H10K 85/6576* (2023.02); *C07B 2200/05* (2013.01)

(58) Field of Classification Search

None

See application file for complete search history.

(56) References Cited

FOREIGN PATENT DOCUMENTS

| | | | |
|---|---|---|---|
| CN | 113292604 | A | 8/2021 |
| CN | 114031643 | A | 2/2022 |
| CN | 115651029 | A | 1/2023 |

*Primary Examiner* — Anthony Ho

(74) *Attorney, Agent, or Firm* — Nitin Kaushik

(57) ABSTRACT

The present invention is in the field of organic electroluminescence, and specifically relates to a fused ring carbazole tetradentate metal platinum (II) complex and use thereof. In the present invention, a tetradentate metal platinum (II) complex phosphorescent material is obtained by introducing a five-membered heterocyclic system such as benzofuran or benzothiophene at the 5, 6-positions of carbazole. Increasing the ratio of the local state (LE) in the excited triplet state of the cyclic tetradentate platinum (II) complex leads to a lower shoulder peak, which improves the luminescence color purity of the materials, which in turn increases device lifetime. The materials provided by the present invention all have good chemical stability and thermal stability and are easy to fabricate an evaporation-type OLED device.

14 Claims, 13 Drawing Sheets

FUSED RING CARBAZOLE TETRADENTATE METAL PLATINUM (II) COMPLEX AND USE THEREOF

CROSS-REFERENCE TO RELATED APPLICATIONS

The application claims priority to Chinese patent application No. 202310972976.4, filed on Aug. 3, 2023, the entire contents of which are incorporated herein by reference.

TECHNICAL FIELD

The present invention is in the field of organic electroluminescence and specifically relates to a fused ring carbazole tetradentate metal platinum (II) complex and use thereof.

BACKGROUND

Organic light emitting diodes (OLED) are a new generation of full-color display and lighting technology. Compared to liquid crystal displays with slow response speed, small viewing angle, the need for backlighting, high energy consumption, and other shortcomings, OLED, as an autonomous light-emitting device, has the following advantages such as no need for backlighting, energy-saving, low drive voltage, fast response speed, high resolution and contrast, wide viewing angle, and outstanding low-temperature performance. OLED devices can be made thinner and can be made into a flexible structure. In addition, it has the advantages of low production cost and a simple production process and allows for large-scale production. Therefore, OLED has a wide and huge application prospect in high-end electronics and aerospace. With the gradual increase of investment, further development, and upgrading of production equipment, OLEDs have a very wide range of application scenarios and prospects in the future.

The core of OLED development is the design and development of light emitting materials. Currently applied OLED devices, the light emitting layer almost all use the host-guest luminescence system mechanism, that is, doping the guest light emitting material in the host. The energy system of the host material is generally larger than that of the guest light emitting material, and the energy will be transferred from the host material to the guest material so that the guest material is excited and emits light. Commonly used organic phosphorescent guest materials are typically heavy metal atoms such as iridium (III), platinum (II), palladium (II), and the like. Commonly used phosphorescent organic materials mCBP (3,3'-bis(9-carbazolyl)-biphenyl) and 2,6-mCPy (2,6-bis(9-carbazolyl)-pyridine) have high efficiency and high triplet energy levels. When they are used as organic materials, triplet energy can be efficiently transferred from the light-emitting organic material to the guest phosphorescent light emitting material. However, due to the easy hole transport and difficult electron flow properties of mCBP and the poor hole transport of 2,6-mCPy, the charge of the light emitting layer is not balanced, and as a result, the current efficiency of the device is reduced. Furthermore, the currently applied heavy metal phosphorescent organic complex molecules are cyclic metallic iridium(III) complex molecules with a limited number. The content of metallic platinum in the earth's crust and the annual production in the world are about ten times that of metallic iridium, and the price of $IrCl_3·H_2O$ used for the preparation of iridium(III) complex phosphorescent materials is much higher than that of $PtCl_2$ used for the preparation of platinum(II) complex phosphorescent materials. In addition, the preparation of iridium(III) complex phosphorescent materials involves a four-step reaction including iridium(III)-containing dimers, iridium(III) intermediate ligand exchange, synthesis of mer-iridium(III) complex, and isomer conversion of mer-to-fac-iridium(III) complex, which greatly reduces the total yield, greatly reduces the utilization of the raw material $IrCl_3·H_2O$, and increases the cost of preparation of iridium(III) complex phosphorescent material. In contrast, the preparation of a platinum (II) complex phosphorescent material has only the last step of metallization of ligands involving the reaction of platinum salts, and the high utilization rate of platinum elements can further reduce the preparation cost of Pt(II) complex phosphorescent materials. In conclusion, the preparation cost of the Pt(II) complex phosphorescent material is much lower than that of the iridium(III) complex phosphorescent material. However, there are still some technical difficulties in the development of platinum complex materials and devices, for example, how to reduce the height of the shoulder peaks in the emission spectrum in order to improve the color purity of the molecular luminescence of the material? This issue is particularly important for blue and deep blue light emitting materials because of their significant impact on the efficiency and energy utilization of top-emitting devices for commercial applications. Therefore, there is a need to develop novel phosphorescent metal platinum (II) complexes.

SUMMARY

In view of the above, it is an object of the present invention to provide a fused ring carbazole tetradentate metal platinum (II) complex and use thereof. The introduction of a five-membered heterocyclic system such as benzofuran or benzothiophene into the 5, 6-position of carbazole in the present invention can increase the ratio of the local state (LE) in the excited triplet state of the cyclic tetradentate platinum (II) complex leads to a lower shoulder peak, which improves the molecular luminescence color purity of the materials. The complex provided can be prepared as an organic electroluminescence device as a light emitting layer so that the device has excellent properties. It can increase the current efficiency of organic electroluminescence devices, improve device life, and also reduce the operating voltage of components.

In order to achieve the technical objectives above, the technical solution of the present invention is as follows.

The present invention provides a fused ring carbazole tetradentate metal platinum (II) complex having the structure shown in formula (I):

(I)

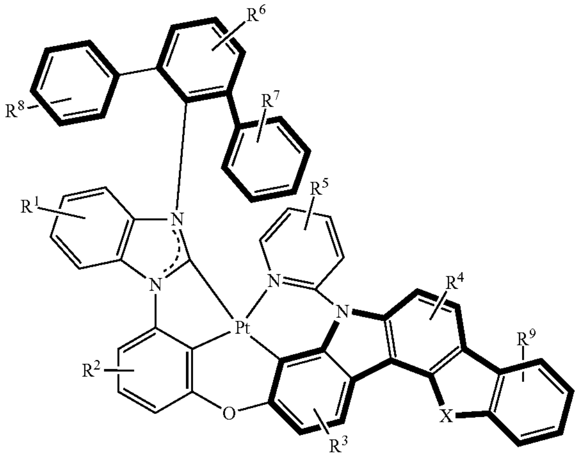

where X is selected from O or S; $R^1$-$R^9$ each independently represent mono- to maximum substitution, or no substitution; $R^1$-$R^9$ are each independently selected from the group consisting of hydrogen, deuterium, halogen, CN, $C_1$-$C_{30}$ alkyl, $C_1$-$C_{30}$ haloalkyl, $C_1$-$C_{30}$ deuterated alkyl, $C_6$-$C_{60}$ aryl, $C_6$-$C_{60}$ arylsilane, and combinations thereof.

Further, $R^1$-$R^9$ are each independently selected from the group consisting of hydrogen, deuterium, $CD_3$, F, $CF_3$, CN, methyl, ethyl, n-propyl, isopropyl, n-butyl, isobutyl, sec-butyl, tert-butyl, n-pentyl, isopentyl, sec-pentyl, tert-pentyl, n-hexyl, isohexyl, sec-hexyl, tert-hexyl, n-heptyl, isoheptyl, sec-heptyl, tert-heptyl, n-octyl, isooctyl, sec-octyl, tert-octyl, n-nonyl, isononyl, sec-nonyl, tert-nonyl, phenyl, biphenyl, triphenylsilane, and combinations thereof.

Further, $R^3$, $R^4$, and $R^9$ are each independently selected from the group consisting of hydrogen, deuterium, F, CN, methyl, tert-butyl, phenyl, and combinations thereof.

Preferably, the fused ring carbazole tetradentate metal platinum (11) complex is selected from any one of the chemical structures shown below: where "D" represents deuterium:

PtO1

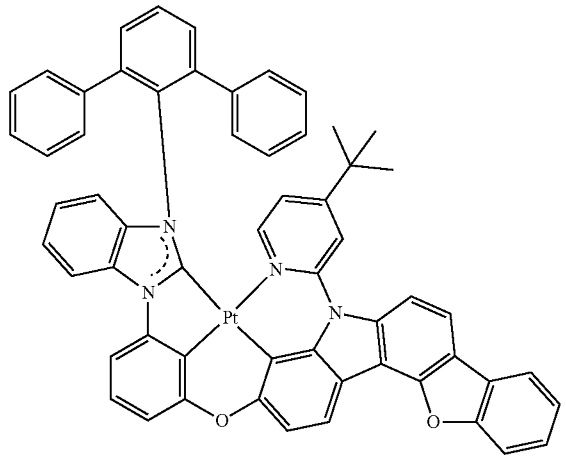

-continued

PtO2

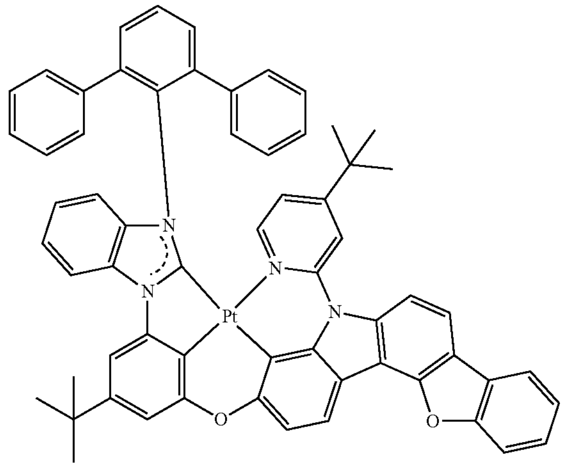

PtO3

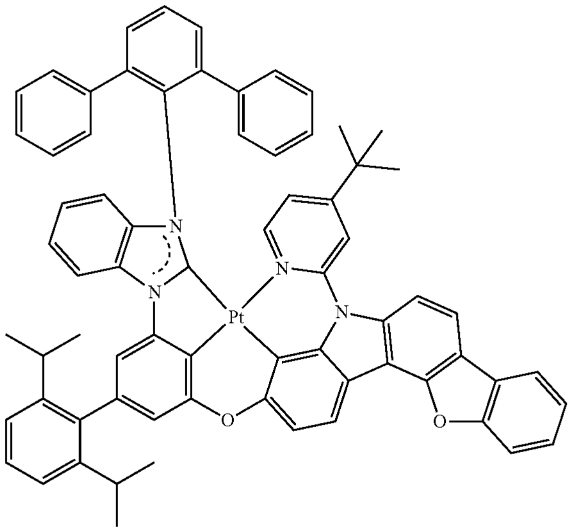

PtO4

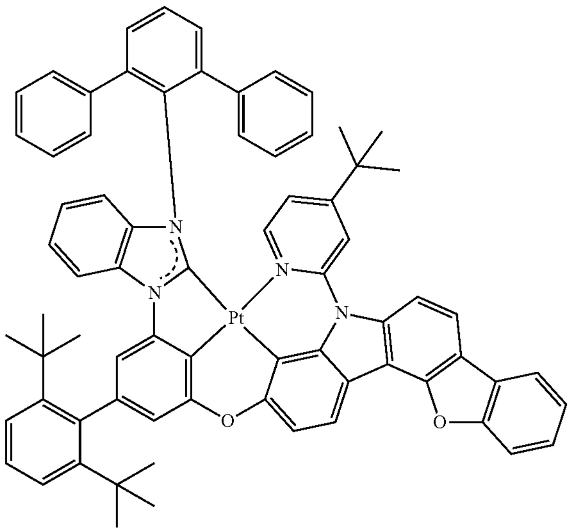

PtO5
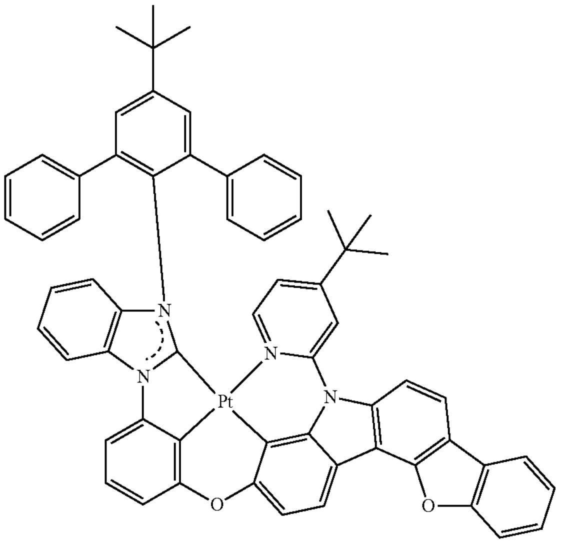
PtO6
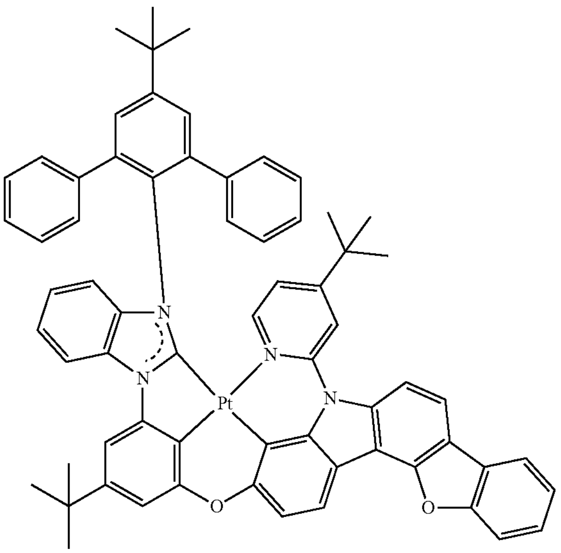
PtO7
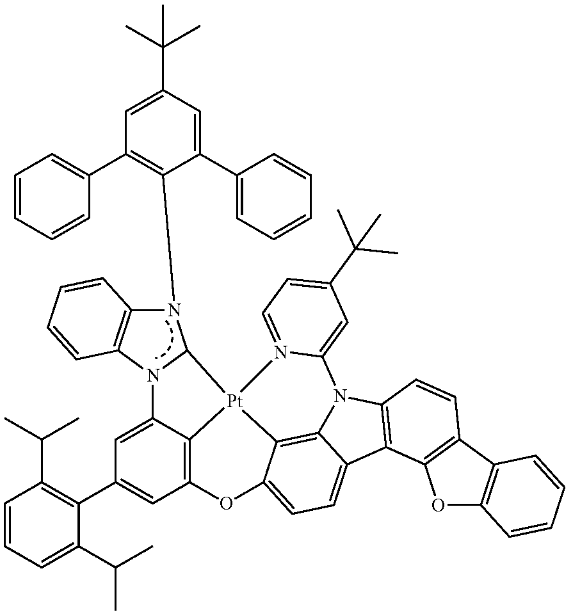
PtO8
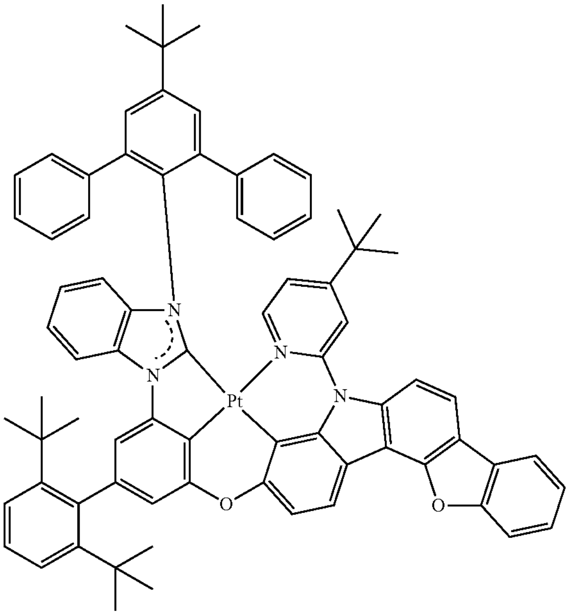

-continued
PtO9
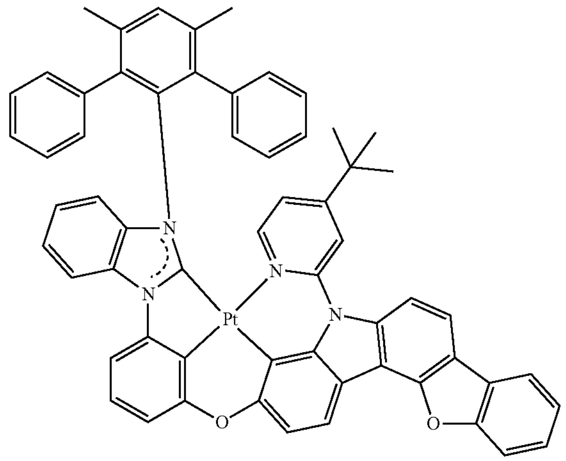
PtO10
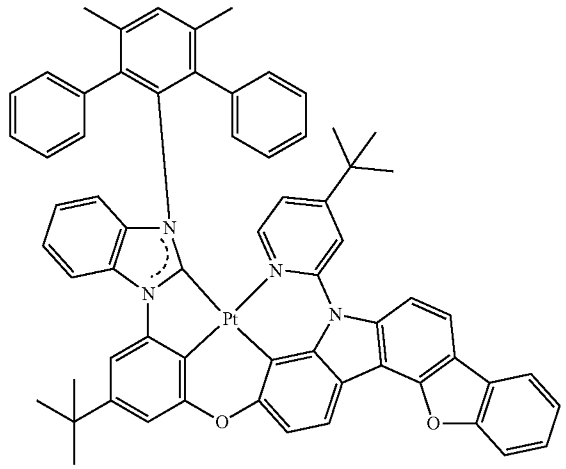
PtO11
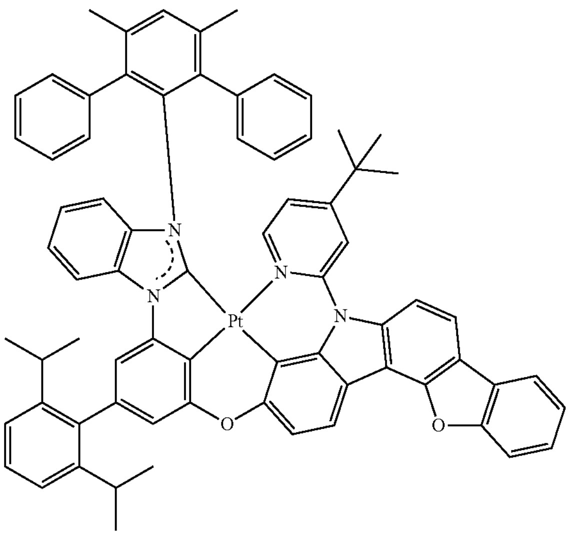
-continued
PtO12
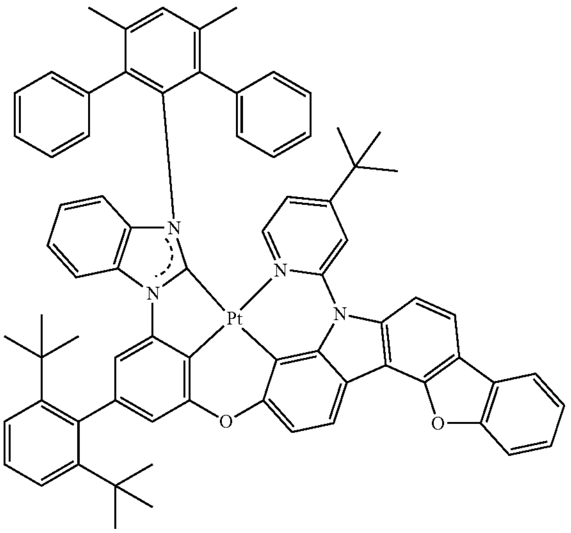
PtO13
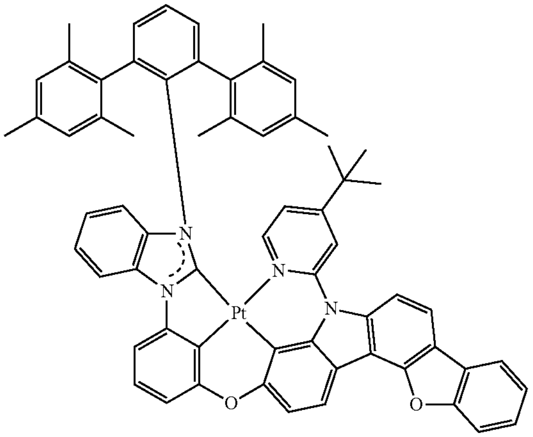
PtO14
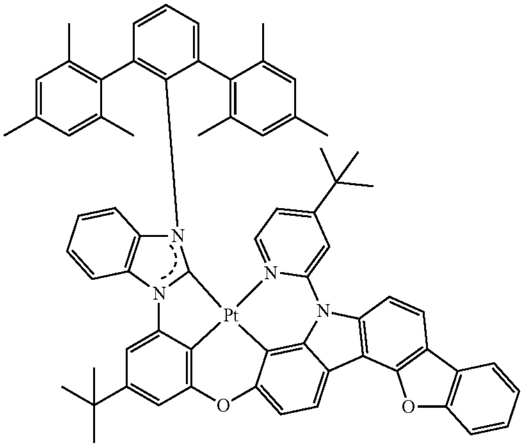

-continued
PtO15
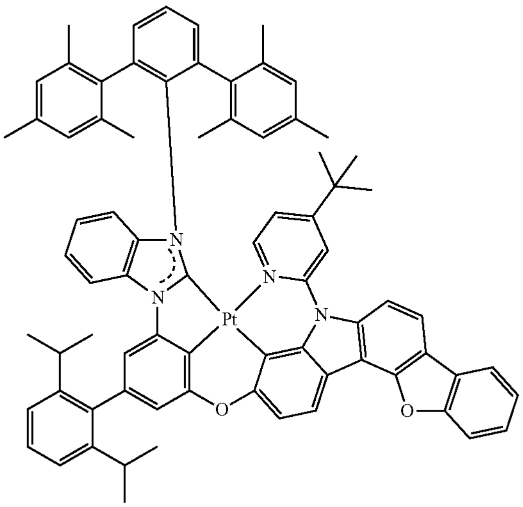
PtO16
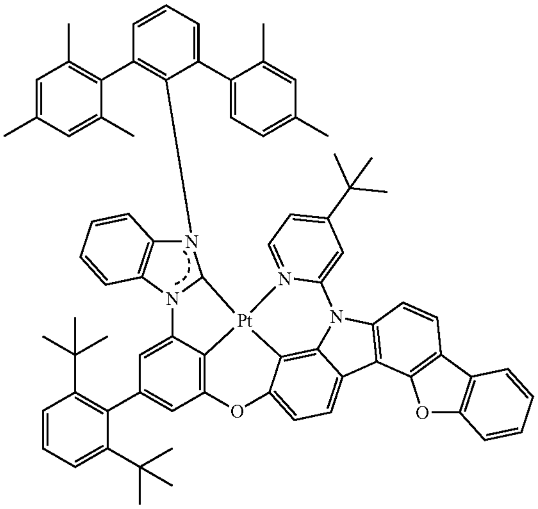
PtO17
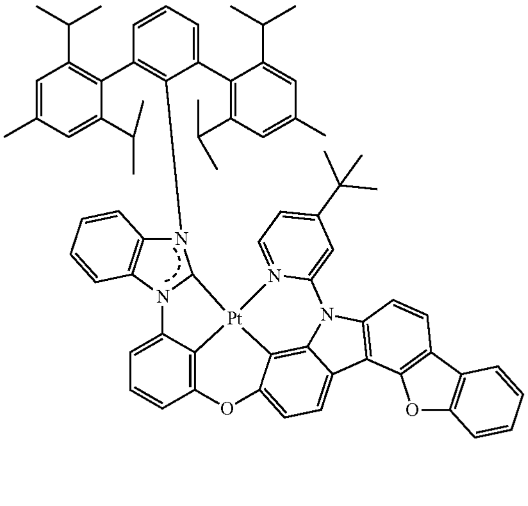
-continued
PtO18
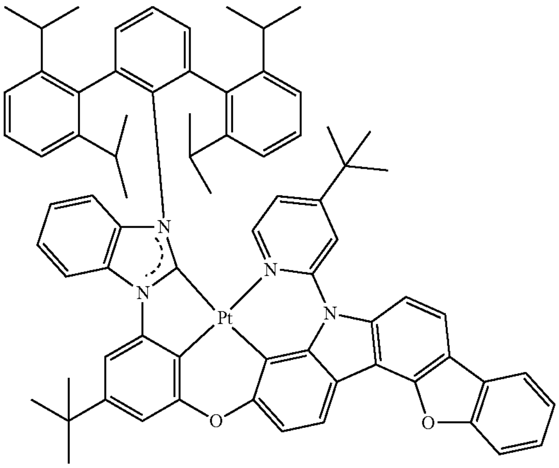
PtO19
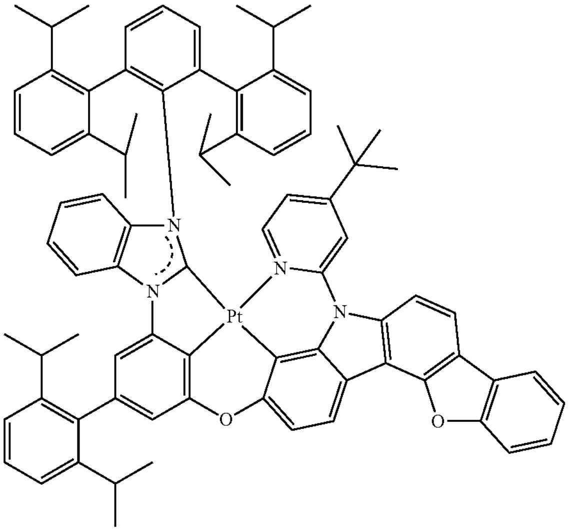
PtO20
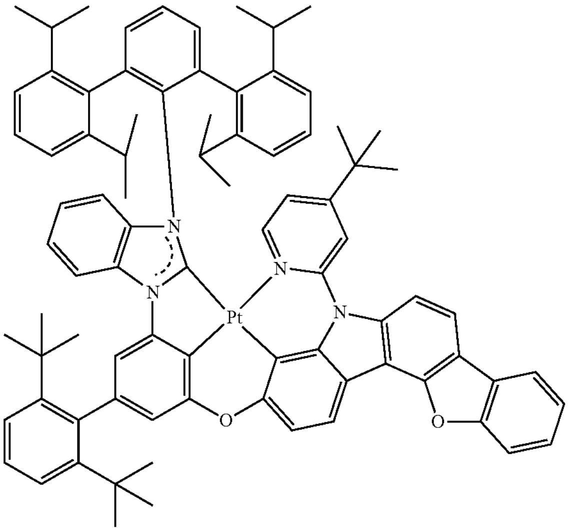

-continued
PtO21
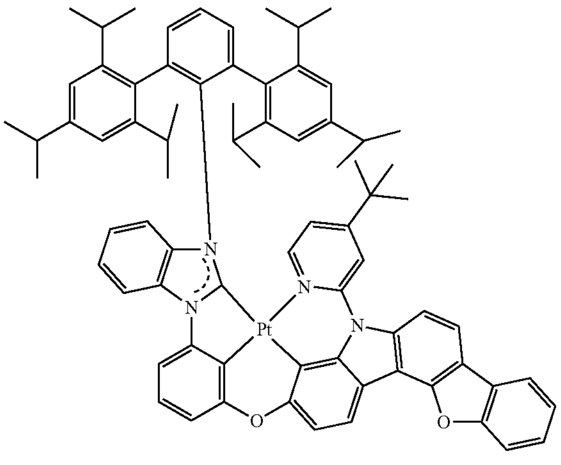
PtO22
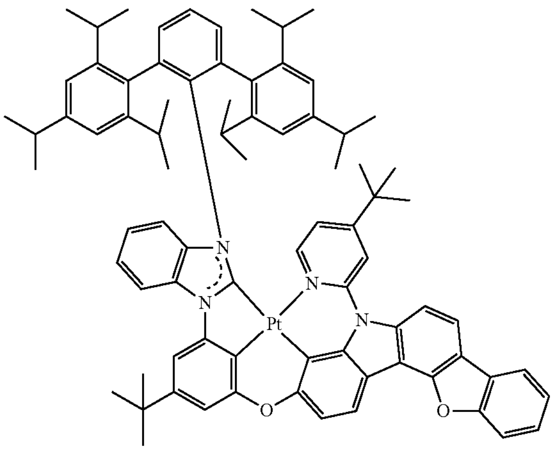
PtO23
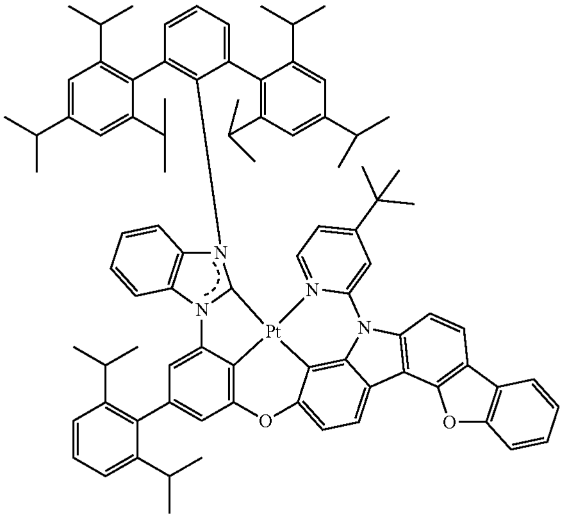
-continued
PtO24
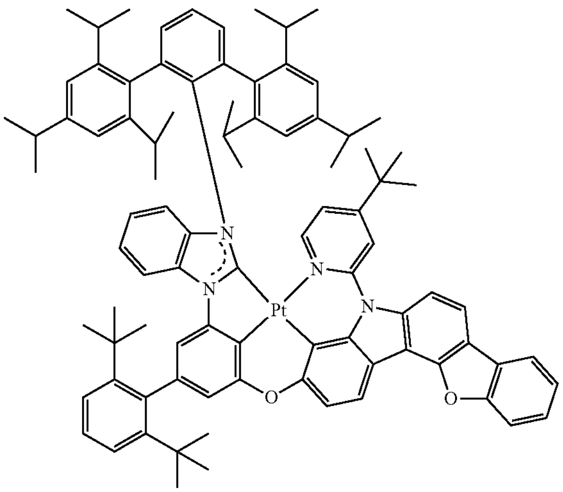
PtO25
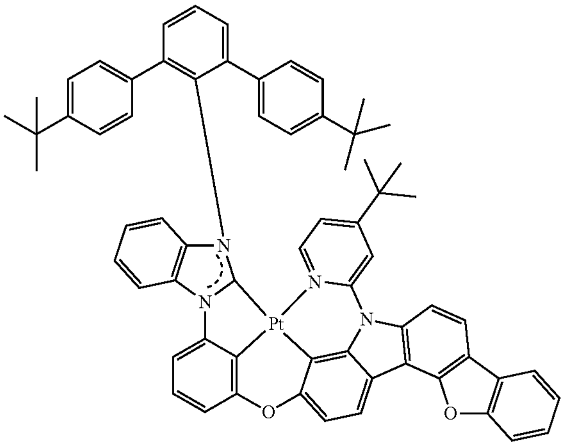
PtO26
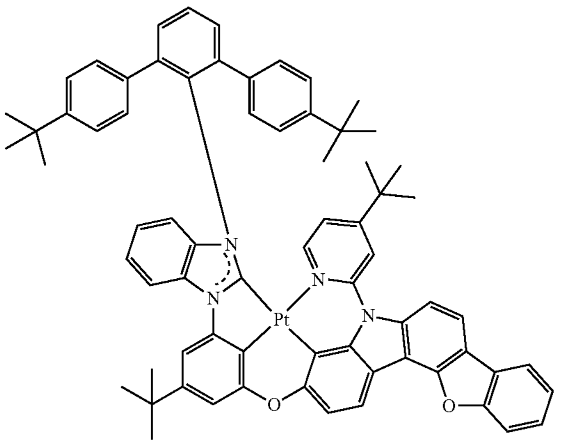

-continued
PtO27
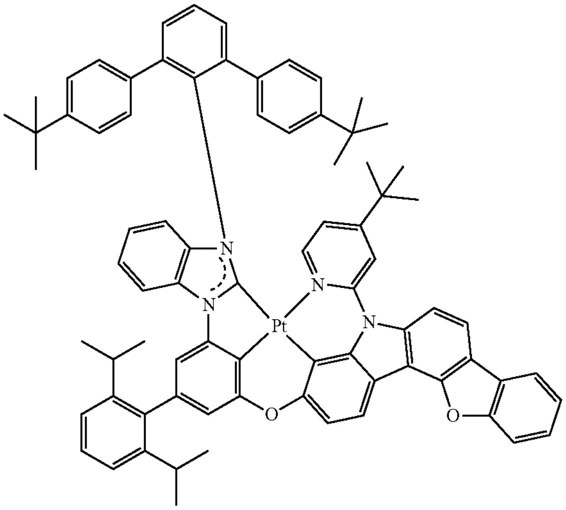
PtO28
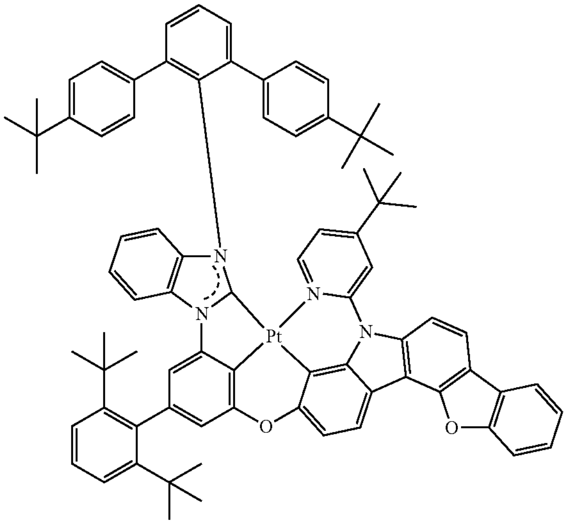
PtO29
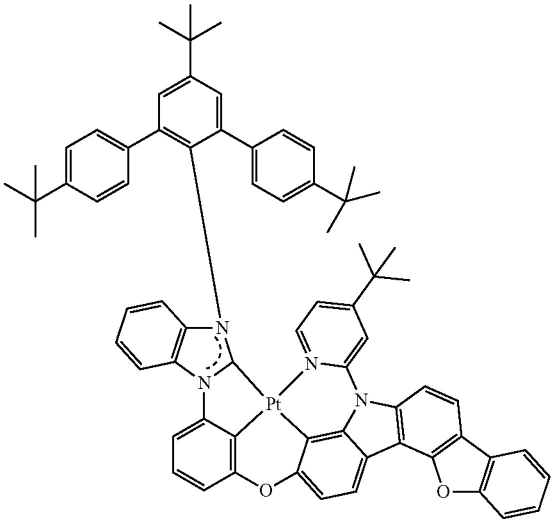
-continued
PtO30
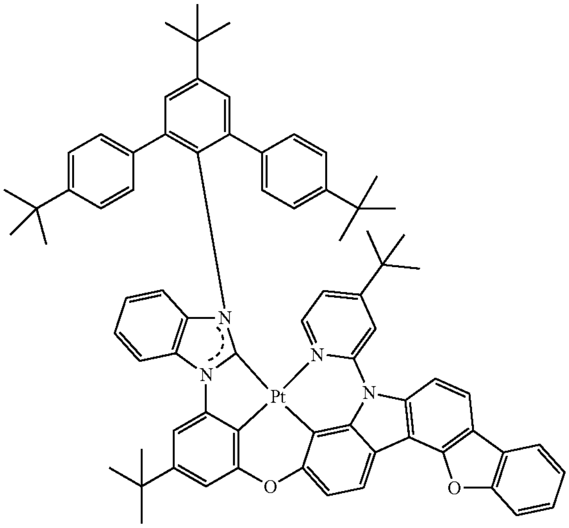
PtO31
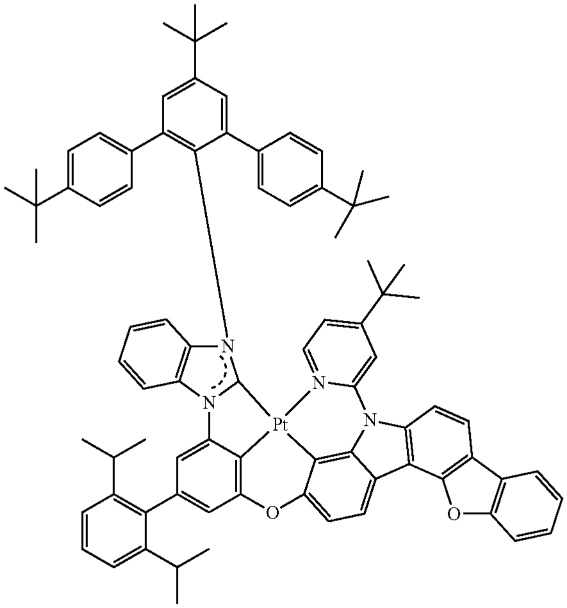

-continued
PtO32
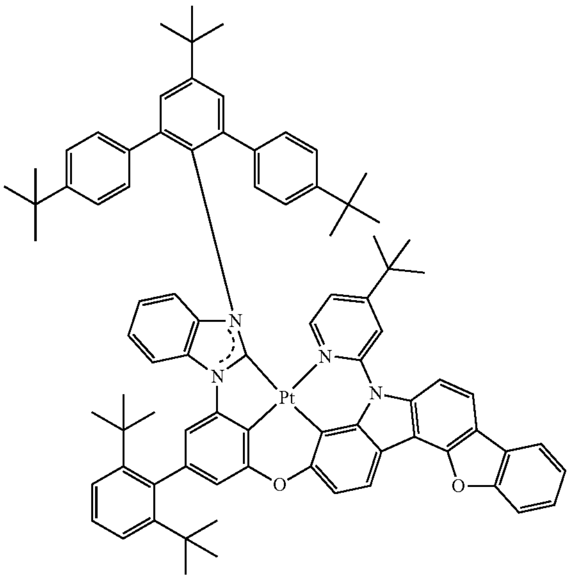
PtO33
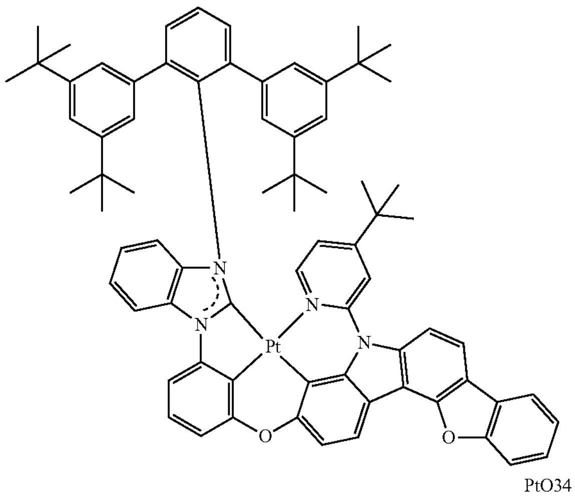
PtO34
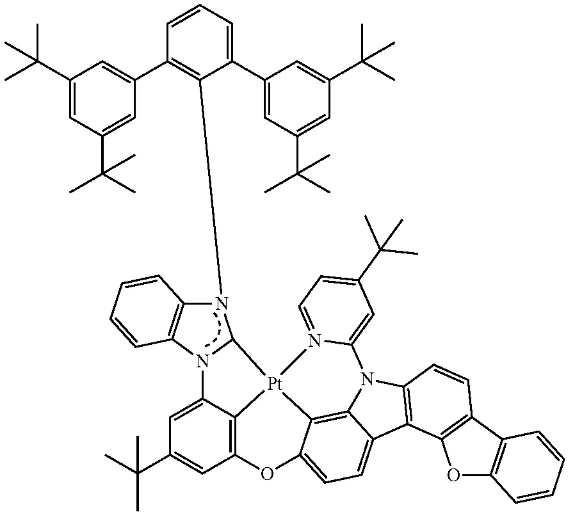
-continued
PtO35
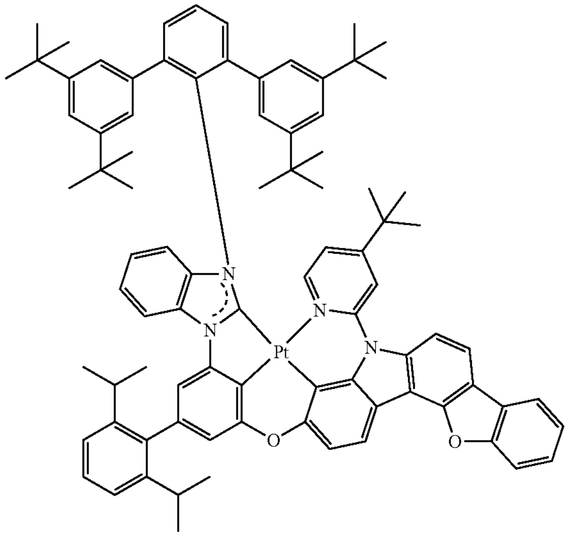
PtO36
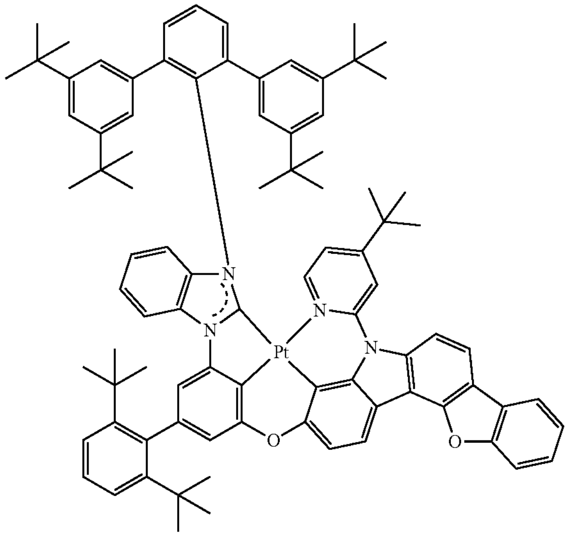
PtO37
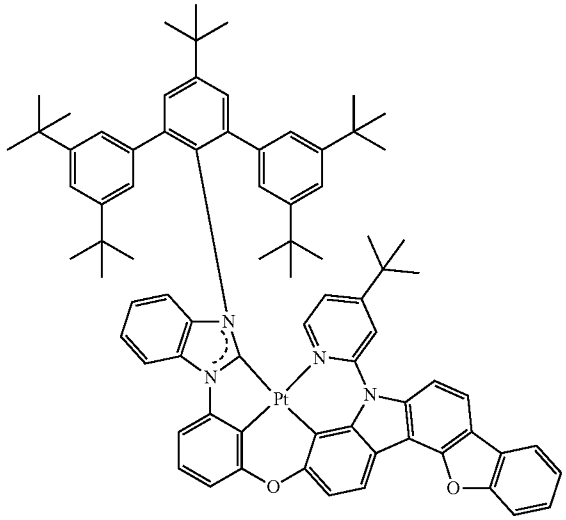

-continued
PtO38
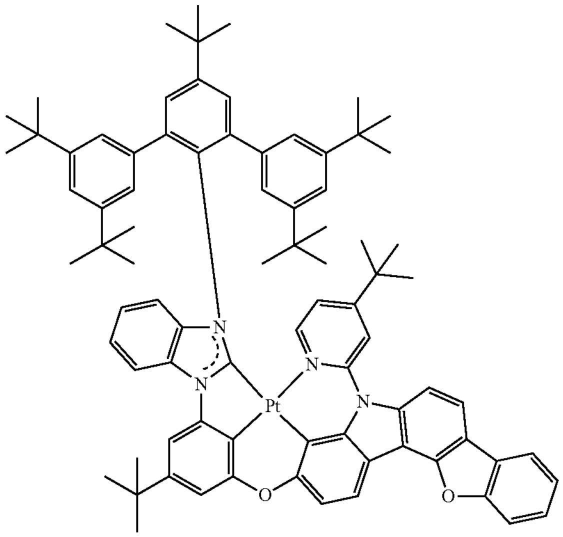
PtO39
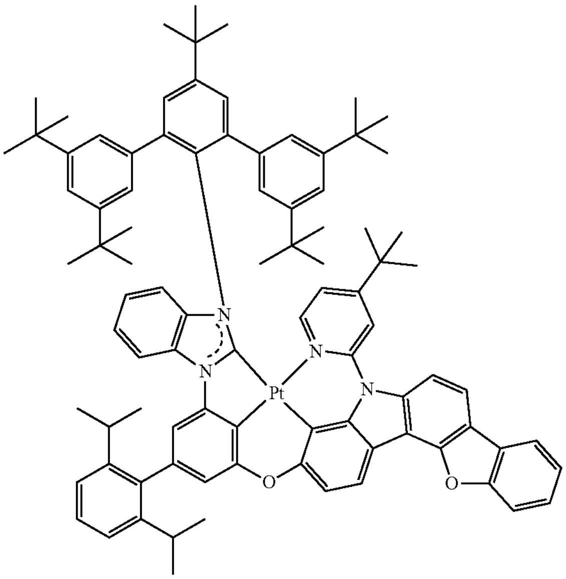
-continued
PtO40
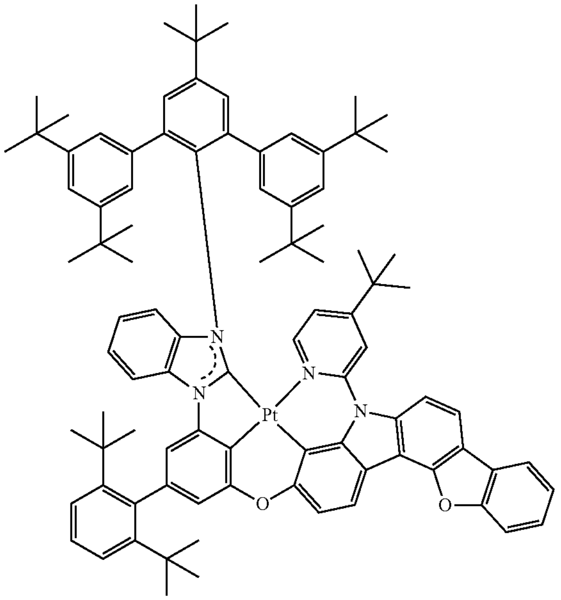
PtO41
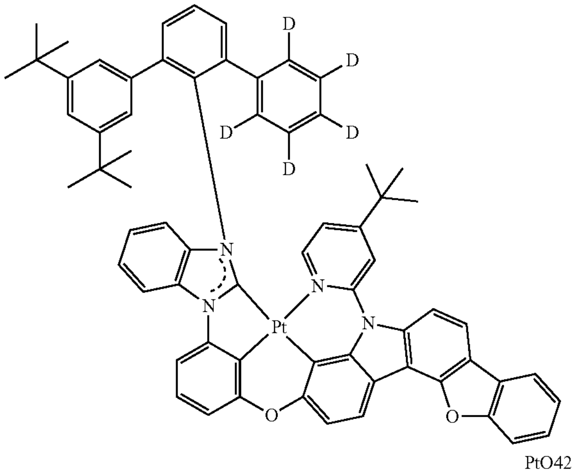
PtO42
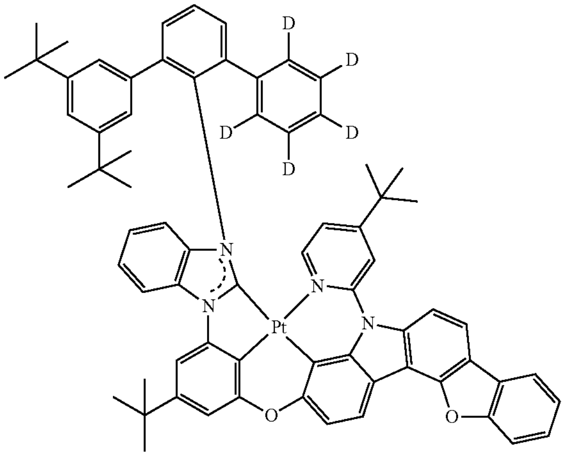

-continued
PtO43
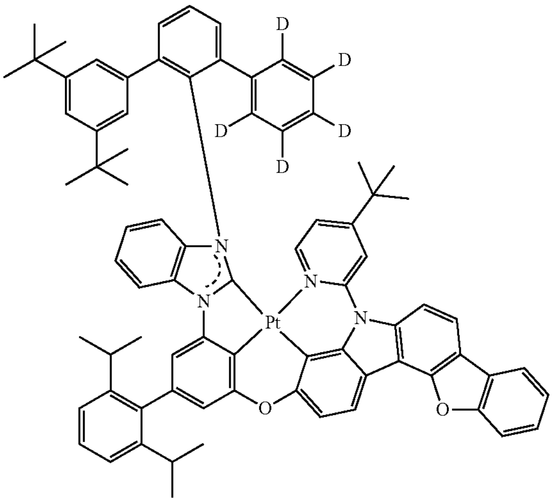
PtO44
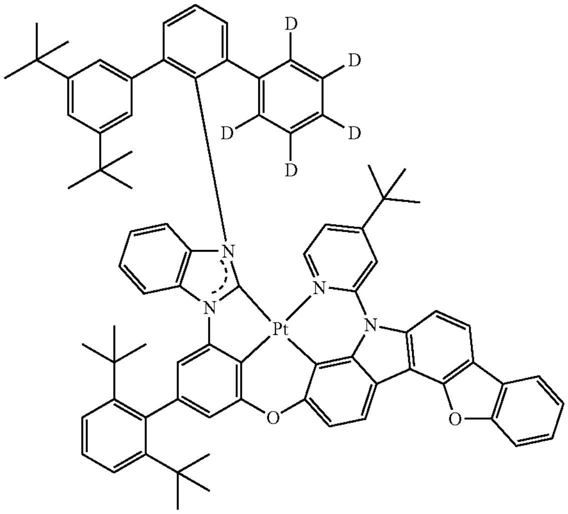
PtO45
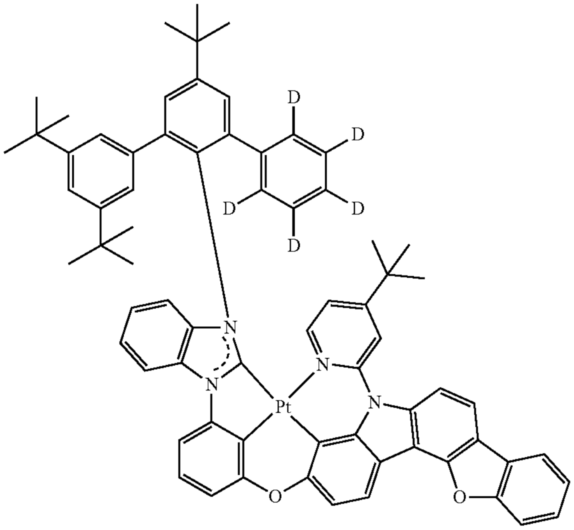
-continued
PtO46
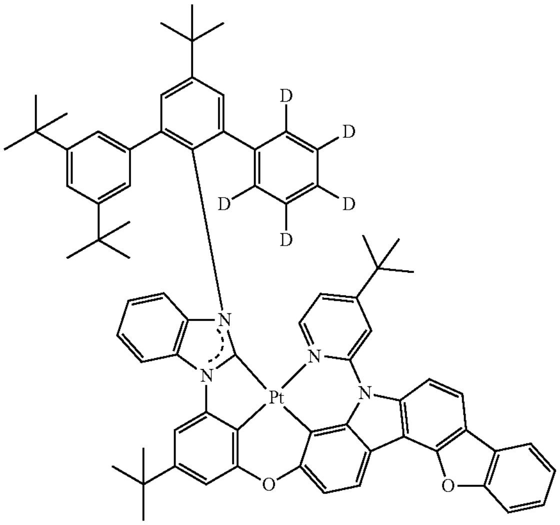
PtO47
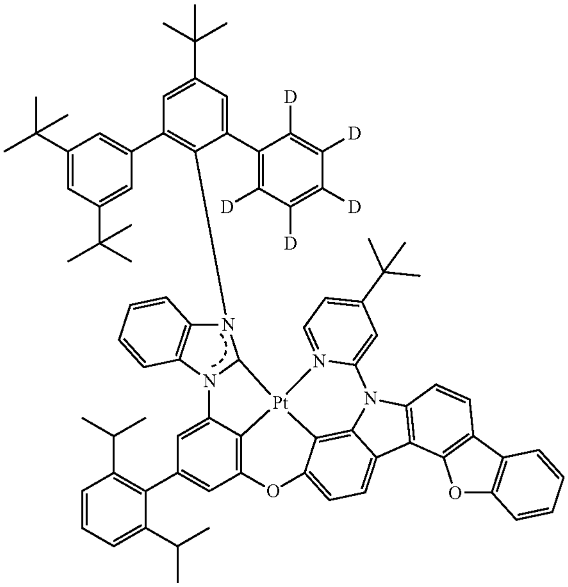

PtO48
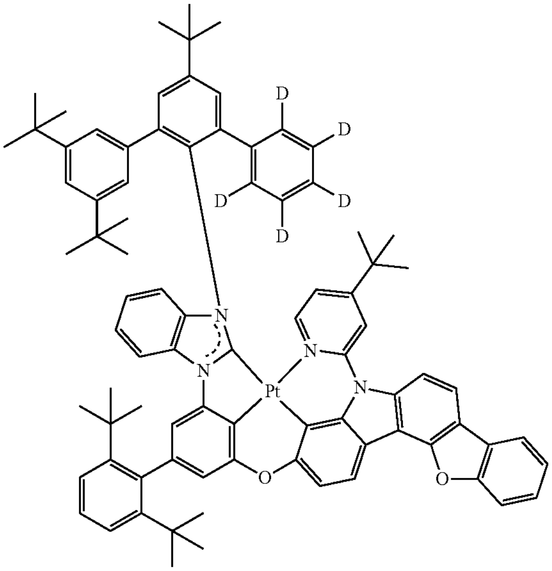
PtO49
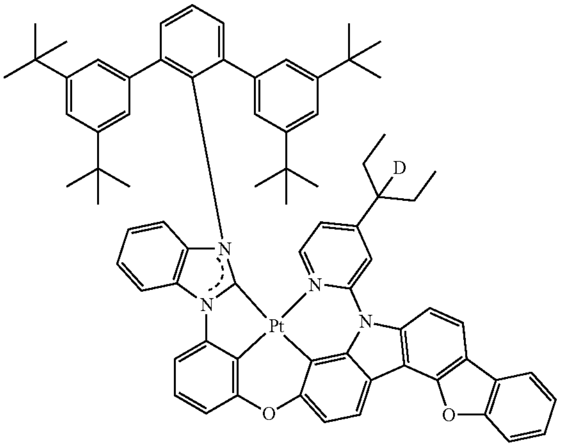
PtO50
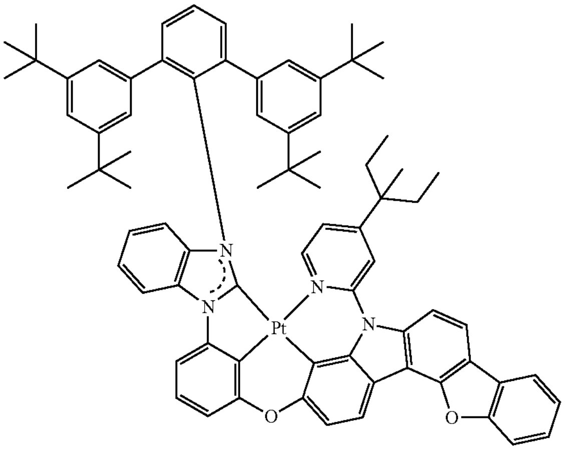
PtO51
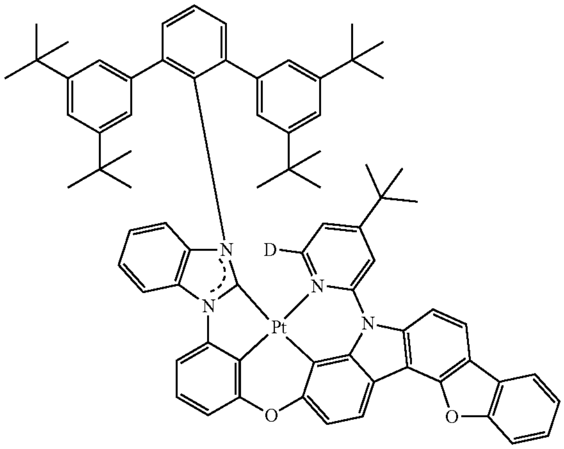
PtO52
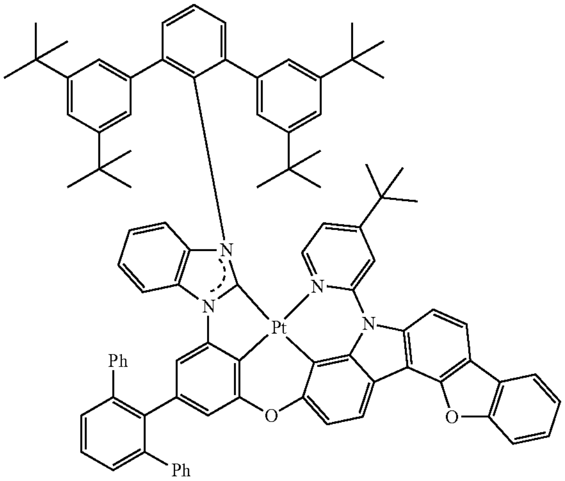
PtO53
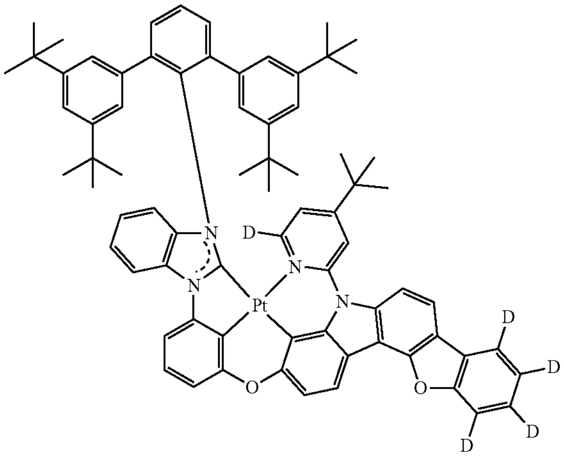

-continued
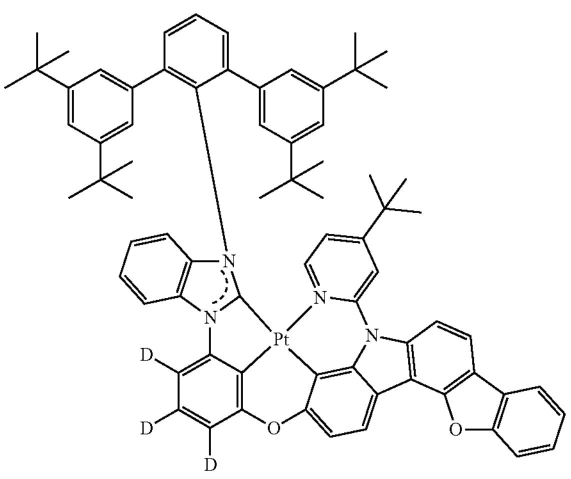
PtO54
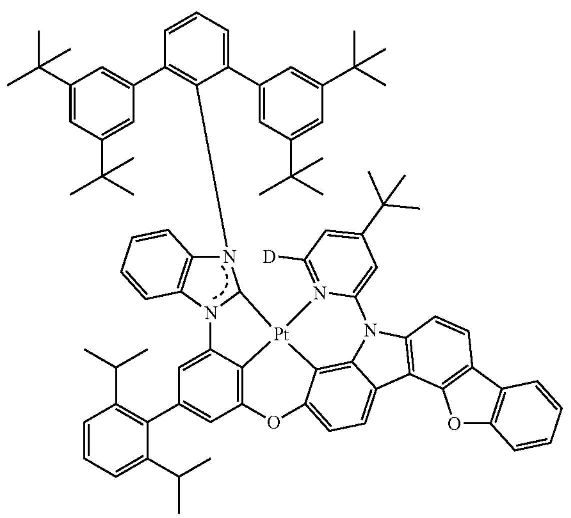
PtO55
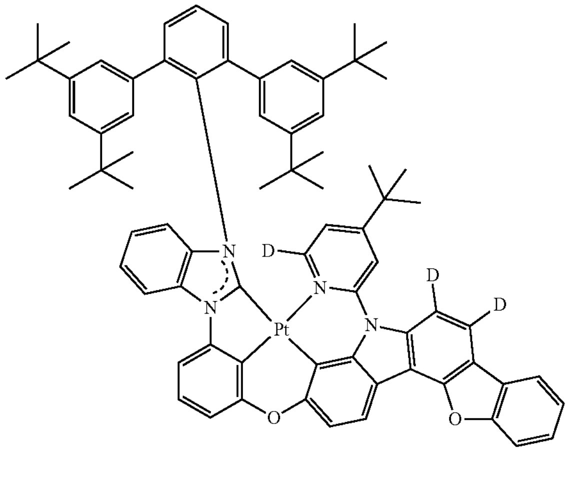
PtO56
-continued
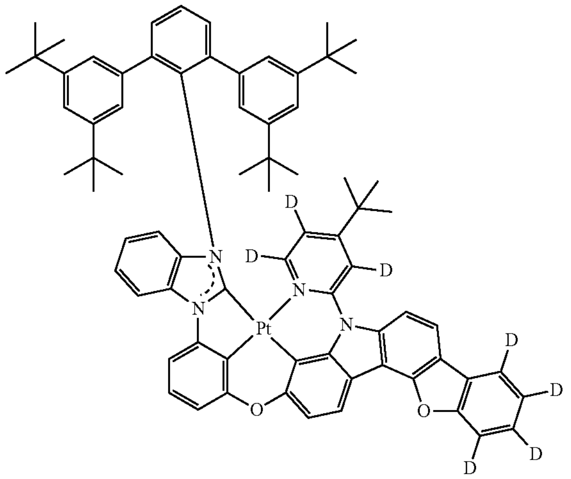
PtO57
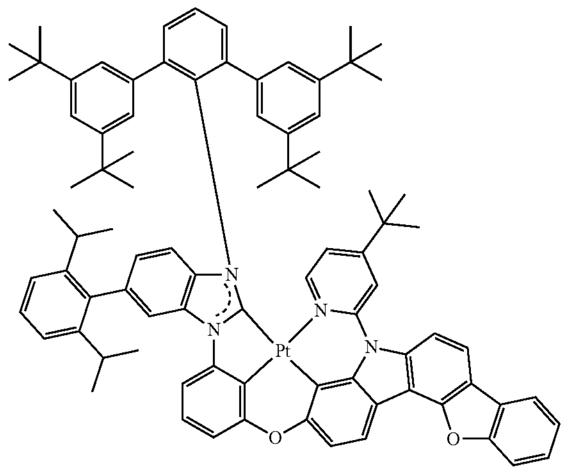
PtO58
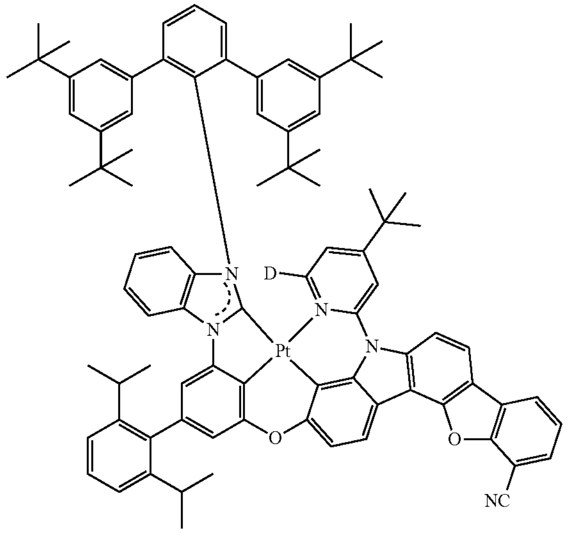
PtO59

-continued
PtO60
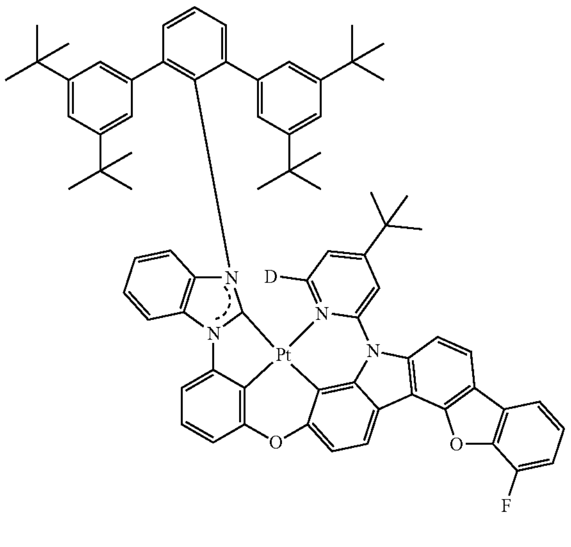
PtO61
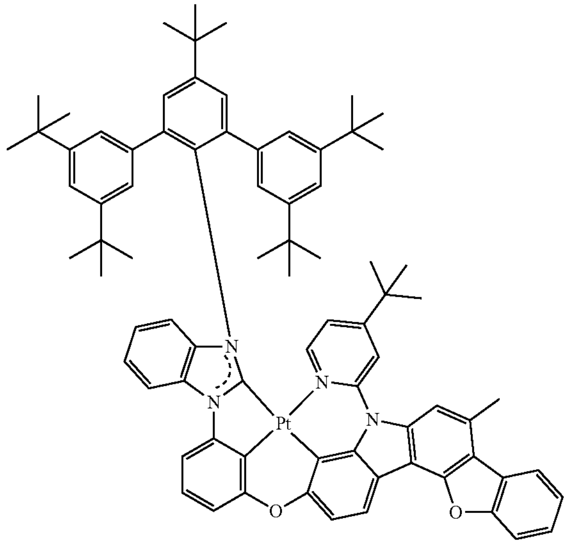
-continued
PtO62
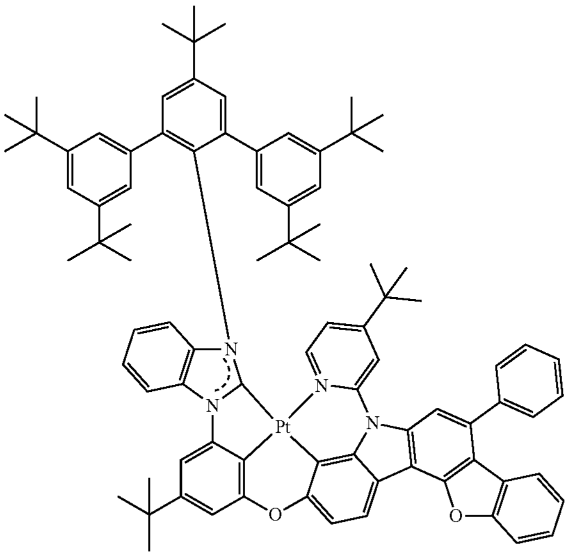
PtO63
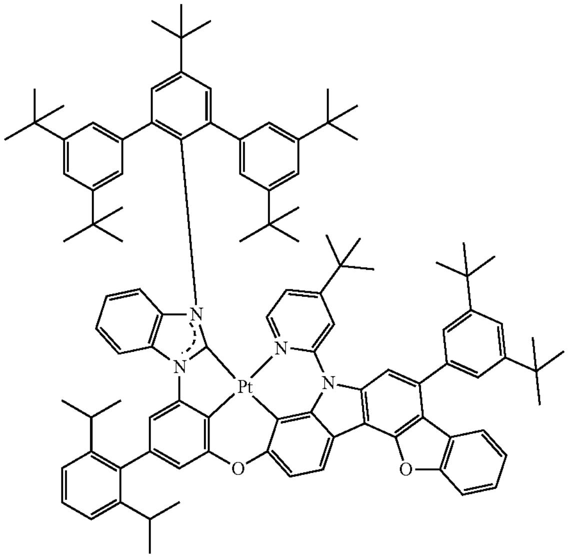

-continued
PtO64
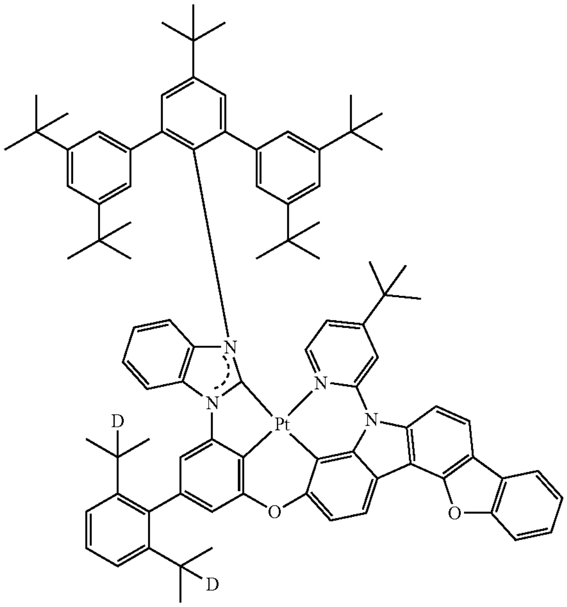
PtO65
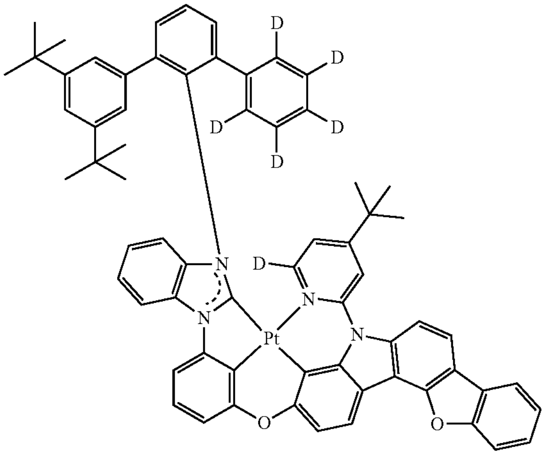
PtO66
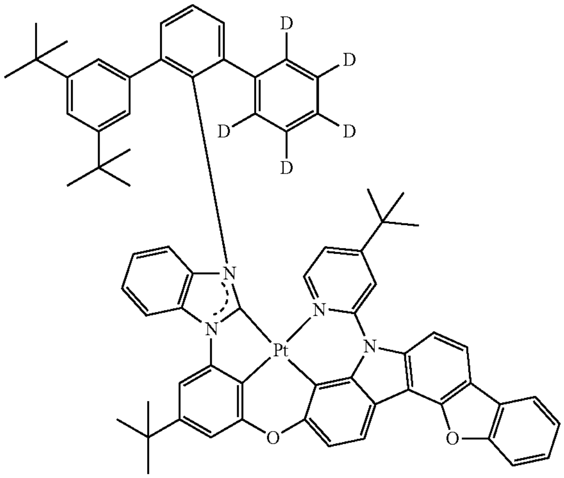
-continued
PtO67
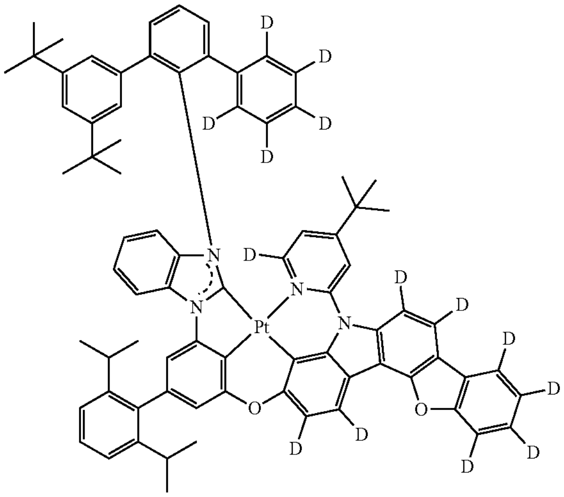
PtO68
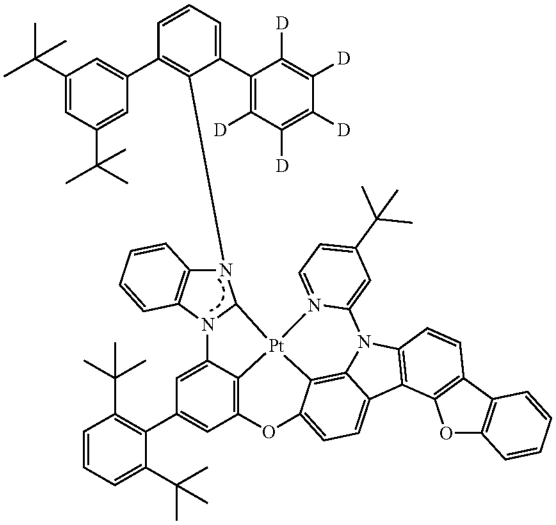
PtO69
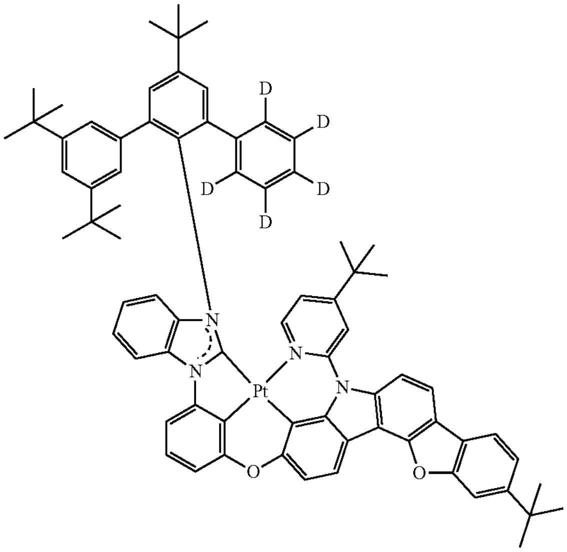

-continued
PtO70
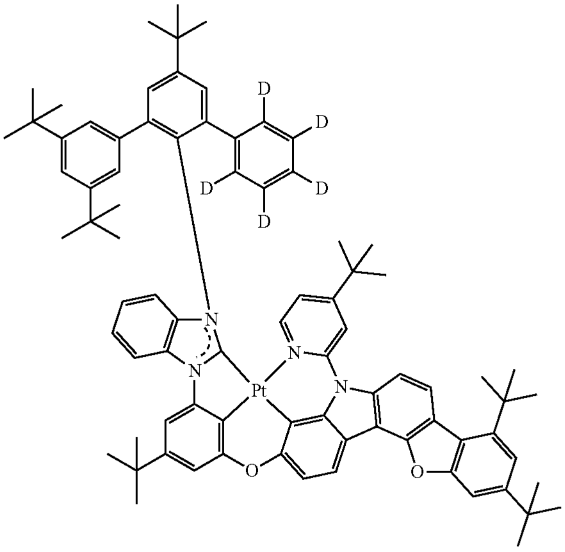
PtO71
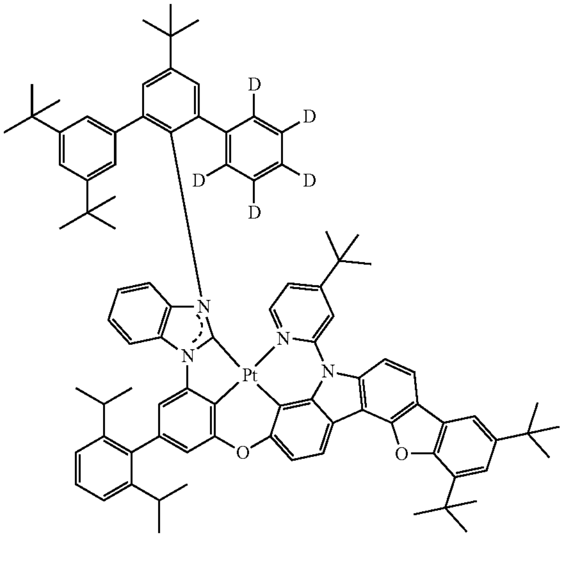
-continued
PtO72
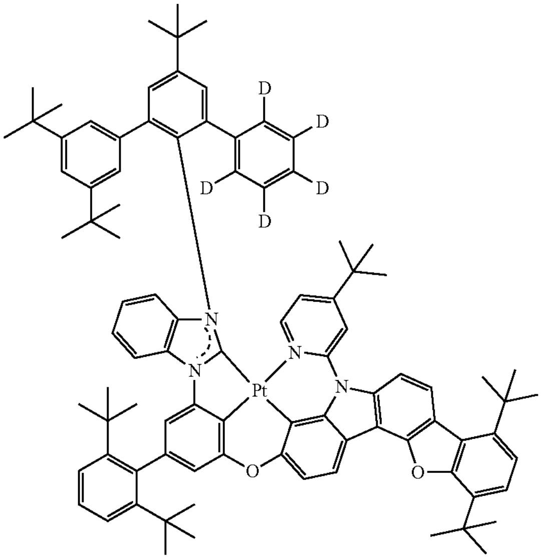
PtO73
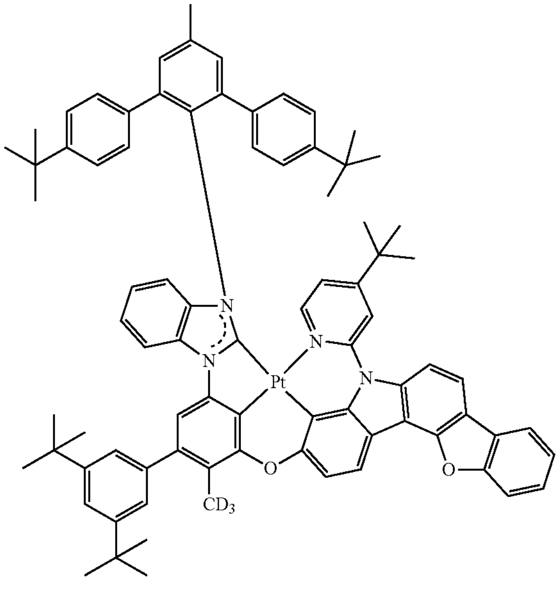

-continued
PtO74
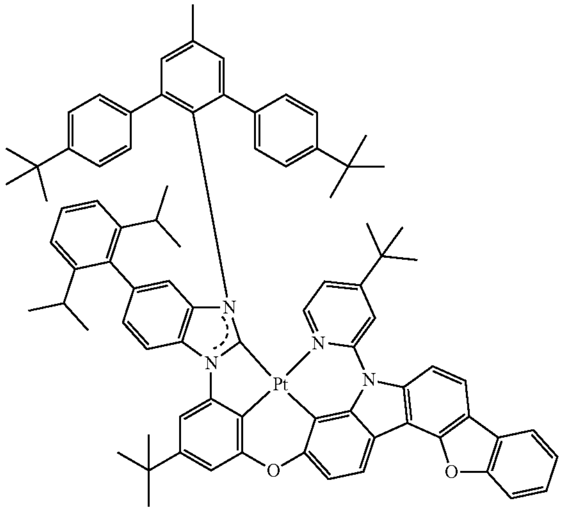
PtO75
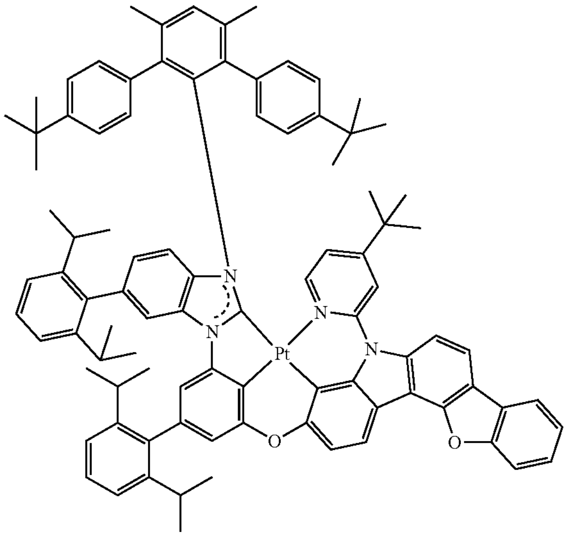
-continued
PtO76
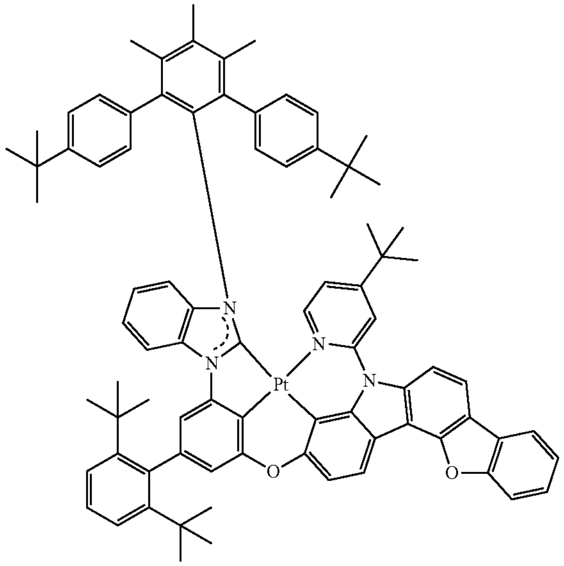
PtO77
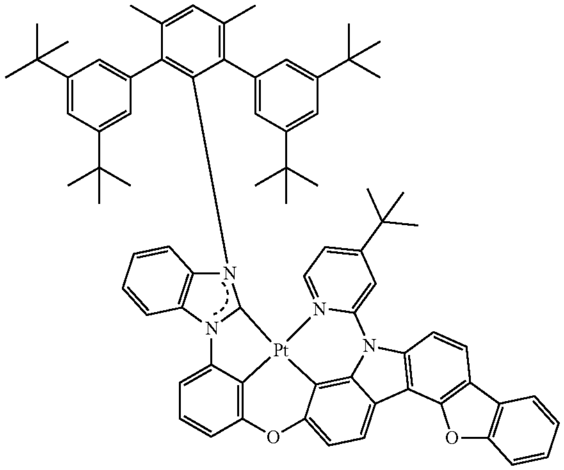
PtO78
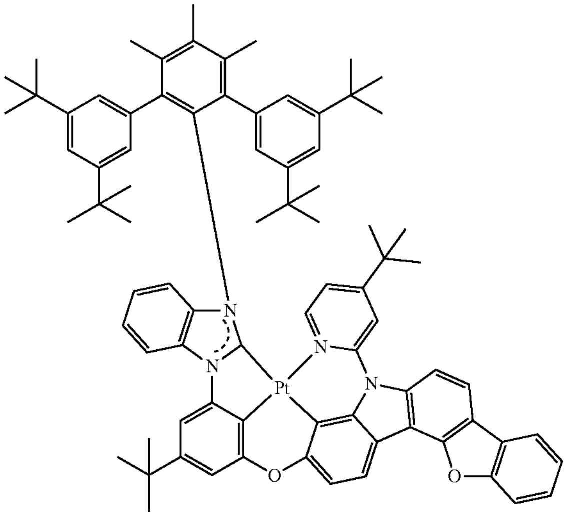

-continued
PtO79
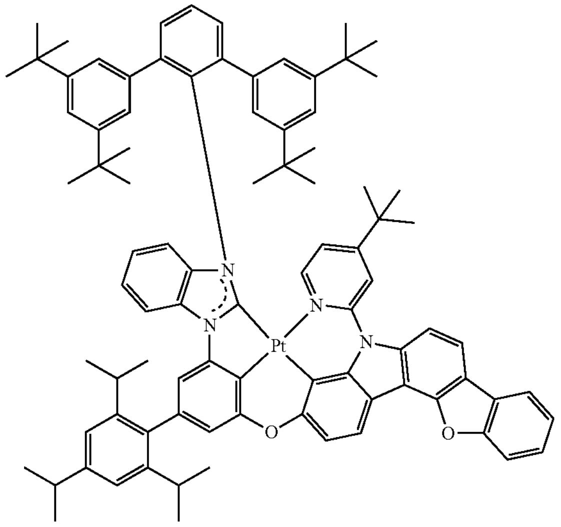
PtO80
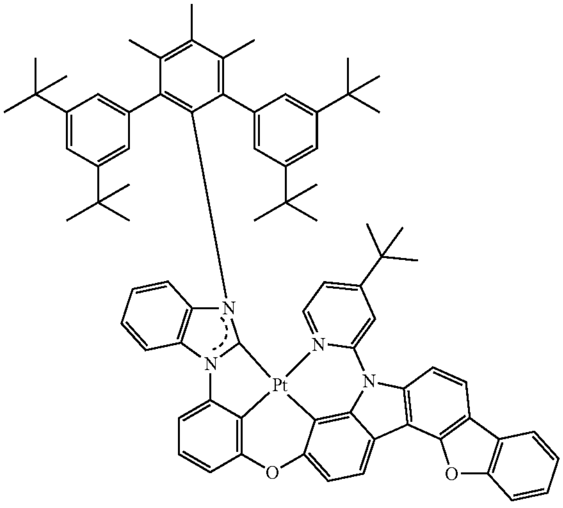
PtO81
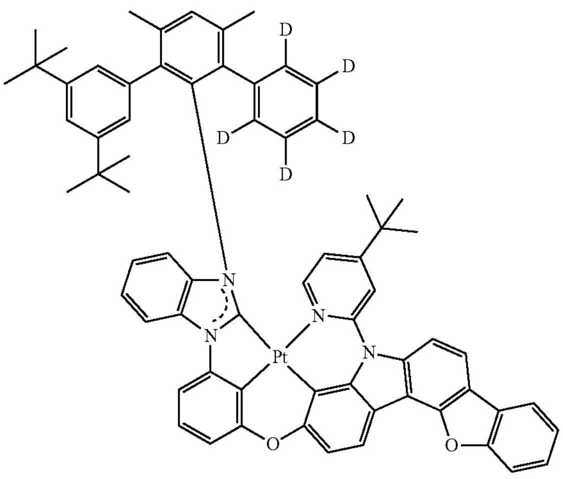
-continued
PtO82
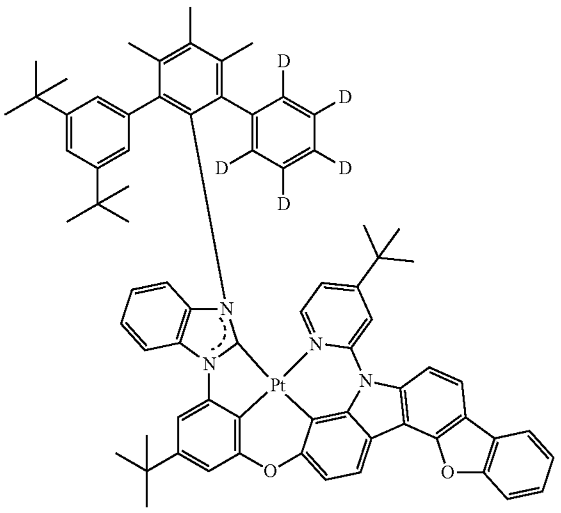
PtO83
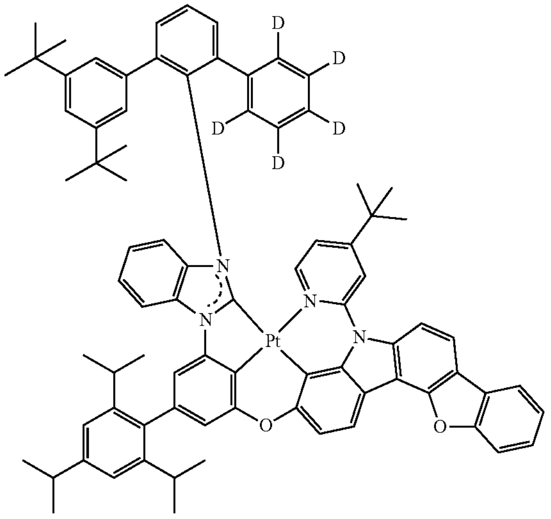
PtO84
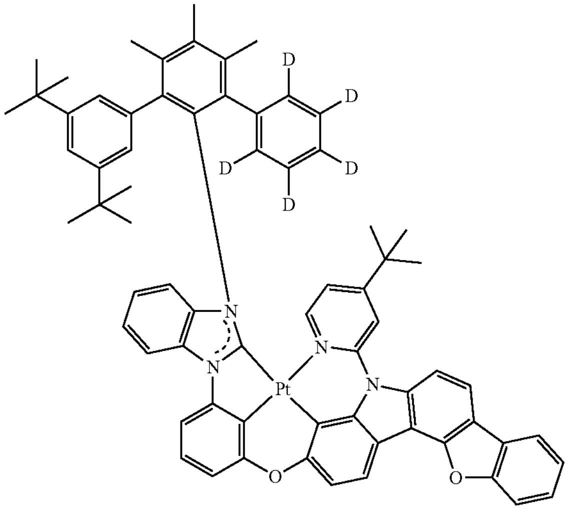

-continued
PtO85
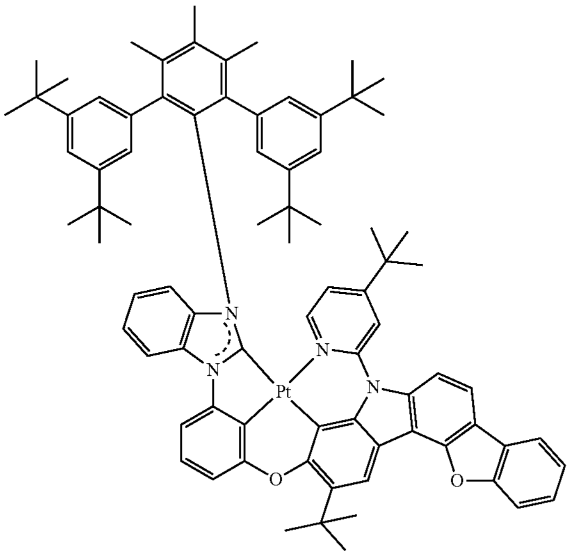
-continued
PtO87
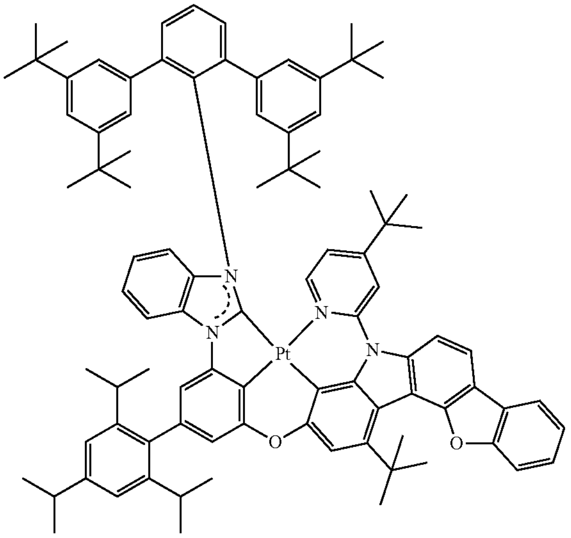
PtO86
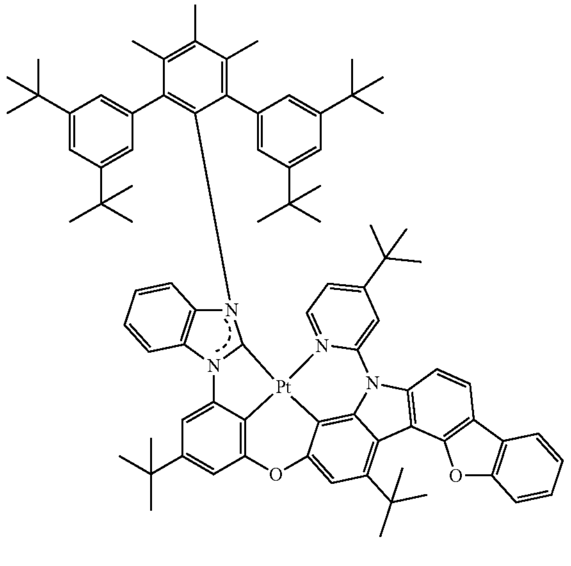
PtO88
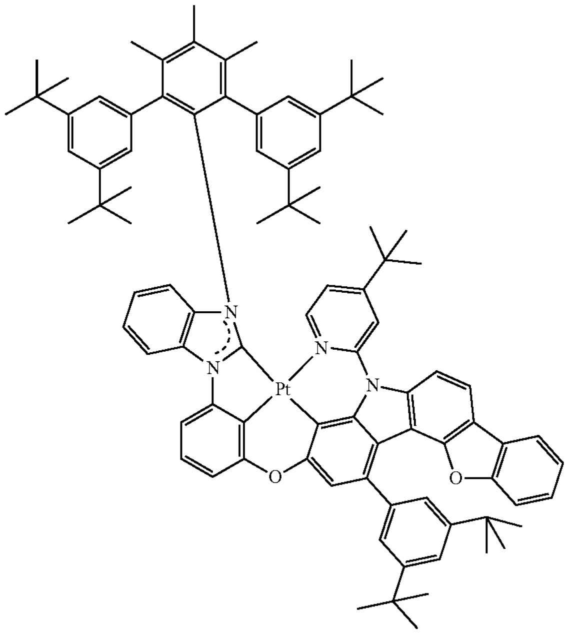

-continued
PtO89
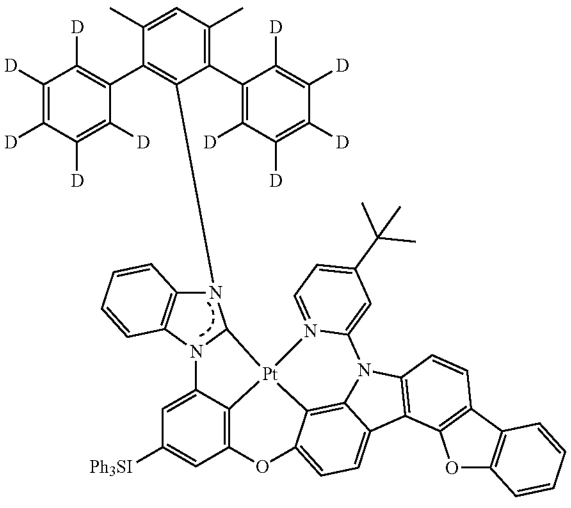
PtO90
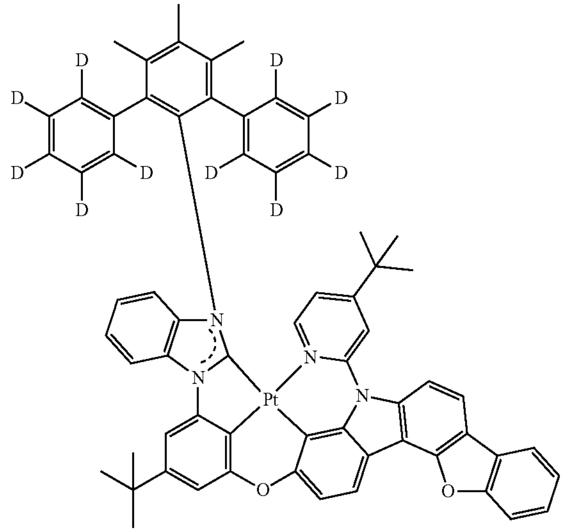
PtO91
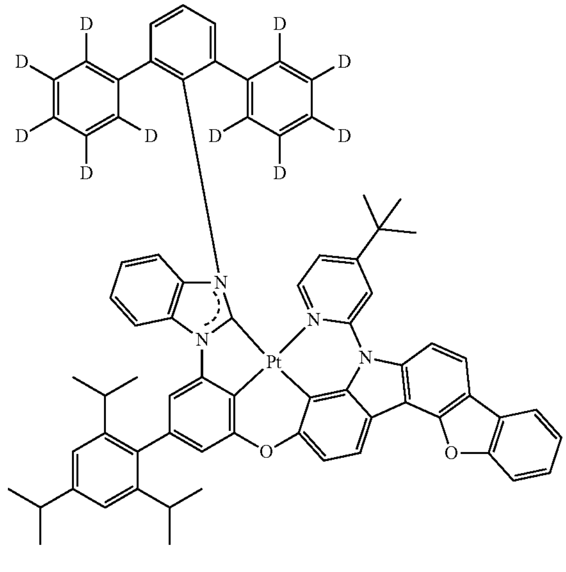
-continued
PtO92
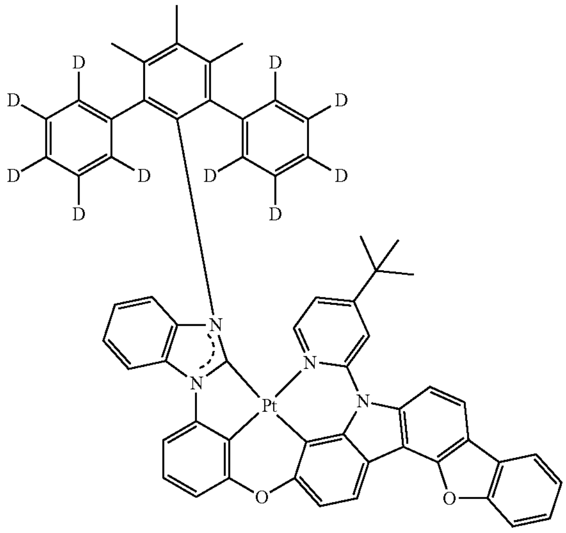
PtO93
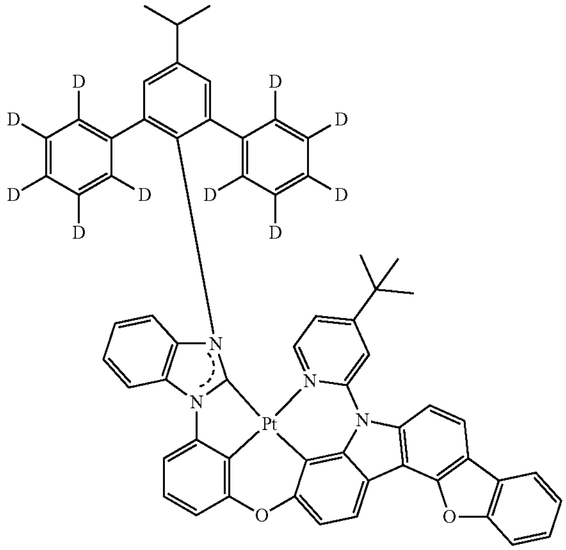

-continued
PtO94
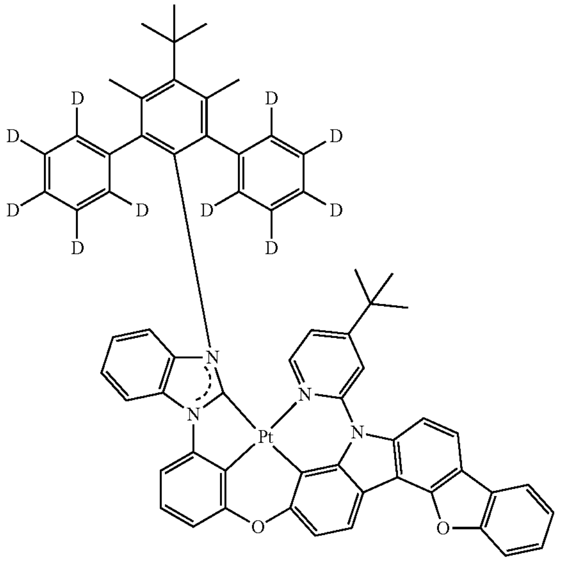
PtO95
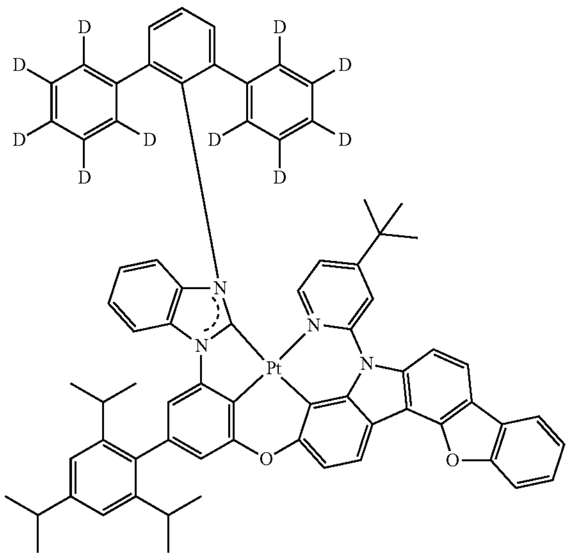
-continued
PtO96
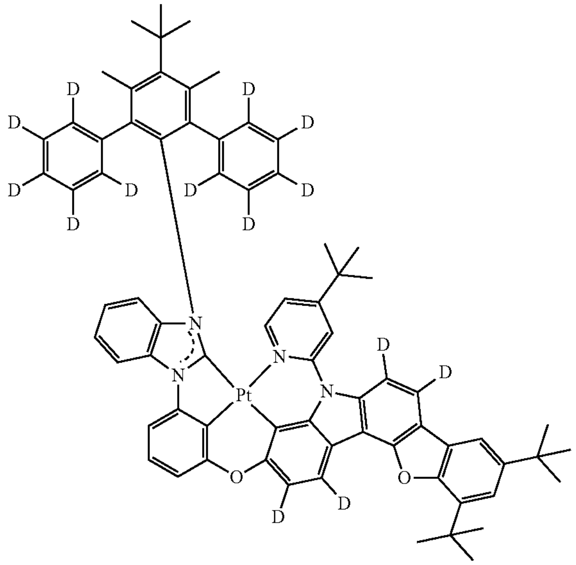
PtO97
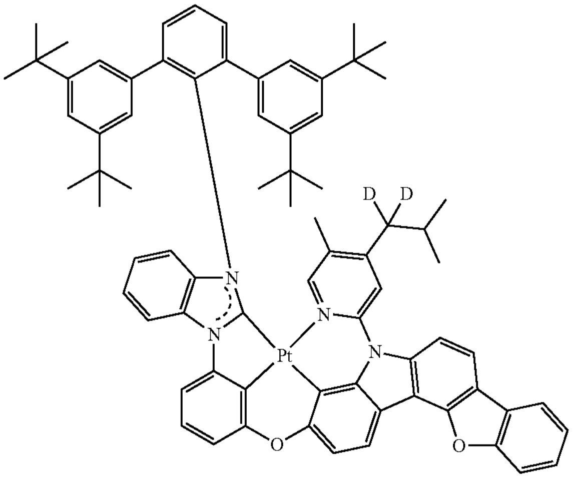
PtO98
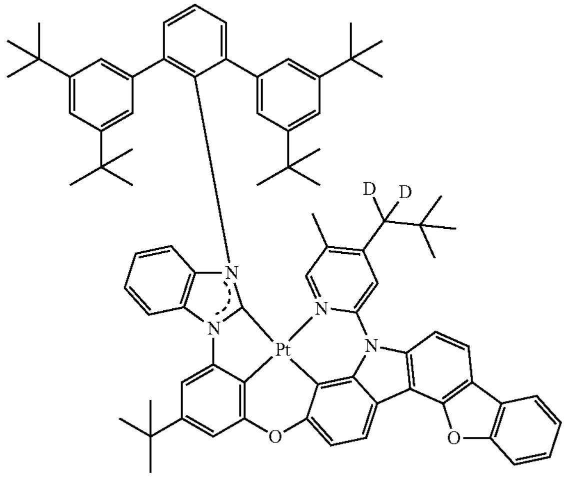

-continued
PtO99
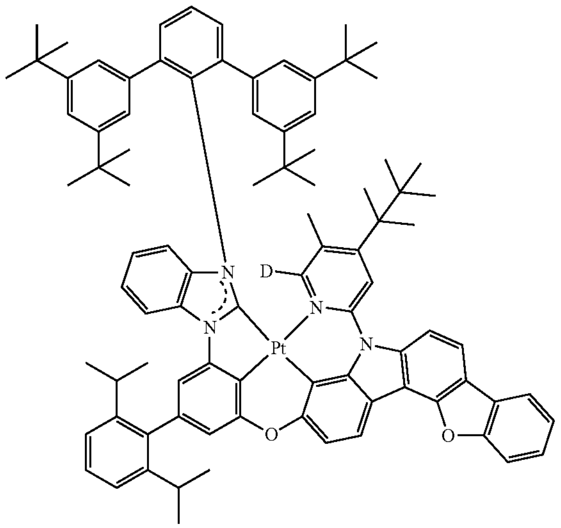
PtO100
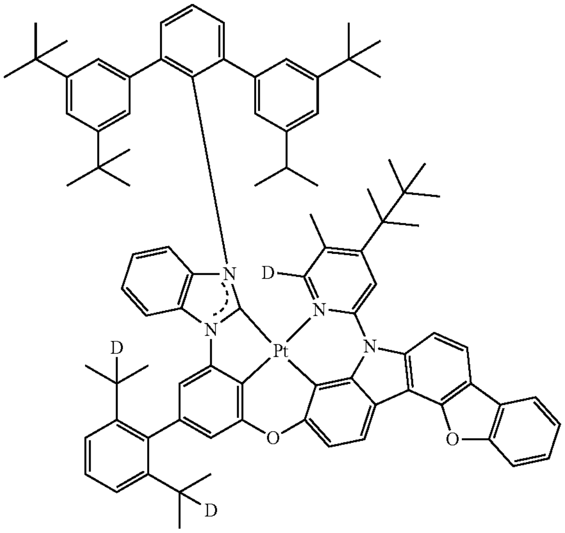
PtO101
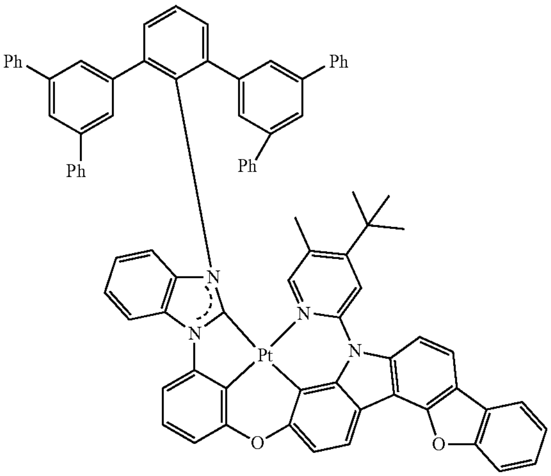
-continued
PtO102
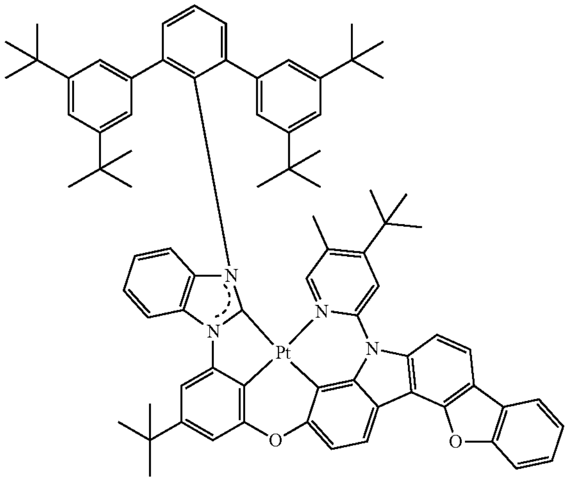
PtO103
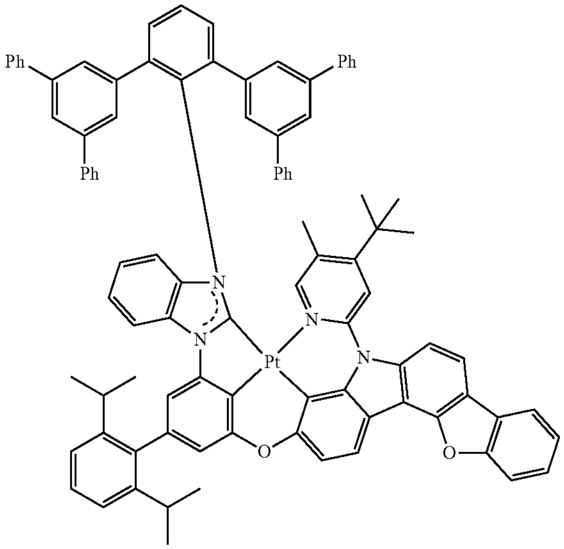
PtO104
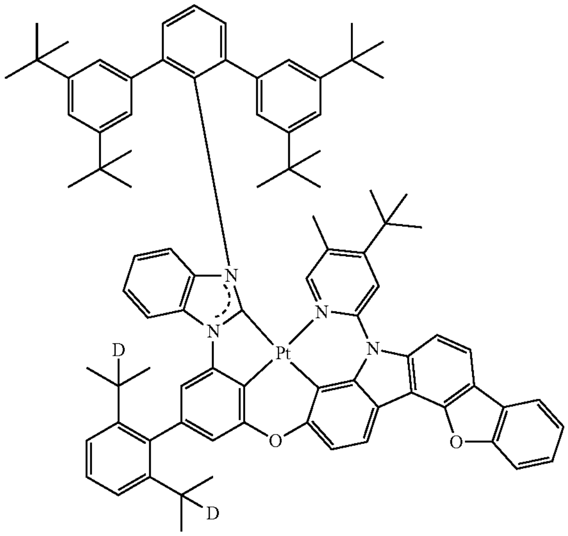

-continued
PtO105
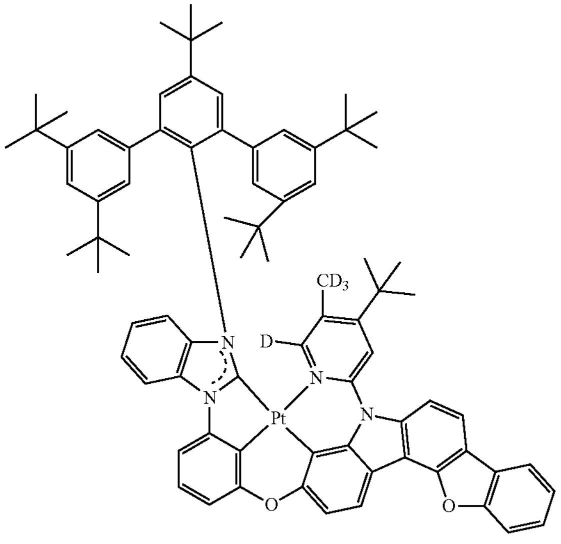
-continued
PtO107
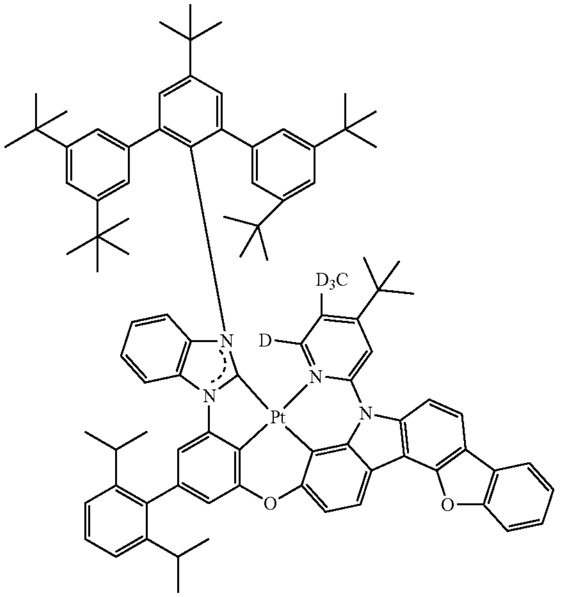
PtO106
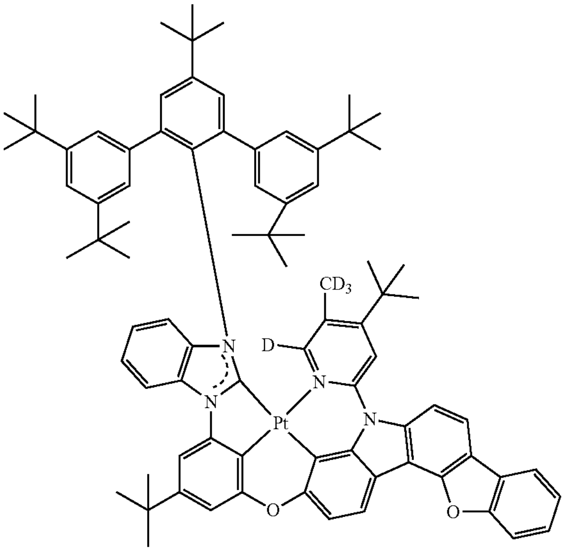
PtO108
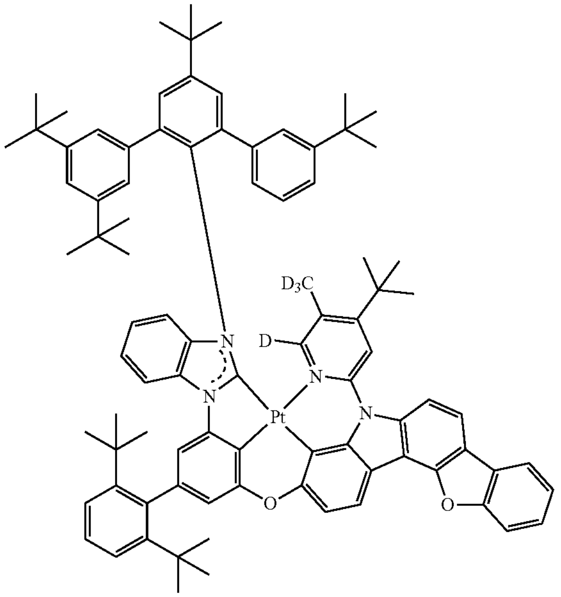

-continued
PtO109
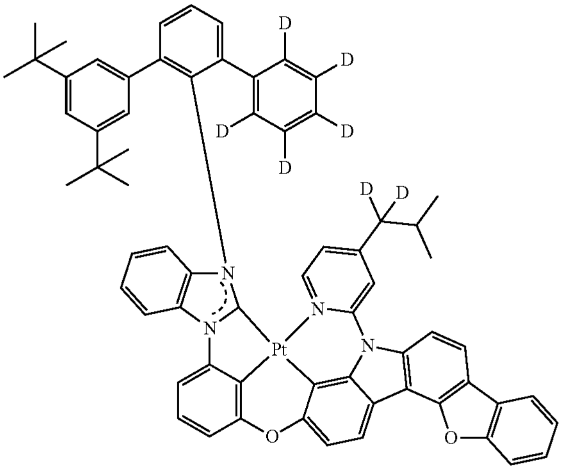
PtO110
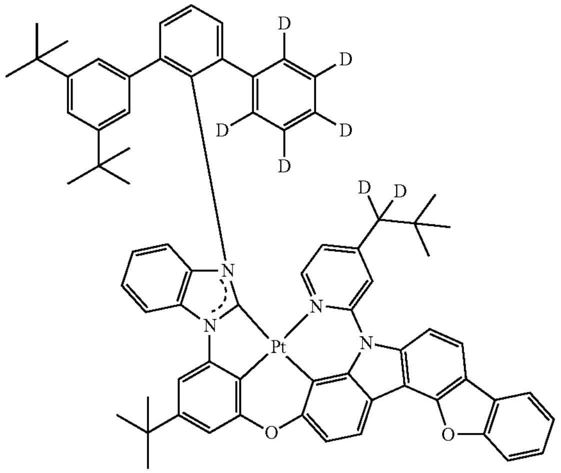
PtO1111
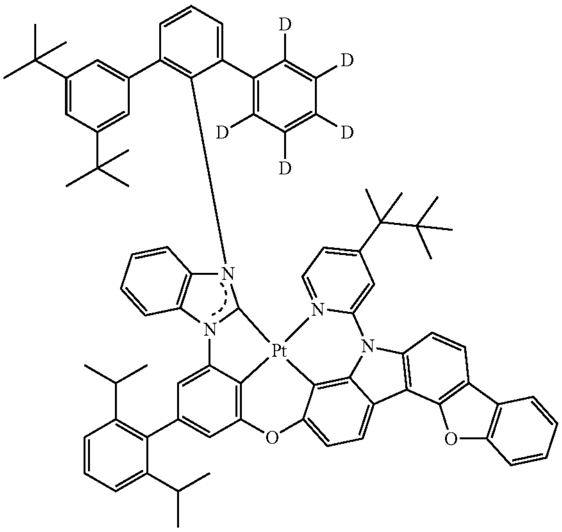
-continued
PtO112
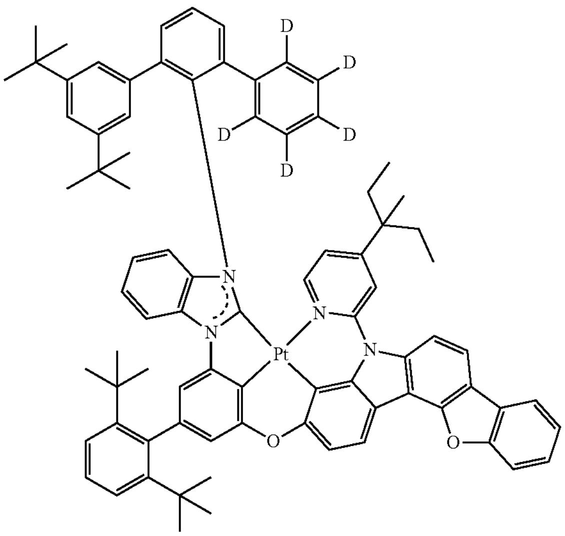
PtO1113
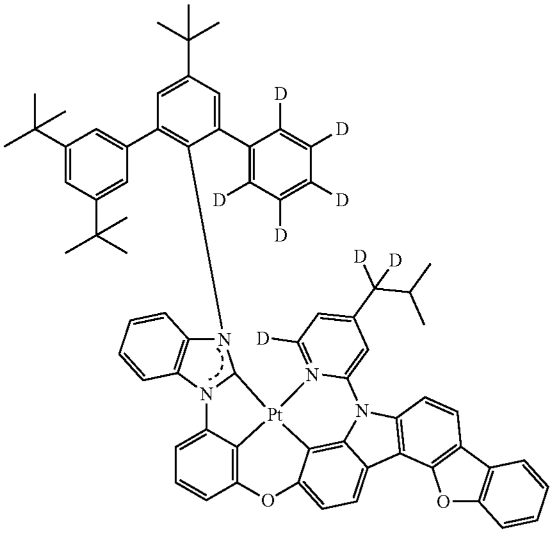

-continued
PtO1114
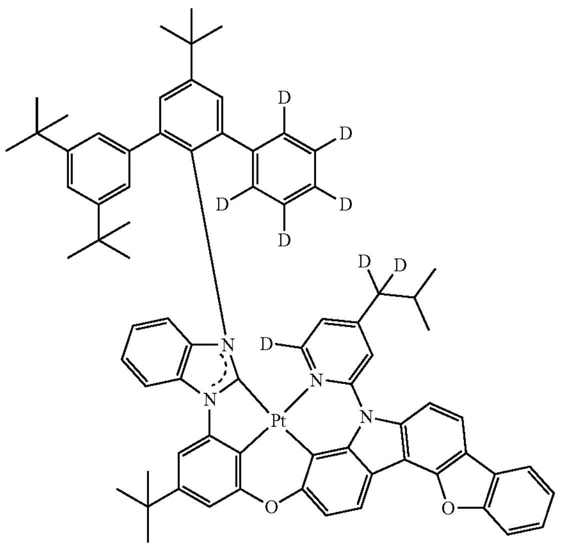
PtO1115
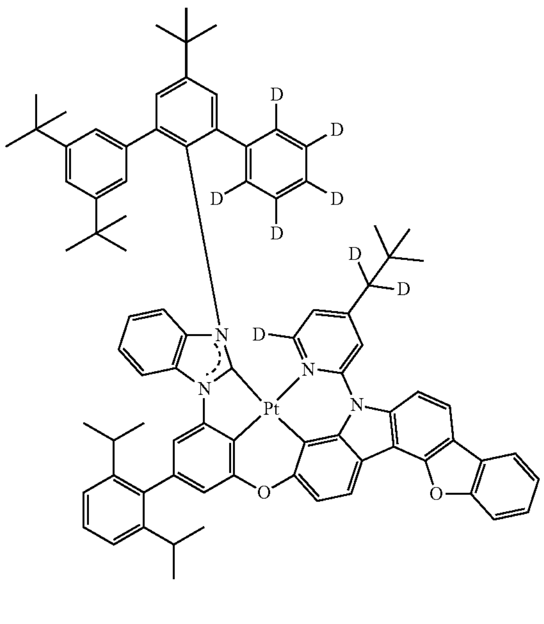
-continued
PtO1116
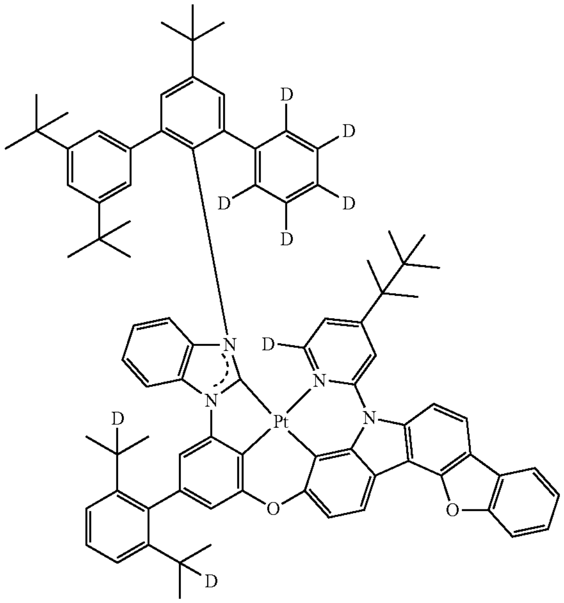
PtO1117
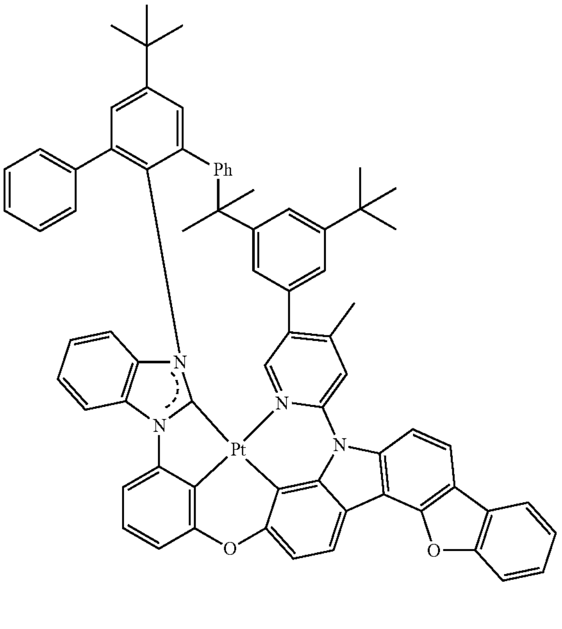

PtO1118
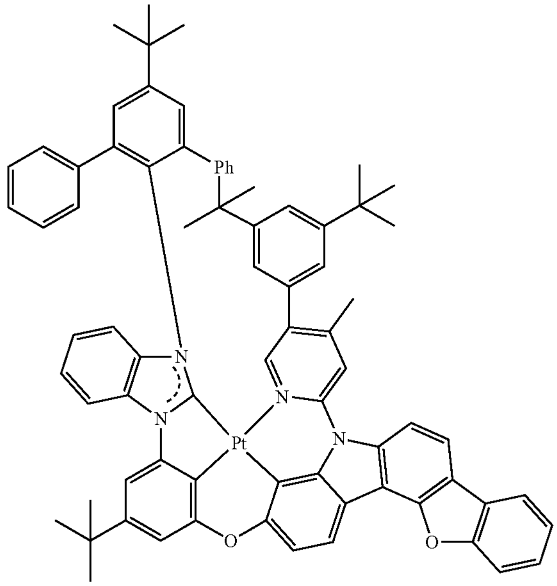
PtO1119
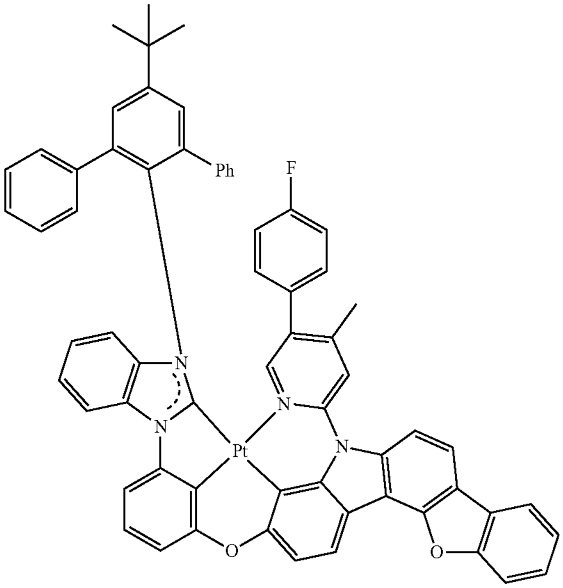
PtO1120
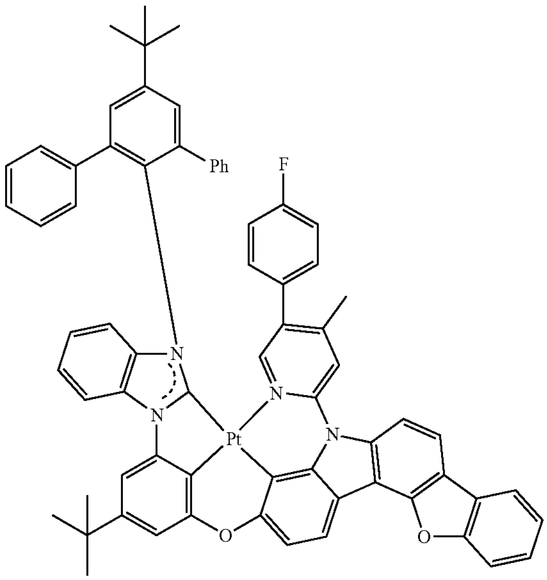
PtO111
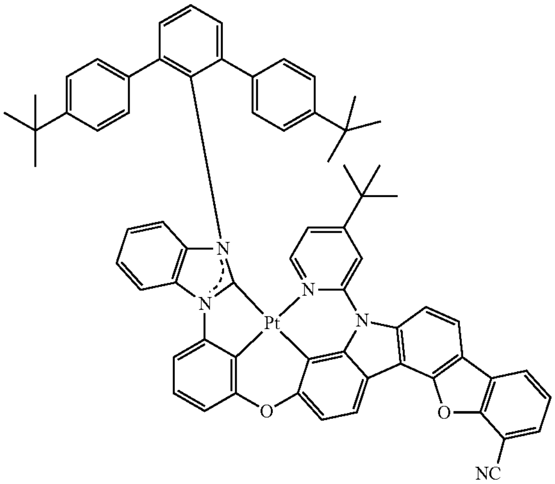

-continued
PtO112
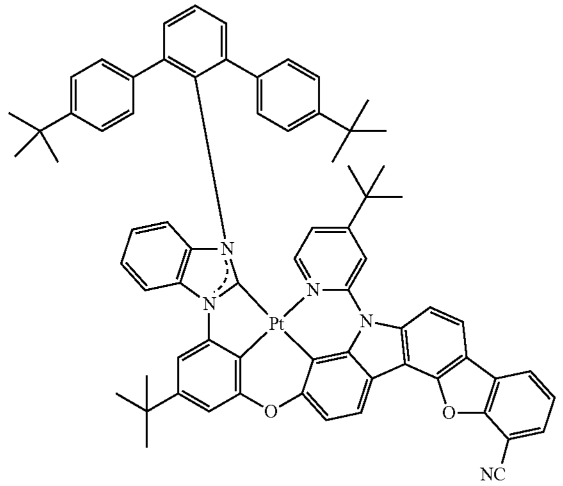
PtO113
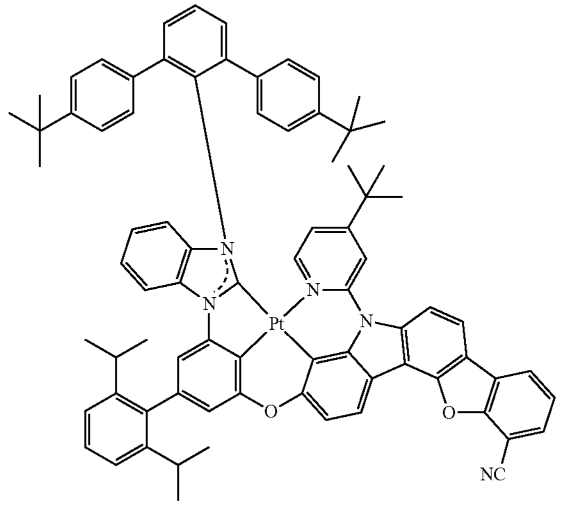
PtO114
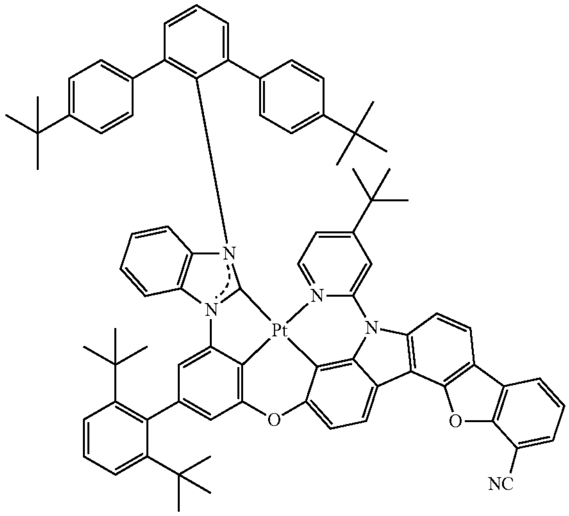
PtO115
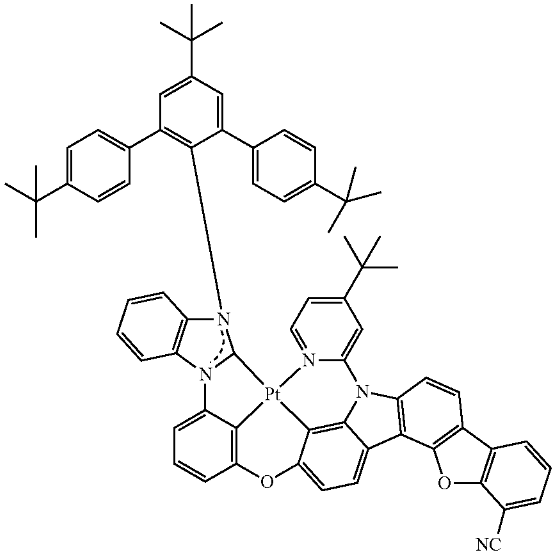
PtO116
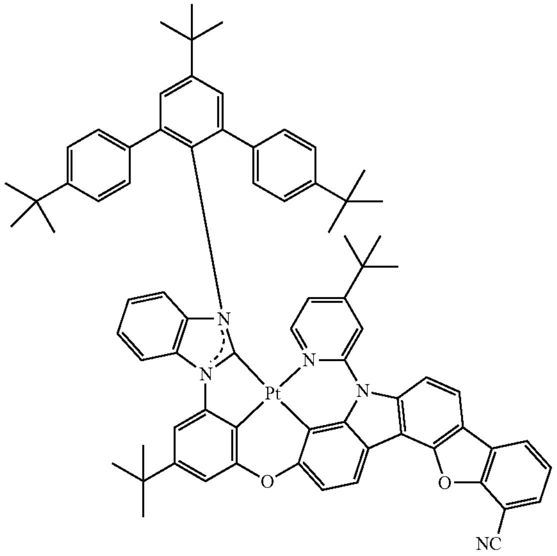

-continued
PtO117
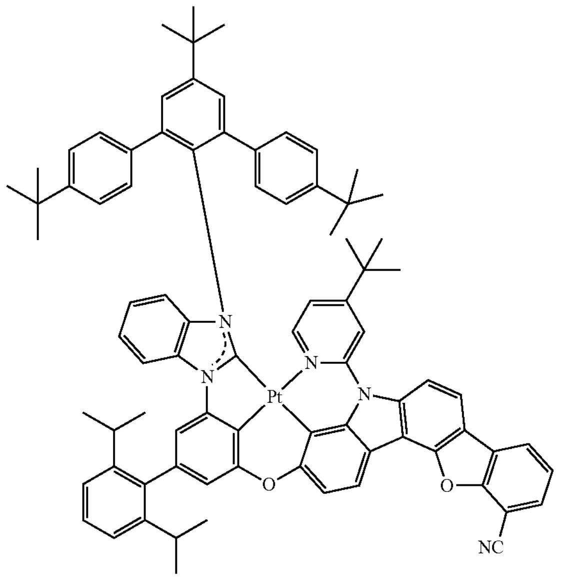
PtO118
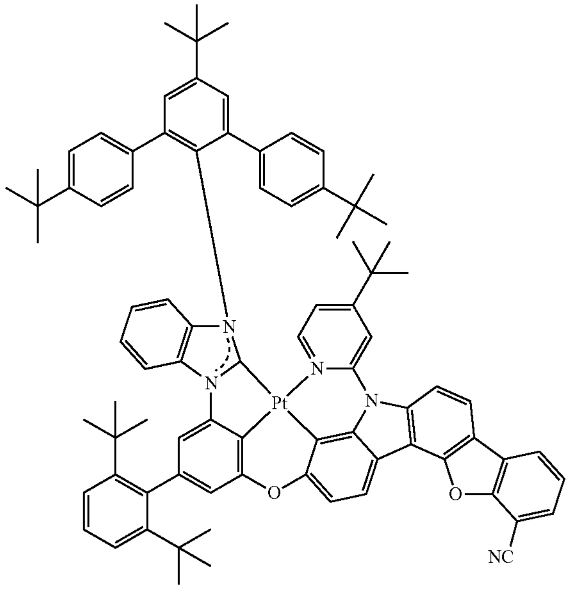
-continued
PtO119
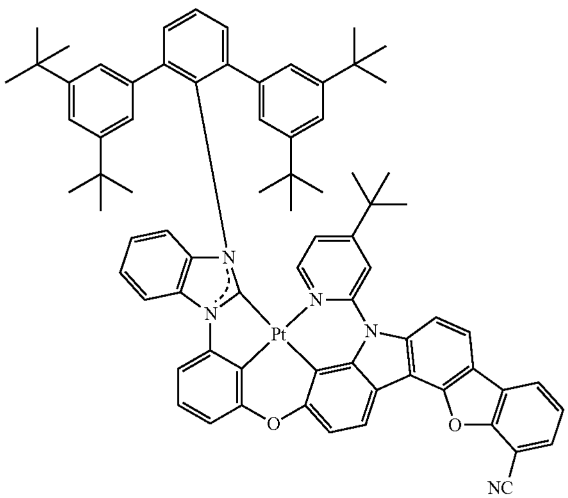
PtO120
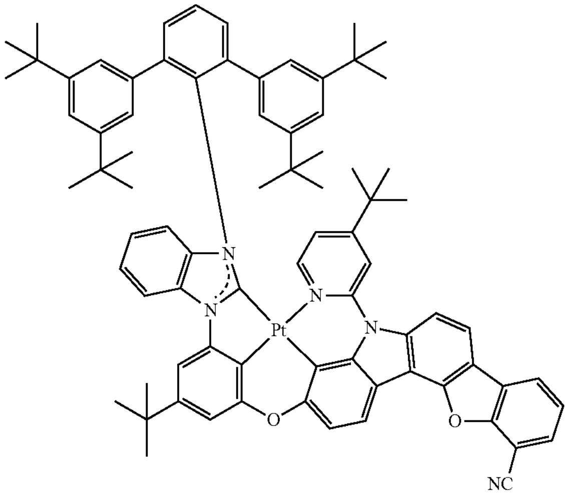
PtO121
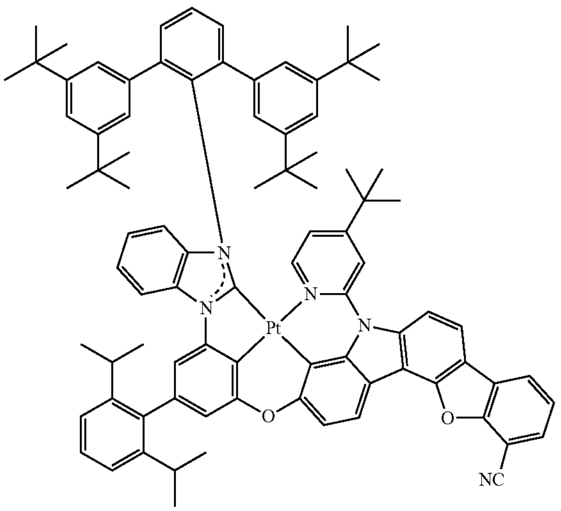

PtO122
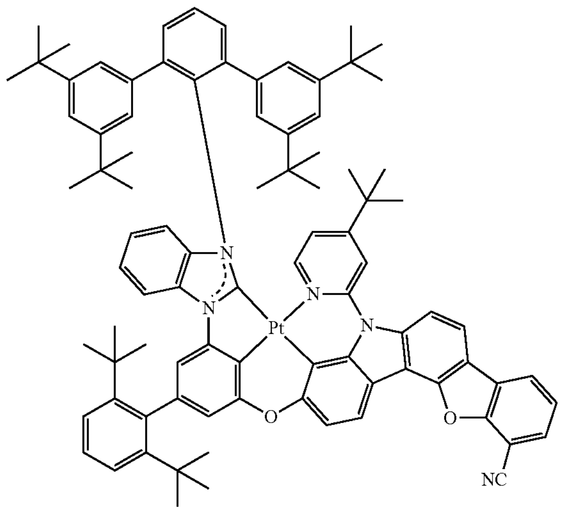
PtO123
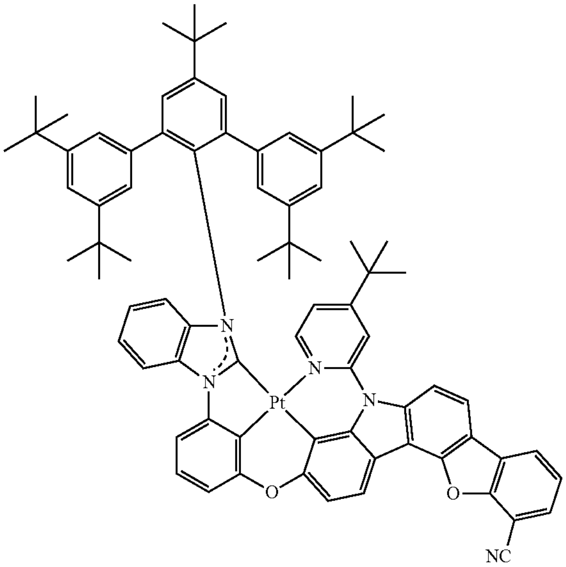
PtO124
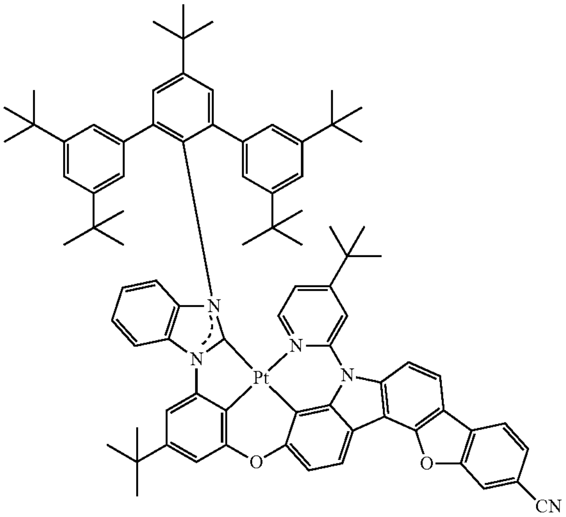
PtO125
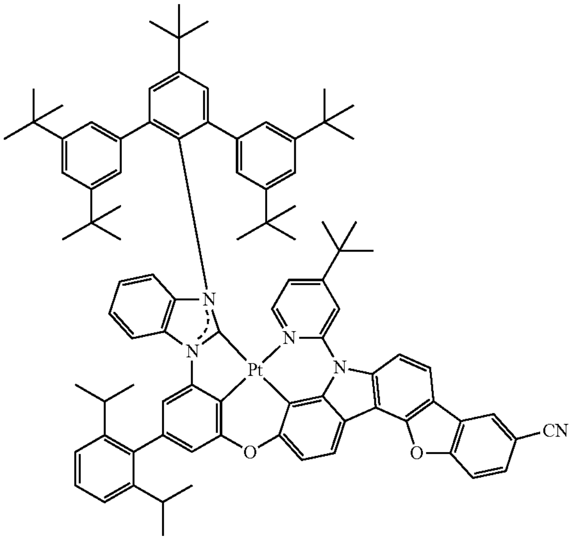
PtO126
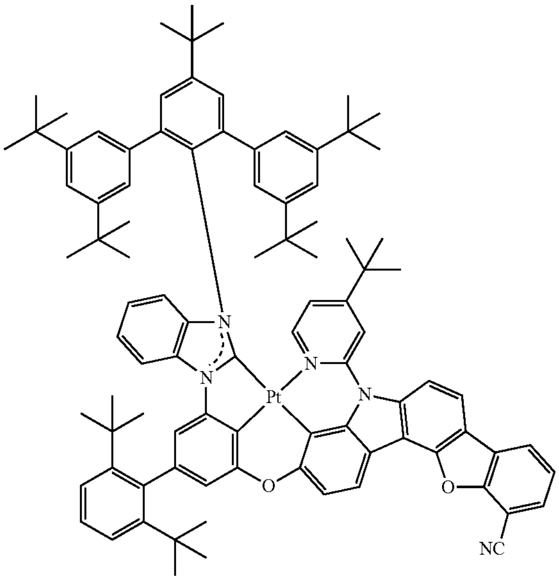

-continued
PtO127
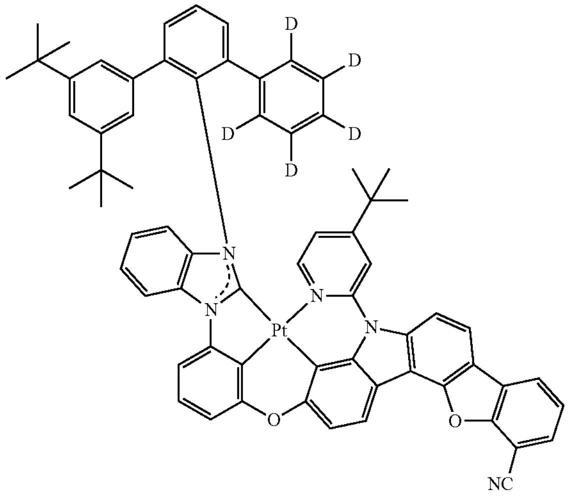
PtO128
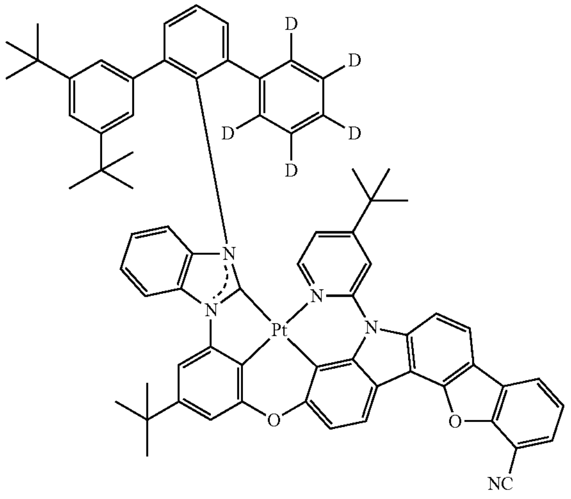
PtO129
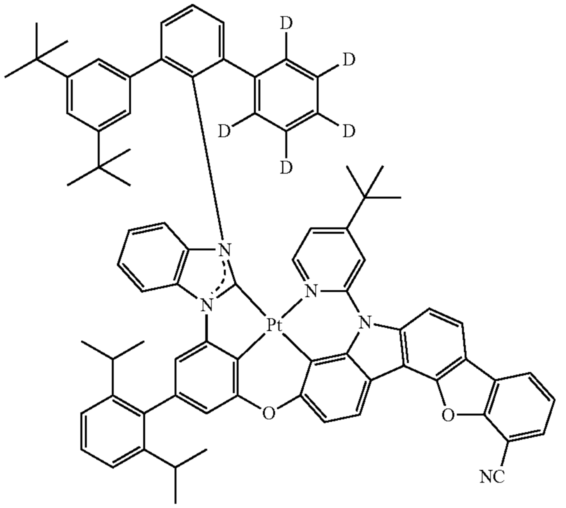
-continued
PtO130
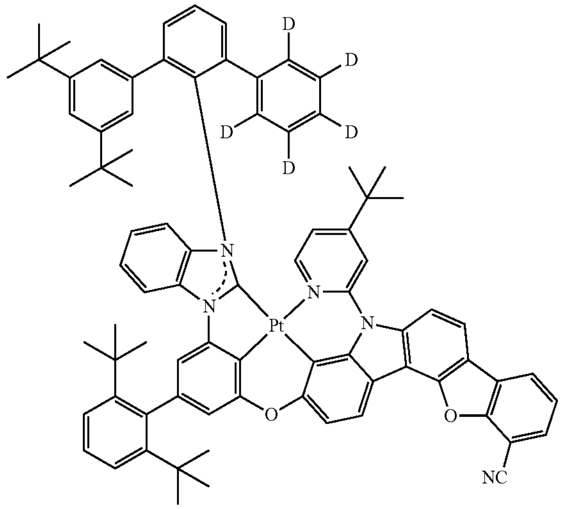
PtO131
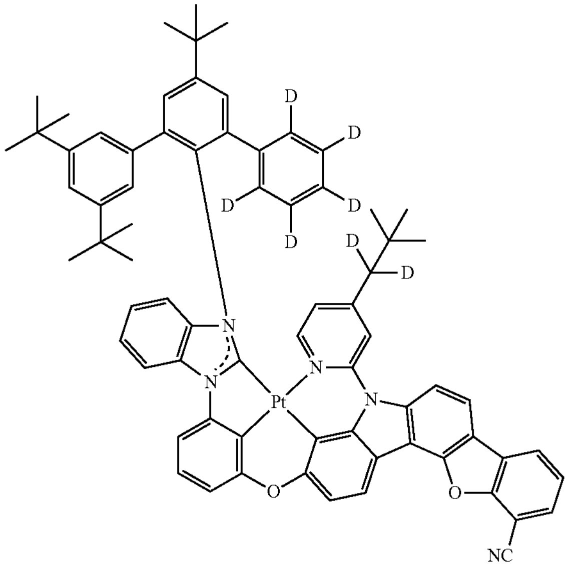

-continued
PtO132
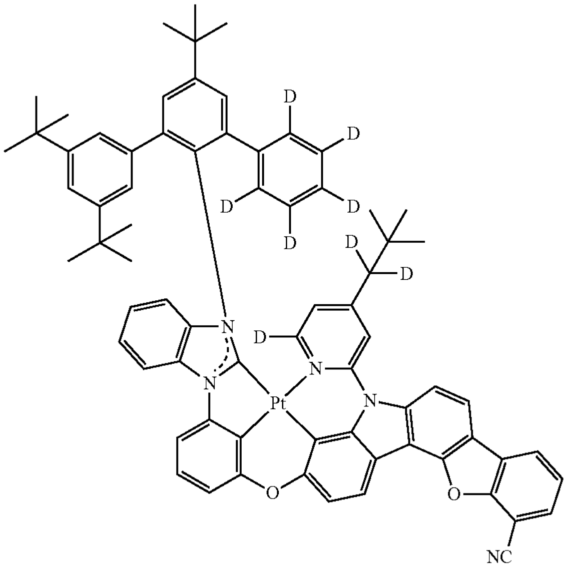
PtO133
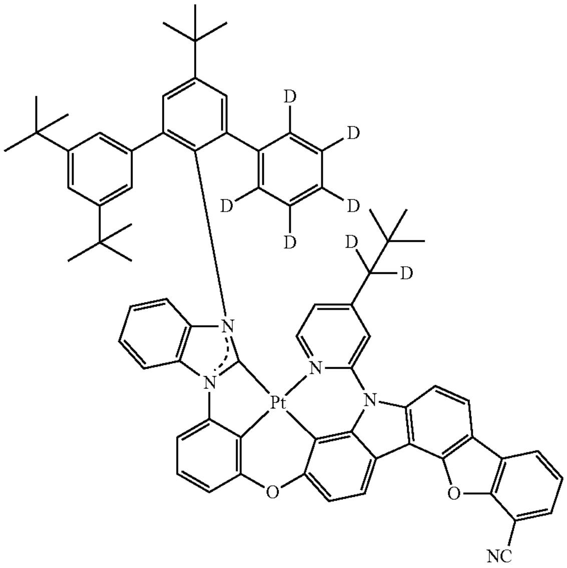
-continued
PtO134
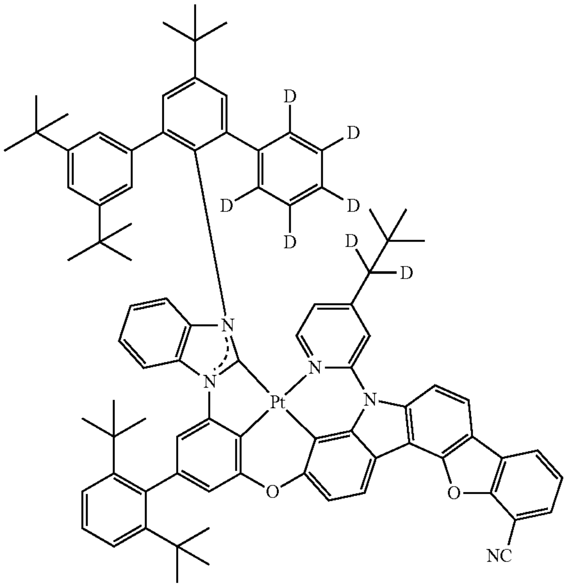
PtO135
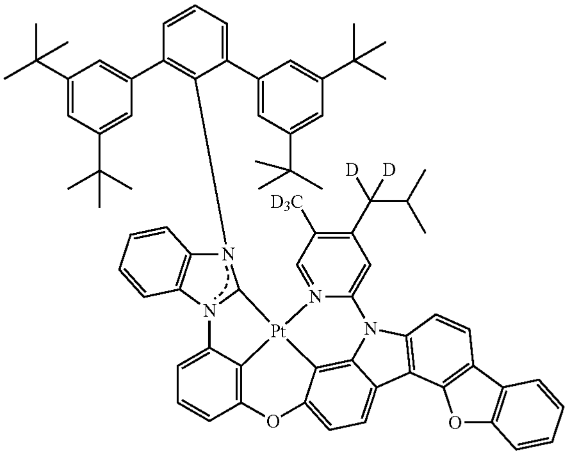
PtO136
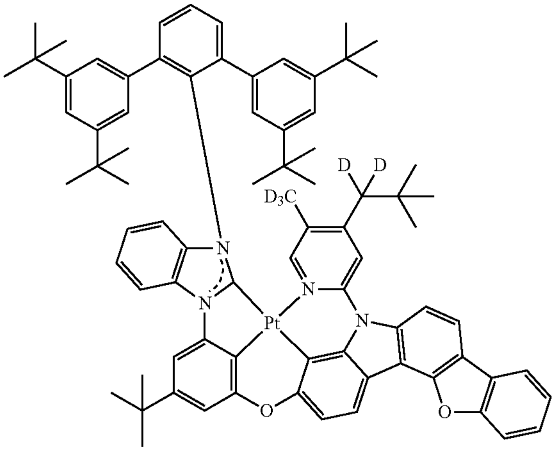

-continued
PtO137
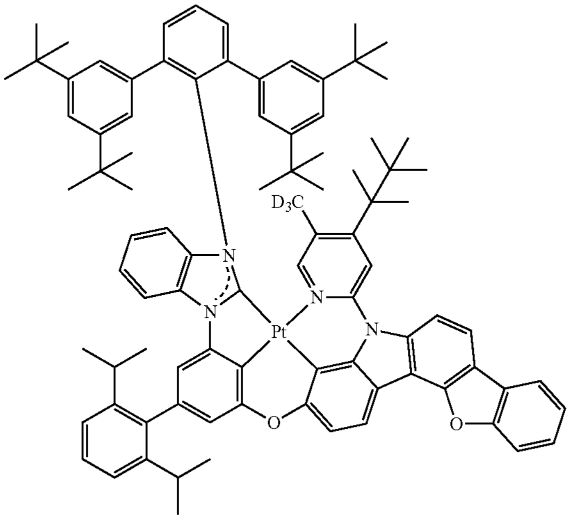
PtO138
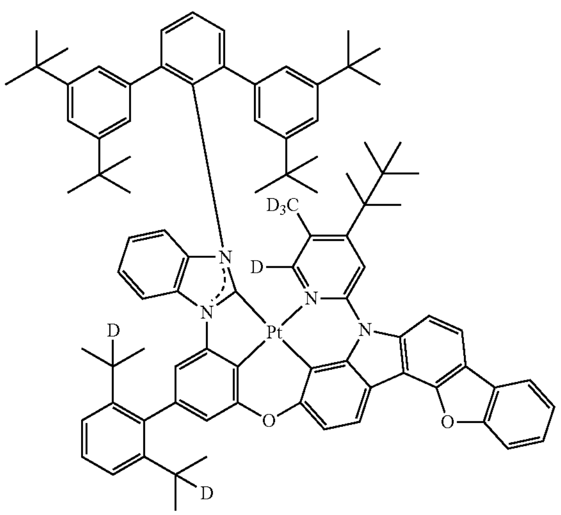
PtO139
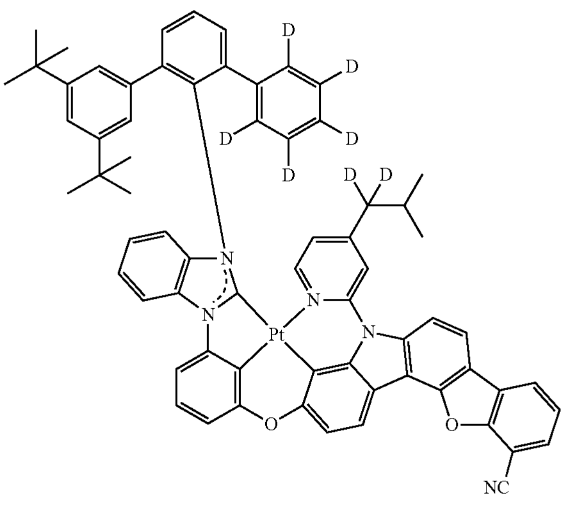
-continued
PtO140
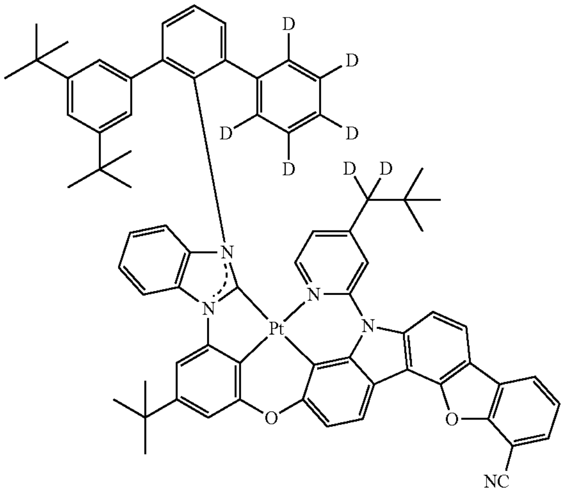
PtO141
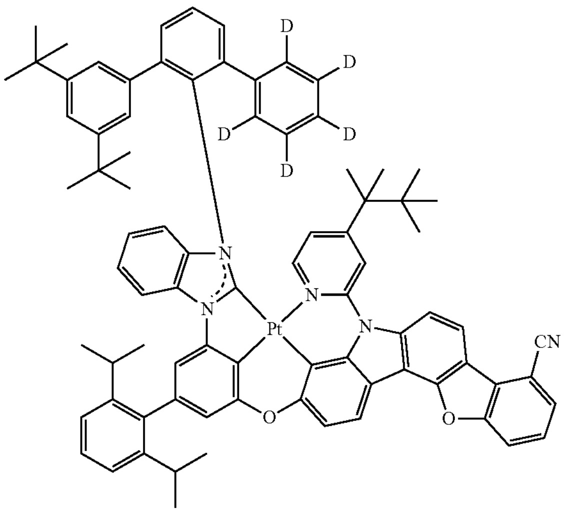
PtO142
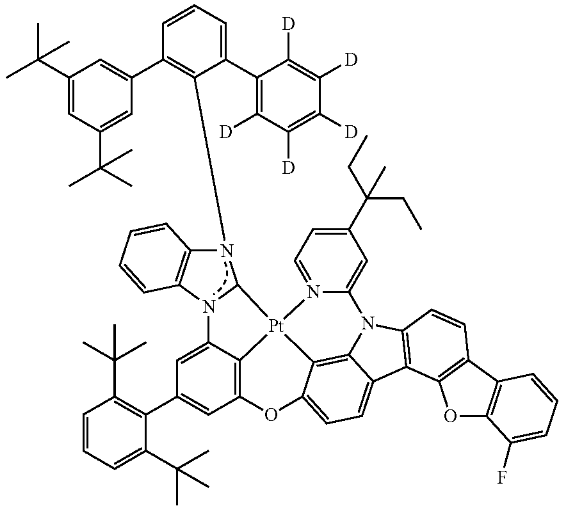

-continued
PtO143
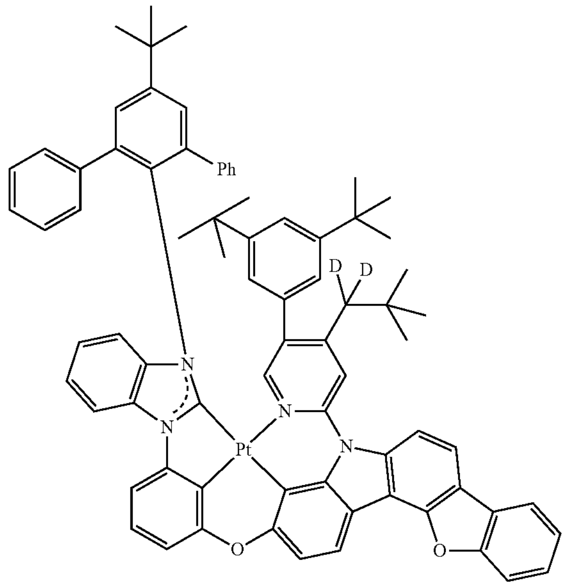
PtO144
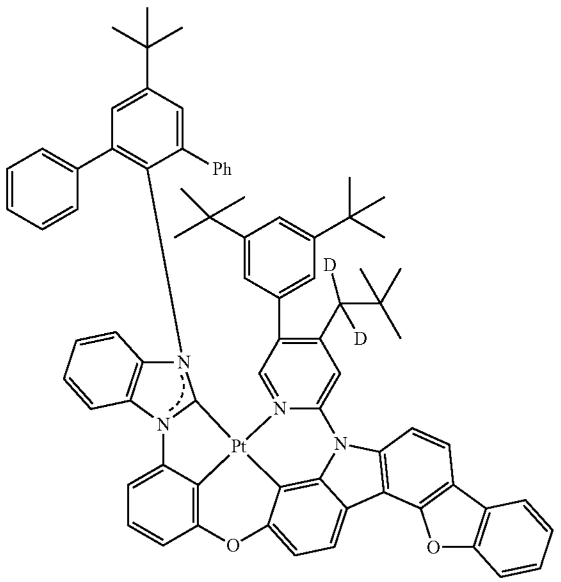
-continued
PtO145
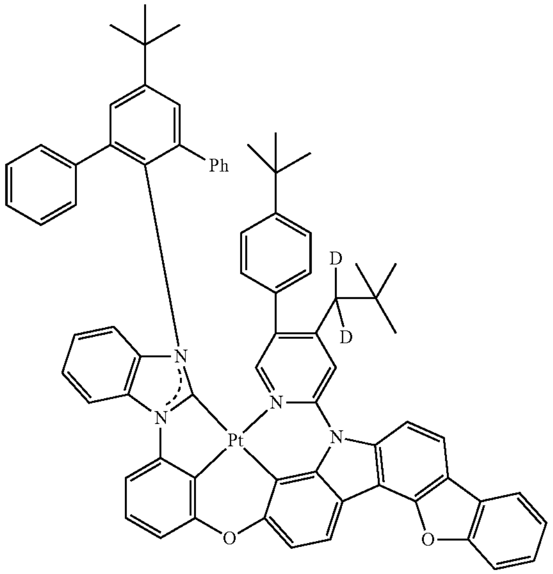
PtO146
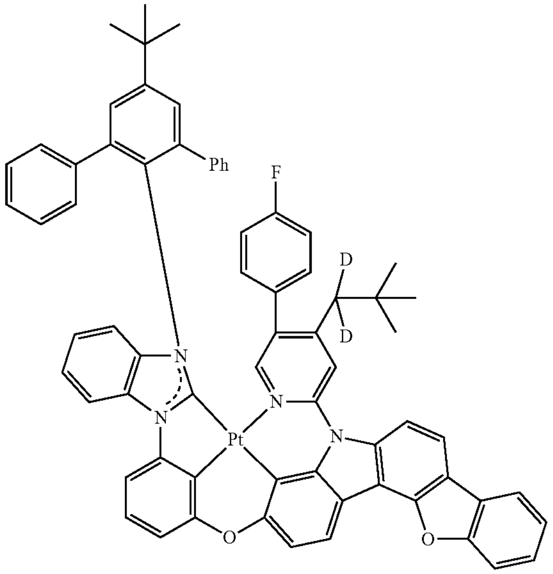

-continued
PtO147
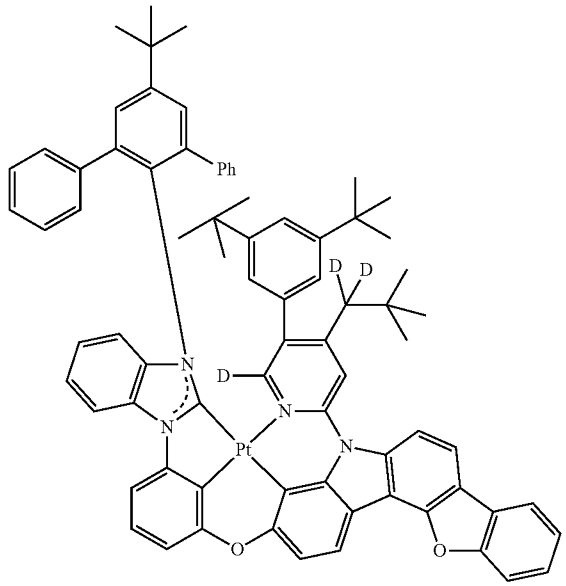
PtO148
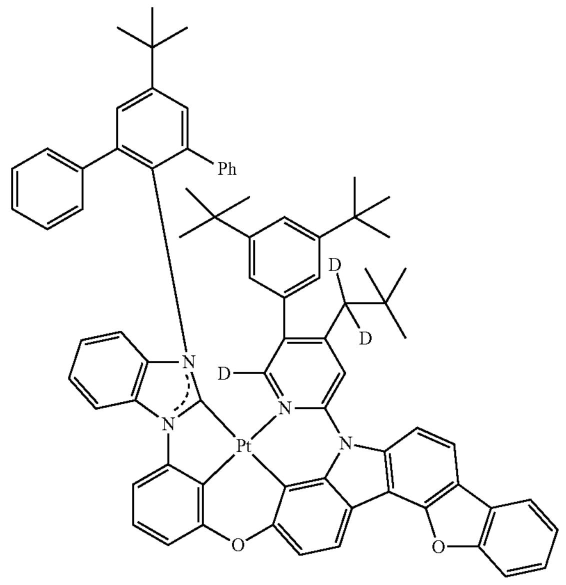
-continued
PtO149
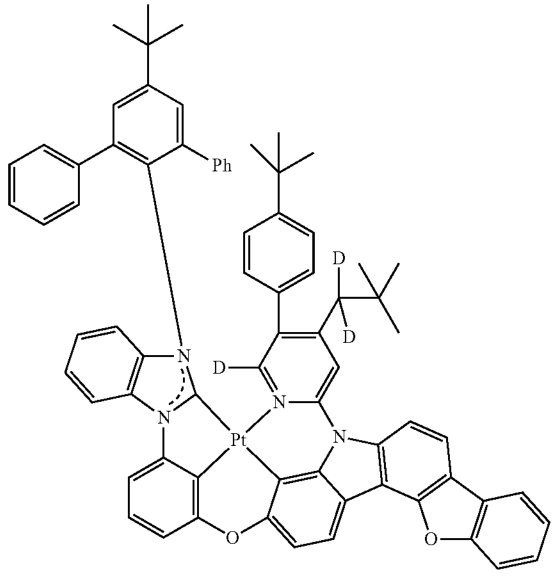
PtO150
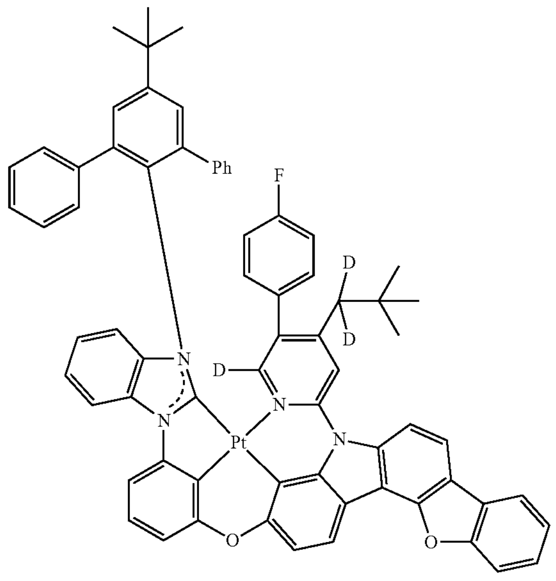

-continued
PtO151
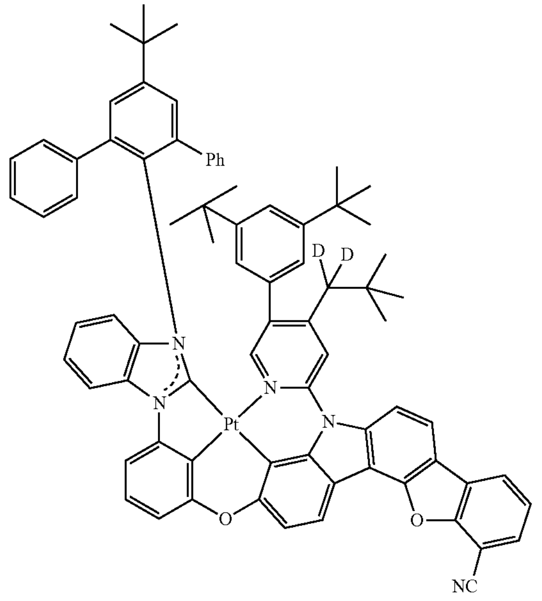
PtO152
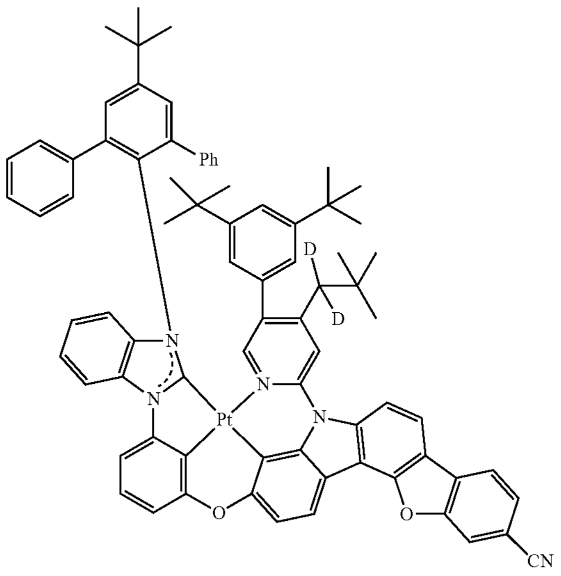
-continued
PtO153
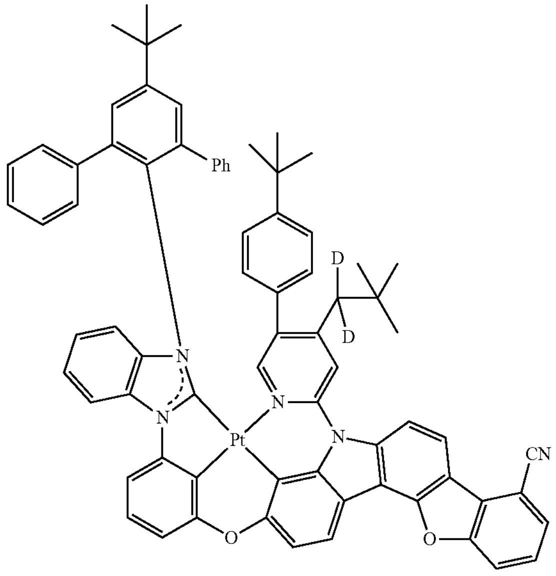
PtO154
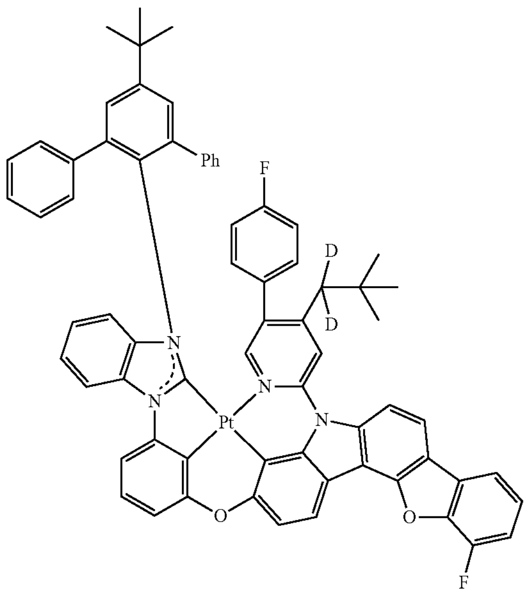

-continued
PtO155
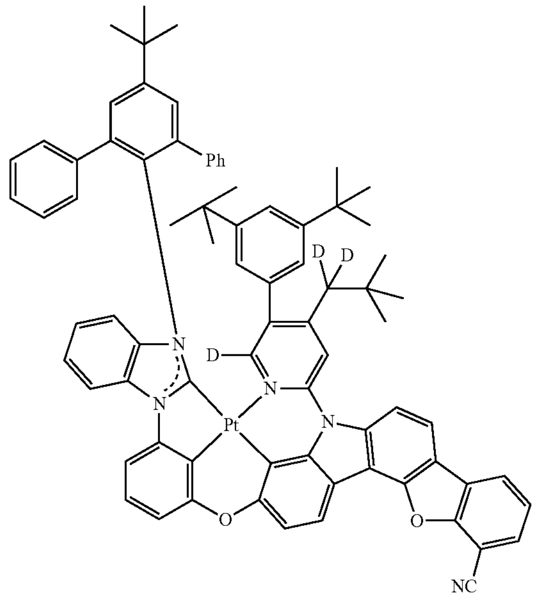
PtO156
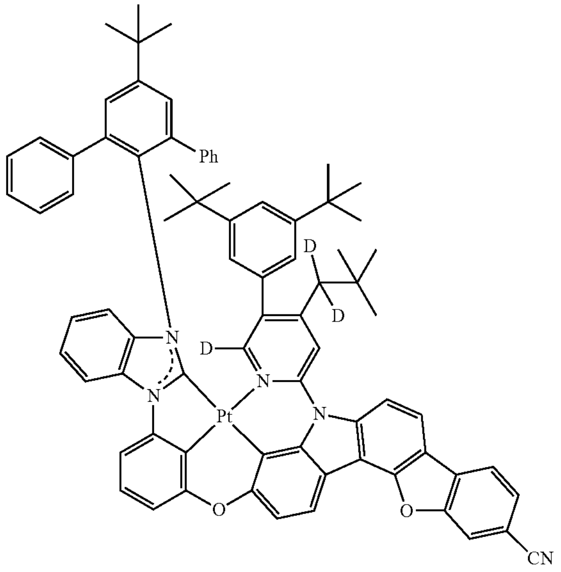
-continued
PtO157
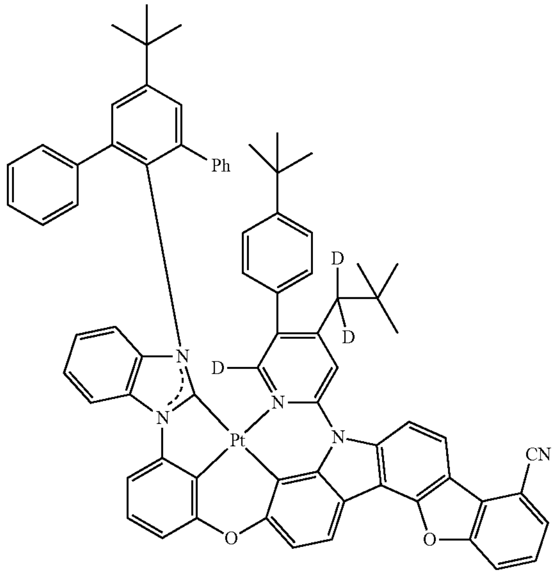
PtO158
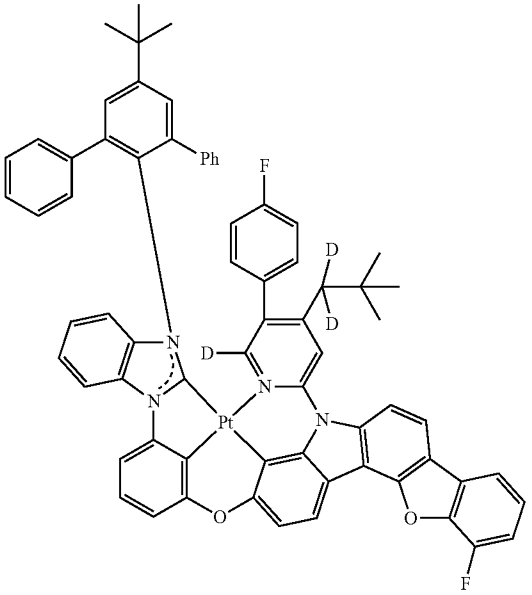

-continued
PtS1
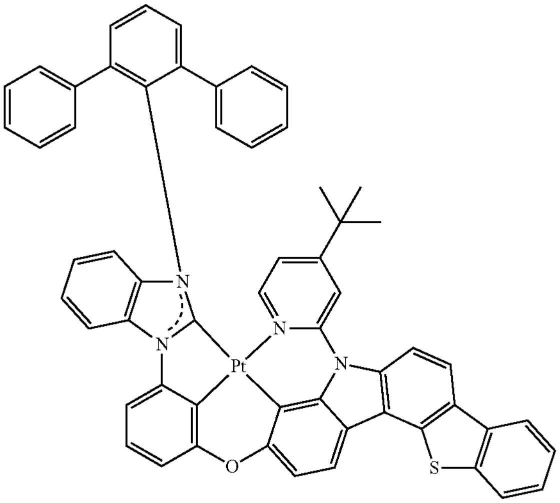
PtS2
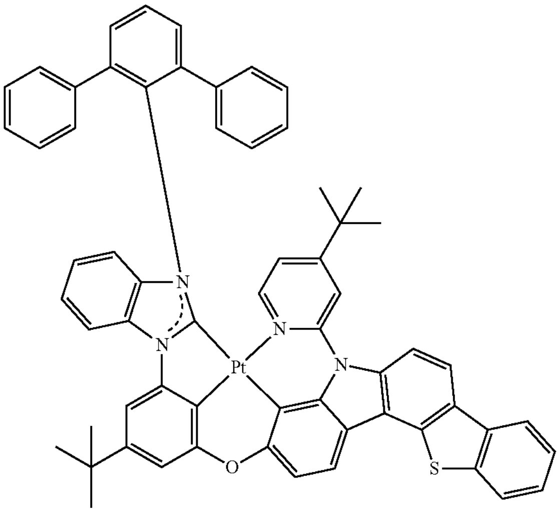
PtS3
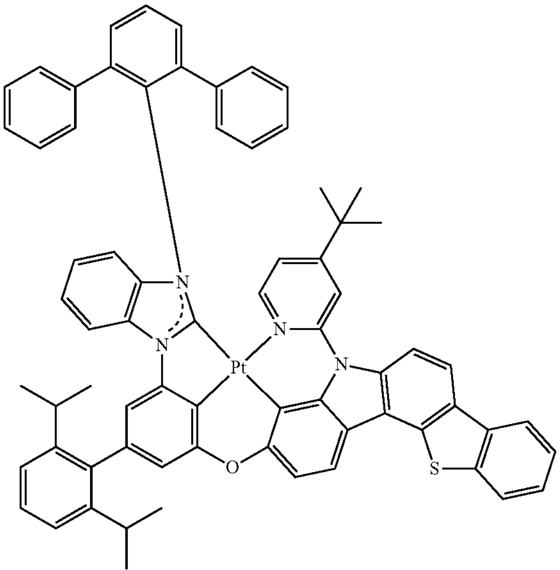
-continued
PtS4
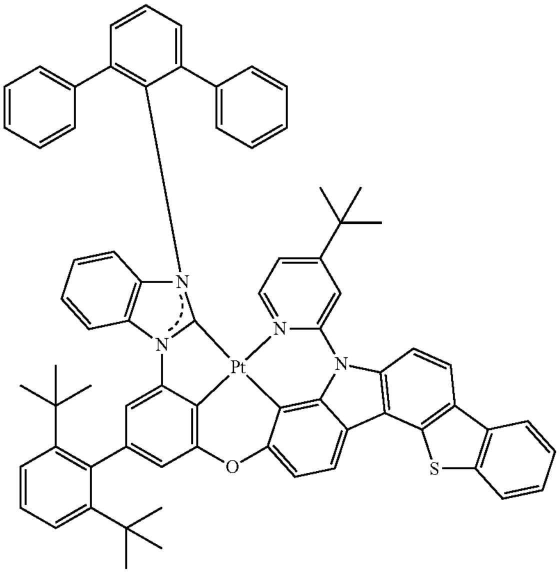
PtS5
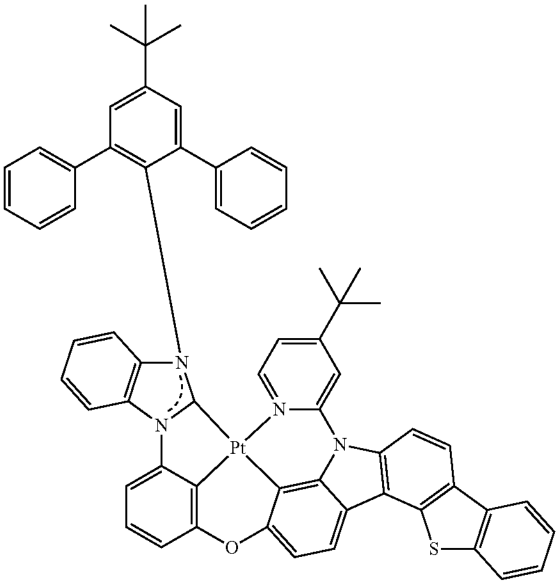

-continued
PtS6
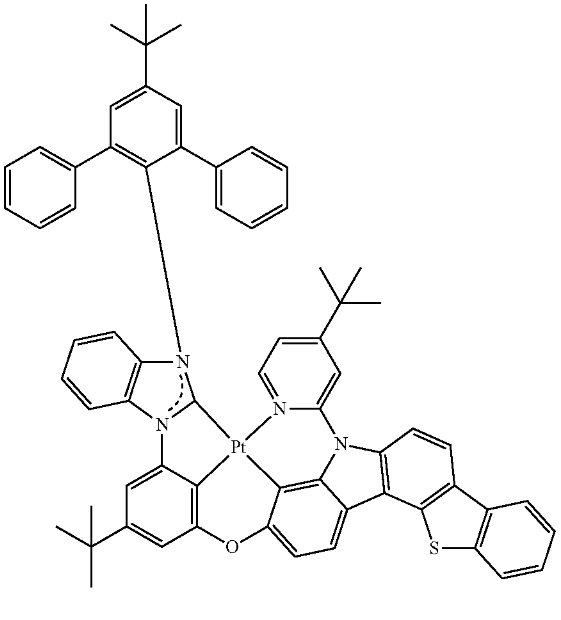
PtS7
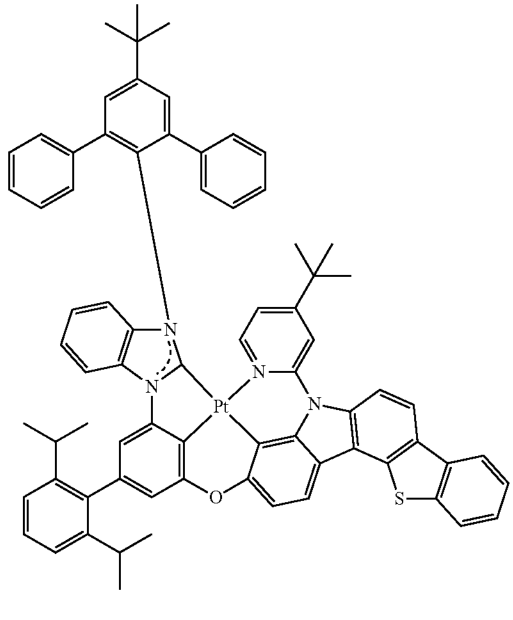
-continued
PtS8
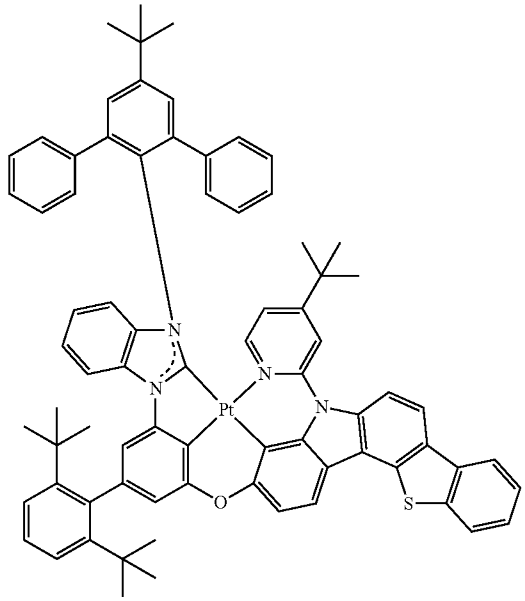
PtS9
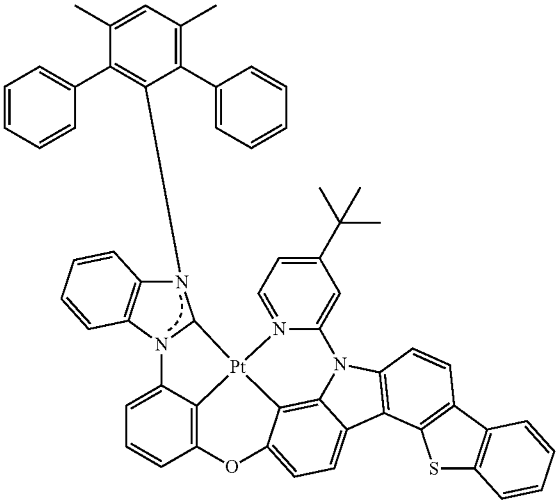

-continued
PtS10
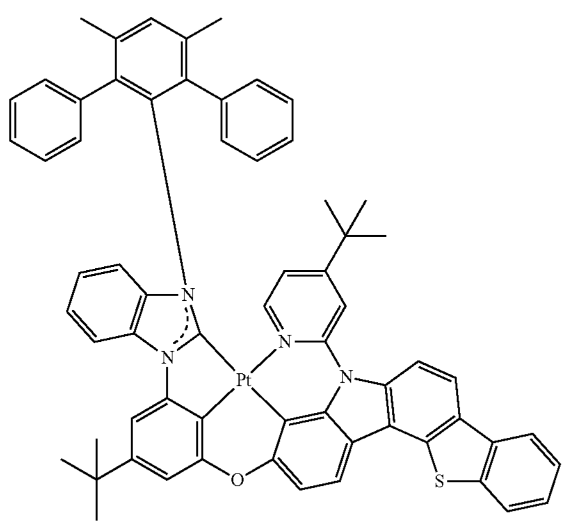
PtS11
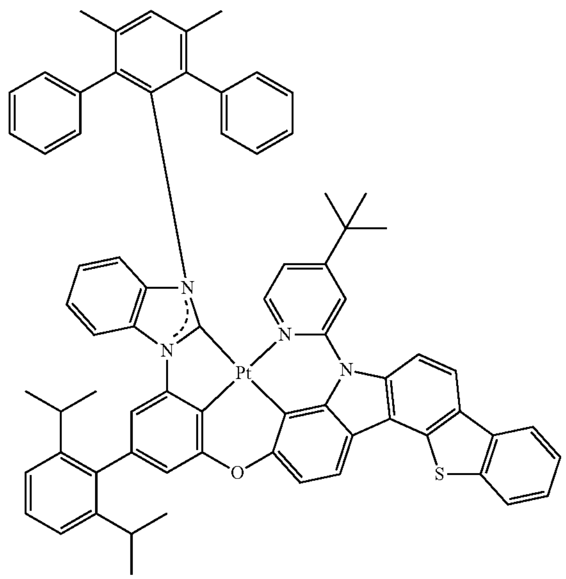
-continued
PtS12
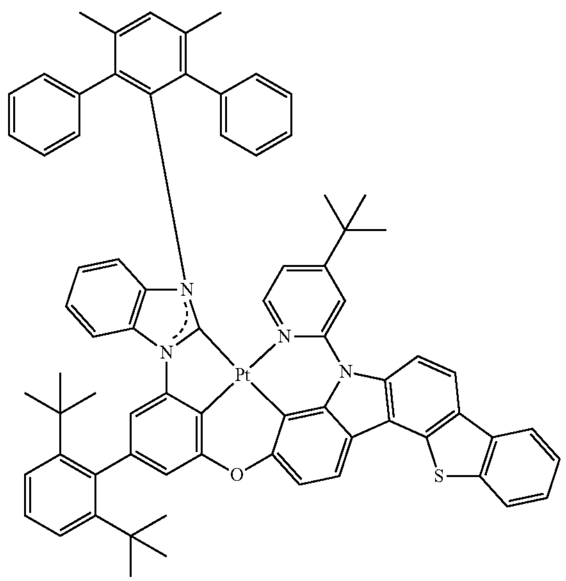
PtS13
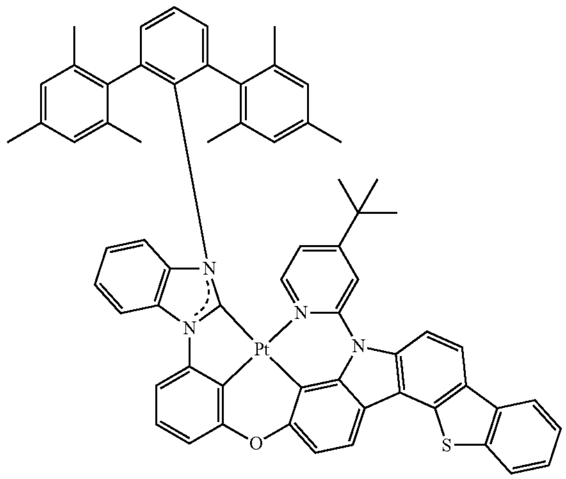
PtS14
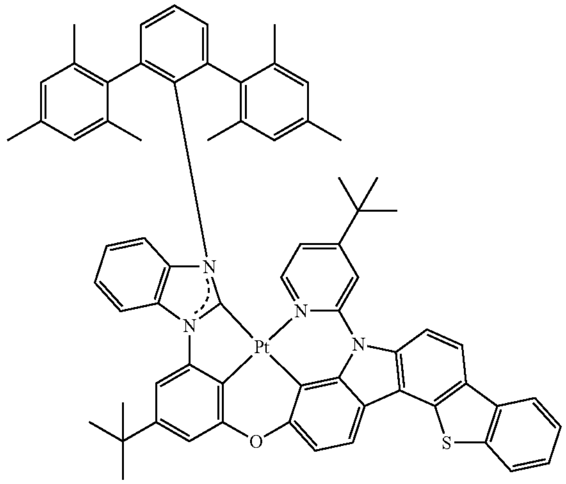

-continued
PtS15
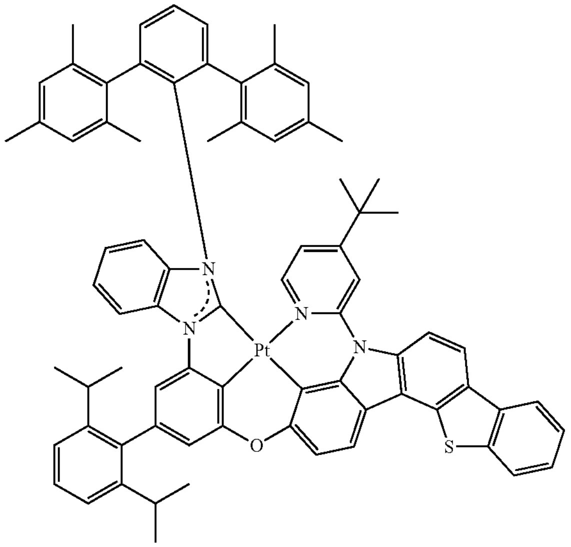
PtS16
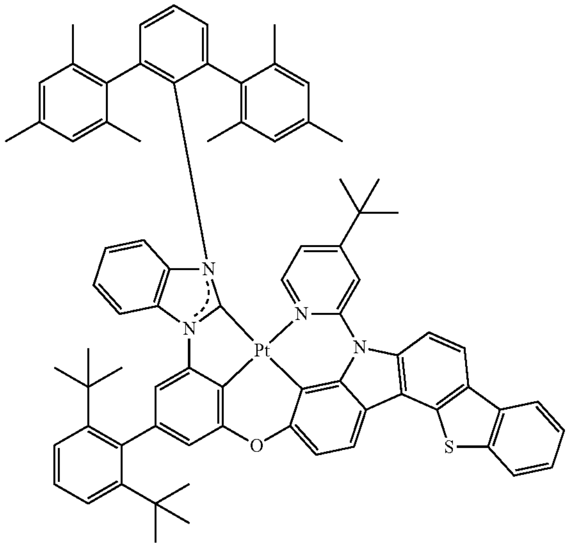
PtS17
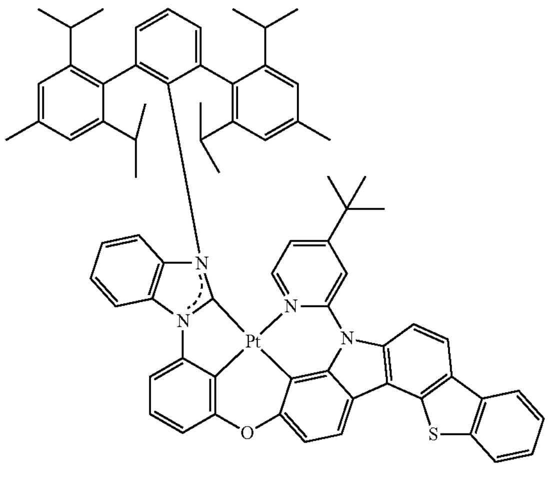
-continued
PtS18
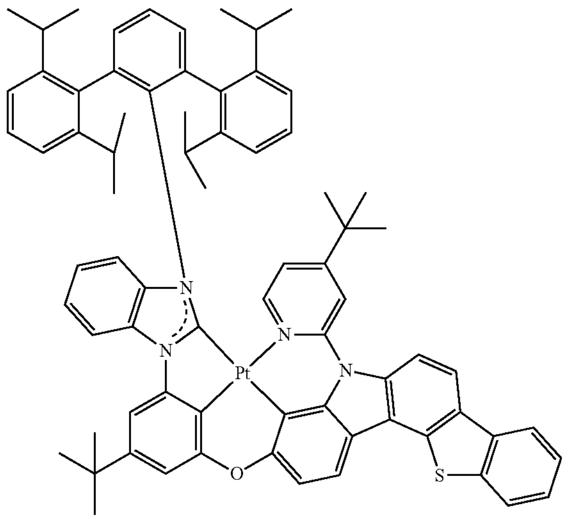
PtS19
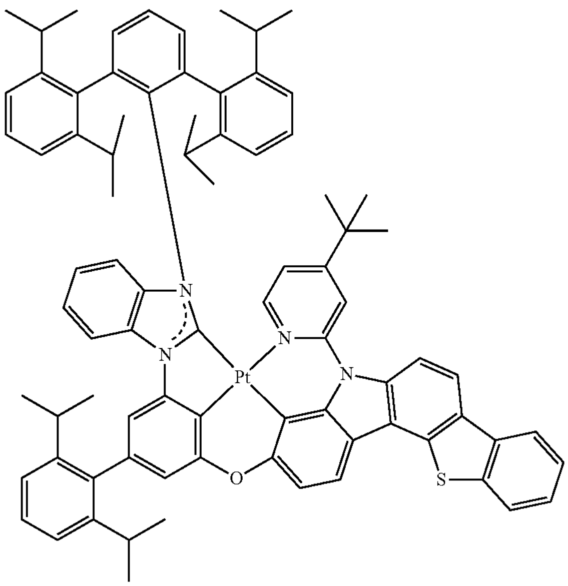

-continued
PtS20
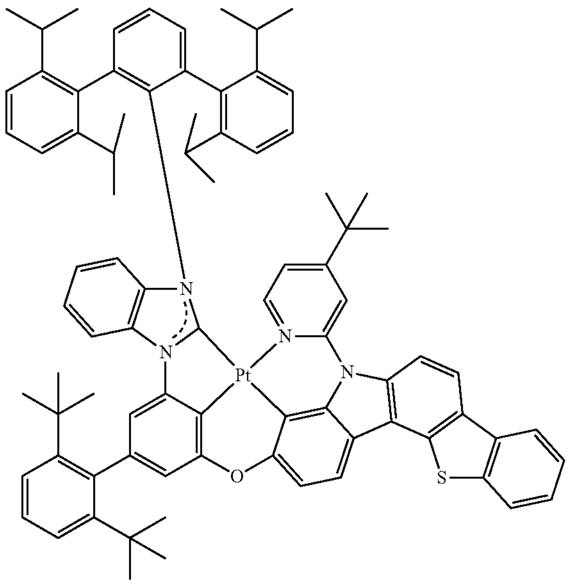
PtS21
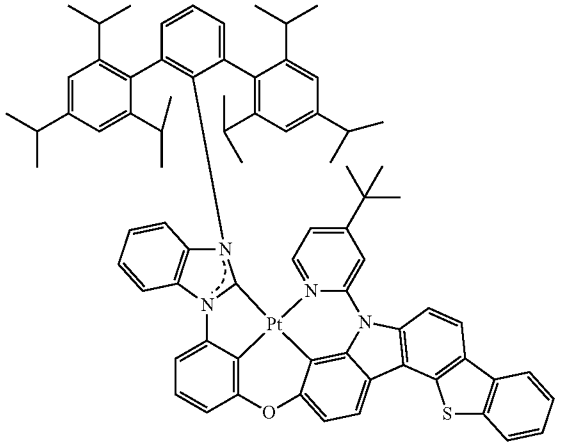
PtS22
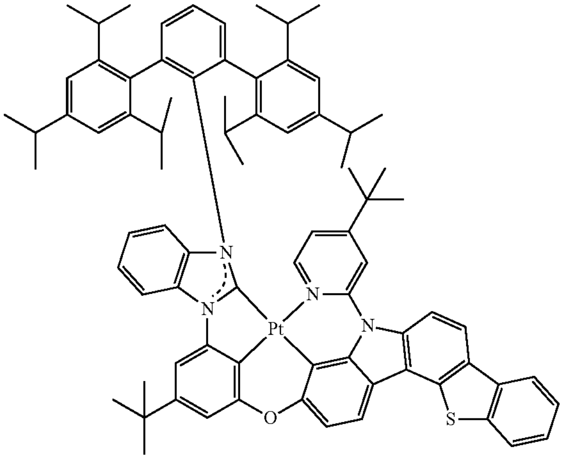
-continued
PtS23
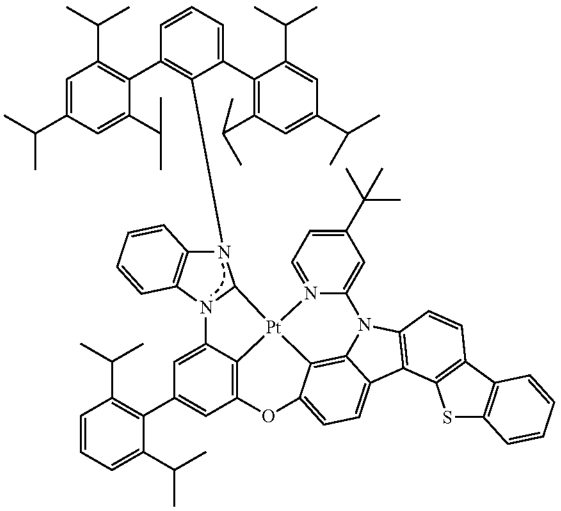
PtS24
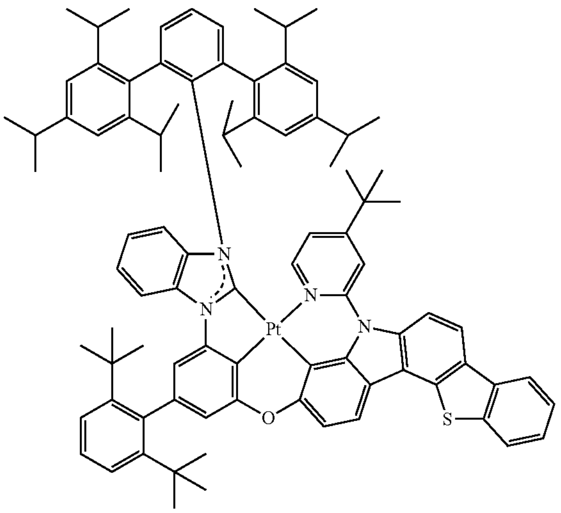
PtS25
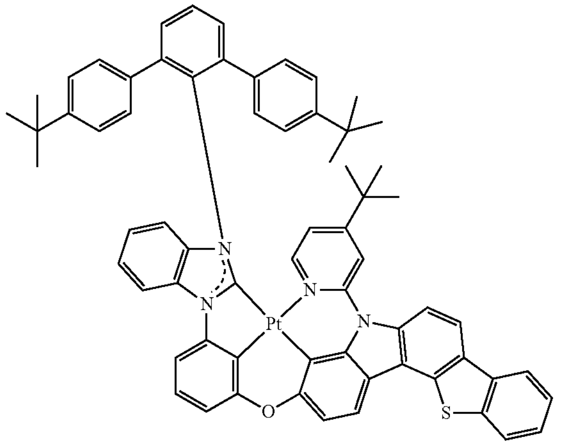

-continued
PtS26
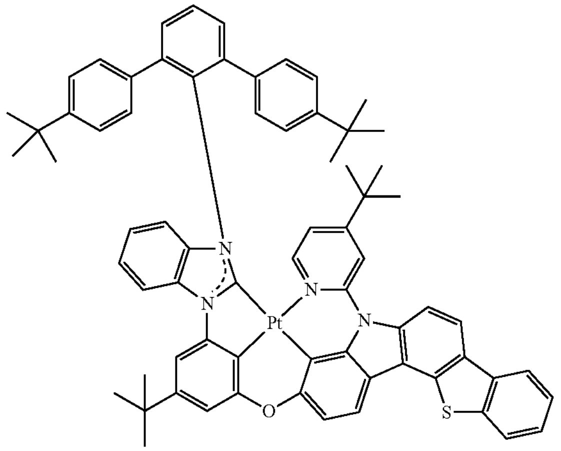
PtS27
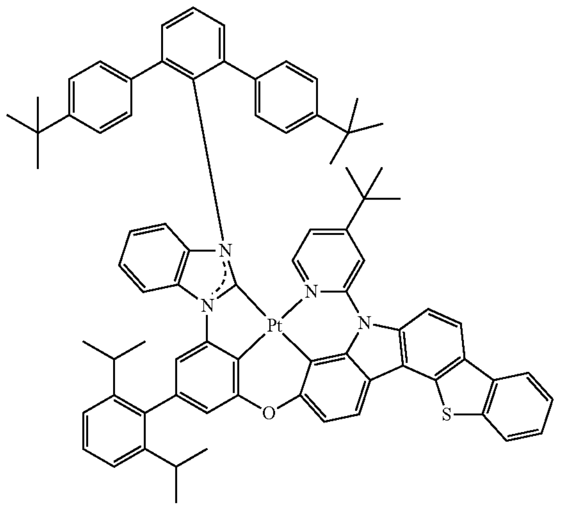
PtS28
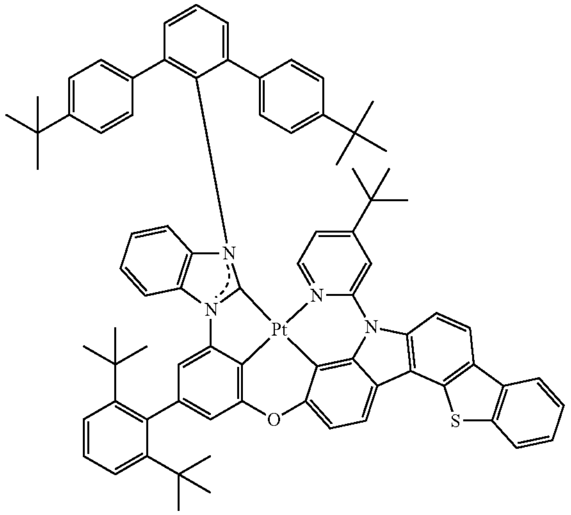
-continued
PtS29
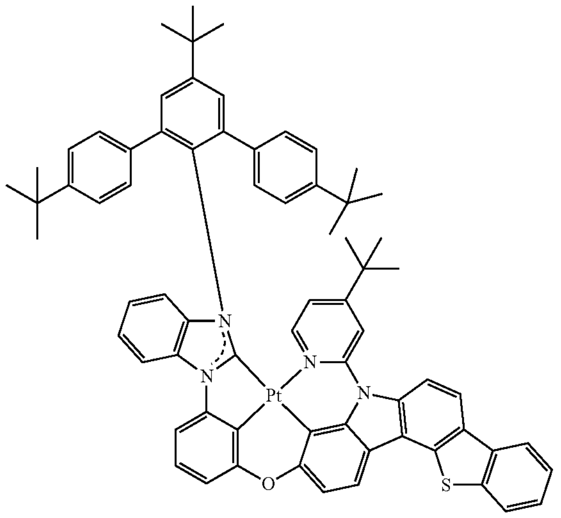
PtS30
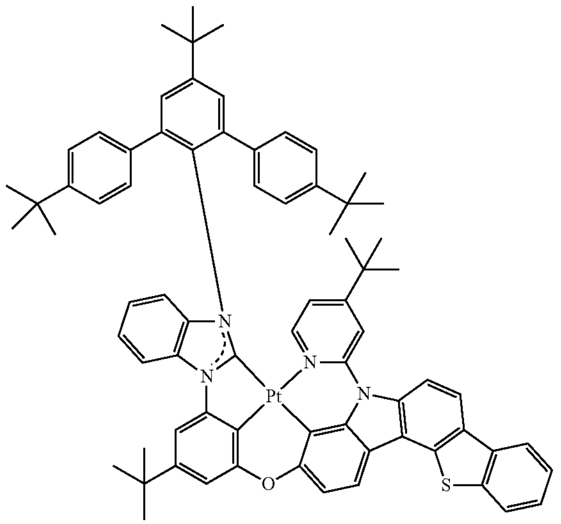

-continued
PtS31
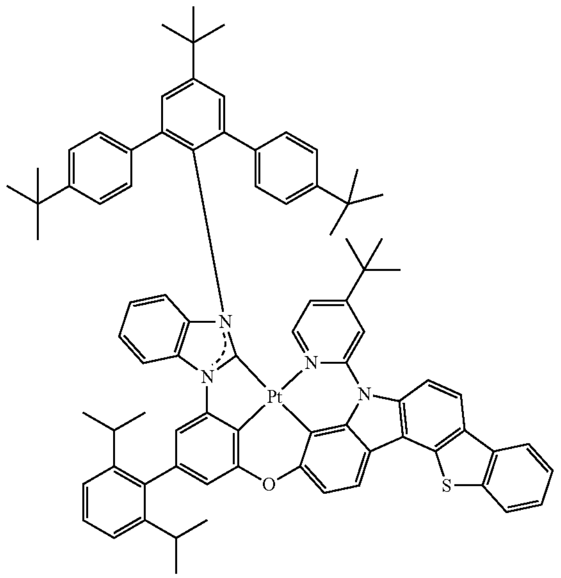
PtS32
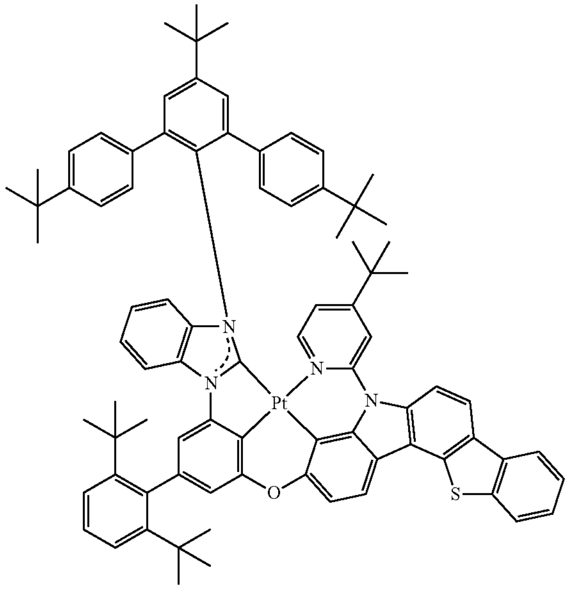
-continued
PtS33
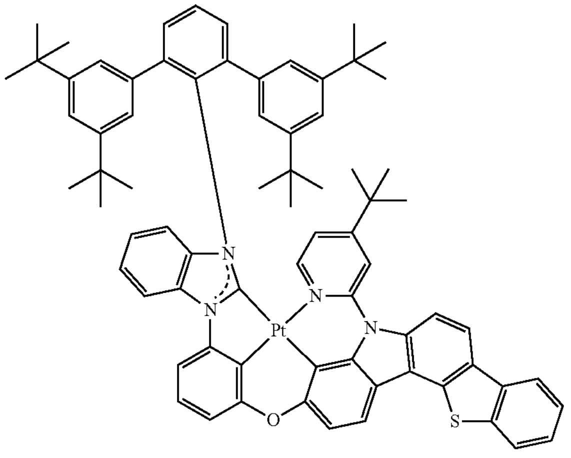
PtS34
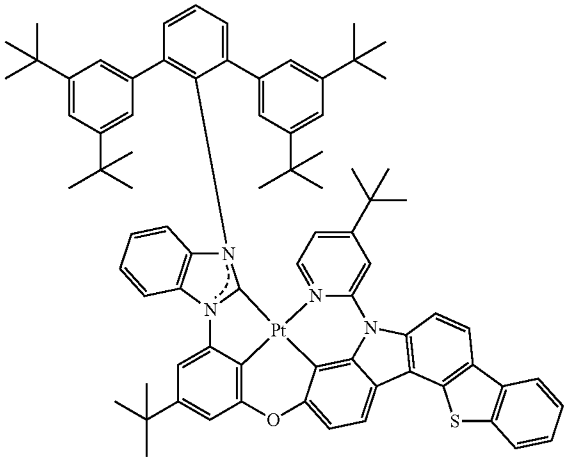
PtS35
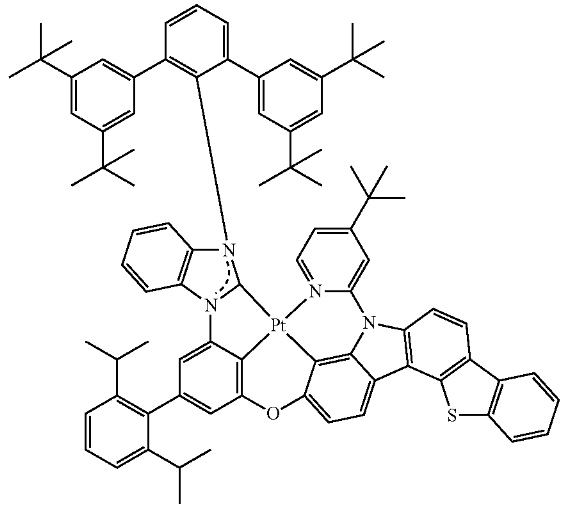

-continued
PtS36
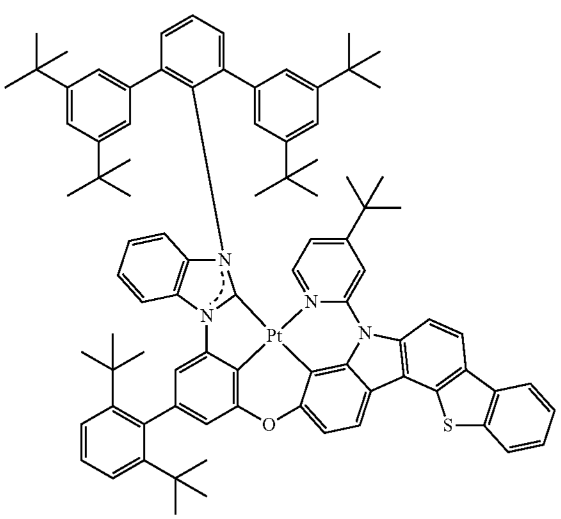
PtS37
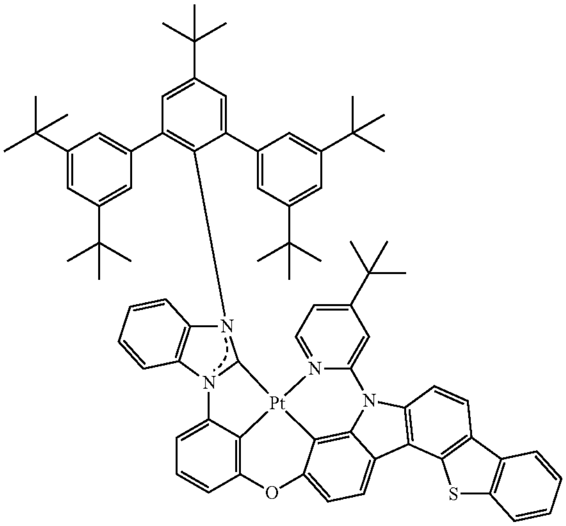
PtS38
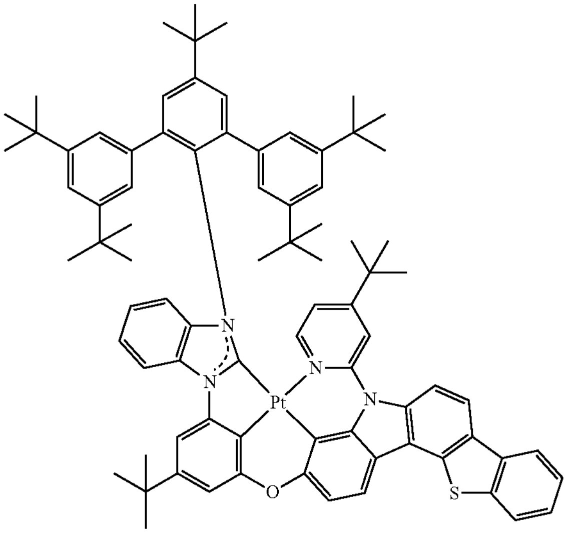
-continued
PtS39
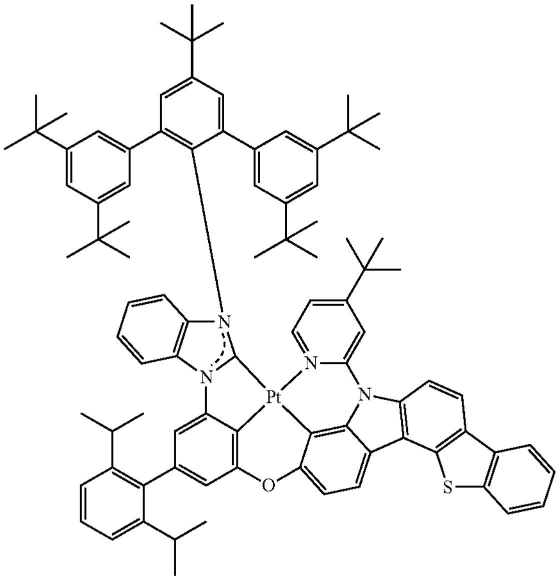
PtS40
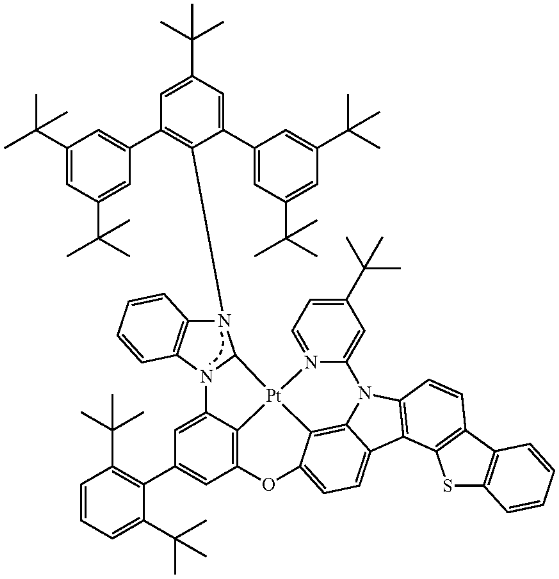

-continued
PtS41
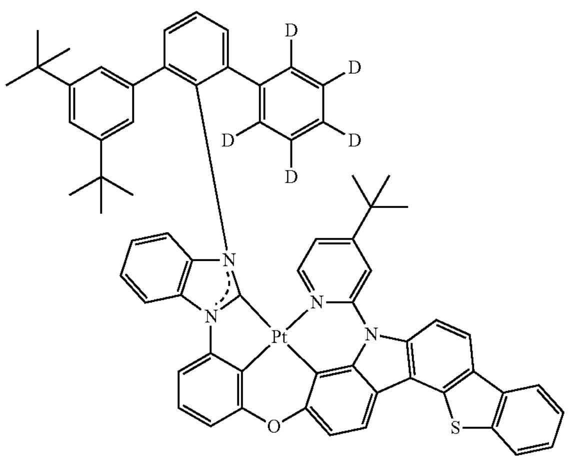
PtS42
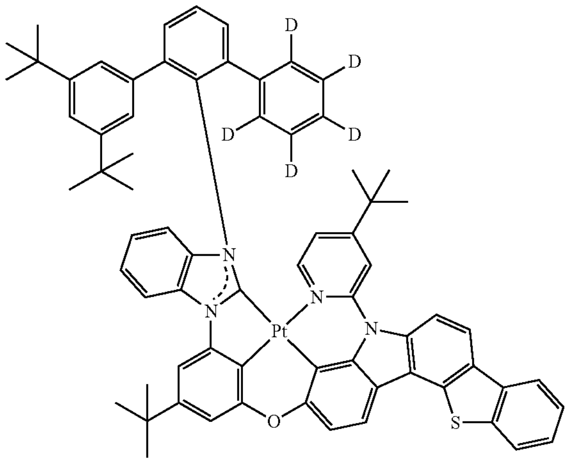
PtS43
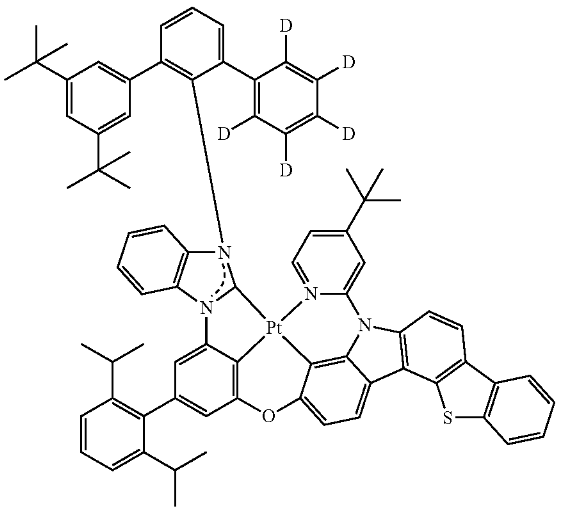
-continued
PtS44
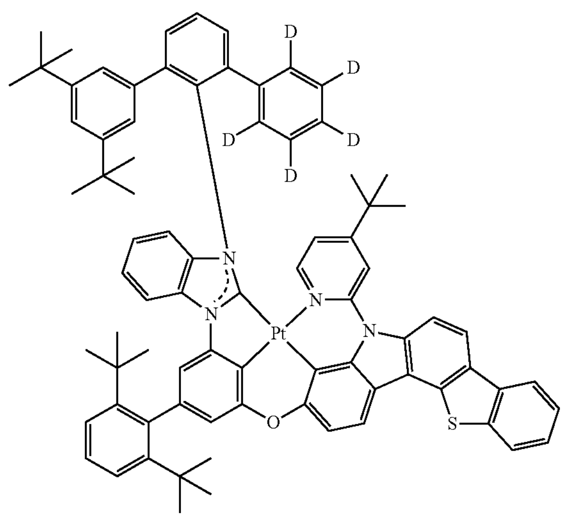
PtS45
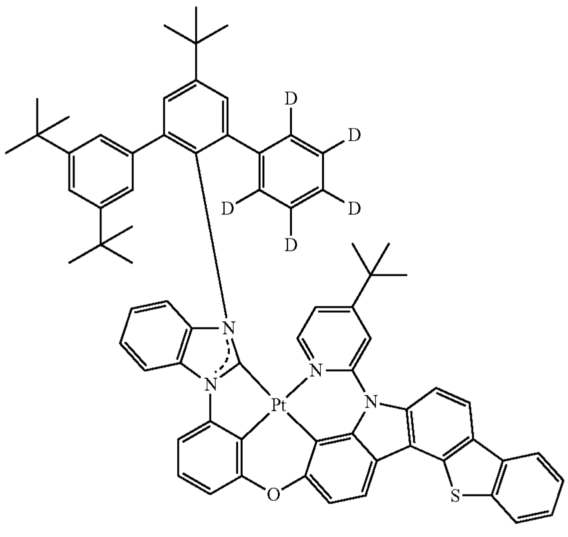
PtS46
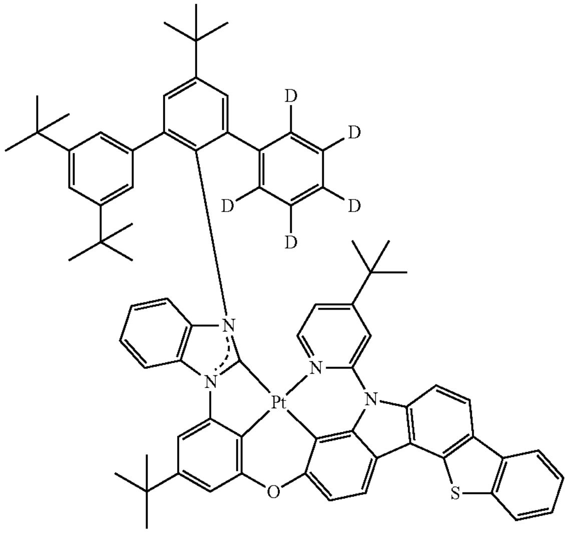

-continued
PtS47
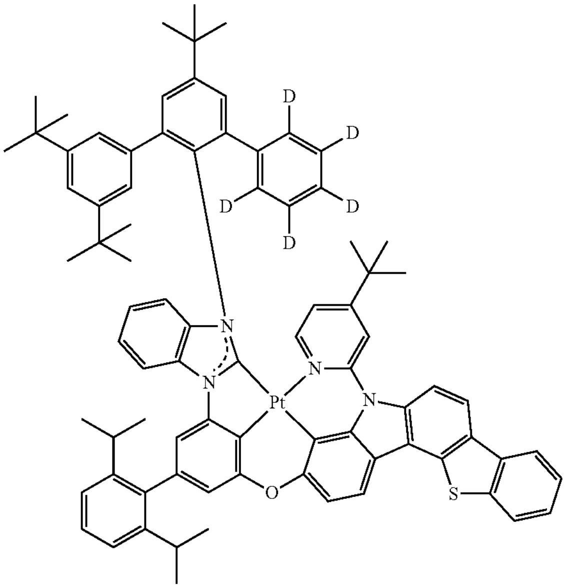
PtS48
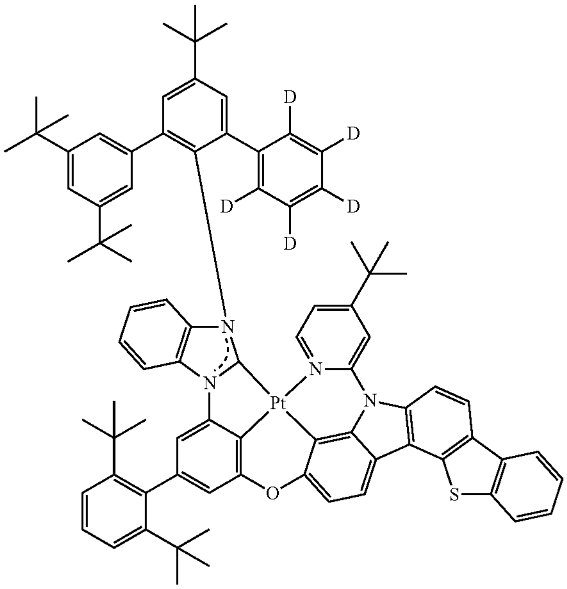
-continued
PtS49
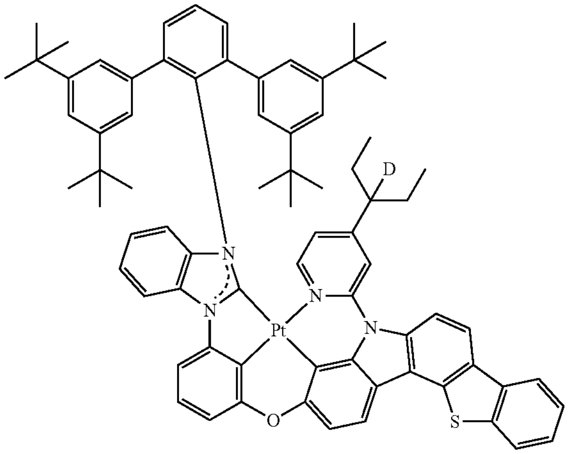
PtS50
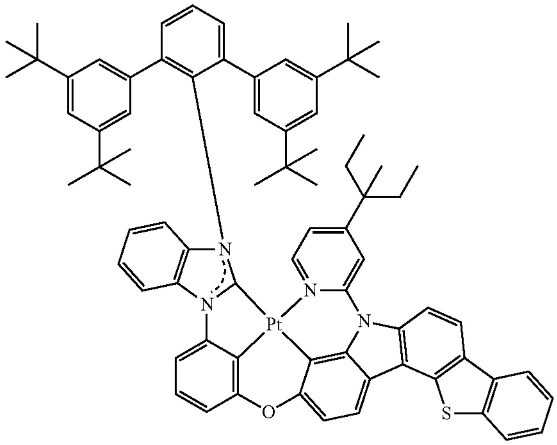
PtS51
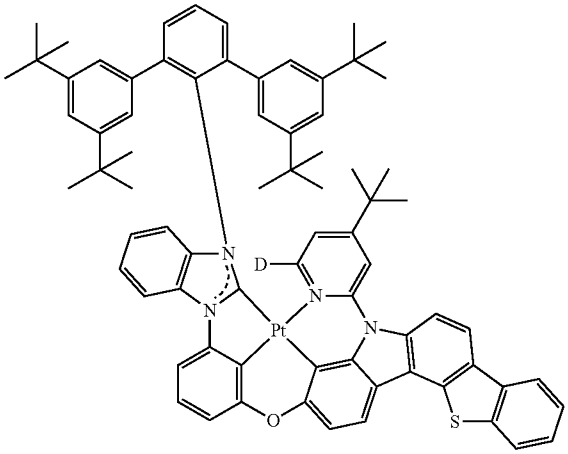

-continued
PtS52
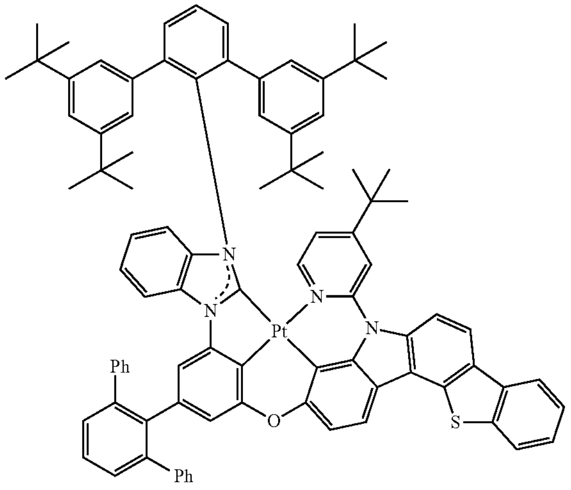
PtS53
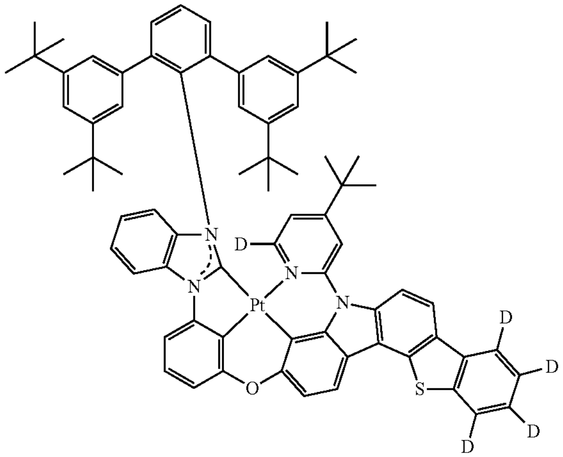
PtS54
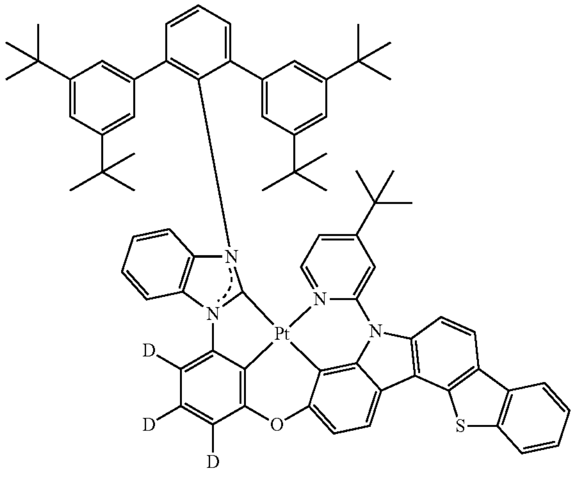
-continued
PtS55
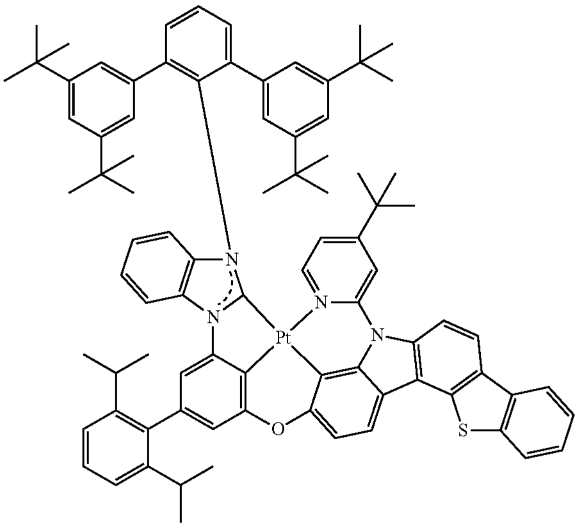
PtS56
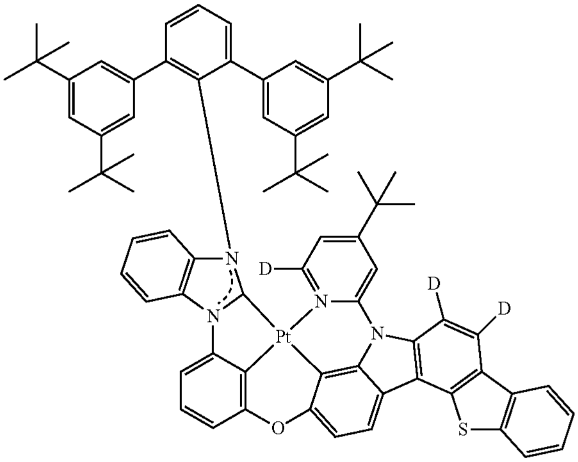
PtS57
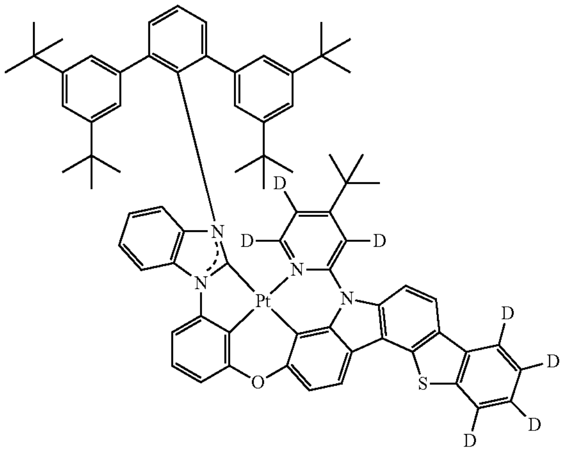

-continued
PtS58
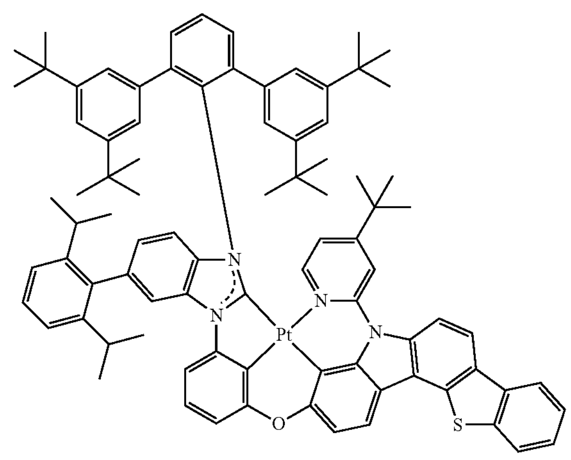
PtS59
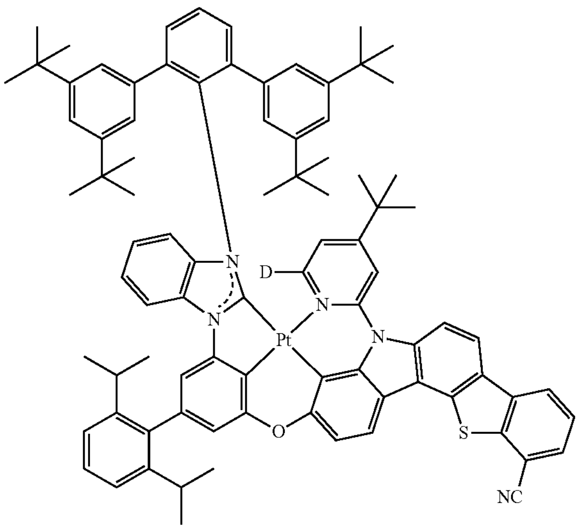
PtS60
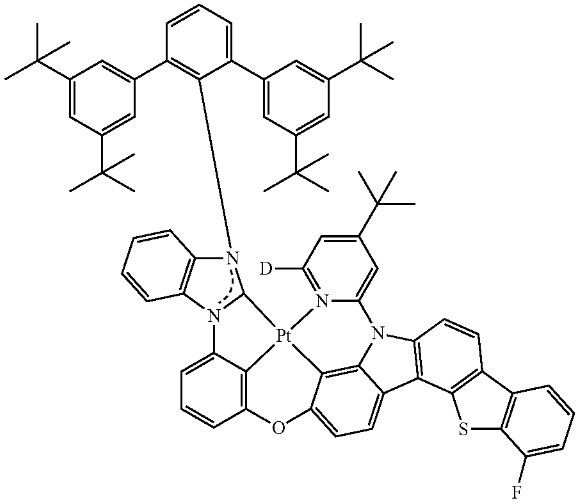
-continued
PtS61
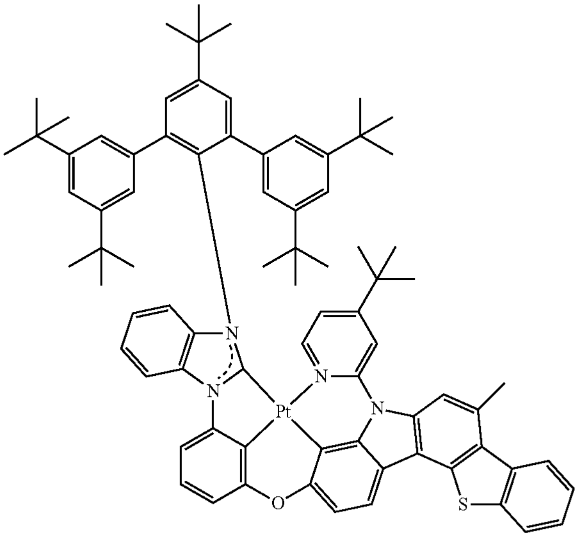
PtS62
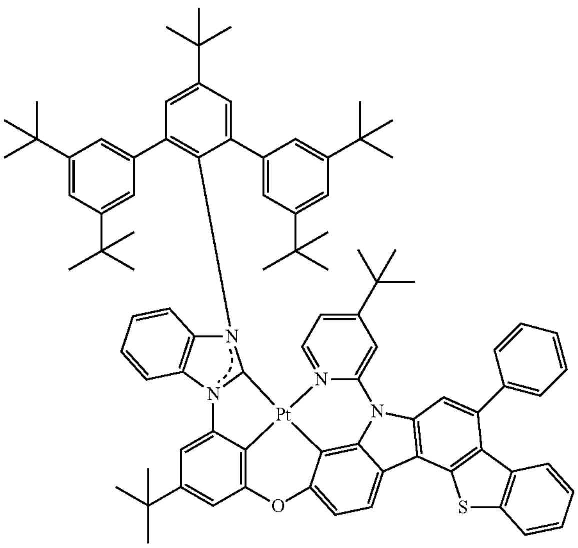
PtS63
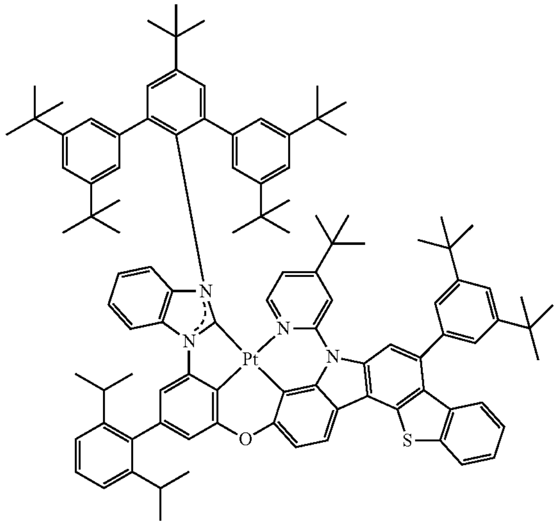

-continued
PtS64
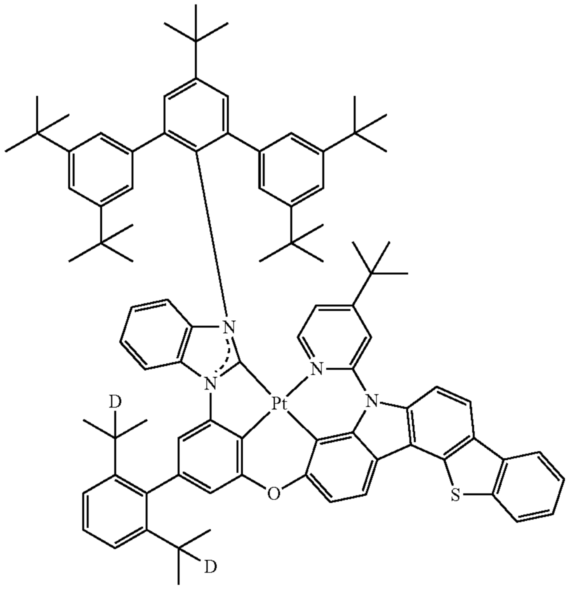
PtS65
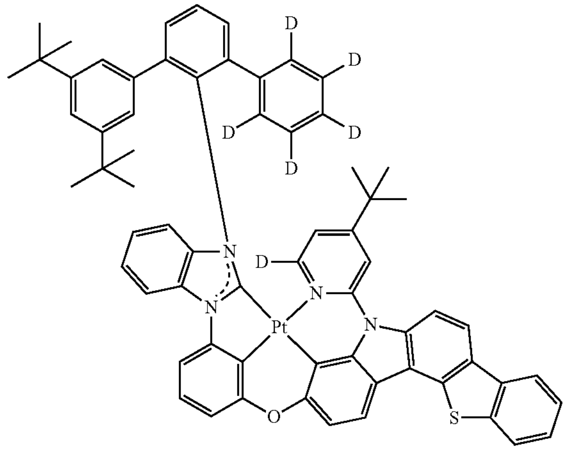
PtS66
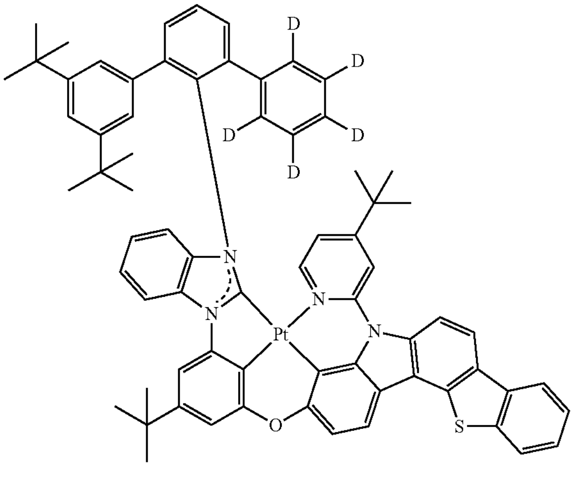
-continued
PtS67
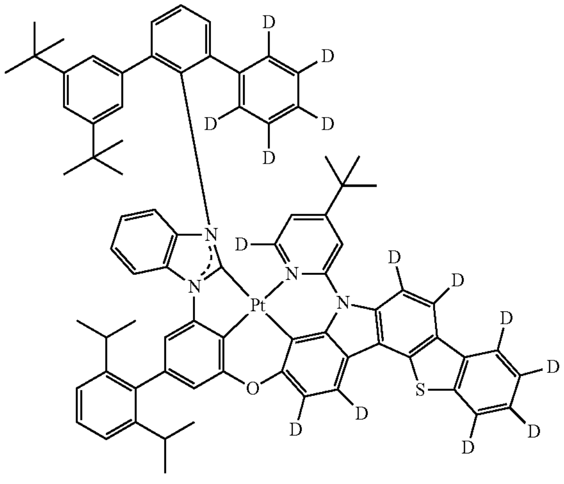
PtS68
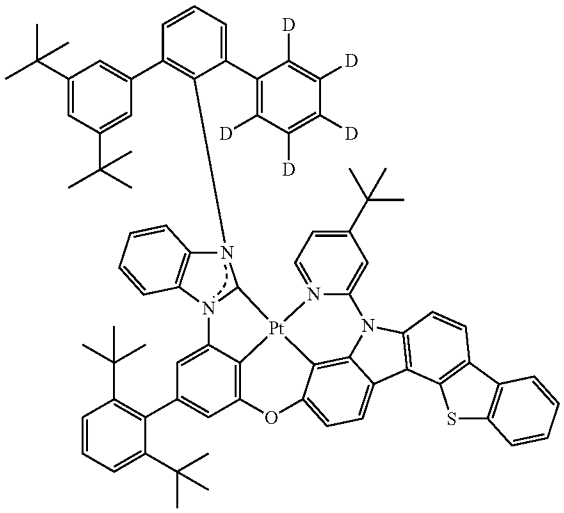
PtS69
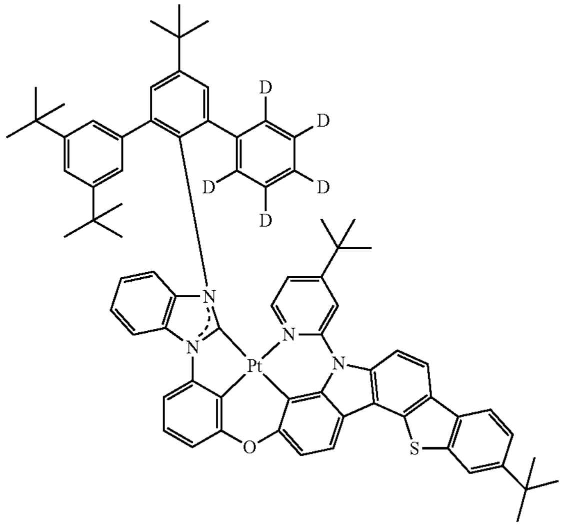

-continued
PtS70
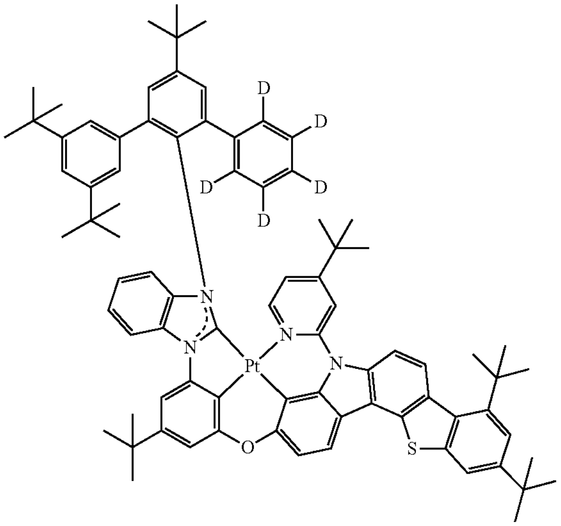
-continued
PtS72
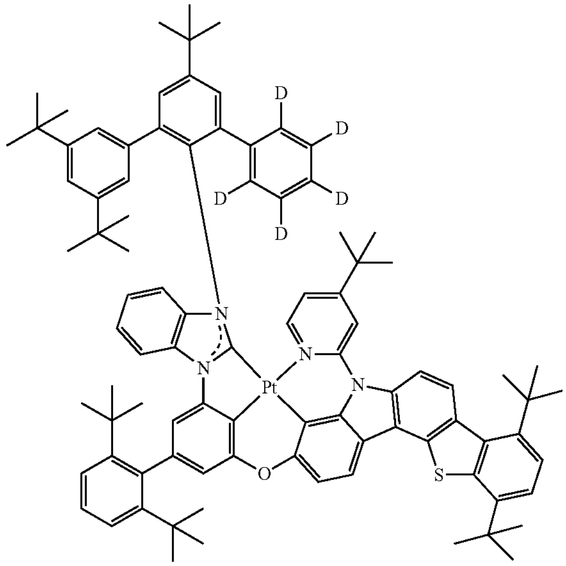
PtS71
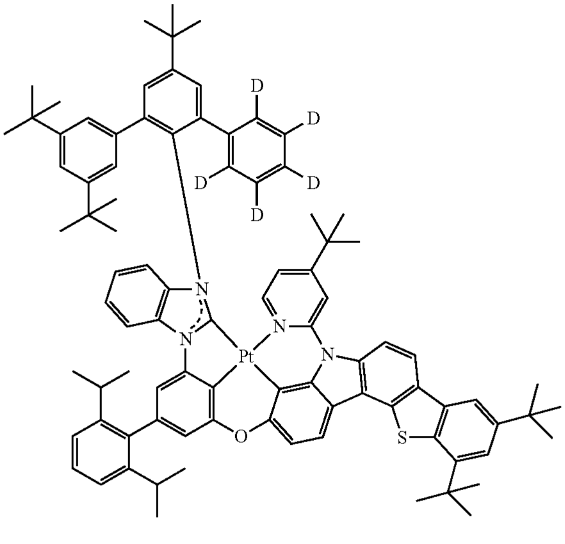
PtS73
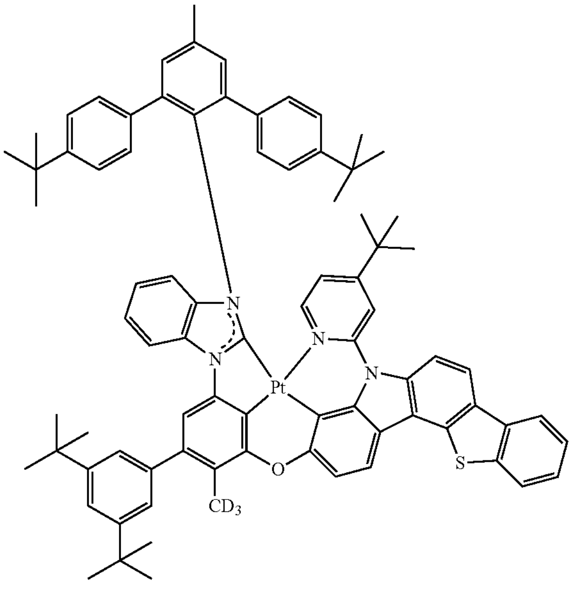

-continued
PtS74
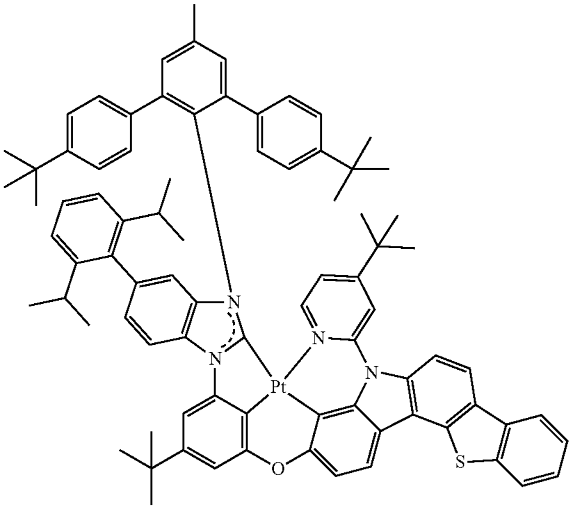
PtS75
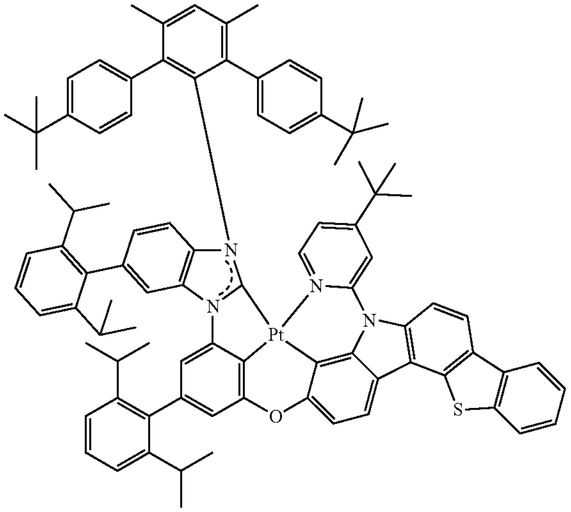
PtS76
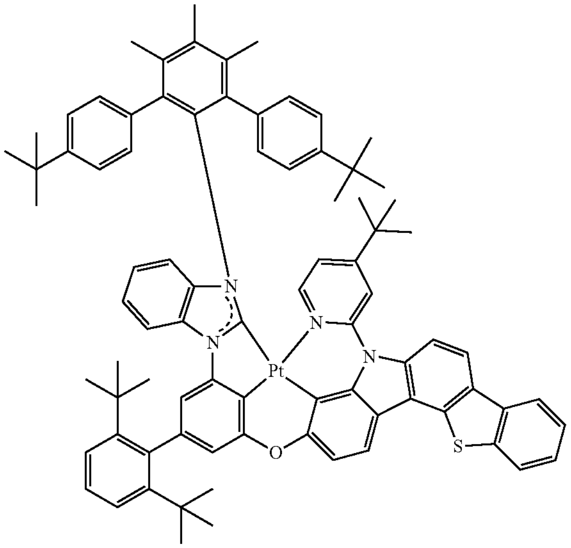
-continued
PtS77
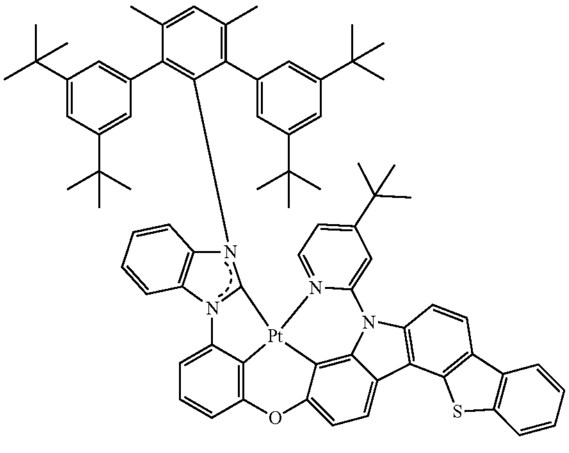
PtS78
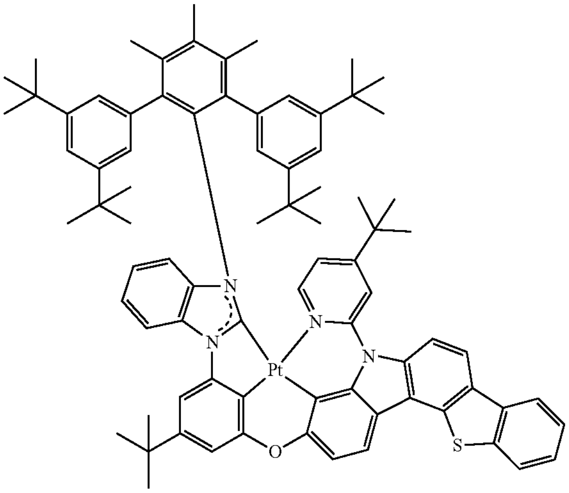
PtS79
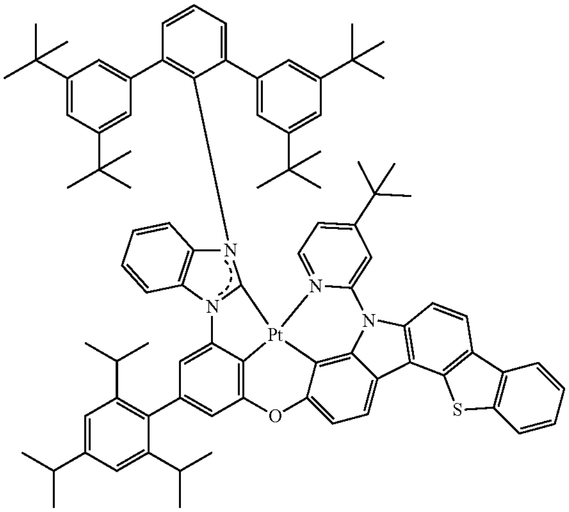

-continued
PtS80
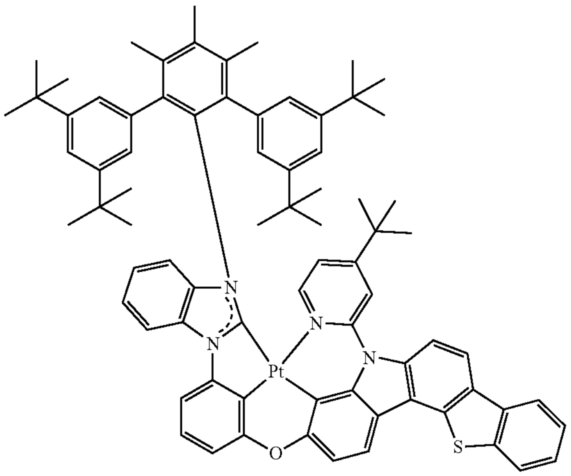
PtS81
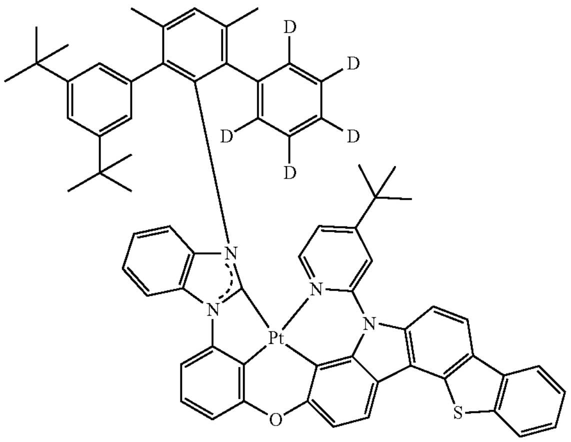
PtS82
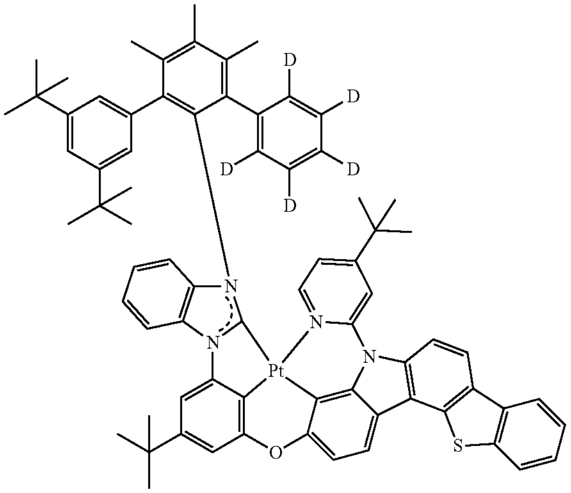
-continued
PtS83
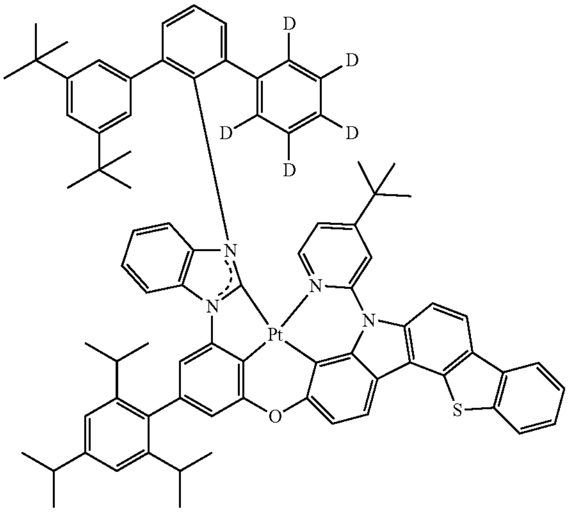
PtS84
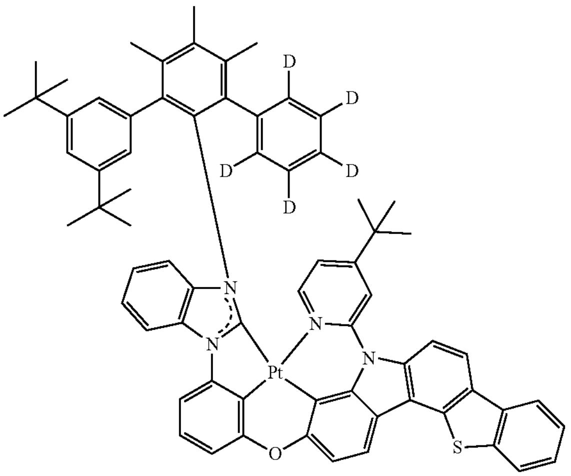
PtS85
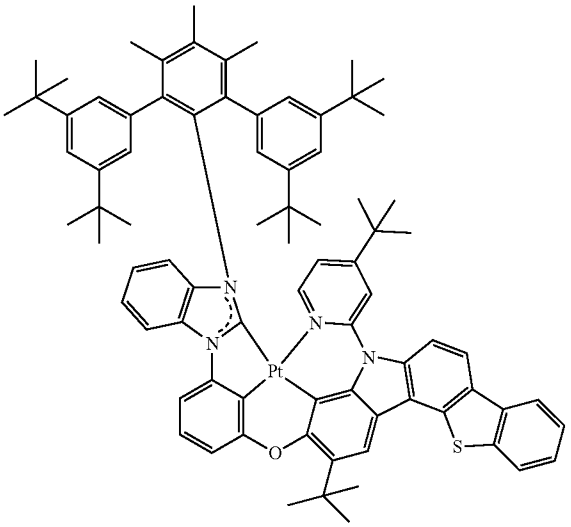

-continued
PtS86
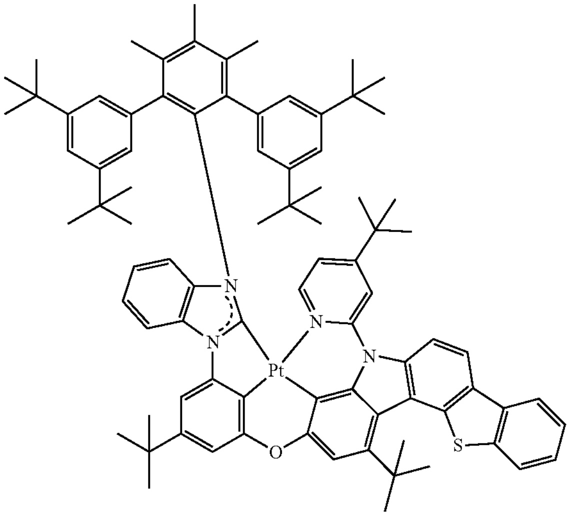
PtS87
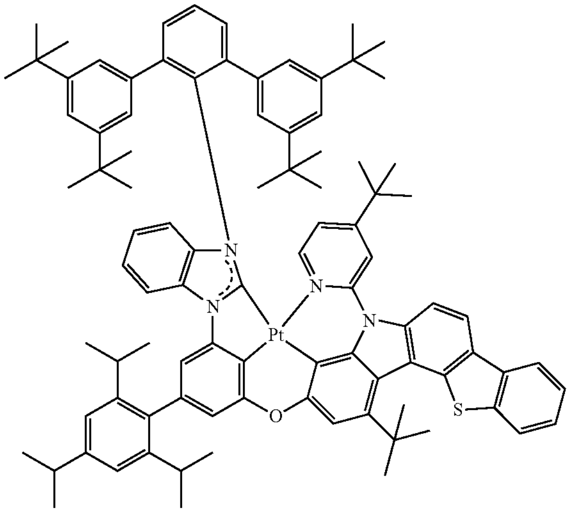
-continued
PtS88
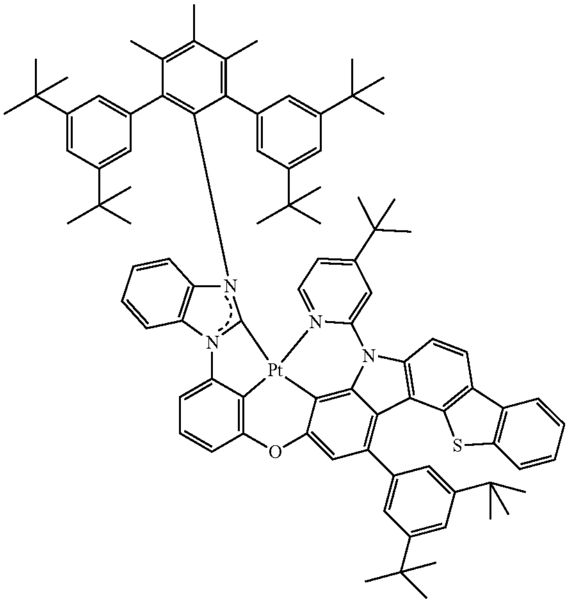
PtS89
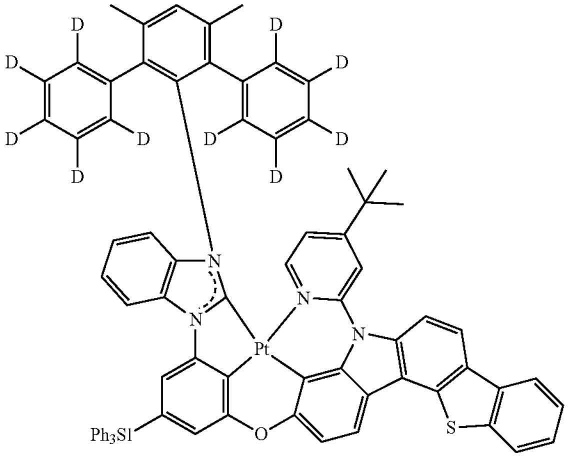
PtS90
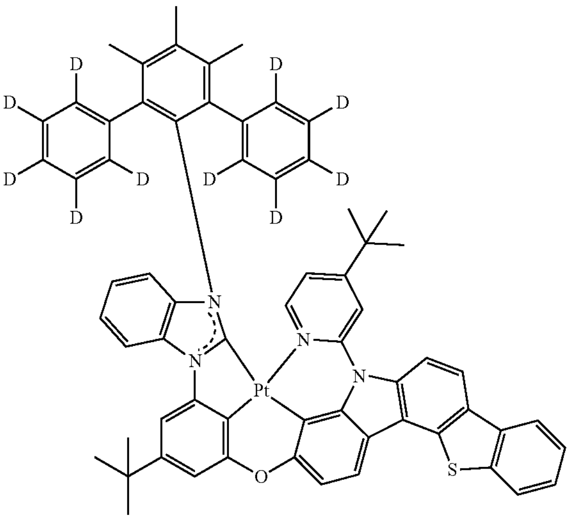

-continued
PtS91
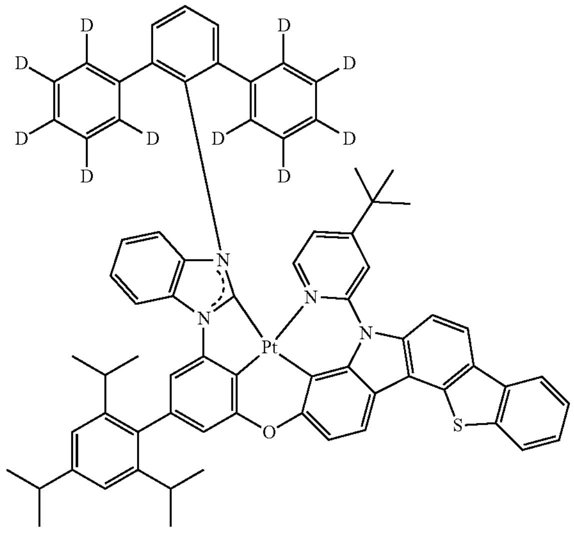
PtS92
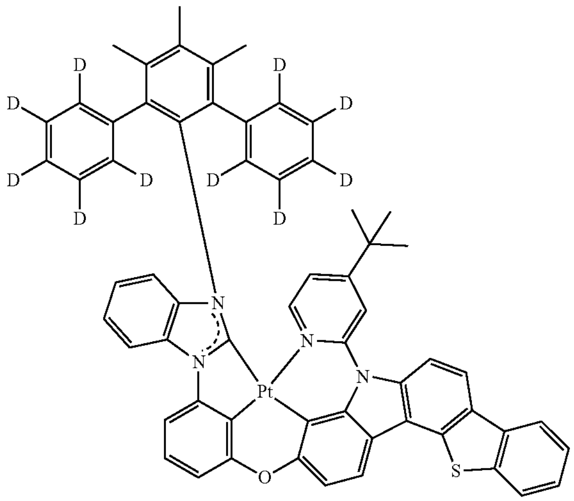
PtS93
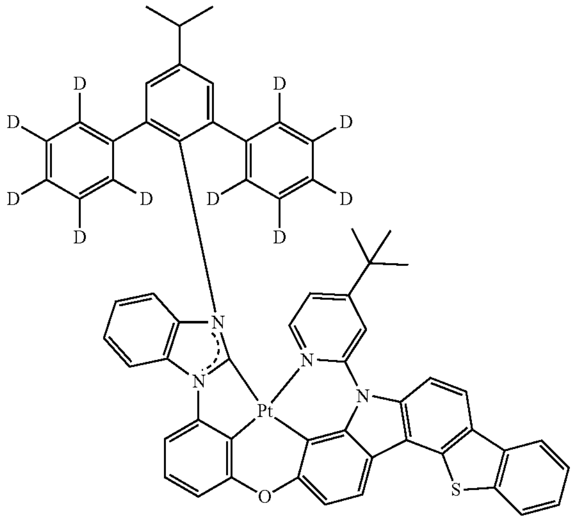
-continued
PtS94
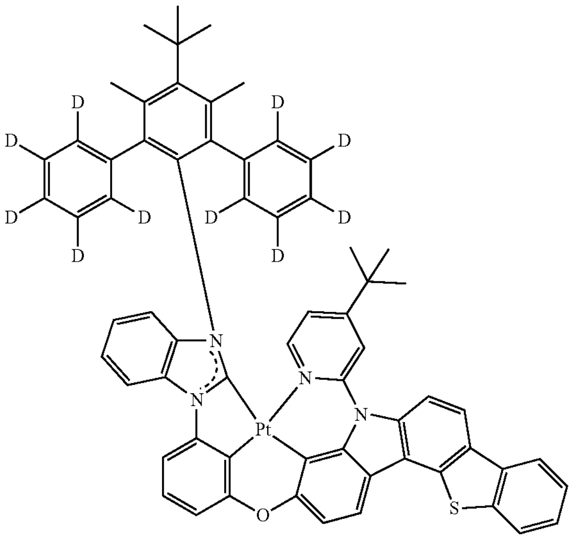
PtS95
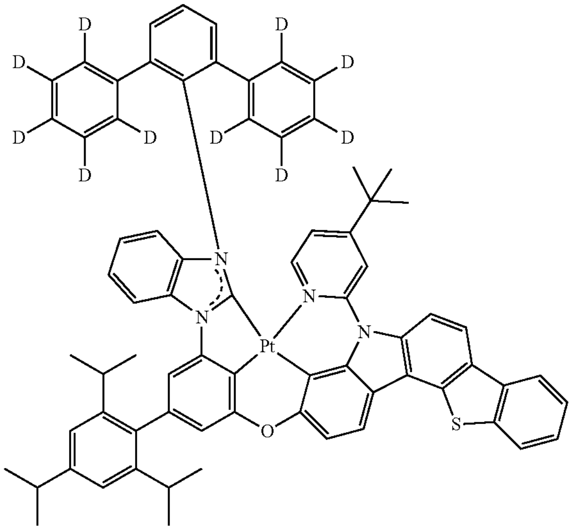
PtS96
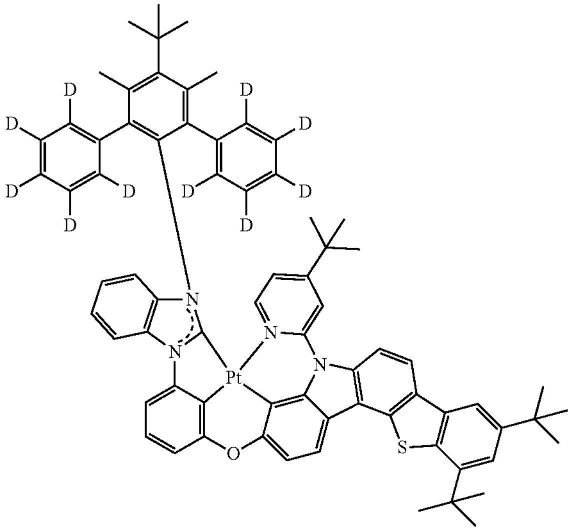

-continued
PtS97
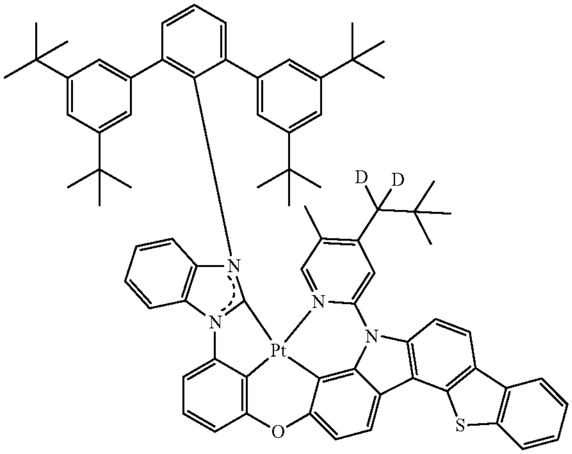
PtS98
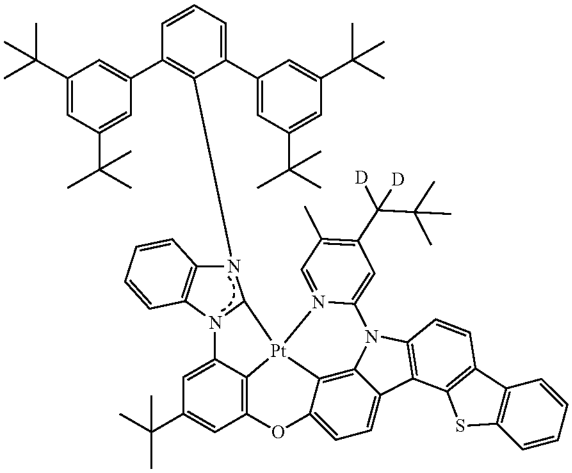
PtS99
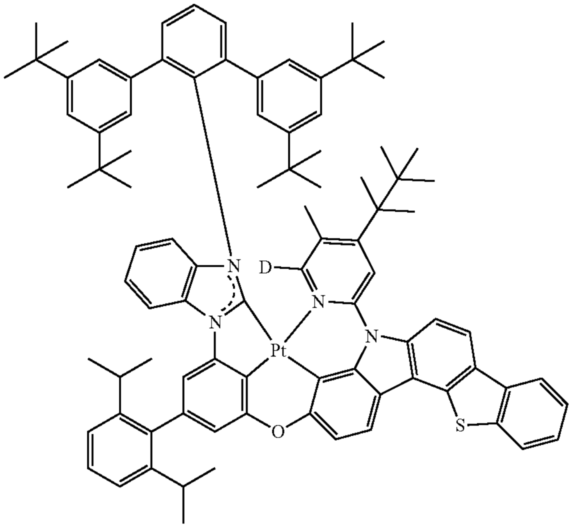
-continued
PtS100
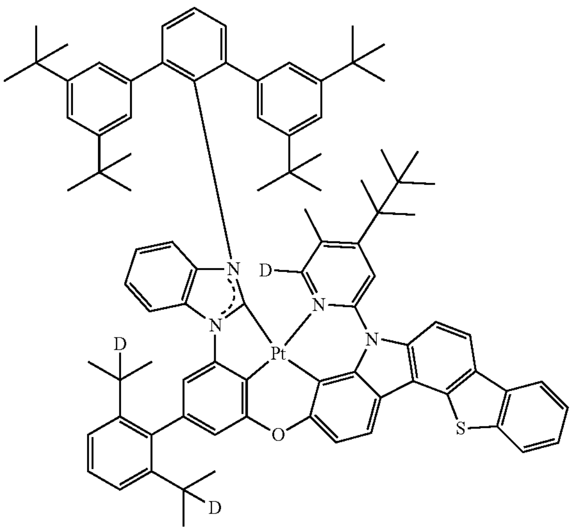
PtS101
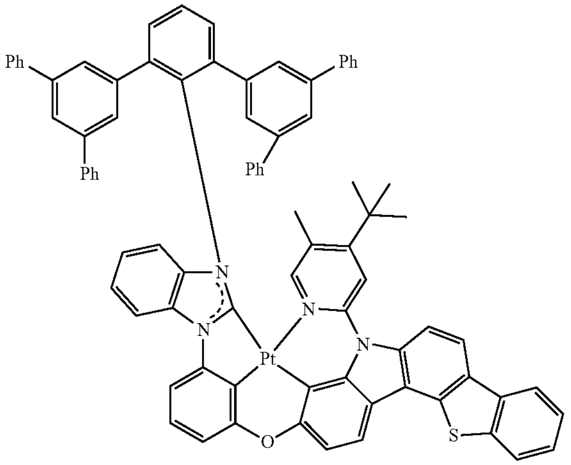
PtS102
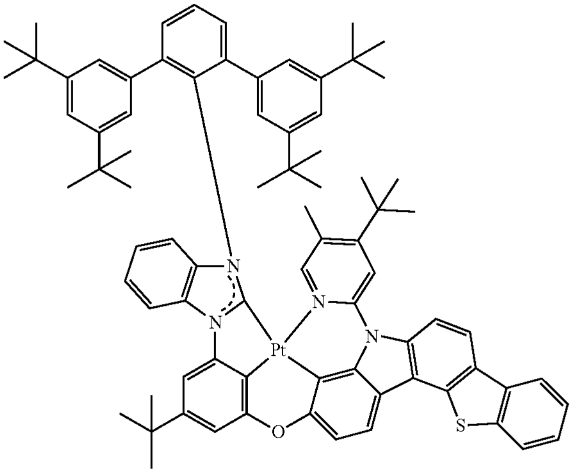

-continued
PtS103
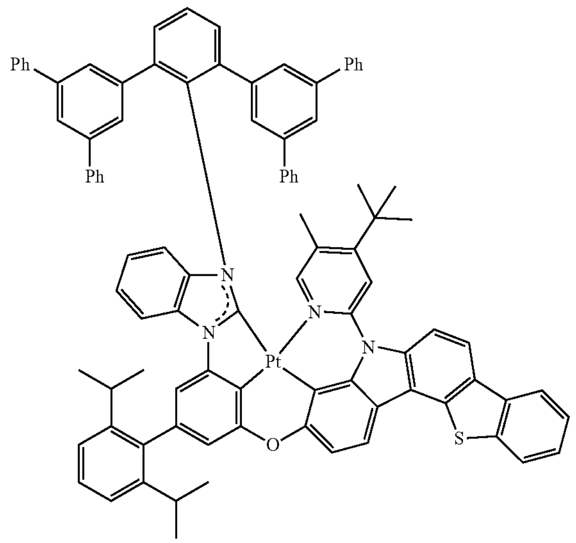
PtS104
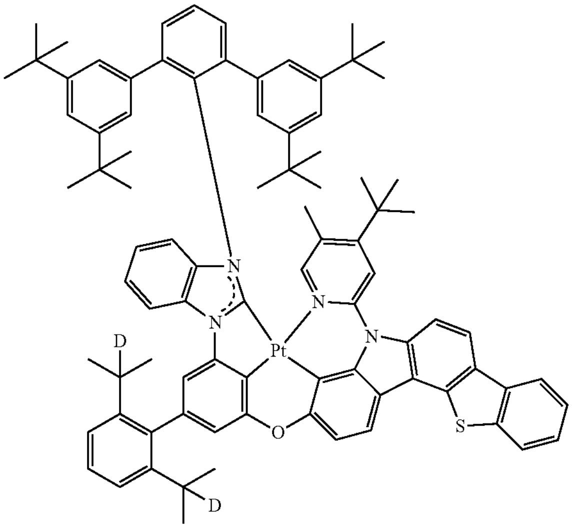
PtS105
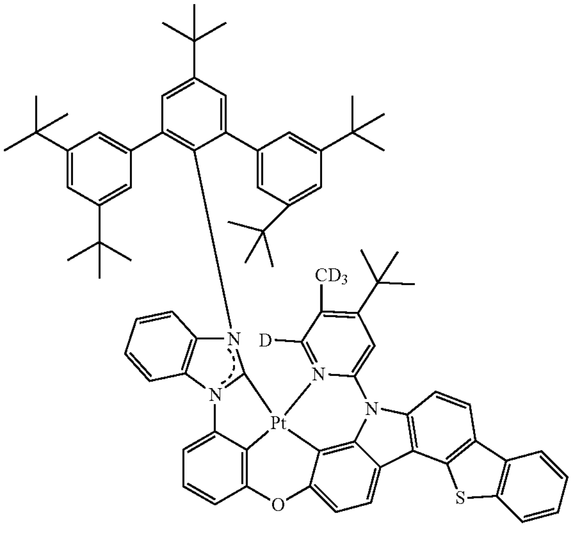
-continued
PtS106
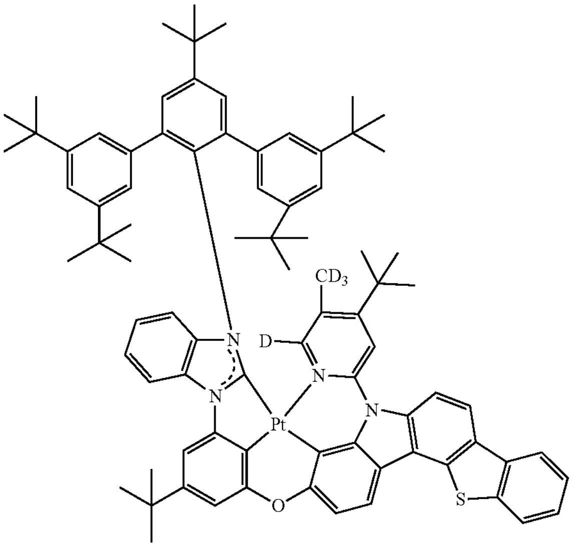
PtS107
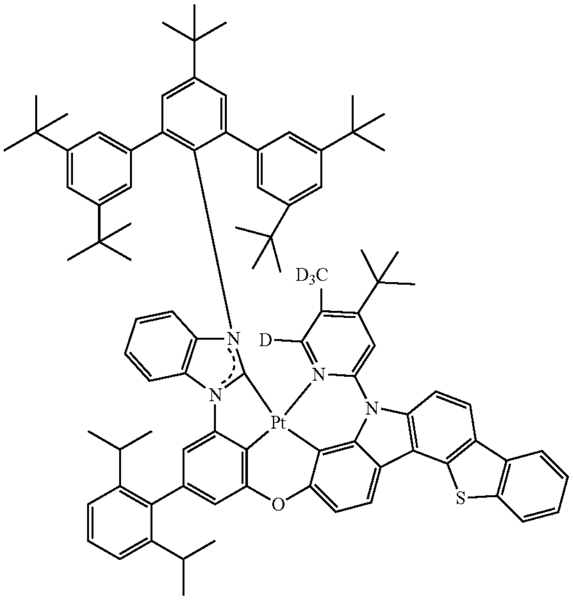

-continued
PtS108
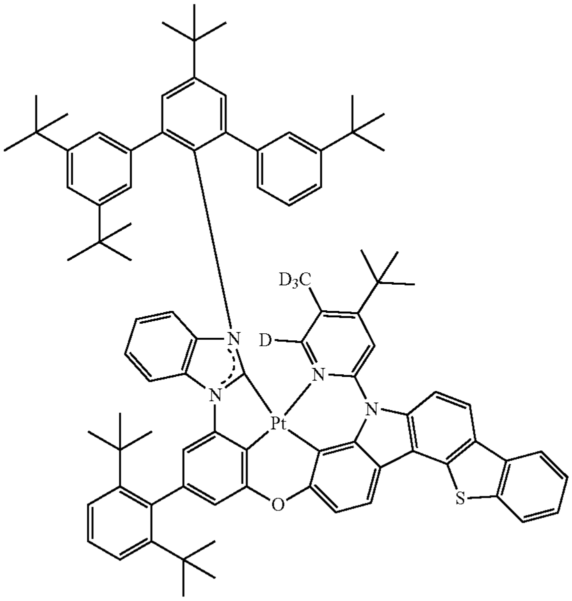
PtS109
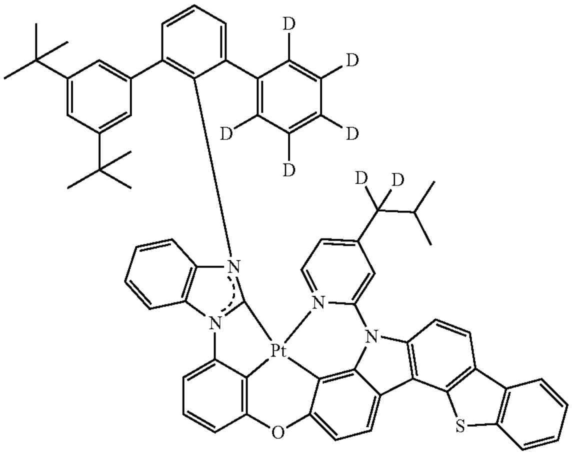
PtS110
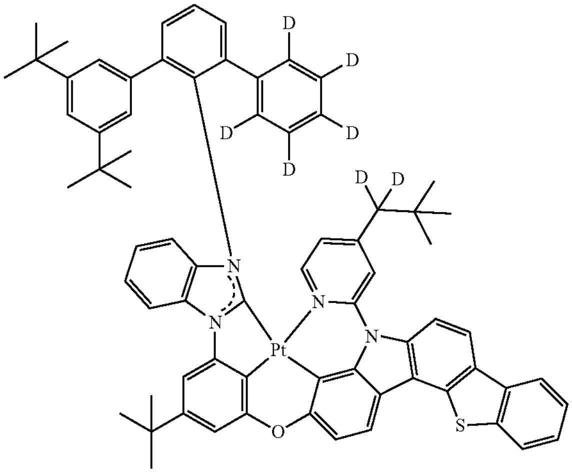
-continued
PtS1101
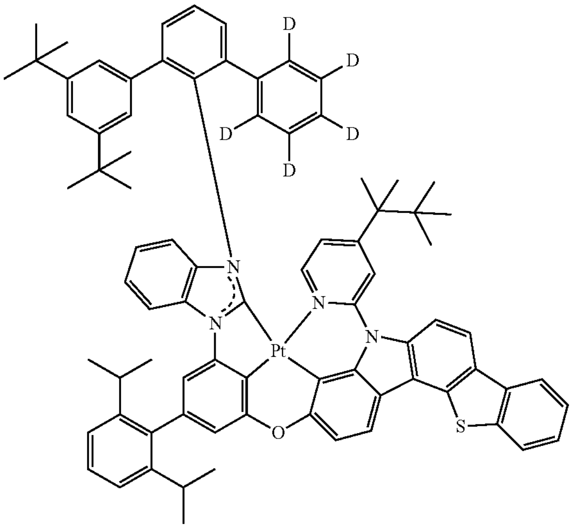
PtS1102
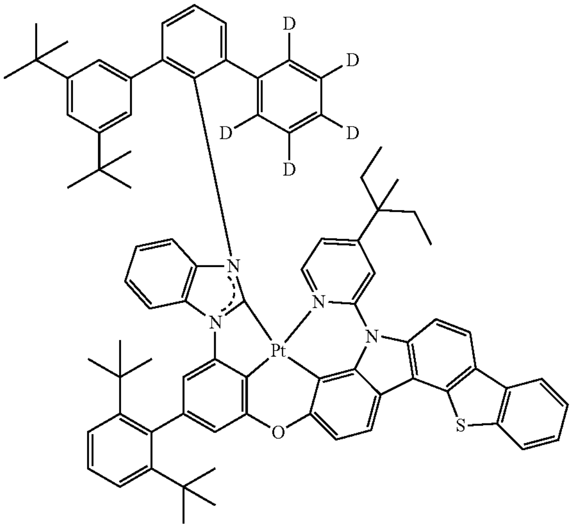
PtS1103
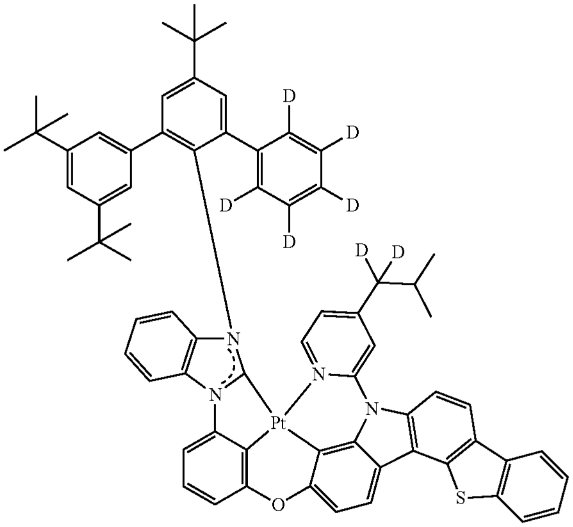

-continued
PtS1104
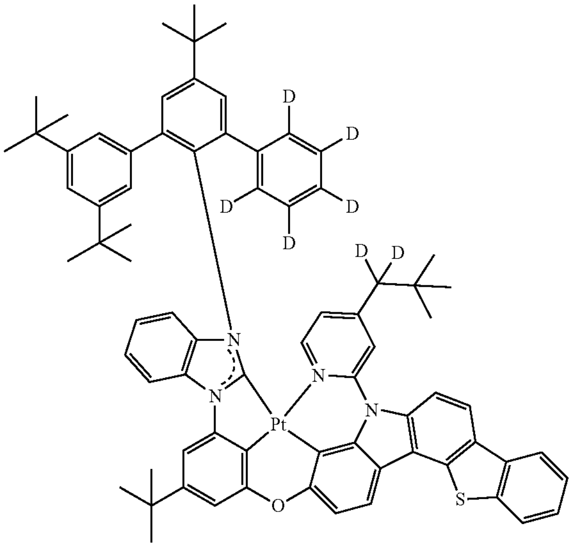
PtS1105
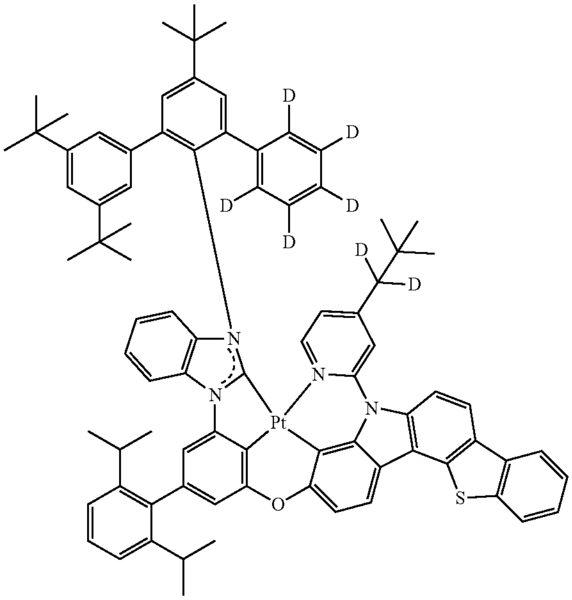
-continued
PtS1106
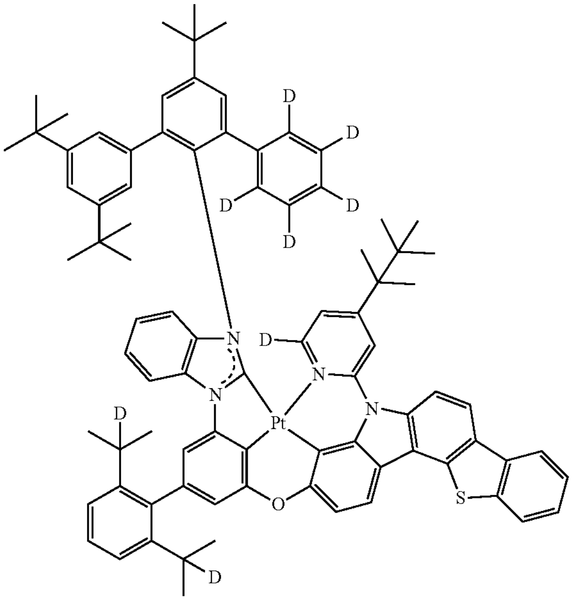
PtS1107
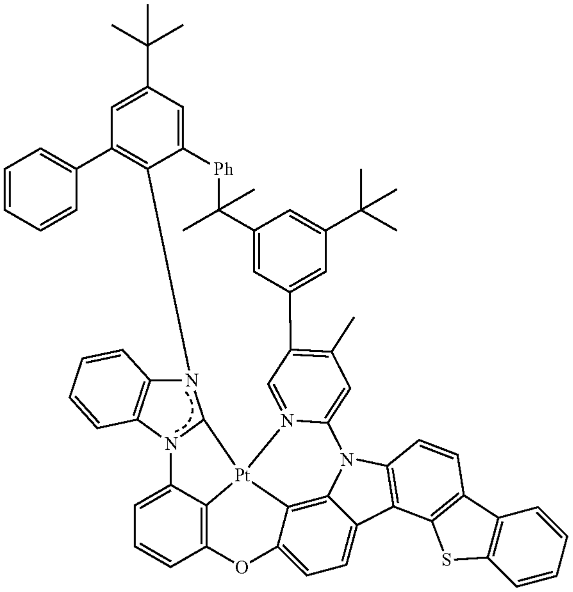

-continued
PtS1108
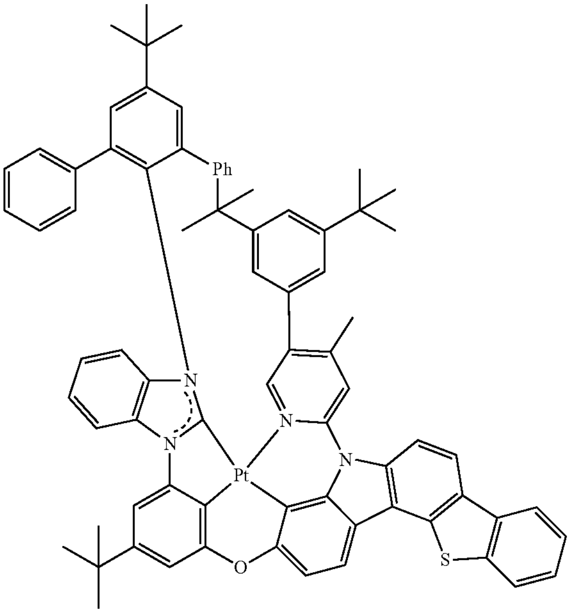
PtS1109
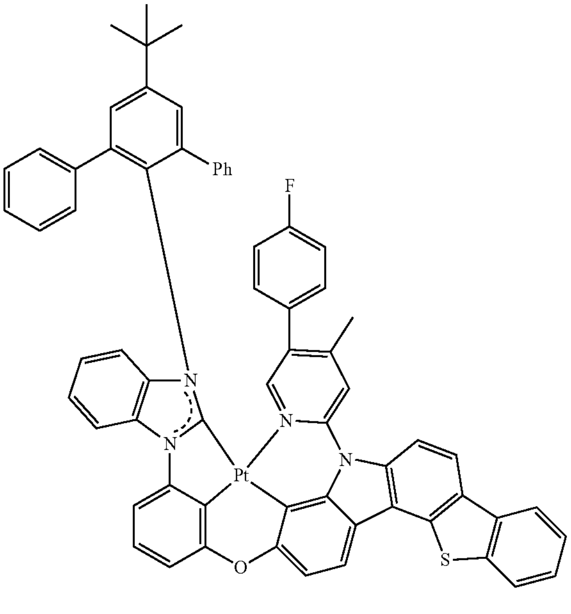
-continued
PtS1110
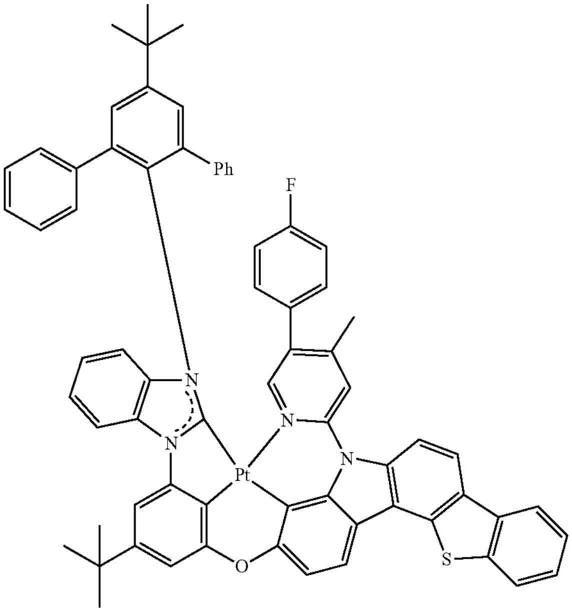
PtS111
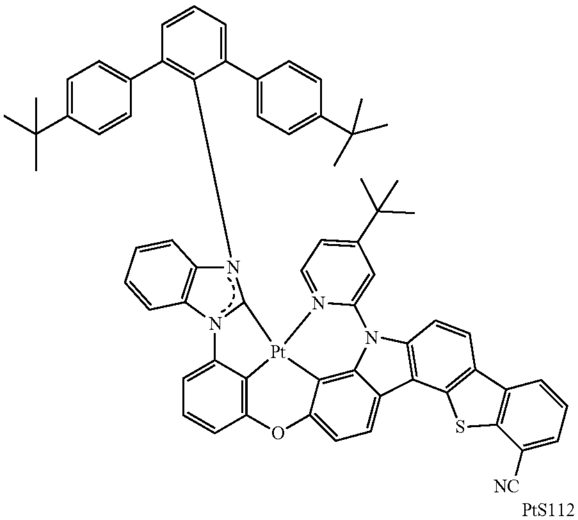
PtS112
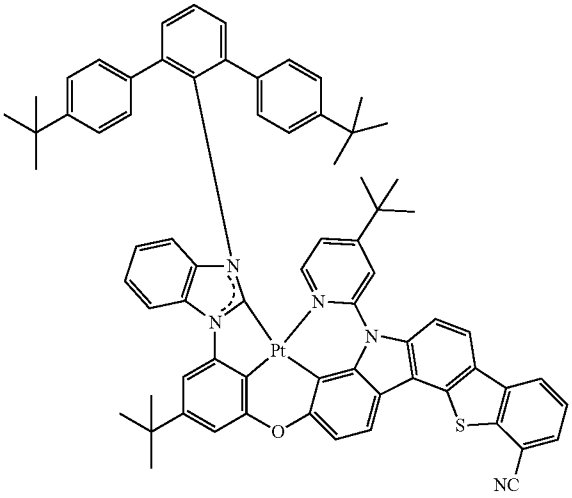

PtS113
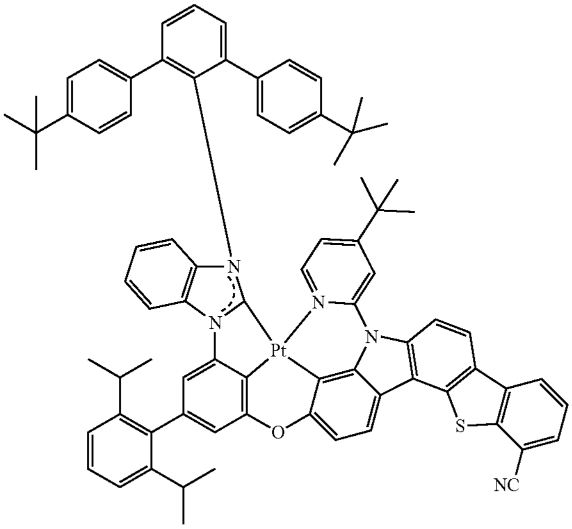
PtS114
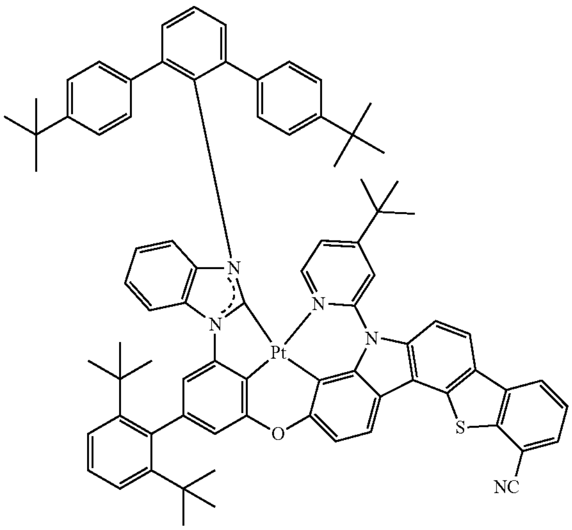
PtS115
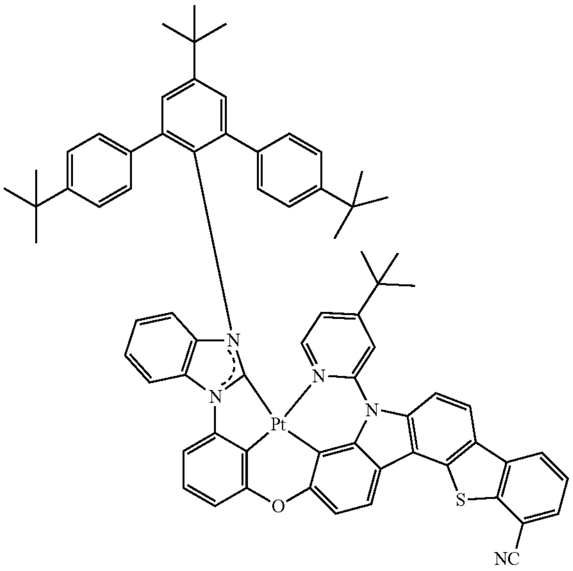
PtS116
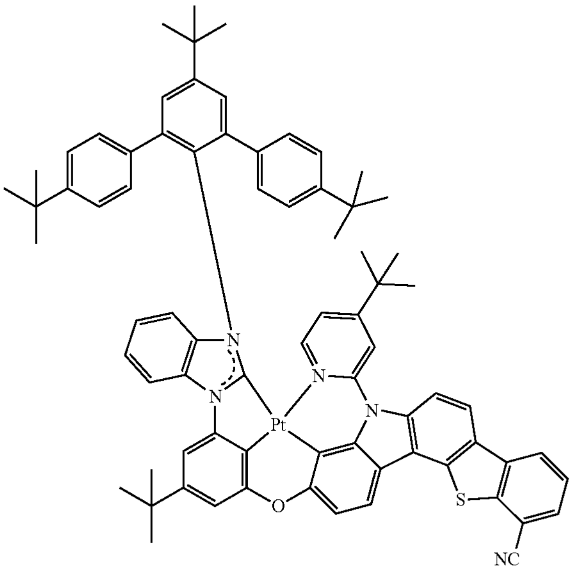

PtS117
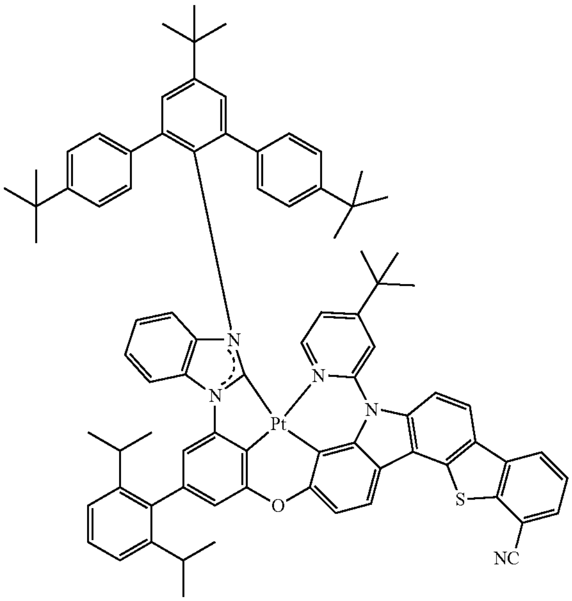
PtS118
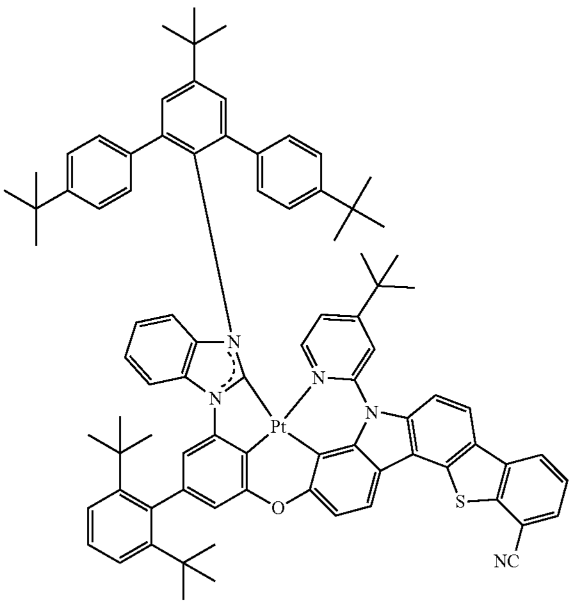
PtS119
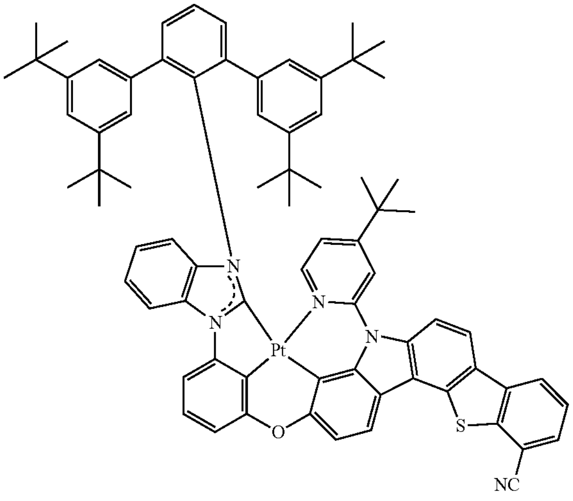
PtS120
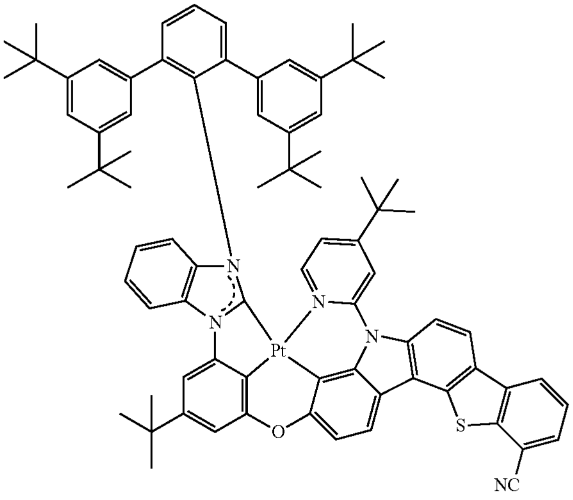
PtS121
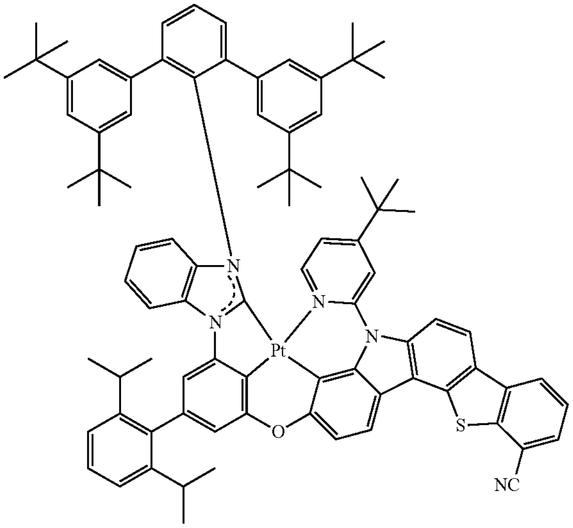

-continued
PtS122
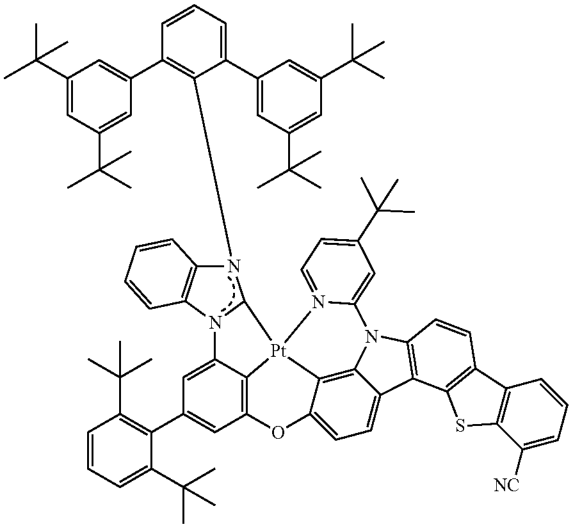
PtS123
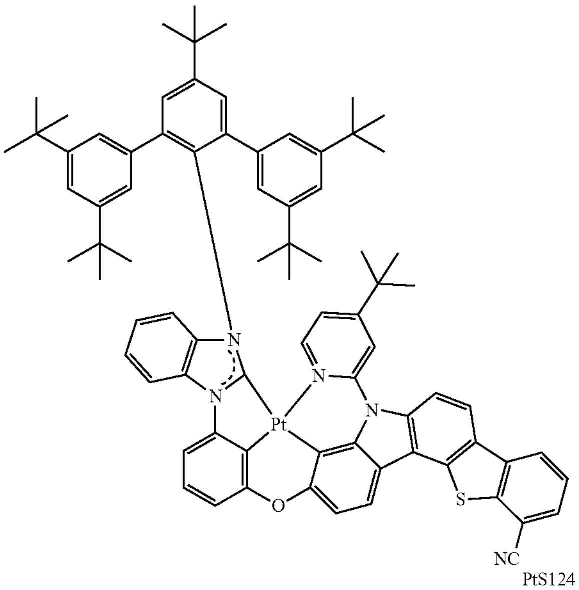
PtS124
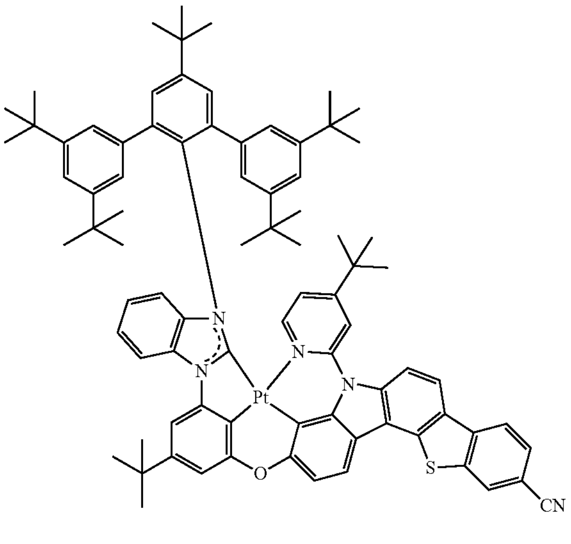
-continued
PtS125
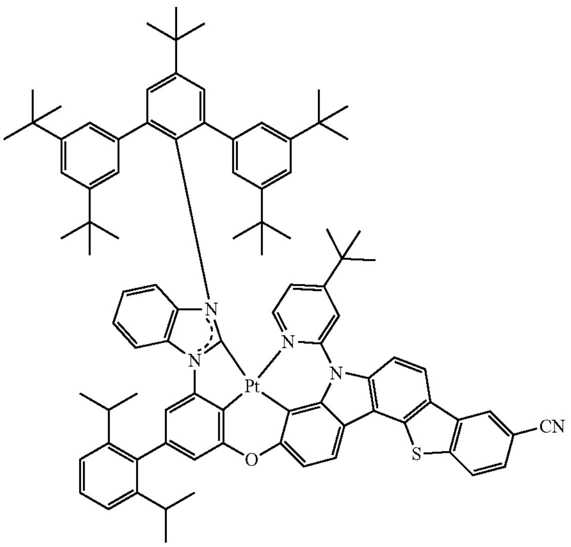
PtS126
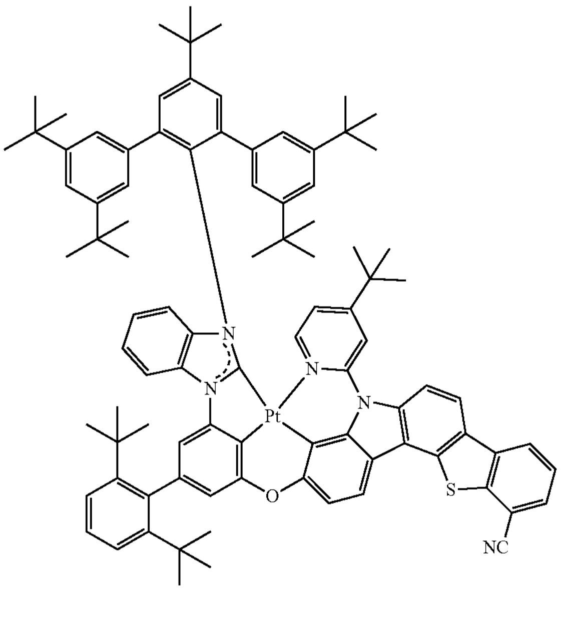

PtS127
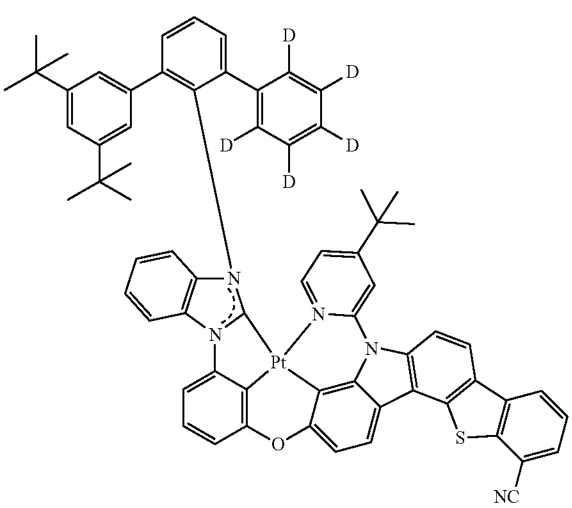
PtS128
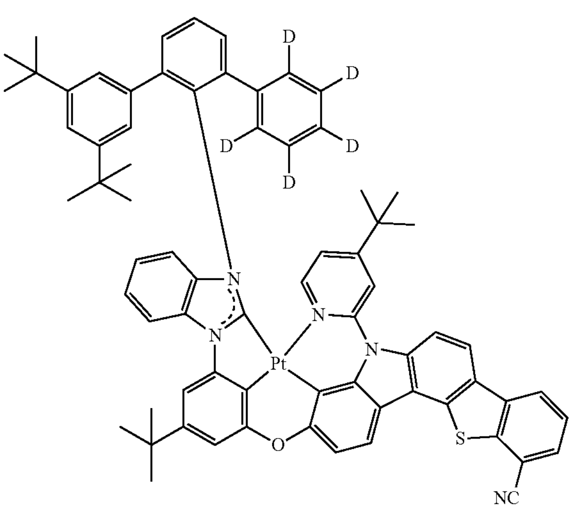
PtS129
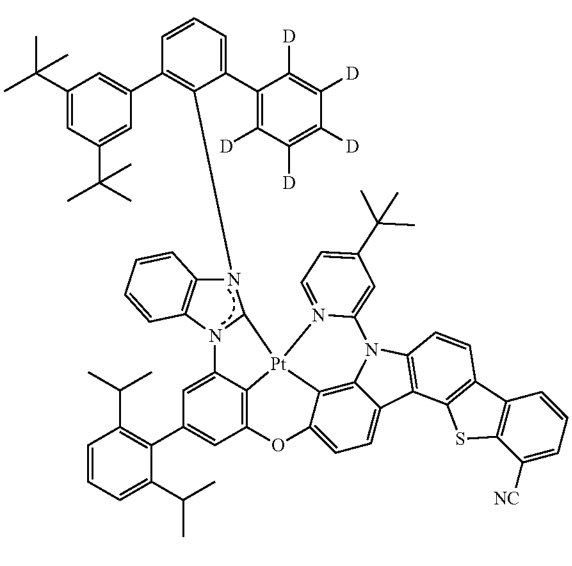
PtS130
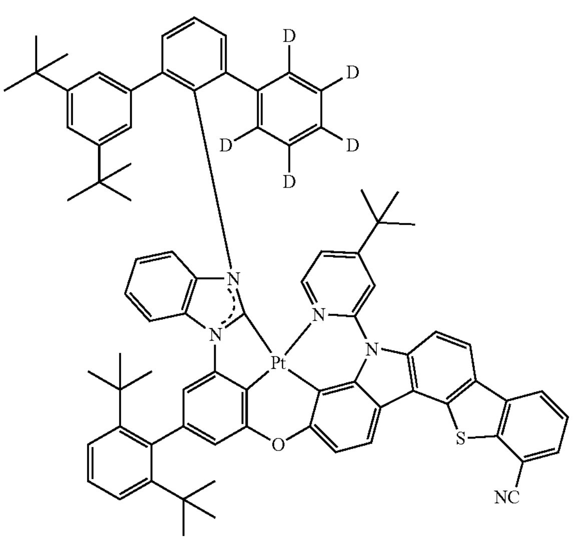
PtS131
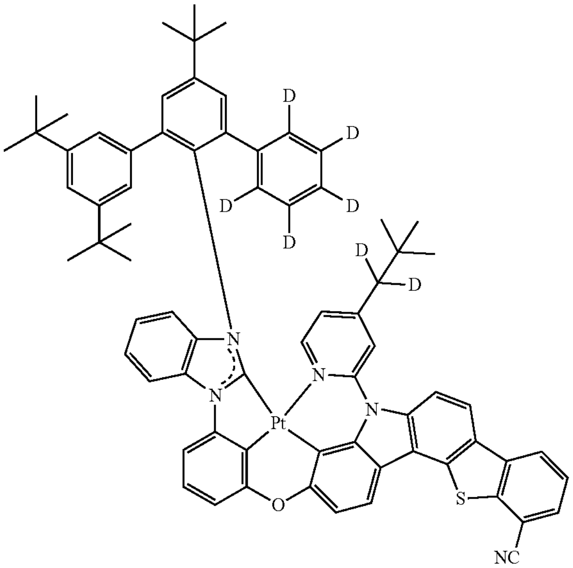

PtS132
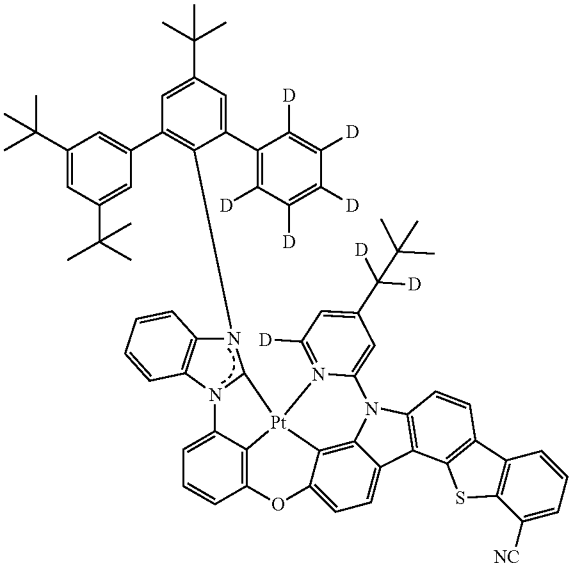
PtS133
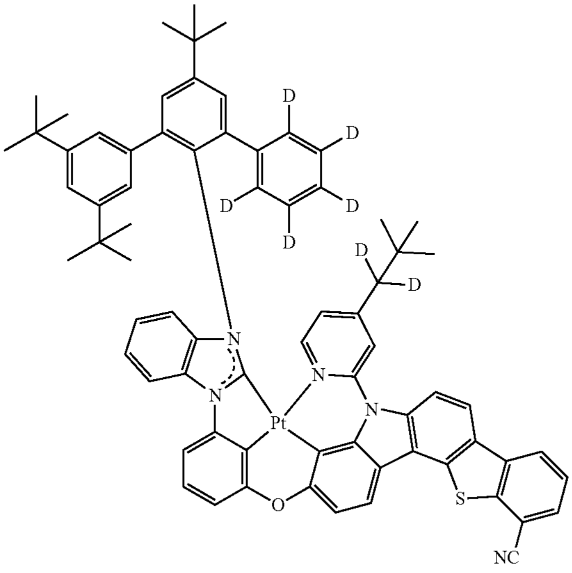
PtS134
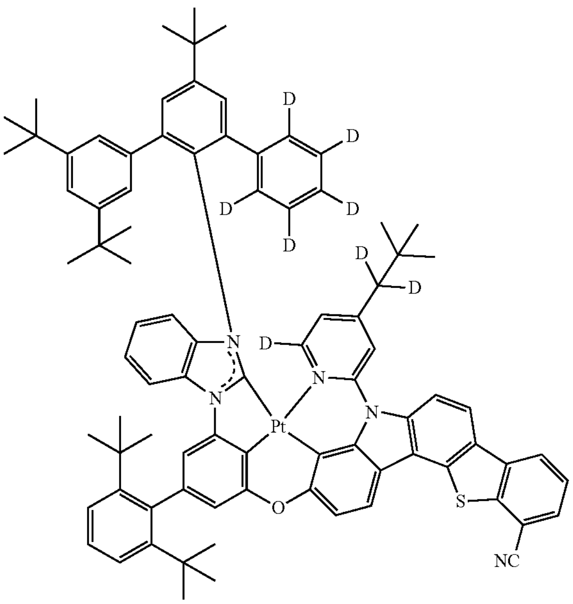
PtS135
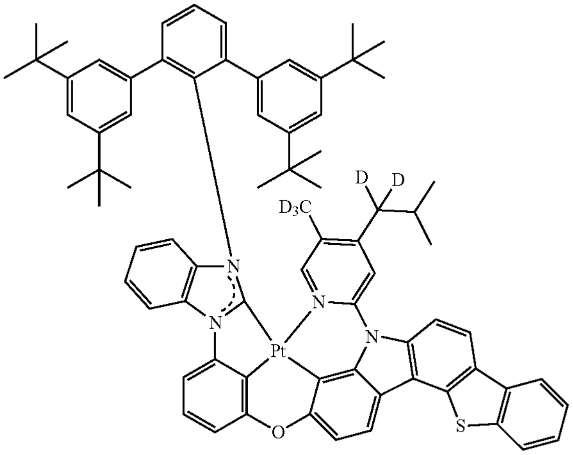
PtS136
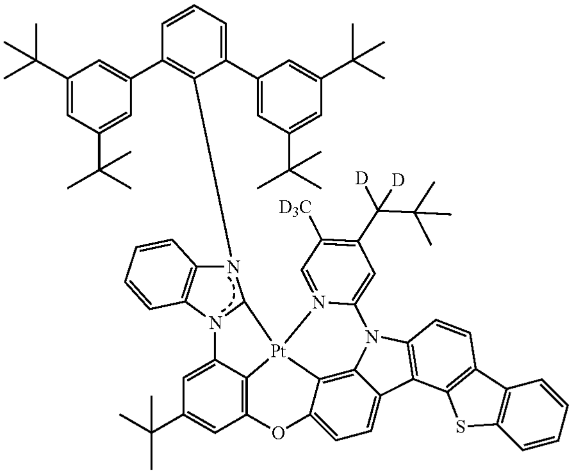

-continued
PtS137
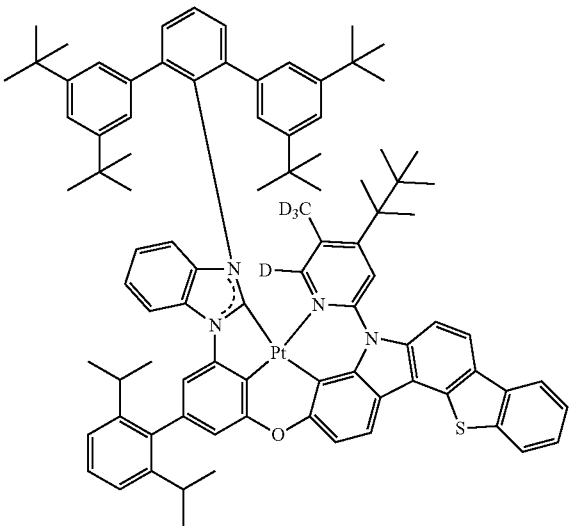
PtS138
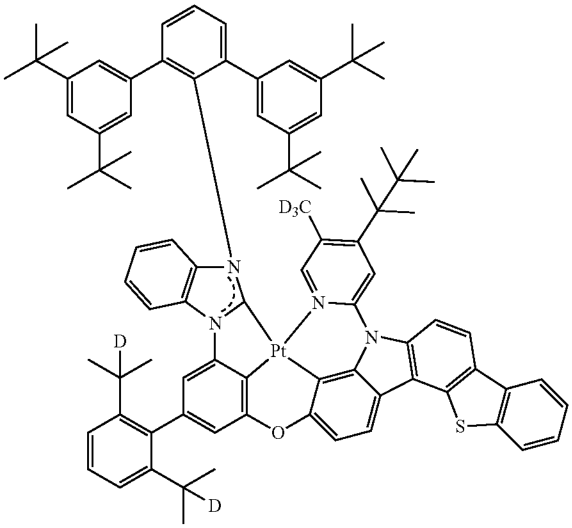
PtS139
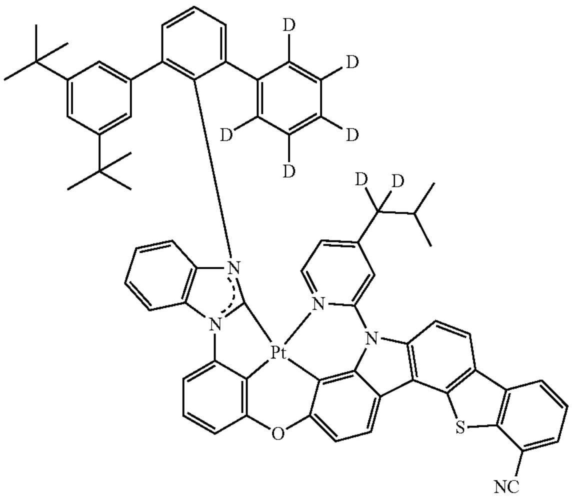
-continued
PtS140
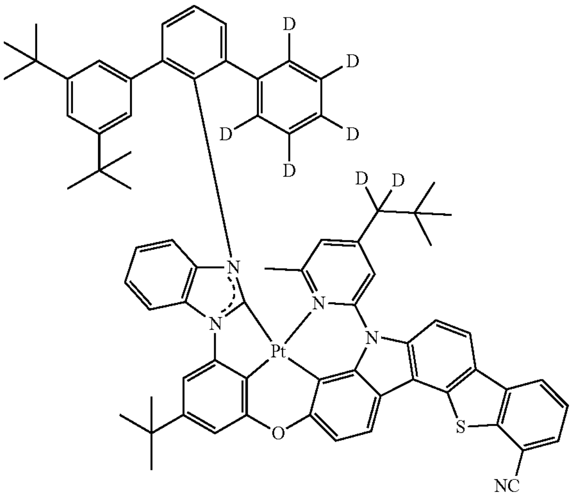
PtS141
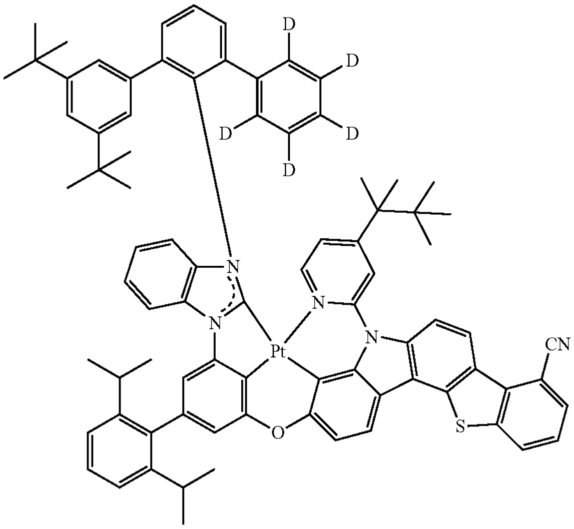
PtS142
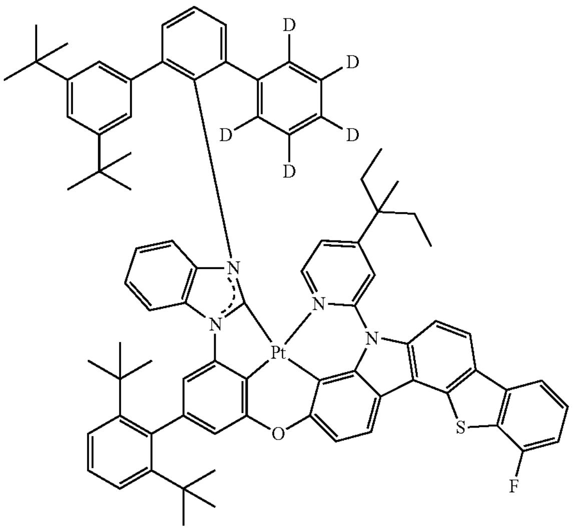

PtS143
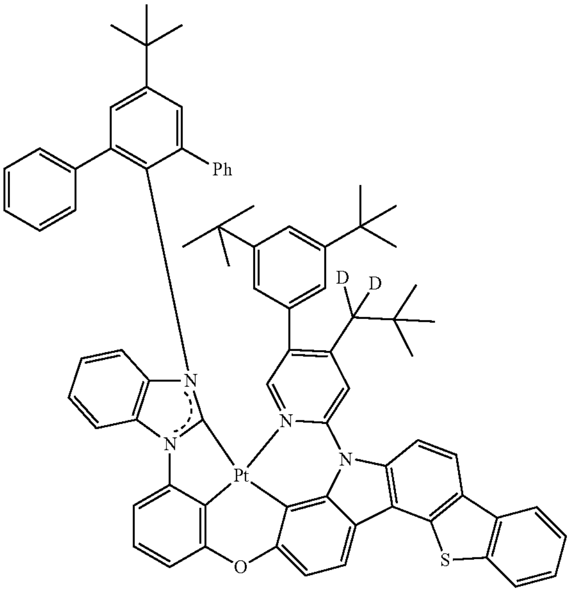
PtS144
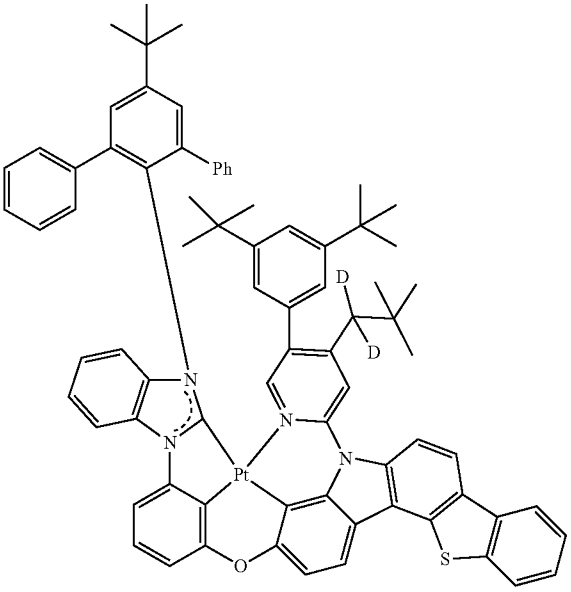
PtS145
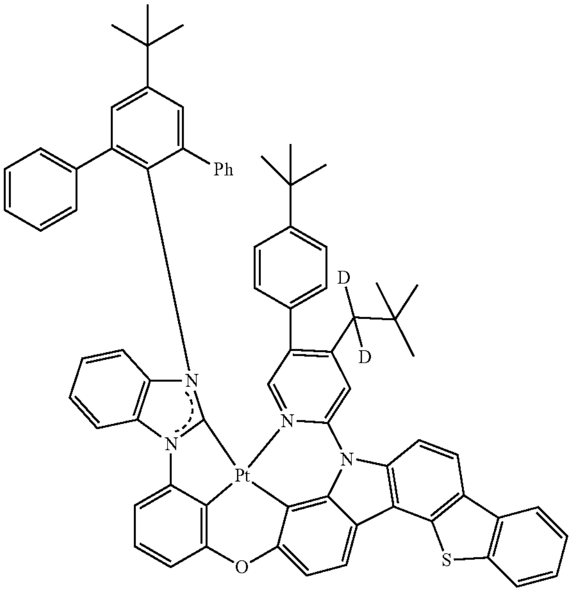
PtS146
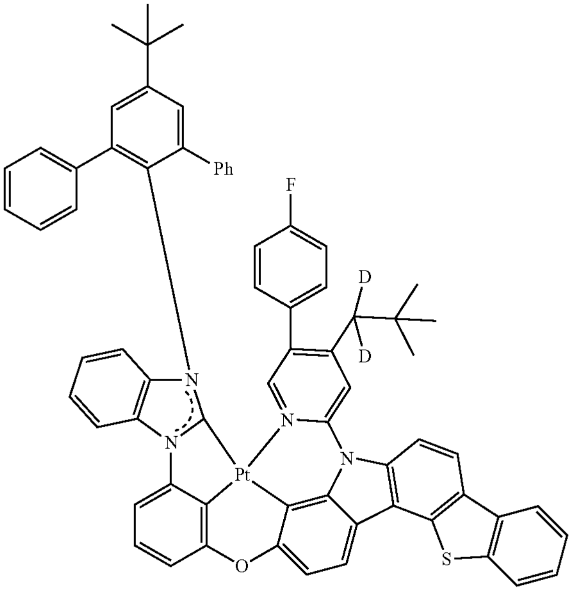

-continued
PtS147
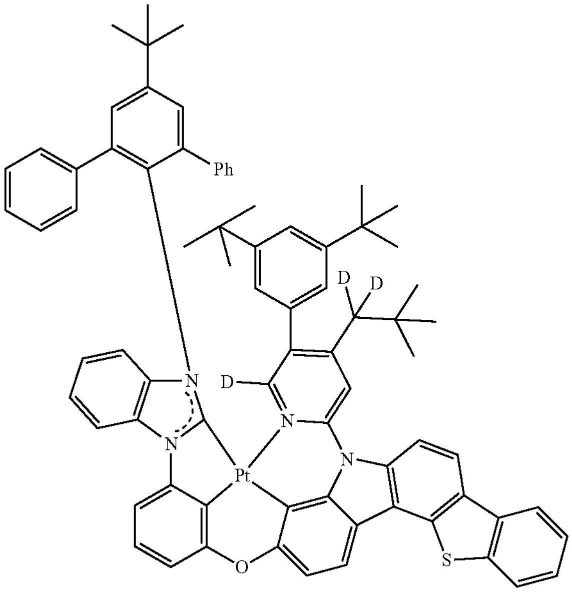
PtS148
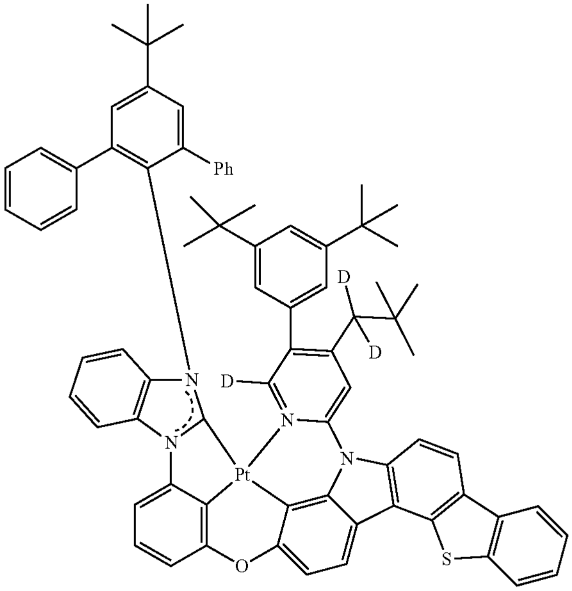
-continued
PtS149
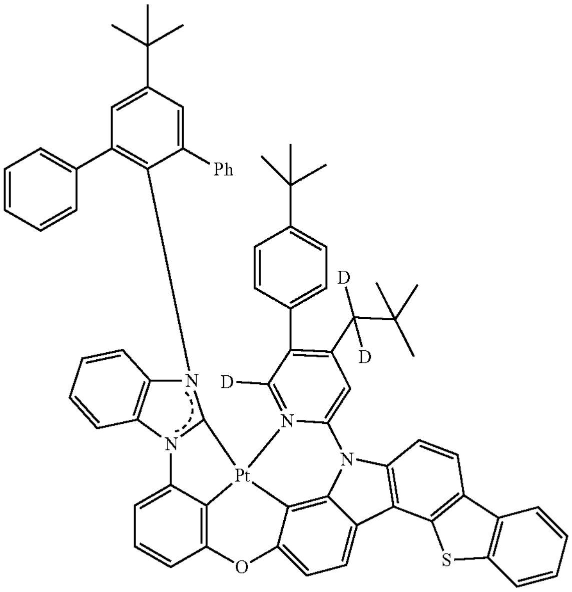
PtS150
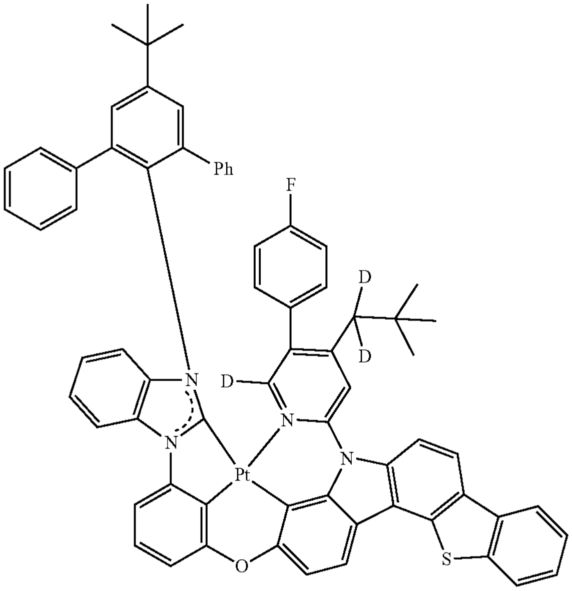

-continued
PtS151
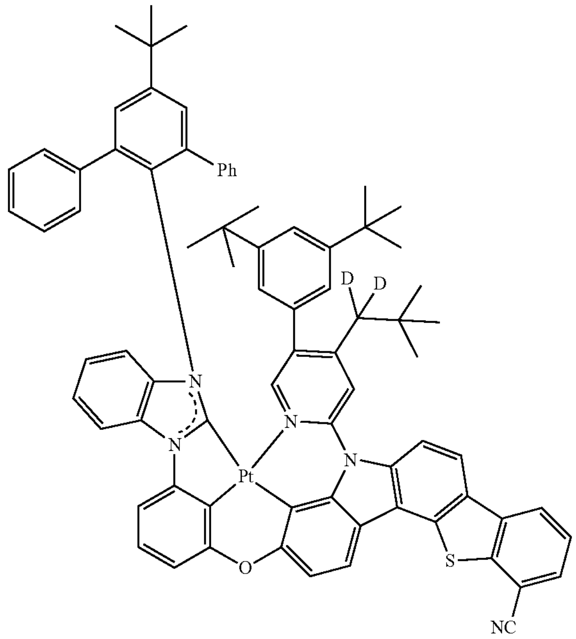
PtS152
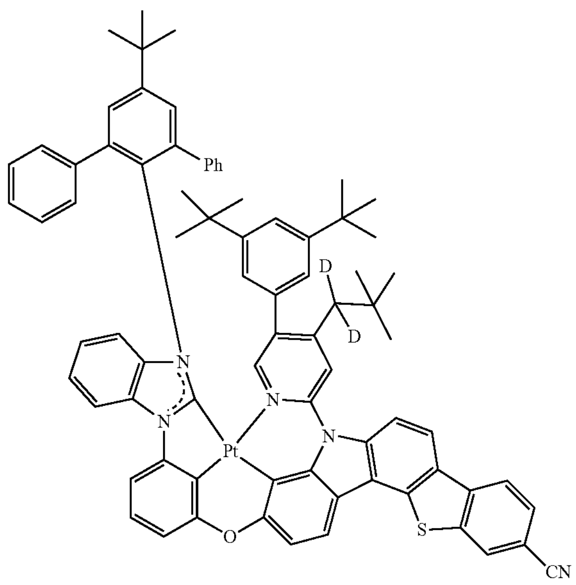
-continued
PtS153
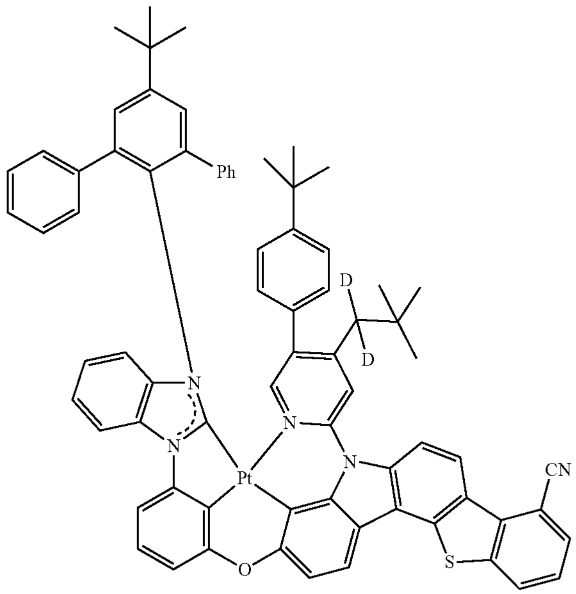
PtS154
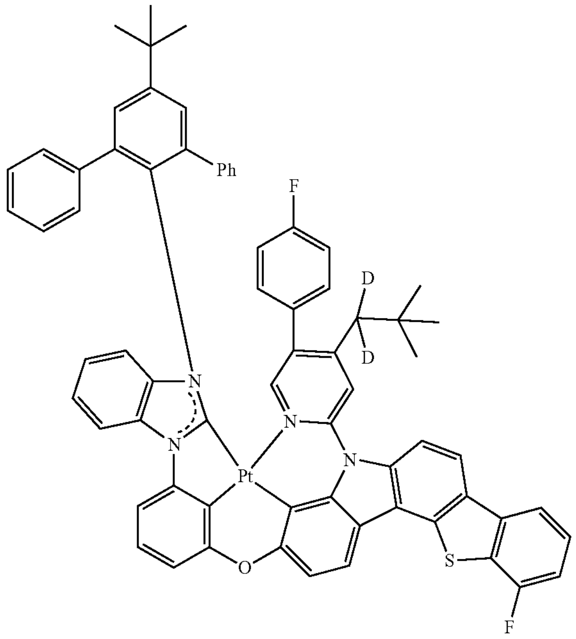

-continued

PtS155

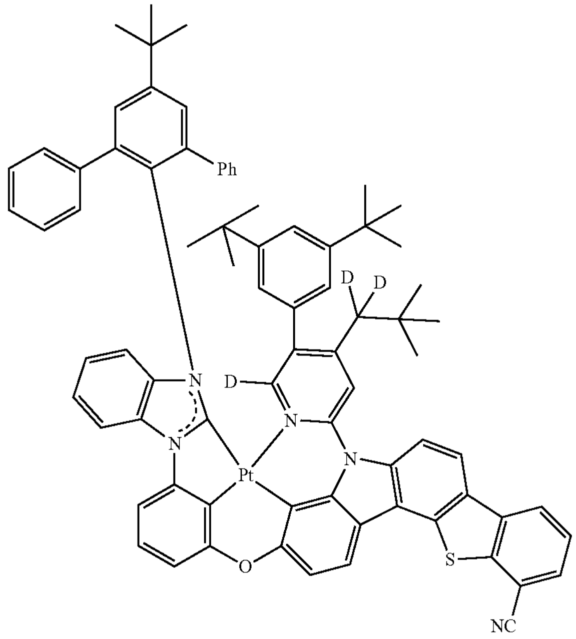

PtS156

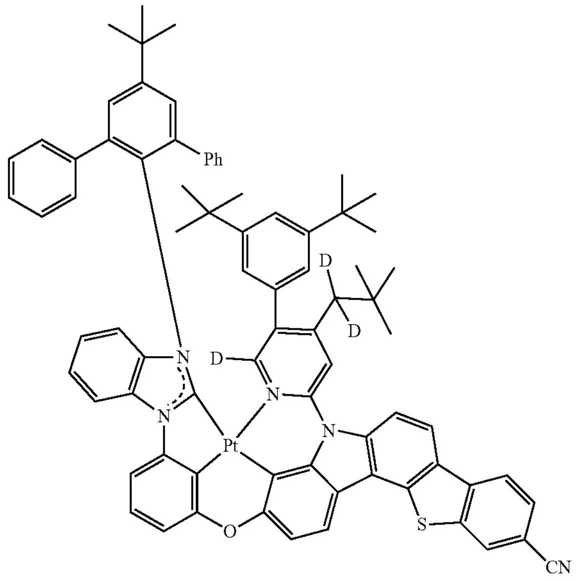

-continued

PtS157

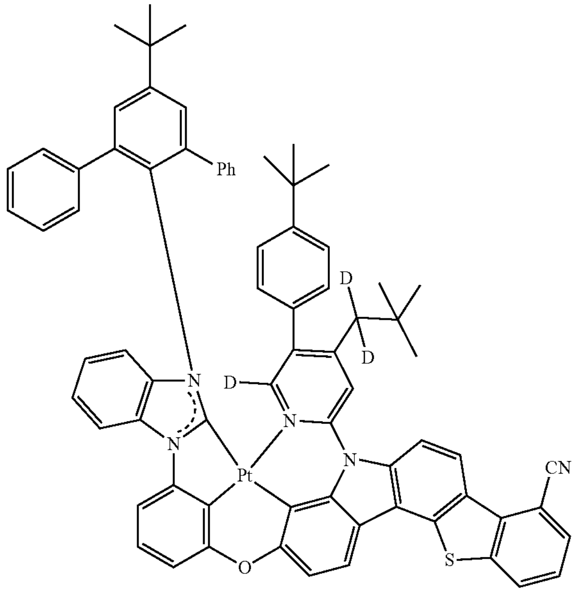

PtS158

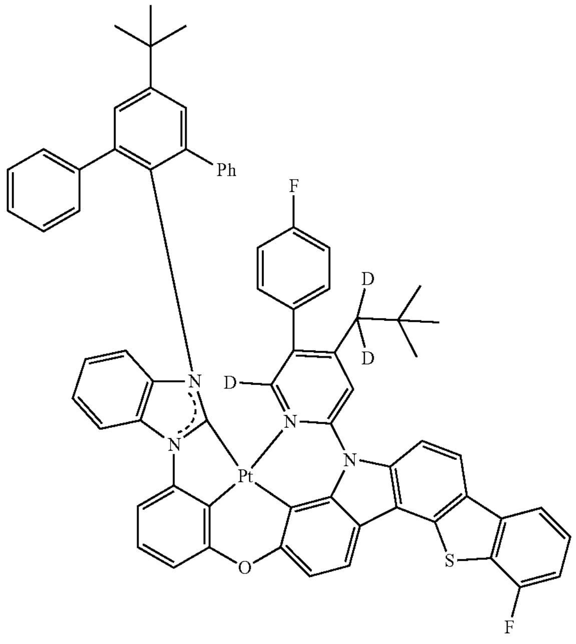

Further, the present invention also provides use of the fused ring carbazole tetradentate metal platinum (II) complex having the structure shown in formula (I) above in an electronic device.

Further, the electronic device includes an organic electroluminescence device (OLED), an organic integrated circuit (O-IC), an organic field effect transistor (O-FET), an organic thin film transistor (O-TFT), an organic light emitting transistor (O-LET), an organic solar cell (O-SC), an organic optical detector, an organic photoreceptor, an organic field quenching device (O-FQD), a light emitting electrochemical cell (LEC), and an organic laser diode (O-laser).

In another aspect, the present invention also provides an organic electroluminescence device including the fused ring carbazole tetradentate metal platinum (II) complex having the structure shown in formula (I) as described above.

Further, the organic electroluminescence device includes a cathode, an anode, and an organic functional layer therebetween; the organic functional layer includes the fused ring carbazole tetradentate metal platinum (II) complex having the structure shown in formula (I) as described above.

Preferably, the organic functional layer includes a light emitting layer including the fused ring carbazole tetradentate metal platinum (II) complex having the structure shown in formula (I) as described above.

Further, the light emitting layer includes a fluorescent doping material; the fluorescent doping material is preferably a boron-containing organic molecular light emitting material.

In another aspect, the present invention also provides an organic photoelectric device including: a substrate layer; a first electrode on the substrate; an organic light emitting functional layer on the first electrode; a second electrode on the organic light emitting functional layer; wherein the organic light emitting functional layer includes the fused ring carbazole tetradentate metal platinum (II) complex as described above. For example, a platinum (II) complex may be included as a light emitting material in the organic light emitting functional layer.

Further, the organic light emitting functional layer includes any one or more fluorescent doping materials, and the fluorescent doping materials are preferably boron-containing organic molecular light emitting materials, and preferably phosphorescent sensitizable boron-containing compounds.

In the present invention, the organic photoelectric device can be fabricated by utilizing methods such as sputter coating, electron beam evaporation, vacuum evaporation, etc. to evaporate metal or oxides having electrical conductivity and alloys thereof on a substrate to form an anode; evaporating a hole-injection layer, a hole-transporting layer, a light emitting layer, an air-blocking layer, and an electron-transporting layer on the surface of the anode obtained by the preparation in a sequential order, and then evaporating a cathode at a later time. In addition to the method above, an organic electroluminescence device is fabricated on a substrate by evaporation in the order of a cathode, an organic layer, and an anode. The organic layer may also include a multilayer structure such as a hole-injection layer, a hole-transport layer, a light emitting layer, a hole-blocking layer, and an electron transport layer. In the present invention, the organic layer is prepared by solvent engineering (spin-coating, tape-casting, doctor-blading, screen-printing, ink-jet printing, or Thermal-Imaging) using a high molecular material instead of the evaporation method, reducing the number of device layers.

The present invention also provides a composition including the fused ring carbazole tetradentate metal platinum (II) complex having the structure shown in formula (I). Preferably, the composition further includes a fluorescent doping material, and the fluorescent doping materials are preferably boron-containing organic molecular light emitting materials, and preferably phosphorescent sensitizable boron-containing compounds.

The present invention also provides a formulation including the fused ring carbazole tetradentate metal platinum (II) complex having the structure shown in formula (I) as described above or a composition as described above and at least one solvent.

The solvent is not particularly limited, and an unsaturated hydrocarbon solvent such as toluene, xylene, mesitylene, tetrahydronaphthalene, decahydronaphthalene, dicyclohexane, n-butylbenzene, sec-butylbenzene, tert-butylbenzene and other unsaturated hydrocarbon solvents, halogenated saturated hydrocarbon solvents such as carbon tetrachloride, chloroform, methylene chloride, ethylene chloride, butyl chloride, butyl bromide, pentyl chloride, pentyl bromide, hexyl chloride, hexyl bromide, cyclohexyl chloride, cyclohexyl bromide, halogenated unsaturated hydrocarbon solvents such as chlorobenzene, dichlorobenzene, trichlorobenzene, ether solvents such as tetrahydrofuran and tetrahydropyran, and other halogenated solvents known to those skilled in the art, can be used.

The present invention also provides a display or lighting device comprising one or more of the organic photoelectric devices described above.

Compared with the Prior Art, the Present Invention has the Following Beneficial Effects:

In the present invention, a tetradentate metal platinum (II) complex phosphorescent material is obtained by introducing a five-membered heterocyclic system such as benzofuran or benzothiophene at the 5, 6-positions of carbazole. Increasing the ratio of the local state (LE) in the excited triplet state of the cyclic tetradentate platinum (II) complex leads to a lower shoulder peak, which improves the molecular luminescence color purity of the materials. This in turn increases the device lifetime. The materials provided by the present invention all have good chemical stability and thermal stability and are easy to fabricate an evaporation-type OLED device. Organic electroluminescence devices fabricated using the compounds of the present invention as the light emitting layer show a significant improvement in both current efficiency and lifetime and a significant reduction in the start-up voltage. The combination with the fluorescent doping material (boron-containing compound) can balance the transport of holes and electrons, making the energy transfer between the subject and the object more efficient, and can improve the light color purity of the device.

DETAILED DESCRIPTION OF THE EMBODIMENTS

Figure 1:
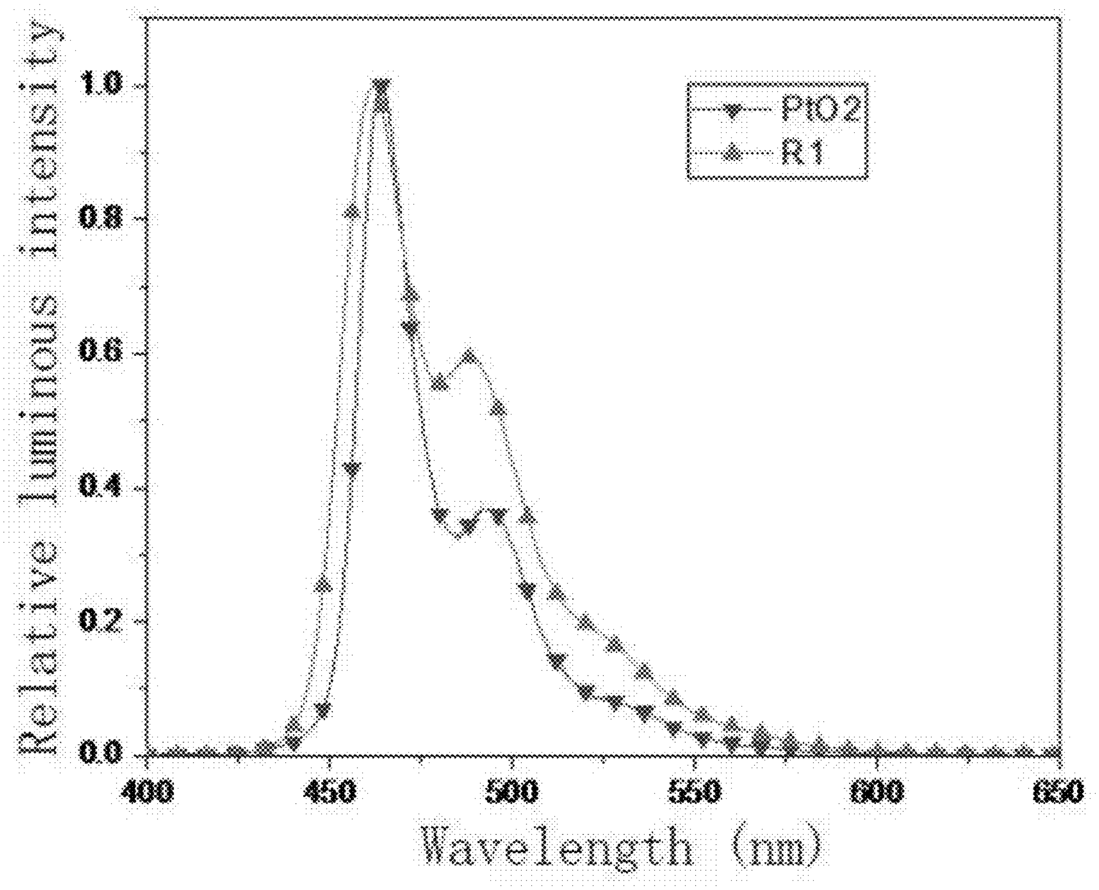
FIG. 1 is a room temperature emission spectrum of R1 and PtO2 in a dichloromethane solution.

Hereinafter, the present invention will be described in detail. The description of the constituent elements recorded below is sometimes based on representative embodiments or specific examples of the present invention, but the present invention is not limited to such embodiments or specific examples.

As used herein, the term "substituted" is intended to encompass all permissible substituents of organic compounds. In broad aspects, permissible substituents include acyclic and cyclic, branched and unbranched, carbocyclic and heterocyclic, and aromatic and non-aromatic substituents of the organic compounds. Illustrative substituents include, for example, those described below. The permissible substituents may be one or more and the same or different for appropriate organic compounds. For the purposes of the present invention, the present invention is not intended to be limited in any manner by the permissible substituents of organic compounds. Likewise, the term "substituted" or "substituted with" includes the implicit proviso that such substitution is in accordance with a permitted valence of the substituted atom and the substituent and that the substitution results in a stable compound (e.g. a compound that does not spontaneously undergo transformation such as by rearrangement, cyclization, elimination, etc.). It is also contemplated that, in certain aspects, unless expressly stated to the contrary, individual substituents can be further optionally substituted (i.e. further substituted or unsubstituted).

In defining various terms, "$R^1$"-"$R^9$" are used herein as a general symbol to represent various specific substituents. These symbols can be any substituents, not limited to those disclosed herein, and when they are limited in one instance to certain substituents, they can be limited in other instances to some other substituents. As used herein, "$R^1$", "$R^2$" . . . "$R^n$" (where n is an integer) can independently have one or more of the groups listed above. For example, if $R^1$ is a straight-chain alkyl group, one hydrogen atom of the alkyl group may be optionally substituted with hydroxyl, alkoxy, alkyl, halogen, and the like. Depending on the group selected, the first group may be incorporated within the second group, or alternatively, the first group may be pendant, i.e. attached, to the second group.

The term "alkyl" as used herein is a branched or unbranched saturated hydrocarbon group of 1 to 60 carbon atoms such as methyl, ethyl, n-propyl, isopropyl, n-butyl, isobutyl, sec-butyl, tert-butyl, n-pentyl, isopentyl, sec-pentyl, neopentyl, hexyl, heptyl, hemi-, nonyl, decyl, dodecyl, tetradecyl, hexadecyl, eicosyl, tetracosyl and the like. The alkyl group may be cyclic or acyclic. The alkyl group may be branched or unbranched. The alkyl group may be substituted or unsubstituted. For example, the alkyl group may be substituted with one or more groups including, but not limited to, an optionally substituted alkyl, cycloalkyl, alkoxy, amino, halo, hydroxy, nitro, silyl, sulfo-oxo, or mercapto group as described herein.

The term "aryl" as used herein is a radical of any carbon-based aromatic group containing from 5 to 60 carbon atoms including, but not limited to, phenyl, naphthyl, phenyl group, biphenyl, phenoxyphenyl, anthracenyl, phenanthrenyl, and the like. The term "aryl" also includes "heteroaryl", which is defined as a group containing an aromatic group having at least one heteroatom incorporated within the ring of the aromatic group. Examples of heteroatoms include but are not limited to, nitrogen, oxygen, sulfur, and phosphorus. Likewise, the term "non-heteroaryl" (which is also encompassed by the term "aryl") defines groups that contain aromatic groups that is free of a heteroatom. The aryl group may be substituted or unsubstituted. The aryl group may be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxyl, ester, halogen, hydroxyl, carbonyl, azido, nitro, silyl, sulfo-oxo, or thiol as described herein.

The compound disclosed herein can exhibit desirable properties and have emission and/or absorption spectra that can be modulated by the selection of appropriate ligands. In another aspect, the invention may exclude any one or more compounds, structures, or portions thereof specifically recited herein.

The compounds of the present invention can be prepared using a variety of methods, including but not limited to those described in the examples provided herein.

It is to be understood that both the foregoing general description and the following detailed description are exemplary and explanatory only and are not restrictive. The present application can be understood more readily by reference to the following detailed description and examples contained therein.

Before the present compounds, devices, and/or methods are disclosed and described, it is to be understood that they are not limited to specific synthetic methods (as otherwise indicated), or to specific reagents (as otherwise indicated), as such can, of course, vary. It is also to be understood that the terminology used in the invention is for the purpose of describing only the particular aspect and is not intended to be limiting. Although any methods and materials similar or equivalent to those described herein can be used in the practice or testing, exemplary methods and materials are described below. All starting materials and solvents of synthetic examples were purchased commercially unless otherwise specified, and the solvents were used as they were without further treatment.

The substrate of the present invention may be any substrate typically used in organic photoelectric devices. It may be a glass or transparent plastic substrate, it may be a substrate of an opaque material such as silicon or stainless steel, and it may be a flexible PI film. Different substrates have different mechanical strength, thermal stability, transparency, surface smoothness, and water resistance. The application direction is different according to the properties of the substrates. As the materials for the hole-injecting layer, the hole-transporting layer, and the electron-injecting layer, any material can be selected and used from known related materials for OLED devices, and the present invention is not particularly limited thereto.

Synthesis Examples

The following examples of synthesis, compositions, devices, or methods of the compound are provided merely to provide a general approach to the industry and are not intended to limit the scope of the patent. The data (quantity, temperature, etc.) mentioned in the patent are as accurate as possible, but some errors may exist. Unless otherwise noted, the weighing is done separately, the temperature is ° C., or room temperature, and the pressure is near atmospheric.

A method for the preparation of a novel compound is provided in the following examples, but the preparation of such compounds is not limited to this method. In this technical field, since the claimed compound of the present invention can be easily prepared by modification, the methods listed below or other methods can be used. The following examples are given by way of example only and are not intended to limit the scope of this patent. The temperature, catalyst, concentration, reactants, and course of reaction may be varied to select different conditions for different reactants to produce the compound.

$^1$H NMR (500 MHz), $^1$H NMR (400 MHz), and $^{13}$C NMR (126 MHz) spectra were measured on an ANANCE III (500M) NMR spectrometer. Unless otherwise specified, DMSO-$d_6$ or $CDCl_3$ containing 0.1% TMS was used as the solvent for NMR. TMS (δ=0.00 ppm) was used as the internal standard when $CDCl_3$ was used as the solvent for the $^1$H NMR spectrum. TMS (δ=0.00 ppm) or residual DMSO peak (δ=2.50 ppm) or residual water peak (δ=3.33 ppm) was used as an internal standard when DMSO-$d_6$ was used as solvent. In $^{13}$C NMR spectra, $CDCl_3$ (δ=77.00 ppm) or DMSO-d6 (δ=39.52 ppm) was used as the internal standard. Determination was done on the HPLC-MS Agilent 6210 TOF LC/MS. HRMS spectra were determined on the Agilent 6210 TOF LC/MS type liquid chromatography-time-of-flight mass spectrometer. $^1$H NMR spectral data: s=singlet, d=doublet, t=triplet, q=quartet, p=quintet, m=multiplet, br=broad.

Synthesis Route

Synthesis Route of Intermediate dPh-tBuNH$_2$

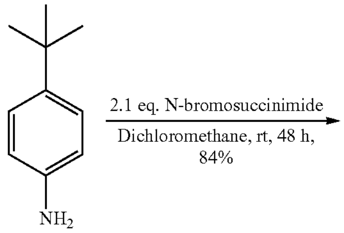

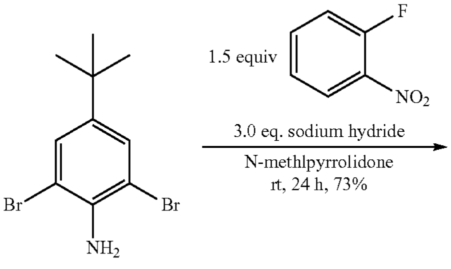

dBr-tBuNH$_2$

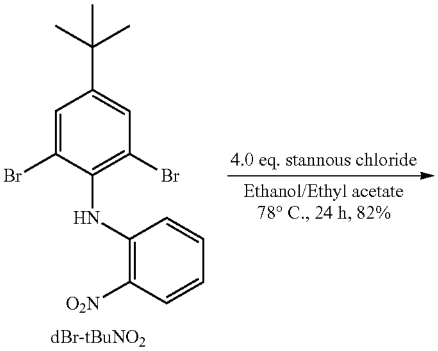

dBr-tBuNO$_2$

-continued

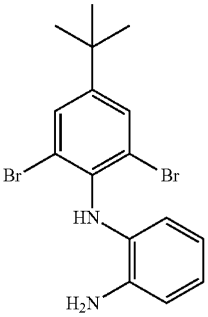

dBr-tBu2NH$_2$

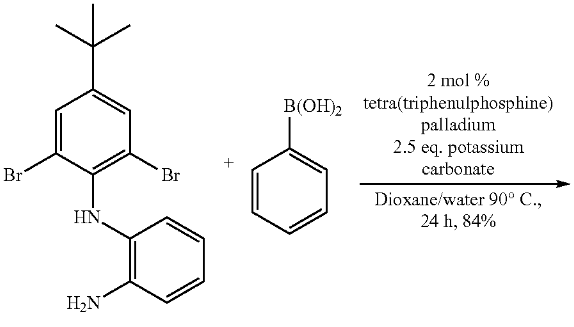

dBr-tBu2NH$_2$

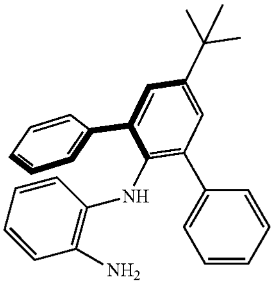

dPh-tBuNH$_2$

Synthesis of intermediate dBr-tBuNH$_2$: to a reaction flask were added p-tert-butylaniline (15.0 g, 100 mmoL, 1.0 eq.) dissolved in dichloromethane (150 mL), and N-bromosuccinimide (37.7 g, 210 mmoL, 2.1 eq.). The reaction was carried out at room temperature and stopped after 48 hours. The reaction product was concentrated and subjected to silica gel column chromatography to give 25.6 g of red liquid in 84% yield, which was used directly in subsequent reactions.

Synthesis of intermediate dBr-tBuNO$_2$: to a reaction flask were added dBr-tBuNH$_2$ (5 g, 16.3 mmoL, 1.0 eq.) dissolved with N-methylpyrrolidone (50 mL), followed by adding sodium hydride (1.96 g, 49 mmoL, 3.0 eq.) and o-fluoronitrobenzene (3.45 g, 24.5 mmoL, 1.5 eq.). The reaction was carried out at room temperature and stopped after 48 hours. The reaction product was concentrated and subjected to silica gel column chromatography to give 5.08 g of yellow solid in 73% yield, which was used directly in subsequent reactions.

Synthesis of intermediate dBr-tBu2NH$_2$: to a reaction flask were added dBr-tBuNO$_2$ (4.8 g, 11.2 mmoL, 1.0 eq.), stannous chloride (10.1 g, 44.8 mmoL, 4.0 eq.), ethyl acetate (50 mL) and ethanol (50 mL). The reaction was carried out at 78° C. in an oil bath and stopped after 24 h. After cooling to room temperature, the reaction product was concentrated and subjected to silica gel column chromatography to give 3.43 g of white solid in 82% yield, which was used directly in subsequent reactions.

Synthesis of intermediate dPh-tBuNH$_2$: to a reaction flask were added dBr-tBu2NH$_2$ (3.2 g, 8 mmoL, 1.0 eq.), phenylboronic acid (2.93 g, 24 mmoL, 3.0 eq.), tetra(triphenylphosphine)palladium (185 mg, 0.16 mmoL, 0.02 eq.), potassium carbonate (2.8 g, 20 mmoL, 2.5 eq.), dioxane (40 mL), and water (15 mL). The reaction was carried out at 90° C. and stopped after 24 h. After cooling to room temperature, the reaction product was concentrated and subjected to silica gel column chromatography to give 2.66 g of white solid in 84% yield, $^1$H NMR (500 MHz, DMSO) δ 1.35 (s, 9H), 4.44 (s, 2H), 5.57 (s, 1H), 6.05 (dd, J=8.0, 1.5 Hz, 1H), 6.12 (td, J=7.5, 1.5 Hz, 1H), 6.25 (td, J=7.5, 1.5 Hz, 1H), 6.31 (dd, J=7.5, 1.5 Hz, 1H), 7.16-7.20 (m, 2H), 7.23-7.26 (m, 4H), 7.28 (s, 2H), 7.41-7.43 (m, 4H).

Synthesis Route of Intermediate dPh-5tBuNH$_2$

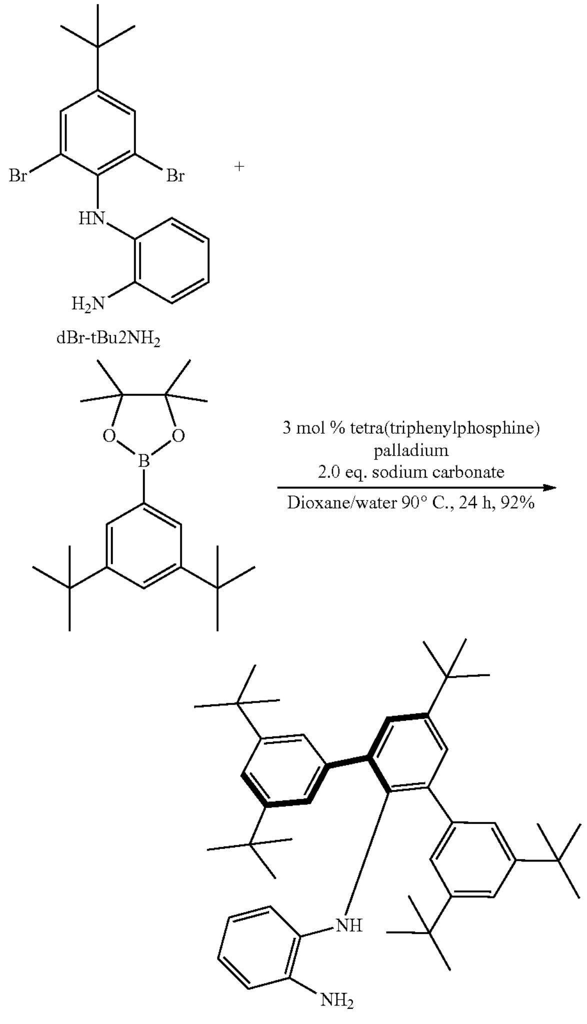

dPh-5tBuNH$_2$

Synthesis of intermediate dPh-5tBuNH$_2$: to a reaction flask were added dBr-tBu2NH$_2$ (1.0 g, 2.5 mmoL, 1.0 eq.), 3,5-di-tert-butylphenylboronic acid pinacol ester (2.37 g, 7.5 mmoL, 3.0 eq.), tetra(triphenylphosphine)palladium (87 mg, 0.075 mmoL, 3 moL %), potassium carbonate (691 mg, 5 mmoL, 2.0 eq.), dioxane (40 mL), and water (10 mL). The reaction was carried out at 90° C. and stopped after 24 h. After cooling to room temperature, the reaction product was concentrated and subjected to silica gel column chromatography to give 1.54 g of white solid in 92% yield. $^1$H NMR (500 MHz, DMSO) δ 1.17 (s, 36H), 1.37 (s, 9H), 4.35 (s, 2H), 5.50 (s, 1H), 6.03 (dd, J=8.0, 1.5 Hz, 1H), 6.14 (td, J=7.5, 1.5 Hz, 1H), 6.26 (td, J=7.0, 1.0 Hz, 1H), 6.34 (dd, J=7.5, 1.5 Hz, 1H), 7.19 (t, J=1.5 Hz, 2H), 7.22 (d, J=2.0 Hz, 4H), 7.29 (s, 2H).

Synthesis Route of Intermediate dPh-NH$_2$

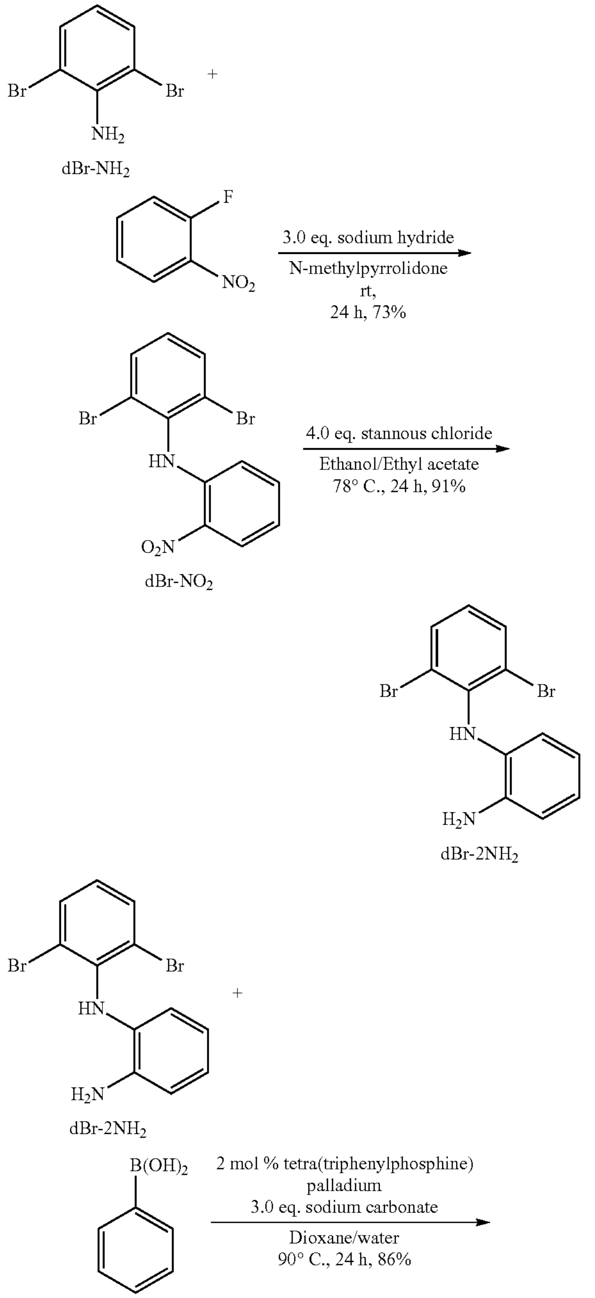

-continued

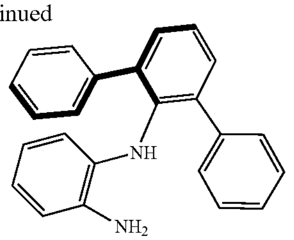

dPh-$NH_2$

Synthesis of intermediate dBr-$NO_2$: to a reaction flask were added dBr-$NH_2$ (20 g, 80 mmoL, 1.0 eq.) dissolved with N-methylpyrrolidone (150 mL), followed by adding sodium hydride (9.6 g, 240 mmoL, 3.0 eq.) and o-fluoronitrobenzene (16.9 g, 120 mmoL, 1.5 eq.). The reaction was carried out at room temperature and stopped after 24 hours. The reaction product was concentrated and subjected to silica gel column chromatography to give 21.6 g of yellow solid in 73% yield, which was used directly in subsequent reactions.

Synthesis of intermediate dBr-2$NH_2$: to a reaction flask were added dBr-$NO_2$ (21.6 g, 58 mmoL, 1.0 eq.), stannous chloride (52.4 g, 232 mmoL, 4.0 eq.), ethyl acetate (150 mL), and ethanol (150 mL). The reaction was carried out at 78° C. and stopped after 24 hours. The reaction product was concentrated and subjected to silica gel column chromatography to give 18.2 g of white solid in 91% yield, which was used directly in subsequent reactions.

Synthesis of intermediate dPh-$NH_2$: to a reaction flask were added dBr-2$NH_2$ (12 g, mmoL, 1.0 eq.), phenylboronic acid (12.7 g, 105 mmoL, 3.0 eq.), tetra(triphenylphosphine) palladium (809 mg, 0.75 mmoL, 0.02 eq.), sodium carbonate (12.1 g, 87.5 mmoL, 2.5 eq.), dioxane (120 mL), and water (30 mL). The reaction was carried out at 90° C. and stopped after 24 hours. The reaction product was concentrated and subjected to silica gel column chromatography to give 10.1 g of white solid in 86% yield, which was used directly in subsequent reactions.

Synthesis Route of Intermediate dPh-4tBu$NH_2$

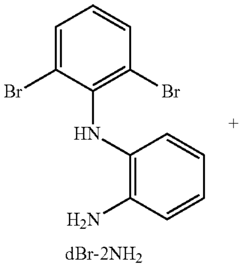

dBr-2$NH_2$

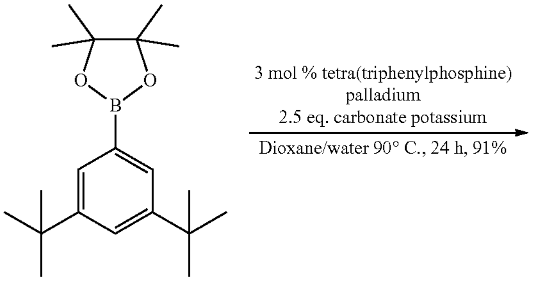

-continued

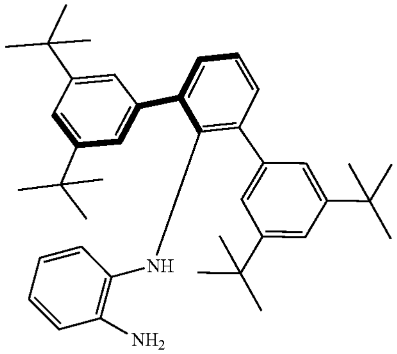

dPh-4tBu$NH_2$

Synthesis of intermediate dPh-4tBu$NH_2$: to a reaction flask were added dBr-2$NH_2$ (9.92 g, 29 mmoL, 1.0 eq.), 3,5-di-tert-butylphenylboronic acid pinacol ester (27.5 g, 86.9 mmoL, 3.0 eq.), tetra(triphenylphosphine)palladium (1.0 g, 0.87 mmoL, 3 moL %), potassium carbonate (10.0 g, 72.5 mmoL, 2.5 eq.), dioxane (40 mL), and water (10 mL). The reaction was carried out at 90° C. and stopped after 24 h. After cooling to room temperature, the reaction product was concentrated and subjected to silica gel column chromatography to give 14.8 g of white solid in 91% yield, which was used directly in subsequent reactions.

Example 1: Synthesis Route of Tetradentate Metal Platinum (II) Complex Phosphorescent Light Emitting Material PtO6

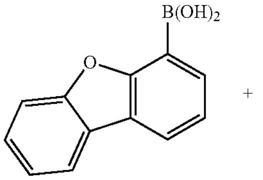

A-40-B$(OH)_2$

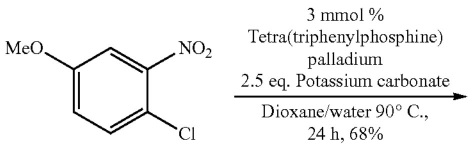

B

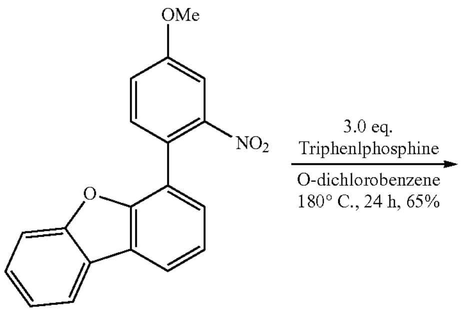

4O-$NO_2$

-continued

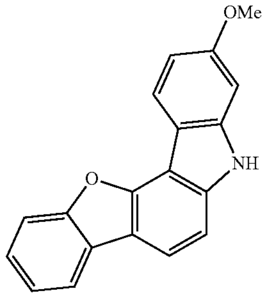

4O-NH

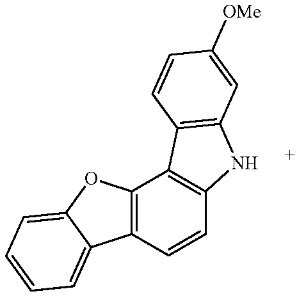

4O-NH

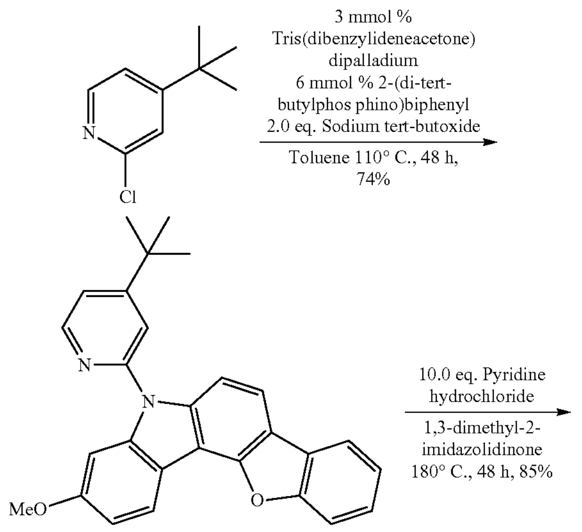

4O-OMe

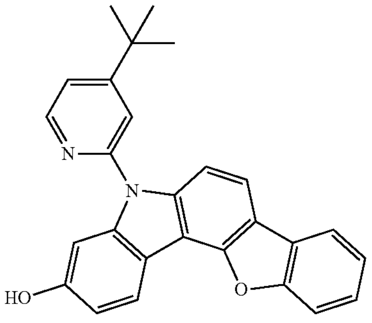

4O-OH

-continued

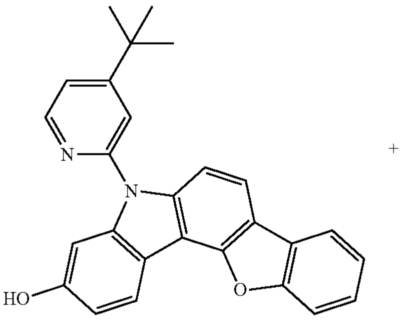

4O-OH

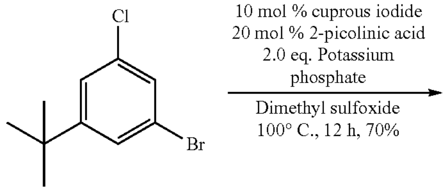

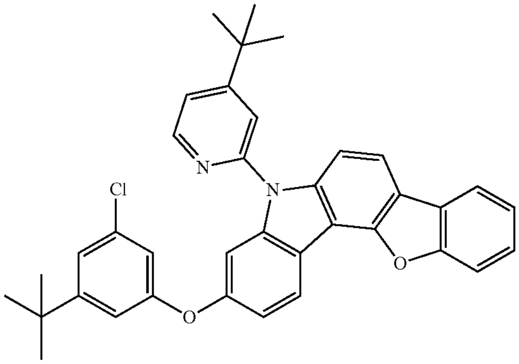

tBu-4O-Cl

Synthesis of intermediate 4O-$NO_2$: to a reaction flask were added A-4O-$B(OH)_2$ (5.8 g, 25.4 mmoL, 1.2 eq.), B (4.5 g, 21.2 mmoL, 1.0 eq.), tetra(triphenylphosphine)palladium (734 g, 0.64 mmoL, 3 moL %), potassium carbonate (5.86 g, 85.2 mmoL, 2.0 eq.), dioxane (40 mL), and water (10 mL). The reaction was carried out at 90° C. and stopped after 24 h. After cooling to room temperature, the reaction product was concentrated and subjected to silica gel column chromatography to give 4.5 g of yellow solid in 68% yield. $^{1}H$ NMR (500 MHz, DMSO) δ 3.95 (s, 3H), 7.42 (td, J=7.5, 1.0 Hz, 1H), 7.47 (dd, J=8.5, 2.5 Hz, 1H), 7.49-7.54 (m, 3H), 7.59 (d, J=8.5 Hz, 1H), 7.67 (d, J=8.65 Hz, 1H), 7.71 (d, J=3.0 Hz, 1H), 8.18 (dd, J=6.5, 2.0 Hz, 2H).

Synthesis of intermediate 4O-NH: to a reaction flask were added 4O-$NO_2$ (4.5 g, 14.1 mmoL, 1.0 eq.), triphenylphosphine (11.1 g, 42.3 mmoL, 3.0 eq.), and o-dichlorobenzene (60 mL). The reaction was carried out at 110° C. and stopped after 24 h. After cooling to room temperature, the reaction product was concentrated and subjected to silica gel column chromatography to give 2.61 g of brown solid in 65% yield, which was used directly in subsequent reactions.

Synthesis of intermediate 4O-OMe: to a reaction flask were added 4O-NH (2.4 g, 8 mmoL, 1.0 eq.), 4-(tert-butyl)-2-chloropyridine (1.63 g, 9.6 mmoL, 1.2 eq.), tris(dibenzylideneacetone) dipalladium (220 mg, 0.24 mmoL, 3 moL %), 2-(di-tert-butylphosphino) biphenyl (143 mg, 0.48 mmoL, 6 moL %), sodium tert-butoxide (1.54 g, 16 mmoL, 2.0 eq.), followed by adding toluene (50 mL). The reaction was carried out at 110° C. and stopped after 48 h. After cooling to room temperature, the reaction product was concentrated and subjected to silica gel column chromatography to give 1.75 g of brown solid in 74% yield, which was used directly in subsequent reactions.

Synthesis of intermediate 4O-OH: to a reaction flask were added 4O-OMe (1.05 g, 2.5 mmoL, 1.0 eq.), pyridine hydrochloride (4.5 g, 25 mmoL, 10.0 eq.) and 1,3-dimethyl-2-imidazolidinone (60 mL). The reaction was carried out at 180° C. and stopped after 48 h. After cooling to room temperature, the reaction product was concentrated and subjected to silica gel column chromatography to give 862 g of brown solid in 85% yield, which was used directly in subsequent reactions.

Synthesis of intermediate tBu-4O-Cl: to a reaction flask were added 4O-OH (500 mg, 1.23 mmoL, 1.0 eq.), 3-chloro-5-bromo-tert-butylbenzene (455 mg, 1.84 mmoL, 1.5 eq.), 2-picolinic acid (30 mg, 0.25 mmoL, 20 mmoL %), cuprous iodide (23 mg, 0.125 mmoL, 10 mmoL %), potassium phosphate (522 mg, 2.46 mmoL, 2.0 eq.), and dimethylsulfoxide (10 mL). The reaction was carried out at 110° C. and stopped after 12 h. After cooling to room temperature, the reaction product was concentrated and subjected to silica gel column chromatography to give 540 mg of white solid in 70% yield. $^1$H NMR (500 MHz, DMSO) δ 1.24 (s, 9H), 1.31 (s, 9H), 6.96 (t, J=2.0 Hz, 1H), 7.13 (t, J=1.5 Hz, 1H), 7.21 (t, J=2.0 Hz, 1H), 7.24 (dd, J=8.5, 2.0 Hz, 1H), 7.32 (d, J=2.0 Hz, 1H), 7.44-7.47 (m, 1H), 7.51-7.54 (m, 2H), 7.71 (d, J=2.0 Hz, 1H), 7.78 (d, J=8.5 Hz, 1H), 7.87 (d, J=8.0 Hz, 1H), 8.16-8.19 (m, 2H), 8.44 (d, J=8.5 Hz, 1H), 8.62 (d, J=5.5 Hz, 1H).

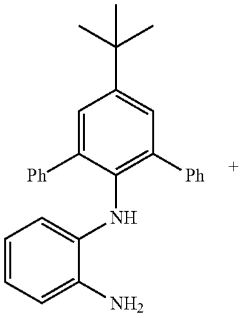

dPh-tBuNH2

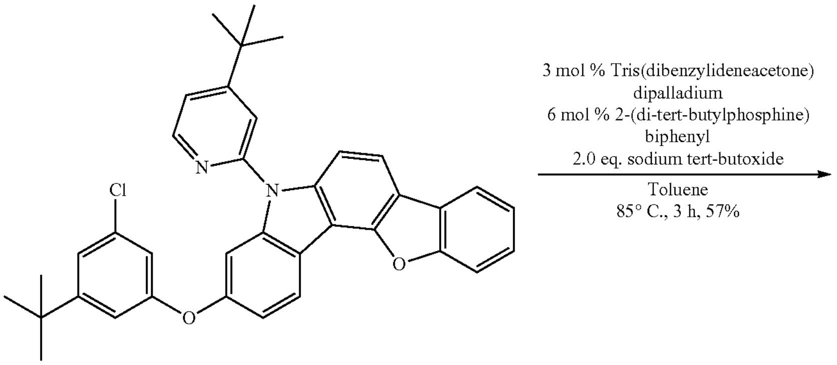

tBu-4O-Cl

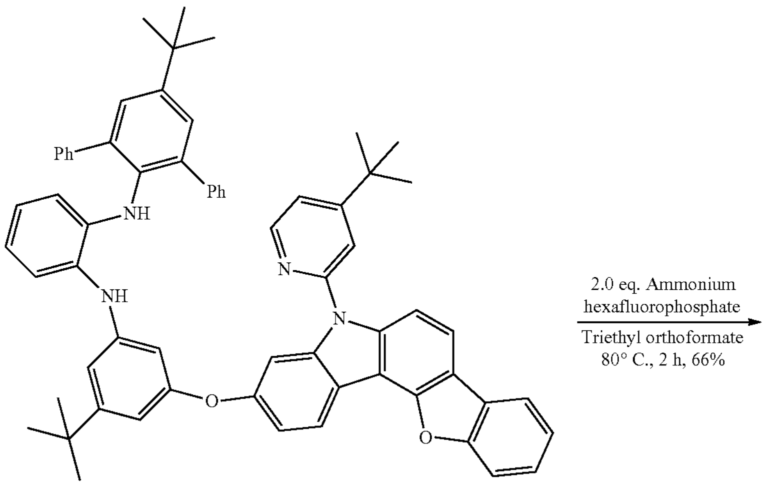

LNH-PtO6

-continued

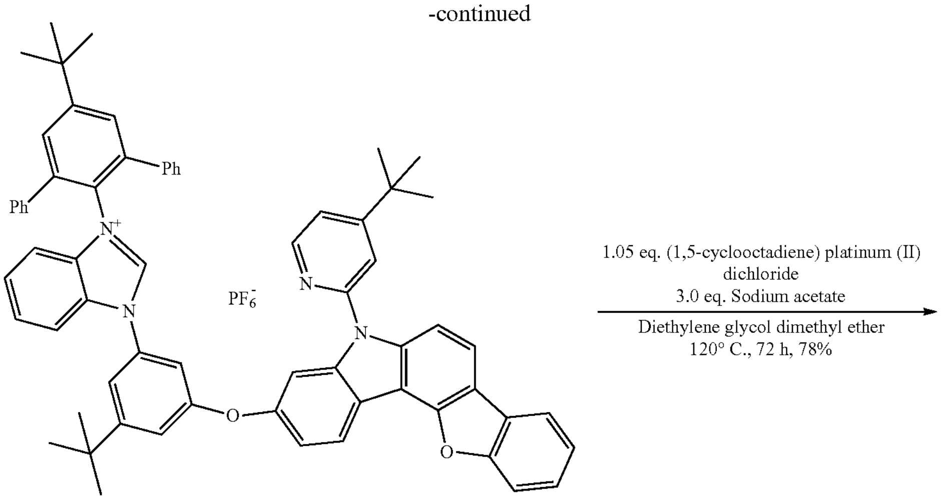

L-PtO6

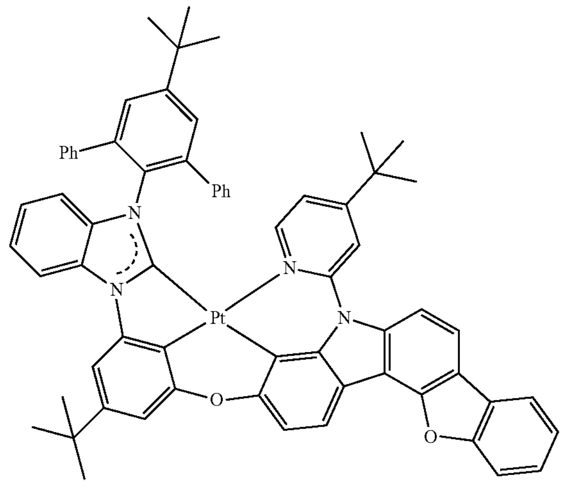

L-PtO6

Synthesis of intermediate LNH-PtO6: to a reaction flask were added dPh-tBuNH$_2$ (409 mg, 1.04 mmoL, 1.2 eq.), tBu-4O-Cl (500 mg, 0.87 mmoL, 1.0 eq.), tris(dibenzylideneacetone) dipalladium (24 mg, 0.03 mmoL, 3 moL %), 2-(di-tert-butylphosphino) biphenyl (16 mg, 0.06 mmoL, 6 moL %) and sodium tert-butoxide (167 mg, 1.74 mmoL, 2.0 eq.), followed by adding toluene (5 mL). The reaction was carried out at 85° C. and stopped after 3 h. After cooling to room temperature, the reaction product was concentrated and subjected to silica gel column chromatography to give 460 mg of white solid in 57% yield, which was used directly in subsequent reactions.

Synthesis of ligand L-PtO6: to a reaction flask was added LNH-PtO6 (370 mg, 0.4 mmoL, 1.0 eq.), followed by ammonium hexafluorophosphate (130 mg, 0.8 mmoL, 2.0 eq.) and triethyl orthoformate (5 mL). The reaction was carried out at 80° C. and stopped after 2 h. After cooling to room temperature, the reaction product was concentrated and subjected to silica gel column chromatography to give 287 mg of white solid in 66% yield. $^1$H NMR (500 MHz, DMSO) δ 1.30 (s, 9H), 1.31 (s, 9H), 1.43 (s, 9H), 6.88 (t, J=2.5 Hz, 1H), 6.97 (t, J=2.0 Hz, 1H), 7.11-7.17 (m, 10H), 7.33 (dd, J=8.5, 2.0 Hz, 1H), 7.45-7.59 (m, 8H), 7.70-7.72 (m, 3H), 7.78 (d, J=1.5 Hz, 1H), 7.80 (d, J=9.0 Hz, 1H), 7.87 (d, J=7.5 Hz, 1H), 8.19-8.22 (m, 2H), 8.52 (d, J=8.0 Hz, 1H), 8.65 (d, J=5.0 Hz, 1H), 10.26 (s, 1H).

Synthesis of PtO6: to a reaction flask were added L-PtO6 (220 mg, 0.2 mmoL, 1.0 eq.), (1,5-cyclooctadiene) platinum (II) dichloride (73 mg, 0.21 mmoL, 1.05 eq.), sodium acetate (50 mg, 0.57 mmoL, 3.0 eq.), and diethylene glycol dimethyl ether (10 mL). The reaction was carried out at 120° C. and stopped after 72 h. After cooling to room temperature, the reaction product was concentrated and subjected to silica gel column chromatography to give 178 mg of light yellow solid in 78% yield. 1H NMR (400 MHz, DMSO-d6) δ1.23 (s, 9H), 1.43 (s, 18H), 6.64 (dd, J=6.4, 1.6 Hz, 2H), 6.95-7.05 (m, 5H), 7.16 (t, J=8.0 Hz, 2H), 7.28-7.37 (m, 5H), 7.46-7.60 (m, 6H), 7.77 (d, J=9.2 Hz, 1H), 7.91 (d, J=8.0 Hz, 1H), 8.04 (d, J=8.0 Hz, 2H), 8.13 (t, J=7.2 Hz, 2H), 8.27 (d, J=7.2 Hz, 1H), 8.35 (d, J=8.4 Hz, 1H), 8.95 (d, J=6.4 Hz, 1H).

Example 2: Synthesis Route of Tetradentate Metal Platinum (11) Complex Phosphorescent Light Emitting Material PtO2
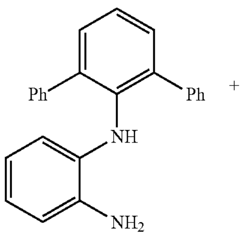
dPh-$NH_2$
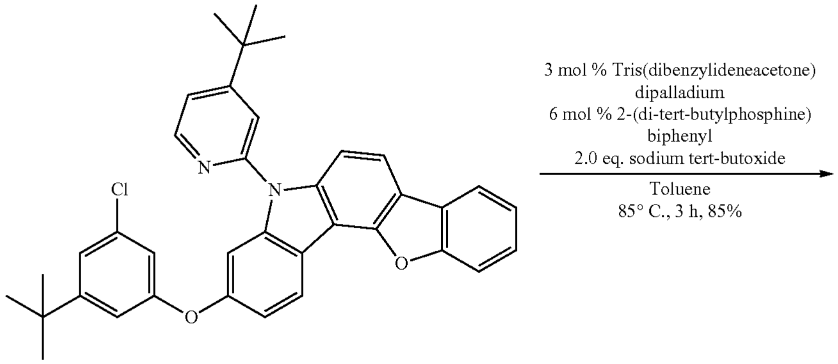
tBu-4O-Cl
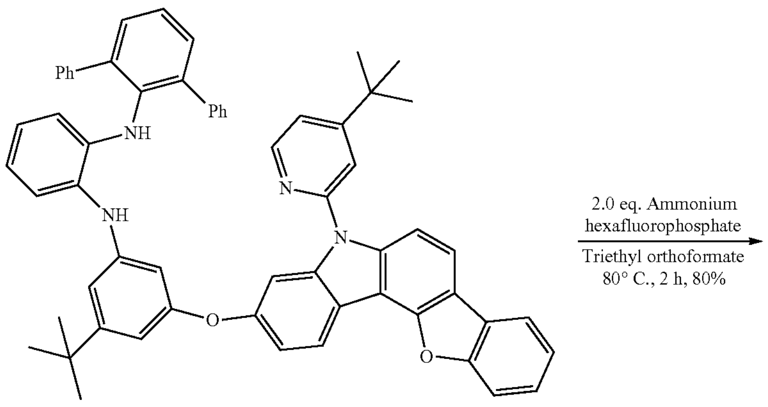
LNH-PtO2
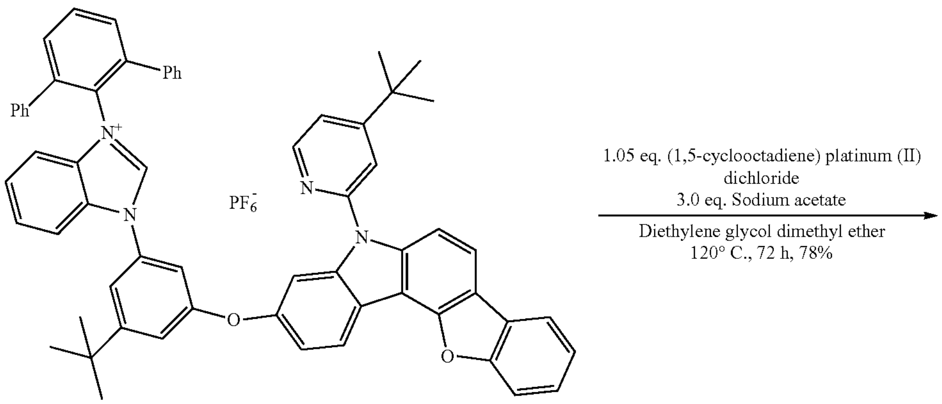
L-PtO2

-continued

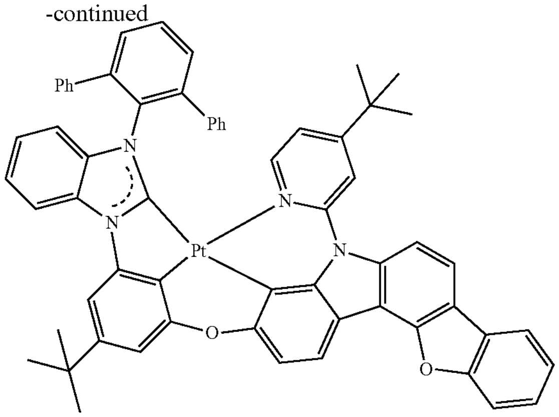

L-PtO2

Synthesis of intermediate LNH-PtO2: to a reaction flask were added dPh-$NH_2$ (200 mg, 0.6 mmoL, 1.0 eq.), tBu-4O-Cl (361 mg, 0.63 mmoL, 1.05 eq.), tris(dibenzylideneacetone) dipalladium (16 mg, 0.02 mmoL, 3 moL %), 2-(di-tert-butylphosphino) biphenyl (10 mg, 0.04 mmoL, 6 moL %), and sodium tert-butoxide (115 mg, 1.2 mmoL, 2.0 eq.), followed by adding toluene (5 mL). The reaction was carried out at 85° C. and stopped after 3 h. After cooling to room temperature, the reaction product was concentrated and subjected to silica gel column chromatography to give 419 mg of white solid in 85% yield, which was used directly in subsequent reactions.

Synthesis of ligand L-PtO2: to a reaction flask was added LNH-PtO2 (500 mg, 0.57 mmoL, 1.0 eq.), ammonium hexafluorophosphate (185 mg, 1.14 mmoL, 2.0 eq.) and triethyl orthoformate (5 mL). The reaction was carried out at 80° C. and stopped after 2 h. After cooling to room temperature, the reaction product was concentrated and subjected to silica gel column chromatography to give 500 mg of white solid in 80% yield. $^1$H NMR (500 MHz, DMSO) δ 1.29 (s, 9H), 1.31 (s, 9H), 6.92 (t, J=2.0 Hz, 1H), 6.95 (t, J=1.5 Hz, 1H), 6.95 (t, J=1.5 Hz, 1H), 7.11-7.15 (m, 10H), 7.33 (dd, J=8.5, 2.0 Hz, 1H), 7.45-7.51 (m, 4H), 7.52-7.59 (m, 4H), 7.69-7.70 (m, 1H), 7.75-7.81 (m, 4H), 7.87 (d, J=8.0 Hz, 1H), 7.94 (t, J=8.0 Hz, 1H), 8.19-8.22 (m, 2H), 8.52 (d, J=8.5 Hz, 1H), 8.64 (d, J=5.0 Hz, 1H), 10.33 (s, 1H).

Synthesis of Pt PtO2: to a reaction flask were added L-PtO2 (450 mg, 0.44 mmoL, 1.0 eq.), (1,5-cyclooctadiene) platinum (II) dichloride (160 mg, 0.46 mmoL, 1.05 eq.), sodium acetate (108 mg, 1.32 mmoL, 3.0 eq.), and diethylene glycol dimethyl ether (10 mL). Nitrogen was bubbled to remove oxygen for 30 min. The reaction was carried out at 120° C. and stopped after 72 h. After cooling to room temperature, the reaction product was concentrated and subjected to silica gel column chromatography to give 368 mg of light yellow solid in 78% yield. $^1$H NMR (500 MHz, $CDCl_3$) δ 1.31 (s, 9H), 1.47 (s, 9H), 6.24 (dd, J=6.5, 2.0 Hz, 2H), 6.75-7.34 (m, 5H), 6.89 (d, J=7.5 Hz, 2H), 7.06 (t, J=8.0 Hz, 2H), 7.15 (d, J=1.5 Hz, 2H), 7.41-7.54 (m, 8H), 7.77 (d, J=8.0 Hz, 1H), 7.98 (d, J=8.5 Hz, 1H), 8.04-8.07 (m, 2H), 8.10 (d, J=8.5 Hz, 1H), 8.18 (d, J=2.5 Hz, 1H), 8.21 (d, J=8.5 Hz, 1H), 9.02 (d, J=6.0 Hz, 1H).

Example 3: Synthesis Route of Tetradentate Metal Platinum (II) Complex Phosphorescent Light Emitting Material PtO5

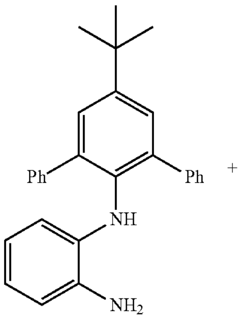

dPh-$tBuNH_2$

-continued
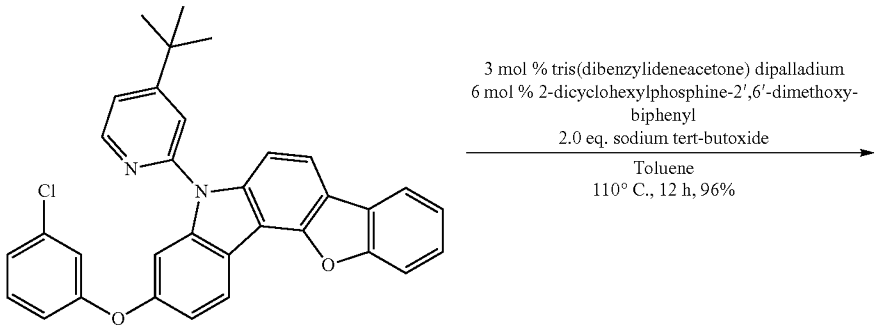
4O-Cl
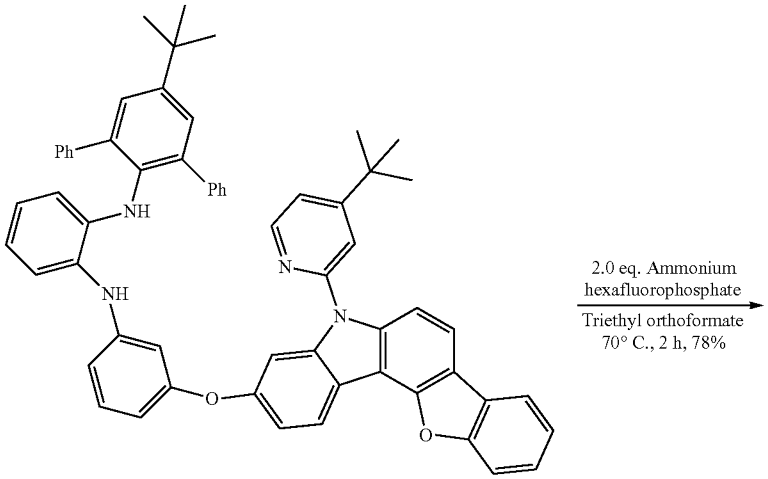
LNH-PtO5
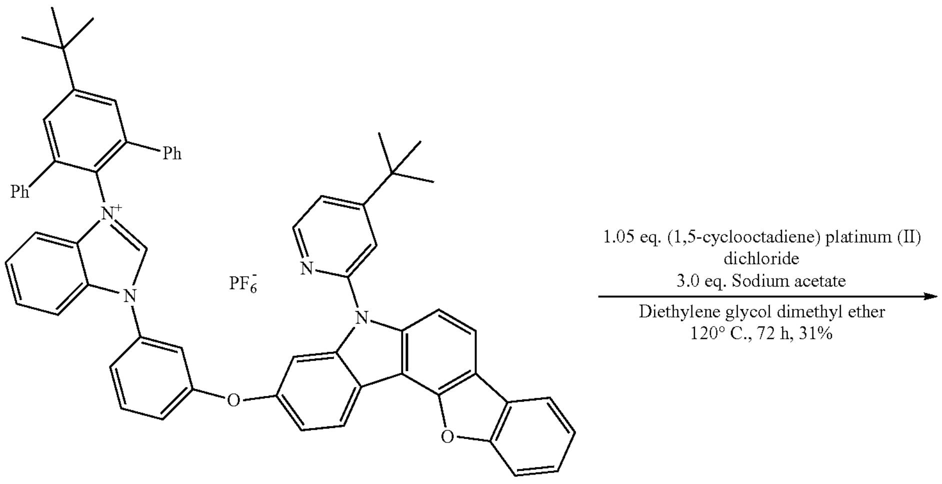
L-PtO5

-continued

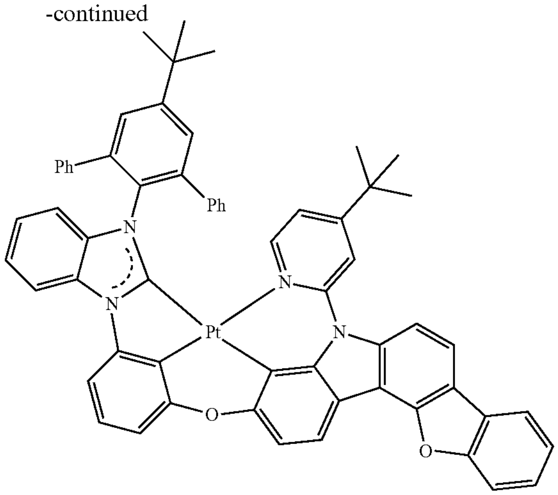

L-PtO5

Synthesis of intermediate LNH-PtO5: to a reaction flask were added dPh-tBuNH$_2$ (502 mg, 1.28 mmol, 1.1 eq.), 4O-Cl (600 mg, 1.16 mmol, 1.0 eq.), tris(dibenzylideneacetone)dipalladium (32 mg, 0.035 mmol, 3 mol %), 2-dicyclohexylphosphino-2',6'-dimethoxy-biphenyl (29 mg, 0.070 mmol, 6 mol %), and sodium tert-butoxide (223 mg, 2.32 mmol, 2.0 eq.), followed by adding toluene (5 mL). The reaction was carried out at 110° C. in an oil bath and stopped after 12 h. After cooling to room temperature, the reaction product was concentrated and subjected to silica gel column chromatography to give 1.04 g of light green solid in 96% yield, which was used directly in subsequent reactions.

Synthesis of ligand L-PtO5: to a reaction flask were added LNH-PtO5 (1.04 g, 1.2 mmol, 1.0 eq.), ammonium hexafluorophosphate (391 mg, 2.4 mmol, 2.0 eq.) and triethyl orthoformate (5 mL). The reaction was carried out at 70° C. and stopped after 2 h. After cooling to room temperature, the reaction product was concentrated and subjected to silica gel column chromatography to give 961 mg of white solid in 78% yield. $^1$H NMR (500 MHz, $CDCl_3$) δ 1.42 (s, 9H), 1.45 (s, 9H), 6.66 (t, J=2.0 Hz, 1H), 6.95 (dd, J=8.0, 2.0 Hz, 1H), 7.05-7.08 (m, 2H), 7.10-7.16 (m, 8H), 7.22 (dd, J=8.5, 2.0 Hz, 1H), 7.25 (s, 1H), 7.27 (d, J=2.0 Hz, 1H), 7.37-7.44 (m, 3H), 7.46-7.49 (m, 2H), 7.52-7.55 (m, 2H), 7.59 (s, 2H), 7.64 (d, J=2.0 Hz, 1H), 7.68-7.72 (m, 2H), 7.77 (d, J=8.0 Hz, 1H), 8.00 (t, J=7.5 Hz, 2H), 8.59 (d, J=8.5 Hz, 1H), 8.64 (d, J=5.5 Hz, 1H), 9.09 (s, 1H).

Synthesis of PtO5: to a reaction flask were added L-PtO5 (890 mg, 0.86 mmoL, 1.0 eq.), (1,5-cyclooctadiene) platinum (II) dichloride (337 mg, 0.90 mmoL, 1.05 eq.), sodium acetate (212 mg, 2.58 mmoL, 3.0 eq.), and diethylene glycol dimethyl ether (10 mL). The reaction was carried out at 120° C. and stopped after 72 h. After cooling to room temperature, the reaction product was concentrated and subjected to silica gel column chromatography to give 283 mg of light yellow solid in 31% yield. $^1$H NMR (500 MHz, Chloroform-d) δ 1.22 (s, 9H), 1.44 (s, 9H), 6.33-7.09 (m, 11H), 7.23-7.24 (m, 2H), 7.27 (s, 1H), 7.42-7.53 (m, 7H), 7.79 (d, J=9.0 Hz, 1H), 7.92 (d, J=8.5 Hz, 1H), 8.00-8.07 (m, 4H), 8.26 (d, J=8.0 Hz, 1H), 9.12 (d, J=6.5 Hz, 1H).

Example 4: Synthesis Route of Tetradentate Metal Platinum (II) Complex Phosphorescent Light Emitting Material PtO27

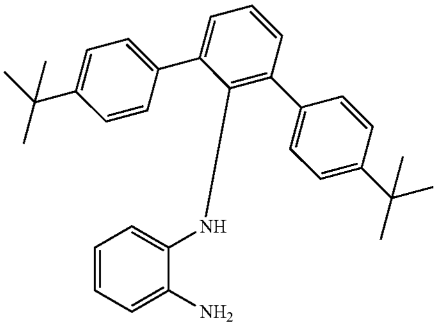

M1-NH$_2$

+

-continued
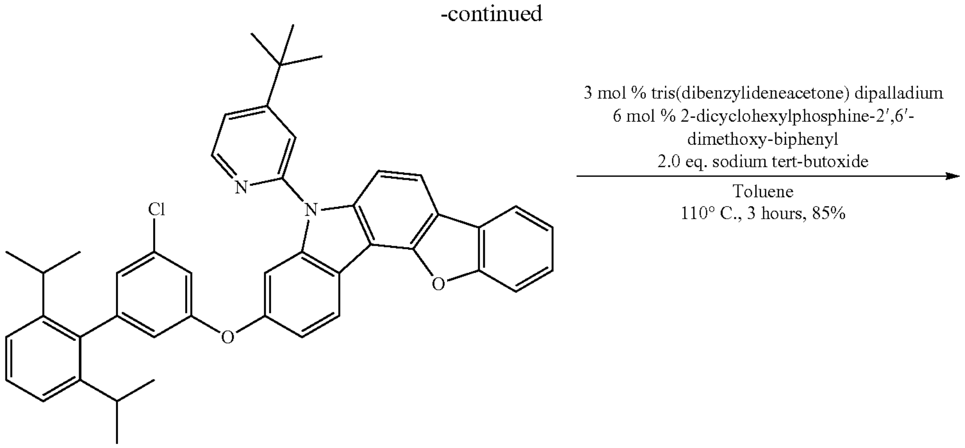
PhDiPr-4O-Cl
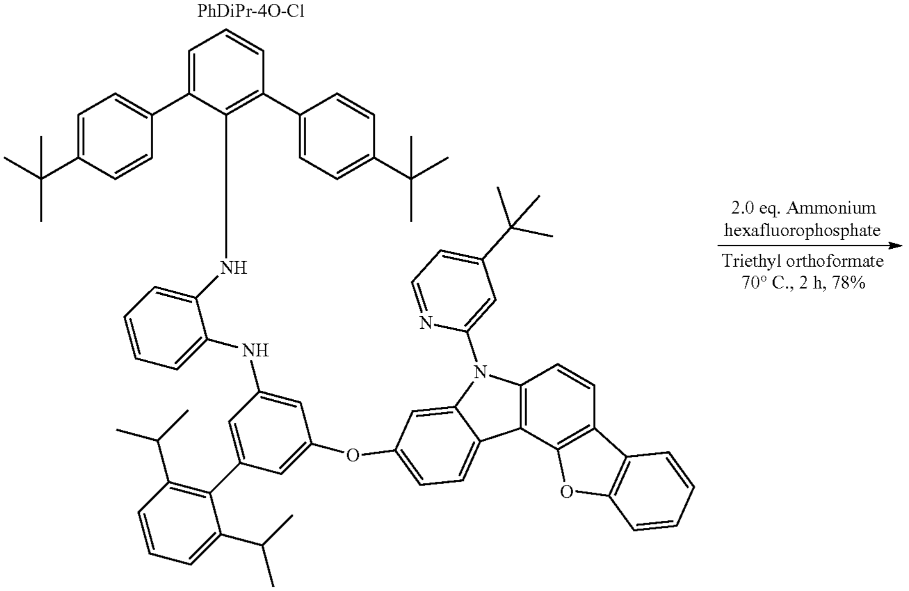
LNH-PtO27
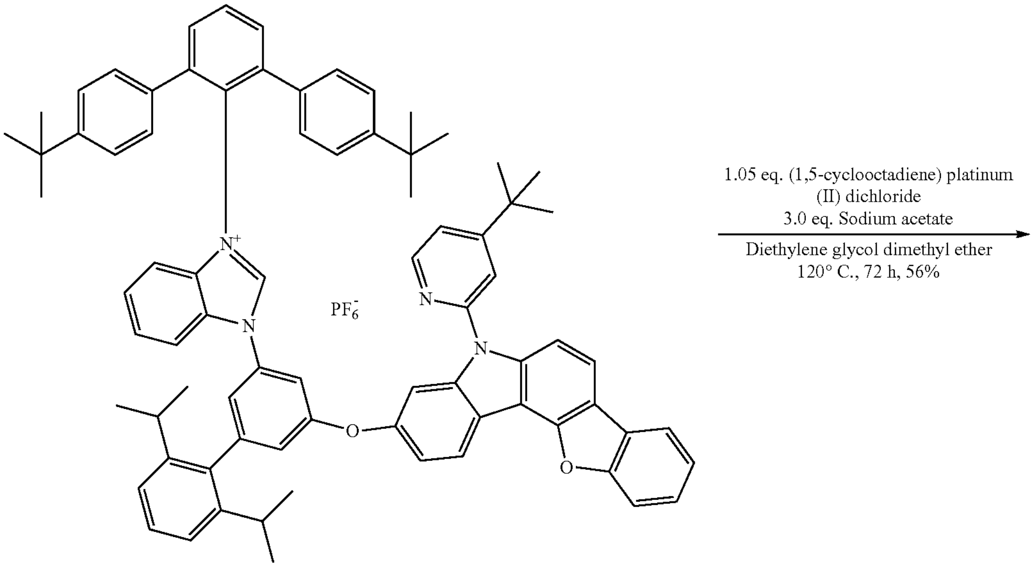
L-PtO27

-continued

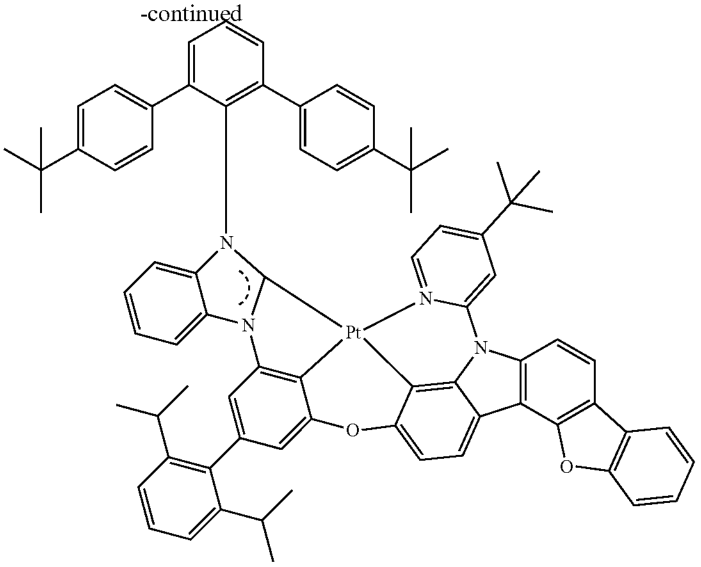

PtO27

PtO27 was synthesized by referring to the synthesis procedure and reaction condition of compound PtO6 in Example 5. The synthesis afforded the desired product LNH-PtO27, 1.24 g of light green foamy solid in 85% yield. The desired product L-PtO27, 881 mg of light green foamy solid, in 78% yield. Molecular weight [M]$^+$: 1100.5. The desired product PtO27, 425 mg of yellow solid in 56% yield. Molecular weight [M+H]$^+$: 1294.5.

Example 5: Synthesis Route of Tetradentate Metal Platinum (II) Complex Phosphorescent Light Emitting Material PtO33

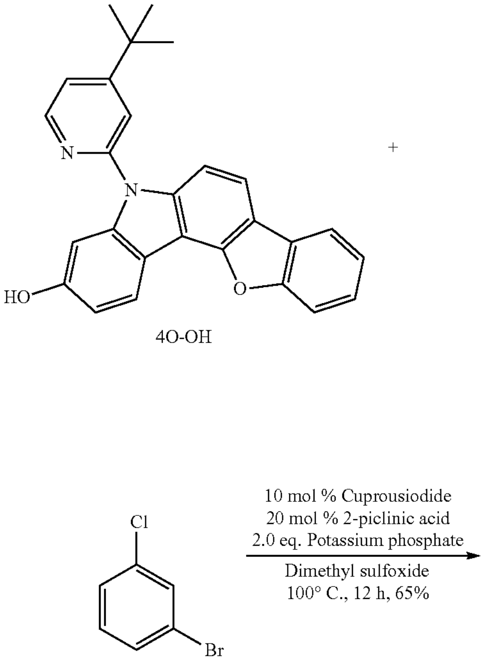

4O-OH

-continued

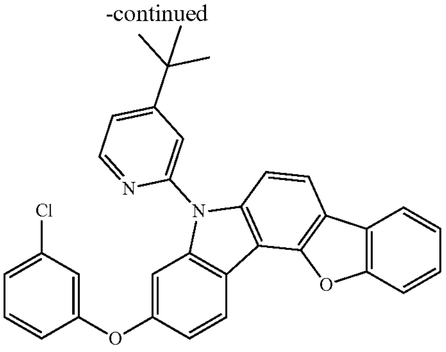

4O-Cl

Synthesis of intermediate 4O-Cl: to a reaction flask were added 4O-OH (200 mg, 0.49 mmoL, 1.0 eq.), m-chlorobromobenzene (140 mg, 0.73 mmoL, 1.5 eq.), 2-picolinic acid (12 mg, 0.098 mmoL, 20 mmoL %), cuprous iodide (9 mg, 0.049 mmoL, 5 mmoL %), potassium phosphate (208 mg, 0.98 mmoL, 2.0 eq.), and dimethylsulfoxide (10 mL). The reaction was carried out at 100° C. and stopped after 12 h. After cooling to room temperature, the reaction product was concentrated and subjected to silica gel column chromatography to give 164 mg of white solid in 65% yield. $^1$H NMR (500 MHz, DMSO) δ 1.32 (s, 9H), 7.09-7.12 (m, 1H), 7.20-7.26 (m, 3H), 7.33 (d, J=2.0 Hz, 1H), 7.40-7.48 (m, 2H), 7.51-7.55 (m, 2H), 7.74 (d, J=2.0 Hz, 1H), 7.80 (d, J=8.5 Hz, 1H), 7.88 (d, J=8.0 Hz, 1H), 8.18-8.20 (m, 2H), 8.45 (d, J=8.5 Hz, 1H), 8.64 (d, J=5.45 Hz, 1H).

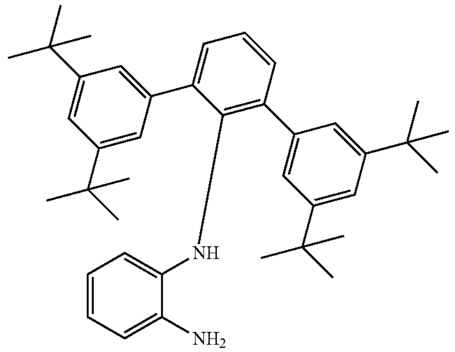
dPh-4tBuNH$_2$
+
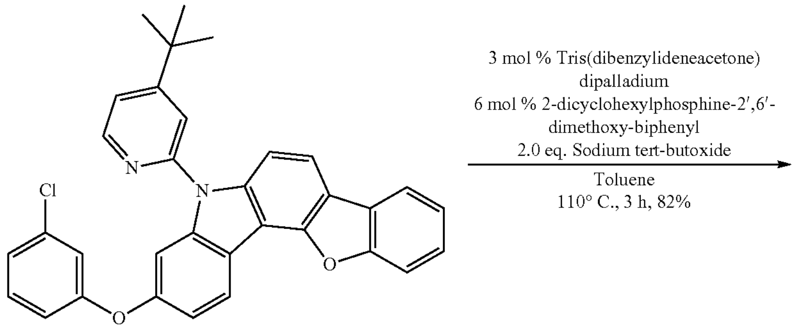
4O-Cl
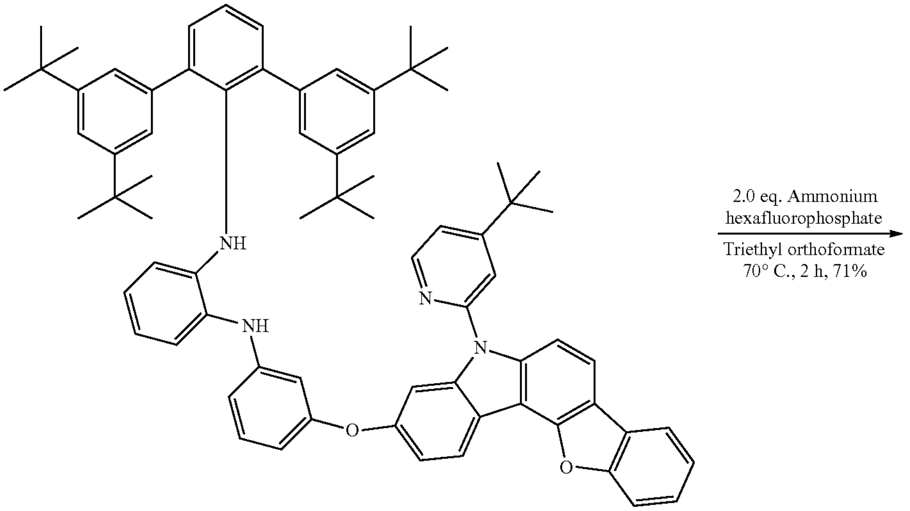
LNH-PtO33

-continued

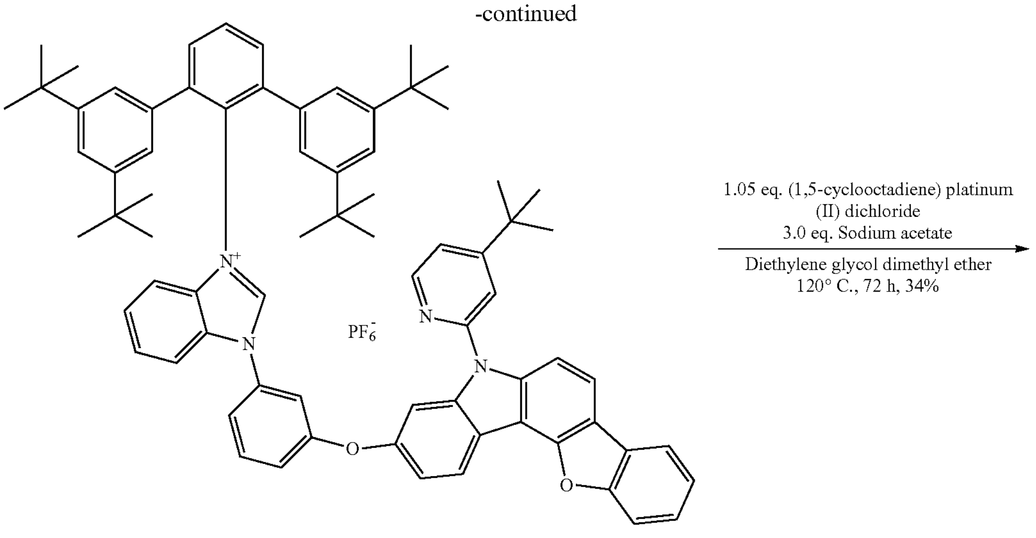

L-PtO33

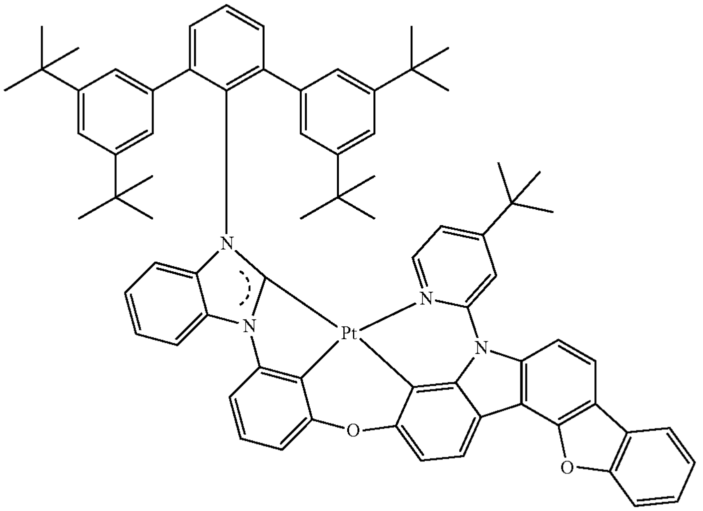

PtO33

Synthesis of intermediate LNH-PtO33: to a reaction flask were added dPh-4tBuNH$_2$ (477 mg, 0.85 mmoL, 1.1 eq.), 4O-Cl (400 mg, 0.77 mmoL, 1.0 eq.), tris(dibenzylideneacetone)dipalladium (21 mg, 0.02 mmoL, 3 moL %), 2-dicyclohexylphosphino-2',6'-dimethoxy-biphenyl (19 mg, 0.04 mmoL, 6 moL %), and sodium tert-butoxide (149 mg, 1.4 mmoL, 2.0 eq.), followed by adding toluene (5 mL). The reaction was carried out at 110° C. in an oil bath and stopped after 3 h. After cooling to room temperature, the reaction product was concentrated and subjected to silica gel column chromatography to give 660 mg of white solid in 82% yield, which was used directly in subsequent reactions.

Synthesis of ligand L-PtO33: to a reaction flask were added LNH-PtO33 (660 mg, 0.63 mmoL, 1.0 eq.), ammonium hexafluorophosphate (206 mg, 1.27 mmoL, 2.0 eq.) and triethyl orthoformate (5 mL). The reaction was carried out at 70° C. and stopped after 2 h. After cooling to room temperature, the reaction product was concentrated and subjected to silica gel column chromatography to give 542 mg of white solid in 71% yield. $^1$H NMR (500 MHz, DMSO-d$_6$) δ 0.92 (s, 36H), 1.34 (s, 9H), 6.55 (t, J=2.5 Hz, 1H), 6.68 (ddd, J=8.5, 2.5, 1.0 Hz, 1H), 6.91 (d, J=1.5 Hz, 4H), 7.14 (t, J=2.0 Hz, 2H), 7.32 (dd, J=8.0, 2.0 Hz, 1H), 7.46-7.59 (m, 8H), 7.69-7.73 (m, 2H), 7.75 (d, J=1.0 Hz, 1H), 7.79-7.89 (m, 4H), 7.94-7.97 (m, 1H), 8.19-8.24 (m, 2H), 8.49 (d, J=8.5 Hz, 1H), 8.65 (dd, J=5.0, 0.5 Hz, 1H), 10.01 (s, 1H).

Synthesis of PtO33: to a reaction flask were added L-PtO33 (500 mg, 0.42 mmoL, 1.0 eq.), (1,5-cyclooctadiene) platinum (II) dichloride (156 mg, 0.42 mmoL, 1.05 eq.), sodium acetate (103 mg, 1.25 mmoL, 3.0 eq.), and diethylene glycol dimethyl ether (10 mL). The reaction was carried out at 120° C. and stopped after 72 h. After cooling to room temperature, the reaction product was concentrated and subjected to silica gel column chromatography to give 108 mg of light yellow solid in 34% yield. $^1$H NMR (500 MHz, DMSO-d$_6$) δ 0.26-1.19 (br, 36H), 1.32 (s, 9H), 6.53-7.37 (m, 14H), 7.47-7.61 (m, 5H), 7.90 (d, J=8.0 Hz, 1H), 8.06 (d, J=8.0 Hz, 1H), 8.15-8.20 (m, 2H), 8.21-8.30 (m, 3H), 9.04 (d, J=6.5 Hz, 1H).

Example 6: Synthesis Route of Tetradentate Metal Platinum (II) Complex Phosphorescent Light Emitting Material PtO34
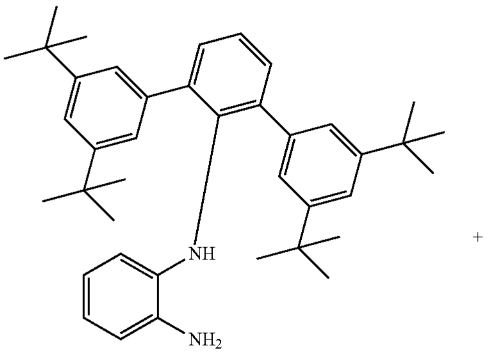
dPh-4tBuNH$_2$
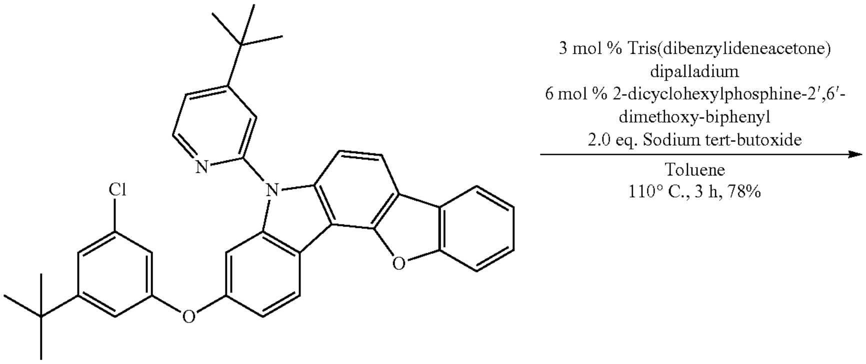
tBu-4O-Cl
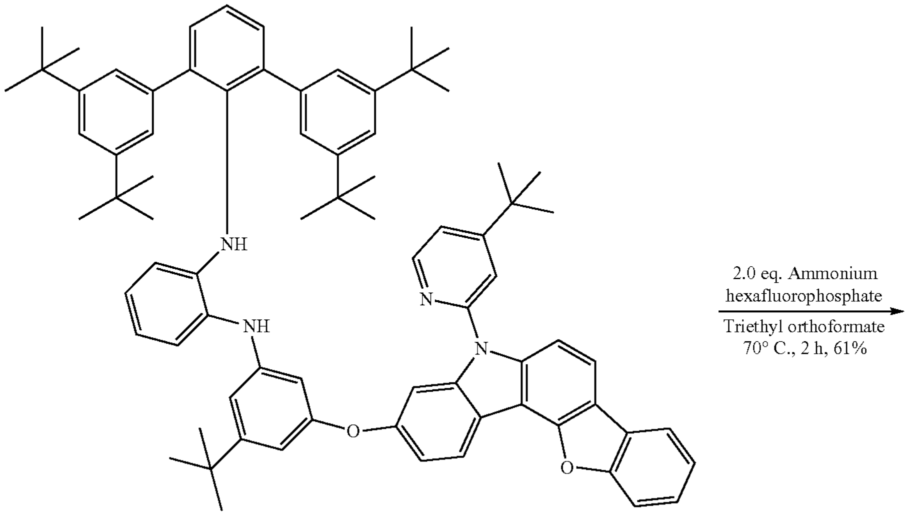
LNH-PtO34

-continued

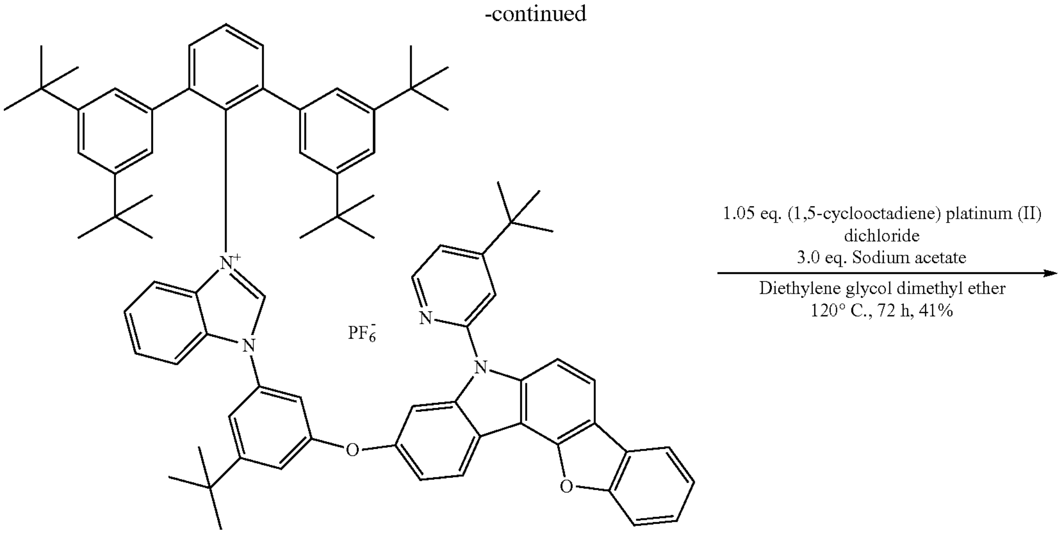

L-PtO34

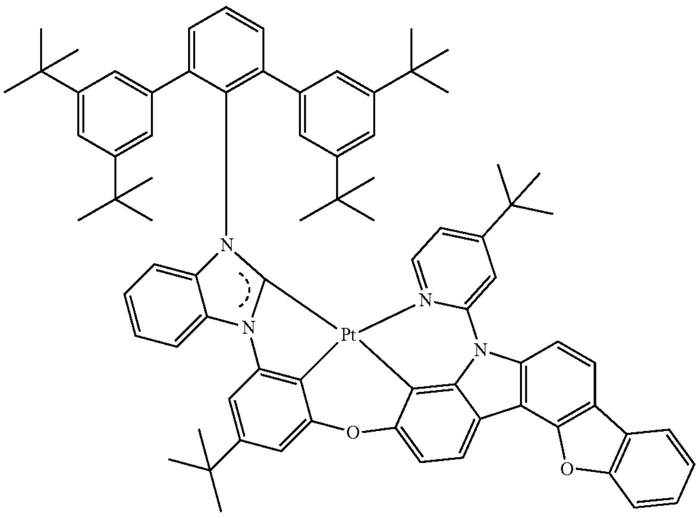

PtO34

Synthesis of intermediate LNH-PtO34: to a reaction flask were added dPh-4tBuNH$_2$ (430 mg, 0.77 mmol, 1.1 eq.), tBu-4O-Cl (400 mg, 0.70 mmol, 1.0 eq.), tris(dibenzylideneacetone)dipalladium (19 mg, 0.02 mmol, 3 mol %), 2-dicyclohexylphosphino-2',6'-dimethoxy-biphenyl (17 mg, 0.04 mmol, 6 mol %), sodium tert-butoxide (134 mg, 1.40 mmol, 2.0 eq.), followed by adding toluene (5 mL). The reaction was carried out at 110° C. in an oil bath and stopped after 3 h. After cooling to room temperature, the reaction product was concentrated and subjected to silica gel column chromatography to give 591 mg of white solid in 78% yield, which was used directly in subsequent reactions.

Synthesis of ligand L-PtO34: to a reaction flask was added LNH-PtO34 (591 mg, 0.54 mmol, 1.0 eq.), ammonium hexafluorophosphate (175 mg, 1.07 mmol, 2.0 eq.) and triethyl orthoformate (5 mL). The reaction was carried out at 70° C. and stopped after 2 h. After cooling to room temperature, the reaction product was concentrated and subjected to silica gel column chromatography to give 415 mg of white solid in 61% yield. $^1$H NMR (500 MHz, DMSO-d$_6$) δ 0.87 (s, 36H), 1.29 (s, 9H), 1.35 (s, 9H), 6.40 (t, J=2.0 Hz, 1H), 6.69 (t, J=2.0 Hz, 1H), 6.89 (d, J=2.0 Hz, 4H), 7.07 (t, J=1.5 Hz, 2H), 7.34 (dd, J=8.5, 2.5 Hz, 1H), 7.44-7.59 (m, 8H), 7.68 (d, J=8.5 Hz, 1H), 7.74 (d, J=1.0 Hz, 1H), 7.77-7.82 (m, 2H), 7.83 (s, 1H), 7.86-7.89 (m, 1H), 7.93-7.96 (m, 1H), 8.19-8.24 (m, 2H), 8.49 (d, J=8.0 Hz, 1H), 8.65 (d, J=5.5 Hz, 1H), 10.07 (s, 1H).

Synthesis of PtO34: to a reaction flask were added L-PtO34 (350 mg, 0.28 mmoL, 1.0 eq.), (1,5-cyclooctadiene) platinum (II) dichloride (104 mg, 0.29 mmoL, 1.05 eq.), sodium acetate (69 mg, 0.84 mmoL, 3.0 eq.), and diethylene glycol dimethyl ether (10 mL). The reaction was carried out at 120° C. and stopped after 72 h. After cooling to room temperature, the reaction product was concentrated and subjected to silica gel column chromatography to give 152 mg of light yellow solid in 41% yield. $^1$H NMR (500 MHz, DMSO-d$_6$) δ 0.75 (s, 36H), 1.32 (s, 9H), 1.40 (s, 9H), 6.64 (dd, J=6.0, 2.0 Hz, 1H), 6.80-7.12 (m, 9H), 7.28-7.33 (m, 2H), 7.45 (s, 1H), 7.50 (t, J=7.5 Hz, 1H), 7.57 (t, J=7.5 Hz, 3H), 7.90 (d, J=8.0 Hz, 1H), 8.05 (d, J=8.0 Hz, 2H), 8.17 (s, 1H), 8.21 (d, J=8.5 Hz, 1H), 8.25-8.28 (m, 2H), 9.00 (d, J=6.0 Hz, 1H).

Example 7: Synthesis Route of Tetradentate Metal Platinum (11) Complex Phosphorescent Light Emitting Material PtO37
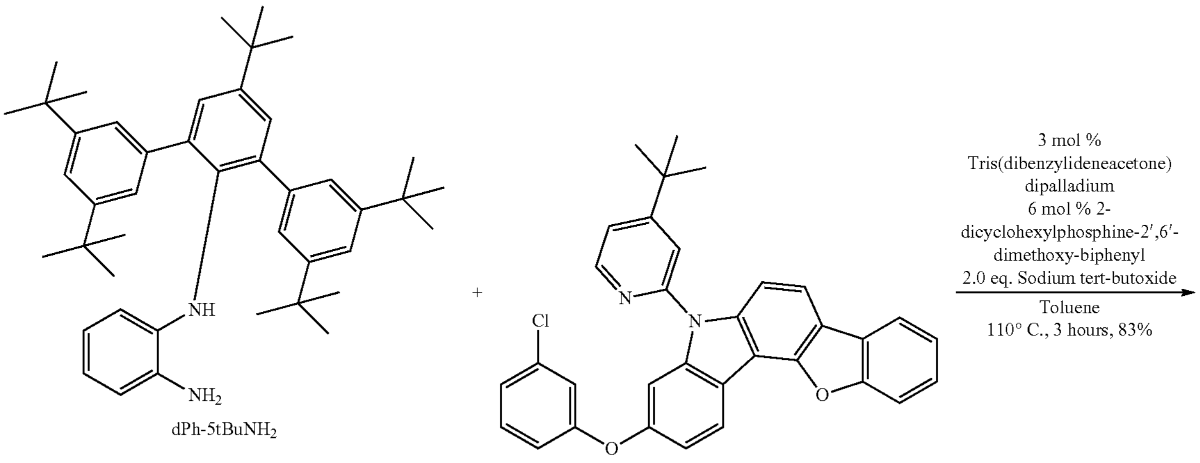
dPh-5tBuNH$_2$
4O-Cl
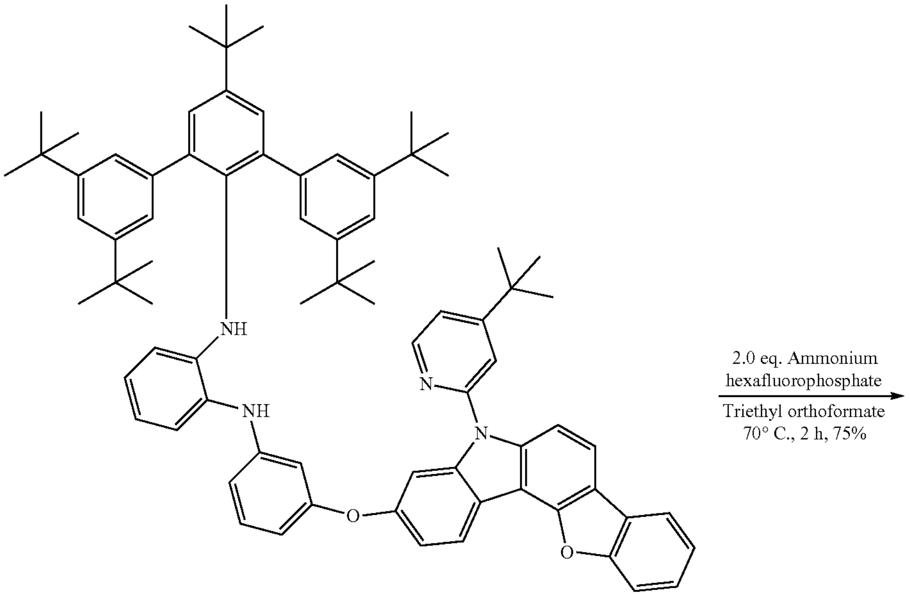
LNH-PtO37

-continued

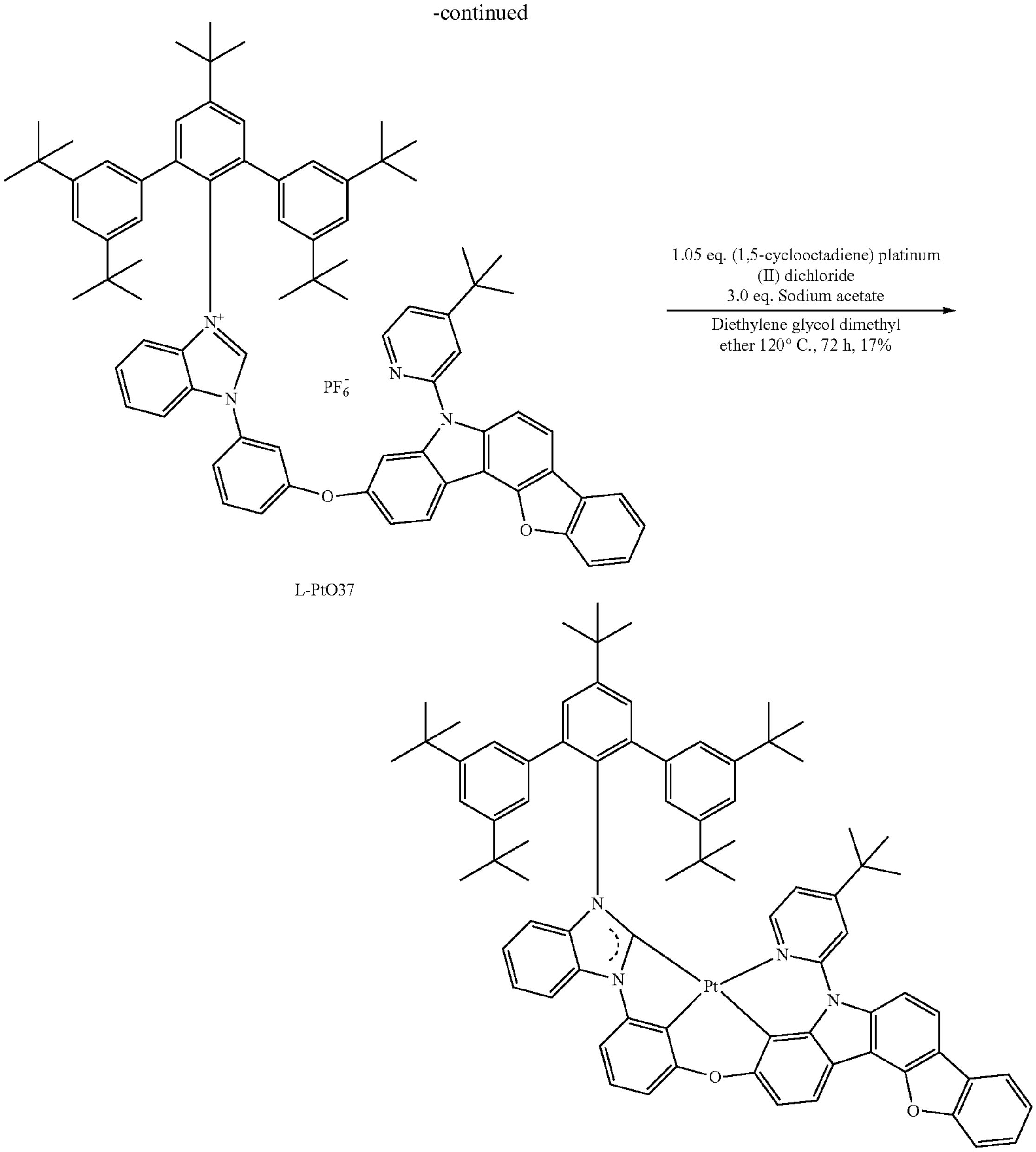

L-PtO37

PtO37

Synthesis of intermediate LNH-PtO37: to a reaction flask were added dPh-5tBuNH$_2$ (666 mg, 1.08 mmoL, 1.1 eq.), 4O-Cl (500 mg, 0.98 mmoL, 1.0 eq.), tris(dibenzylideneacetone)dipalladium (28 mg, 0.03 mmoL, 3 moL %), 2-dicyclohexylphosphino-2',6'-dimethoxy-biphenyl (25 mg, 0.06 mmoL, 6 moL %), sodium tert-butoxide (188 mg, 1.96 mmoL, 2.0 eq.), followed by adding toluene (5 mL). The reaction was carried out at 110° C. in an oil bath and stopped after 3 h. After cooling to room temperature, the reaction product was concentrated and subjected to silica gel column chromatography to give 896 mg of white solid in 83% yield, which was used directly in subsequent reactions.

Synthesis of ligand L-PtO37: to a reaction flask was added LNH-PtO37 (896 mg, 0.82 mmoL, 1.0 eq.), followed by ammonium hexafluorophosphate (267 mg, 1.64 mmoL, 2.0 eq.) and triethyl orthoformate (5 mL). The reaction was carried out at 70° C. and stopped after 2 h. After cooling to room temperature, the reaction product was concentrated and subjected to silica gel column chromatography to give 770 mg of white solid in 75% yield. $^1$H NMR (500 MHz, DMSO) δ 0.92 (s, 36H), 1.34 (s, 9H), 1.47 (s, 9H), 6.54 (s, 1H), 6.67 (d, J=7.0 Hz, 1H), 6.91 (s, 4H), 7.14 (s, 2H), 7.32 (dd, J=8.0, 2.0 Hz, 1H), 7.45-7.57 (m, 8H), 7.68-7.72 (m, 2H), 7.75 (s, 1H), 7.81 (d, J=7.5 Hz, 3H), 7.87 (d, J=8.0 Hz, 1H), 8.21 (t, J=8.5 Hz, 2H), 8.49 (d, J=8.0 Hz, 1H), 8.65 (d, J=5.5 Hz, 1H), 9.93 (s, 1H).

Synthesis of PtO37: to a reaction flask were added L-PtO37 (700 mg, 0.56 mmoL, 1.0 eq.), (1,5-cyclooctadiene) platinum (II) dichloride (221 mg, 0.59 mmoL, 1.05 eq.), sodium acetate (138 mg, 1.68 mmoL, 3.0 eq.), and diethylene glycol dimethyl ether (5 mL). The reaction was carried out at 120° C. and stopped after 72 h. After cooling to room temperature, the reaction product was concentrated and subjected to silica gel column chromatography to give 124 mg of light yellow solid in 17% yield. $^{1}H$ NMR (500 MHz, $CDCl_3$) δ 0.05-1.18 (m, 36H), 1.20 (s, 9H), 1.40 (s, 9H), 6.45 (dd, J=6.5, 2.0 Hz, 1H), 6.86 (d, J=8.0 Hz, 3H), 6.95-7.05 (m, 4H), 7.20 (t, J=8.0 Hz, 3H), 7.37-7.59 (m, 7H), 7.79 (dd, J=8.0, 2.0 Hz, 2H), 7.92-8.00 (m, 3H), 8.05 (d, J=7.5 Hz, 1H), 8.25 (d, J=8.5 Hz, 1H), 9.25 (d, J=6.5 Hz, 1H).

Example 8: Synthesis Route of Tetradentate Metal Platinum (II) Complex Phosphorescent Light Emitting Material PtO38

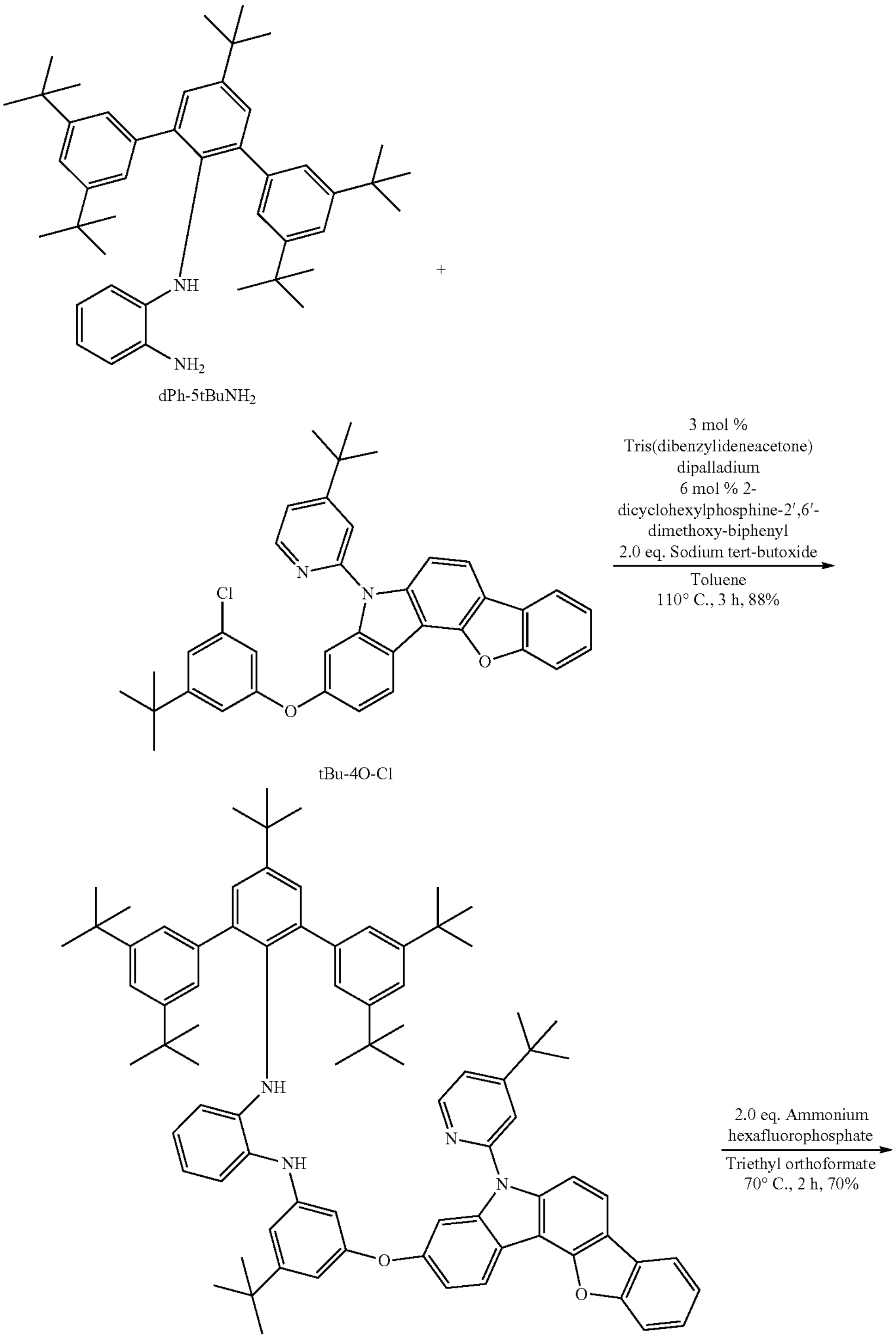

dPh-5tBuNH$_2$ tBu-4O-Cl

LNH-PtO38

-continued

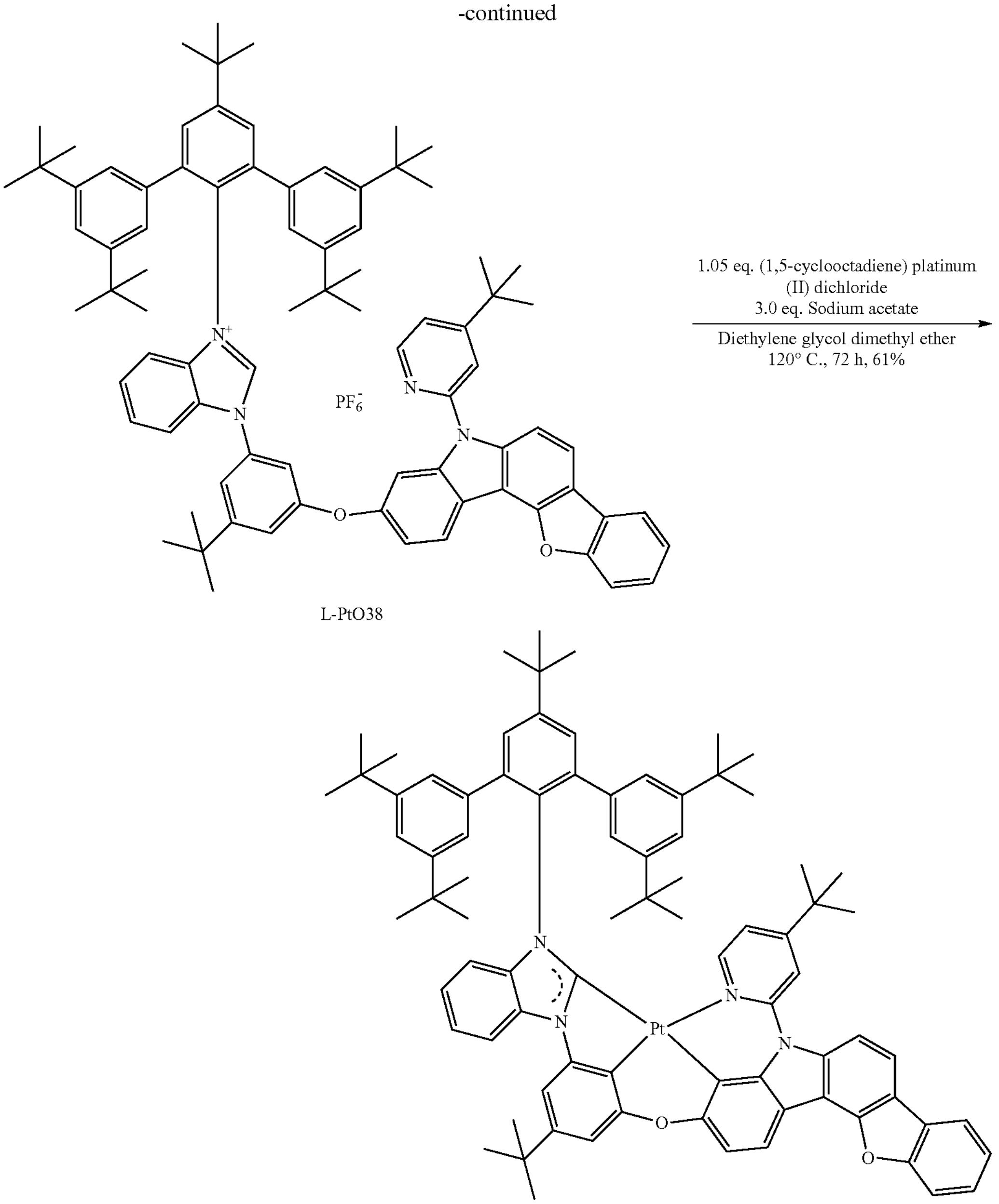

L-PtO38

PtO38

Synthesis of intermediate LNH-PtO38: to a reaction flask were added dPh-5tBuNH$_2$ (592 mg, 0.96 mmoL, 1.1 eq.), tBu-4O-Cl (500 mg, 0.87 mmoL, 1.0 eq.), tris(dibenzylideneacetone)dipalladium (24 mg, 0.03 mmoL, 3 moL %), 2-dicyclohexylphosphino-2',6'-dimethoxy-biphenyl (26 mg, 0.06 mmoL, 6 moL %), and sodium tert-butoxide (167 mg, 1.74 mmoL, 2.0 eq.), followed by adding toluene (5 mL). The reaction was carried out at 110° C. in an oil bath and stopped after 3 h. After cooling to room temperature, the reaction product was concentrated and subjected to silica gel column chromatography to give 887 mg of white solid in 88% yield, which was used directly in subsequent reactions.

Synthesis of ligand L-PtO38: to a reaction flask were added LNH-PtO38 (887 mg, 0.77 mmoL, 1.0 eq.), ammonium hexafluorophosphate (251 mg, 1.54 mmoL, 2.0 eq.), and triethyl orthoformate (5 mL). The reaction was carried out at 70° C. and stopped after 2 h. After cooling to room temperature, the reaction product was concentrated and subjected to silica gel column chromatography to give 700 mg of white solid in 70% yield. $^1$H NMR (500 MHz, DMSO) δ 0.87 (s, 36H), 1.28 (s, 9H), 1.34 (s, 9H), 1.46 (s, 9H), 6.38 (t, J=2.5 Hz, 1H), 6.70 (t, J=2.0 Hz, 1H), 6.89 (d, J=2.0 Hz, 4H), 7.06 (t, J=1.5 Hz, 2H), 7.34 (dd, J=8.5, 2.0 Hz, 1H), 7.42-7.50 (m, 3H), 7.52-7.58 (m, 5H), 7.67 (d, J=8.5 Hz, 1H), 7.74 (d, J=2.5 Hz, 1H), 7.78-7.80 (m, 3H), 7.86 (d, J=8.0 Hz, 1H), 8.21 (t, J=9.0 Hz, 2H), 8.49 (d, J=8.5 Hz, 1H), 8.65 (d, J=5.5 Hz, 1H), 10.00 (s, 1H).

Synthesis of PtO38: to a reaction flask were added L-PtO38 (622 mg, 0.48 mmoL, 1.0 eq.), (1,5-cyclooctadiene) platinum (II) dichloride (189 mg, 0.54 mmoL, 1.05 eq.), sodium acetate (118 mg, 1.44 mmoL, 3.0 eq.), and diethylene glycol dimethyl ether (5 mL). The reaction was carried out at 120° C. and stopped after 72 h. After cooling to room temperature, the reaction product was concentrated and subjected to silica gel column chromatography to give 400 mg of light yellow solid in 61% yield. $^1$H NMR (500 MHz, DMSO) δ 1.23 (s, 45H), 1.40 (s, 18H), 6.68 (d, J=8.0 Hz, 2H), 6.83-6.97 (m, 4H), 7.08 (t, J=7.5 Hz, 3H), 7.24-7.35 (m, 3H), 7.43-7.60 (m, 5H), 7.87 (d, J=8.5 Hz, 1H), 7.91 (d, J=8.0 Hz, 1H), 8.01 (d, J=2.0 Hz, 1H), 8.07 (dd, J=11.5, 8.0 Hz, 2H), 8.24 (d, J=8.0 Hz, 1H), 8.28 (d, J=8.5 Hz, 1H), 9.09 (d, J=6.5 Hz, 1H).

Example 9: Synthesis Route of Tetradentate Metal Platinum (II) Complex Phosphorescent Light Emitting Material PtO93

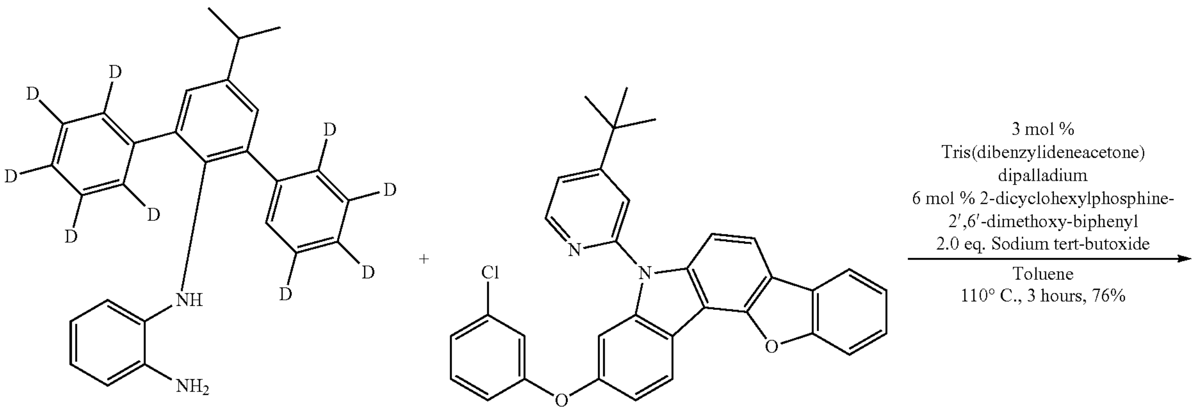

M4-NH$_2$ 4O-Cl

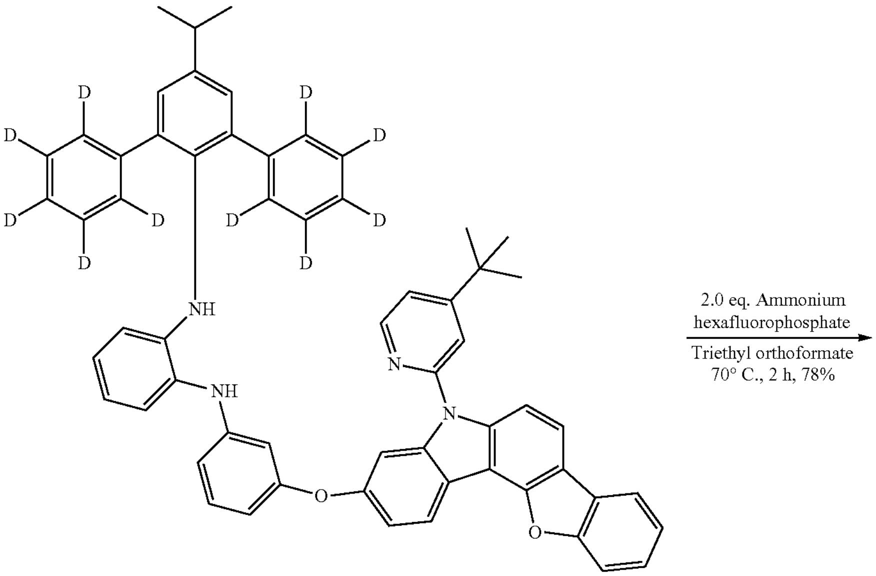

LNH-PtO93

-continued

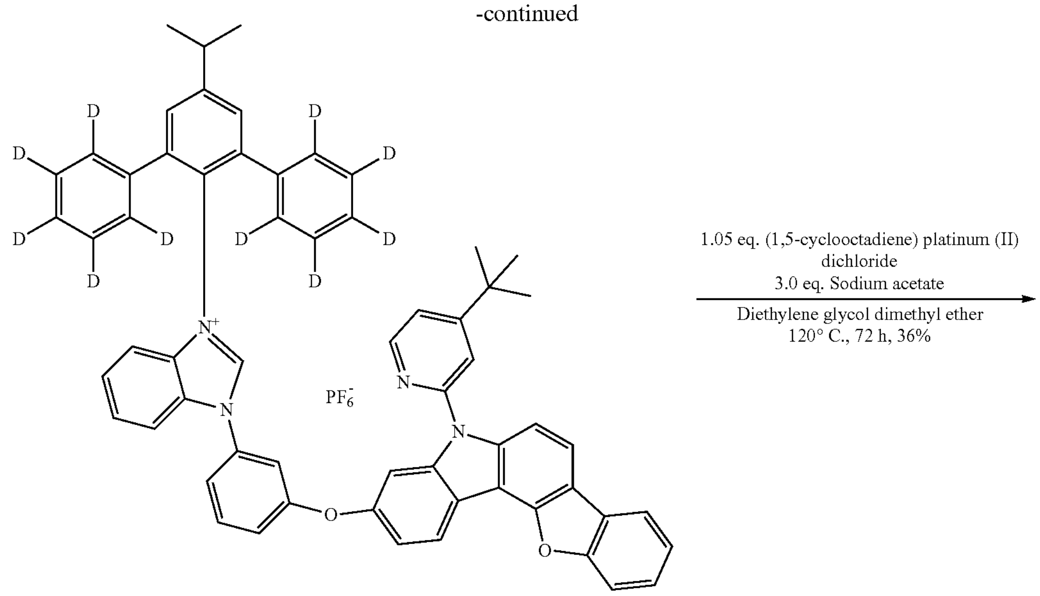

L-PtO93

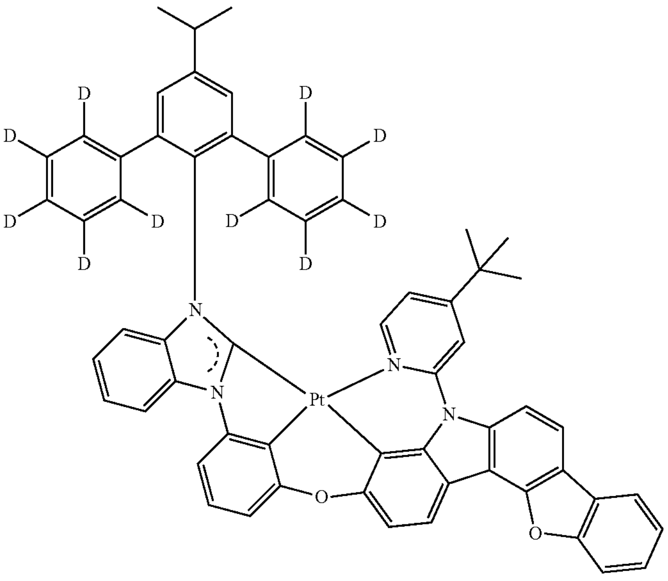

PtO93

PtS93 was synthesized by referring to the synthesis procedure and reaction condition of compound PtS6 in Example 12. The synthesis afforded the desired product LNH-PtO93, 1.19 g of light green foamy solid in 77% yield. The desired product L-PtO93, 891 mg of light green foamy solid, in 78% yield. Molecular weight $[M]^+$: 881.2. The desired product Pt 093, 325 mg of yellow solid in 36% yield. Molecular weight $[M+H]^+$: 1072.2.

Example 10: Synthesis Route of Tetradentate Metal Platinum (II) Complex Phosphorescent Light Emitting Material PtO107
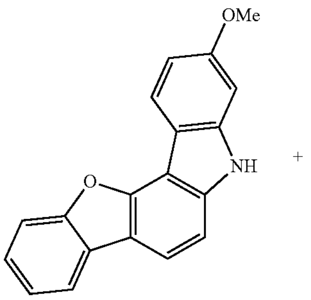
4O-NH
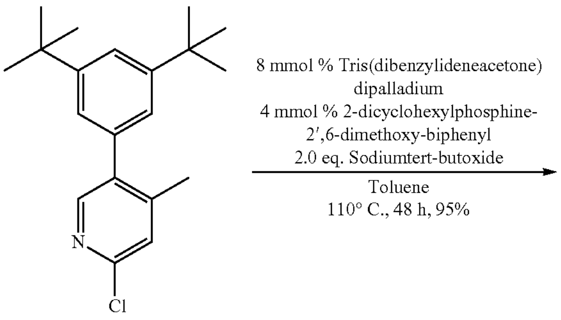
dtBu-Me-Cl
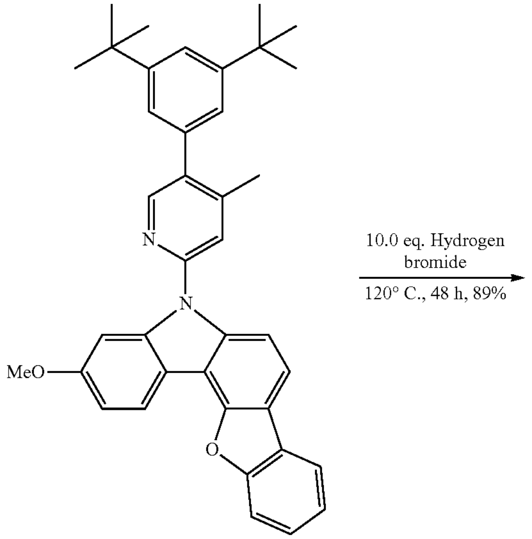
dtBu-Me-4O-OMe
-continued
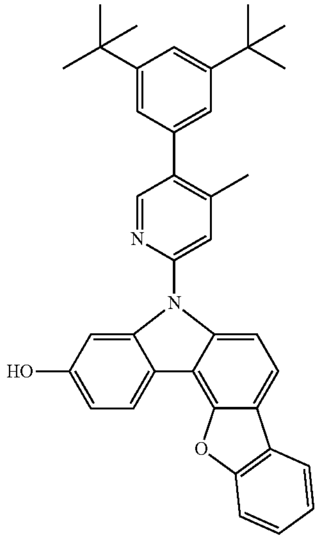
dtBu-Me-4O-OH
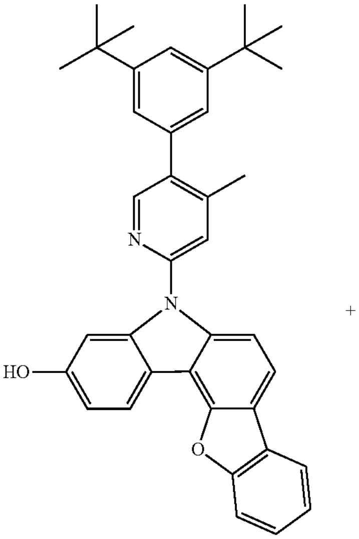
dtBu-Me-4O-OH
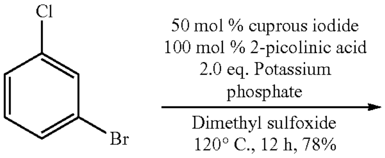

-continued

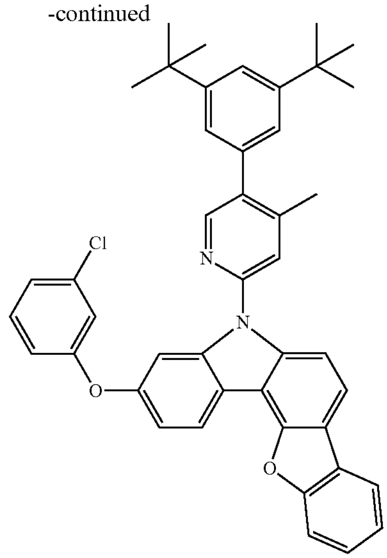

dtBu-Me-4O-Cl

Synthesis of intermediate dtBu-Me-4O-OMe: to a reaction flask were added 4O-NH (1.0 g, 3.5 mmoL, 1.0 eq.), dtBu-Me-Cl (1.34 g, 4.2 mmoL, 1.2 eq.), tris (dibenzylideneacetone) dipalladium (128 mg, 0.14 mmoL, 4 moL %), 2-dicyclohexylphosphine-2',6'-dimethoxy-biphenyl (115 mg, 0.28 mmoL, 8 moL %), and sodium tert-butoxide (673 mg, 7 mmoL, 2.0 eq.), followed by adding toluene (5 mL). The reaction was carried out at 110° C. and stopped after 48 h. After cooling to room temperature, the reaction product was concentrated and subjected to silica gel column chromatography to give 1.92 g of brown solid in 95% yield, which was used directly in subsequent reactions.

Synthesis of intermediate dtBu-Me-4O-OH: to a reaction flask were added dtBu-Me-4O-OMe (1.84 g, 3.2 mmoL, 1.0 eq.) and hydrogen bromide (2.59 g, 32 mmoL, 10.0 eq.). The reaction was carried out at 120° C. and stopped after 48 h. After cooling to room temperature, the reaction product was concentrated and subjected to silica gel column chromatography to give 1.58 g of brown solid in 89% yield, which was used directly in subsequent reactions.

Synthesis of intermediate dtBu-Me-4O-Cl: to a reaction flask were added dtBu-Me-4O-OH (600 mg, 1.09 mmoL, 1.0 eq.), m-chlorobromobenzene (314 mg, 1.64 mmoL, 1.5 eq.), 2-picolinic acid (134 mg, 1.10 mmoL, 100 mmoL %), cuprous iodide (105 mg, 0.55 mmoL, 10 mmoL %), potassium phosphate (463 mg, 2.18 mmoL, 2.0 eq.), and dimethylsulfoxide (10 mL). The reaction was carried out at 110° C. and stopped after 12 h. After cooling to room temperature, the reaction product was concentrated and subjected to silica gel column chromatography to give 566 mg of white solid in 78% yield. $^{1}$H NMR (500 MHz, DMSO) δ 1.36 (s, 18H), 2.44 (s, 3H), 7.04 (dd, J=8.0, 2.0 Hz, 1H), 7.13 (t, J=2.5 Hz, 1H), 7.18-7.23 (m, 2H), 7.35 (d, J=2.0 Hz, 2H), 7.41 (t, J=8.0 Hz, 1H), 7.45-7.49 (m, 2H), 7.51-7.55 (m, 1H), 7.63 (d, J=2.0 Hz, 1H), 7.82 (s, 1H), 7.88 (t, J=9.0 Hz, 1H), 8.21 (d, J=11.0 Hz, 2H), 8.46 (d, J=8.5 Hz, 1H), 8.57 (s, 1H).

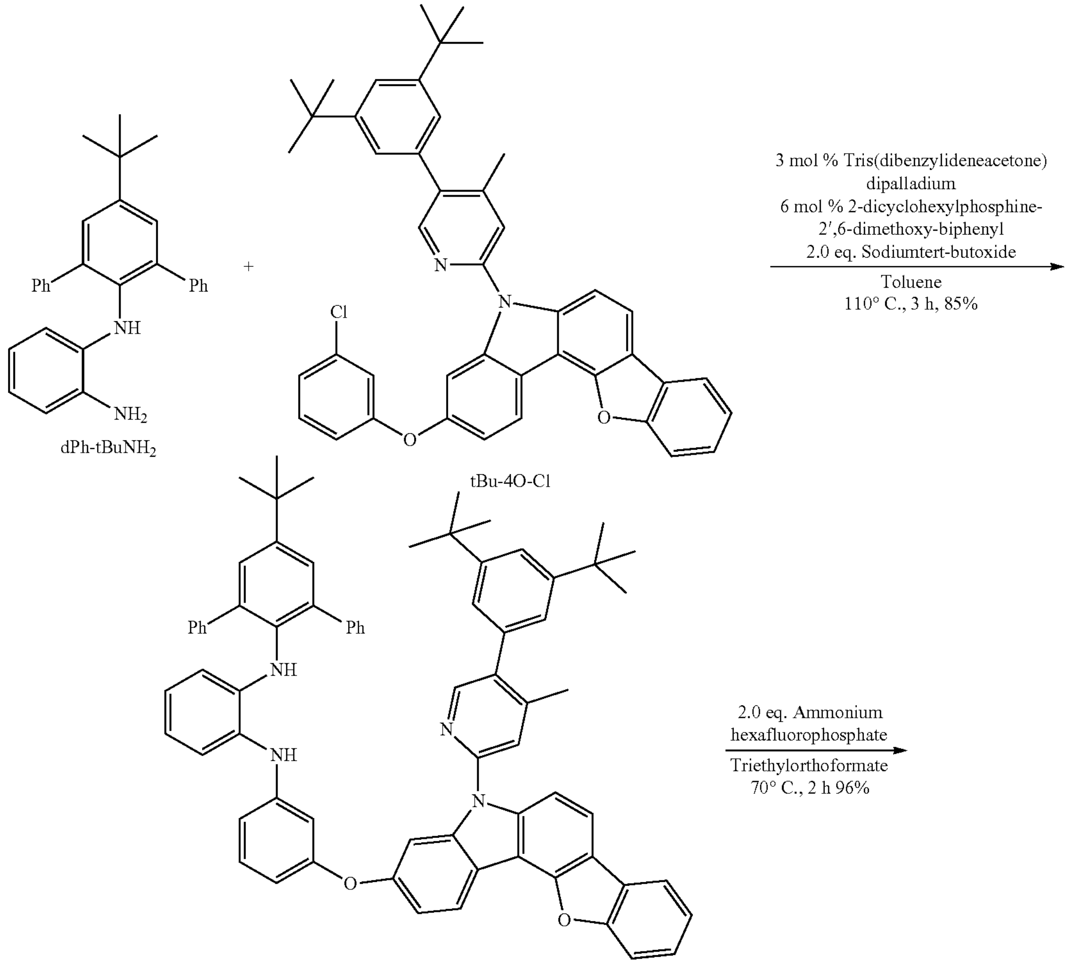

dPh-tBuNH$_2$ tBu-4O-Cl

LNH-PtO107

-continued

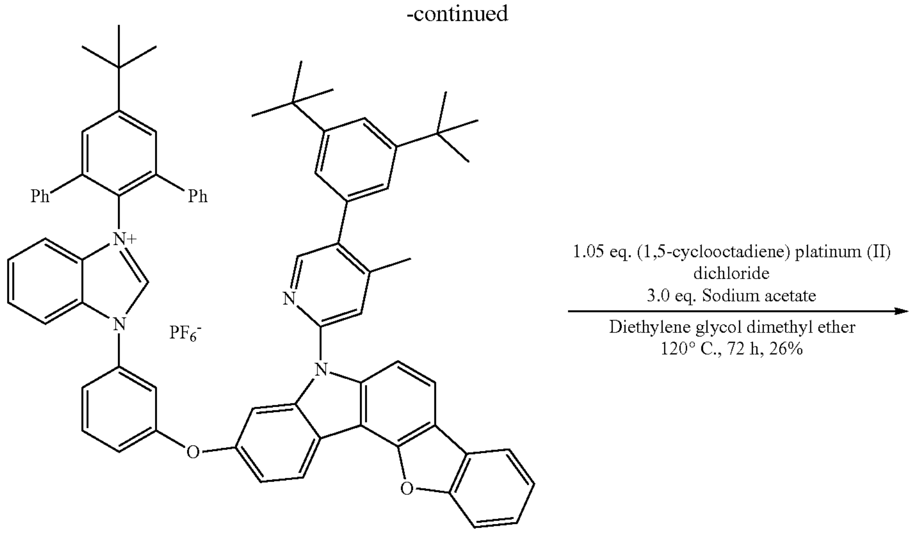

L-PtO107

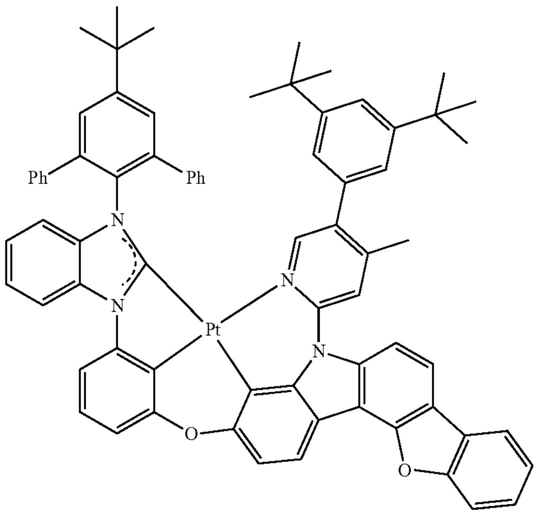

PtO107

Synthesis of intermediate LNH-PtO107: to a reaction flask were added dPh-tBuNH$_2$ (341 mg, 0.87 mmoL, 1.1 eq.), dtBu-Me-4O-Cl (524 mg, 0.79 mmoL, 1.0 eq.), tris (dibenzylideneacetone)dipalladium (22 mg, 0.024 mmoL, 3 moL %), 2-dicyclohexylphosphino-2',6'-dimethoxy-biphenyl (20 mg, 0.048 mmoL, 6 moL %), sodium tert-butoxide (152 mg, 1.58 mmoL, 2.0 eq.), followed by adding toluene (5 mL). The reaction was carried out at 110° C. in an oil bath and stopped after 3 h. After cooling to room temperature, the reaction product was concentrated and subjected to silica gel column chromatography to give 687 mg of white solid in 85% yield, which was used directly in subsequent reactions.

Synthesis of ligand L-PtO107: to a reaction flask were added LNH-PtO107 (687 mg, 0.67 mmoL, 1.0 eq.), ammonium hexafluorophosphate (218 mg, 1.34 mmoL, 2.0 eq.), and triethyl orthoformate (5 mL). The reaction was carried out at 70° C. and stopped after 2 h. After cooling to room temperature, the reaction product was concentrated and subjected to silica gel column chromatography to give 755 mg of white solid in 96% yield. which was used directly in subsequent reactions.

Synthesis of PtO107: to a reaction flask were added L-PtO107 (675 mg, 0.57 mmoL, 1.0 eq.), (1,5-cyclooctadiene) platinum (II) dichloride (224 mg, 0.60 mmoL, 1.05 eq.), sodium acetate (140 mg, 1.71 mmoL, 3.0 eq.), and diethylene glycol dimethyl ether (5 mL). The reaction was carried out at 120° C. and stopped after 72 h. After cooling to room temperature, the reaction product was concentrated and subjected to silica gel column chromatography to give 183 mg of light yellow solid in 26% yield. $^1$H NMR (500 MHz, CDCl$_3$) δ 1.17 (s, 18H), 1.55 (s, 9H), 2.05 (s, 3H), 6.05 (t, J=8.5 Hz, 2H), 6.43 (tt, J=8.0, 1.5 Hz, 1H), 6.50 (s, 2H), 6.73 (d, J=8.0 Hz, 1H), 6.78 (d, J=2.0 Hz, 2H), 6.87-6.96 (m, 4H), 7.05-7.10 (m, 2H), 7.16-7.25 (m, 4H), 7.39-7.54 (m, 6H), 7.80 (d, J=8.0 Hz, 1H), 7.95-7.97 (m, 2H), 8.02 (d, J=8.5 Hz, 1H), 8.06-8.09 (m, 2H), 8.27 (d, J=8.0 Hz, 1H), 9.19 (s, 1H).

Example 11: Synthesis Route of Tetradentate Metal Platinum (II) Complex Phosphorescent Light Emitting Material PtO109

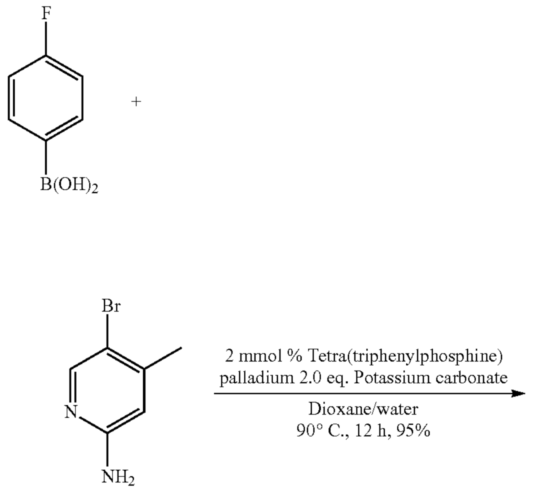

Br-Me-NH

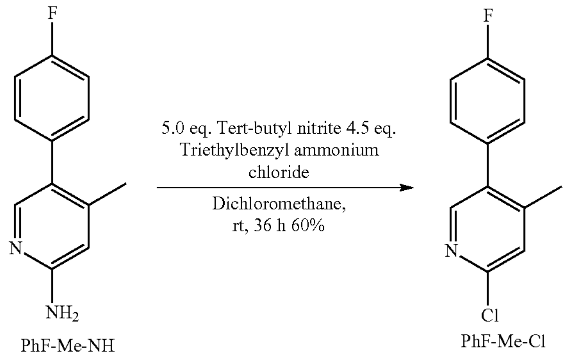

PhF-Me-NH PhF-Me-Cl

Synthesis of intermediate PhF-Me-NH: to a reaction flask were added p-fluorobenzene boronic acid (2.7 g, 19.2 mmoL, 1.2 eq.), Br-Me-NH (3.0 g, 16 mmoL, 1.0 eq.), tetra(triphenylphosphine) palladium (371 mg, 0.32 mmoL, 2 moL %), potassium carbonate (4.4 g, 32 mmoL, 2.0 eq.), dioxane (160 mL), and water (40 mL). The reaction was carried out at 90° C. and stopped after 12 h. After cooling to room temperature, the reaction product was concentrated and subjected to silica gel column chromatography to give 3.1 g of yellow solid in 95% yield, which was used directly in subsequent reactions.

Synthesis of intermediate PhF-Me-Cl: to a reaction flask were added PhF-Me-NH (3.1 g, 15.3 mmoL, 1.0 eq.), tert-butyl nitrite (15.7 g, 69 mmoL, 5.0 eq.), triethylbenzyl ammonium chloride (7.9 g, 76.6 mmoL, 4.5 eq.), dichloromethane (100 mL), and water (40 mL). The reaction was carried out at room temperature and stopped after 12 h. After cooling to room temperature, the reaction product was concentrated and subjected to silica gel column chromatography to give 3.1 g of yellow solid in 60% yield, which was used directly in subsequent reactions.

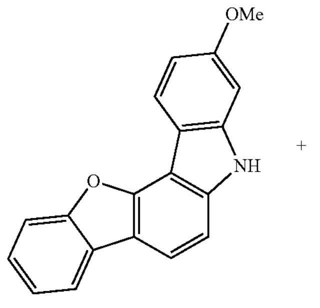

4O-NH

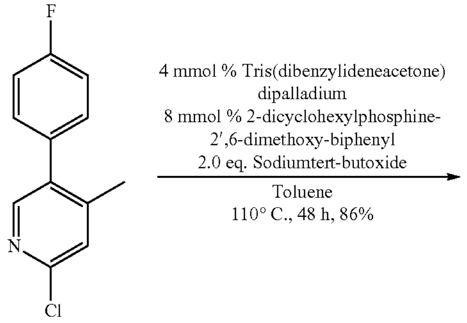

PhF-Me-Cl

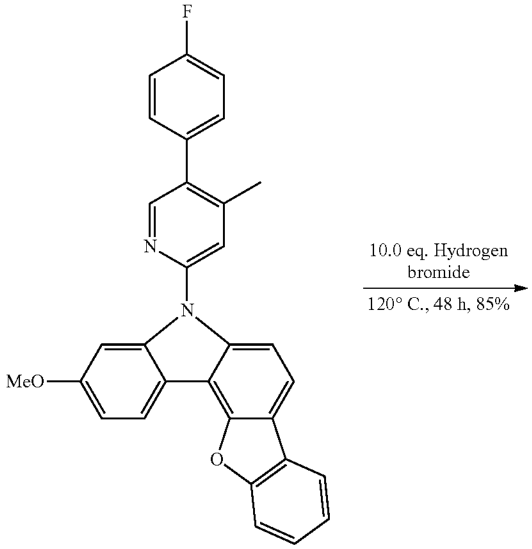

PhF-Me-4O-OMe

-continued

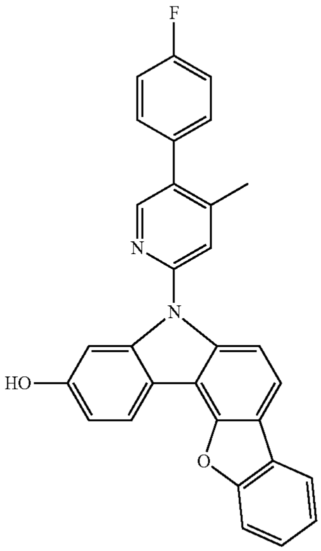

PhF-Me-4O-OH

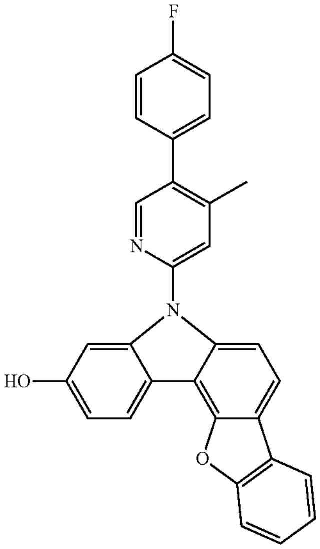

PhF-Me-4O-OH

+

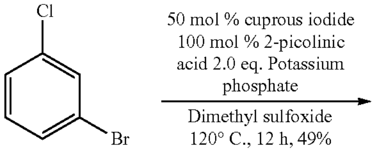

-continued

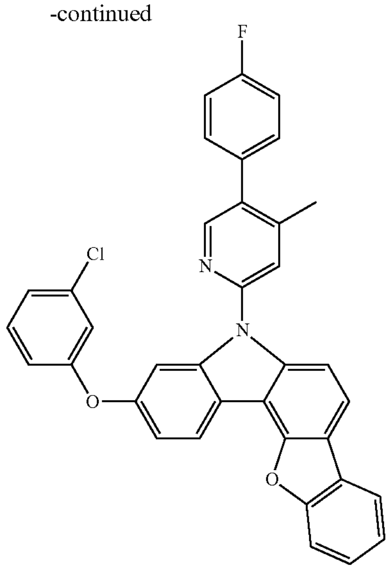

PhF-Me-4O-Cl

Synthesis of intermediate PhF-Me-4O-OMe: to a reaction flask were added 4O-NH (1.0 g, 3.5 mmoL, 1.0 eq.), PhF-Me-Cl (931 g, 3.5 mmoL, 1.2 eq.), tris(dibenzylideneacetone) dipalladium (128 mg, 0.14 mmoL, 4 moL %), 2-dicyclohexylphosphine-2',6'-dimethoxy-biphenyl (115 mg, 0.28 mmoL, 8 moL %), and sodium tert-butoxide (673 mg, 7 mmoL, 2.0 eq.), followed by adding toluene (5 mL). The reaction was carried out at 110° C. and stopped after 48 h. After cooling to room temperature, the reaction product was concentrated and subjected to silica gel column chromatography to give 1.42 g of brown solid in 86% yield, which was used directly in subsequent reactions.

Synthesis of intermediate PhF-Me-4O-OH: to a reaction flask were added PhF-Me-4O-OMe (1.42 g, 3.2 mmoL, 1.0 eq.) and hydrogen bromide (2.59 g, 32 mmoL, 10.0 eq.). The reaction was carried out at 120° C. and stopped after 48 h. After cooling to room temperature, the reaction product was concentrated and subjected to silica gel column chromatography to give 1.21 g of brown solid in 85% yield, which was used directly in subsequent reactions.

Synthesis of intermediate PhF-Me-4O-Cl: to a reaction flask were added PhF-Me-4O-OH (3.0 g, 6.5 mmoL, 1.0 eq.), m-chlorobromobenzene (1.88 g, 9.8 mmoL, 1.5 eq.), 2-picolinic acid (800 mg, 6.5 mmoL, 100 mmoL %) cuprous iodide (619 mg, 3.3 mmoL, 50 mmoL %), potassium phosphate (2.7 g, 13 mmoL, 2.0 eq.), and dimethylsulfoxide (20 mL). The reaction was carried out at 120° C. and stopped after 12 h. After cooling to room temperature, the reaction product was concentrated and subjected to silica gel column chromatography to give 644 mg of white solid in 49% yield. which was used directly in subsequent reactions.

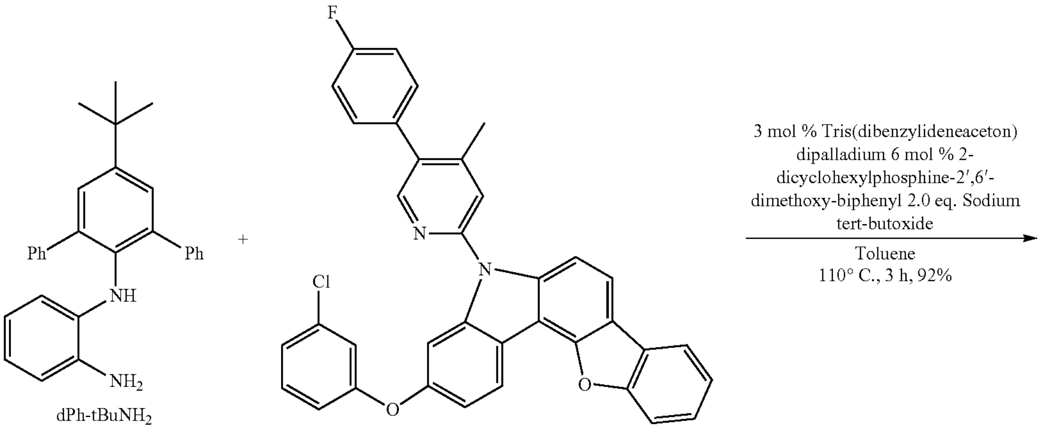
dPh-tBuNH$_2$
tBu-4O-Cl
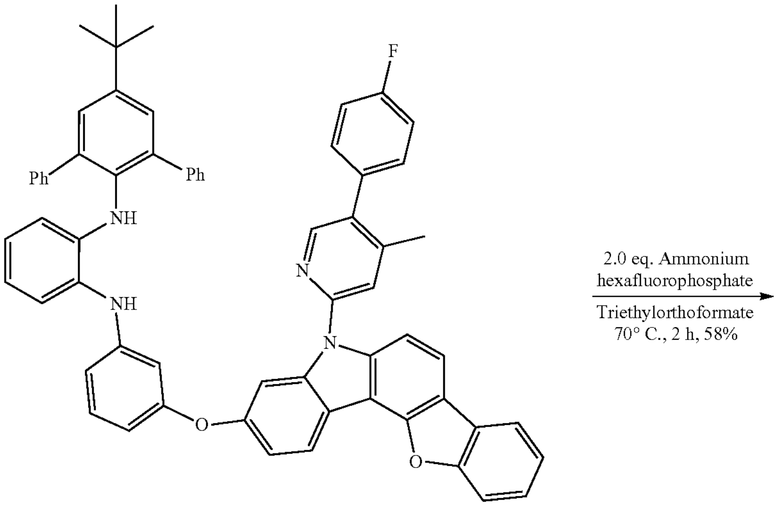
LNH-PtO109
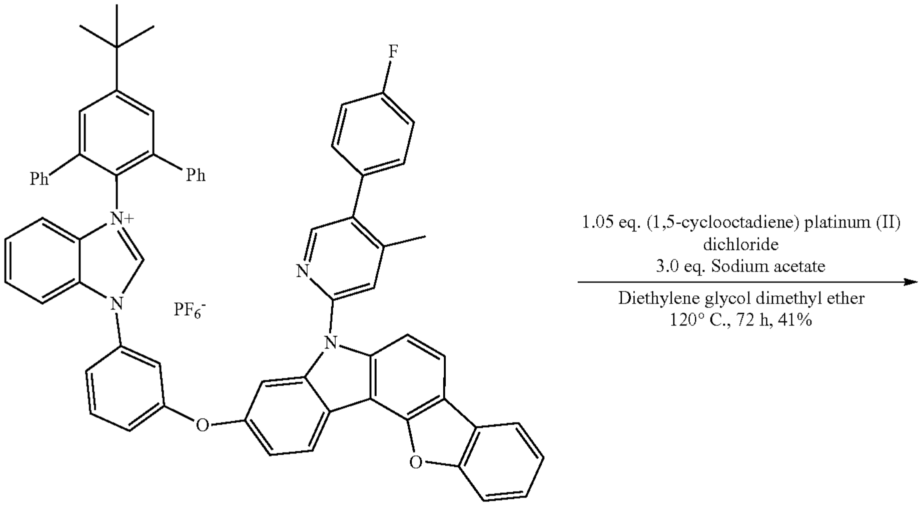
L-PtO109

-continued

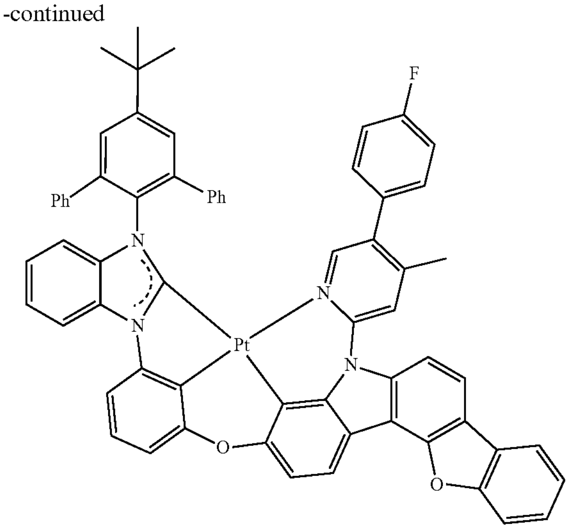

PtO109

Synthesis of intermediate LNH-PtO109: to a reaction as were added dPh-4tBuNH$_2$ (470 mg, 1.2 mmoL, 1.2 eq.), phF-Me-4O-Cl (620 mg, 1.09 mmoL, 1.0 eq.), tris(dibenzylideneacetone) dipalladium (30 mg, 0.03 mmoL, 3 moL %), 2-dicyclohexylphosphine-2',6'-dimethoxy-biphenyl (27 mg, 0.06 mmoL, 6 moL %), sodium tert-butoxide (210 mg, 2.18 mmoL, 2.0 eq.), followed by adding toluene (8 mL). The reaction was carried out at 110° C. in an oil bath and stopped after 3 h. After cooling to room temperature, the reaction product was concentrated and subjected to silica gel column chromatography to give 925 mg of white solid in 92% yield, which was used directly in subsequent reactions.

Synthesis of the ligand L-PtO109: to a reaction flask were added LNH-PtO109 (925 mg, 1 mmoL, 1.0 eq.), ammonium hexafluorophosphate (326 mg, 2 mmoL, 2.0 eq.), and triethyl orthoformate (5 mL). The reaction was carried out at 70° C. and stopped after 2 h. After cooling to room temperature, the reaction product was concentrated and subjected to silica gel column chromatography to give 629 mg of white solid in 58% yield. $^1$H NMR (500 MHz, DMSO-d$_6$) δ 1.43 (s, 9H), 2.42 (s, 3H), 6.97 (t, J=2.0 Hz, 1H), 7.11-7.17 (m, 11H), 7.32 (dd, J=8.5, 2.5 Hz, 1H), 7.36-7.43 (m, 3H), 7.45-7.51 (m, 2H), 7.52-7.61 (m, 5H), 7.70-7.78 (m, 5H), 7.87-7.93 (m, 3H), 8.21-8.26 (m, 2H), 8.53-8.56 (m, 2H), 10.26 (s, 1H).

Synthesis of PtO109: to a reaction flask were added L-PtO109 (591 mg, 0.55 mmoL, 1.0 eq.), (1,5-cyclooctadiene) platinum (II) dichloride (205 mg, 0.58 mmoL, 1.05 eq.), sodium acetate (135 mg, 1.64 mmoL, 3.0 eq.), and diethylene glycol dimethyl ether (5 mL). The reaction was carried out at 120° C. and stopped after 72 h. After cooling to room temperature, the reaction product was concentrated and subjected to silica gel column chromatography to give 254 mg of light yellow solid in 41% yield. $^1$H NMR (500 MHz, DMSO-d$_6$) δ 1.48 (s, 9H), 2.22 (s, 3H), 6.10 (t, J=7.5 Hz, 2H), 6.47 (t, J=7.5 Hz, 1H), 6.52 (d, J=7.5 Hz, 2H), 6.79 (d, J=8.0 Hz, 1H), 6.83 (t, J=9.0 Hz, 2H), 6.94 (dd, J=8.0, 1.0 Hz, 1H), 7.05-7.13 (m, 4H), 7.16-7.32 (m, 8H), 7.40 (d, J=2.5 Hz, 1H), 7.52 (td, J=7.5, 1.0 Hz, 1H), 7.59 (ddd, J=8.0, 7.0, 1.5 Hz, 1H), 7.64 (d, J=7.5 Hz, 1H), 7.92 (d, J=8.0 Hz, 1H), 8.06-8.10 (m, 2H), 8.17 (d, J=8.5 Hz, 1H), 8.22 (d, J=8.5 Hz, 1H), 8.29 (dd, J=7.5, 1.5 Hz, 1H), 8.37 (d, J=8.5 Hz, 1H), 9.05 (s, 1H).

Example 12: Synthesis Route of Tetradentate Metal Platinum (II) Complex Phosphorescent Light Emitting Material PtS6

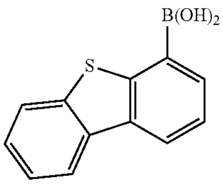

A-4S-B(OH)$_2$

+

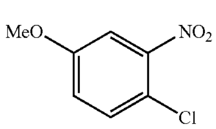

B 3 mmol %
Tetra(triphenylphosphine) palladium
2.5 eq. Potassium carbonate
Dioxane/water 90° C., 24 h, 80%

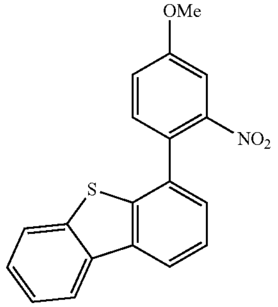

4S-NO$_2$ 3.0 eq.
Triphenylphosphine
O-dichlorobenzene
180° C., 24 h, 82%

-continued

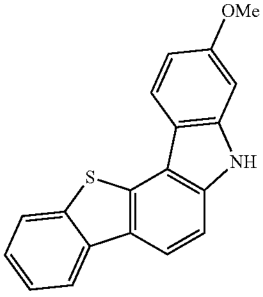

4S-NH

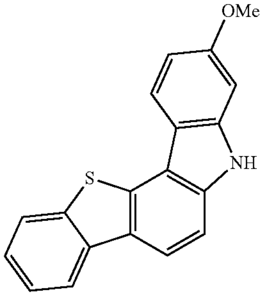

4S-NH

+

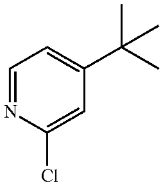

3 mmol % Tris(dibenzylideneacetone) dipalladium
6 mmol % 2-(di-tert-butylphosphine) biphenyl
2.0 eq. Sodium tert-butoxide
Toluene 110° C., 48 h, 73%

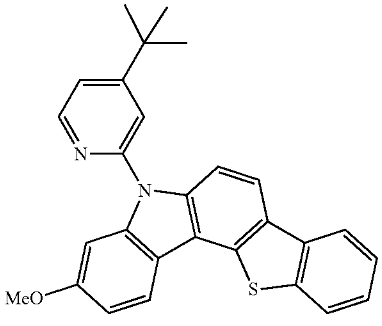

4S-OMe 10.0 eq. Pyridinehydro-chloride
1,3-dimethyl-2-imidazolidinone
180° C., 48 h, 87%

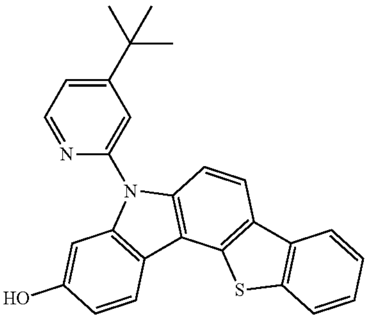

4S-OH

-continued

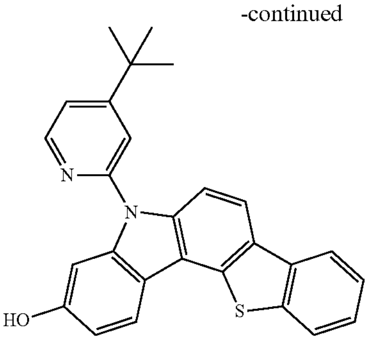

4S-OH

+

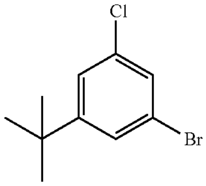

10 mol % cuprous iodide
20 mol % 2-picolinic acid
2.0 eq. Potassium phosphate
Dimethyl sulfoxide
100° C., 12 h, 75%

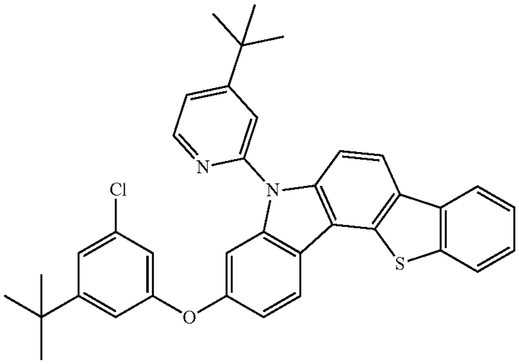

tBu-4S-Cl

Synthesis of intermediate 4S-$NO_2$: to a reaction flask were added A-4S-$B(OH)_2$ (8.76 g, 38.4 mmoL, 1.2 eq.), B (6 g, 32 mmoL, 1.0 eq.), tetra(triphenylphosphine) palladium (1.11 g, 0.96 mmoL, 3 moL %), and potassium carbonate (8.86, 64 mmoL, 2.0 eq.), dioxane (80 mL), and water (20 mL). The reaction was carried out at 90° C. and stopped after 24 h. After cooling to room temperature, the reaction product was concentrated and subjected to silica gel column chromatography to give 9.23 g of yellow solid in 80% yield, which was used directly in subsequent reactions.

Synthesis of intermediate 4S-NH: to a reaction flask were added 4S-$NO_2$ (6 g, 17.9 mmoL, 1.0 eq.) and triphenylphosphine (14.08 g, 53.7 mmoL, 3.0 eq.), and o-dichlorobenzene (60 mL). The reaction was carried out at 110° C. and stopped after 24 h. After cooling to room temperature, the reaction product was concentrated and subjected to silica gel column chromatography to give 4.45 g of brown solid in 82% yield, which was used directly in subsequent reactions.

Synthesis of intermediate 4S-OMe: to a reaction flask were added 4S-NH (3 g, 10 mmoL, 1.0 eq.), 4-(tert-butyl)-2-chloropyridine (2.04 g, 12 mmoL, 1.2 eq.), tris(dibenzylideneacetone) dipalladium (275 mg, 0.3 mmoL, 3 moL %), 2-(di-tert-butylphosphine) biphenyl (179 mg, 0.6 mmoL, 6 moL %), sodium tert-butoxide (1.92 g, 20 mmoL, 2.0 eq.), followed by adding toluene (50 mL). The reaction was carried out at 110° C. and stopped after 48 h. After cooling to room temperature, the reaction product was concentrated and subjected to silica gel column chromatography to give 3.12 g of brown solid in 73% yield, which was used directly in subsequent reactions.

Synthesis of intermediate 4S-OH: to a reaction flask were added 4S-OMe (3.12 g, 7.1 mmoL, 1.0 eq.), pyridine hydrochloride (8.53 g, 71 mmoL, 10.0 eq.) and 1,3-dimethyl-2-imidazolidinone (60 mL). The reaction was carried out at 180° C. and stopped after 48 h. After cooling to room temperature, the reaction product was concentrated and subjected to silica gel column chromatography to give 2.68 g of brown solid in 87% yield, which was used directly in subsequent reactions.

Synthesis of intermediate tBu-4S-Cl: to a reaction flask were added 4S-OH (1 g, 2.4 mmoL, 1.0 eq.), 3-chloro-5-bromo-tert-butylbenzene (1.78 g, 3.12 mmoL, 1.3 eq.), 2-picolinic acid (60 mg, 0.48 mmoL, 20 mmoL %) and cuprous iodide (46 mg, 0.24 mmoL, 10 mmoL %), potassium phosphate (1.02 g, 4.8 mmoL, 2.0 eq.), and dimethyl sulfoxide (10 mL). The reaction was carried out at 110° C. and stopped after 12 h. After cooling to room temperature, the reaction product was concentrated and subjected to silica gel column chromatography to give 1.05 g of white solid in 75% yield. $^1$H NMR (500 MHz, DMSO) δ 1.24 (s, 9H), 1.32 (s, 9H), 6.95 (t, J=2.0 Hz, 1H), 7.14 (t, J=2.5 Hz, 1H), 7.21 (t, J=1.5 Hz, 1H), 7.28 (dd, J=11.0, 2.5 Hz, 1H), 7.38 (d, J=2.0 Hz, 1H), 7.52-7.60 (m, 3H), 7.72 (d, J=1.5 Hz, 1H), 7.91 (d, J=9.0 Hz, 1H), 8.17 (d, J=6.5 Hz, 1H), 8.23 (d, J=8.5 Hz, 1H), 8.42-8.45 (m, 2H), 8.63 (d, J=5.5 Hz, 1H).

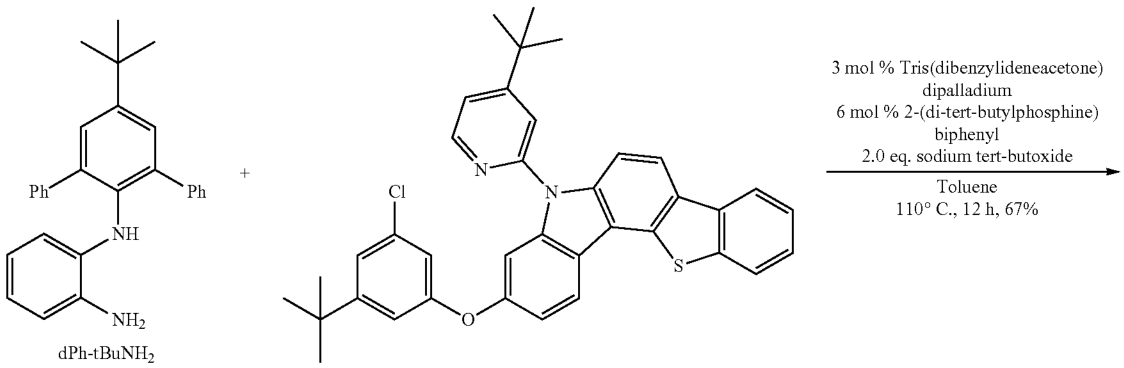

dPh-tBuNH$_2$ tBu-4S-Cl

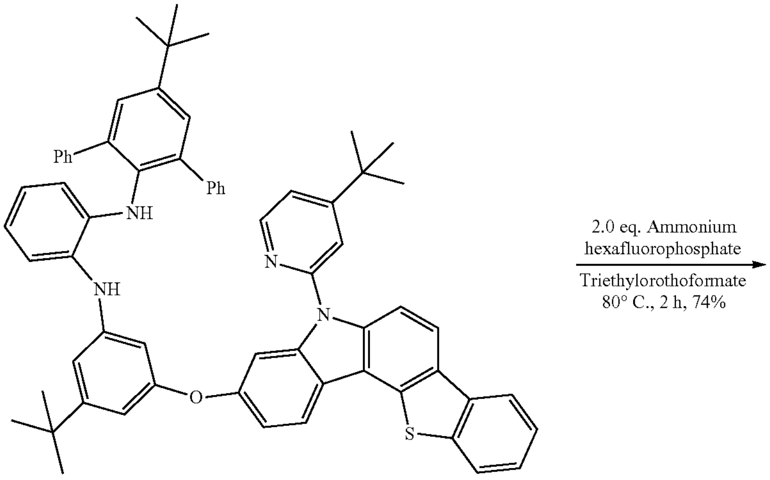

LNH-PtS6

-continued

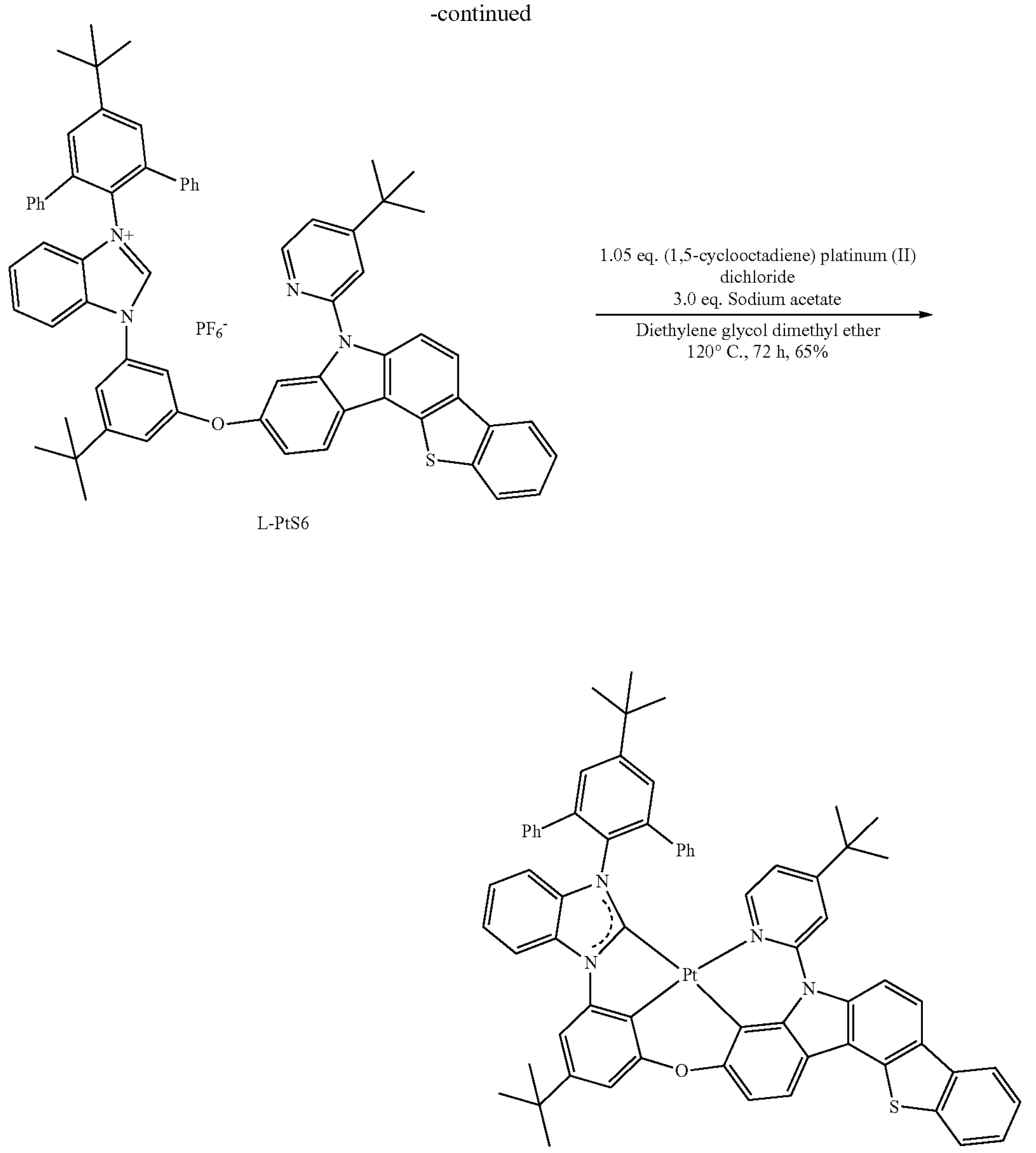

L-PtS6

PtS6

Synthesis of intermediate LNH-PtS6: to a reaction flask were added dPh-tBuNH$_2$ (125 mg, 0.32 mmoL, 1.0 eq.), tBu-4O-Cl (200 mg, 0.34 mmoL, 1.05 eq.), tris(dibenzylideneacetone) dipalladium (9 mg, 0.001 mmoL, 3 moL %), 2-(di-tert-butylphosphino) biphenyl (6 mg, 0.002 mmoL, 6 moL %), sodium tert-butoxide (61 mg, 0.64 mmoL, 2.0 eq.), followed by adding toluene (5 mL). The reaction was carried out at 110° C. and stopped after 12 h. After cooling to room temperature, the reaction product was concentrated and subjected to silica gel column chromatography to give 187 mg of white solid in 67% yield, which was used directly in subsequent reactions.

Synthesis of the ligand L-PtS6: to a reaction flask were added LNH-PtS6 (228 mg, 0.24 mmoL, 1.0 eq.), ammonium hexafluorophosphate (31 mg, 0.48 mmoL, 2.0 eq.), and triethyl orthoformate (5 mL). The reaction was carried out at 80° C. and stopped after 2 h. After cooling to room temperature, the reaction product was concentrated and subjected to silica gel column chromatography to give 184 mg of white solid in 74% yield, $^1$H NMR (500 MHz, DMSO) δ 1.30 (s, 9H), 1.31 (s, 9H), 1.42 (s, 9H), 6.86 (t, J=2.0 Hz, 1H), 6.97 (t, J=1.5 Hz, 1H), 7.10-7.16 (m, 10H), 7.37 (dd, J=8.5, 2.5 Hz, 1H), 7.47-7.60 (m, 8H), 7.70-7.71 (m, 3H), 7.78 (d, J=2.0 Hz, 1H), 7.93 (d, J=8.5 Hz, 1H), 8.18 (d, J=7.0 Hz, 1H), 8.31 (d, J=8.5 Hz, 1H), 8.44 (d, J=7.0 Hz, 1H), 8.48 (d, J=9.0 Hz, 1H), 8.65 (d, J=5.5 Hz, 1H), 10.26 (s, 1H).

Synthesis of PtS6: to a reaction flask were added PtS6 (140 mg, 0.13 mmoL, 1.0 eq.), (1,5-cyclooctadiene) platinum (II) dichloride (48 mg, 0.14 mmoL, 1.05 eq.), sodium acetate (32 mg, 0.39 mmoL, 3.0 eq.), and diethylene glycol dimethyl ether (10 mL). The reaction was carried out at 120° C. and stopped after 72 h. After cooling to room temperature, the reaction product was concentrated and subjected to silica gel column chromatography to give 97 mg of light yellow solid in 65% yield. $^1$H NMR (500 MHz, $CDCl_3$) δ 1.22 (s, 9H), 1.44 (s, 9H), 1.47 (s, 9H), 6.33 (dd, J=6.0, 2.0 Hz, 2H), 6.67-7.18 (m, 10H), 7.36-7.68 (m, 9H), 7.95-8.01 (m, 3H), 8.05 (dd, J=8.5, 3.5 Hz, 2H), 8.29 (dd, J=8.5, 5.0 Hz, 2H), 9.09 (d, J=6.0 Hz, 1H).

Example 13: Synthesis Route of Tetradentate Metal Platinum (II) Complex Phosphorescent Light Emitting Material PtS2
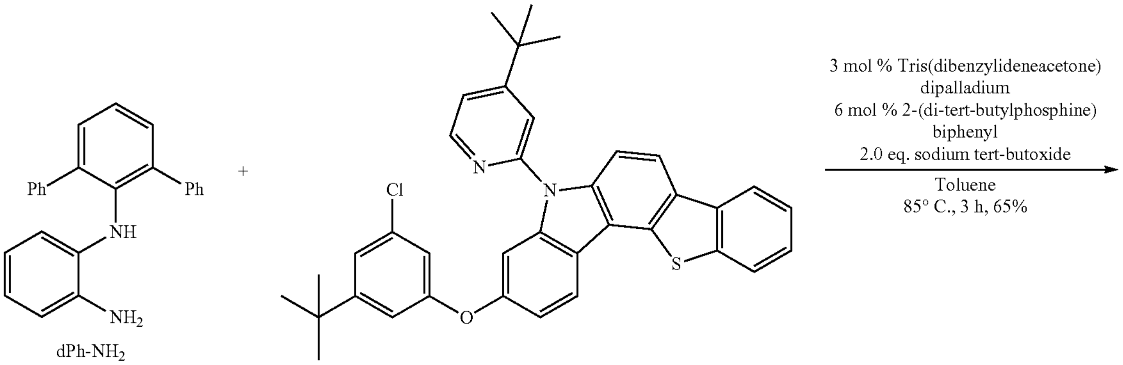
dPh-$NH_2$
tBu-4S-Cl
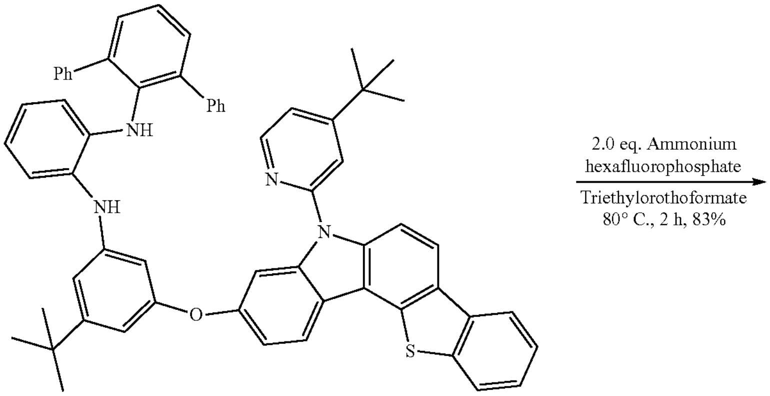
LNH-PtS2
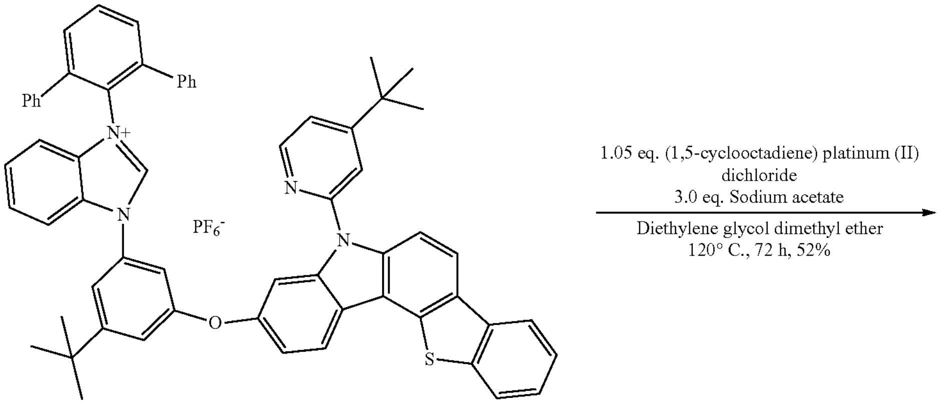
L-PtS2

-continued

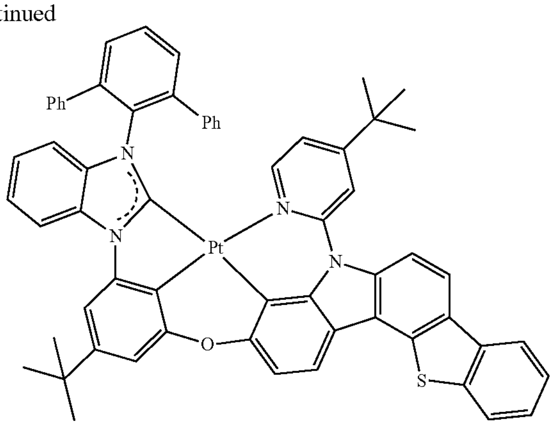

PtS2

Synthesis of intermediate LNH-PtS2: to a reaction flask were added dPh-$NH_2$ (200 mg, 0.6 mmoL, 1.0 eq.), tBu-4S-Cl (371 mg, 0.63 mmoL, 1.05 eq.), tris(dibenzylideneacetone) dipalladium (34 mg, 0.04 mmoL, 3 moL %), 2-(di-tert-butylphosphino) biphenyl (22 mg, 0.08 mmoL, 6 moL %), and sodium tert-butoxide (115 mg, 1.2 mmoL, 2.0 eq.), followed by adding toluene (5 mL). The reaction was carried out at 85° C. in an oil bath and stopped after 3 h. After cooling to room temperature, the reaction product was concentrated and subjected to silica gel column chromatography to give 374 mg of white solid in 65% yield, which was used directly in subsequent reactions.

Synthesis of the ligand L-PtS2: to a reaction flask were added LNH-2 (374 mg, 0.42 mmoL, 1.0 eq.), ammonium hexafluorophosphate (137 mg, 0.84 mmoL, 2.0 eq.), and triethyl orthoformate (5 mL). The reaction was carried out at 80° C. and stopped after 2 h. After cooling to room temperature, the reaction product was concentrated and subjected to silica gel column chromatography to give 372 mg of white solid in 83% yield, $^1$H NMR (500 MHz, DMSO) δ 1.30 (s, 9H), 1.32 (s, 9H), 6.91 (t, J=2.0 Hz, 1H), 6.97 (t, J=2.0 Hz, 1H), 7.12-7.15 (m, 9H), 7.38 (dd, J=8.5, 2.0 Hz, 1H), 7.47-7.49 (m, 1H), 7.52-7.61 (m, 7H), 7.70-7.72 (m, 1H), 7.76 (d, J=8.0 Hz, 2H), 7.79 (d, J=1.5 Hz, 1H), 7.84 (s, 1H), 7.92-7.96 (m, 2H), 8.18 (d, J=7.0 Hz, 1H), 8.31 (d, J=8.5 Hz, 1H), 8.44 (d, J=7.0 Hz, 1H), 8.49 (d, J=9.0 Hz, 1H), 8.65 (d, J=5.5 Hz, 1H), 10.34 (s, 1H).

Synthesis of PtS2: to a reaction flask were added L-PtS2 (250 mg, 0.24 mmoL, 1.0 eq.), (1,5-cyclooctadiene) platinum (II) dichloride (87 mg, 0.25 mmoL, 1.05 eq.), sodium acetate (60 mg, 0.72 mmoL, 3.0 eq.), and diethylene glycol dimethyl ether (10 mL). The reaction was carried out at 120° C. and stopped after 72 h. After cooling to room temperature, the reaction product was concentrated and subjected to silica gel column chromatography to give 136 mg of light yellow solid in 52% yield. $^1$H NMR (500 MHz, DMSO) δ 1.33 (s, 9H), 1.43 (s, 9H), 6.25-6.90 (m, 6H), 6.97-7.51 (m, 10H), 7.53-7.90 (m, 7H), 8.15 (d, J=8.5 Hz, 2H), 8.21 (d, J=8.0 Hz, 1H), 8.54 (dd, J=8.0, 4.0 Hz, 2H), 8.61 (d, J=9.0 Hz, 1H), 8.84 (d, J=6.0 Hz, 1H).

Example 14: Synthesis Route of Tetradentate Metal Platinum (II) Complex Phosphorescent Light Emitting Material PtS1

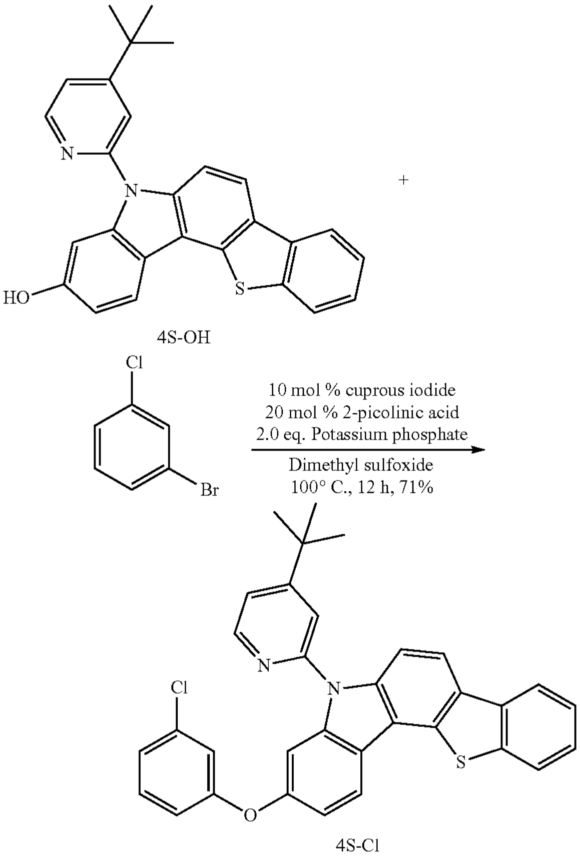

Synthesis of intermediate 4S-Cl: to a reaction flask were added 4S-OH (1.0 g, 2.4 mmoL, 1.0 eq.), m-chlorobromobenzene (689 mg, 3.6 mmoL, 1.5 eq.), 2-picolinic acid (60 mg, 0.48 mmoL, 20 mmoL %), cuprous iodide (45 mg, 0.24 mmoL, 10 mmoL %), potassium phosphate (1.02 g, 4.8 mmoL, 2.0 eq.), and dimethyl sulfoxide (10 mL). The reaction was carried out at 110° C. and stopped after 12 h. After cooling to room temperature, the reaction product was concentrated and subjected to silica gel column chromatography to give 868 mg of white solid in 71% yield. $^{1}H$ NMR (500 MHz, DMSO) δ 1.32 (s, 9H), 7.08-7.10 (m, 2H), 7.19-7.24 (m, 2H), 7.29 (dd, J=8.5, 2.0 Hz, 1H), 7.39-7.44 (m, 2H), 7.52-7.60 (m, 3H), 7.74 (d, J=1.0 Hz, 1H), 7.92 (d, J=9.0 Hz, 1H), 8.16-8.18 (m, 1H), 8.23 (d, J=8.5 Hz, 1H), 8.42-8.46 (m, 2H), 8.64-8.65 (m, 1H).
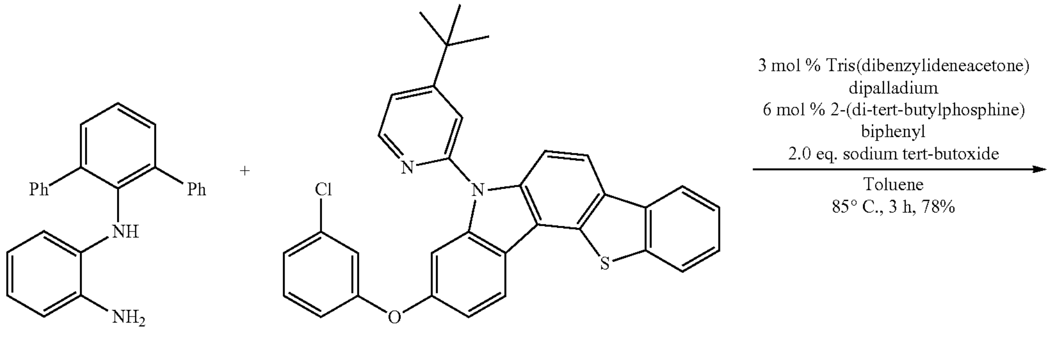
dPh-$NH_2$
4S-Cl
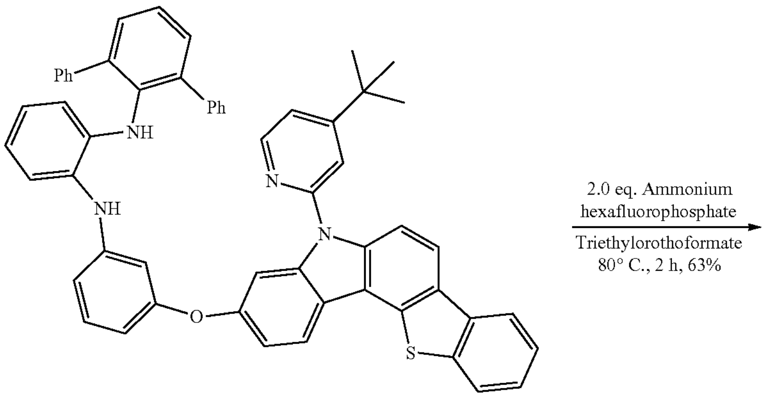
LNH-PtS1
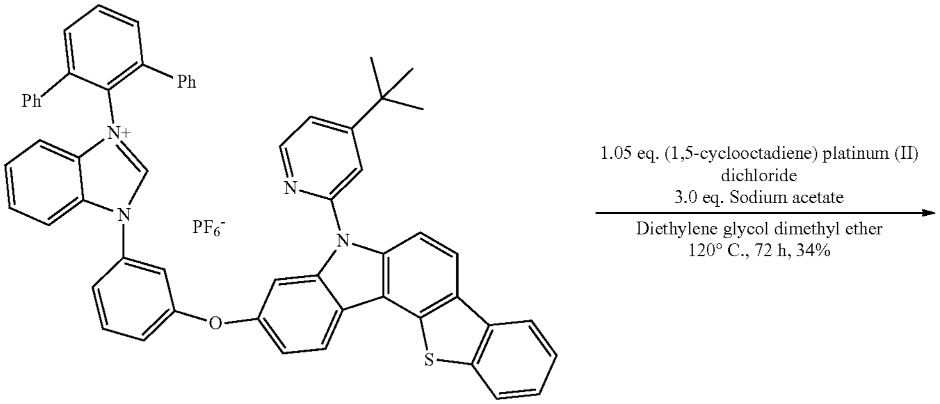
L-PtS1

-continued

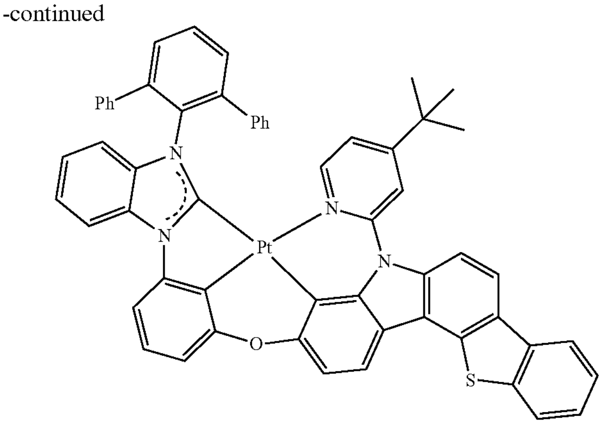

PtS1

Synthesis of intermediate LNH-PtS1: to a reaction flask were added dPh-$NH_2$ (242 mg, 0.72 mmoL, 1.0 eq.), 4S-Cl (400 mg, 0.75 mmoL, 1.03 eq.), tris (dibenzylideneacetone) dipalladium (66 mg, 0.072 mmoL, 3 moL %), 2-(di-tert-butylphosphino) biphenyl (43 mg, 0.14 mmoL, 6 moL %), and sodium tert-butoxide (119 mg, 1.44 mmoL, 2.0 eq.), followed by adding toluene (5 mL). The reaction was carried out at 85° C. in an oil bath and stopped after 3 h. After cooling to room temperature, the reaction product was concentrated and subjected to silica gel column chromatography to give 505 mg of white solid in 78% yield, which was used directly in subsequent reactions.

Synthesis of ligand L-PtS1: to a reaction flask were added LNH-PtS1 (505 mg, 0.61 mmoL, 1.0 eq.), ammonium hexafluorophosphate (199 mg, 1.22 mmoL, 2.0 eq.), and triethyl orthoformate (5 mL). The reaction was carried out at 80° C. and stopped after 2 h. After cooling to room temperature, the reaction product was concentrated and subjected to silica gel column chromatography to give 416 mg of white solid in 63% yield, $^1H$ NMR (500 MHz, DMSO) δ 1.32 (s, 9H), 7.04 (t, J=2.0 Hz, 1H), 7.10-7.18 (m, 11H), 7.37 (dd, J=8.5, 2.0 Hz, 1H), 7.44-7.48 (m, 2H), 7.53-7.61 (m, 6H), 7.71-7.77 (m, 4H), 7.80 (d, J=2.5 Hz, 1H), 7.93-7.96 (m, 2H), 8.18 (d, J=7.0 Hz, 1H), 8.32 (d, J=8.5 Hz, 1H), 8.43-8.50 (m, 2H), 8.66 (d, J=6.0 Hz, 1H), 10.35 (s, 1H).

Synthesis of PtS1: to a reaction flask were added L-PtS1 (310 mg, 0.31 mmoL, 1.0 eq.), (1,5-cyclooctadiene) platinum (II) dichloride (115 mg, 0.33 mmoL, 1.05 eq.), sodium acetate (76 mg, 0.93 mmoL, 3.0 eq.), and diethylene glycol dimethyl ether (10 mL). The reaction was carried out at 120° C. and stopped after 72 h. After cooling to room temperature, the reaction product was concentrated and subjected to silica gel column chromatography to give 108 mg of light yellow solid in 34% yield. $^1H$ NMR (500 MHz, $CDCl_3$) δ 1.31 (s, 9H), 6.25 (dd, J=6.0, 1.5 Hz, 1H), 6.30-6.97 (m, 8H), 6.99-7.15 (m, 4H), 7.18-7.24 (m, 1H), 7.26-7.31 (m, 2H), 7.47-7.57 (m, 7H), 7.96 (d, J=8.0 Hz, 1H), 8.00 (d, J=8.5 Hz, 1H), 8.04 (d, J=8.0 Hz, 1H), 8.17 (d, J=2.0 Hz, 1H), 8.23 (d, J=8.5 Hz, 1H), 8.29-8.31 (m, 2H), 9.04 (d, J=6.0 Hz, 1H).

Example 15: Synthesis Route of Tetradentate Metal Platinum (II) Complex Phosphorescent Light Emitting Material PtS5

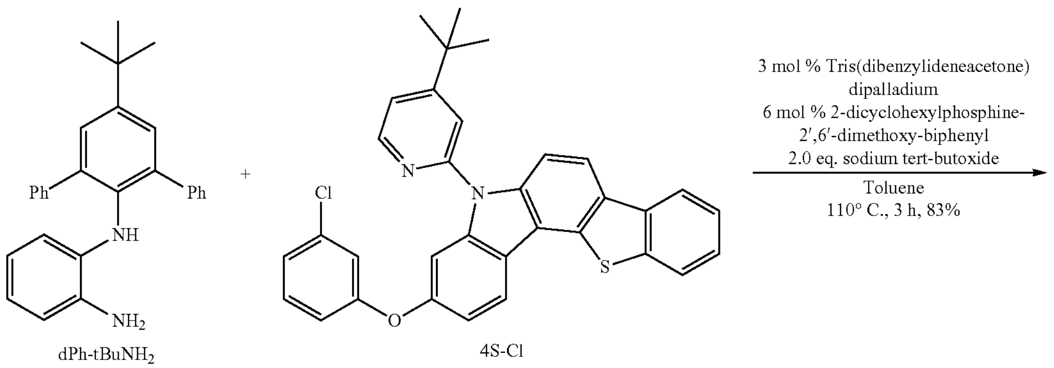

dPh-tBuNH$_2$ 4S-Cl

-continued

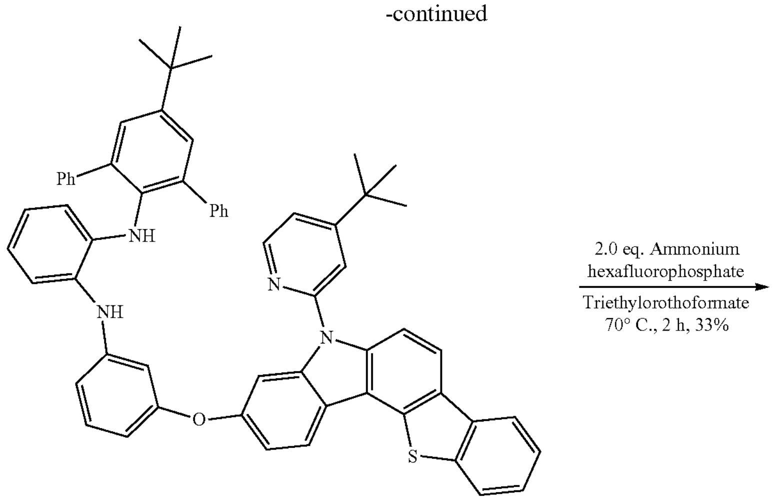

LNH-PtS5

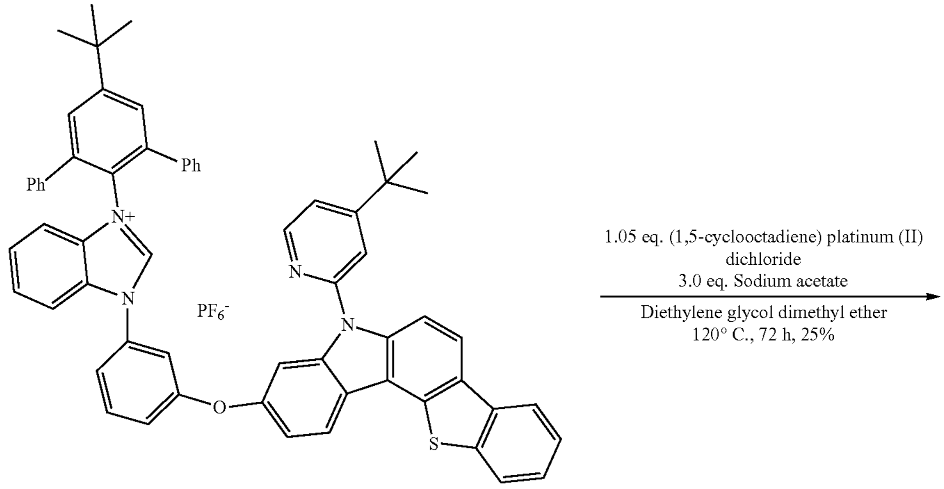

L-PtS5

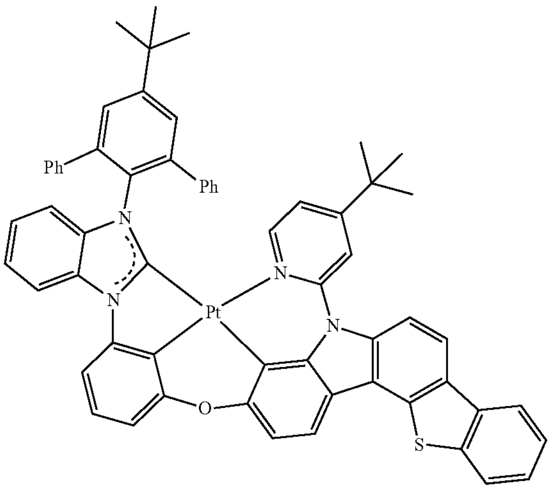

PtS5

Synthesis of intermediate LNH-PtS5: to a reaction flask were added dPh-$NH_2$ (281 mg, 0.72 mmoL, 1.1 eq.), 4S-Cl (344 mg, 0.65 mmoL, 1.0 eq.), tris(dibenzylideneacetone) dipalladium (24 mg, 0.03 mmoL, 3 moL %), 2-dicyclohexylphosphino-2',6'-dimethoxy-biphenyl (21 mg, 0.06 mmoL, 6 moL %), and sodium tert-butoxide (125 mg, 1.30 mmoL, 2.0 eq.), followed by adding toluene (5 mL). The reaction was carried out at 110° C. in an oil bath and stopped after 3 h. After cooling to room temperature, the reaction product was concentrated and subjected to silica gel column chromatography to give 480 mg of white solid in 83% yield, which was used directly in subsequent reactions.

Synthesis of the ligand L-PtS5: to a reaction flask were added LNH-PtS5 (480 mg, 0.54 mmoL, 1.0 eq.), ammonium hexafluorophosphate (176 mg, 1.08 mmoL, 2.0 eq.), and triethyl orthoformate (5 mL). The reaction was carried out at 70° C. and stopped after 2 h. After cooling to room temperature, the reaction product was concentrated and subjected to silica gel column chromatography to give 187 mg of white solid in 33% yield. $^1$H NMR (500 MHz, DMSO) δ 1.32 (s, 9H), 1.43 (s, 9H), 7.01 (t, J=2.0 Hz, 1H), 7.05-7.21 (m, 11H), 7.37 (dd, J=8.5, 2.0 Hz, 1H), 7.42-7.48 (m, 2H), 7.51-7.61 (m, 6H), 7.68-7.77 (m, 4H), 7.80 (d, J=1.5 Hz, 1H), 7.94 (d, J=9.0 Hz, 1H), 8.18 (d, J=7.5 Hz, 1H), 8.32 (d, J=8.5 Hz, 1H), 8.44 (d, J=6.5 Hz, 1H), 8.49 (d, J=9.0 Hz, 1H), 8.66 (d, J=6.0 Hz, 1H), 10.27 (s, 1H).

Synthesis of PtS5: to a reaction flask were added L-PtS5 (168 mg, 0.16 mmoL, 1.0 eq.), (1,5-cyclooctadiene) platinum (II) dichloride (58 mg, 0.17 mmoL, 1.05 eq.), sodium acetate (39 mg, 0.48 mmoL, 3.0 eq.), and diethylene glycol dimethyl ether (10 mL). The reaction was carried out at 120° C. and stopped after 72 h. After cooling to room temperature, the reaction product was concentrated and subjected to silica gel column chromatography to give 44 mg of light yellow solid in 25% yield. $^1$H NMR (500 MHz, DMSO-$d_6$) δ 1.22 (s, 9H), 1.44 (s, 9H), 6.34 (dd, J=6.5, 2.0 Hz, 1H), 6.90 (d, J=8.0 Hz, 7H), 7.04-7.09 (m, 4H), 7.24 (d, J=7.5 Hz, 2H), 7.27 (s, 1H), 7.46-7.57 (m, 7H), 7.99-8.01 (m, 3H), 8.05 (d, J=8.5 Hz, 2H), 8.28-8.31 (m, 2H), 9.11 (d, J=5.0 Hz, 1H).

Example 16: Synthesis Route of Tetradentate Metal Platinum (II) Complex Phosphorescent Light Emitting Material PtS27

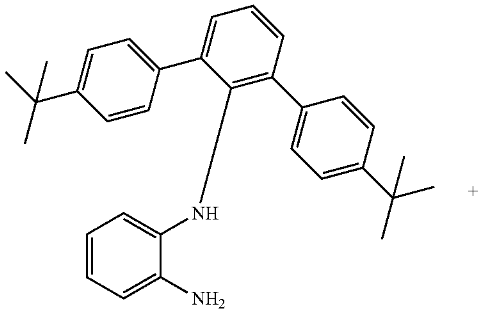

M1-NH$_2$

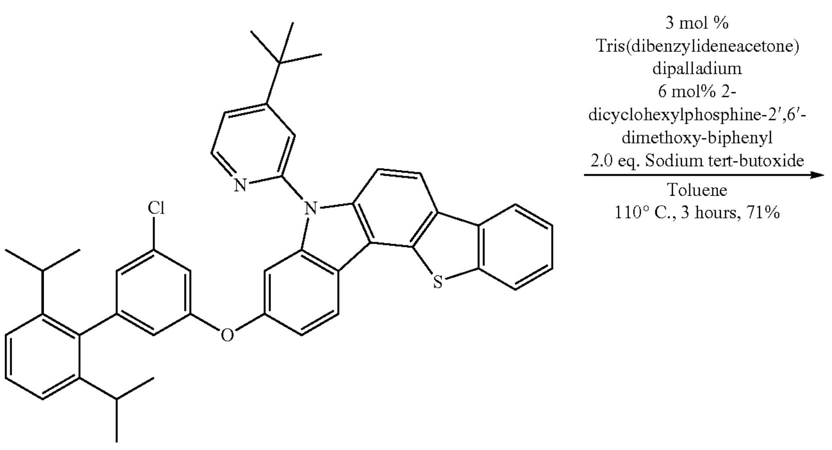

PhDiPr-4S-Cl

-continued
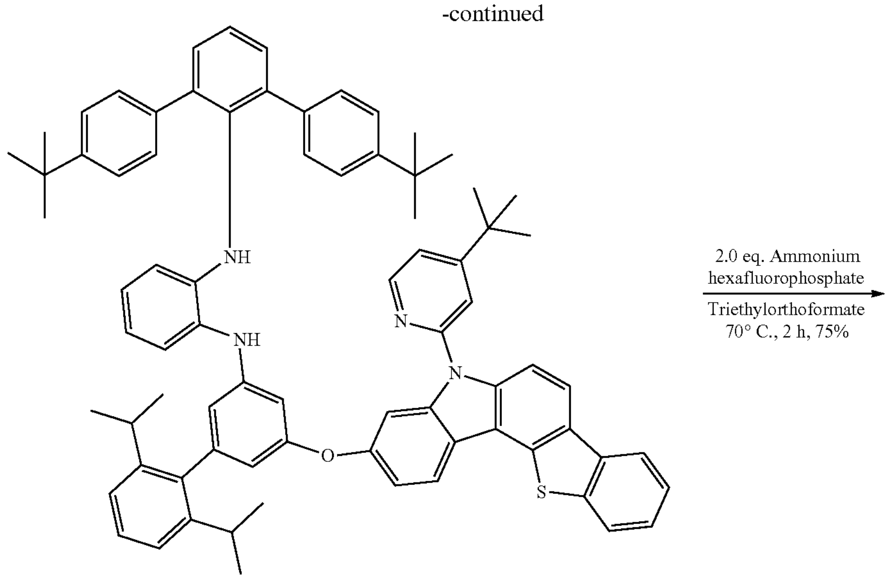
LNH-PtS27
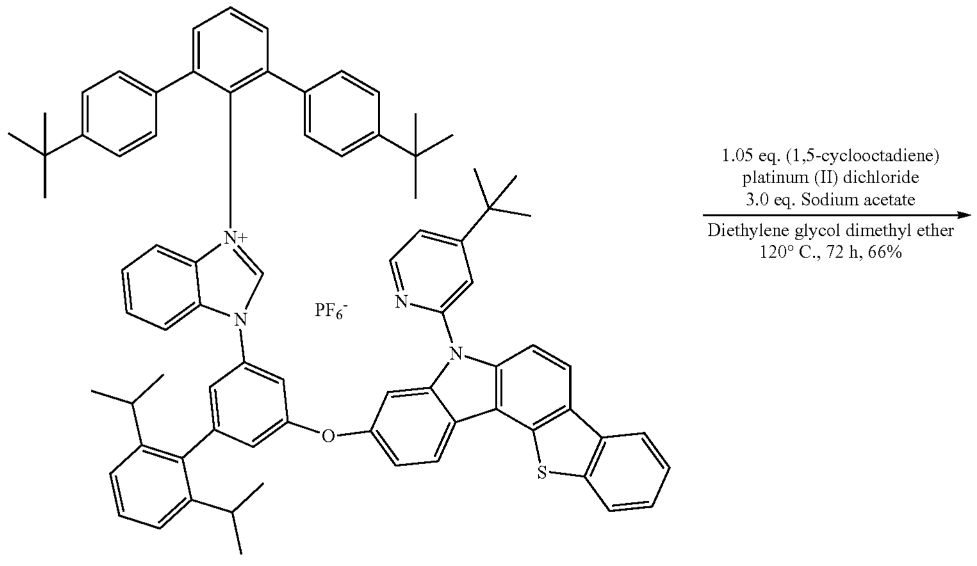
L-PtS27

-continued

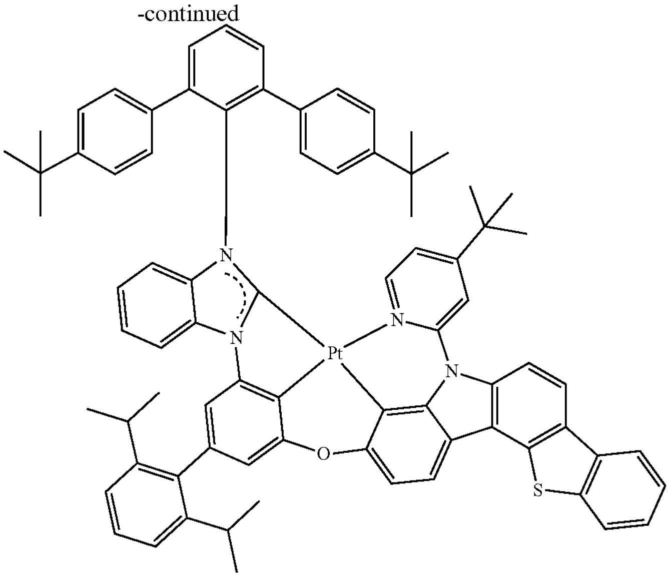

PtS27

PtS27 was synthesized by referring to the synthesis procedure and reaction condition of compound PtS06 in Example 12. The synthesis afforded the desired product LNH-PtS27, 1.07 g of light green foamy solid in 71% yield. The desired product L-PtS27, 861 mg of light green foamy solid, in 75% yield. Molecular weight $[M]^+$: 1116.5. The desired product PtS27, 325 mg of yellow solid in 66% yield. Molecular weight $[M+H]^+$: 1310.7.

Example 17: Synthesis Route of Tetradentate Metal Platinum (II) Complex Phosphorescent Light Emitting Material PtO28

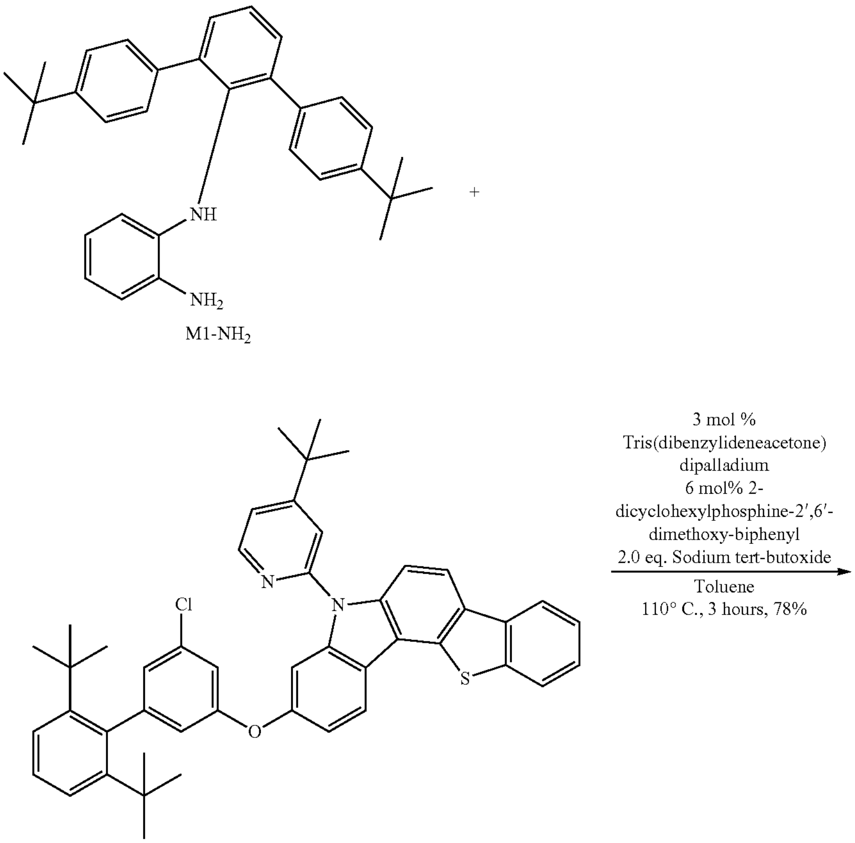

M1-$NH_2$

PhDtBu-4S-Cl

-continued
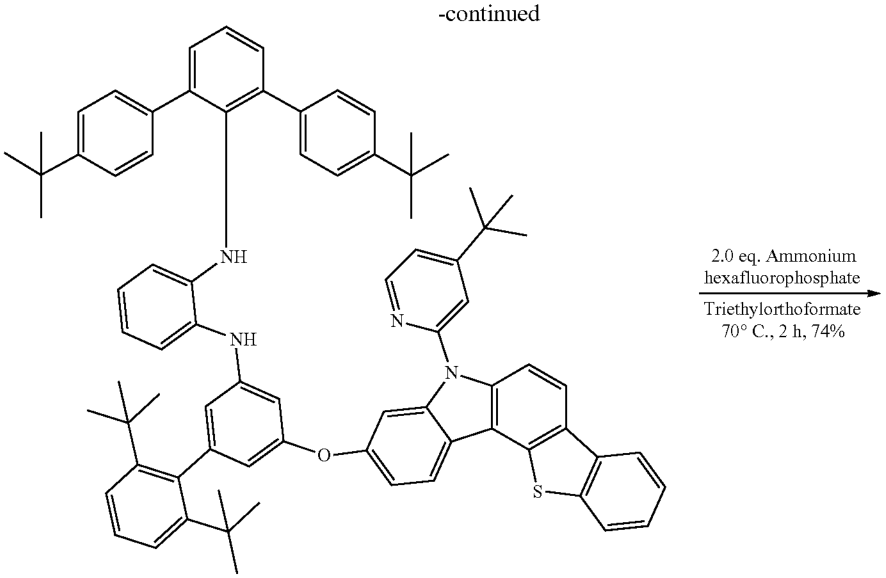
LNH-PtS28
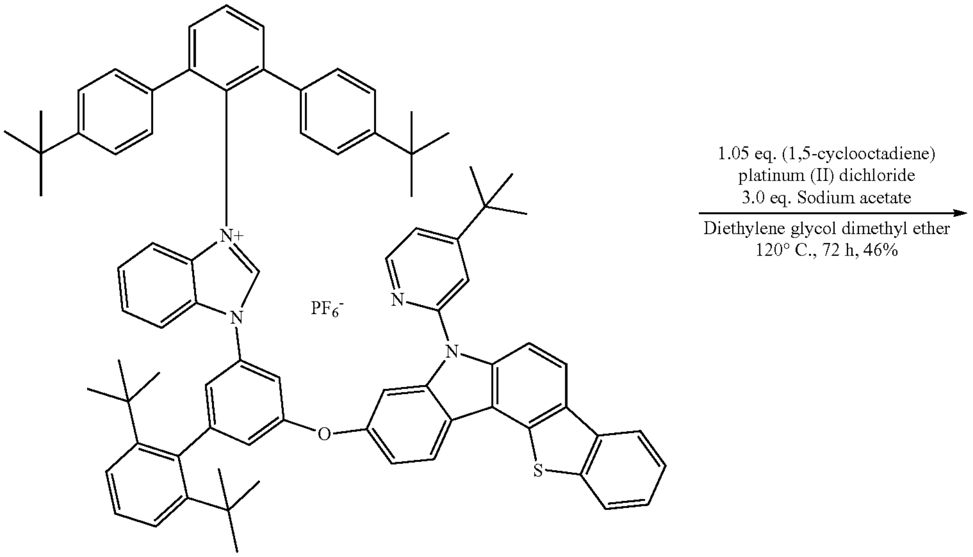
L-PtS28

-continued

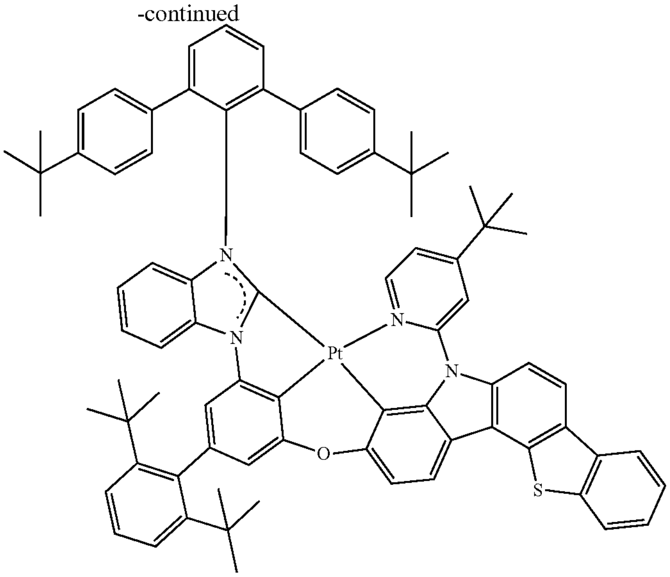

PtS28

PtS28 was synthesized by referring to the synthesis procedure and reaction condition of compound PtS06 in Example 12. The synthesis afforded the desired product LNH-PtS28, 1.19 g of light green foamy solid in 78% yield. The desired product L-PtS28, 841 mg of light green foamy solid, in 74% yield. Molecular weight $[M]^+$: 1145.6. The desired product PtS28, 385 mg of yellow solid in 46% yield. Molecular weight $[M+H]^+$: 1338.7.

Example 18: Synthesis Route of Tetradentate Metal Platinum (II) Complex Phosphorescent Light Emitting Material PtS13

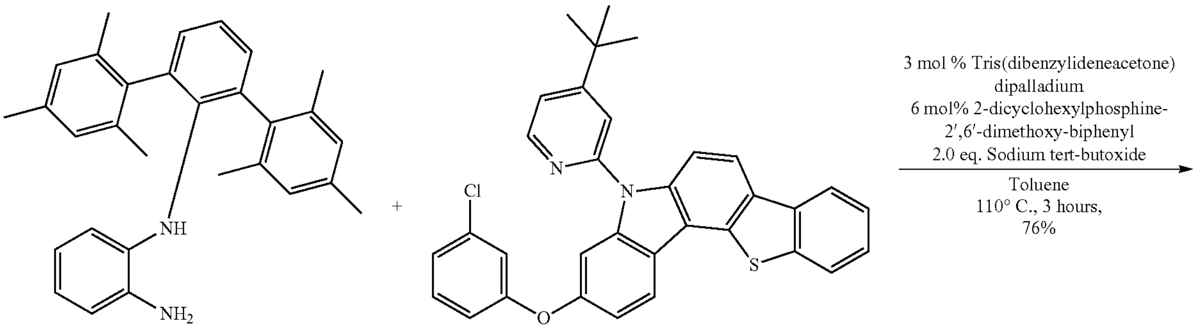

M2-$NH_2$ 4S-Cl

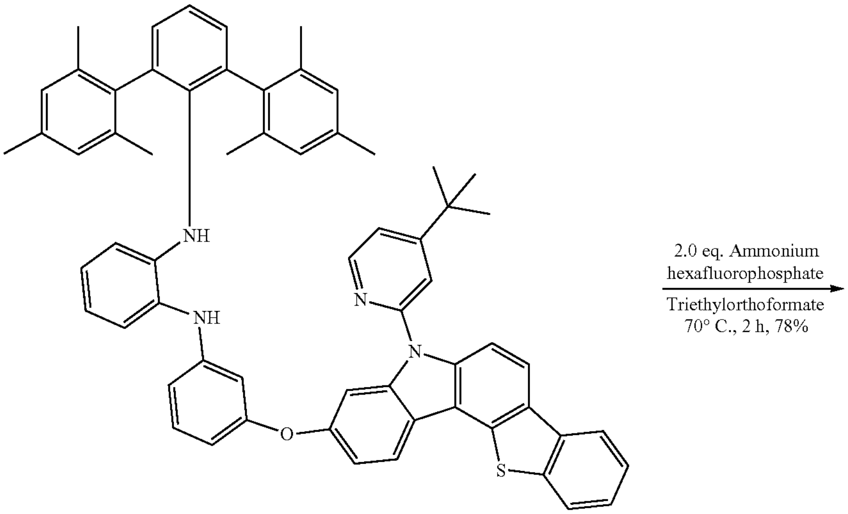

LNH-PtS13

-continued

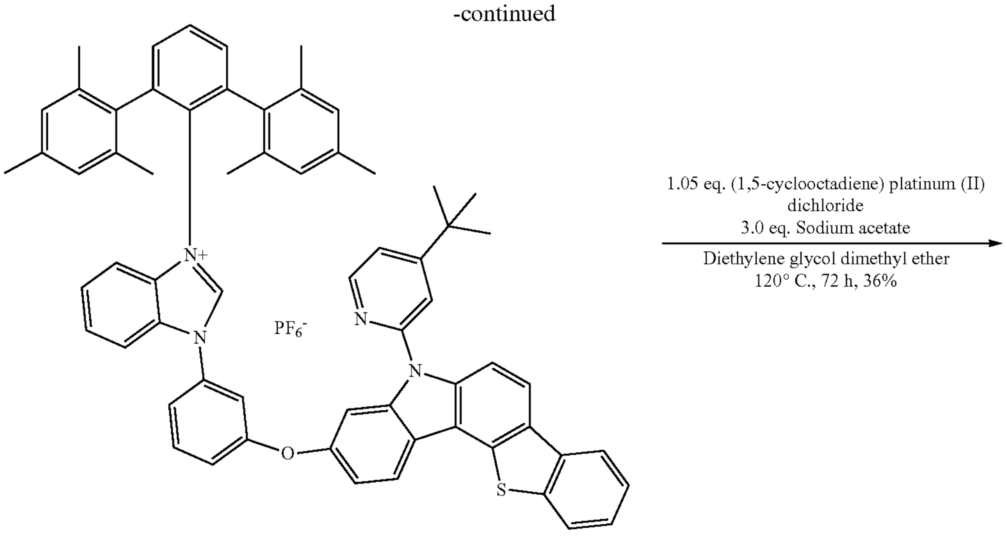

L-PtS13

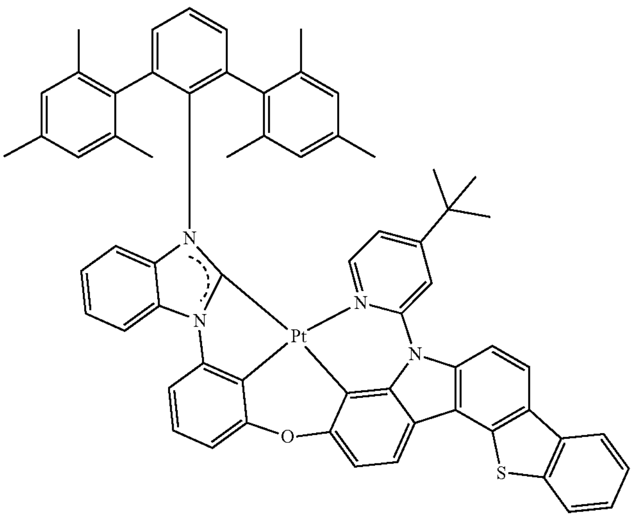

PtS13

PtS13 was synthesized by referring to the synthesis procedure and reaction condition of compound PtS06 in Example 12. The synthesis afforded the desired product LNH-PtS13, 1.19 g of light green foamy solid in 76% yield. The desired product L-PtS13, 891 mg of light green foamy solid, in 78% yield. Molecular weight $[M]^+$: 929.2. The desired product PtS28, 325 mg of yellow solid in 36% yield. Molecular weight $[M+H]^+$: 1122.3.

Example 19: Synthesis Route of Tetradentate Metal Platinum (II) Complex Phosphorescent Light Emitting Material PtS17

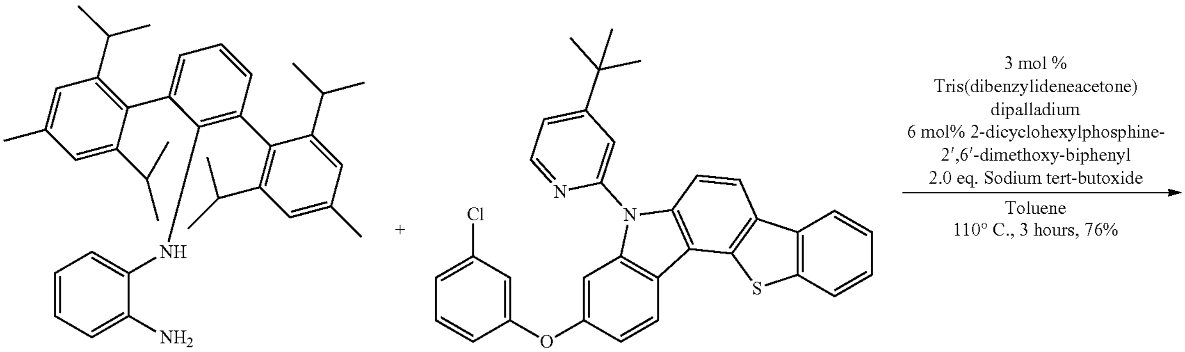

M3-$NH_2$ 4S-Cl

-continued
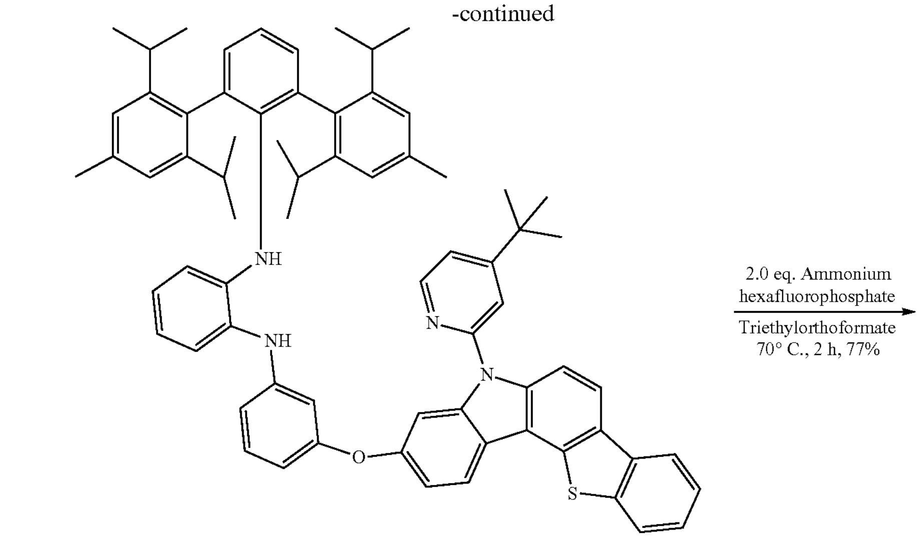
LNH-PtS17
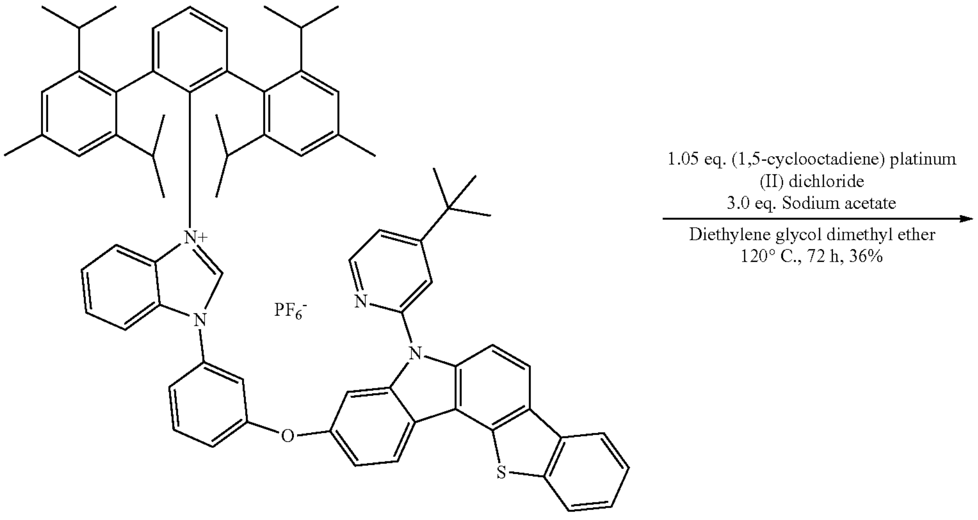
L-PtS17
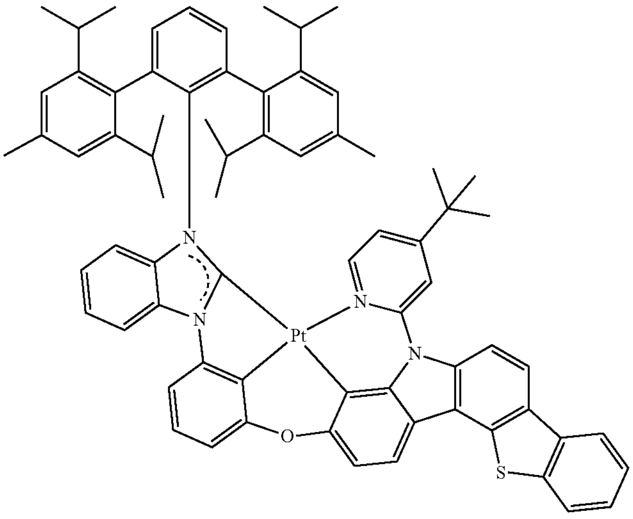
PtS17

PtS17 was synthesized by referring to the synthesis procedure and reaction condition of compound PtS06 in Example 12. The synthesis afforded the desired product LNH-PtS17, 1.19 g of light green foamy solid in 77% yield. The desired product L-PtS17, 891 mg of light green foamy solid, in 78% yield. Molecular weight $[M]^+$: 1041.5. The desired product PtS17, 325 mg of yellow solid in 36% yield. Molecular weight $[M+H]^+$: 1232.5.

Example 20: Synthesis of PtO52

PtO52 was synthesized by referring to the synthesis procedure and reaction condition of compound PtO6 in Example 1. The desired product was obtained as 562 mg of yellow solid in 35% yield. Molecular weight $[M+H]^+$: 1472.6.

Example 21: Synthesis of PtO74

PtO74 was synthesized by referring to the synthesis procedure and reaction condition of compound PtO6 in Example 1. The desired product was obtained as 604 mg of yellow solid in 58% yield. Molecular weight $[M+H]^+$: 1362.6.

Example 22: Synthesis of PtO88

PtO88 was synthesized by referring to the synthesis procedure and reaction condition of compound PtO6 in Example 1. The desired product was obtained as 624 mg of yellow solid in 58% yield. Molecular weight $[M+H]^+$: 1474.7.

Example 23: Synthesis of PtO89

PtO89 was synthesized by referring to the synthesis procedure and reaction condition of compound PtO6 in Example 1. The desired product was obtained as 661 mg of yellow solid in 72% yield. Molecular weight $[M+H]^+$: 1316.5.

Example 24: Synthesis of PtO140

PtO140 was synthesized by referring to the synthesis procedure and reaction condition of compound PtO6 in Example 1. The desired product was obtained as 455 mg of yellow solid in 69% yield. Molecular weight $[M+H]^+$: 1236.5.

Example 25: Synthesis of PtO144

PtO144 was synthesized by referring to the synthesis procedure and reaction condition of compound PtO6 in Example 1. The desired product was obtained as 471 mg of yellow solid in 80% yield. Molecular weight $[M+H]^+$: 1280.5.

Example 26: Synthesis of PtO150

PtO150 was synthesized by referring to the synthesis procedure and reaction condition of compound PtO6 in Example 1. The desired product was obtained as 596 mg of yellow solid in 56% yield. Molecular weight $[M+H]^+$: 1187.4.

Example 27: Synthesis of PtO158

PtO158 was synthesized by referring to the synthesis procedure and reaction condition of compound PtO6 in Example 1. The desired product was obtained as 369 mg of yellow solid in 58% yield. Molecular weight $[M+H]^+$: 1205.4.

Example 28: Synthesis of PtS47

PtS47 was synthesized by referring to the synthesis procedure and reaction condition of compound PtS6 in Example 12. The desired product was obtained as 492 mg of yellow solid in 82% yield. Molecular weight $[M+H]^+$: 1369.6.

Example 29: Synthesis of PtS87

PtS87 was synthesized by referring to the synthesis procedure and reaction condition of compound PtS6 in Example 12. The desired product was obtained as 596 mg of yellow solid in 74% yield. Molecular weight $[M+H]^+$: 1518.7.

Example 30: Synthesis of PtS93

PtS93 was synthesized by referring to the synthesis procedure and reaction condition of compound PtS6 in Example 12. The desired product was obtained as 615 mg of yellow solid in 68% yield. Molecular weight $[M+H]^+$: 1088.4.

Example 31: Synthesis of PtS135

PtS135 was synthesized by referring to the synthesis procedure and reaction condition of compound PtS6 in Example 12. The desired product was obtained as 582 mg of yellow solid in 66% yield. Molecular weight $[M+H]^+$: 1279.6.

Theoretical calculations show that the geometry of the ground state ($S_0$) molecule is optimized using density functional theory (DFT). DFT calculations were performed using 1B3LYP functional where the 6-31G(d) basis set was used for C, H, O and N atoms and the LANL2DZ basis set was used for Pt atoms.

TABLE 1
| Electrons and Holes in Tl Excited States for Partial Metal Complexes of the Invention | |
|---|---|
| Metal complex | |
| 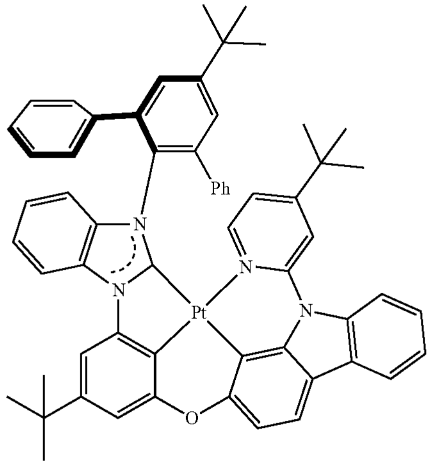 | R1 |
| 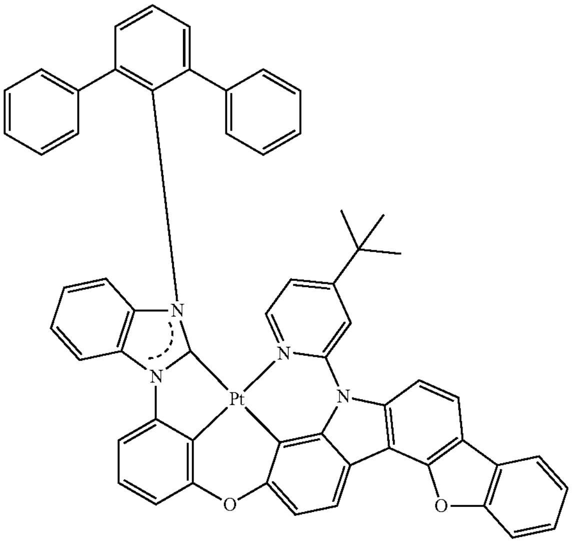 | PtO1 |
| 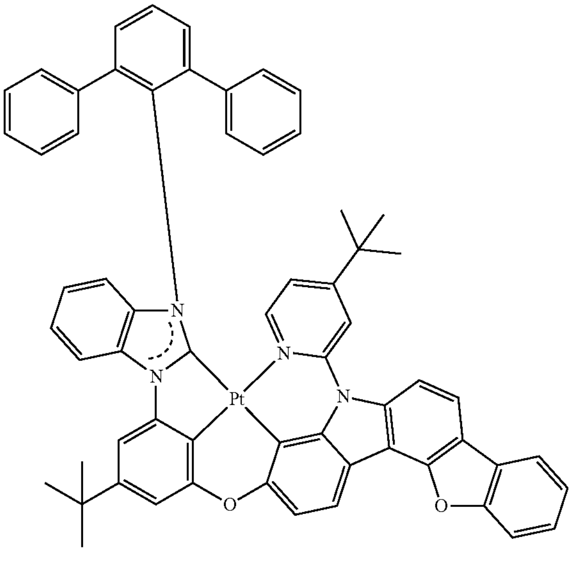 | PtO2 |

TABLE 1-continued
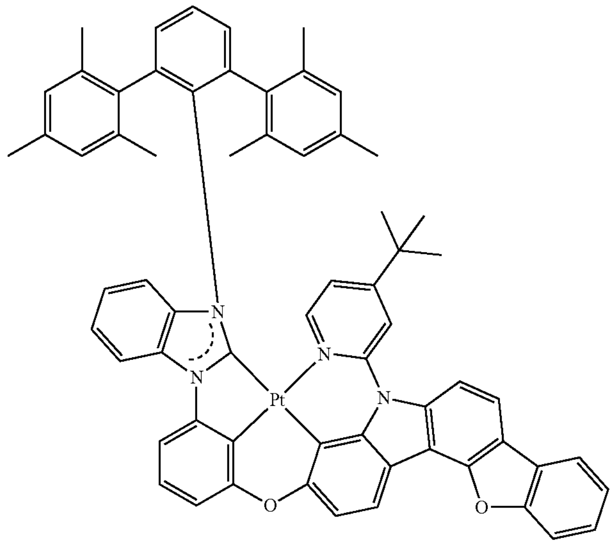
PtO13
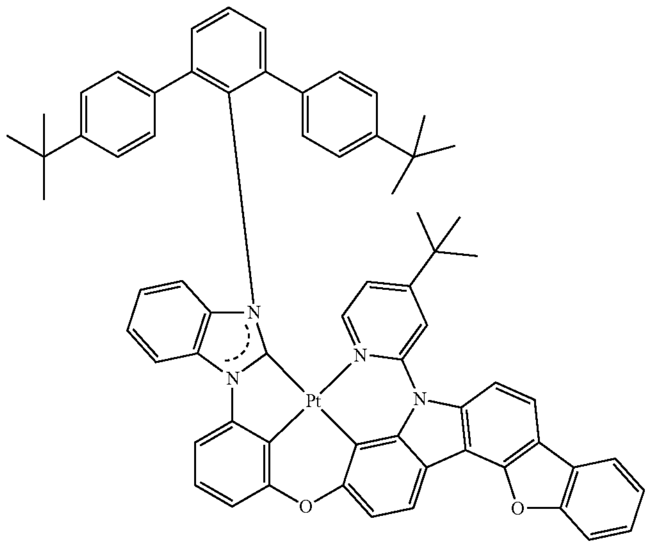
PtO25

TABLE 1-continued
PtO35
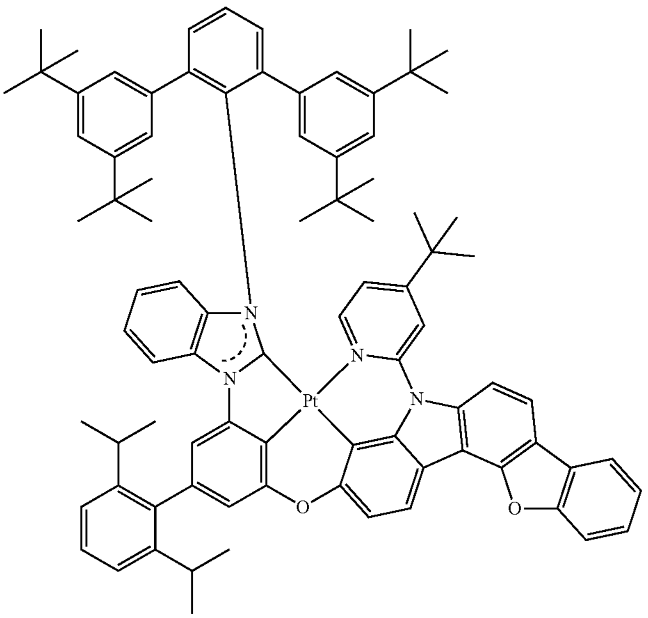
PtO40
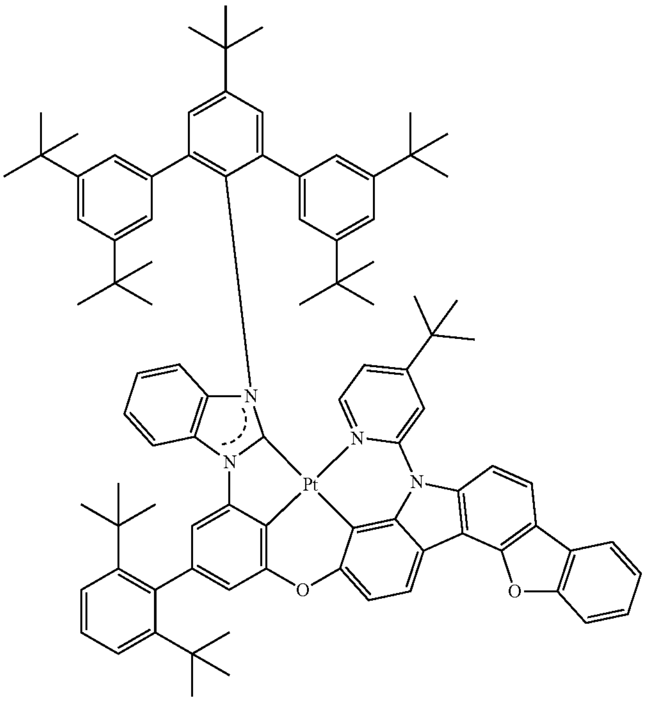

TABLE 1-continued
PtS1
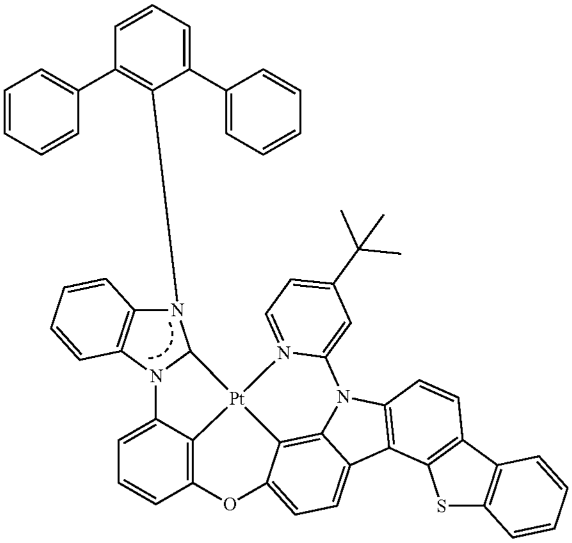
PtS2
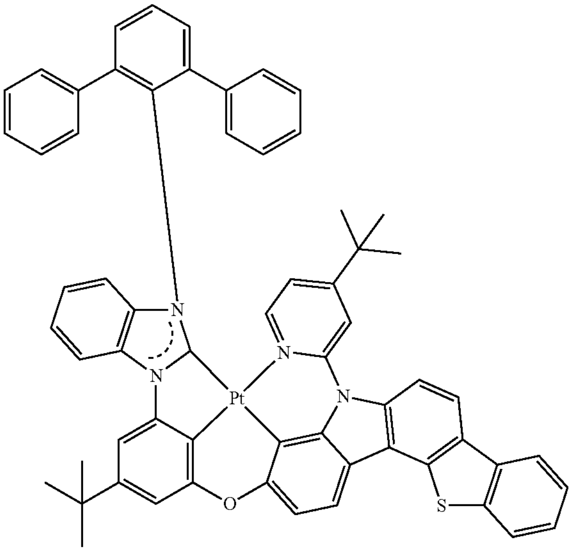
PtS13
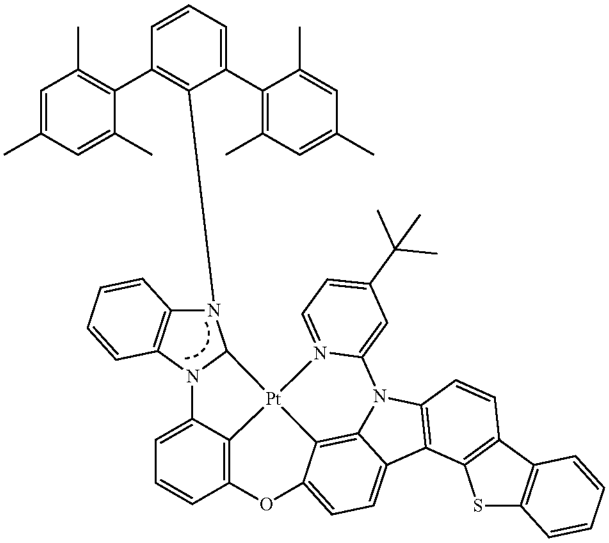

TABLE 1-continued
PtS25
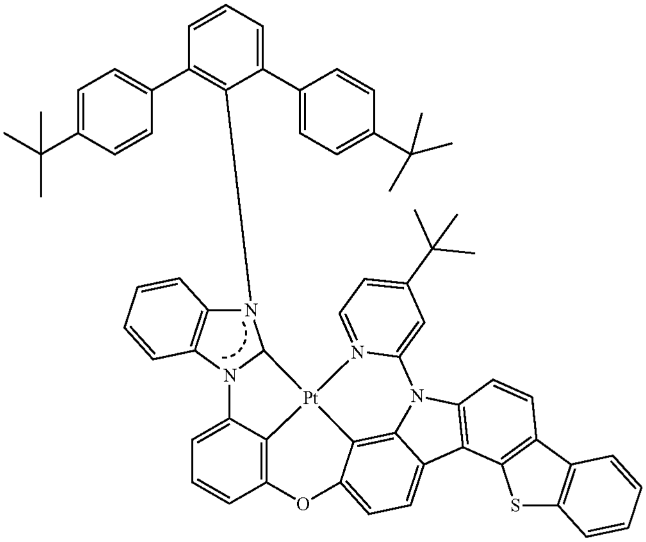
PtS35
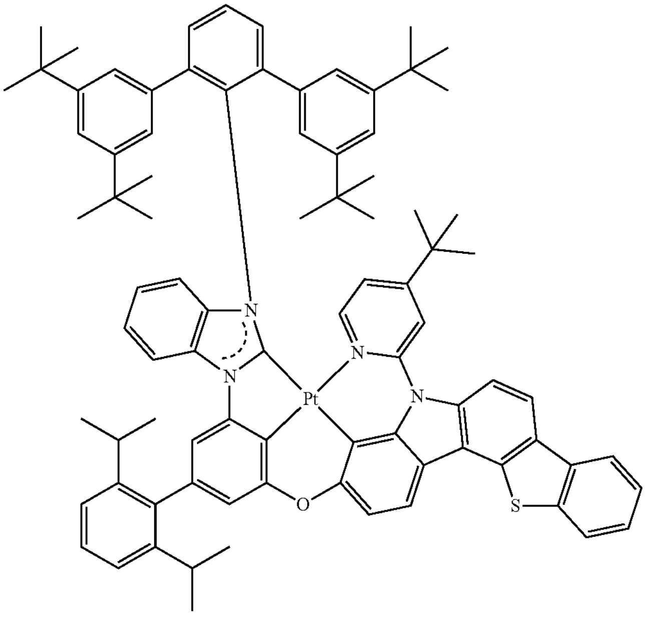

TABLE 1-continued
| | |
|---|---|
| 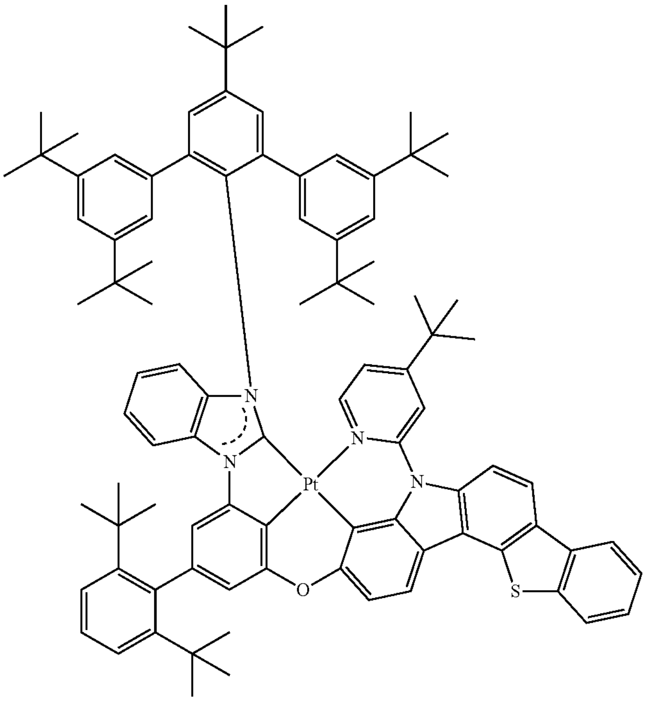 | PtS40 |
Electrons and Holes in Tl Excited States for Partial Metal Complexes of the Invention
| Metal complex | $T_1$-electron |
|---|---|
| R1 | 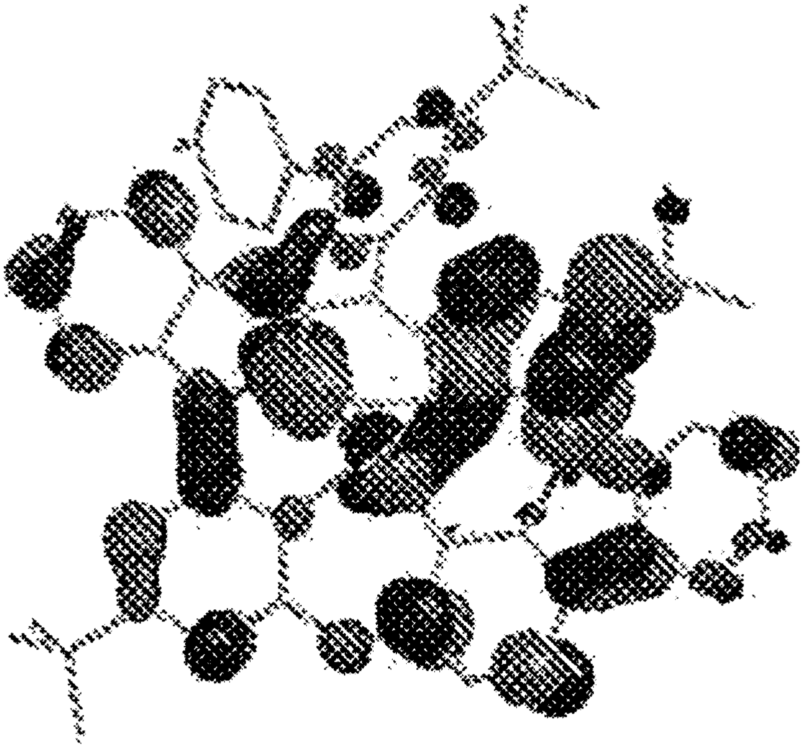 |

TABLE 1-continued
PtO1
PtO2
PtO13
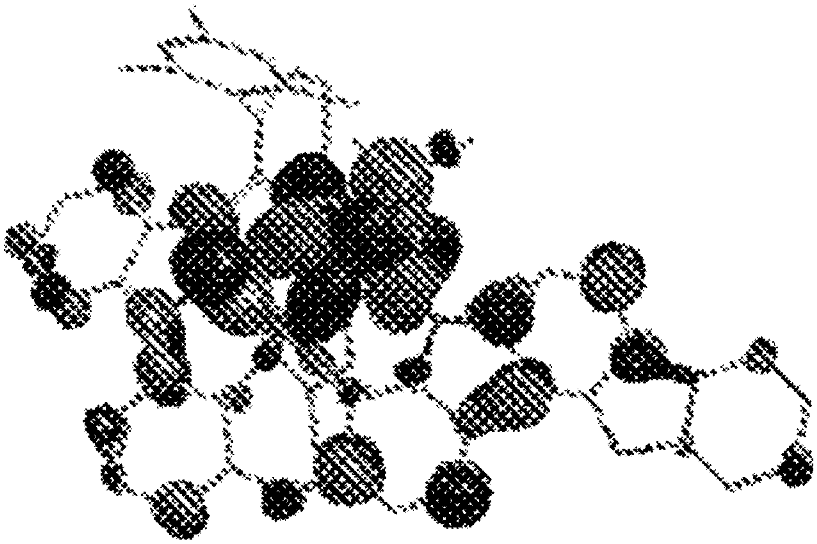

TABLE 1-continued
PtO25
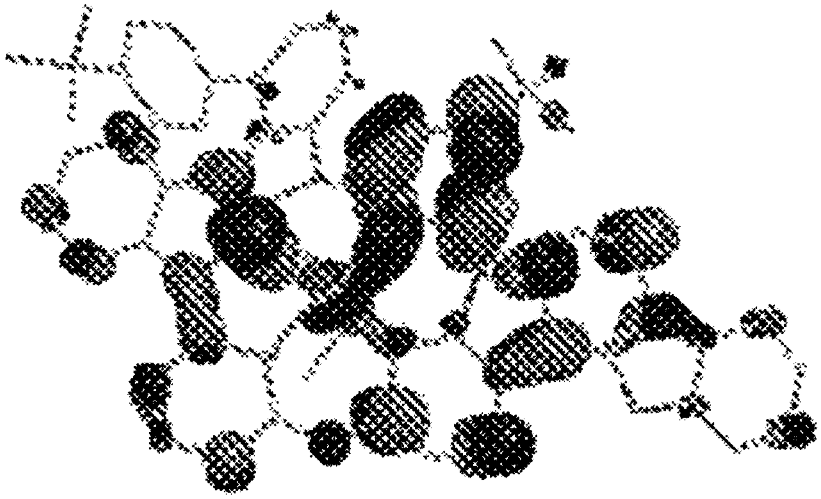
PtO35

TABLE 1-continued
PtO40
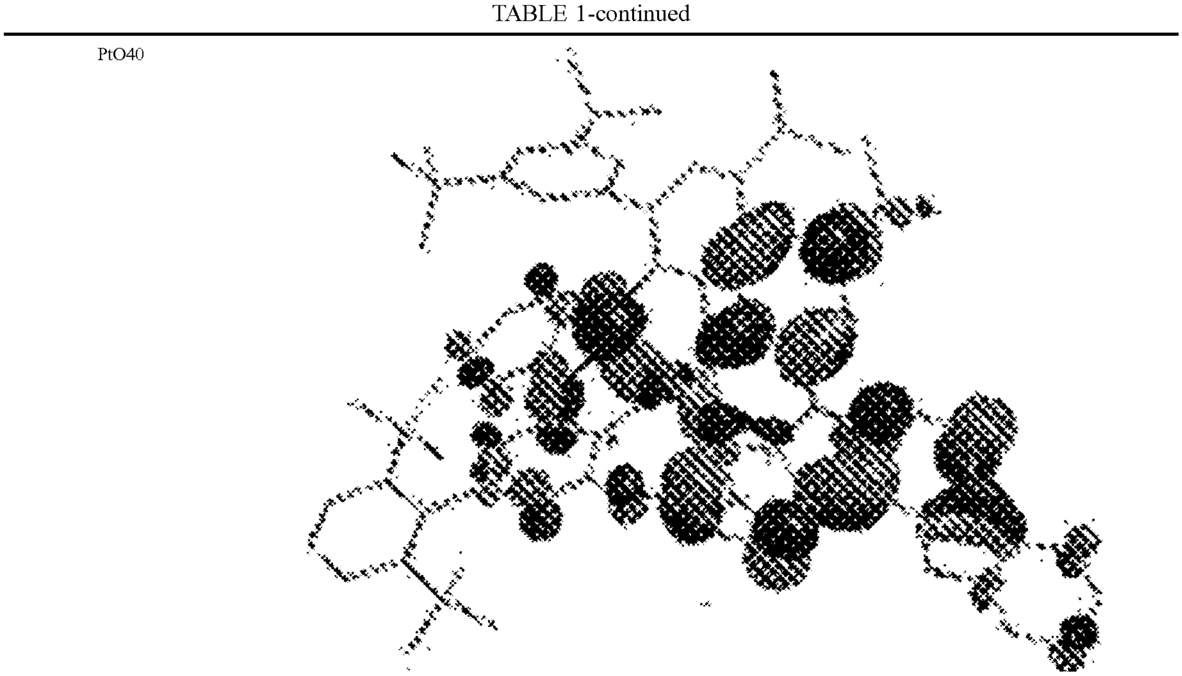
PtS1
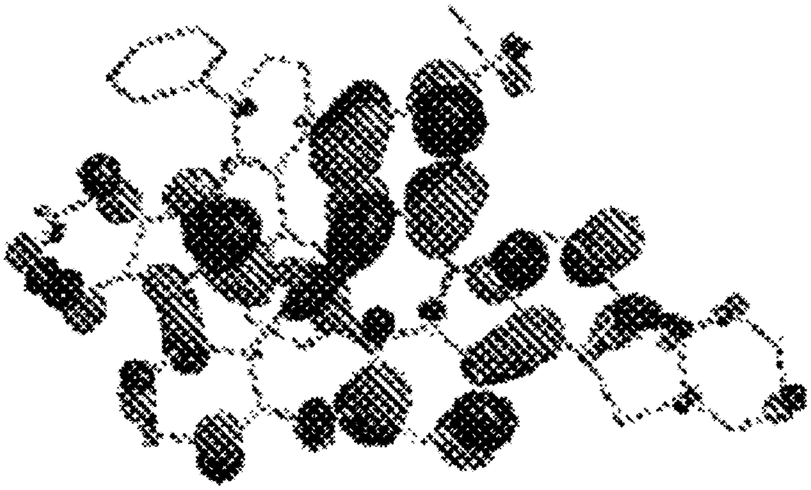
PtS2
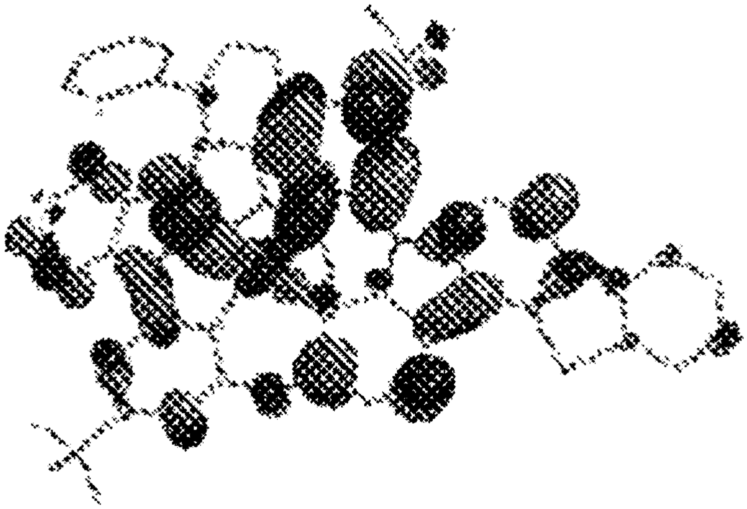

TABLE 1-continued
PtS13
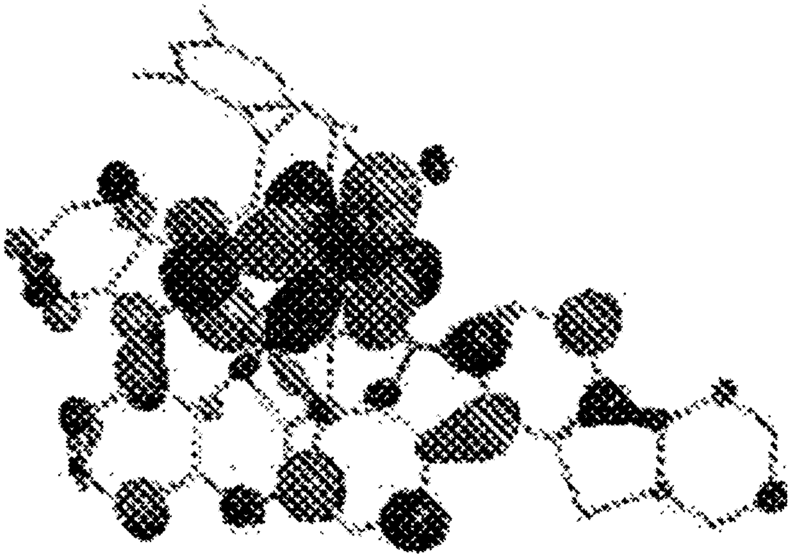
PtS25
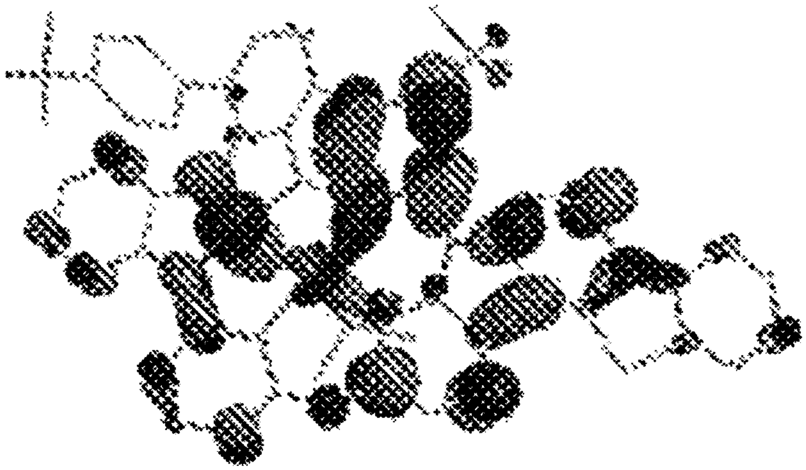
PtS35
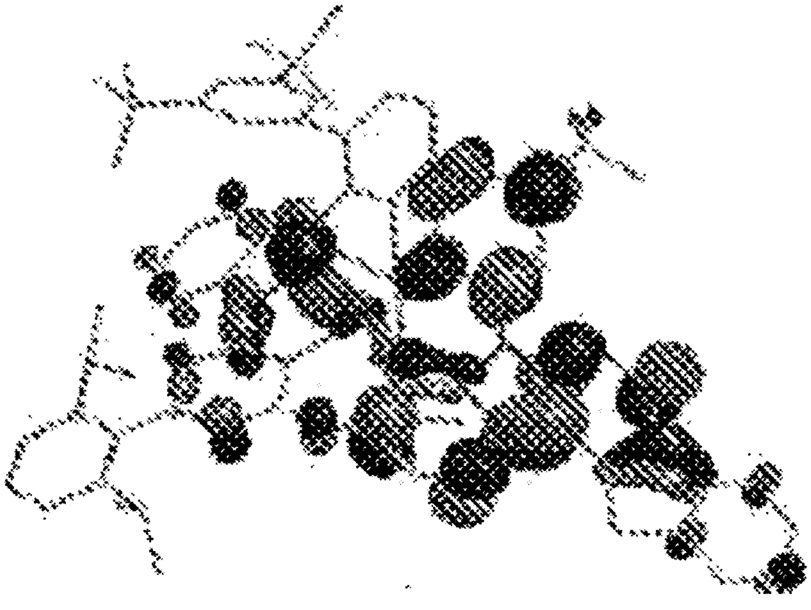

TABLE 1-continued
| | |
|---|---|
| PtS40 |  |
| Electrons and Holes in Tl Excited States for Partial Metal Complexes of the Invention | |
|---|---|
| Metal complex | $T_1$-hole |
| R1 | 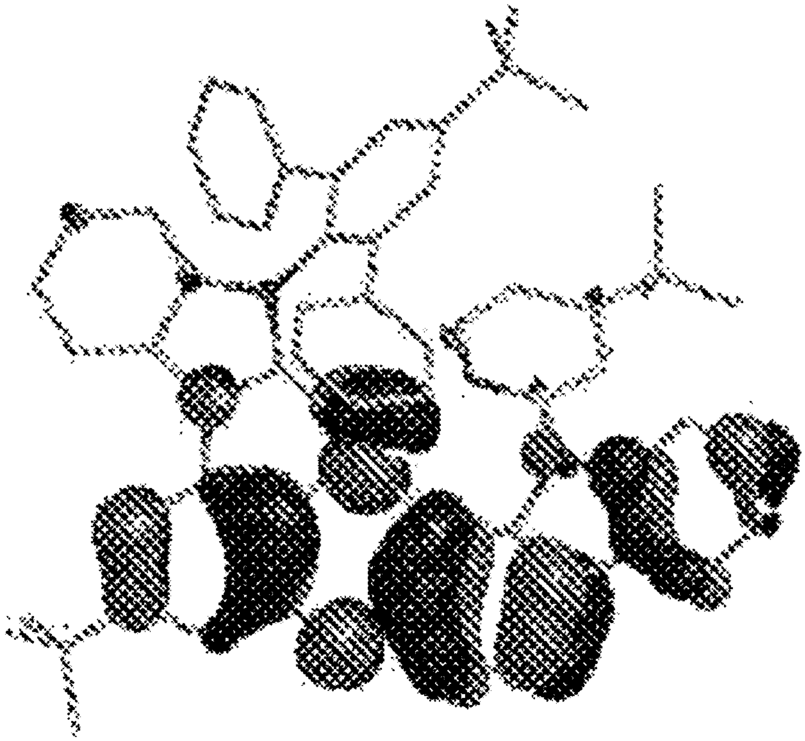 |

TABLE 1-continued
PtO1
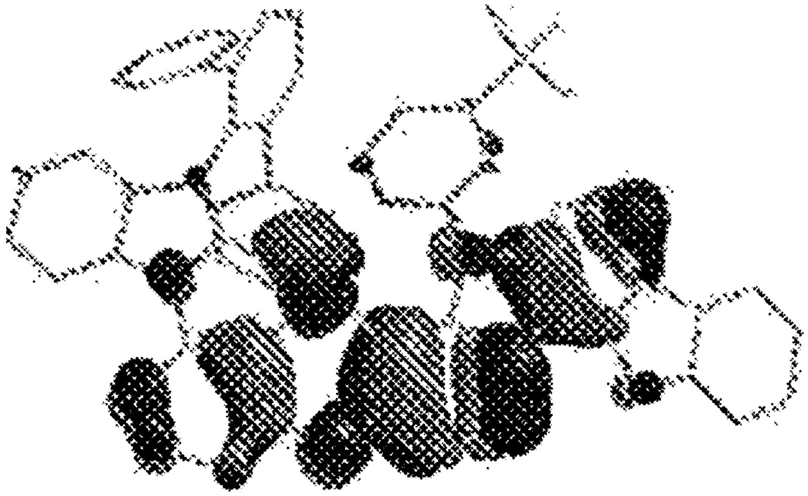
PtO2
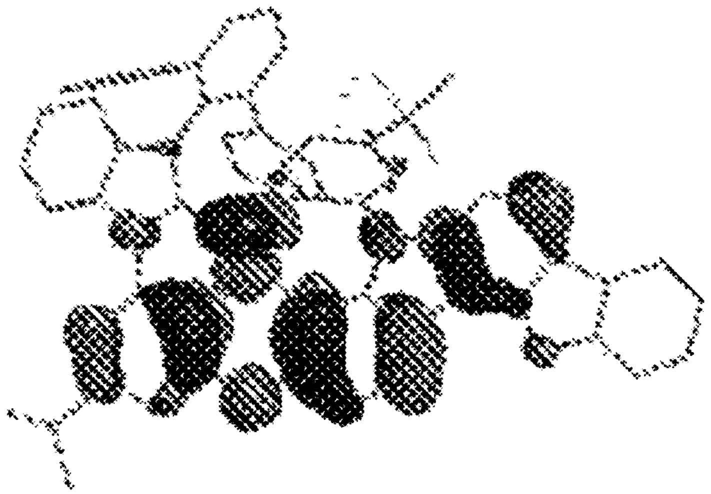
PtO13
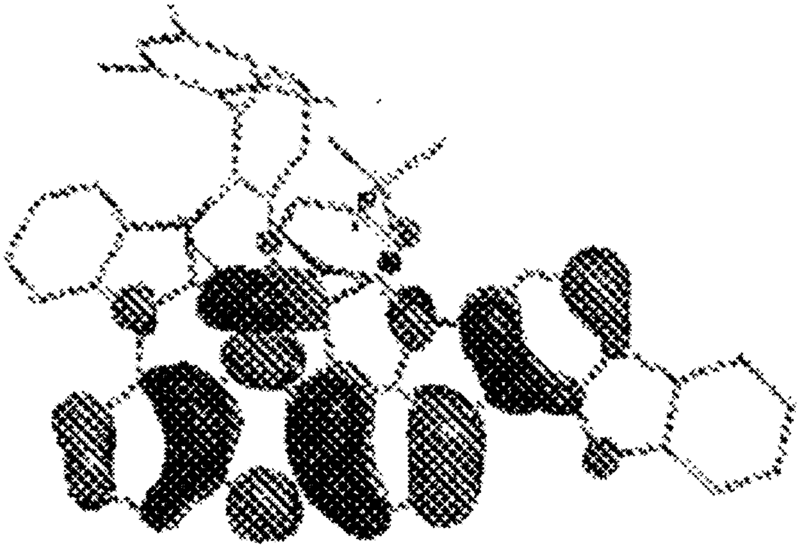

TABLE 1-continued
PtO25
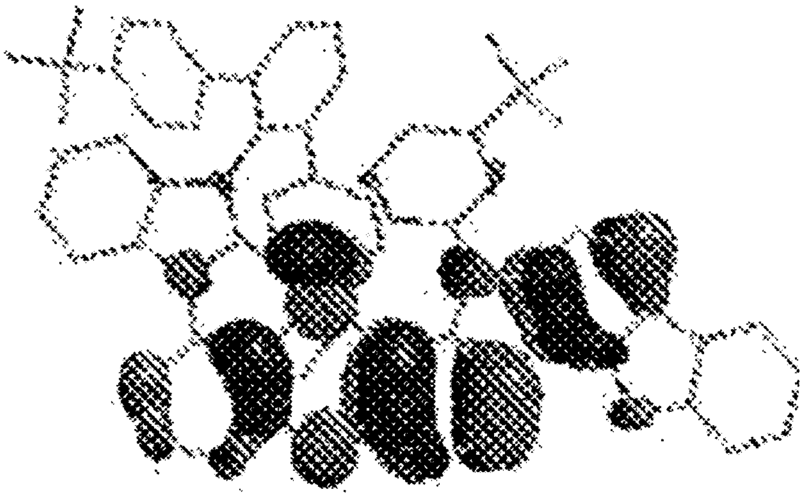
PtO35
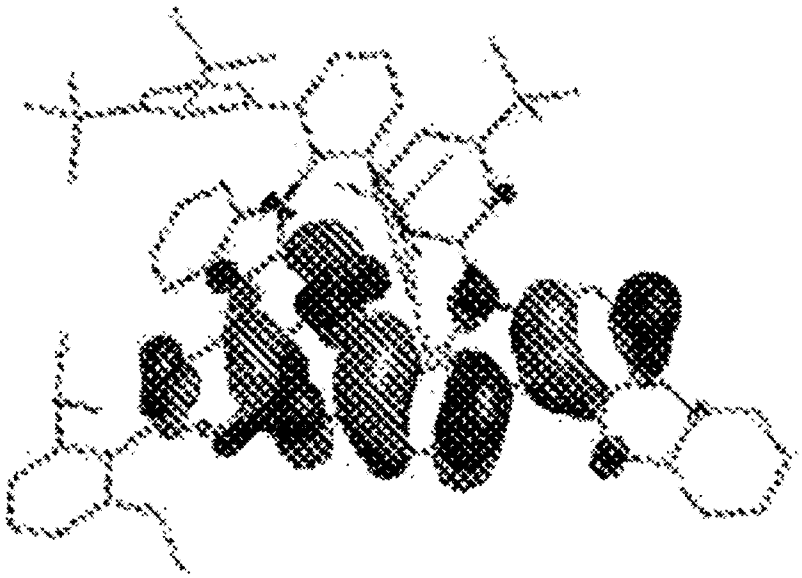

TABLE 1-continued
PtO40
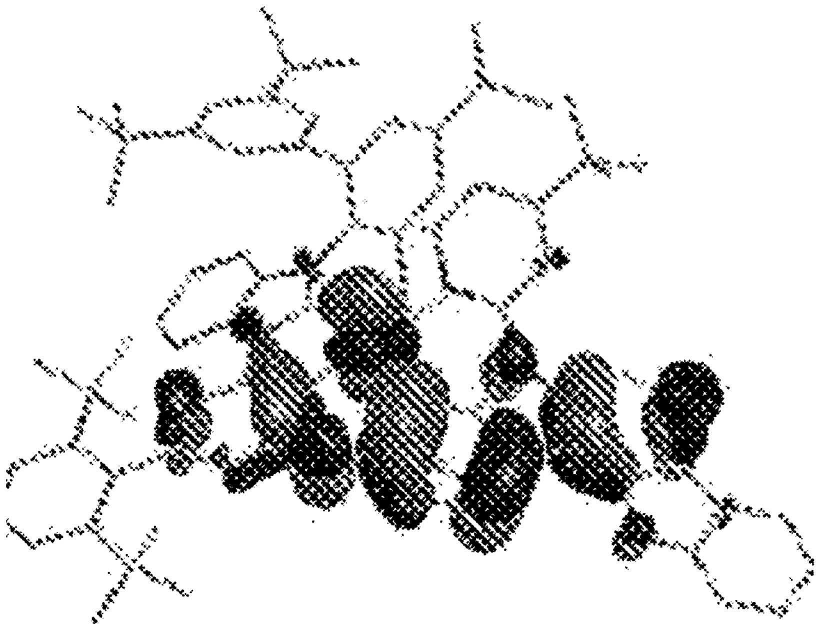
PtS1
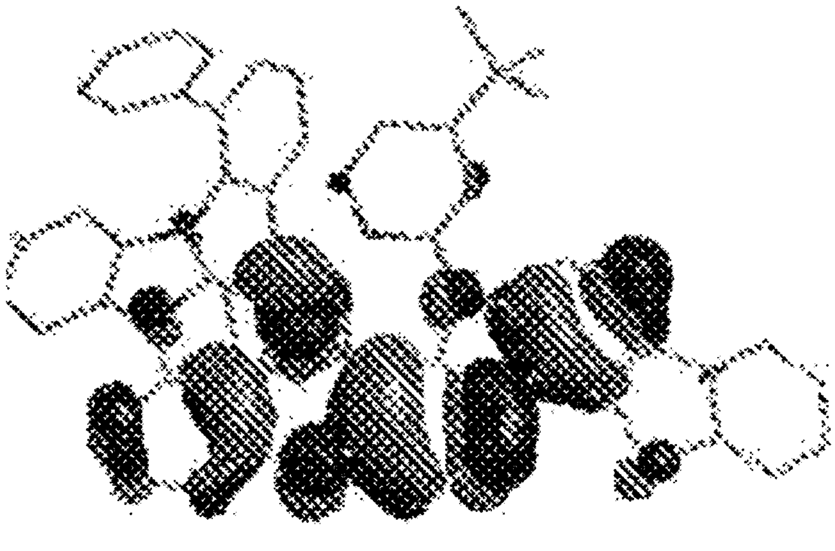

TABLE 1-continued
PtS2
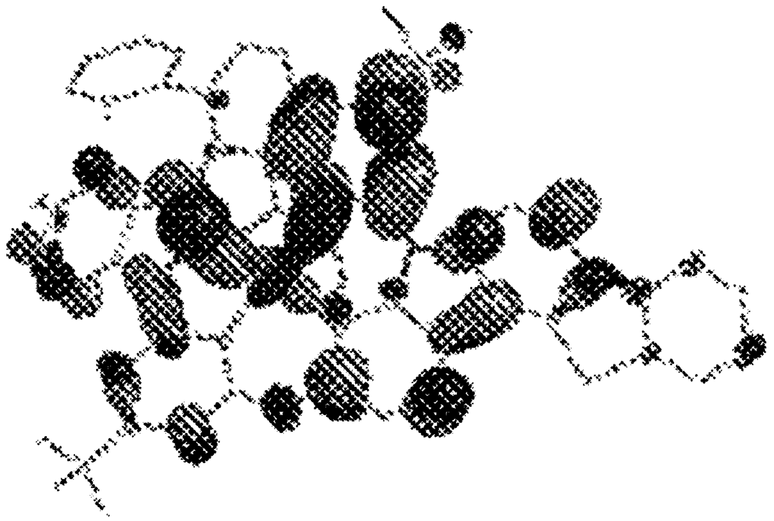
PtS13
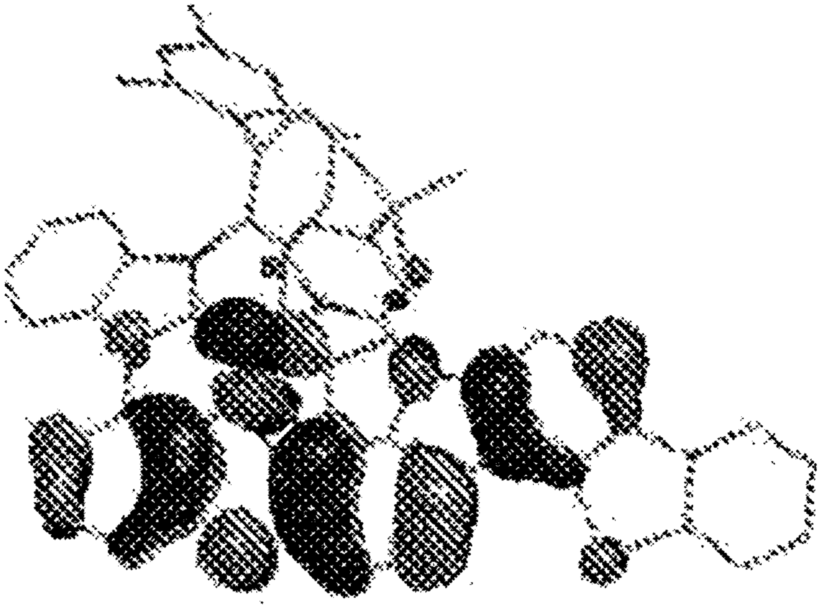

TABLE 1-continued
PtS25
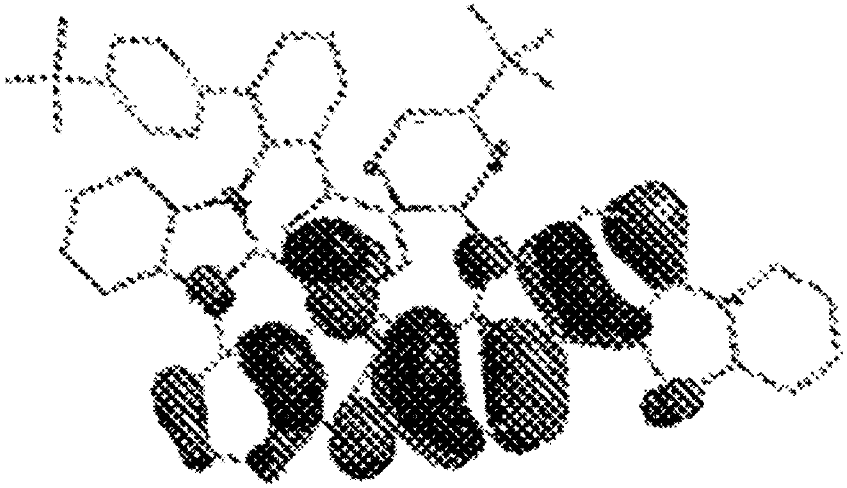
PtS35
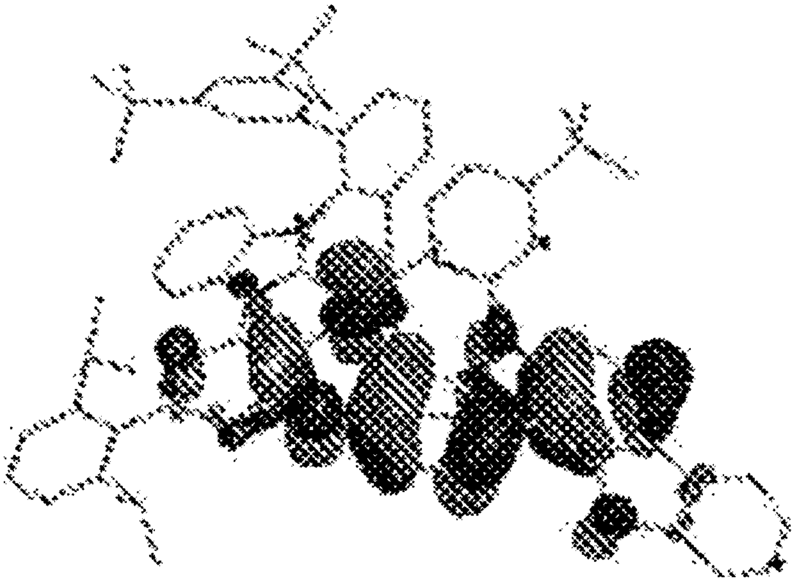

TABLE 1-continued

PtS40

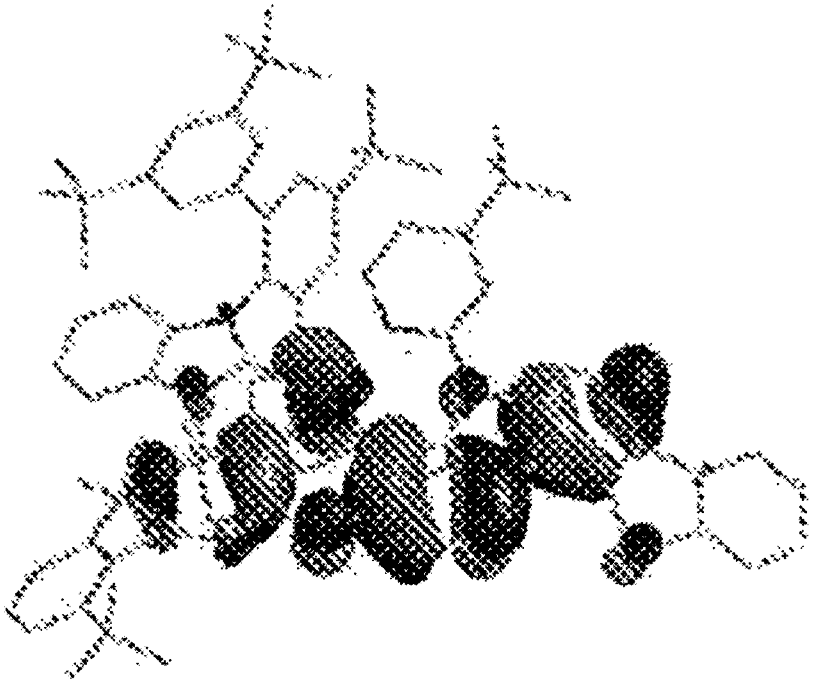

From the calculation data in Table 1, it can be seen that the introduction of the fused ring at different positons of carbazole enlarges the conjugated system and increases the distribution of the local excited state, so that the emission shoulder peak becomes lower, the Full Width at Half Maximum becomes narrower and the color purity is higher, which can meet the requirements of value materials.

Photophysical Properties

TABLE 2

Photophysical property data of some metal complexes in dichloromethane solution.

| Complex | Maximum emission wavelength | Full Width at Half Maximum |
|---|---|---|
| R1 | 461 nm | 25 nm |
| PtO2 | 464 nm | 18.2 nm |
| PtO5 | 460.8 nm | 16.2 nm |
| PtO6 | 463.4 nm | 17.8 nm |
| PtO33 | 461 nm | 17 nm |
| PtO34 | 464 nm | 19 nm |
| PtO37 | 460.6 nm | 17 nm |
| PtO38 | 463 nm | 18.2 nm |
| PtO107 | 462.4 nm | 22 nm |
| PtO109 | 462.4 nm | 18 nm |
| PtS1 | 466 nm | 18.4 nm |
| PtS5 | 465.4 nm | 17 nm |
| PtS6 | 466.4 nm | 17.6 nm |
| PtS28 | 467.8 nm | 18.6 nm |

Figure 2:
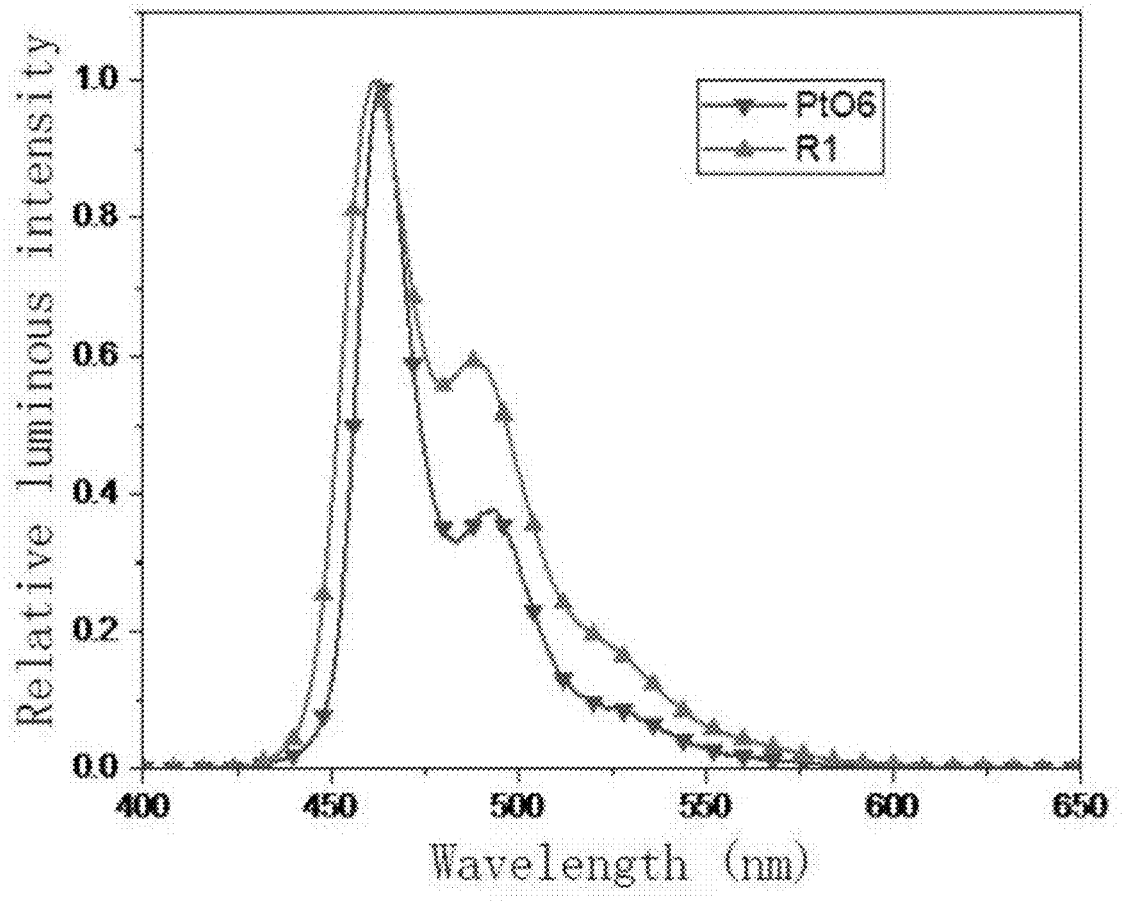
FIG. 2 is a room temperature emission spectrum of R1 and PtO6 in a dichloromethane solution.
Figure 3:
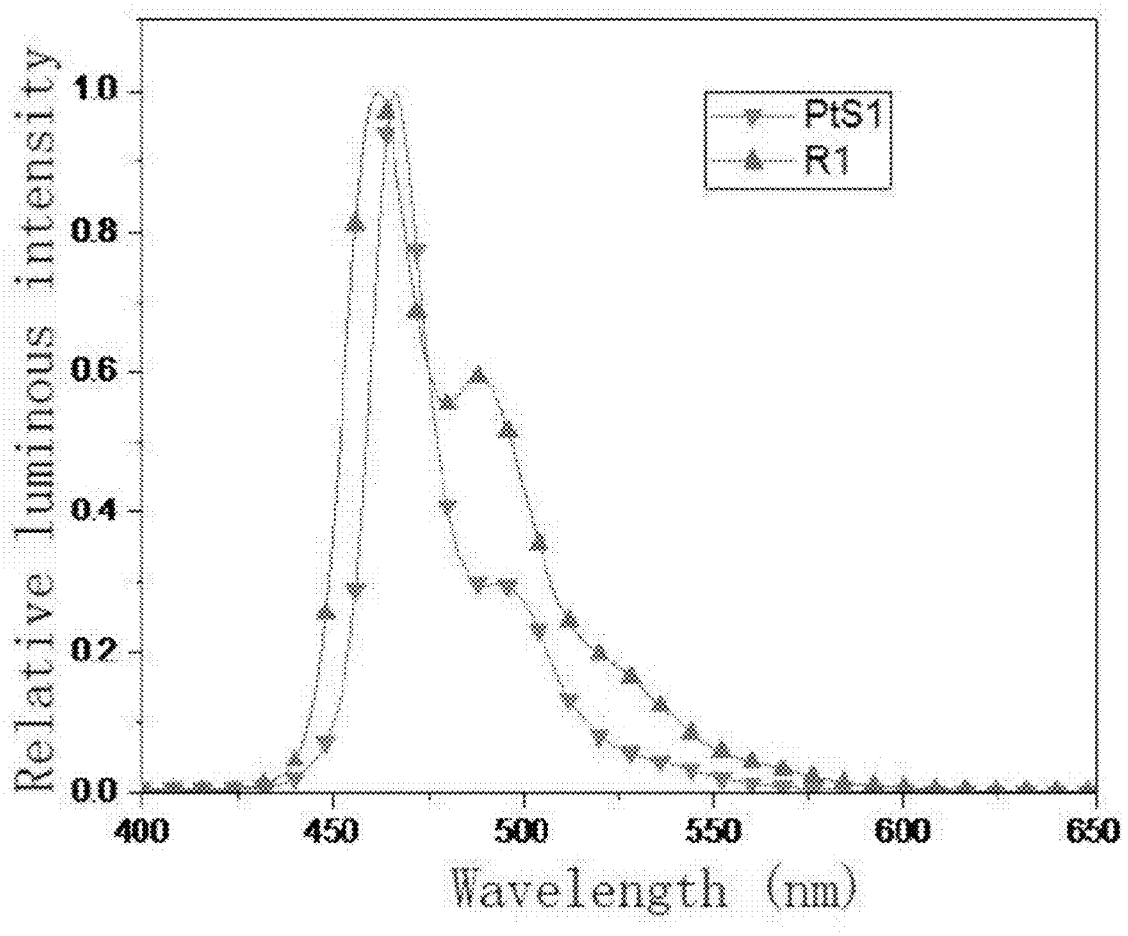
FIG. 3 is a room temperature emission spectrum of R1 and PtS1 in a dichloromethane solution.
Figure 4:
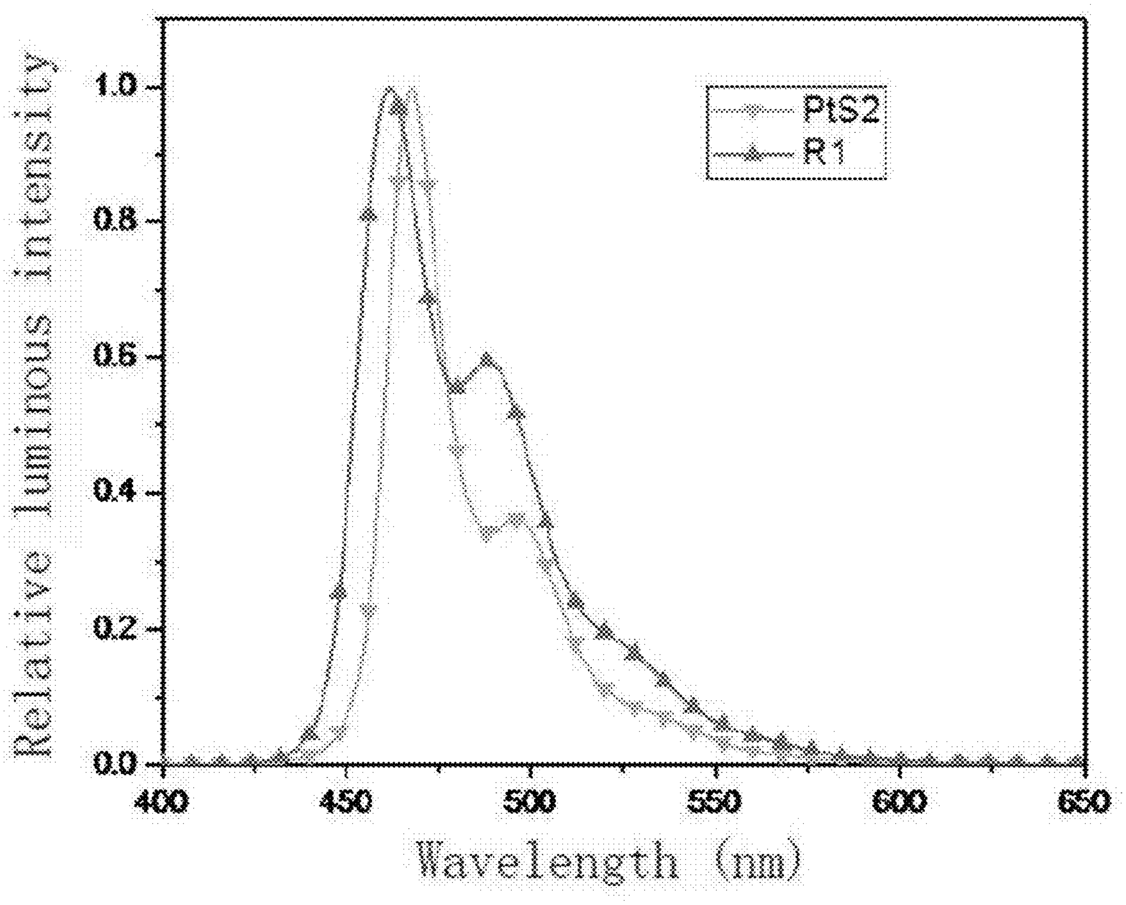
FIG. 4 is a room temperature emission spectrum of R1 and PtS2 in a dichloromethane solution.
Figure 5:
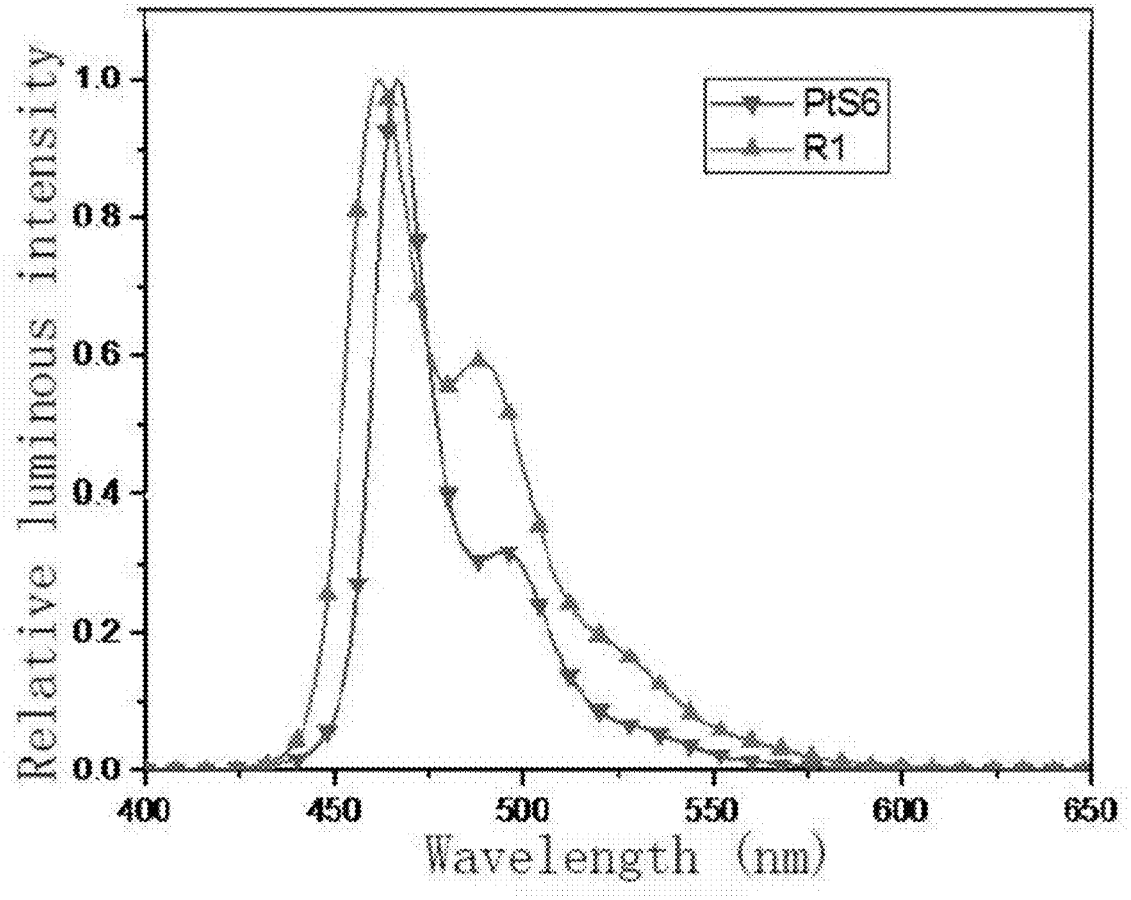
FIG. 5 is a room temperature emission spectrum of R1 and PtS6 in a dichloromethane solution.
Figure 6:
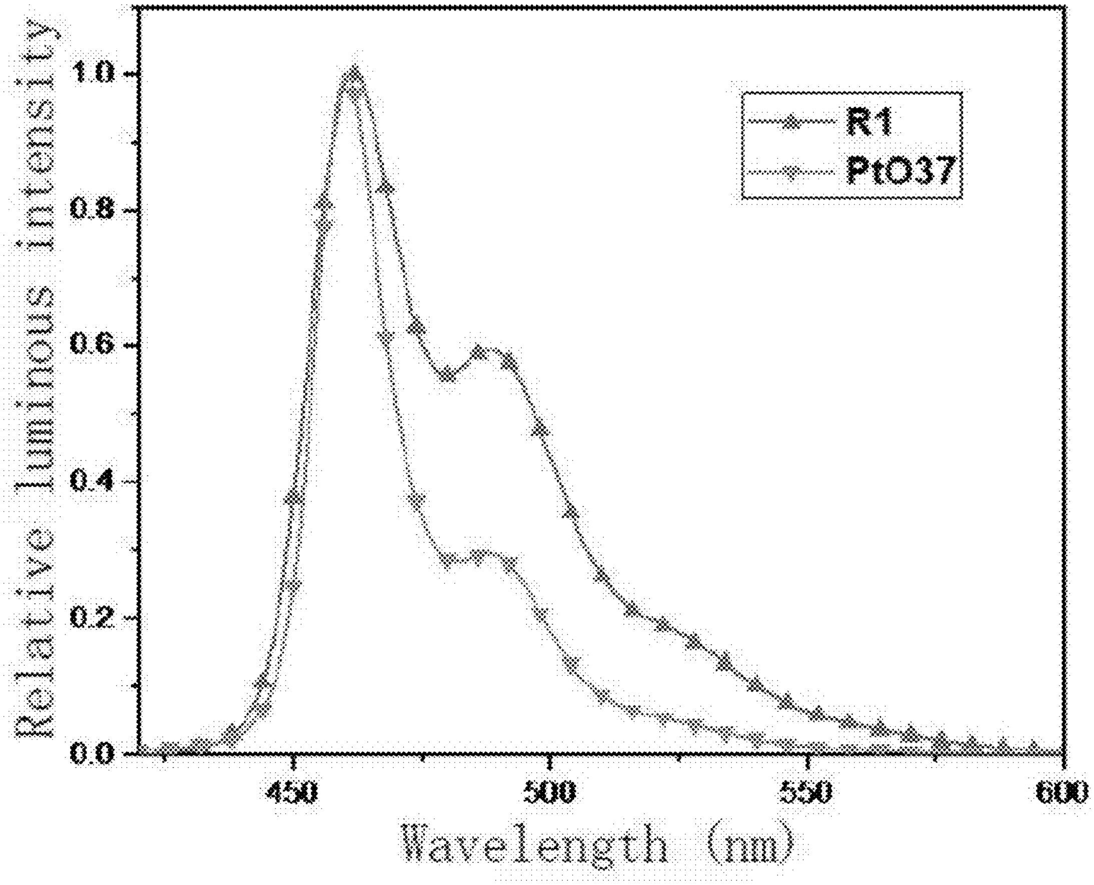
FIG. 6 is a room temperature emission spectrum of R1 and PtO37 in a dichloromethane solution.
Figure 7:
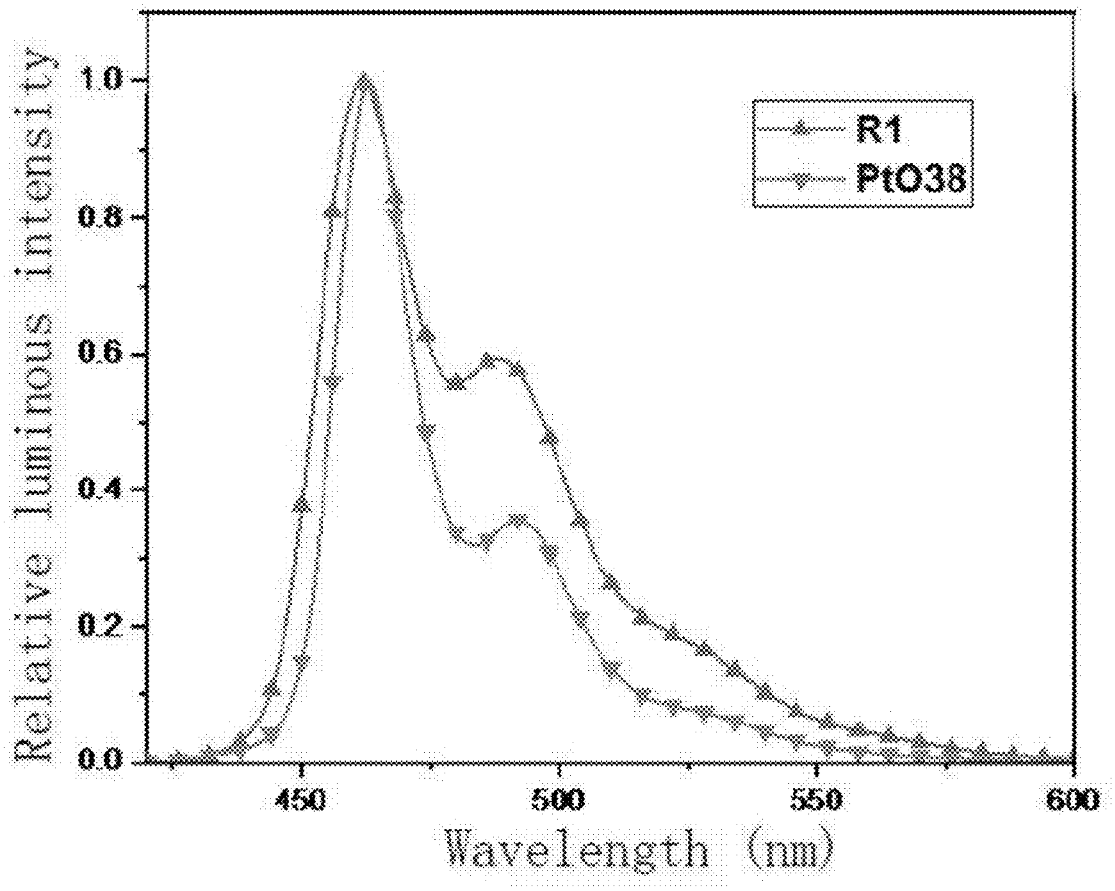
FIG. 7 is a room temperature emission spectrum of R1 and PtO38 in a dichloromethane solution.
Figure 8:
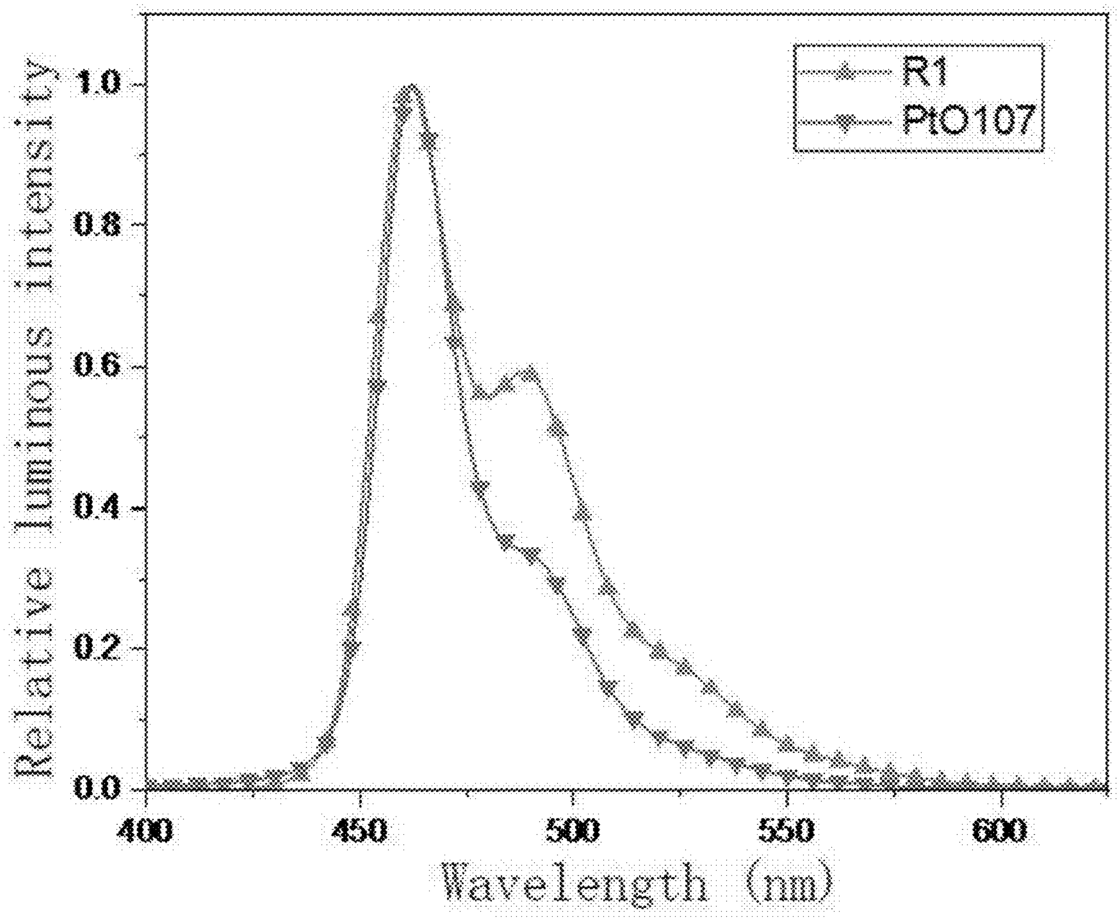
FIG. 8 is a room temperature emission spectrum of R1 and PtO107 in a dichloromethane solution.
Figure 9:
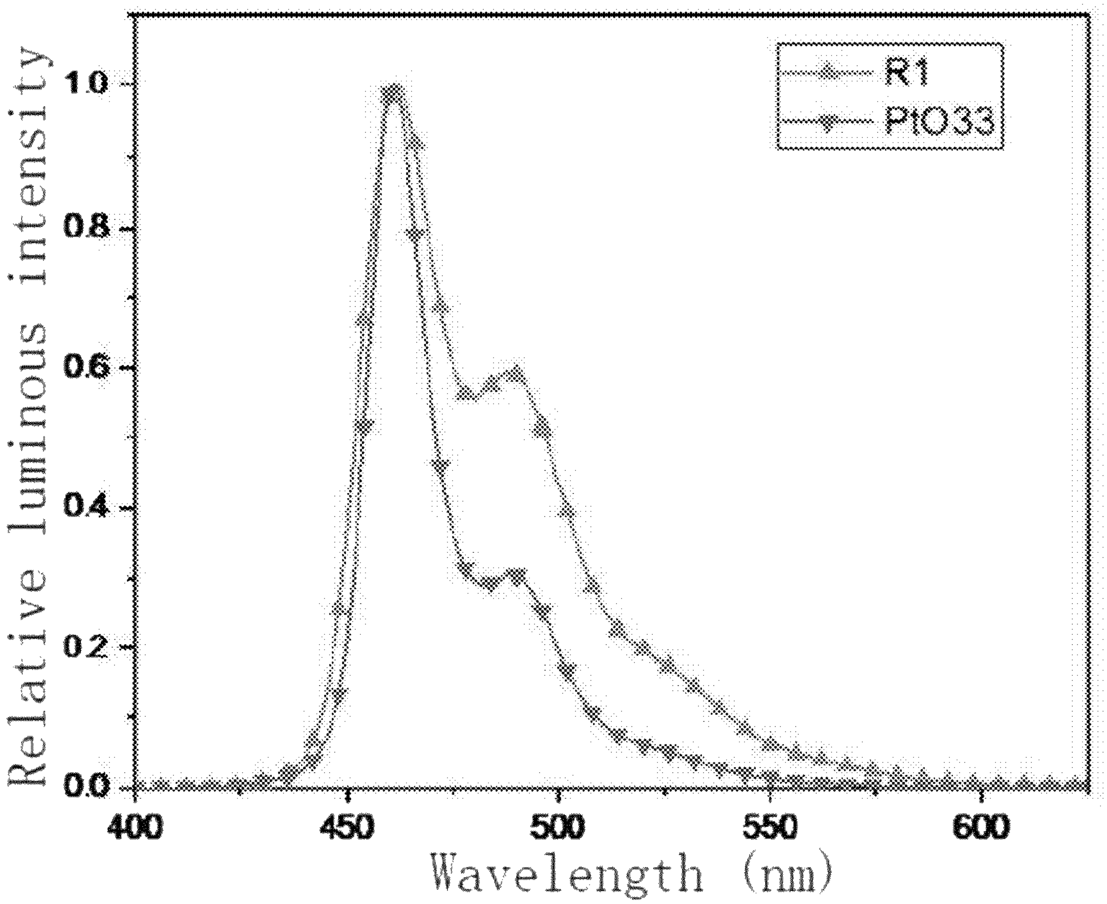
FIG. 9 is a room temperature emission spectrum of R1 and PtO33 in a dichloromethane solution.
Figure 10:
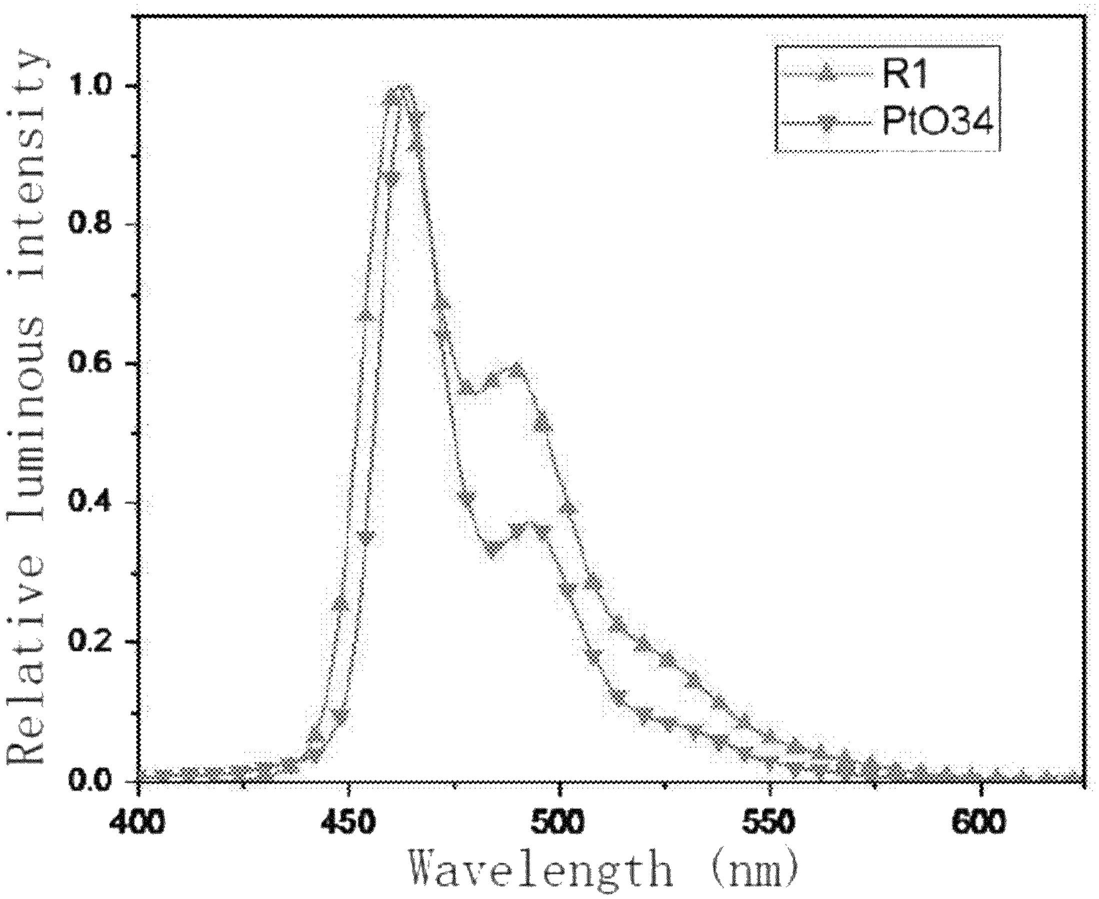
FIG. 10 is a room temperature emission spectrum of R1 and PtO34 in a dichloromethane solution.
Figure 11:
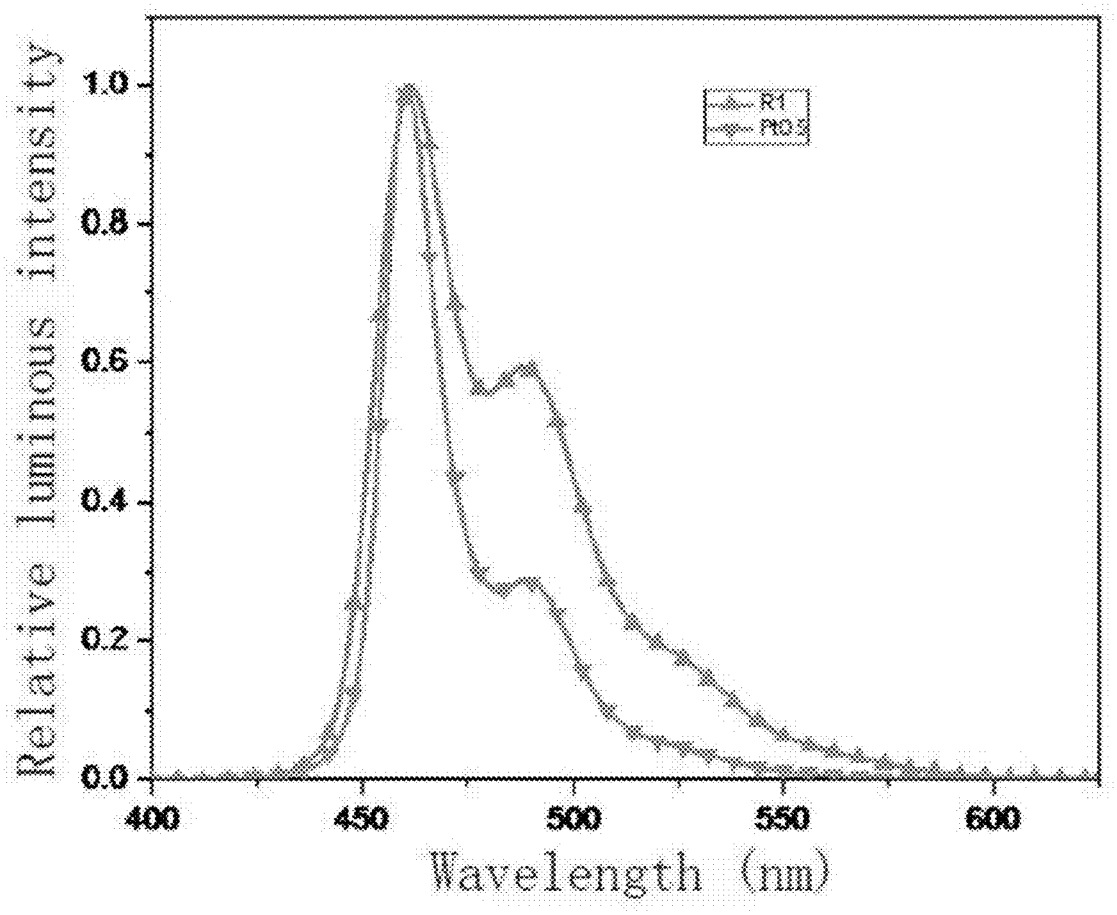
FIG. 11 is a room temperature emission spectrum of R1 and PtO5 in a dichloromethane solution.
Figure 12:
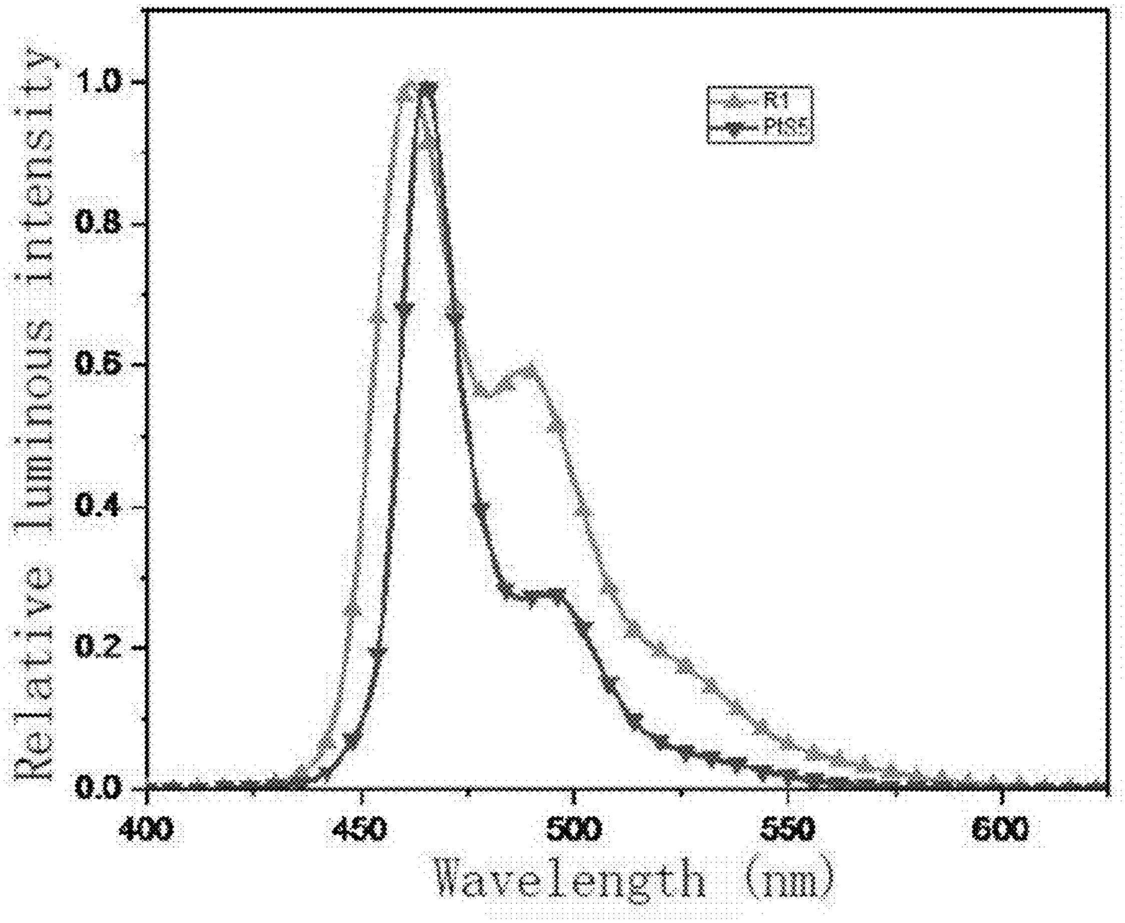
FIG. 12 is a room temperature emission spectrum of R1 and PtS5 in a dichloromethane solution.
Figure 13:
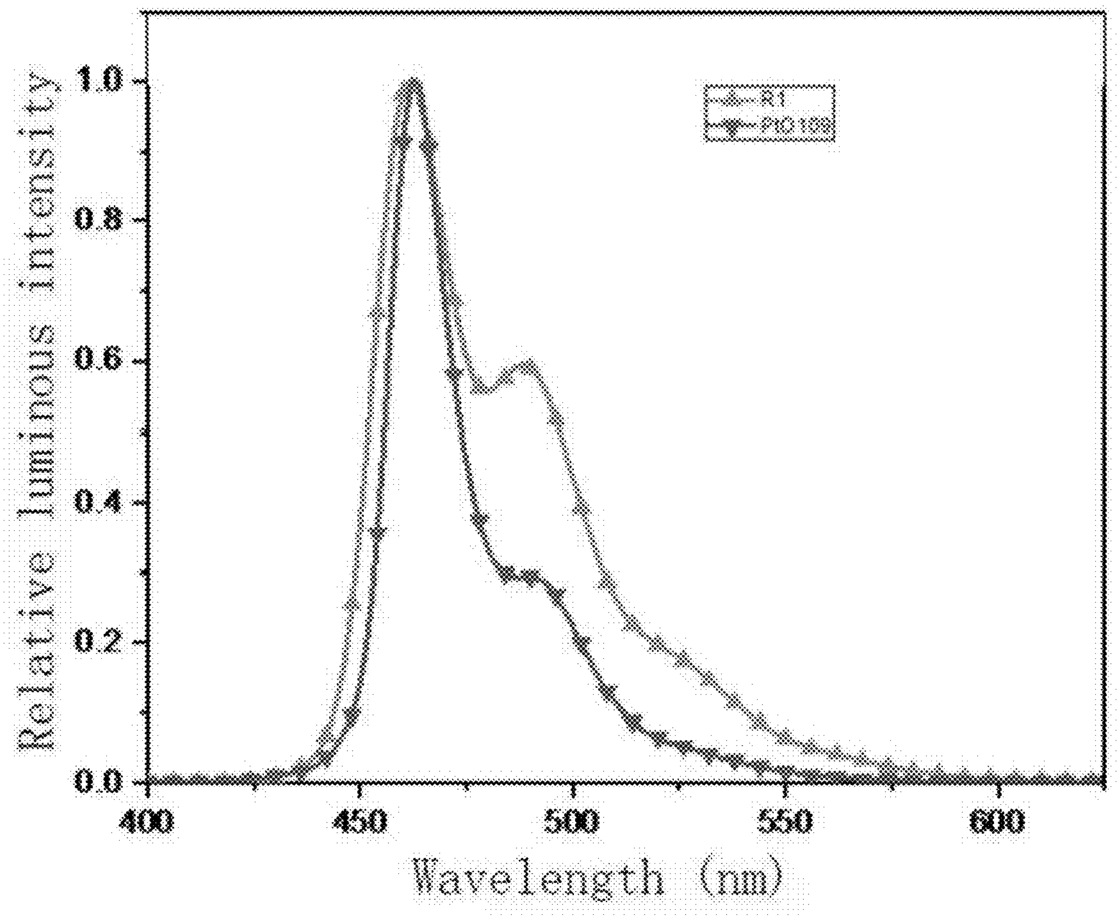
FIG. 13 is a room temperature emission spectrum of R1 and PtO109 in a dichloromethane solution.

FIGS. 1-13 show room temperature emission spectra of R1 and some of the compounds of the present invention, respectively, in a dichloromethane solution. From FIGS. 1-13 and Table 2, it can be seen that by the introduction of the fused ring at different positions of carbazole, the complexes provided in the present invention expand the conjugated system and increase the distribution of local excited states, so that the emission shoulder peak becomes significantly lower, the Full Width at Half Maximum becomes narrower and the color purity is higher.

Fabrication of OLED Devices

As a reference preparation method for a device example, the method of the present invention includes: evaporating a p-doped material on the surface or an anode of an ITO glass with a light-emitting area of 2 mm×2 mm or co-evaporating the p-doped material with a hole-injection material at a concentration of 1%-50% to form a hole-injection layer (HIL) of 5-100 nm, a hole-transport layer (HTL) of 5-200 nm, then forming a light emitting layer (EML) of 10-100 nm (which may contain the compound described in the present invention) on the hole-transport layer, and forming an electron transport layer (ETL) of 20-200 nm and a cathode of 50-200 nm. If necessary, an electron-blocking layer (EBL) can be added between the HTL and EML layers, and an electron-injecting layer (EIL) can be added between the ETL and the cathode to fabricate an OLED device. The OLED can be tested by standard methods. The device materials referred to in the present invention may be obtained by known synthetic methods unless otherwise specified.

In a preferred example, the structure of Device Example 1 provided by the present invention was: ITO/P-4 (10 nm)/NPD (60 nm)/HTH-85 (5 nm)/platinum (II) complex: the mass ratio of HTH-85:ETH-45 (25 nm)(PtO6:HTH-85: ETH-45 was 10:60:30)/ETH-5 (5 nm)/ET-14 (40 nm)/LiQ (1 nm)/Al (100 nm).

Device Examples 2-31 and Comparative Example 1 were prepared using a structure similar to Device Example 1, except that PO6 in Device Example 1 was replaced with PtO2, PtO5, PtO27, PtO33, PtO34, PtO37, PtO38, PtO93, PtO107, PtO109, PtS6, PtS2, PtS1, PtS5, PtS27, PtS28, PtS13, PtS17, PtO52, PtO74, PtO88, PtO89, PO140, PtO144, PtO150, PtO158, PtS47, PtS87, PtS93, PtS135, R1, respectively. The comparative examples and each device example prepared above were tested for luminescence characteristics by standard methods, and the data are shown in Table 3. The structural formula of the device involved was as follows: wherein P-4 is HATCN, and ET-14 is BPyTP.

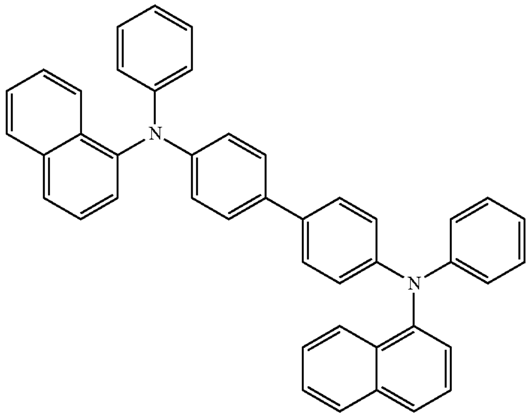

NPD

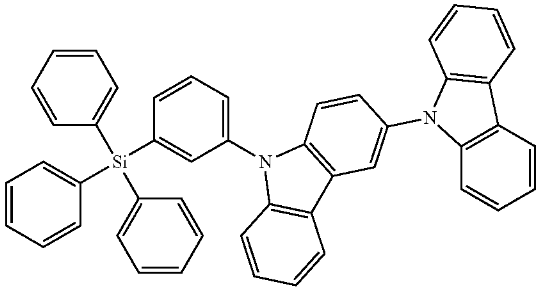

HTH-85

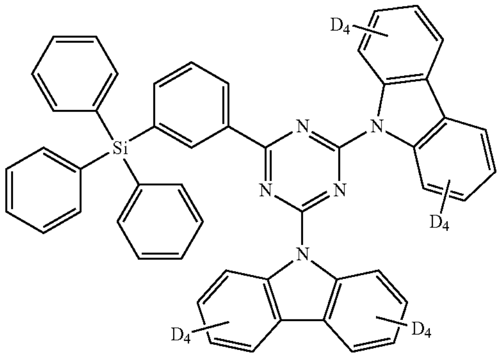

ETH-45

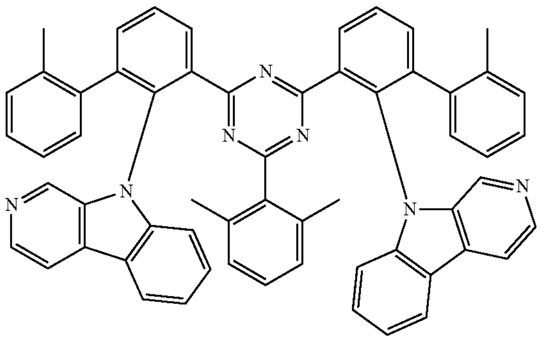

ETH-5

-continued

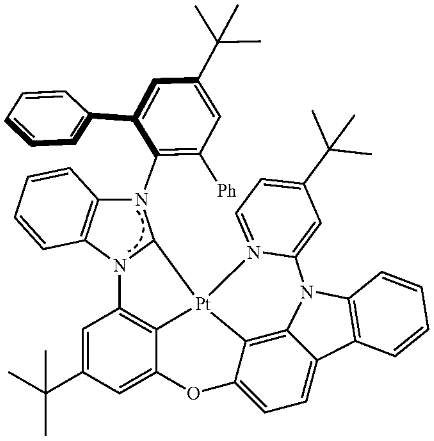

R1

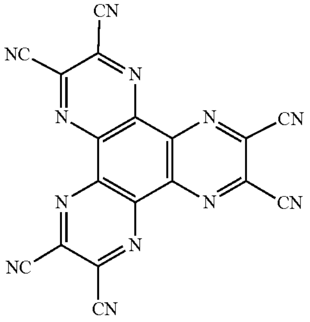

HATCN

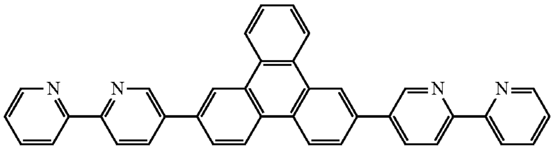

BPyTP

TABLE 3

Device Luminescence Characteristic Data Table

| Example | Compound | Drive Voltage (Volts)@ 10 mA/cm$^2$ (relative, %) | Current Efficiency (cd/A) @1000 cd/m$^2$ (relative, %) | Device Lifetime (h) @1000 cd/m$^2$ (relative, %) |
|---|---|---|---|---|
| Comparative Example 1 | R1 | 100 | 100 | 100 |
| Device Example 1 | PtO6 | 96 | 121 | 121 |
| Device Example 2 | PtO2 | 98 | 123 | 120 |
| Device Example 3 | PtO5 | 97 | 125 | 125 |
| Device Example 4 | PtO27 | 98 | 126 | 128 |
| Device Example 5 | PtO33 | 97 | 120 | 121 |
| Device Example 6 | PtO34 | 96 | 122 | 125 |
| Device Example 7 | PtO37 | 97 | 119 | 122 |
| Device Example 8 | PtO38 | 97 | 127 | 130 |
| Device Example 9 | Pt093 | 95 | 120 | 129 |

TABLE 3-continued

Device Luminescence Characteristic Data Table

| Example | Compound | Drive Voltage (Volts)@ 10 mA/cm$^2$ (relative, %) | Current Efficiency (cd/A) @1000 cd/m$^2$ (relative, %) | Device Lifetime (h) @1000 cd/m$^2$ (relative, %) |
|---|---|---|---|---|
| Device Example 10 | PtO107 | 96 | 125 | 121 |
| Device Example 11 | PtO109 | 97 | 120 | 122 |
| Device Example 12 | PtS6 | 97 | 122 | 124 |
| Device Example 13 | PtS2 | 95 | 131 | 129 |
| Device Example 14 | PtS1 | 96 | 120 | 124 |
| Device Example 15 | PtS5 | 95 | 126 | 132 |
| Device Example 16 | PtS27 | 97 | 124 | 128 |
| Device Example 17 | PtS28 | 96 | 123 | 124 |
| Device Example 18 | PtS13 | 96 | 116 | 120 |
| Device Example 19 | PtS17 | 96 | 127 | 135 |
| Device Example 20 | PtO52 | 96 | 121 | 124 |
| Device Example 21 | PtO74 | 96 | 130 | 135 |
| Device Example 22 | PtO88 | 95 | 127 | 130 |
| Device Example 23 | PtO89 | 97 | 127 | 129 |
| Device Example 24 | PO140 | 97 | 124 | 127 |
| Device Example 25 | PtO144 | 96 | 122 | 125 |
| Device Example 26 | PtO150 | 97 | 126 | 127 |
| Device Example 27 | PtO158 | 96 | 123 | 125 |
| Device Example 28 | PtS47 | 96 | 119 | 122 |
| Device Example 29 | PtS87 | 98 | 121 | 126 |
| Device Example 30 | PtS93 | 96 | 126 | 129 |
| Device Example 31 | PtS135 | 96 | 125 | 127 |

As can be seen from Table 3, Device Examples 1-31 prepared in the present application exhibited good device performance in terms of drive voltage, current efficiency, and device lifetime compared to Comparative Example 1. In addition, the color purity of the device can be greatly improved. The improvement in performance of each device example is based on the fact that the specific compound materials of the present invention have a small emission shoulder peak while having a better electron transport capacity. As can be seen, it is prepared as a light emitting layer material into an electronic device with higher current efficiency, device lifetime, and color purity while reducing the driving voltage. It is shown that the compounds provided by the present invention have certain commercial applications. Furthermore, the devices produced by the present invention are all deep blue devices.

In a preferred embodiment, the structure of Device Example 32 provided by the present invention was: ITO/P-4 (10 nm)/NPD (60 nm)/HTH-85 (5 nm)/platinum (II) complex:Boron-containing compounds:the mass ratio of HTH-85:ETH-45 (25 nm)(PtO6:BN1-8:HTH-85:ETH-45 was 10:1:59:30)/ETH-5 (5 nm)/ET-14 (40 nm)/LiQ (1 nm)/Al (100 nm).

Device Examples 33-39 were each prepared using a structure similar to Device Example 32, except that the platinum (II) complex and the boron-containing compound in Device Example 32 were replaced with the compounds listed in Table 4, respectively. The structural formulas of the devices involved are as follows, and the device structure and luminescence characteristic data are shown in Table 4.

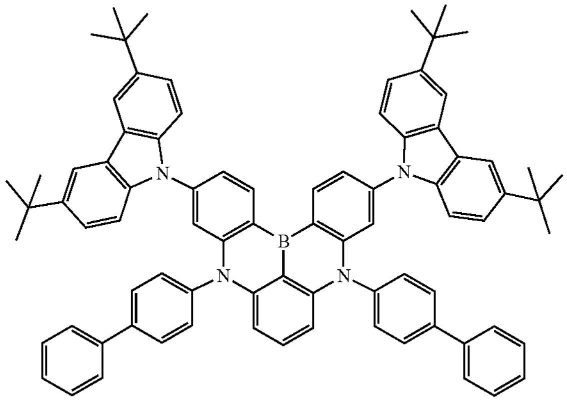

BN1-8

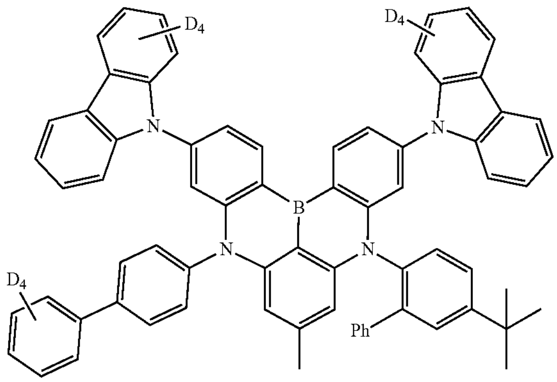

BN1-23

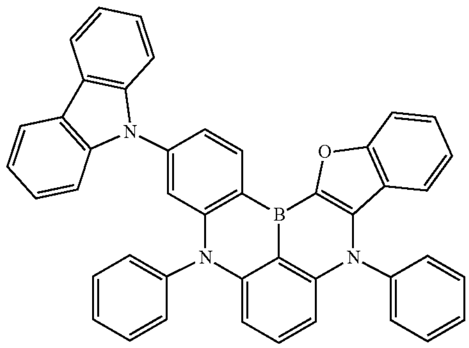

BN2-1

-continued

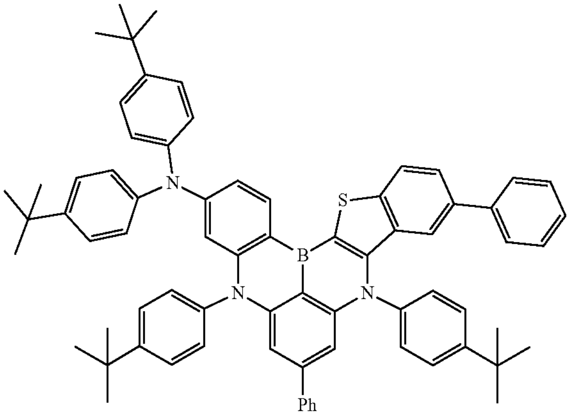

BN2-26

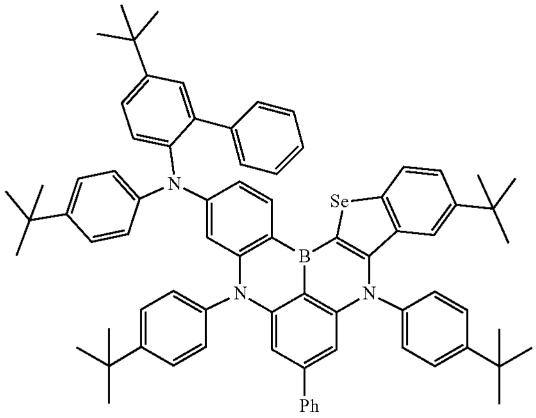

BN2-63

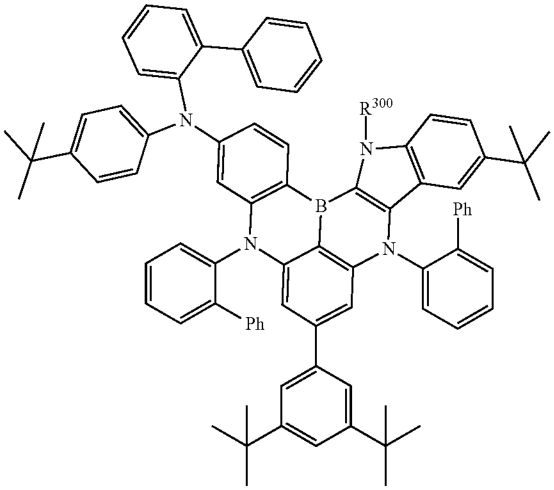

BN2-80

-continued

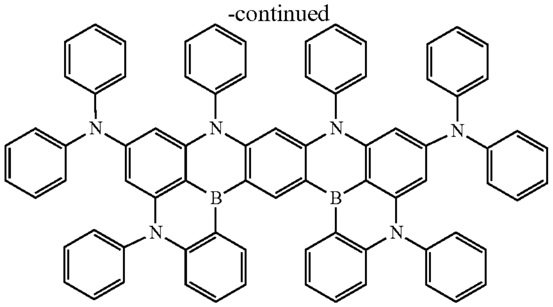

BN3-1

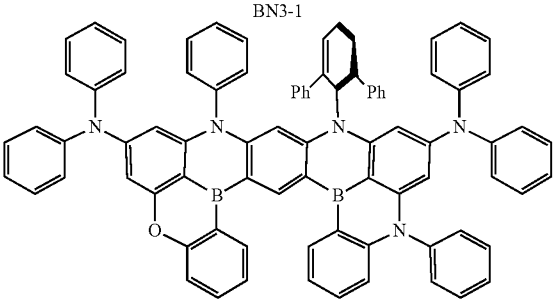

BN3-10

TABLE 4

Device Structure and Luminescence Characteristic Data Table

| Example | Platinum (II) complex: boron-containing compound | Drive Voltage (Volts) @10 mA/cm$^2$ (relative, %) | Current Efficiency (cd/A) @1000 cd/m$^2$ (relative, %) | Device Lifetime (h) @1000 cd/m$^2$ (relative, %) |
|---|---|---|---|---|
| Comparative Example 1 | R1 | 100 | 100 | 100 |
| Device Example 32 | PtO6: BN1-8 | 96 | 118 | 121 |
| Device Example 33 | PtO5: BN1-23 | 95 | 116 | 118 |
| Device Example 34 | PtO33: BN2-1 | 95 | 116 | 121 |
| Device Example 35 | PtO37: BN2-26 | 97 | 115 | 119 |
| Device Example 36 | PtO107: BN2-63 | 96 | 113 | 123 |
| Device Example 37 | PtS1: BN2-80 | 95 | 116 | 122 |
| Device Example 38 | PtS5: BN3-1 | 95 | 117 | 123 |
| Device Example 39 | PtS6: BN3-10 | 96 | 121 | 125 |

As can be seen from Table 4, when the compound of the present invention is use as a sensitizing material together with a boron-containing compound as a light emitting material for devices, the performance of each device can also be significantly improved. It is further shown that the compounds provided by the present invention have certain commercial applications. The addition of boron-containing compounds can further reduce the CIEy value and improve the luminescence color purity of the device.

We also made a top-emitting device D1 for PtO37 and compared it with PtON-TBBI. The device structure used was, ITO/HT-1:P-5 (97:3)/HT-1 (126 nm)/p-host (5 nm)/p-host:ETH-45:PtO37 (60:32:8, 350 nm)/mSiTRz (5 nm)/ET-1:Liq (50:50, 30 nm)/Yb (1 nm)/A (14 nm)/CPL (60 nm); the comparative device D-R1 replaced the PtO37 in the device D1 with PtON-TBBI. The data are shown in Table 5. The structural formula of the device materials involved is as follows:
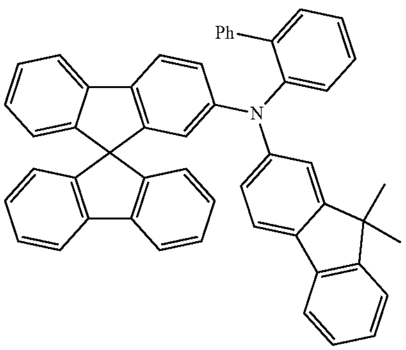
HT-1
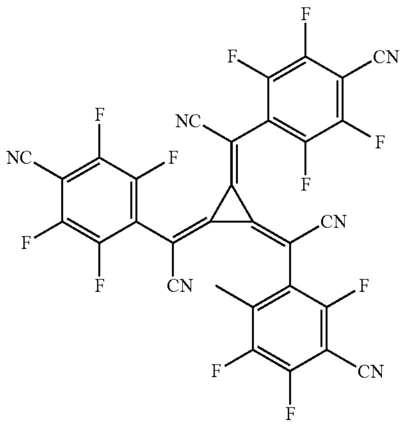
P-5
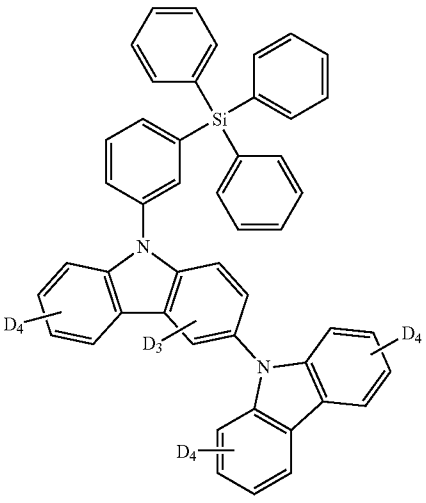
p-host
-continued
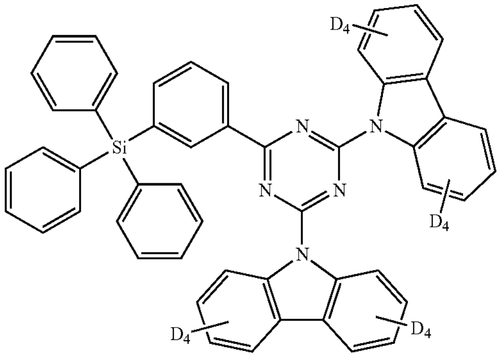
ETH-45
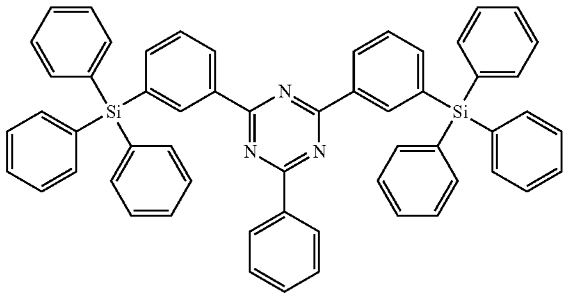
mSiTrz
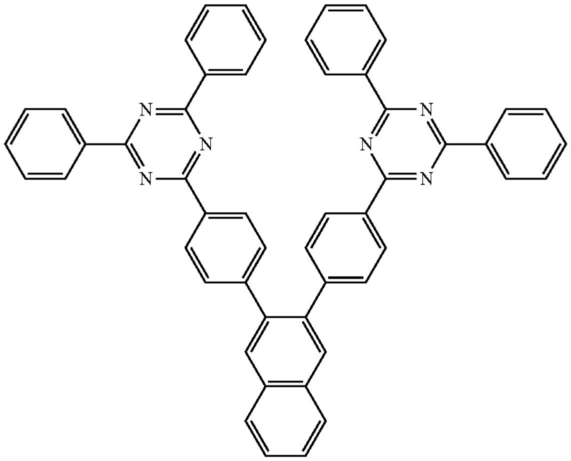
ET-1

-continued

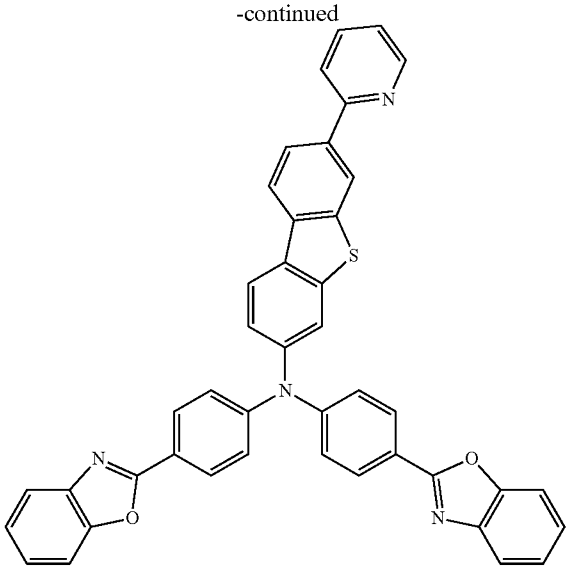

CPL

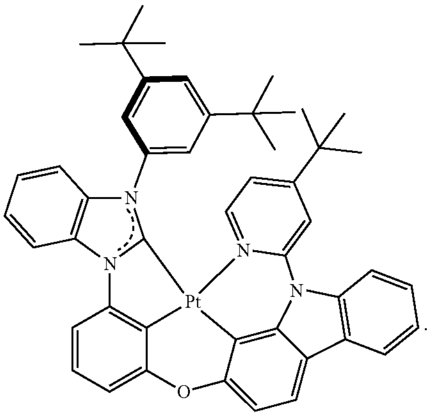

PtON-TBBI

TABLE 5

Top-emitting Device Characteristic Data Sheet

| | Device D1 (PtO37) | Device D-R1 (PtON-TBBI) |
|---|---|---|
| CIE (x, y) | (0.13, 0.06) | (0.14, 0.05) |
| Full Width at Half Maximum (FWHM) | 13.1 nm | 15.2 nm |
| Drive Voltage (Volts)@1000 cd/$m^2$ | 3.9 V | 4.3 V |
| Maximum external quantum efficiency ($EQE_{max}$) | 49.5% | 27.1% |
| External quantum efficiency (EQE)@1000 cd/$m^2$ | 46.4% | 25.0% |
| External quantum efficiency (EQE)@5000 cd/$m^2$ | 39.5% | 20.7% |
| Maximum Blue Light Index (BImax) | 468 | 279 |
| Blue Light Index (BI)@1000 cd/m2 | 438 | 259 |
| Blue Light Index (BI)@5000 cd/m2 | 374 | 214 |
| Device Lifetime LT50 (h)@1000 cd/$m^2$ (relative, %) | 100 | 119 |

As can be seen from Table 5, the application of the compound of the present invention, PtO37, as a deep blue light emitting material, together with PtON-TBBI as a light emitting material on a device can obtain a significant improvement in emission spectrum Full Width at Half Maximum, color purity, external quantum efficiency, blue light index and lifetime; at the same time, the driving voltage at high brightness of 1000 cd/$m^2$ can also be decreased significantly. The above data show that the deep blue light emitting materials of the present invention have great application prospects.

The applicant declares that the above description is only a specific embodiment of the present invention, but the scope of the present invention is not limited thereto, and it should be clear to the person skilled in the art that any changes or substitutions which can be readily thought of by a person skilled in the art within the technical scope of the present invention disclosed herein fall within the scope of the scope and disclosure of the present invention.

What is claimed is:

1. A fused ring carbazole tetradentate metal platinum (II) complex having the general structure shown in formula (I):

(I)

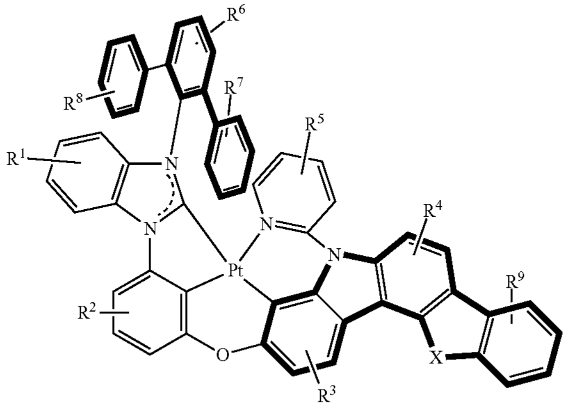

where X is selected from O or S; $R^1$-$R^9$ each independently represent mono- to maximum substitution, or no substitution; $R^1$-$R^9$ are each independently selected from the group consisting of hydrogen, deuterium, halogen, CN, $C_1$-$C_{30}$ alkyl, $C_1$-$C_{30}$ haloalkyl, $C_1$-$C_{30}$ deuterated alkyl, $C_6$-$C_{60}$ aryl, $C_6$-$C_{60}$ arylsilane, and combinations thereof.

2. The fused ring carbazole tetradentate metal platinum (II) complex according to claim 1, wherein $R^1$-$R^9$ are each independently selected from the group consisting of hydrogen, deuterium, $CD_3$, F, $CF_3$, CN, methyl, ethyl, n-propyl, isopropyl, n-butyl, isobutyl, sec-butyl, tert-butyl, n-pentyl, isopentyl, sec-pentyl, tert-pentyl, n-hexyl, isohexyl, sec-hexyl, tert-hexyl, n-heptyl, isoheptyl, sec-heptyl, tert-heptyl, n-octyl, isooctyl, sec-octyl, tert-octyl, n-nonyl, isononyl, sec-nonyl, tert-nonyl, phenyl, biphenyl, triphenylsilane, and combinations thereof.

3. The fused ring carbazole tetradentate metal platinum (II) complex according to claim 1, wherein $R^3$, $R^4$, and $R^9$ are each independently selected from the group consisting of hydrogen, deuterium, F, CN, methyl, isopropyl, tert-butyl, phenyl, and combinations thereof.

4. The fused ring carbazole tetradentate metal platinum (II) complex according to claim 1, wherein $R^6$, $R^7$, and $R^8$ are each independently selected from the group consisting of hydrogen, deuterium, methyl, t-butyl, phenyl, and combinations thereof.

5. The fused ring carbazole tetradentate metal platinum (II) complex according to claim 1, wherein it is selected from any one of the chemical structures shown below, where "D" represents deuterium and Ph represents phenyl:
PtO1
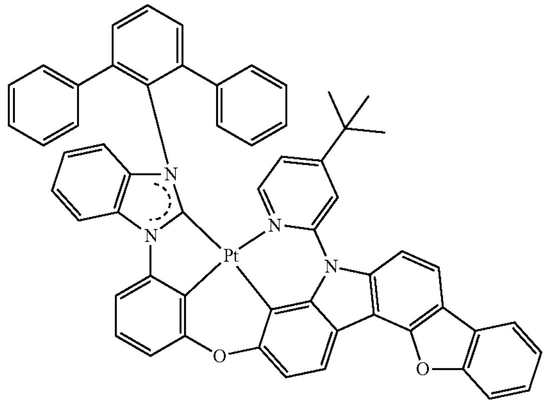
PtO2
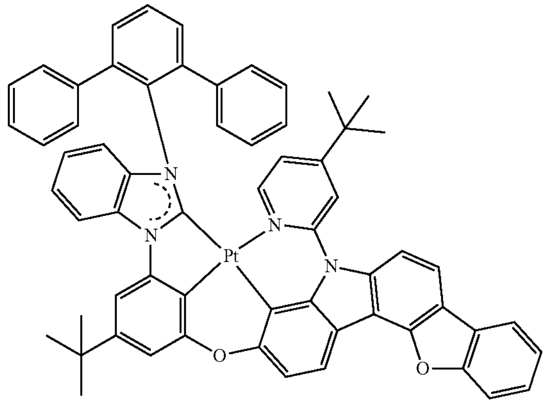
PtO3
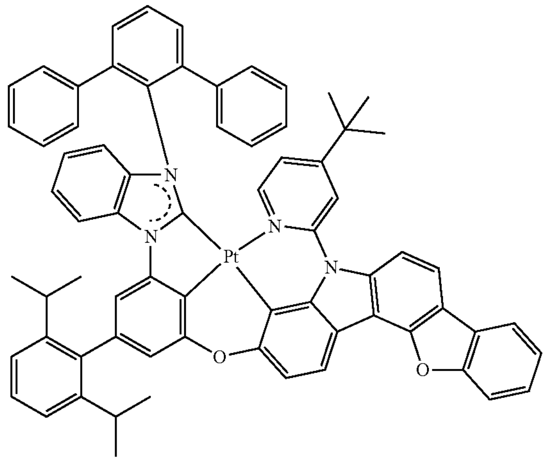
-continued
PtO4
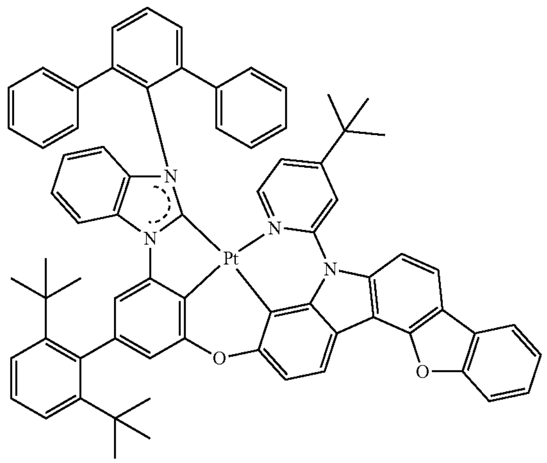
PtO5
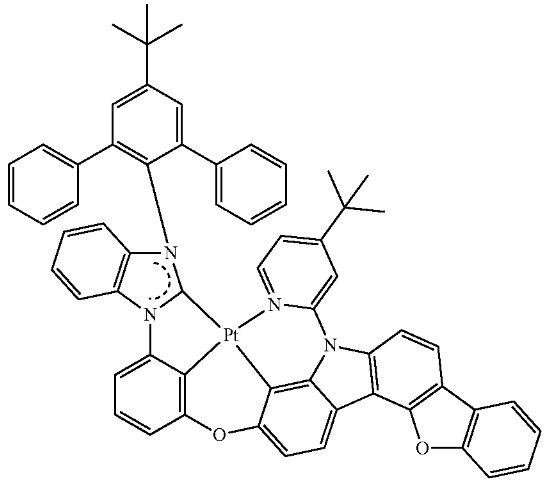
PtO6
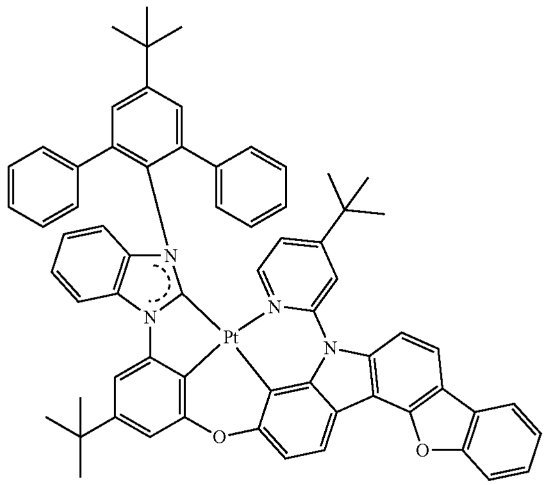

-continued
PtO7
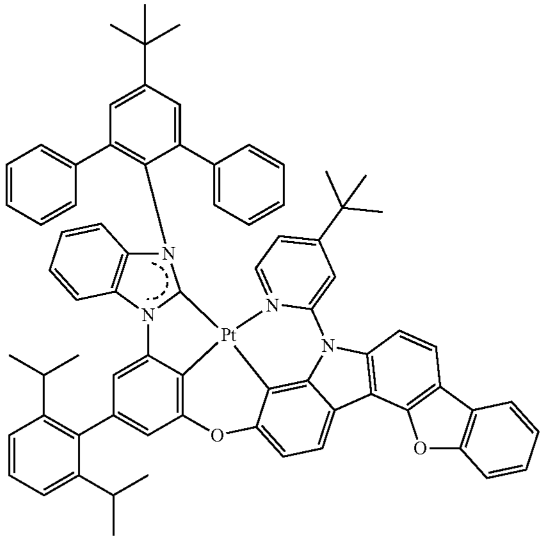
PtO8
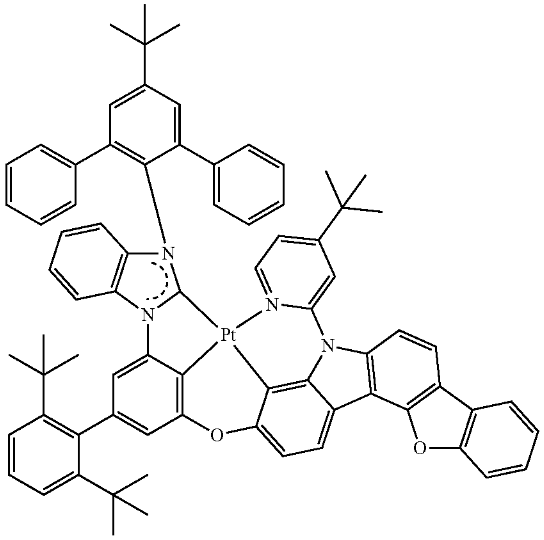
PtO9
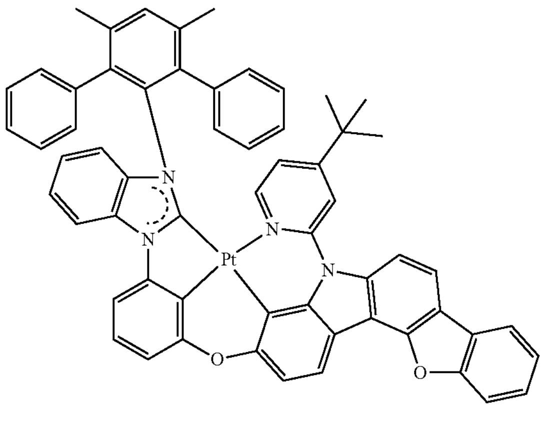
-continued
PtO10
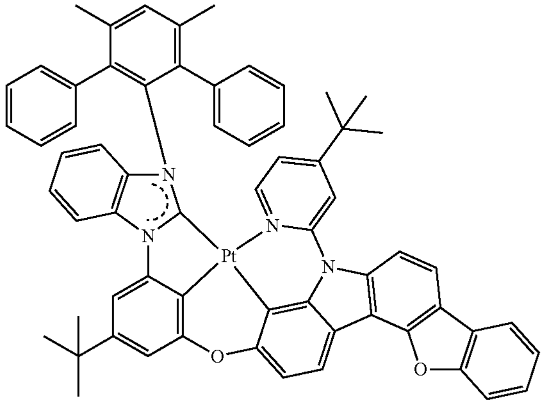
PtO11
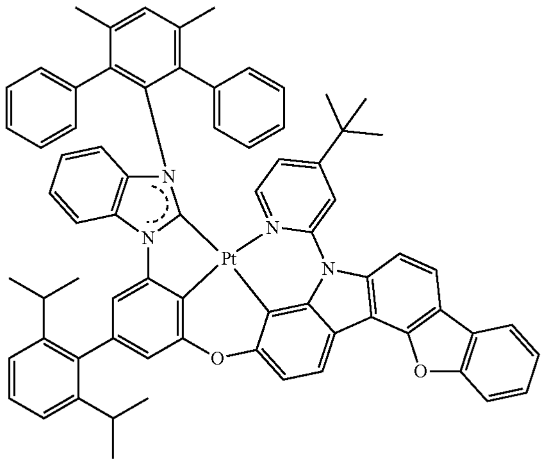
PtO12
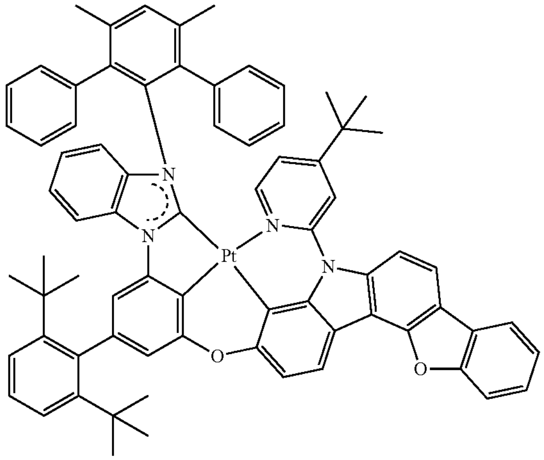

-continued
PtO13
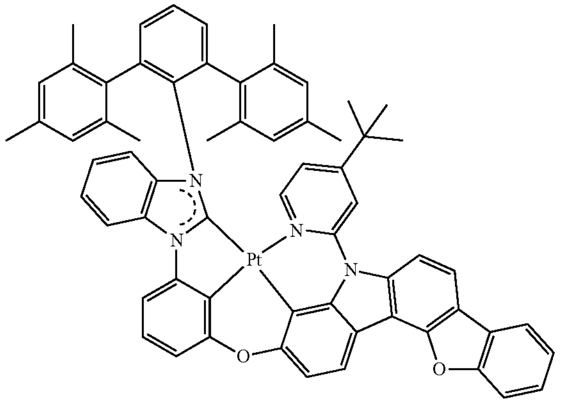
PtO14
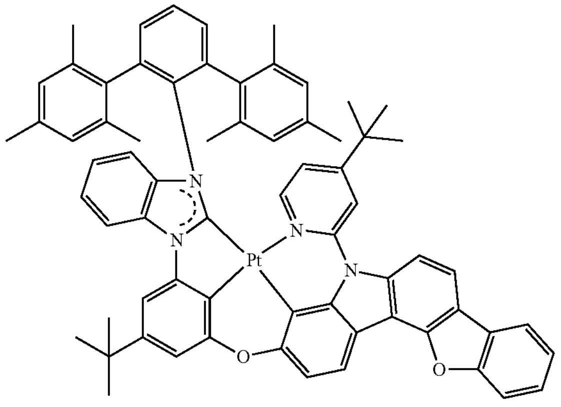
PtO15
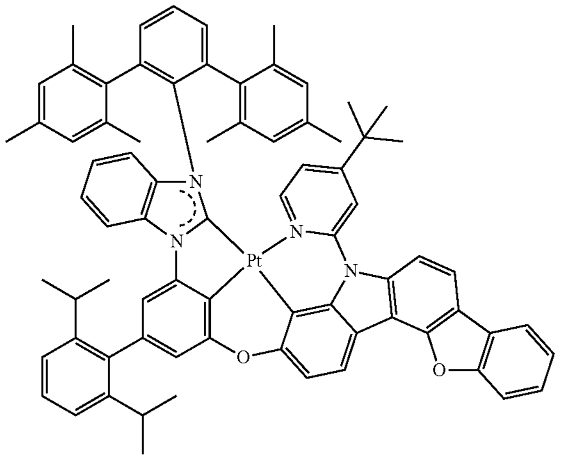
-continued
PtO16
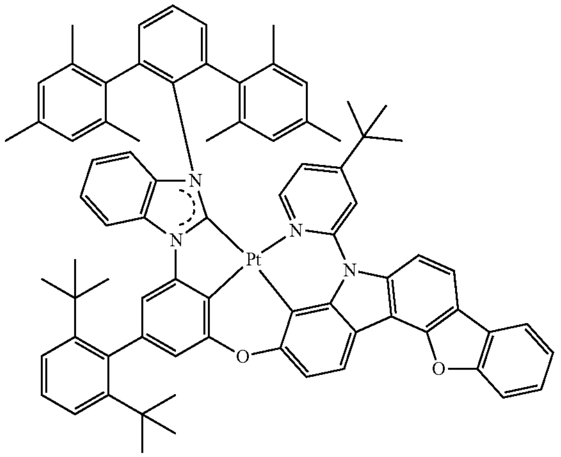
PtO17
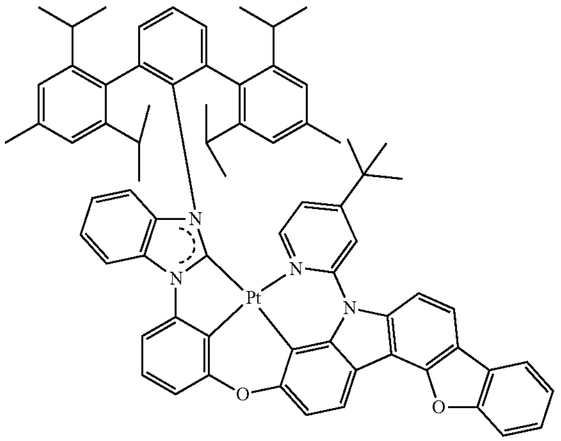
PtO18
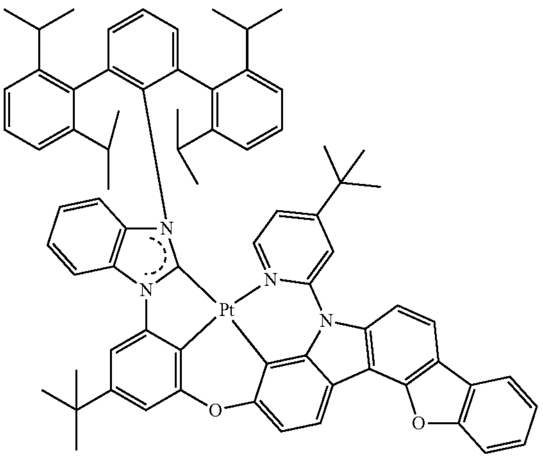

-continued
PtO19
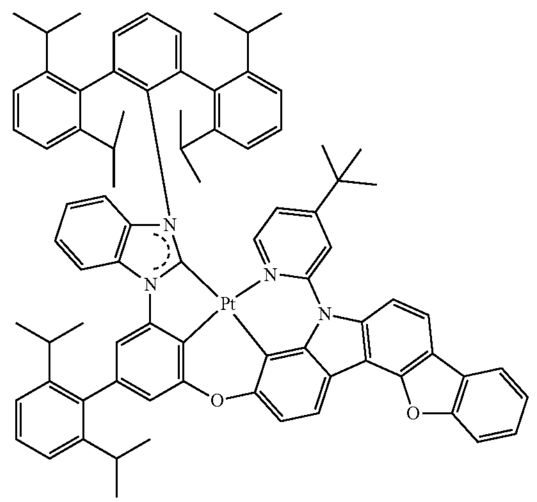
PtO20
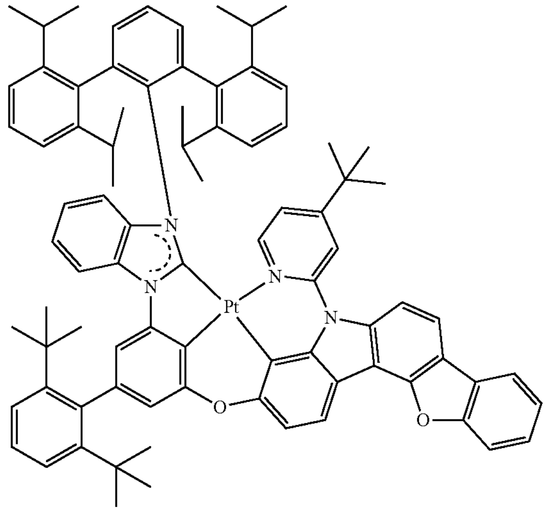
PtO21
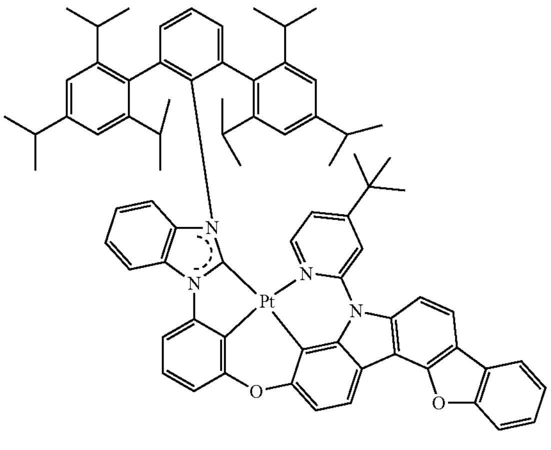
-continued
PtO22
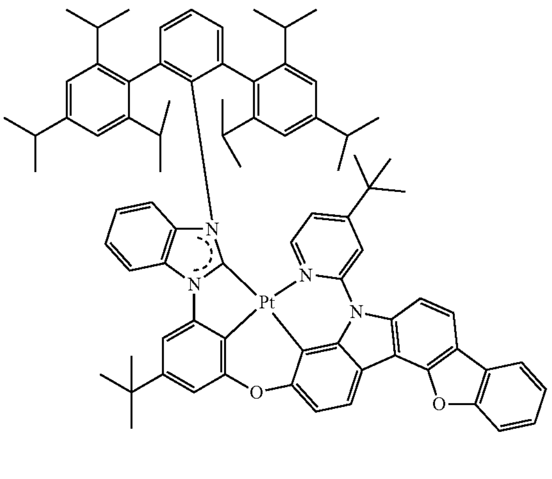
PtO23
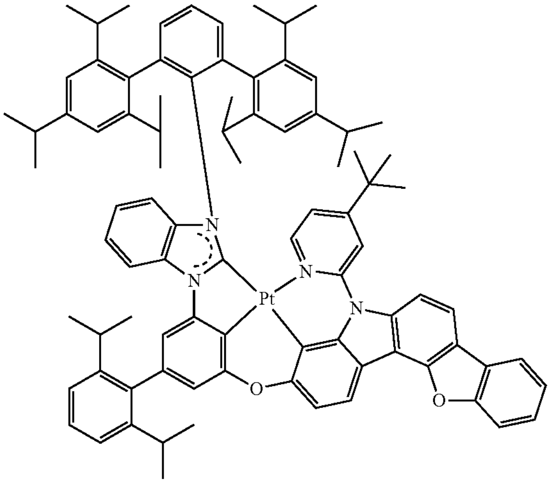
PtO24
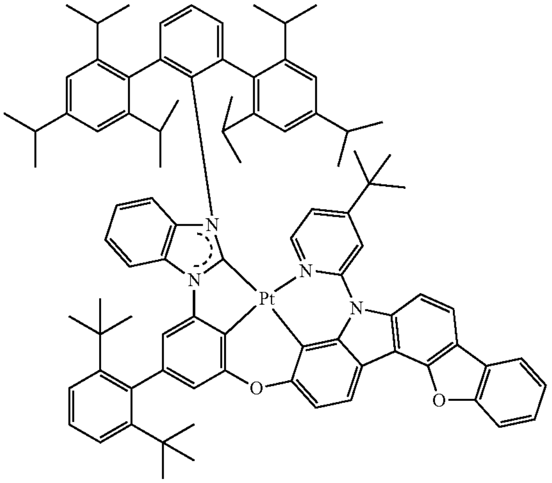

-continued
PtO25
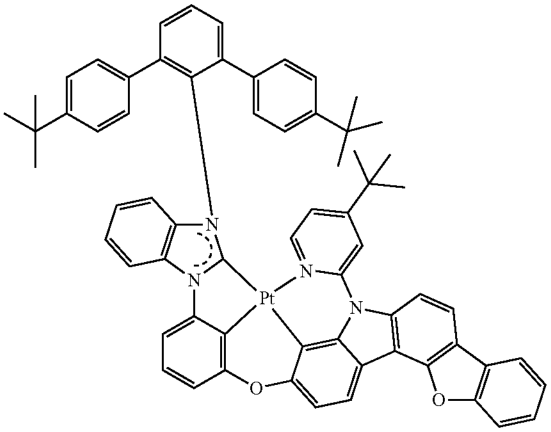
PtO26
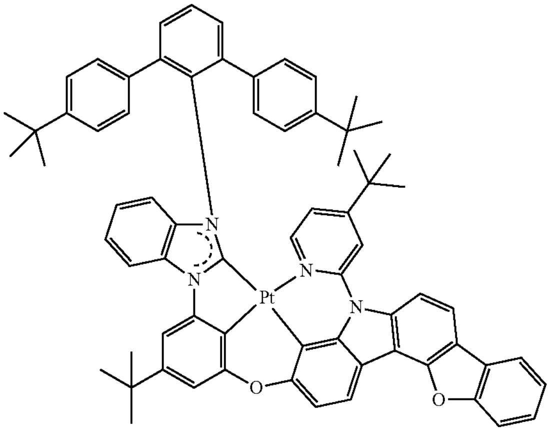
PtO27
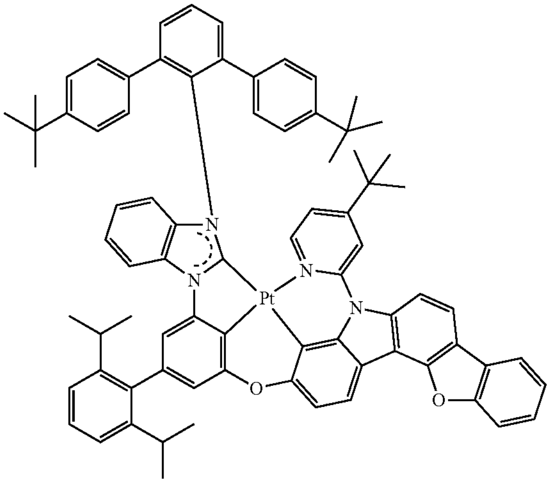
-continued
PtO28
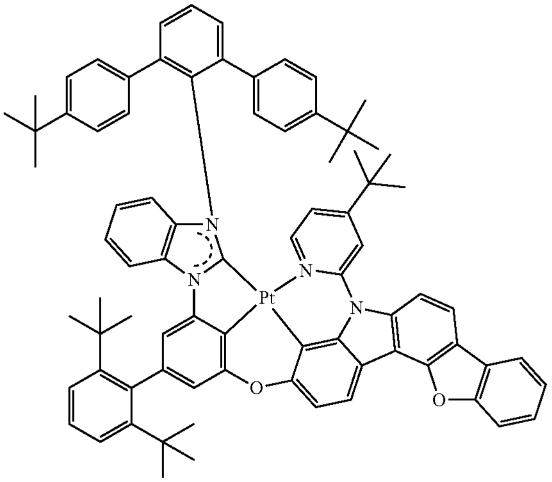
PtO29
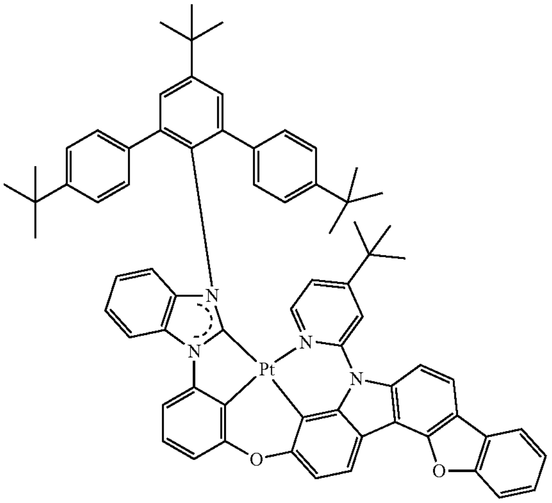
PtO30
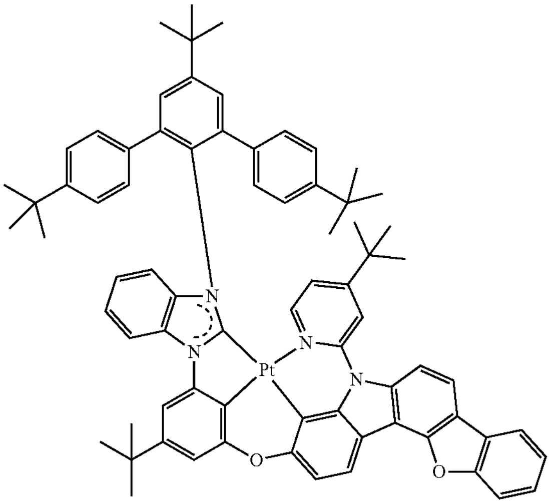

-continued
PtO31
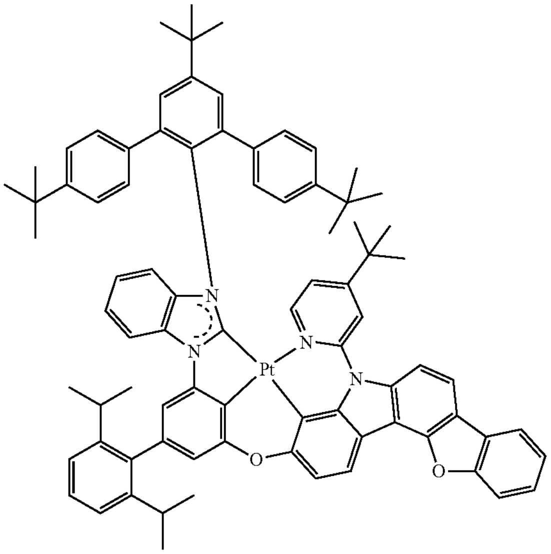
PtO32
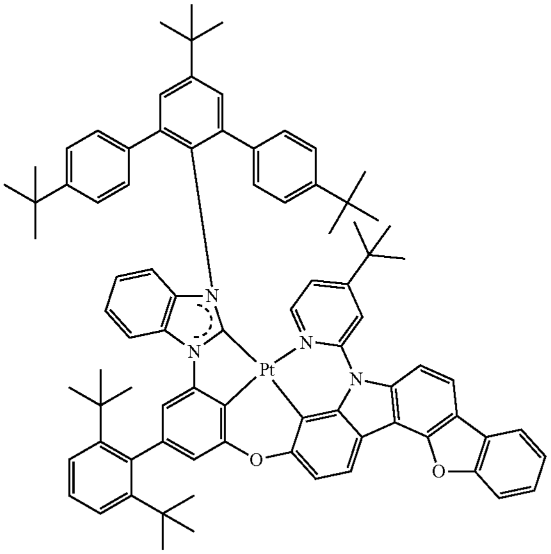
PtO33
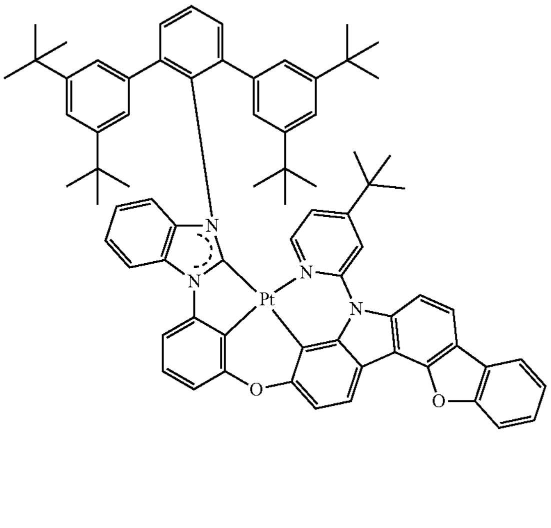
-continued
PtO34
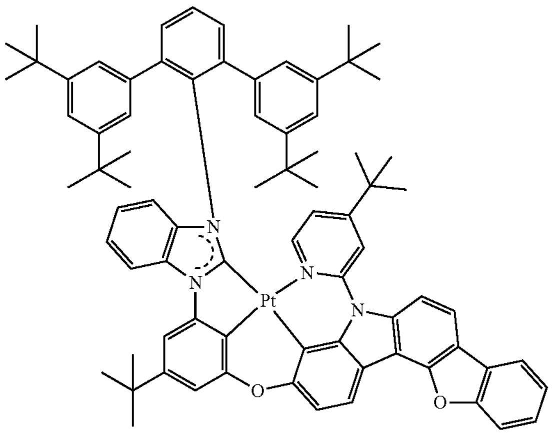
PtO35
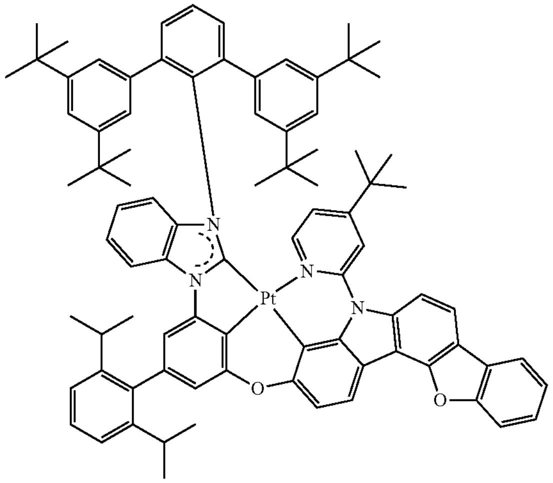
PtO36
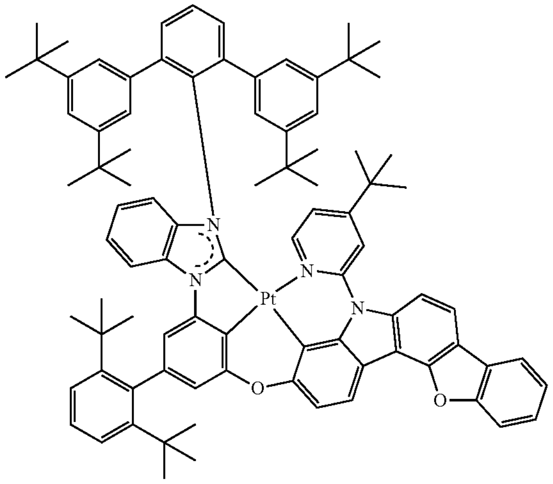

PtO37
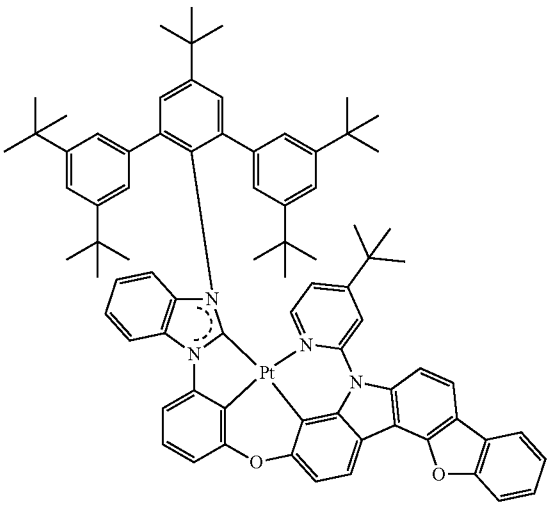
PtO38
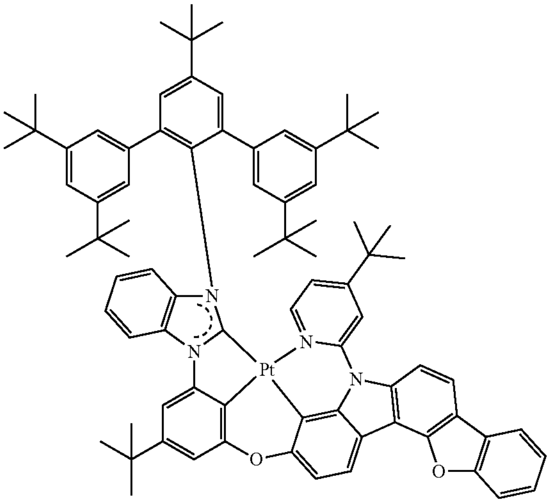
PtO39
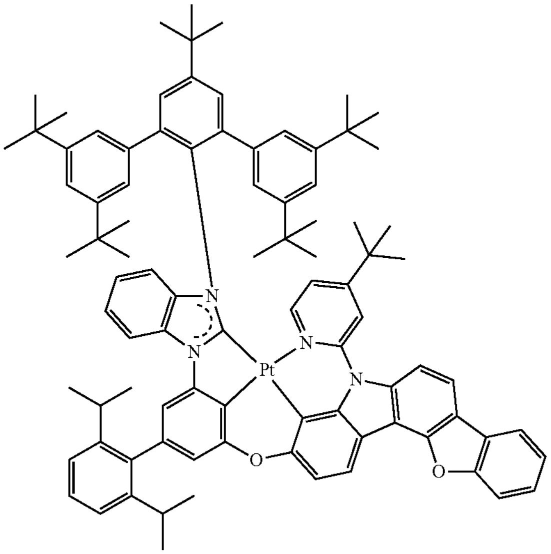
PtO40
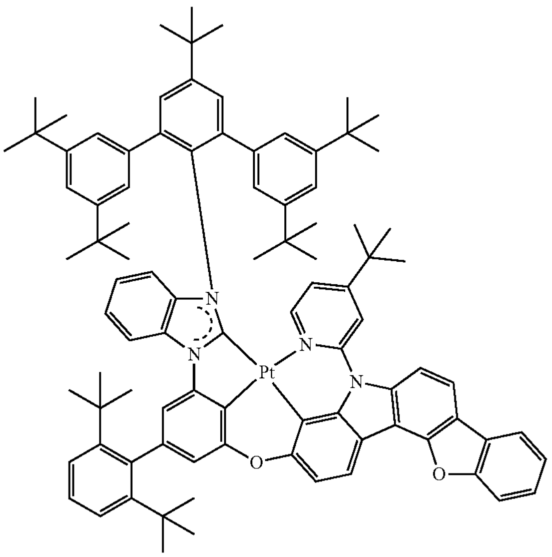
PtO41
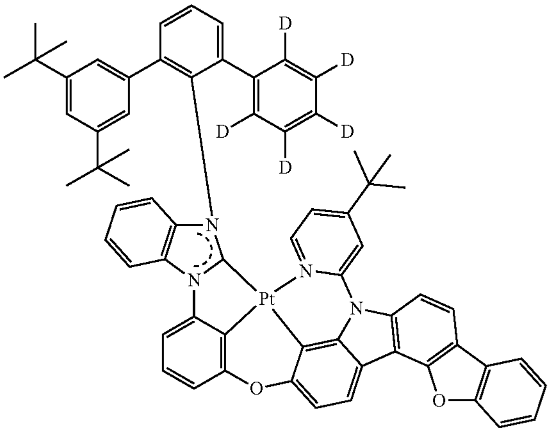
PtO42
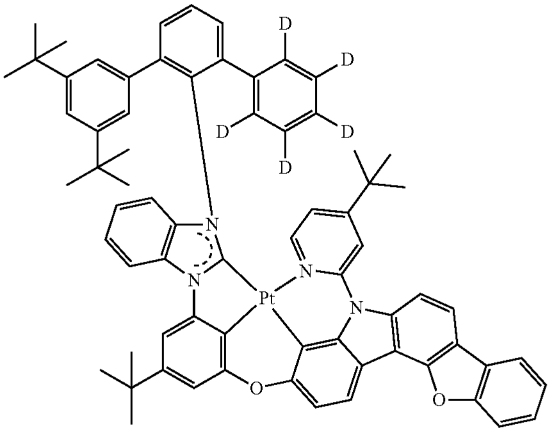

-continued
PtO43
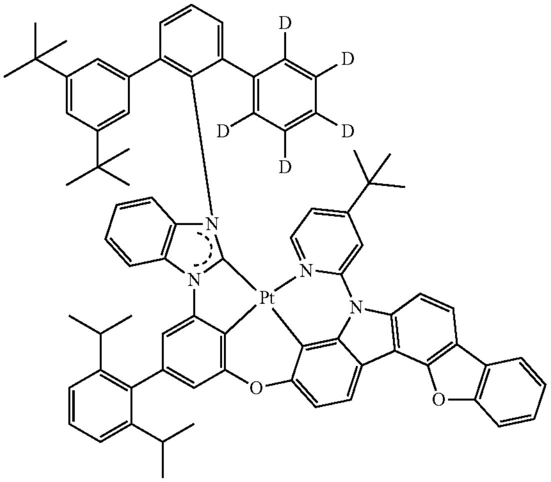
PtO44
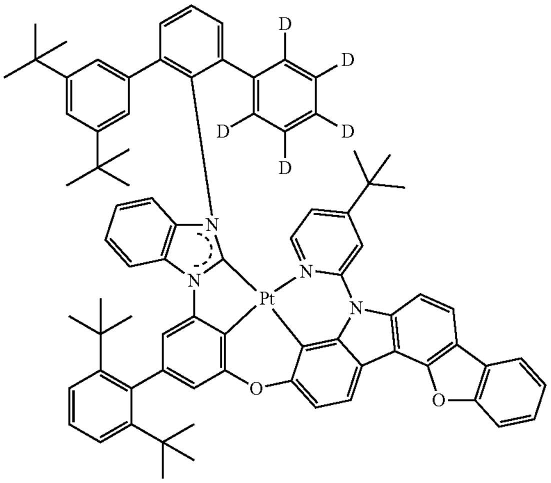
PtO45
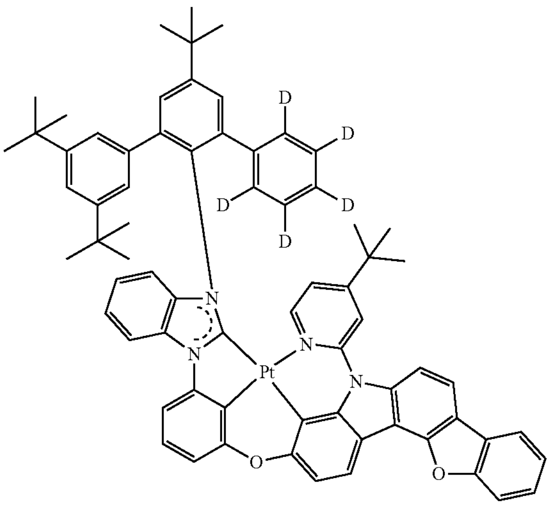
-continued
PtO46
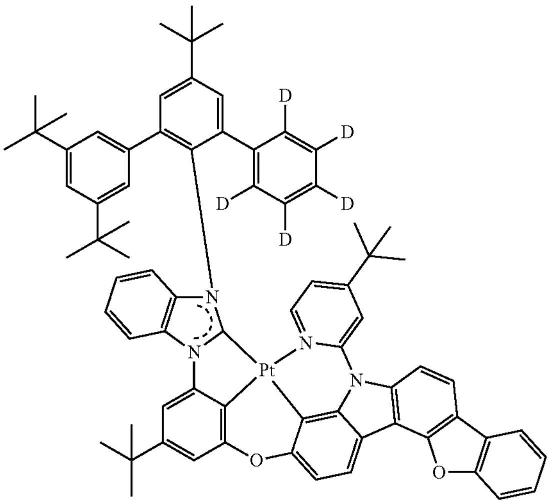
PtO47
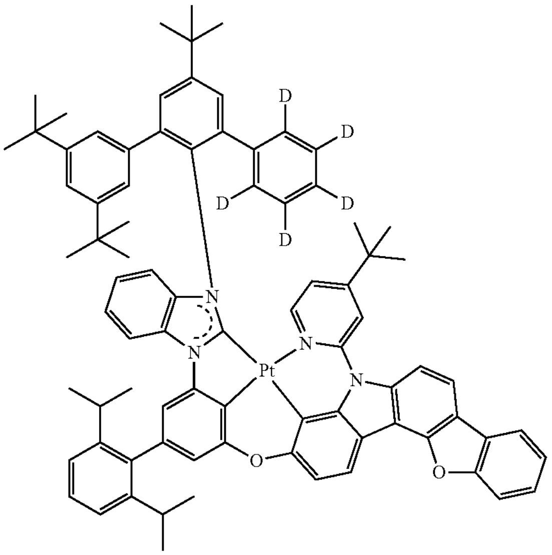

-continued
PtO48
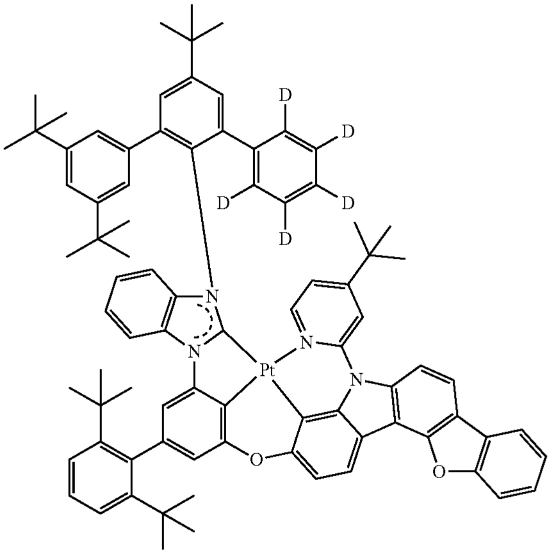
PtO49
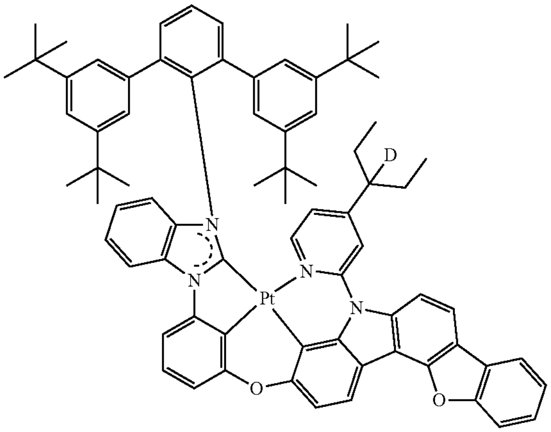
PtO50
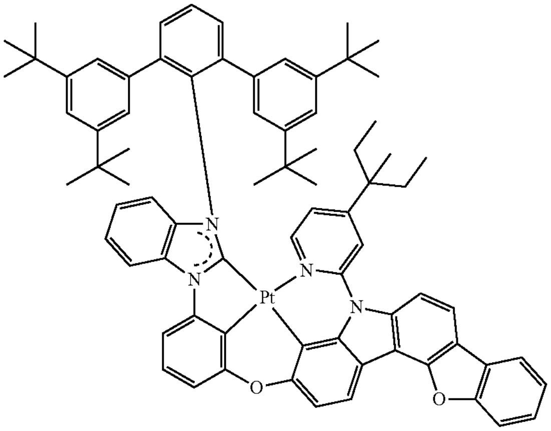
-continued
PtO51
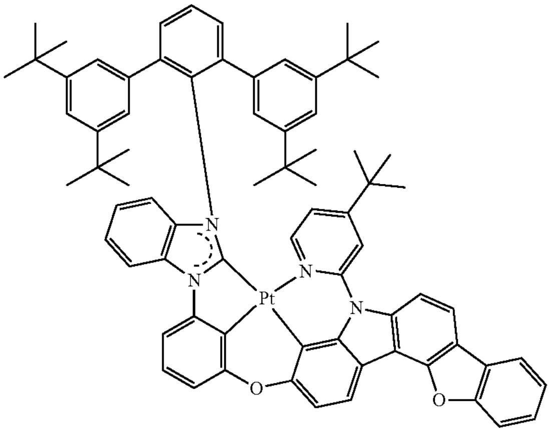
PtO52
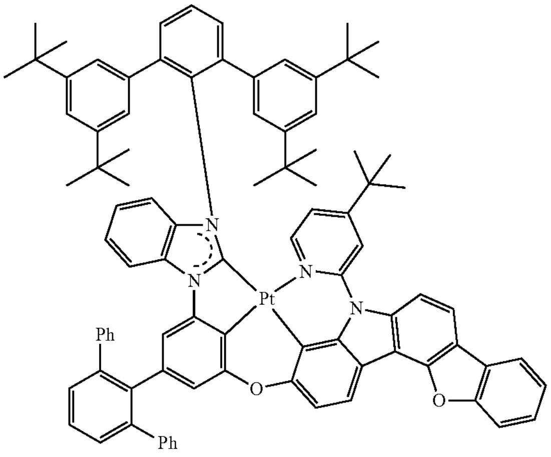
PtO53
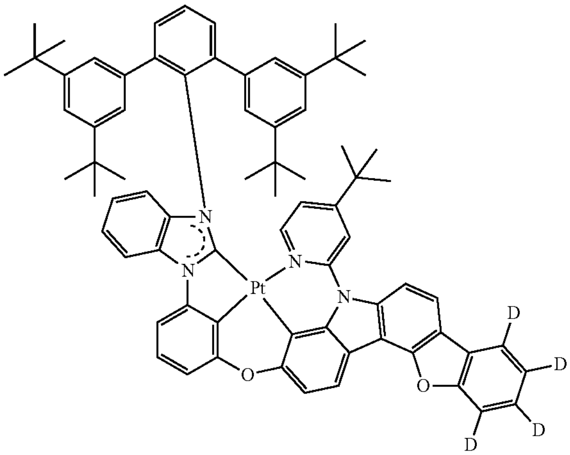

-continued
PtO54
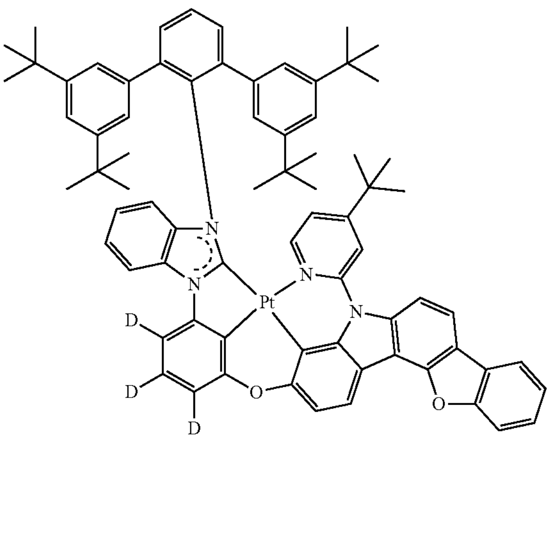
PtO55
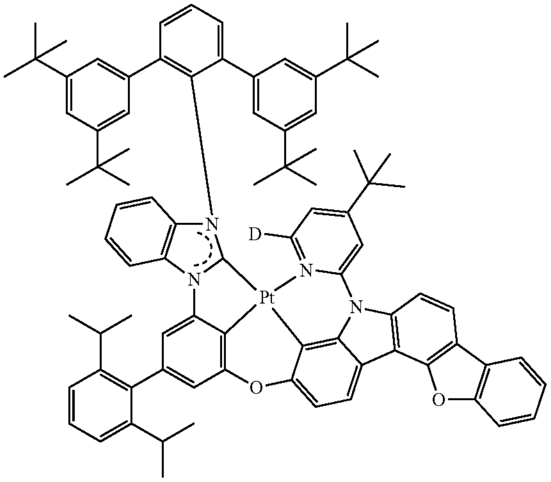
PtO56
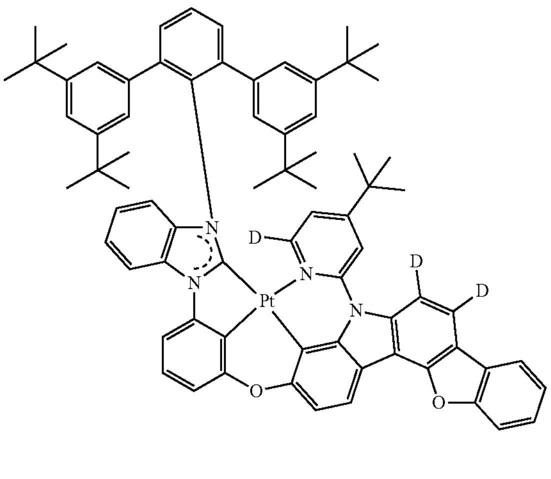
-continued
PtO57
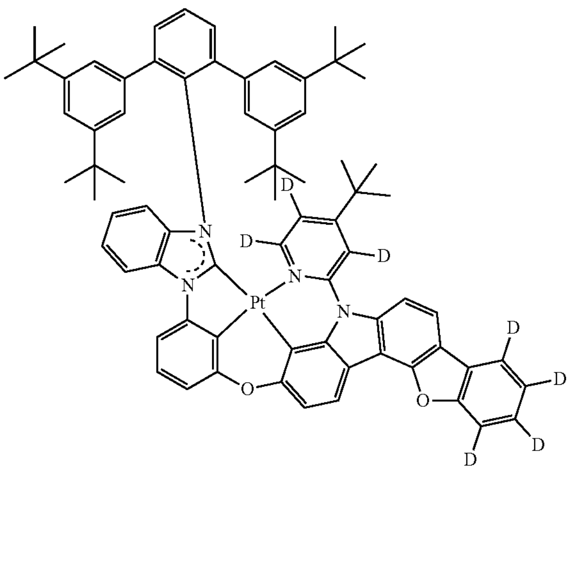
PtO58
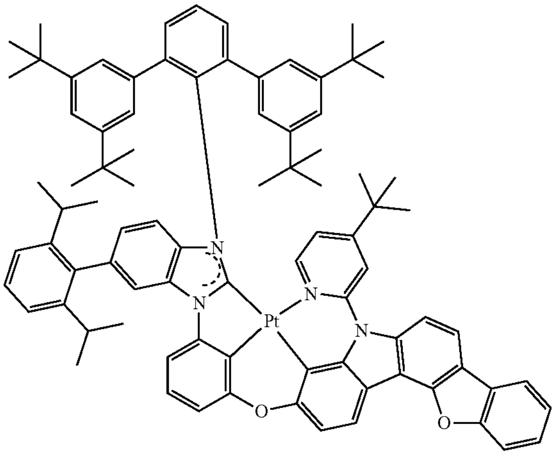
PtO59
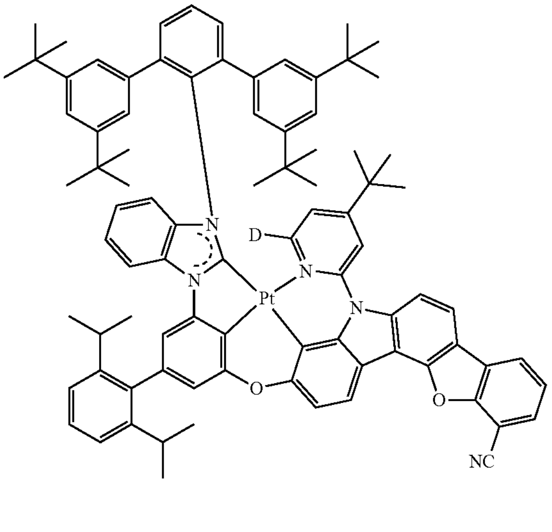

-continued
PtO60
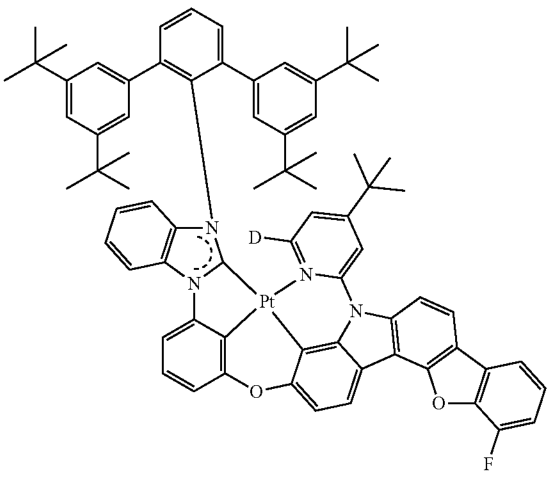
PtO61
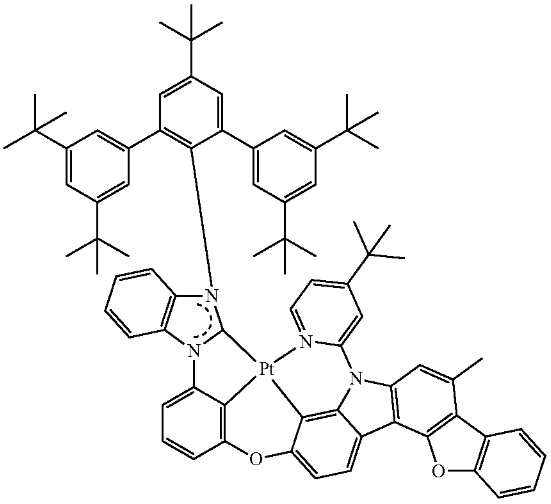
PtO62
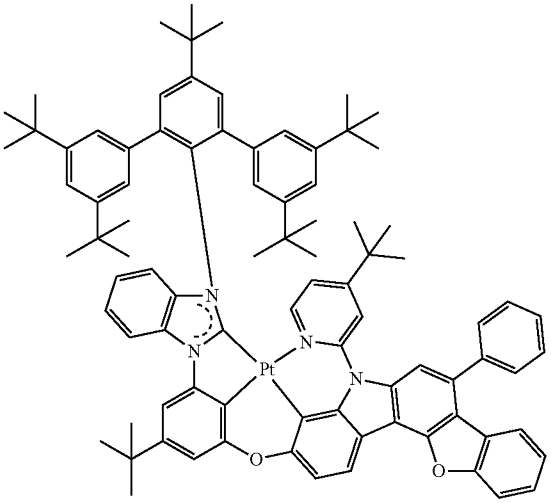
-continued
PtO63
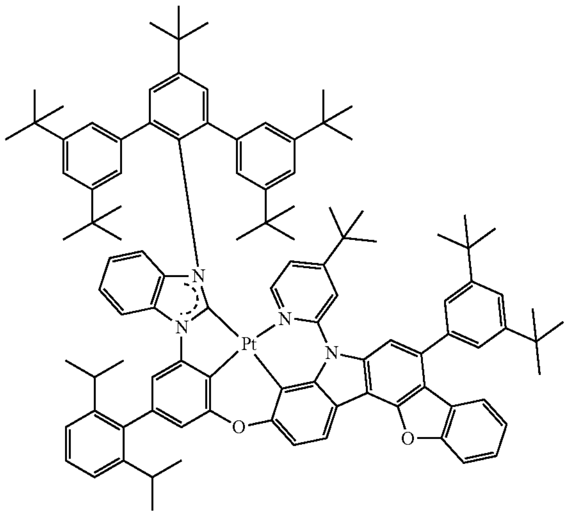
PtO64
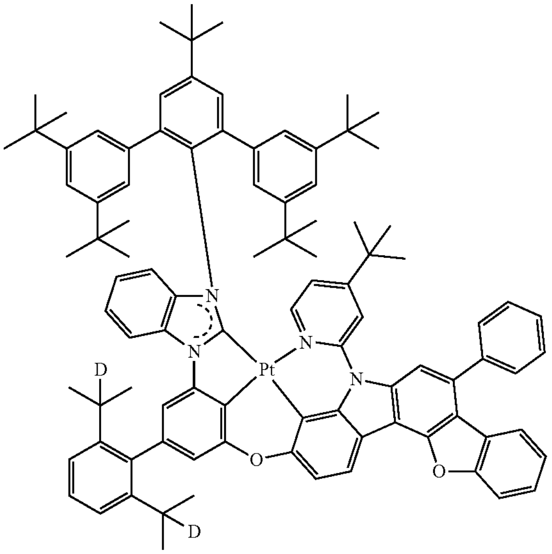
PtO65
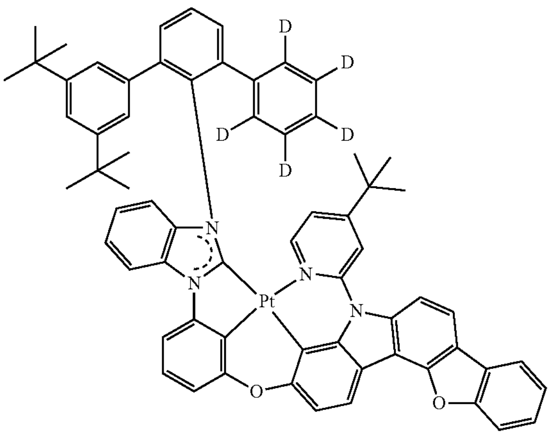

-continued
PtO66
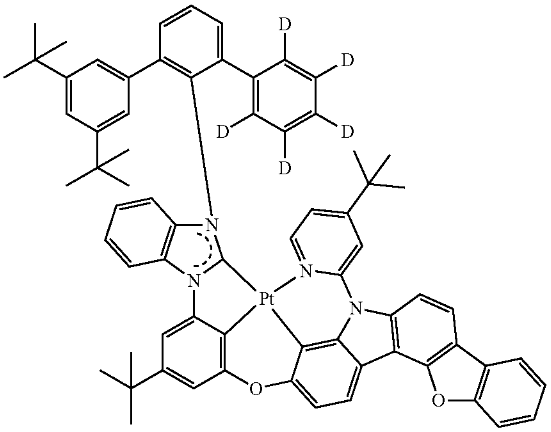
PtO67
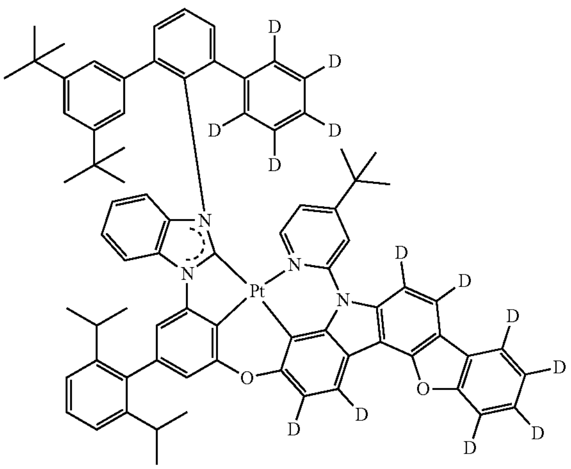
PtO68
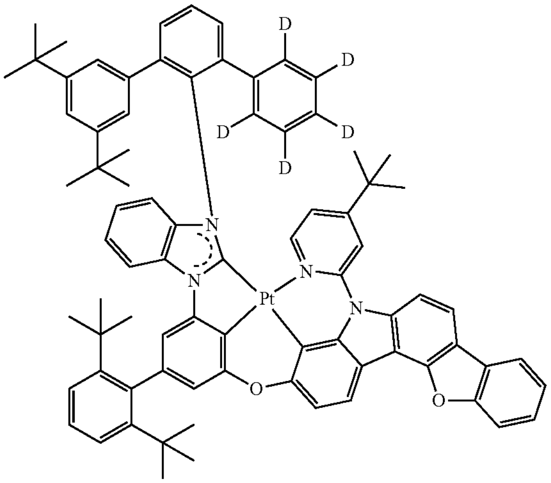
-continued
PtO69
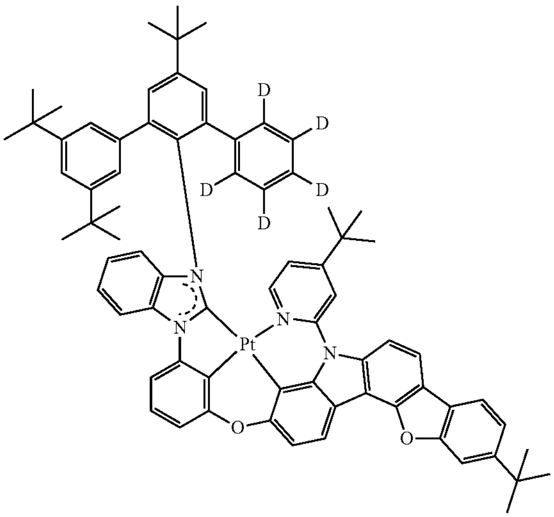
PtO70
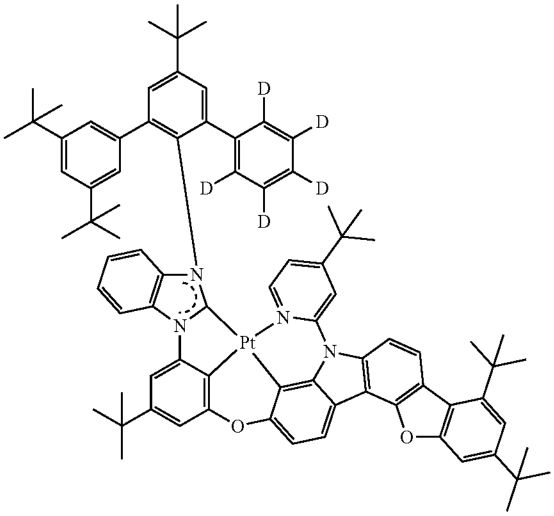
PtO71
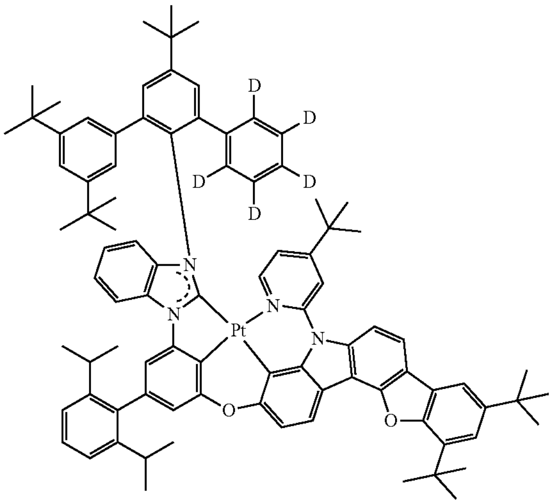

-continued
PtO72
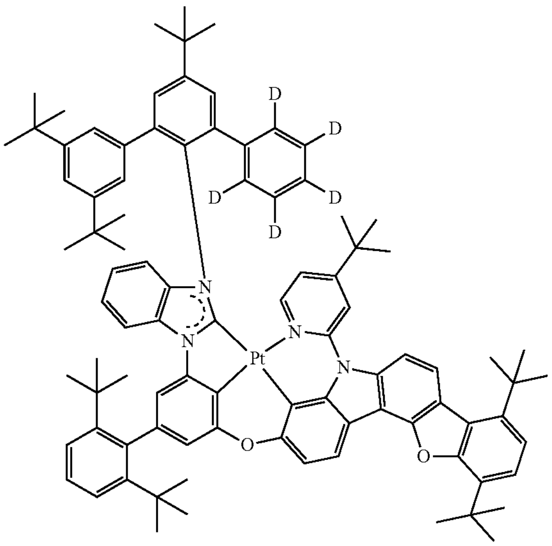
PtO73
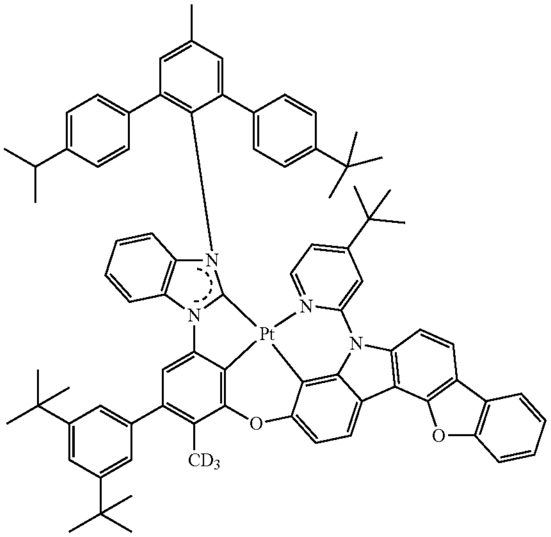
PtO74
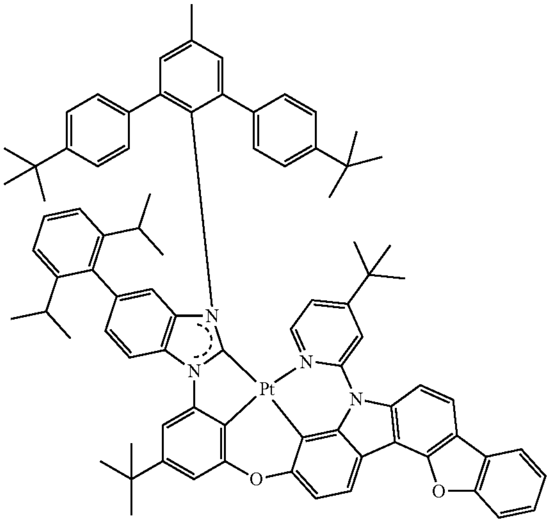
-continued
PtO75
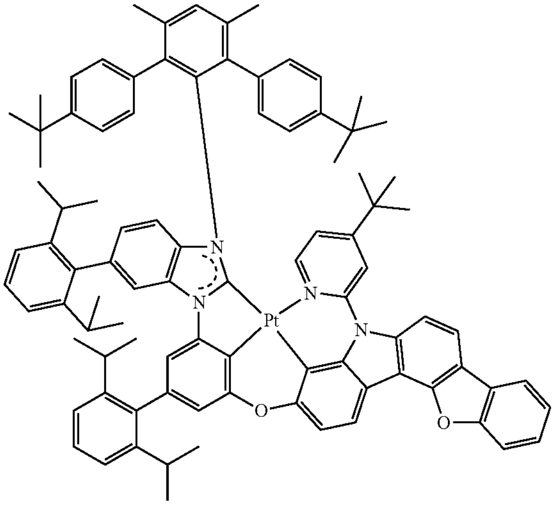
PtO76
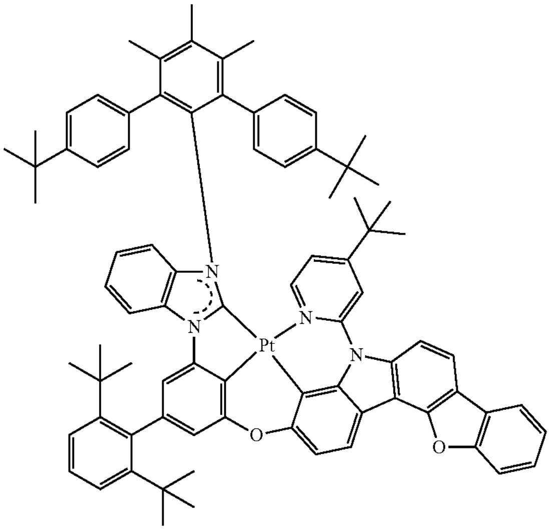
PtO77
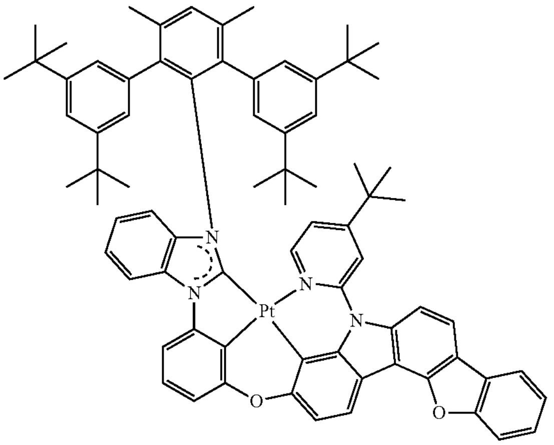

-continued
PtO78
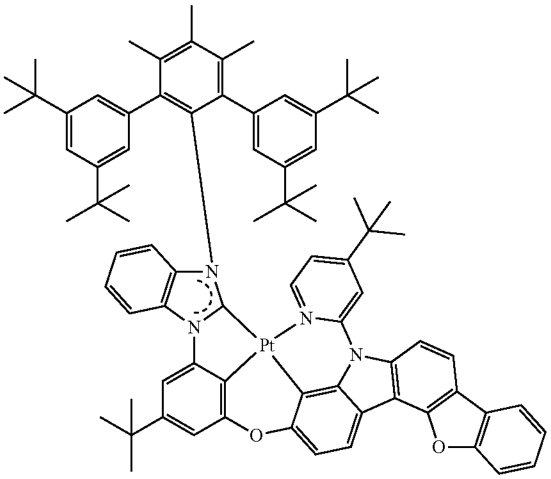
PtO79
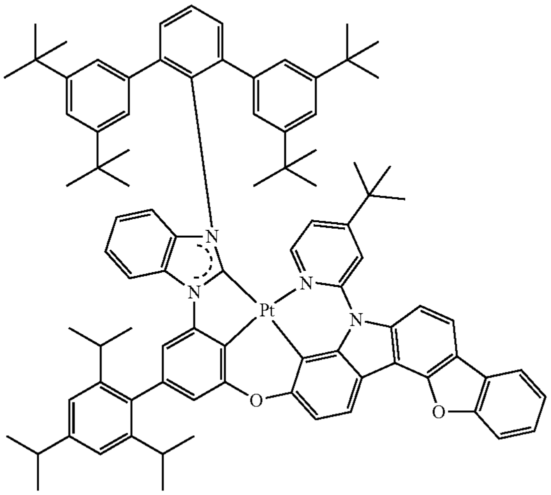
PtO80
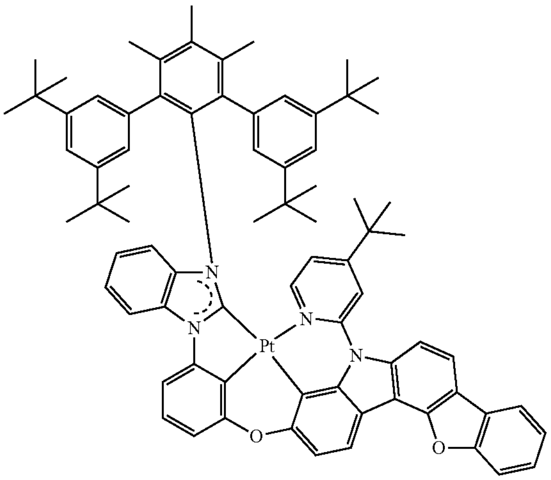
-continued
PtO81
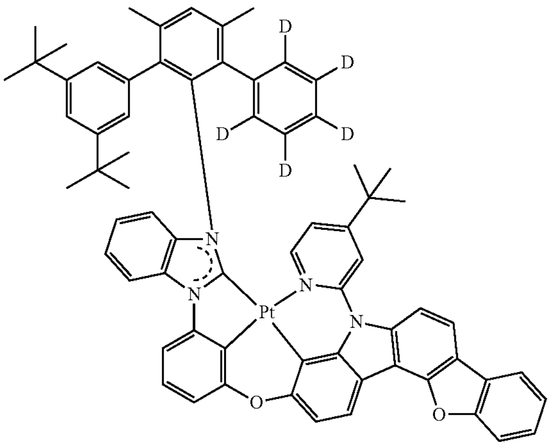
PtO82
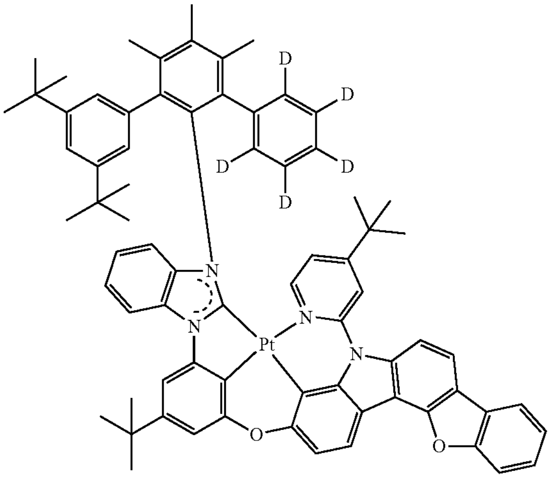
PtO83
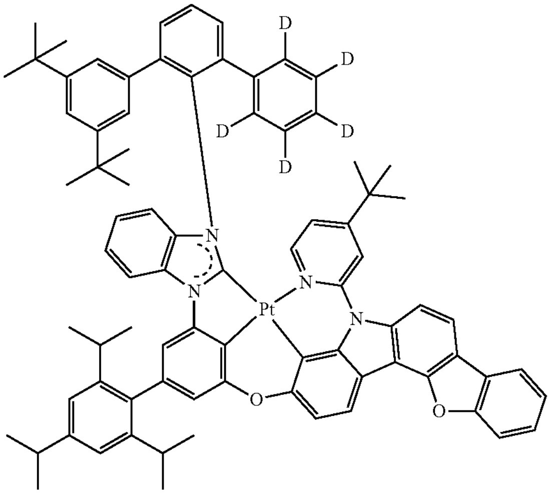

-continued
PtO84
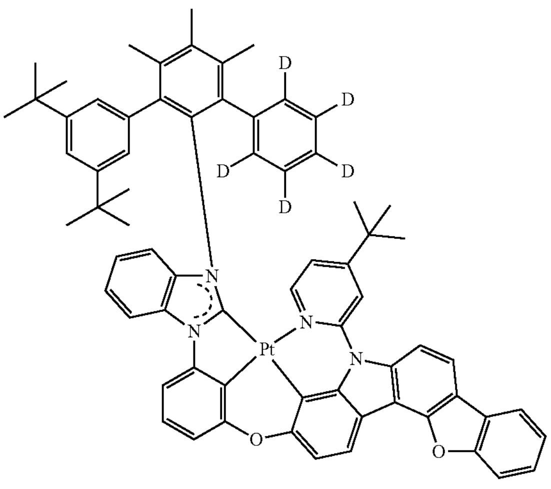
PtO85
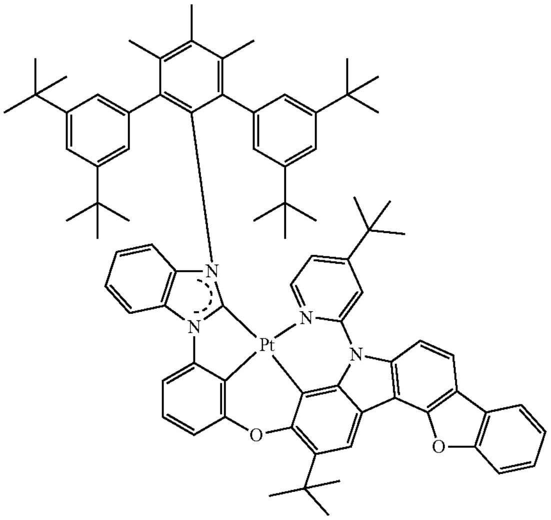
PtO86
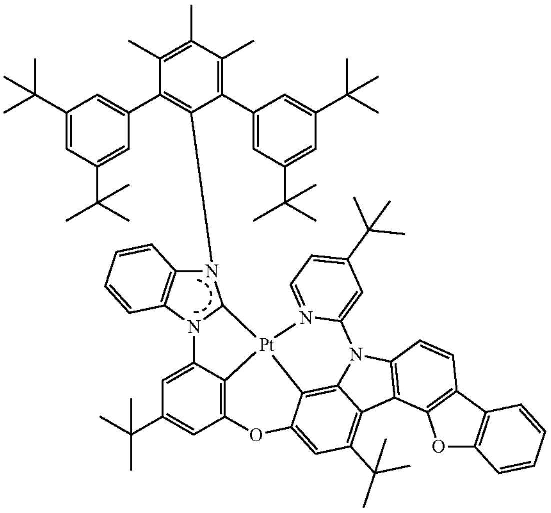
-continued
PtO87
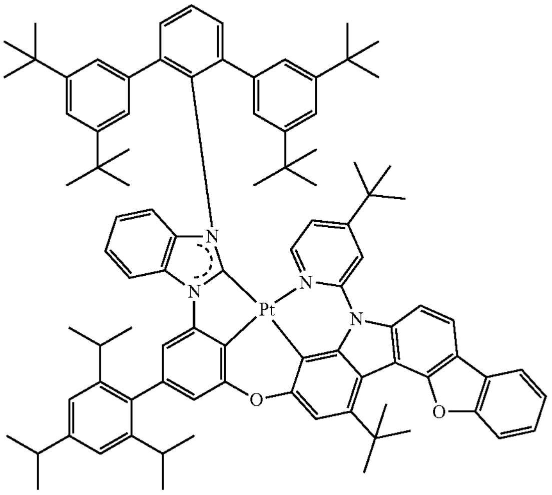
PtO88
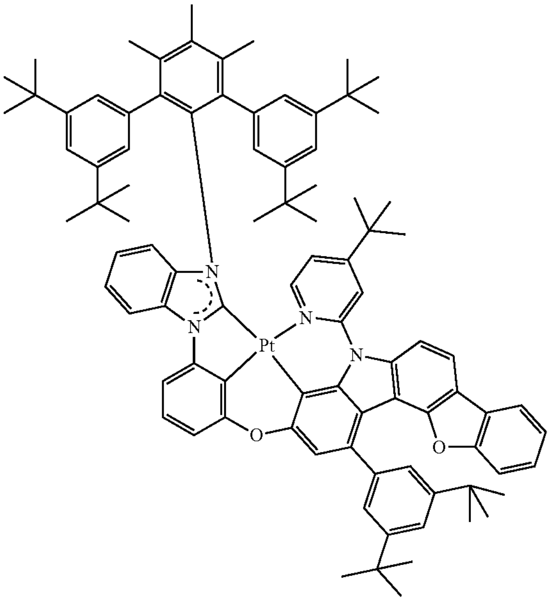
PtO89
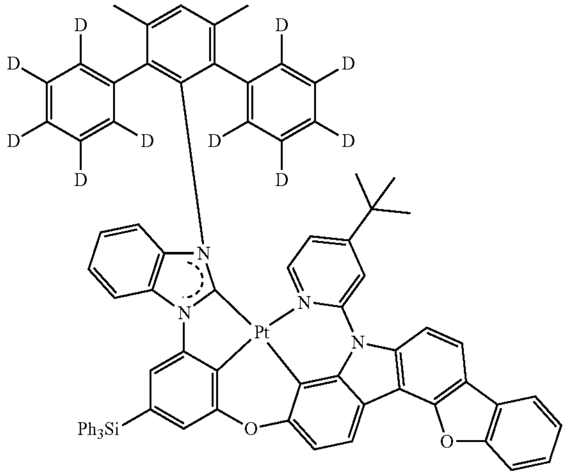

PtO90
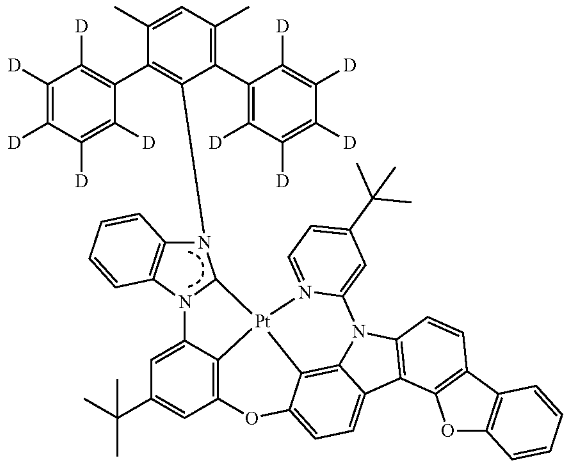
PtO91
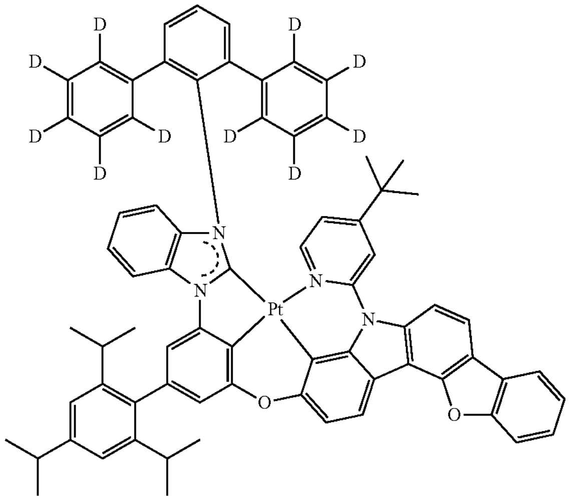
PtO92
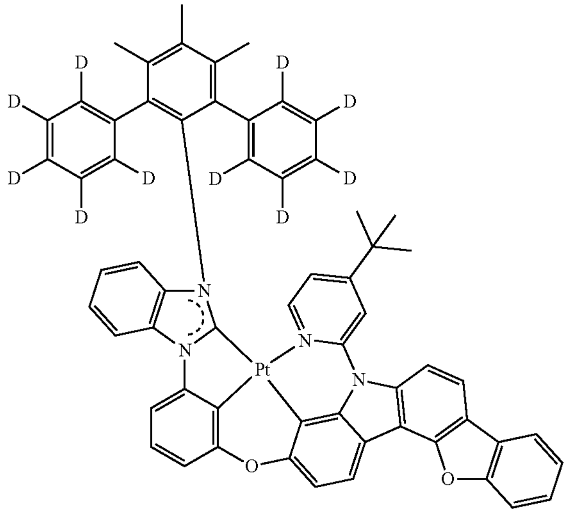
PtO93
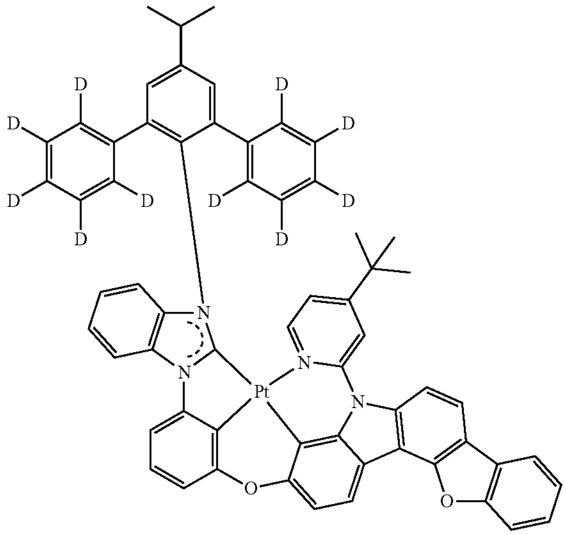
PtO94
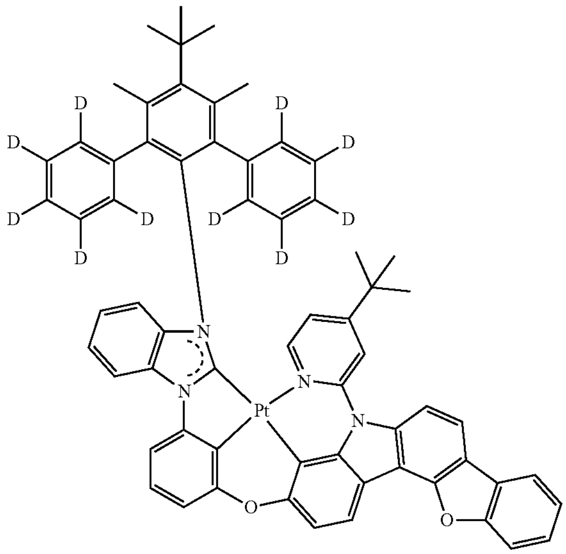
PtO95
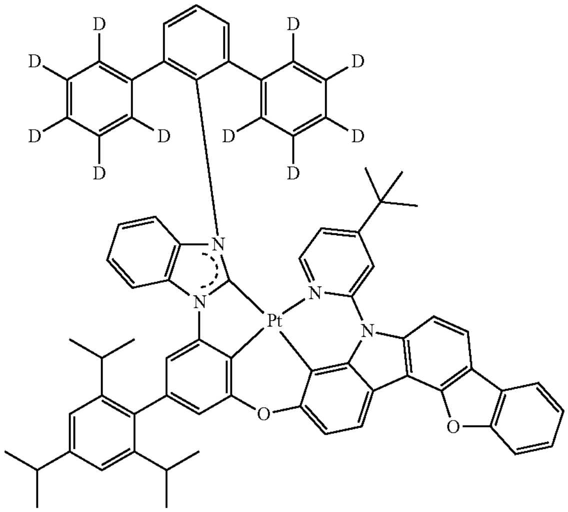

-continued
PtO96
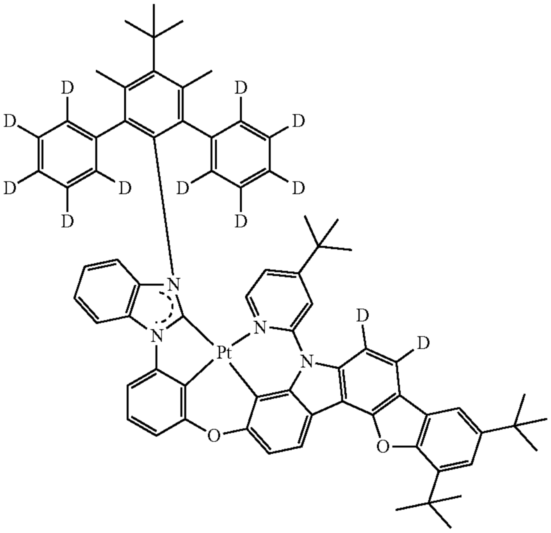
PtO97
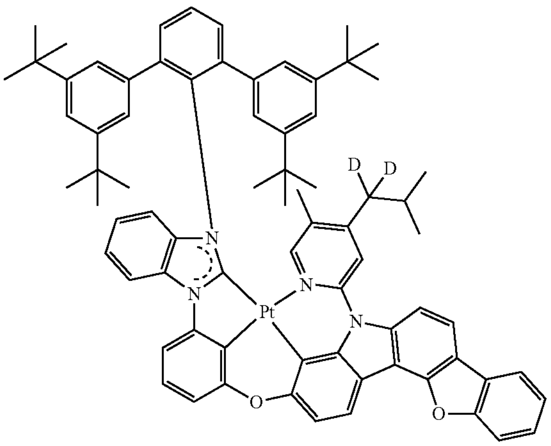
PtO98
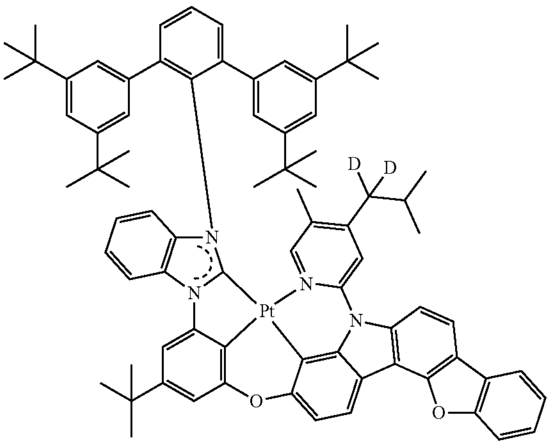
-continued
PtO99
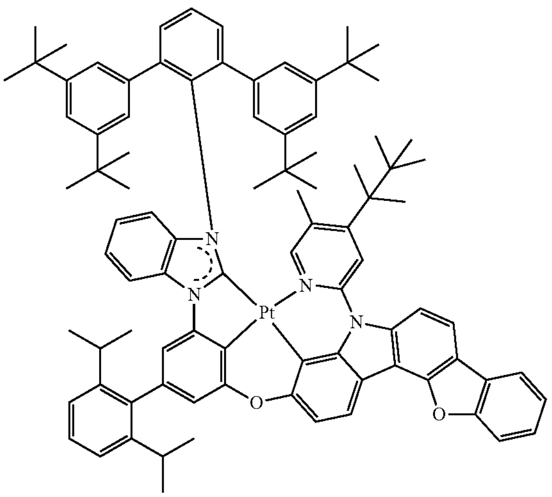
PtO100
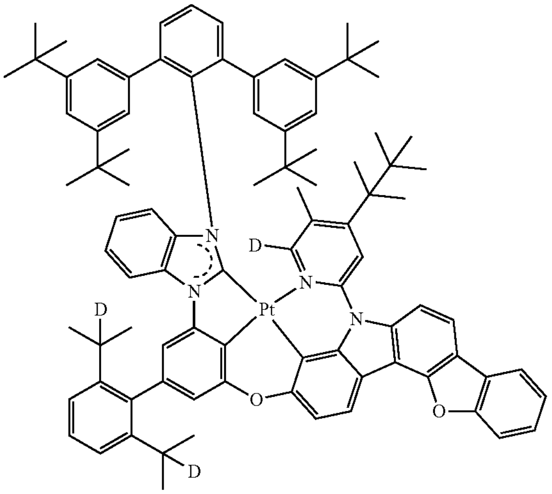
PtO101
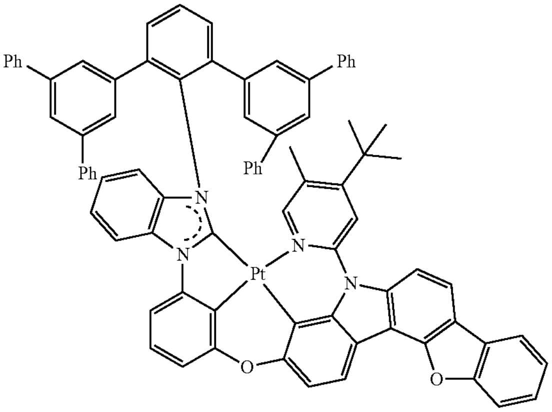

-continued
PtO102
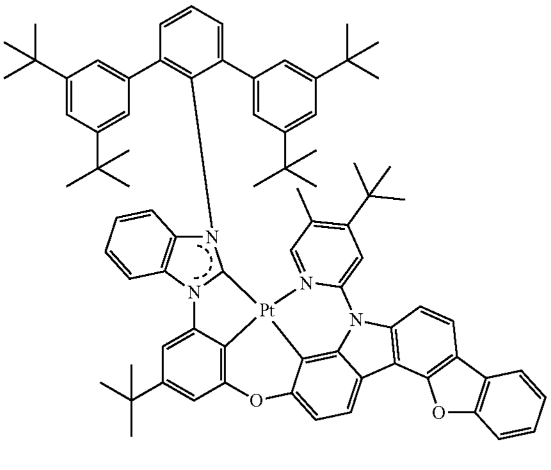
PtO103
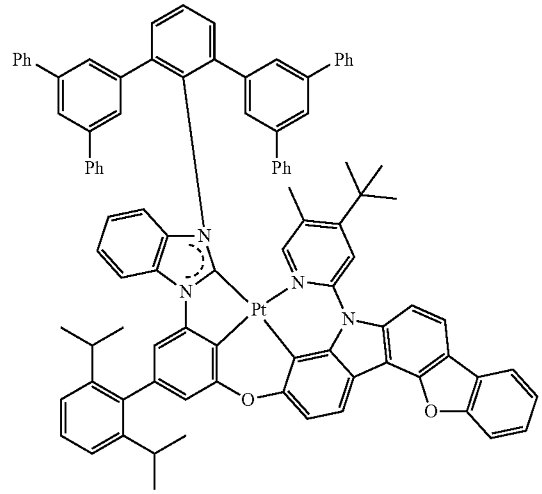
PtO104
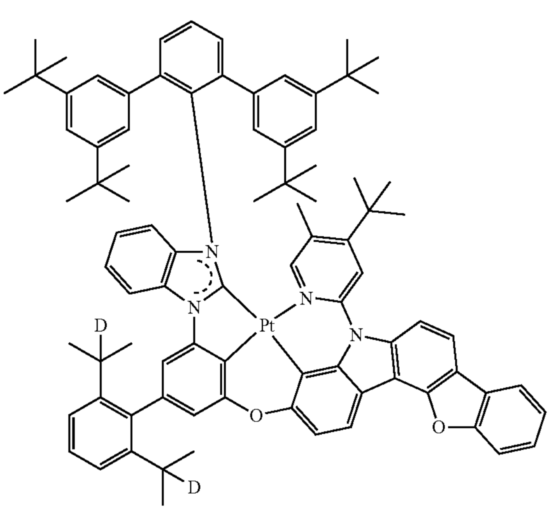
-continued
PtO105
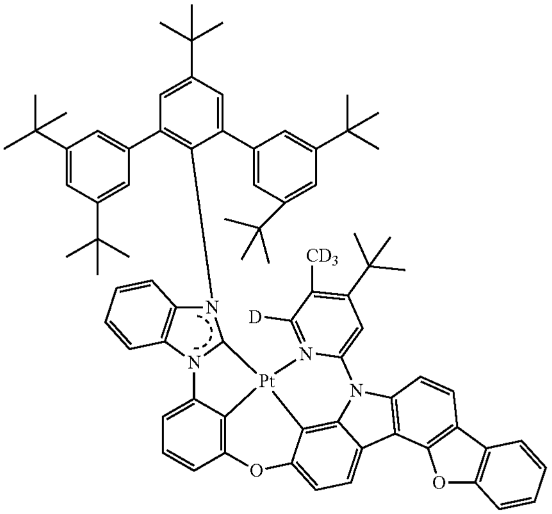
PtO106
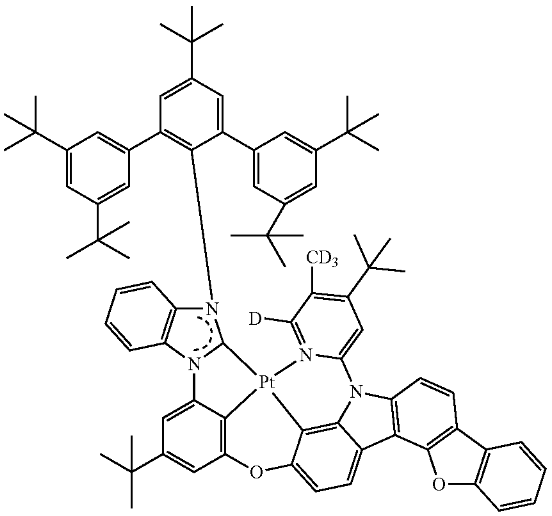
PtO107
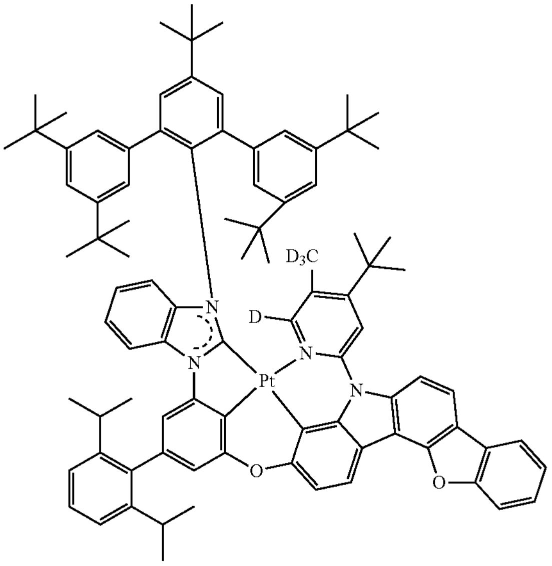

-continued
PtO108
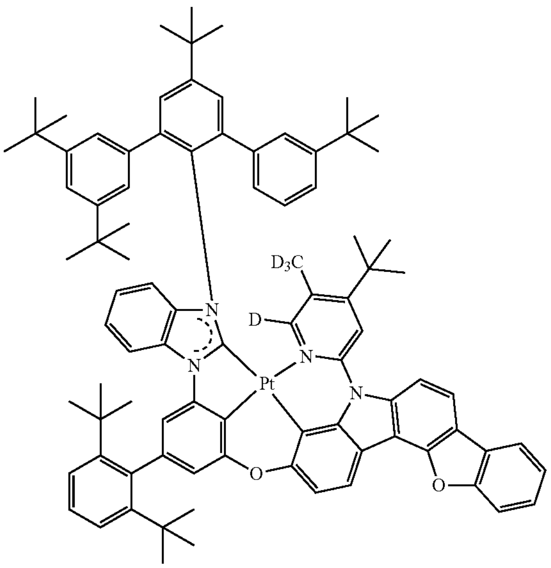
PtO109
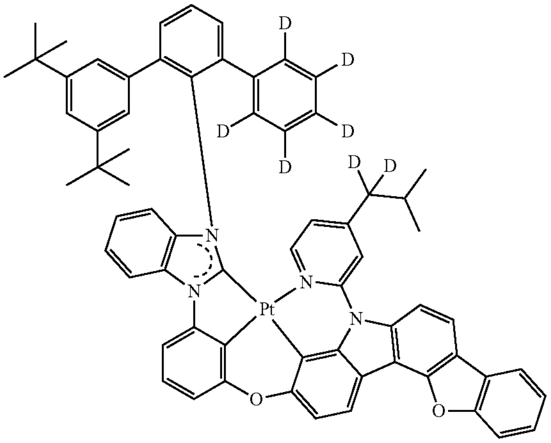
PtO110
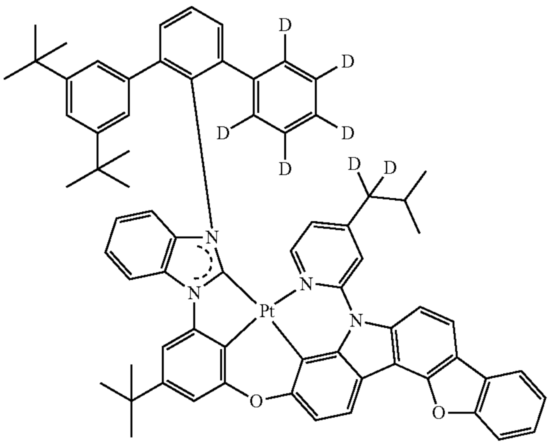
-continued
PtO1111
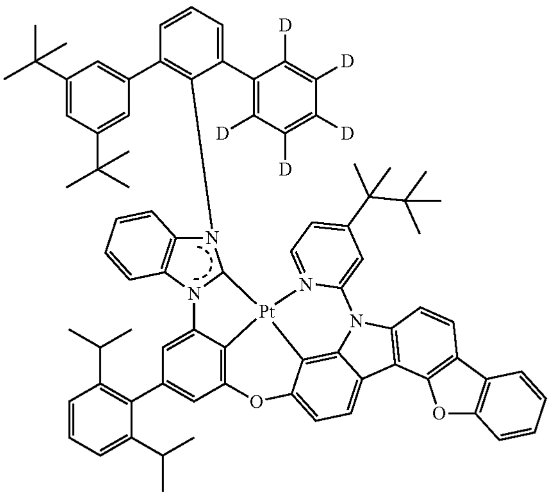
PtO112
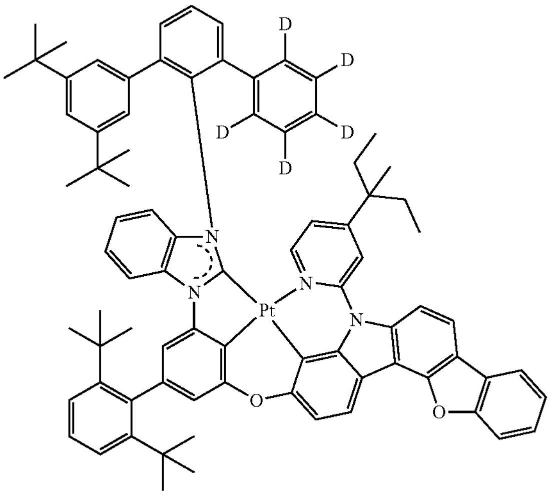
PtO1113
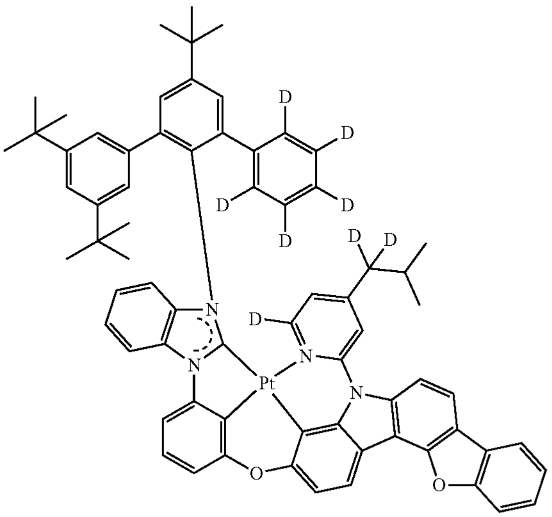

-continued
PtO1114
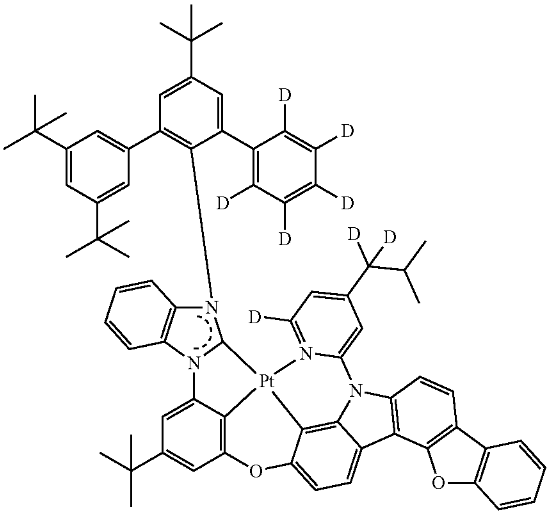
PtO1116
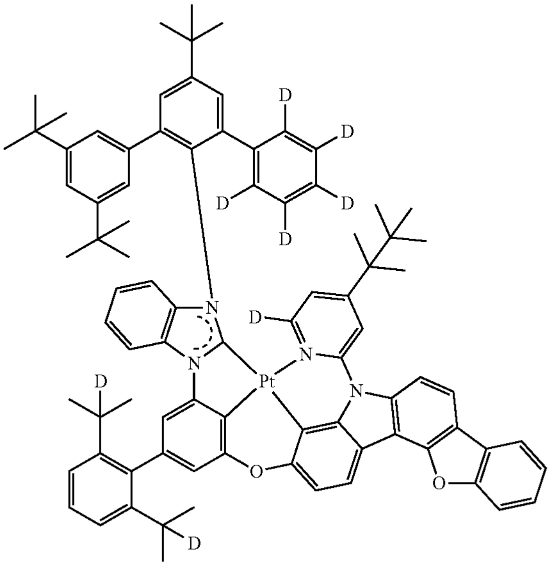
PtO1115
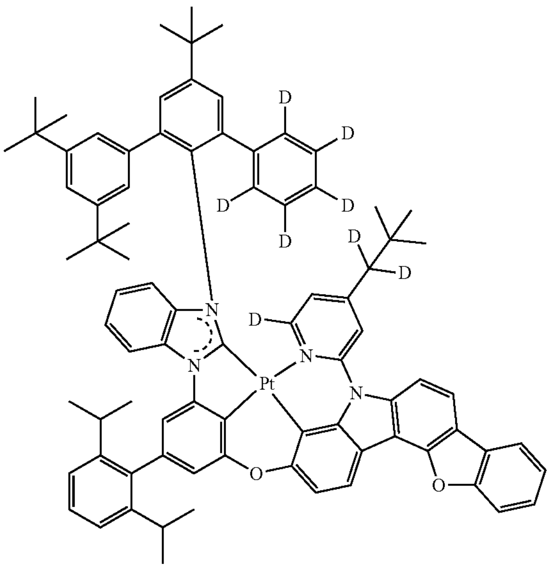
PtO1117
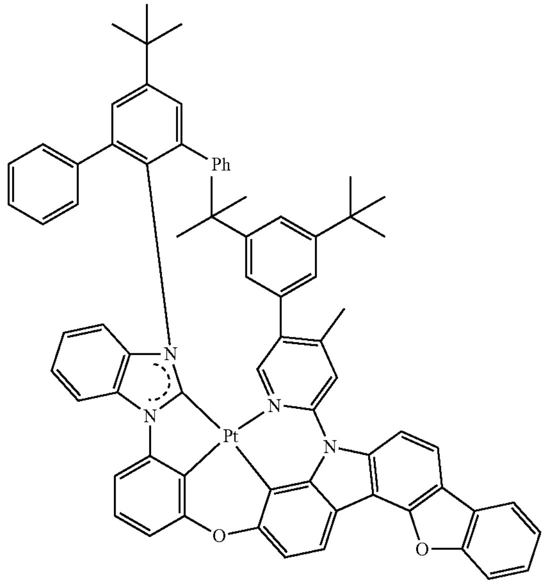

-continued
PtO1118
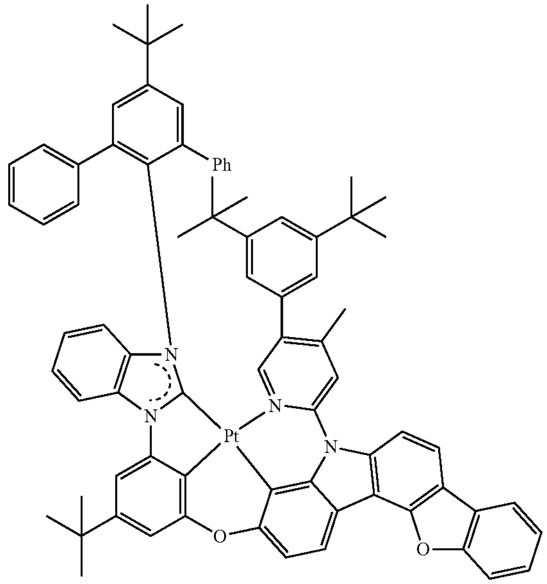
PtO1119
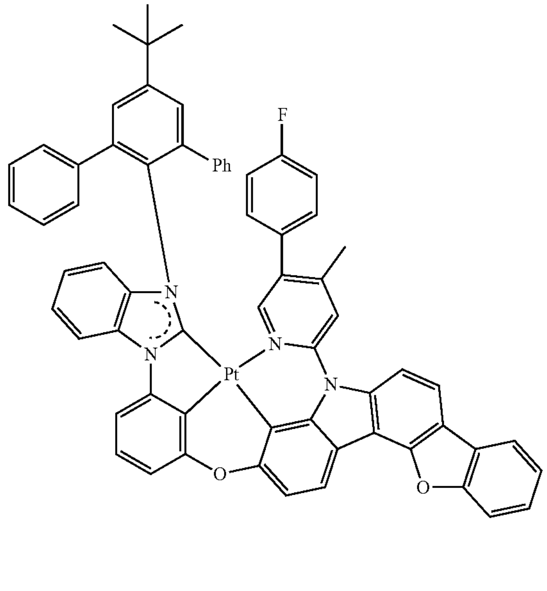
-continued
PtO1120
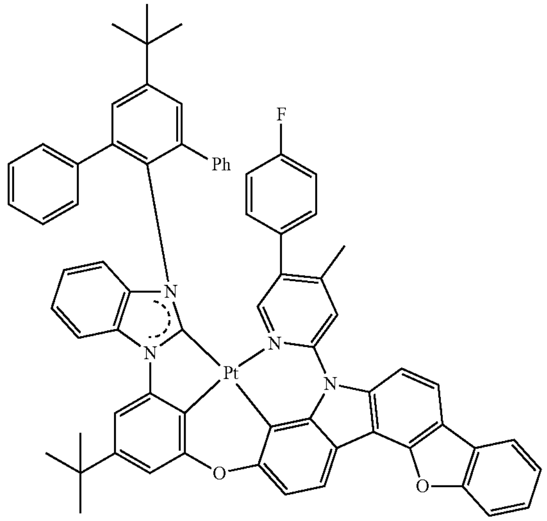
PtO111
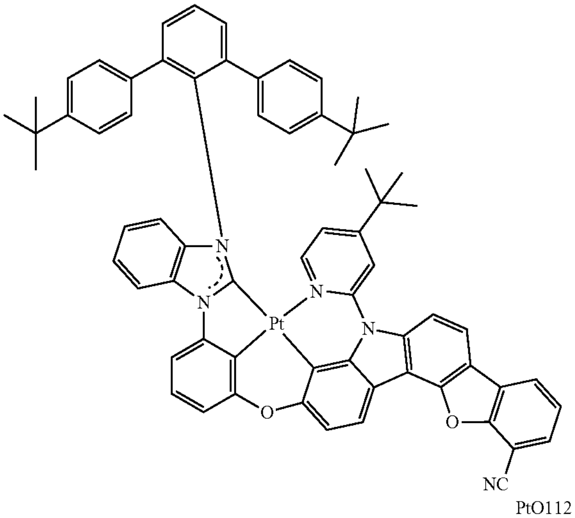
PtO112
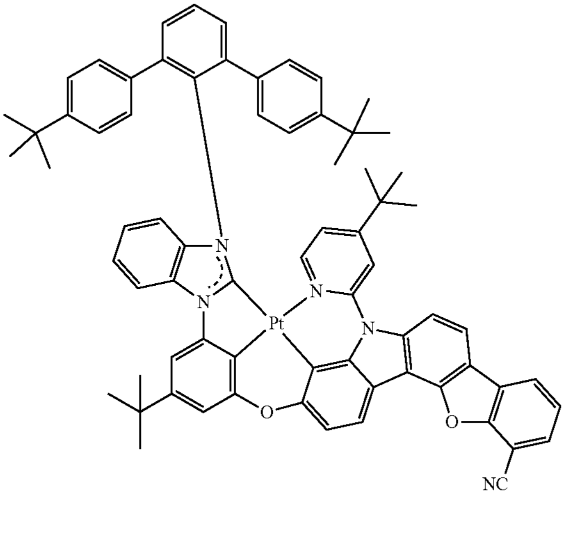

-continued
PtO113
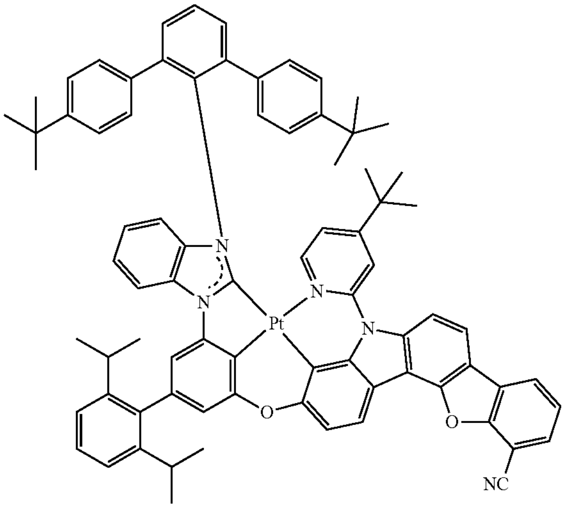
PtO114
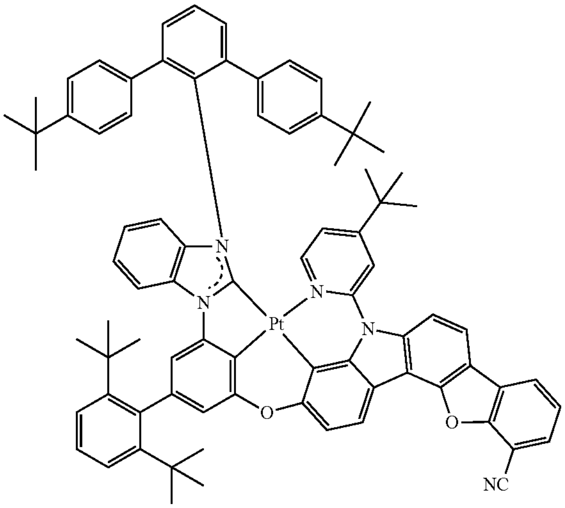
PtO115
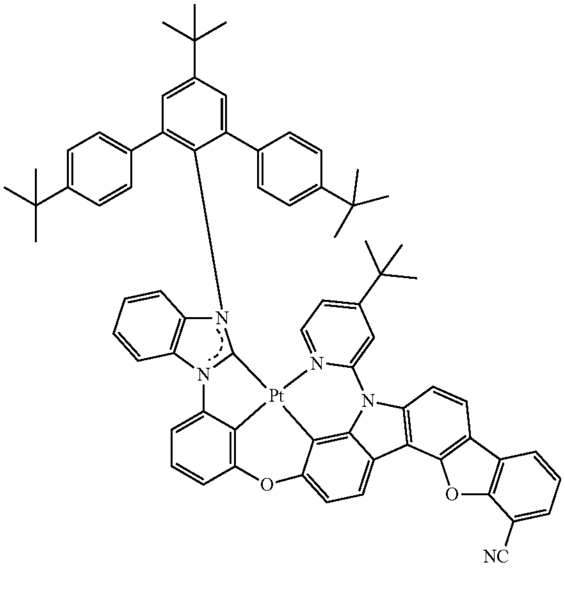
-continued
PtO116
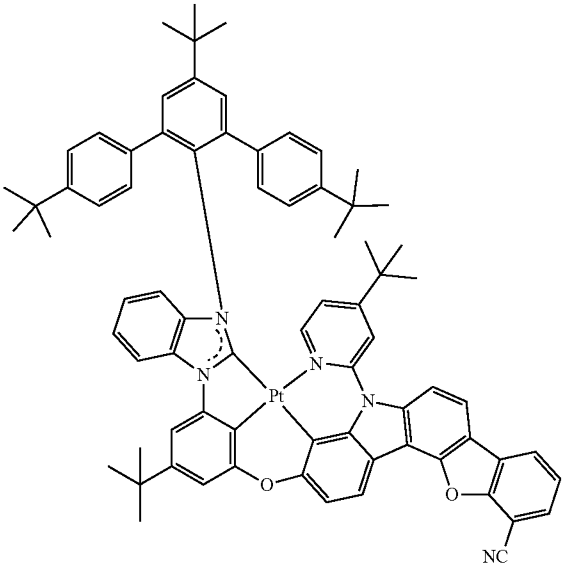
PtO117
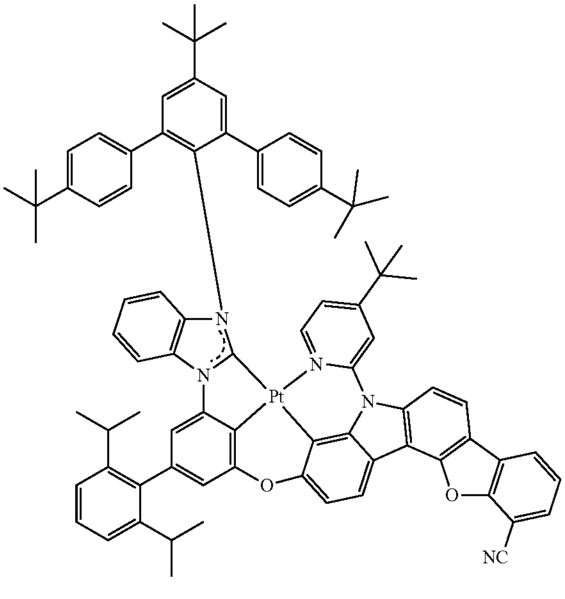

PtO118
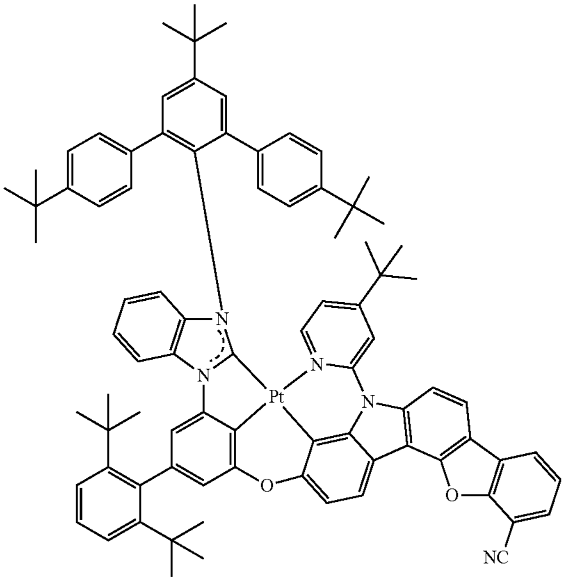
PtO119
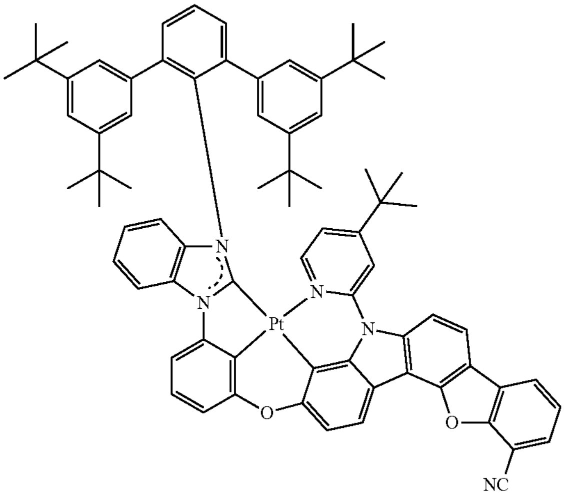
PtO120
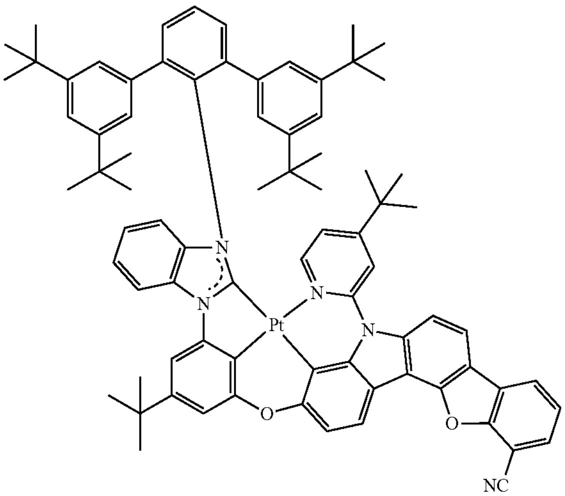
PtO121
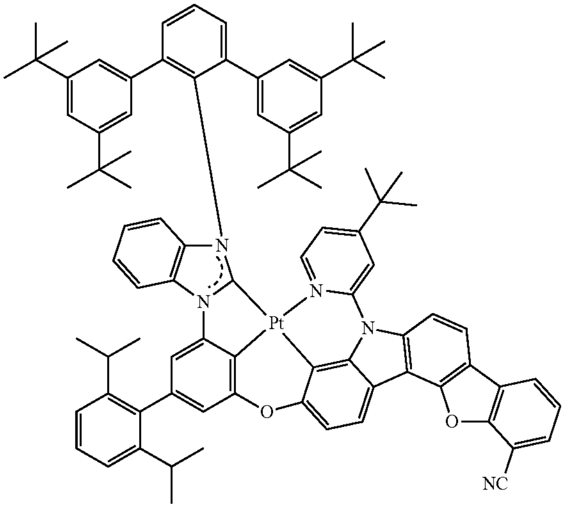
PtO122
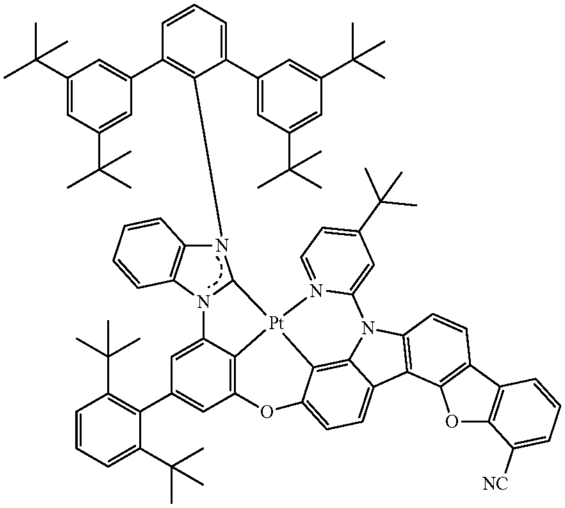
PtO123
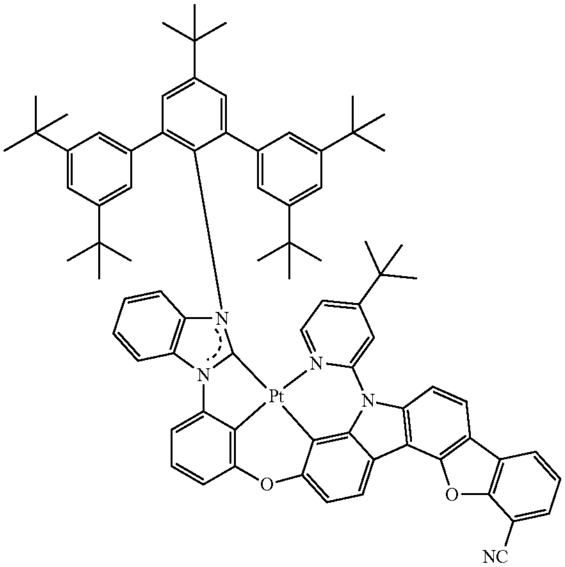

-continued
PtO124
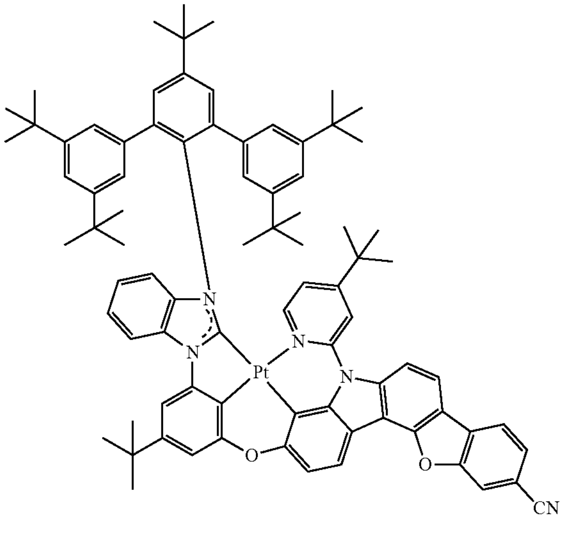
PtO125
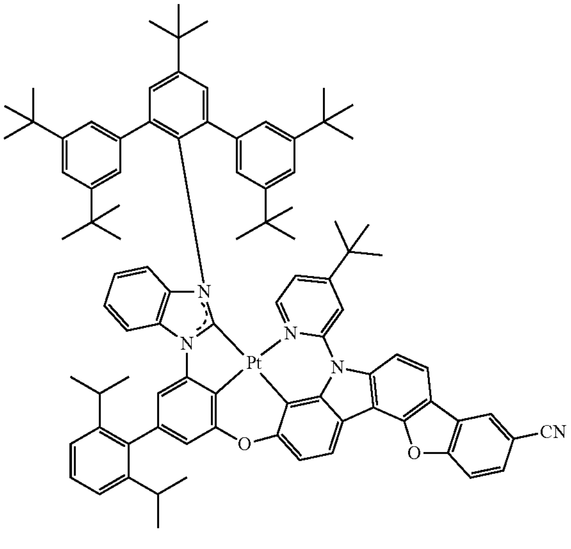
-continued
PtO126
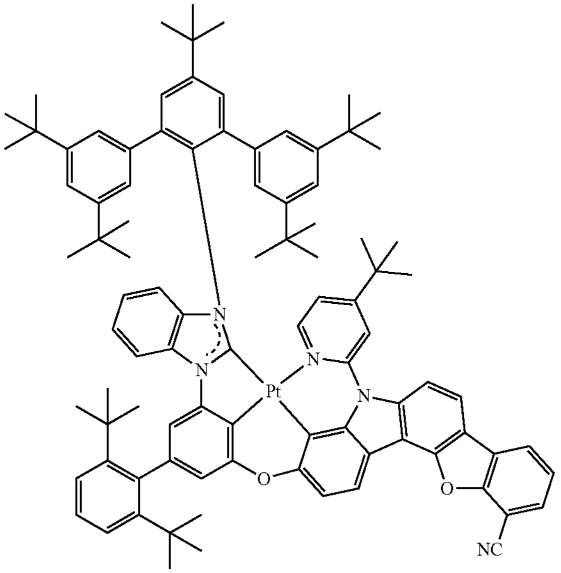
PtO127
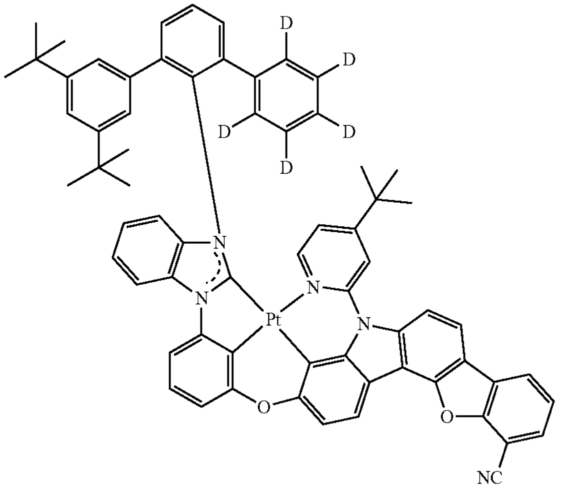
PtO128
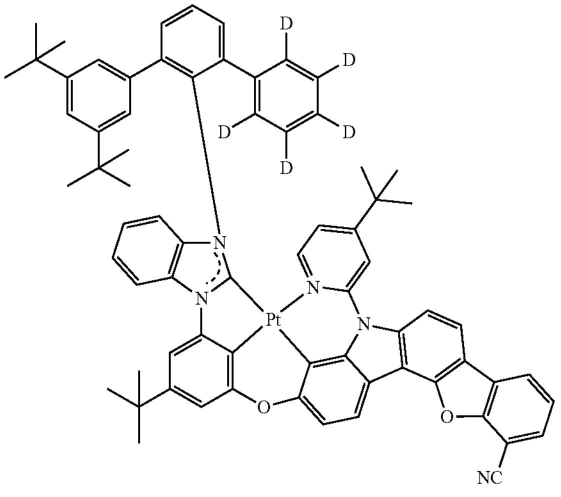

-continued
PtO129
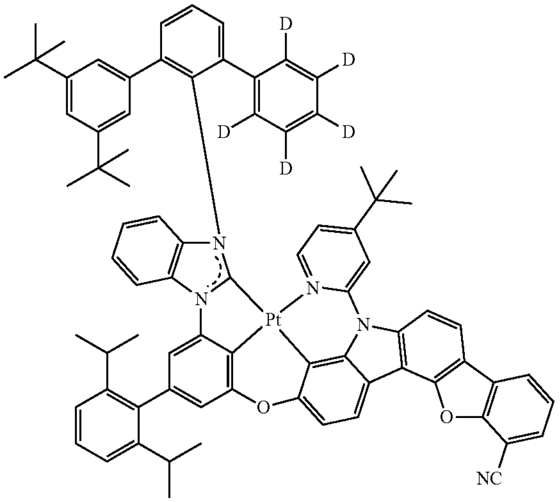
PtO130
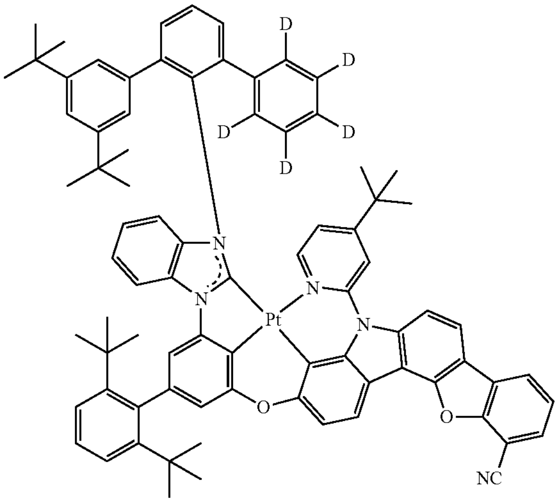
PtO131
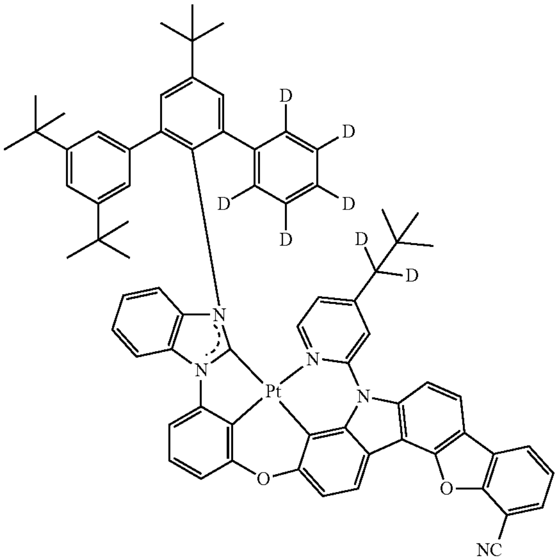
-continued
PtO132
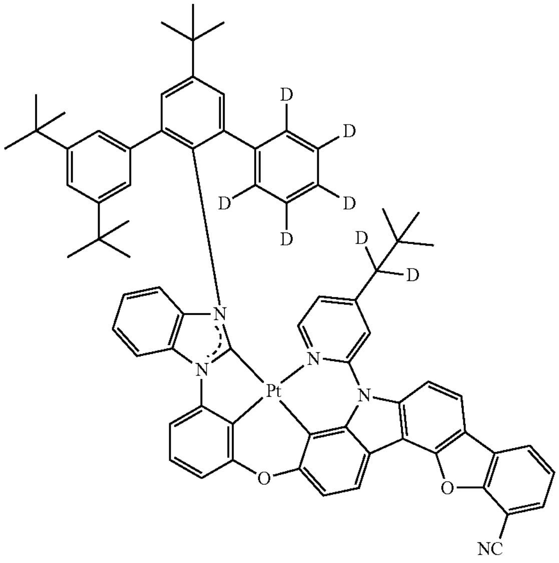
PtO133
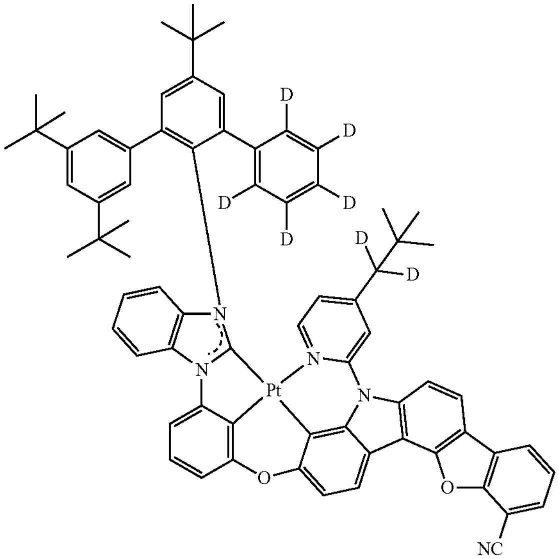

-continued
PtO134
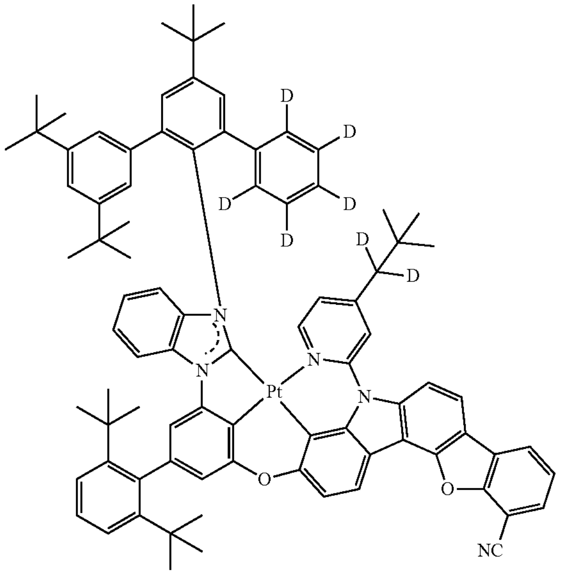
PtO135
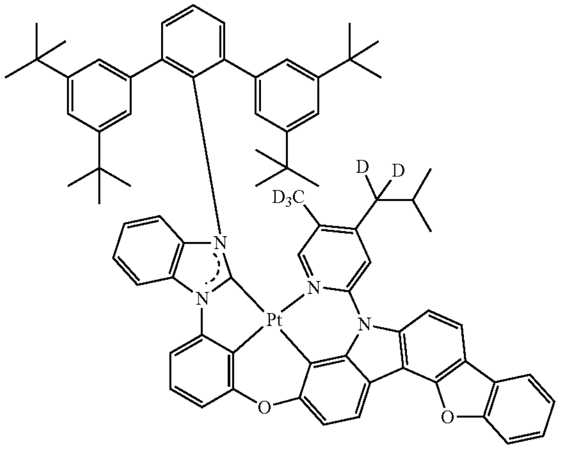
PtO136
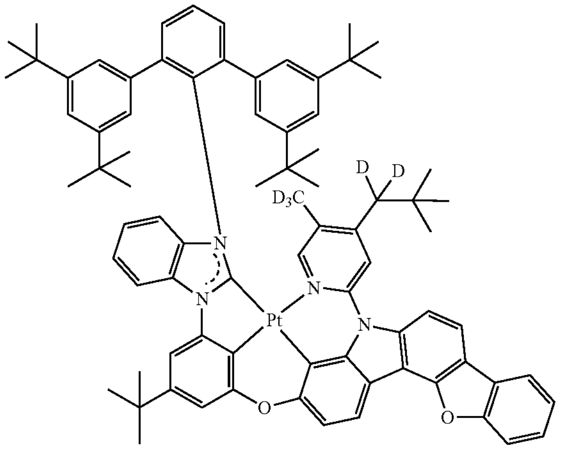
-continued
PtO137
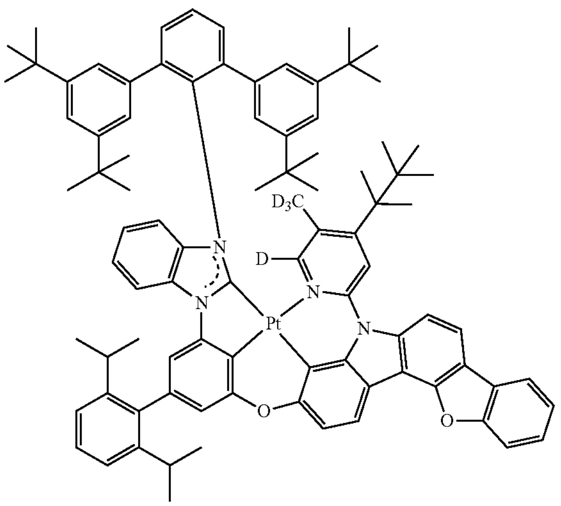
PtO138
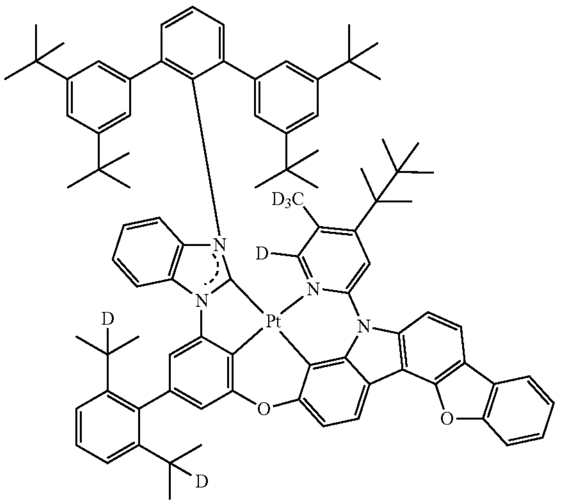
PtO139
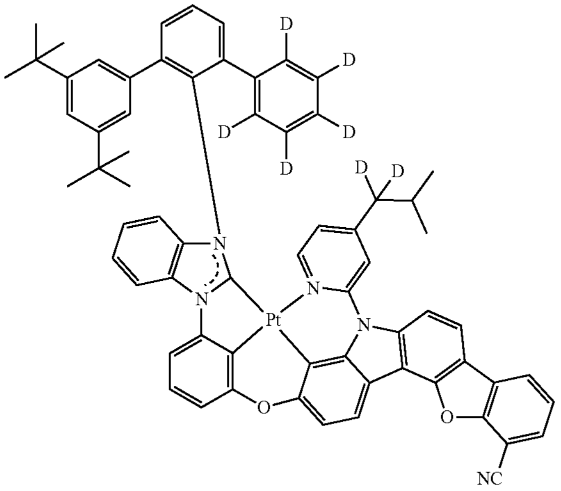

PtO140
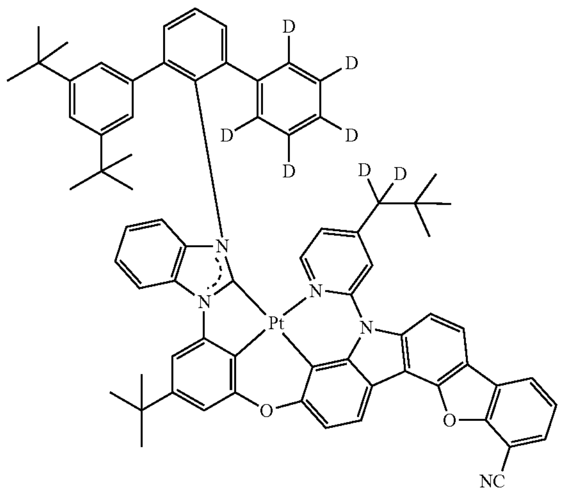
PtO141
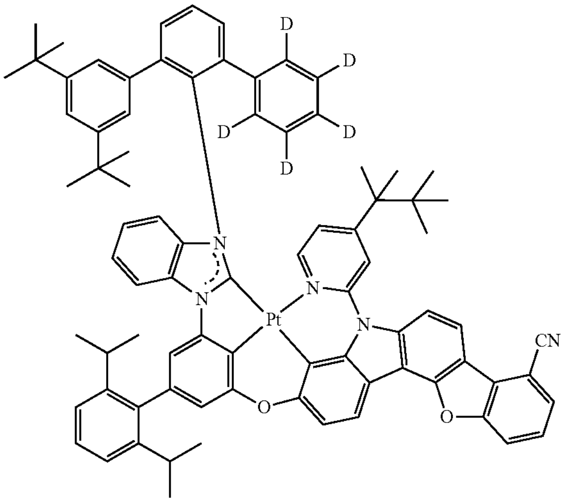
PtO142
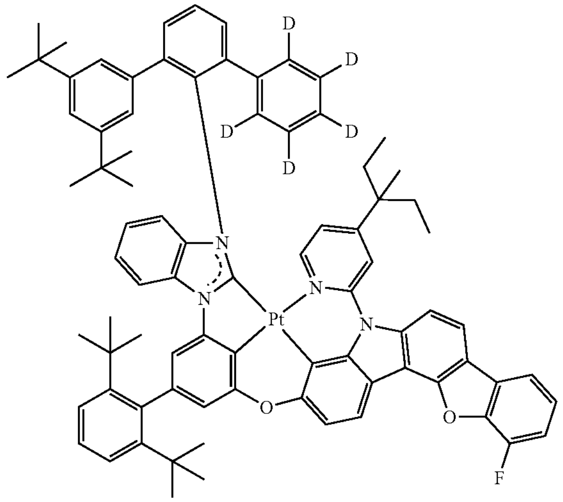
PtO143
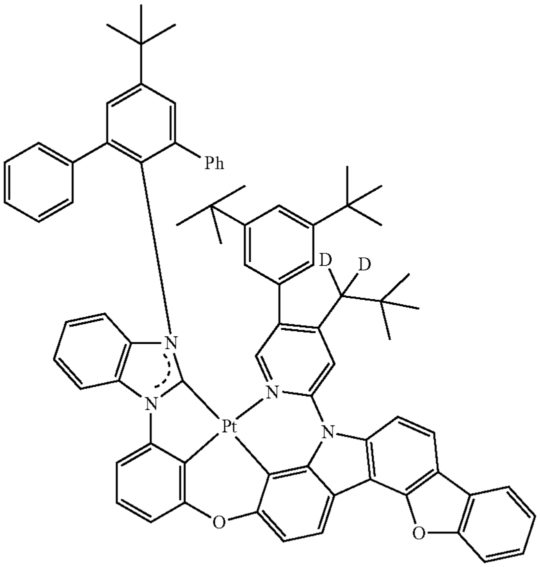
PtO144
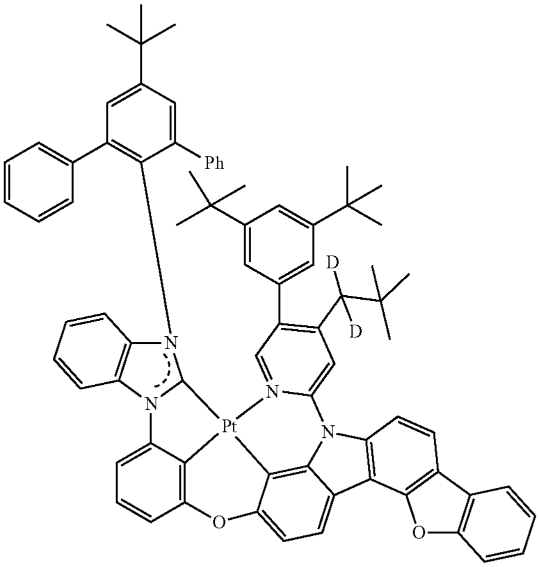

-continued
PtO145
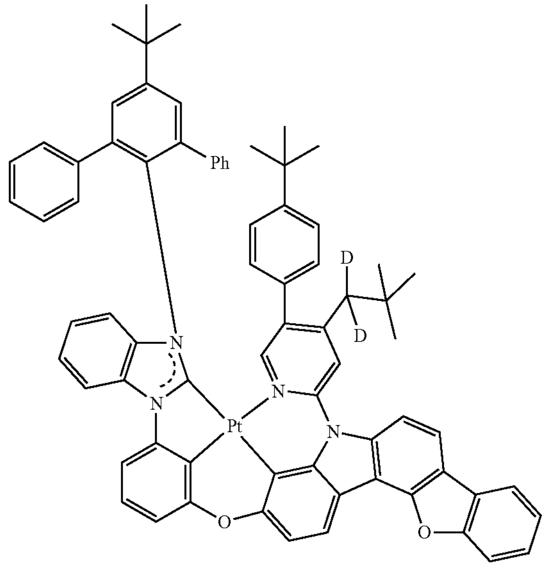
PtO146
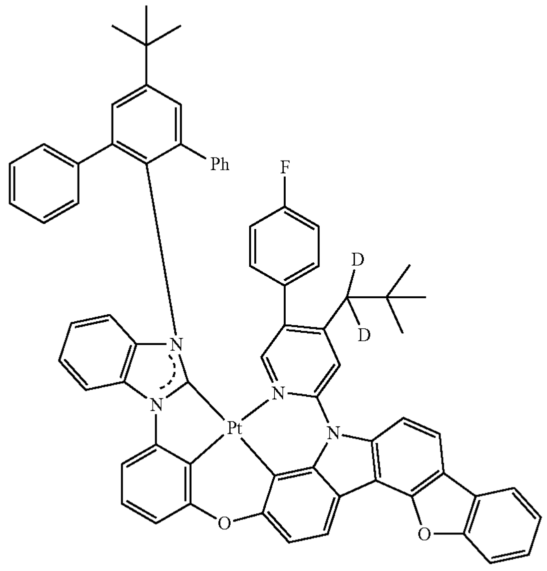
-continued
PtO147
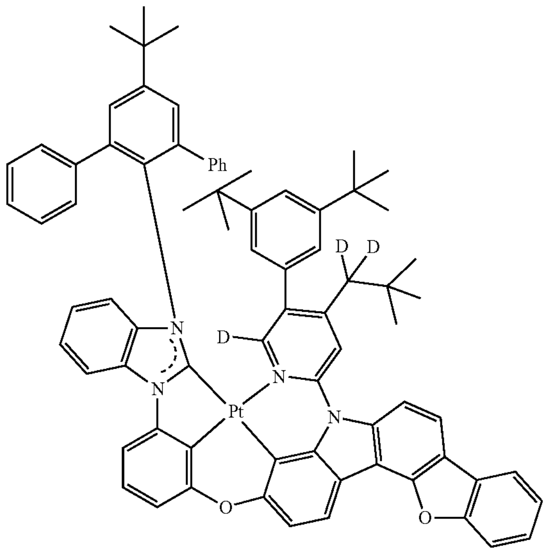
PtO148
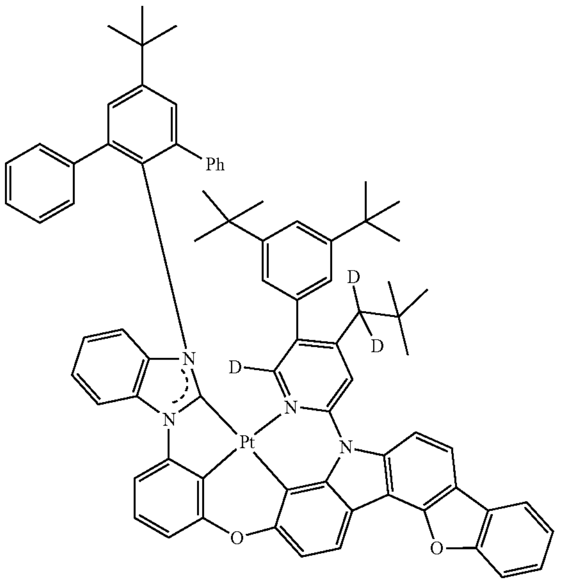

-continued
PtO149
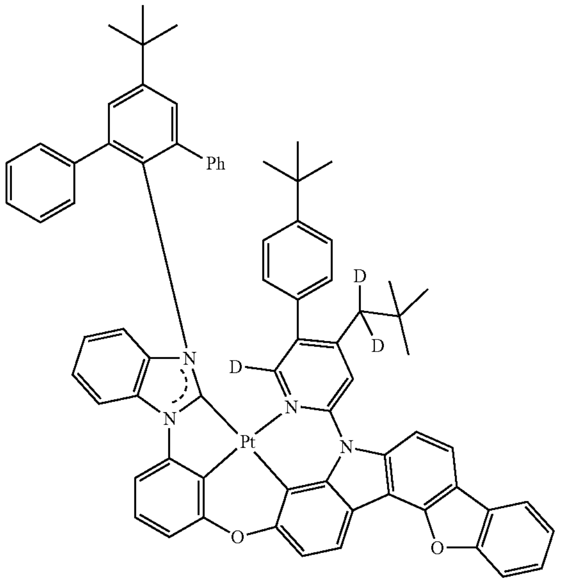
-continued
PtO151
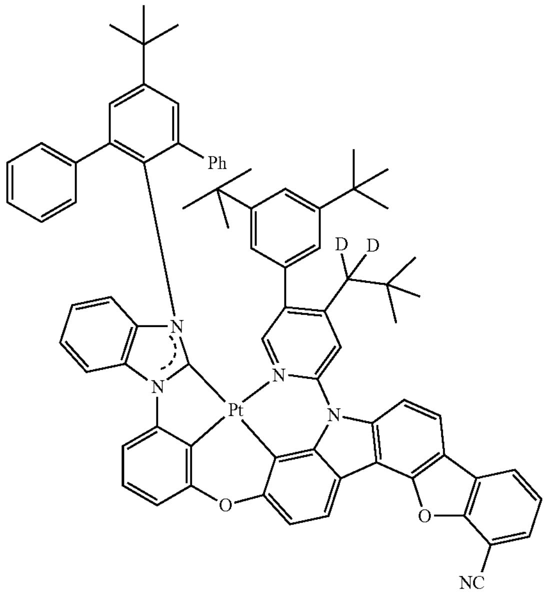
PtO150
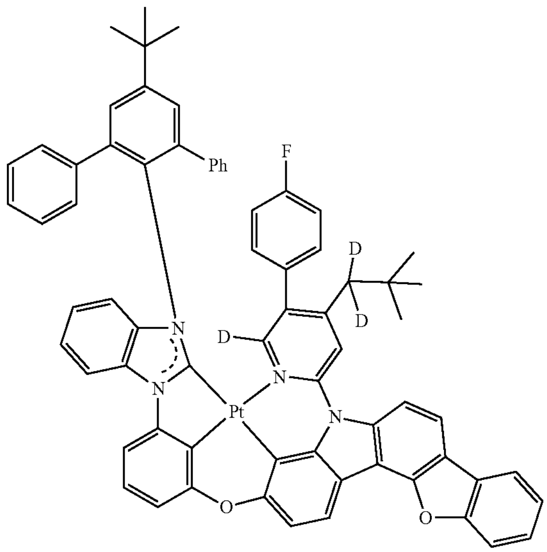
PtO152
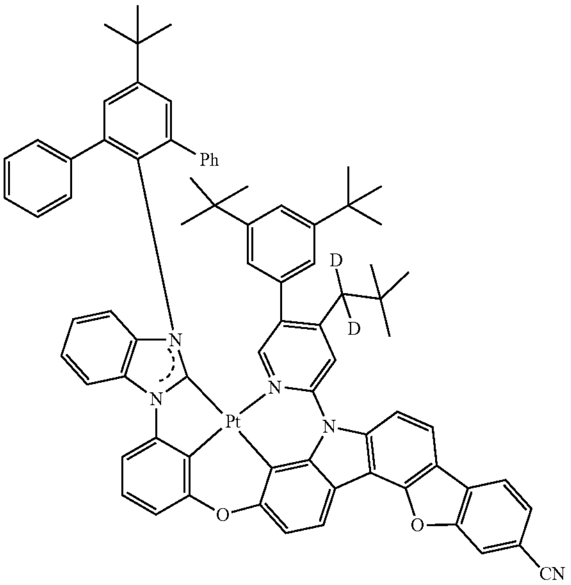

-continued
PtO153
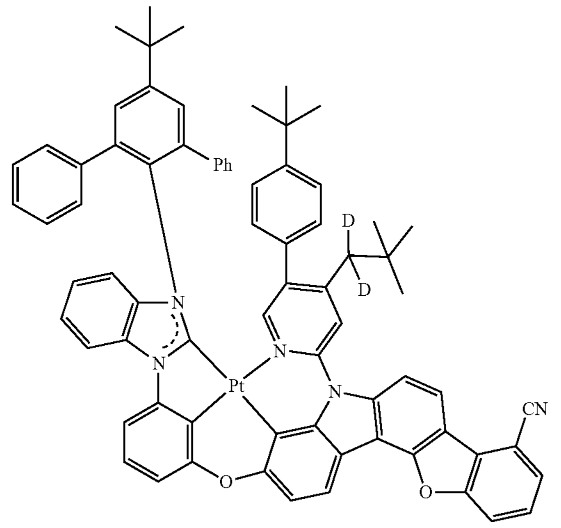
PtO154
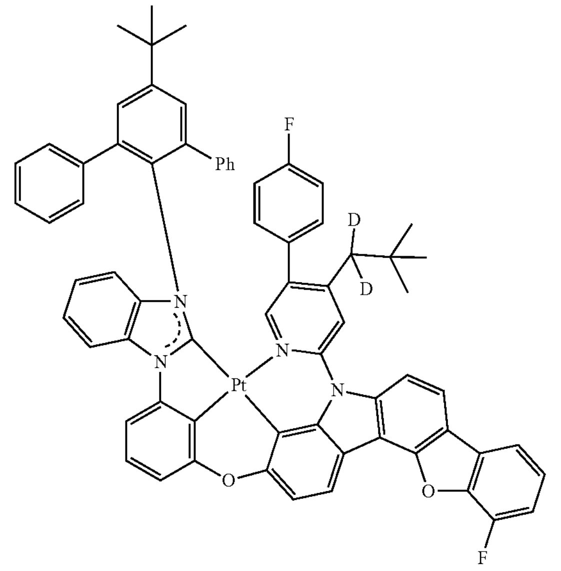
-continued
PtO155
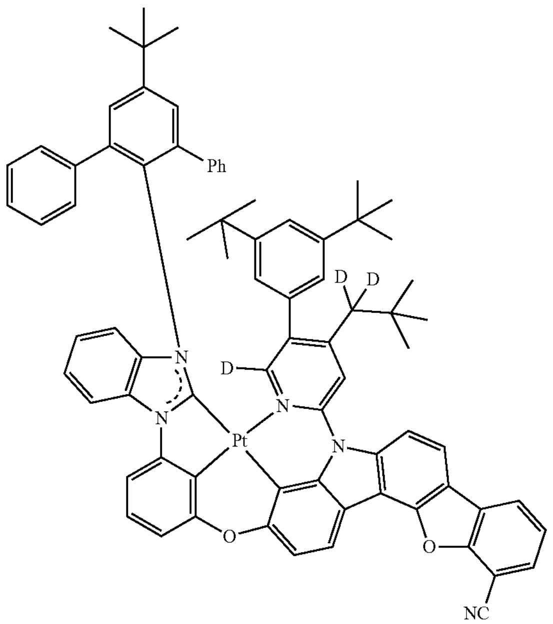
PtO156
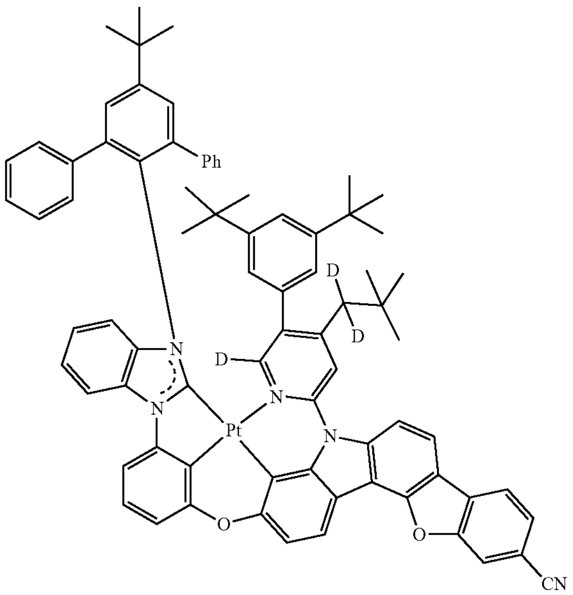

-continued
PtO157
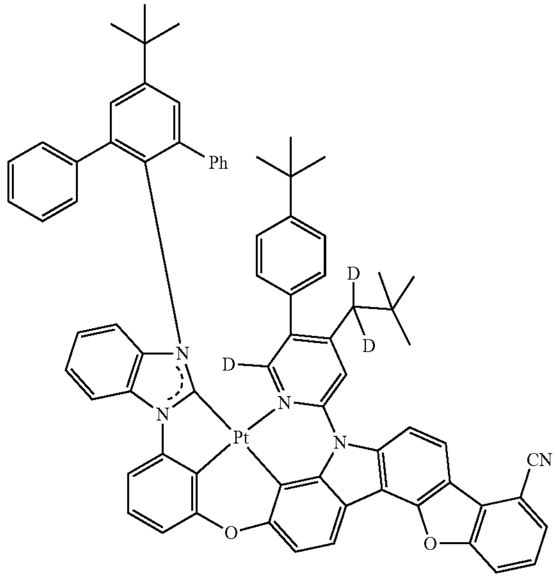
PtO158
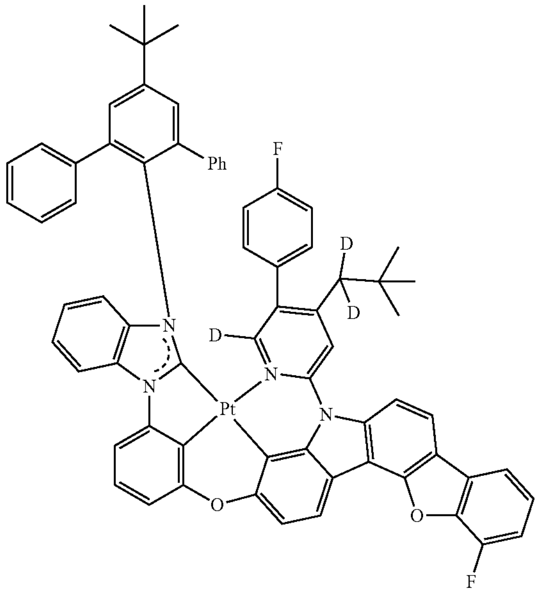
-continued
PtS1
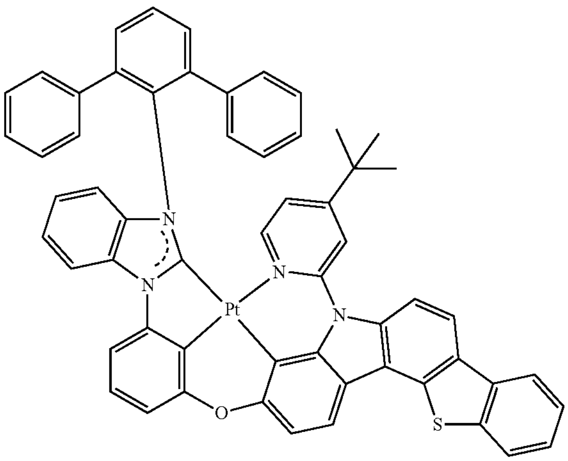
PtS2
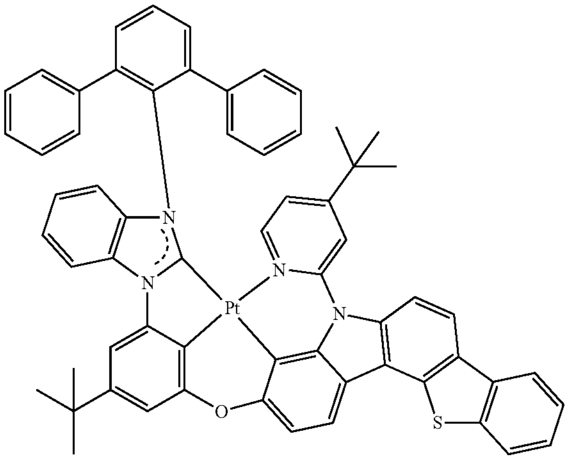
PtS3
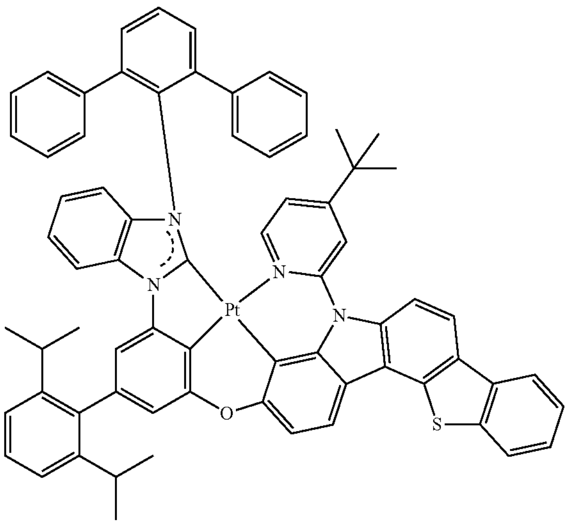

-continued
PtS4
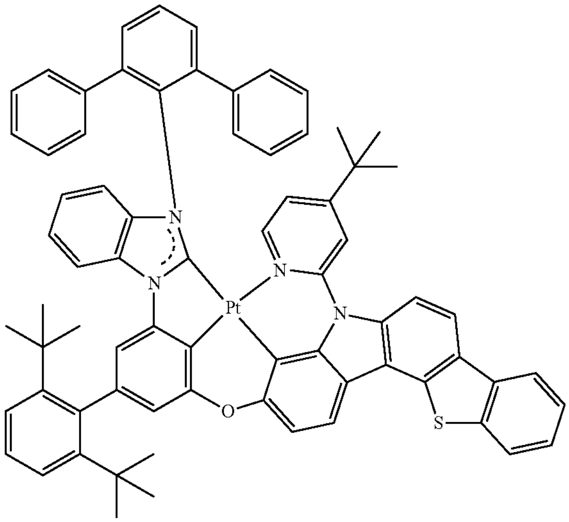
PtS5
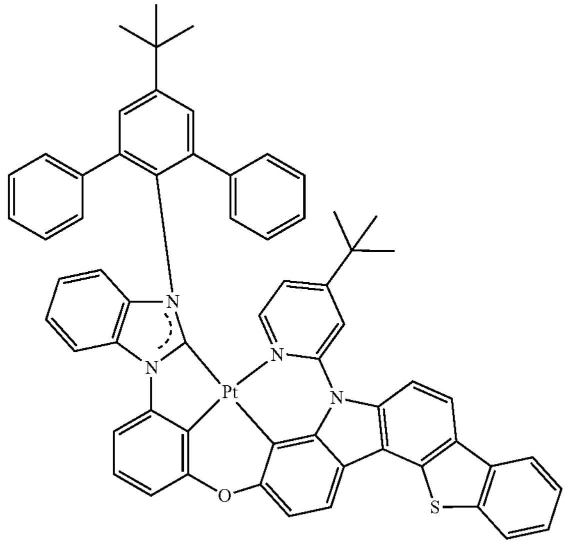
PtS6
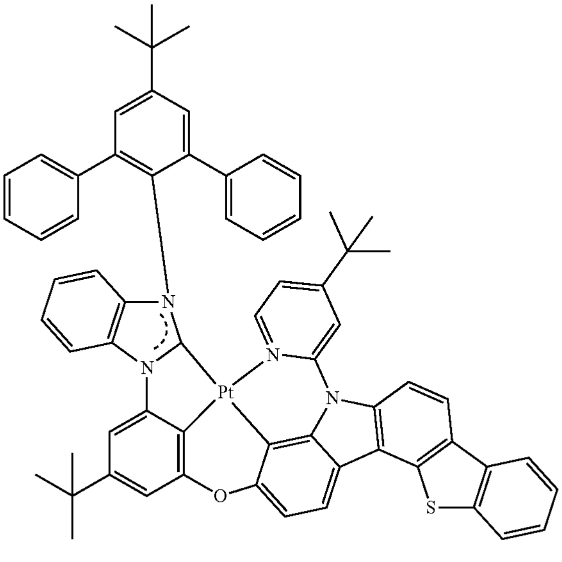
-continued
PtS7
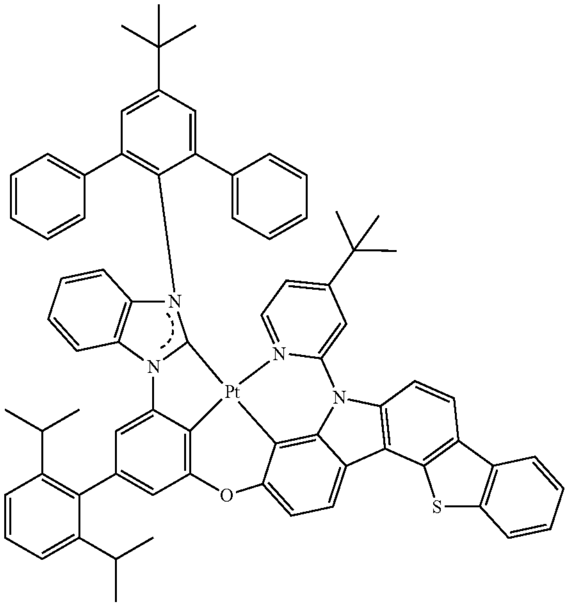
PtS8
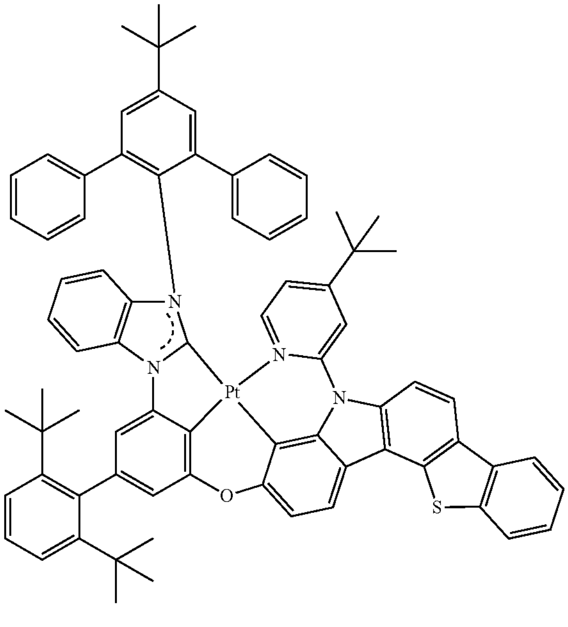

PtS9
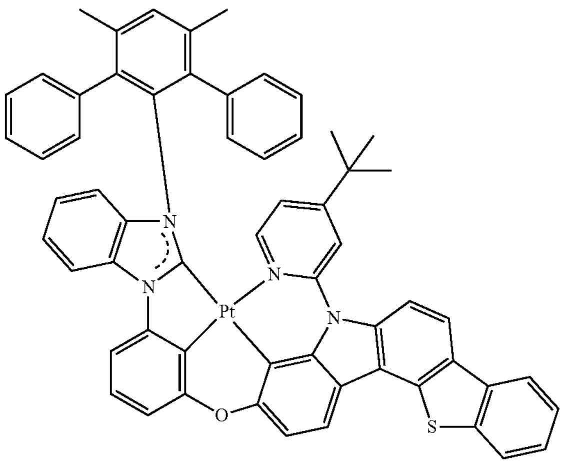
PtS10
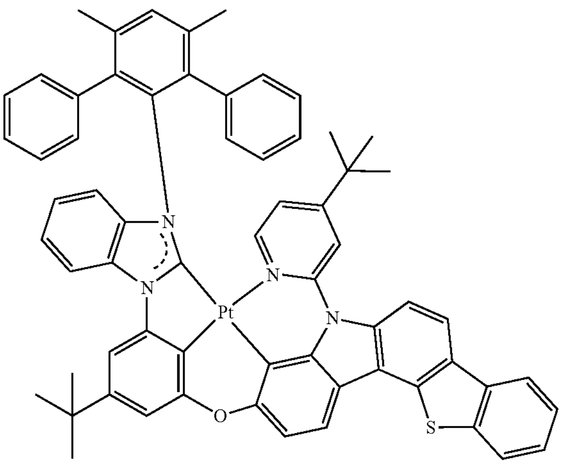
PtS11
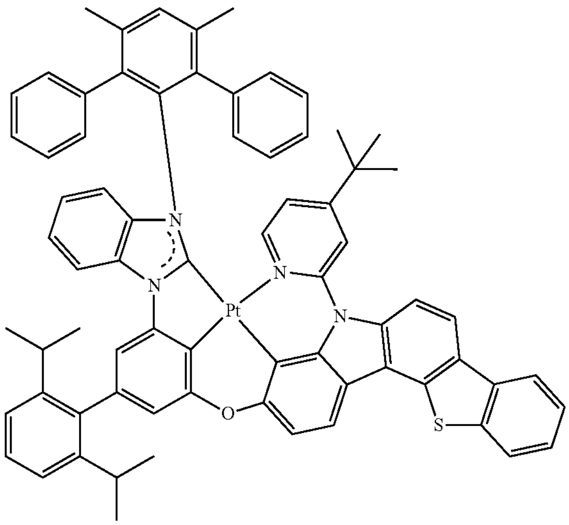
PtS12
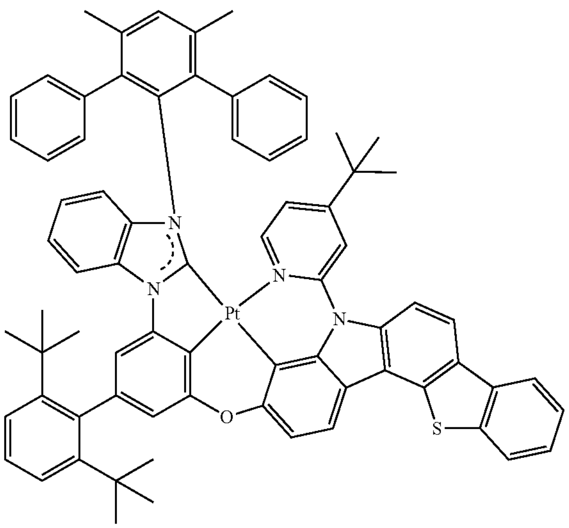
PtS13
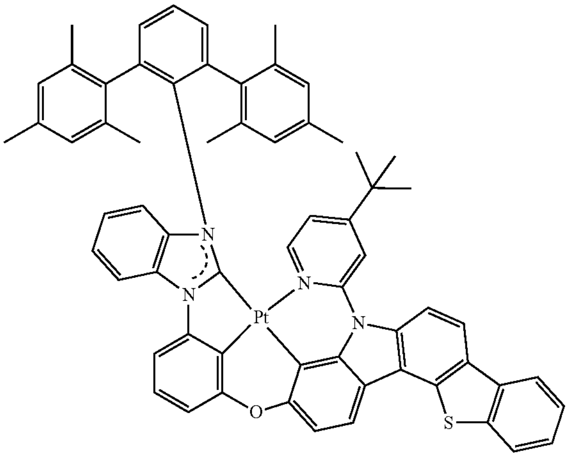
PtS14
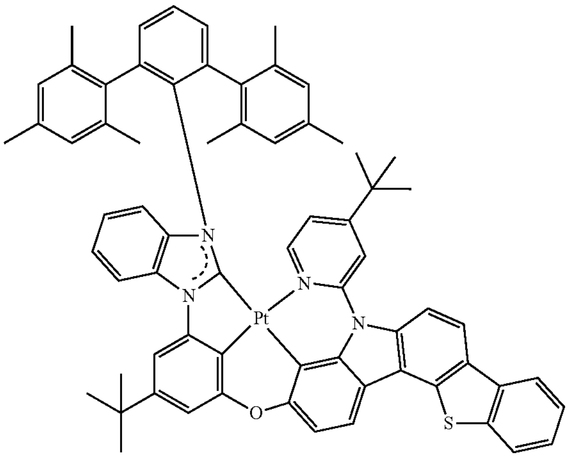

-continued
PtS15
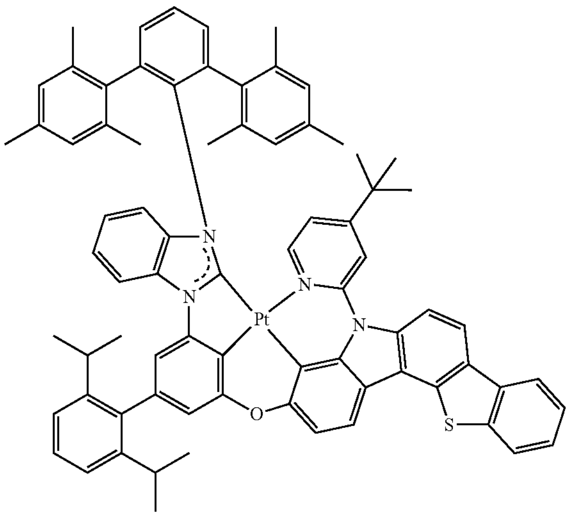
PtS16
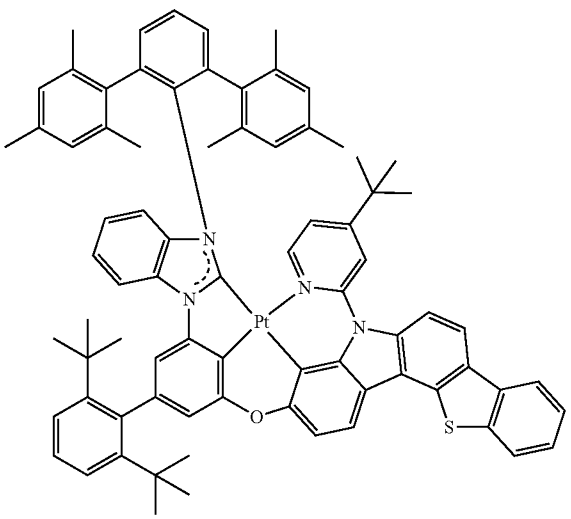
PtS17
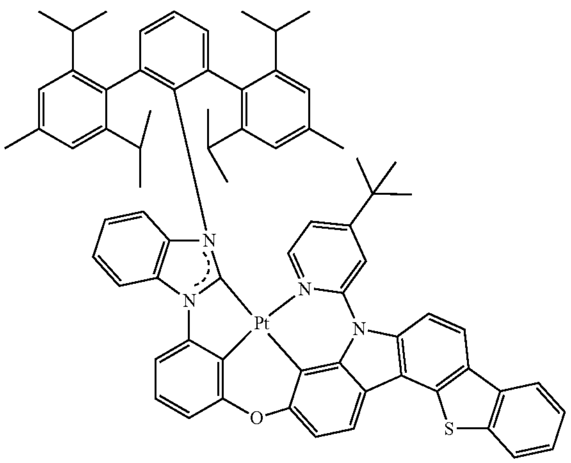
-continued
PtS18
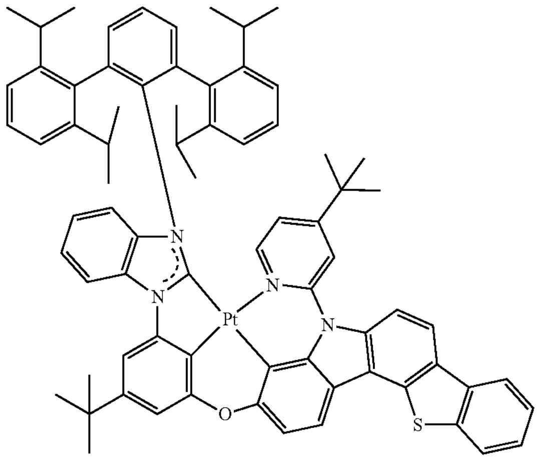
PtS19
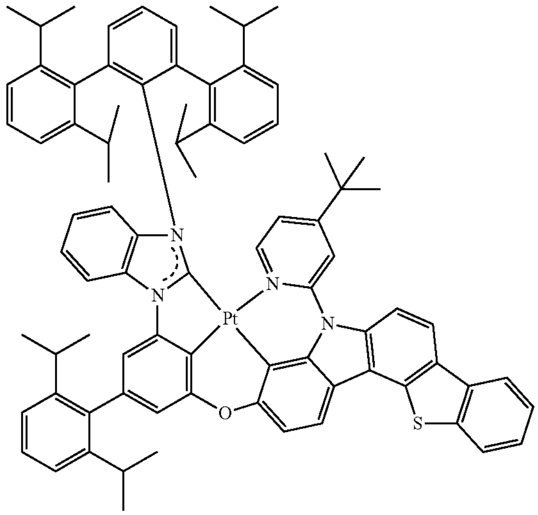
PtS20
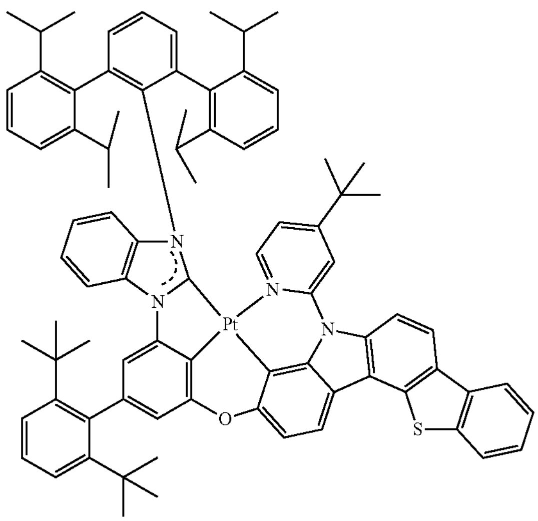

-continued
PtS21
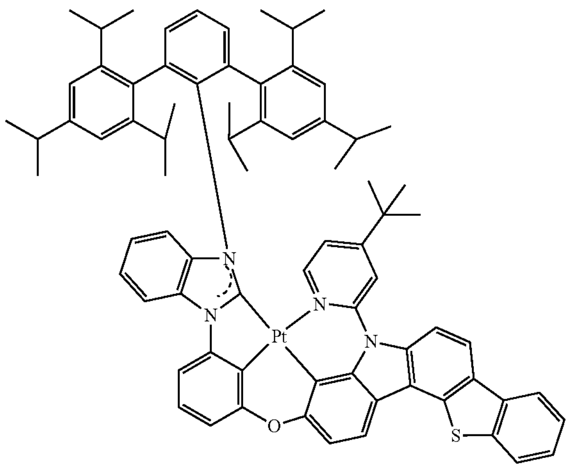
PtS22
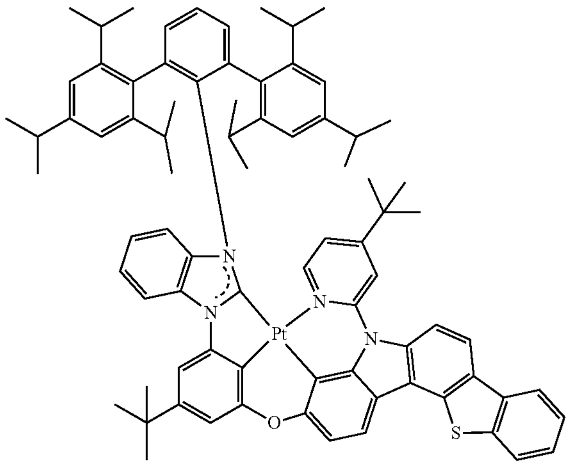
PtS23
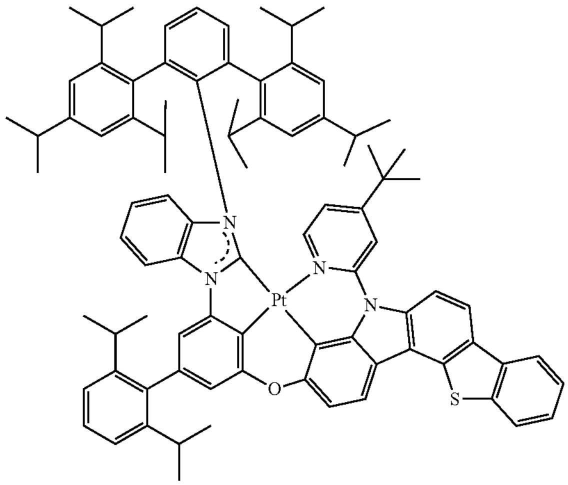
-continued
PtS24
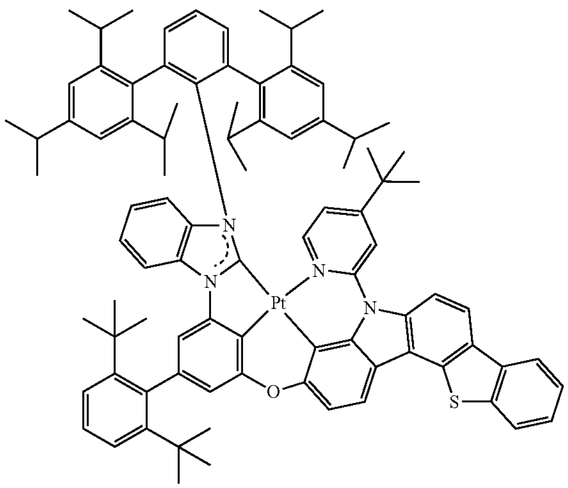
PtS25
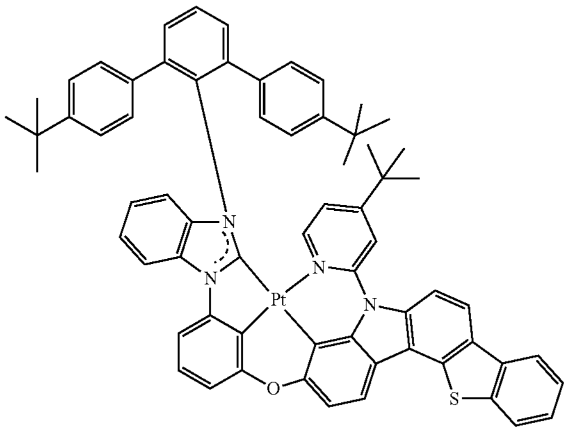
PtS26
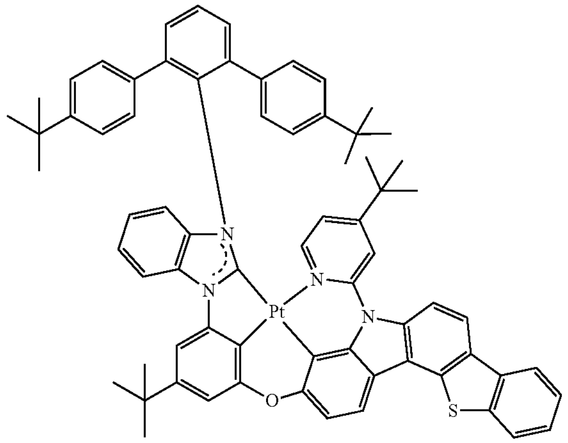

-continued
PtS27
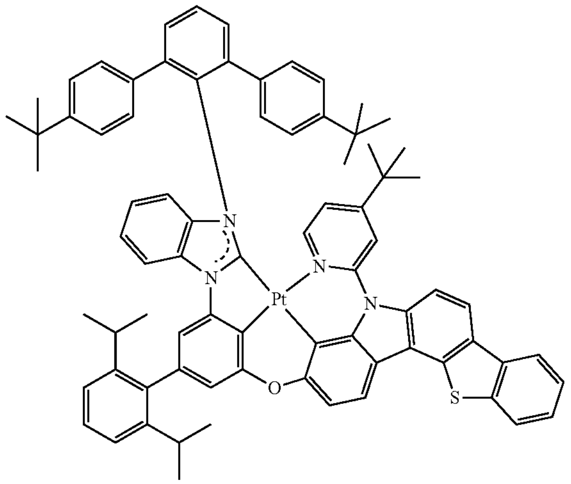
PtS28
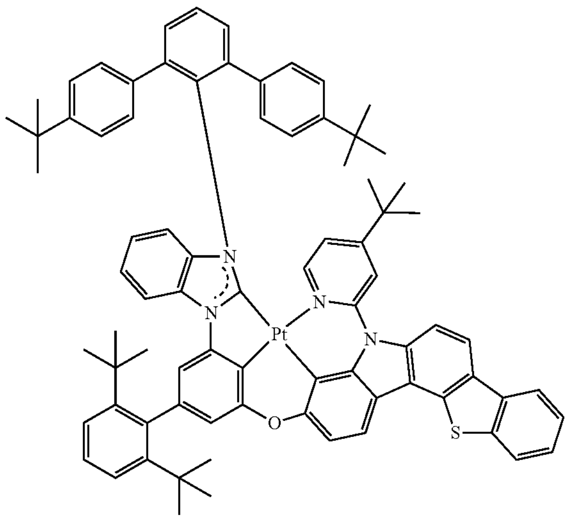
PtS29
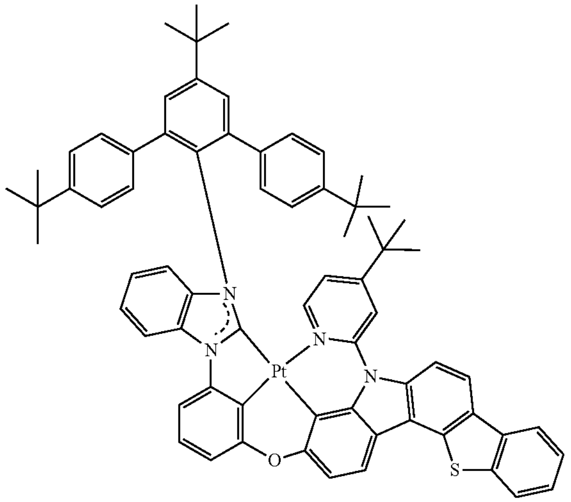
-continued
PtS30
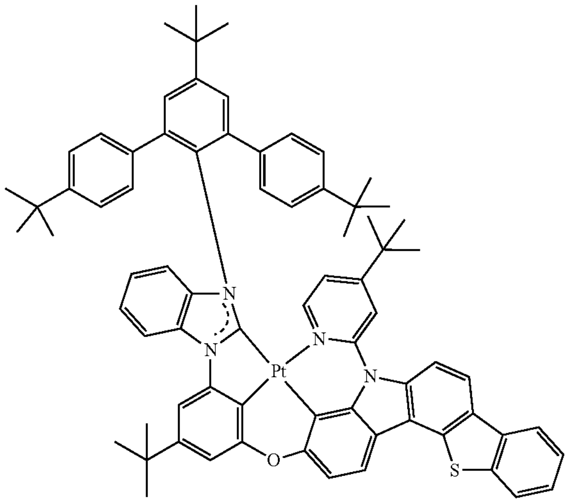
PtS31
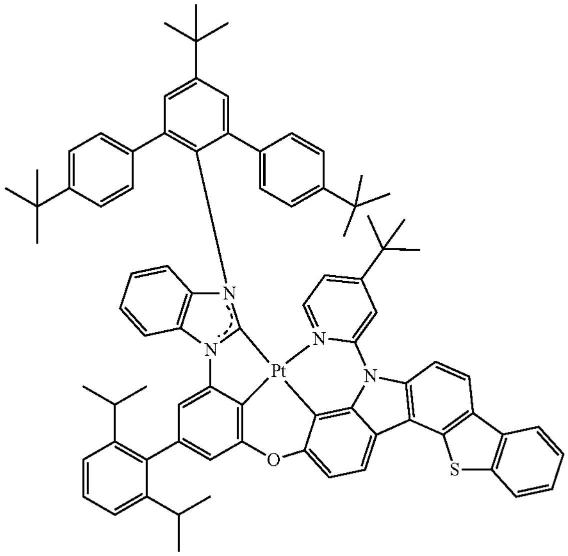

-continued
PtS32
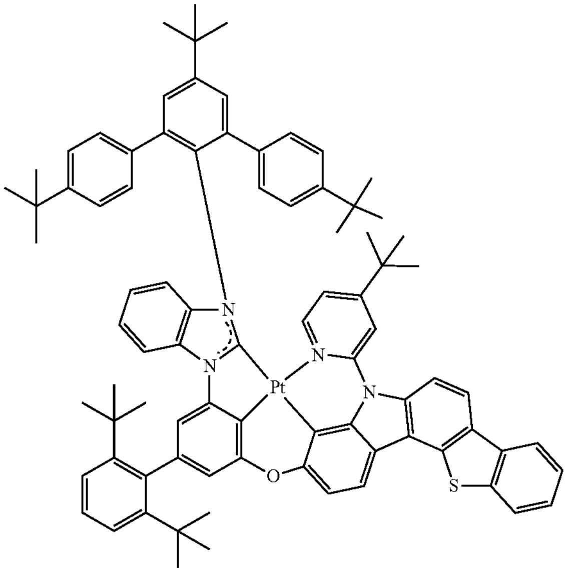
PtS33
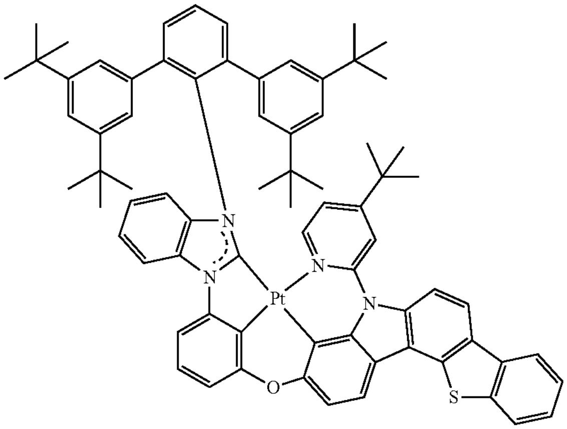
PtS34
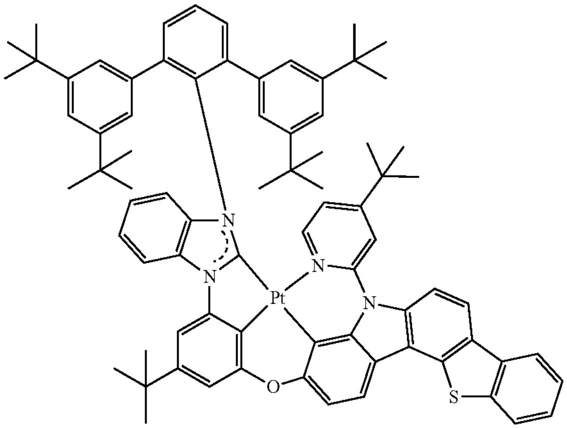
-continued
PtS35
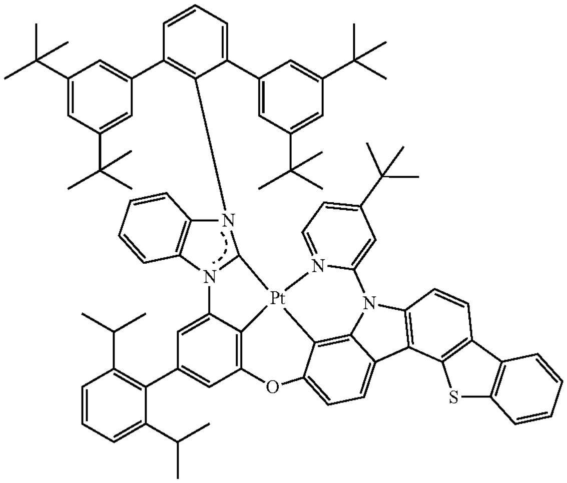
PtS36
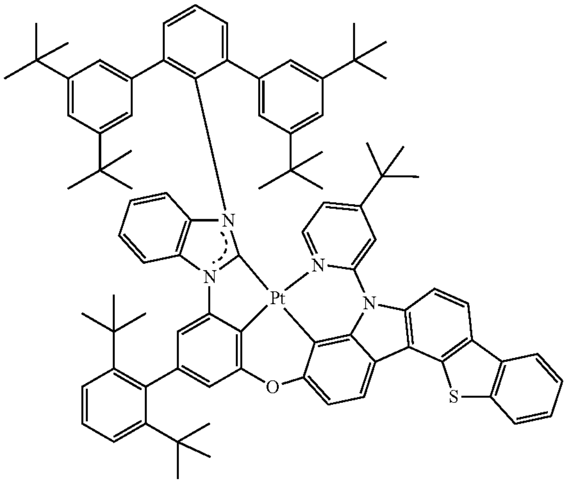
PtS37
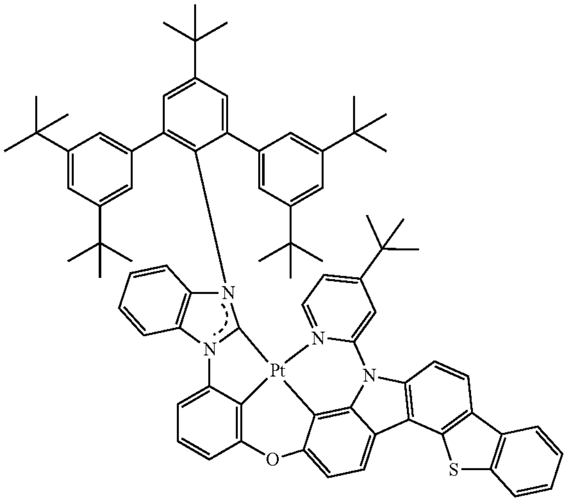

-continued
PtS38
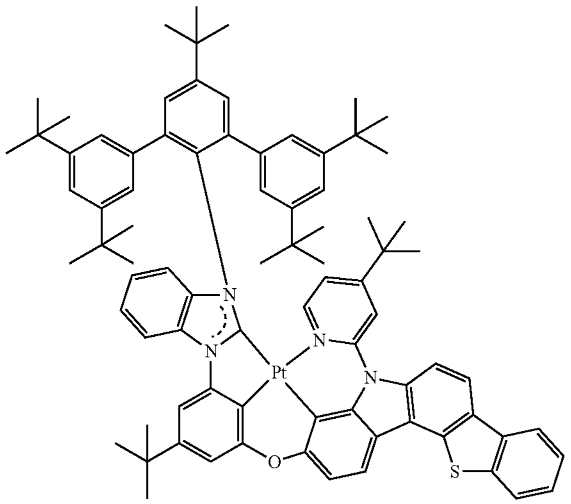
PtS39
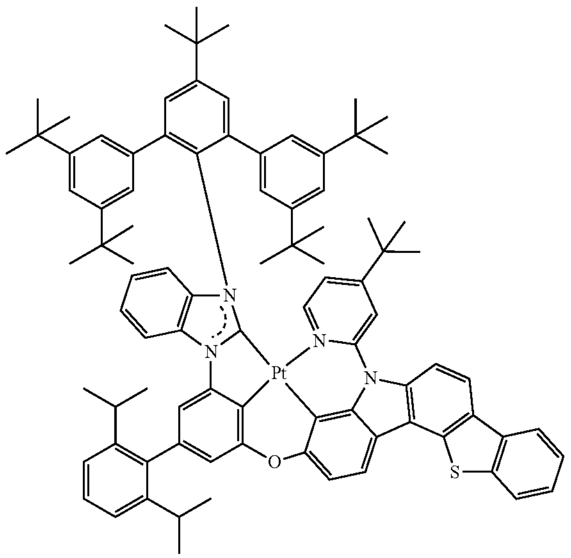
-continued
PtS40
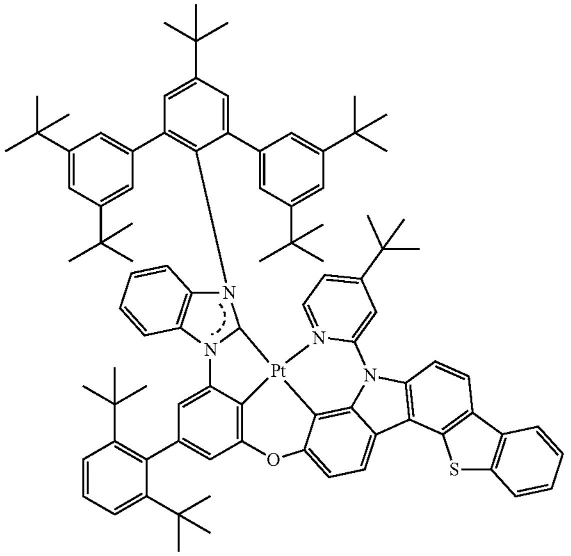
PtS41
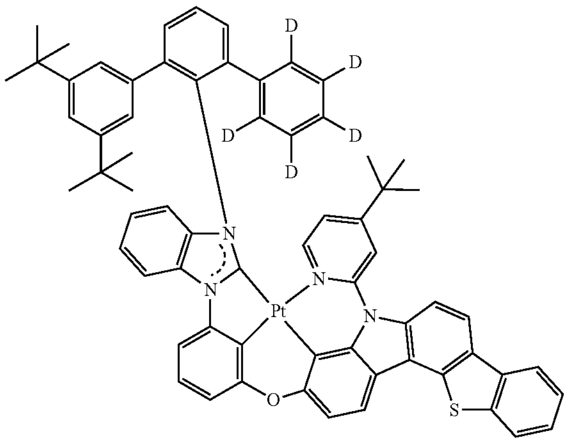
PtS42
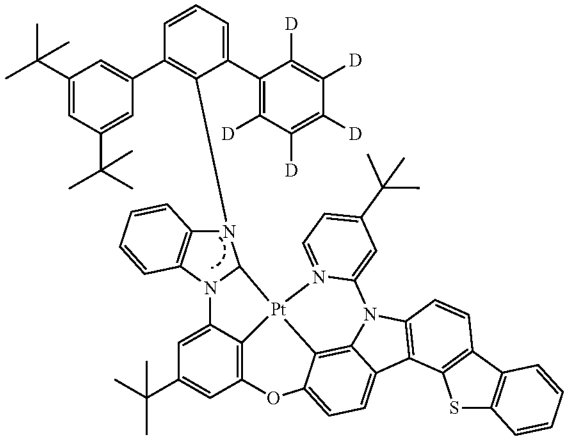

-continued
PtS43
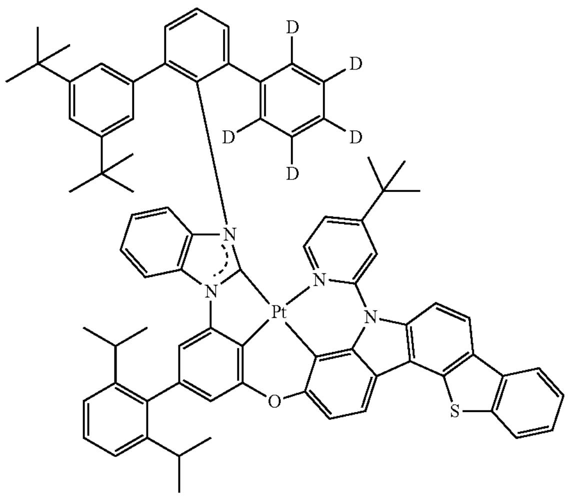
PtS44
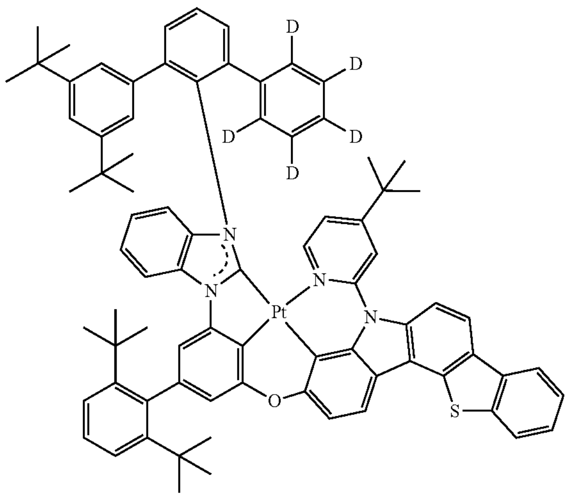
PtS45
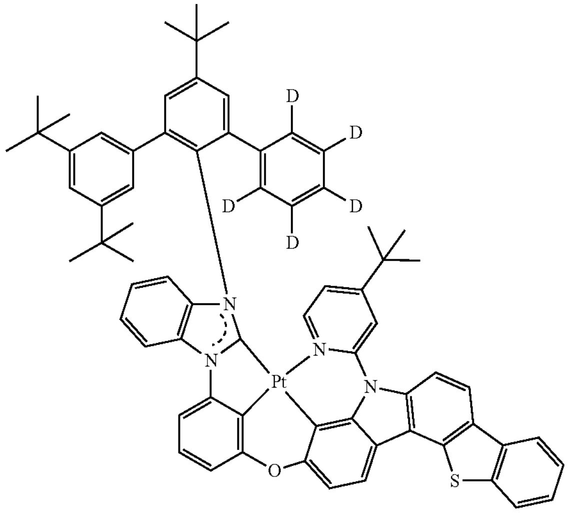
-continued
PtS46
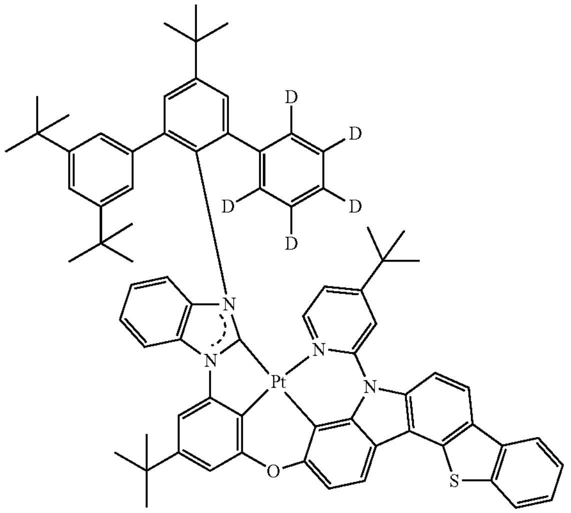
PtS47
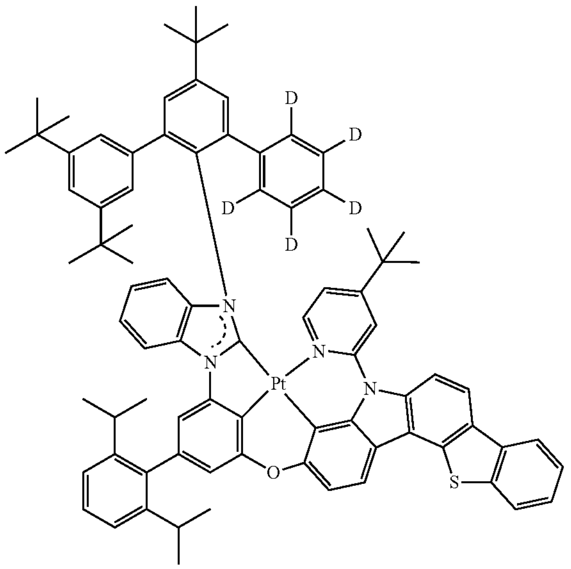

-continued
PtS48
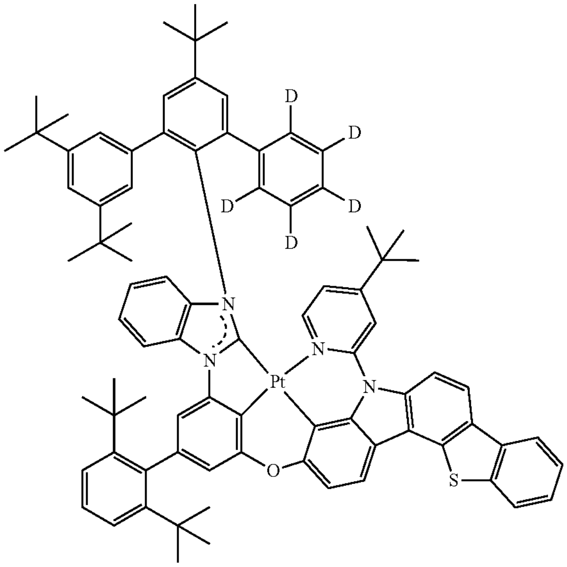
PtS49
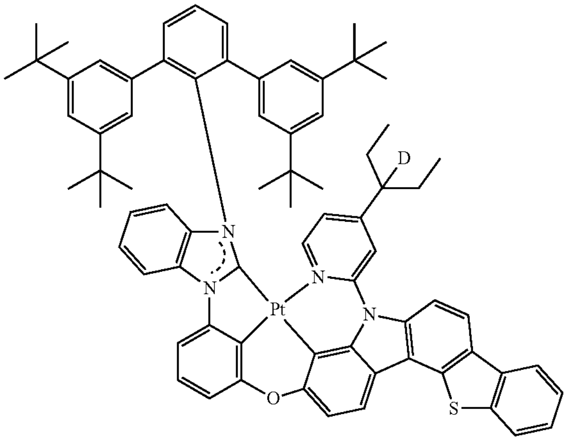
PtS50
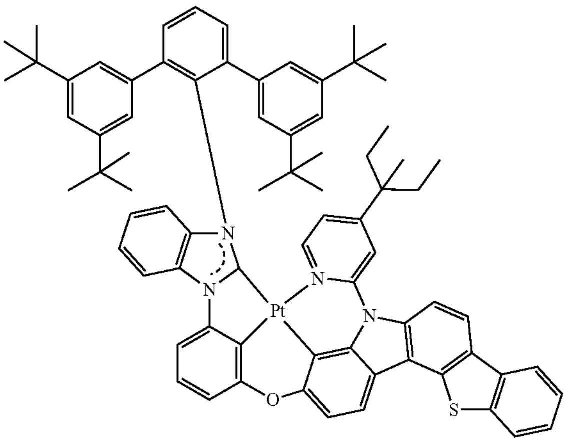
-continued
PtS51
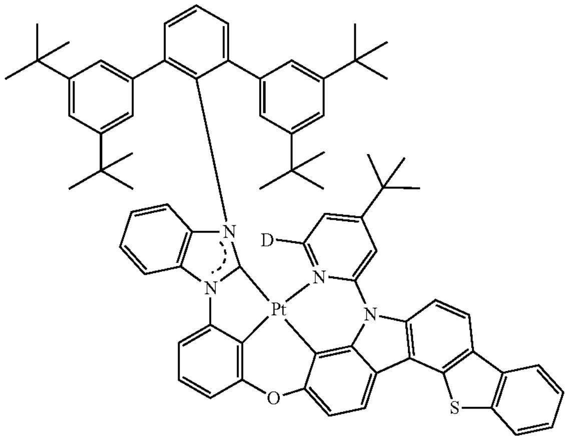
PtS52
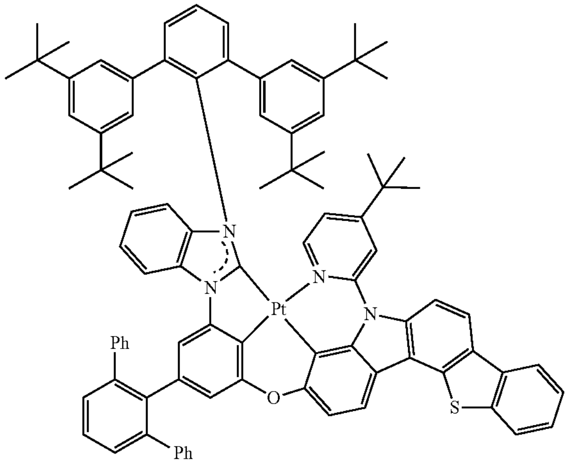
PtS53
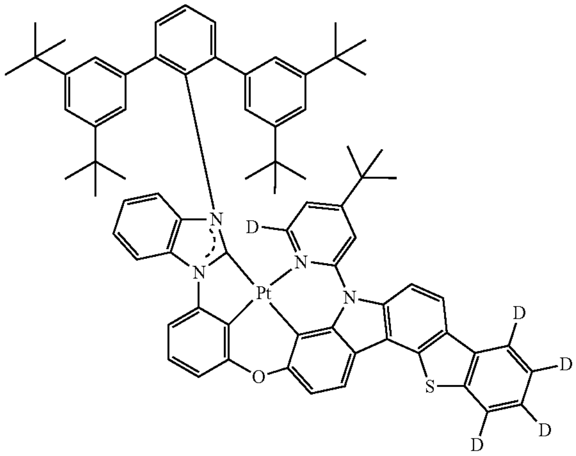

-continued
PtS54
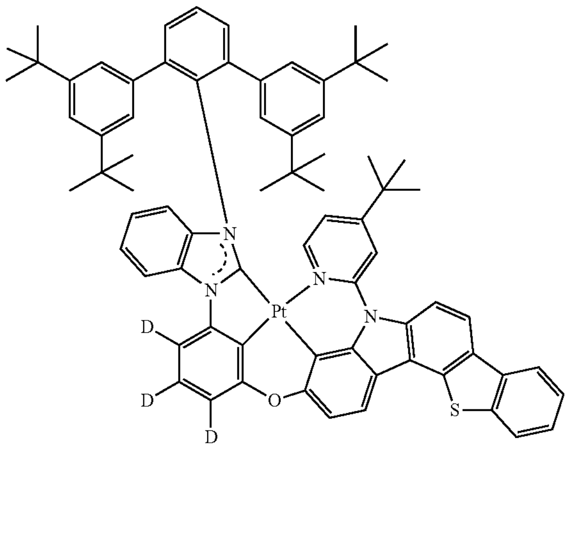
PtS55
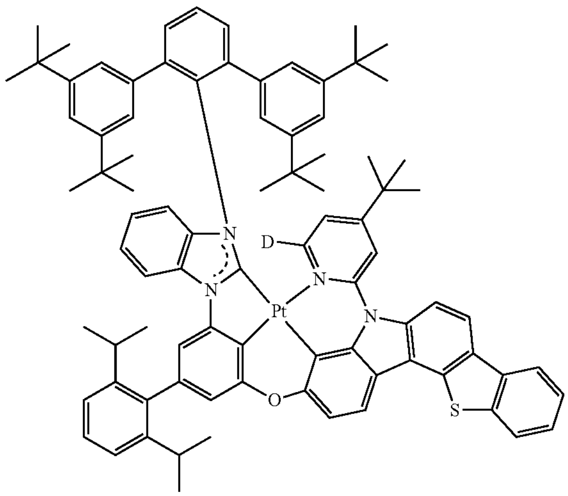
PtS56
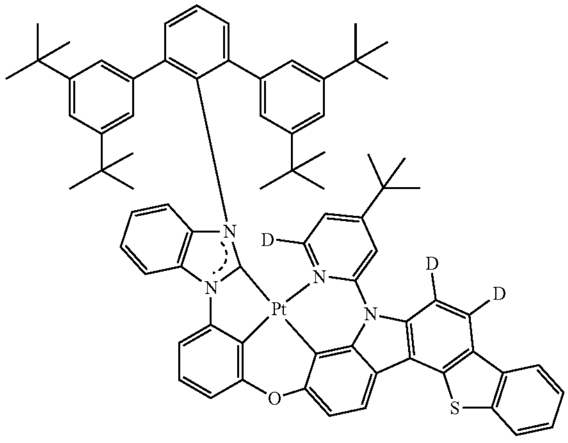
-continued
PtS57
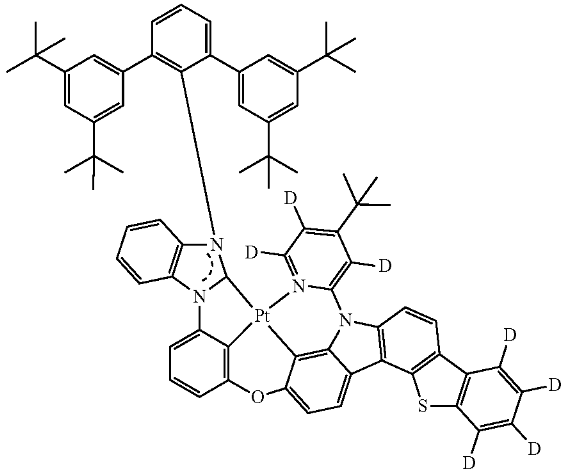
PtS58
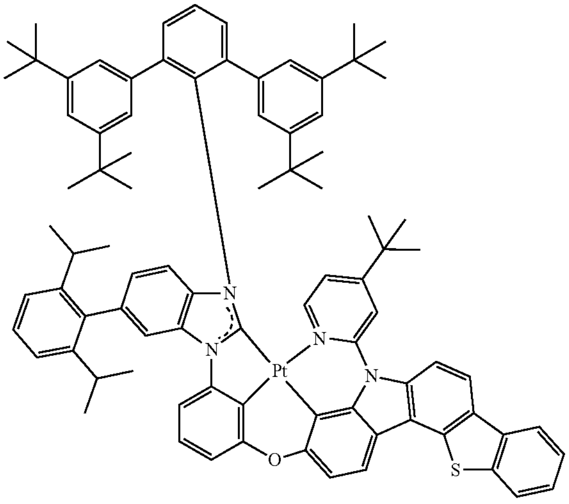
PtS59
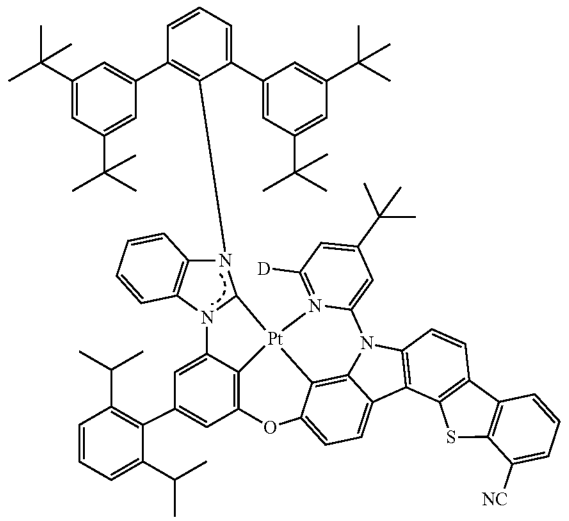

-continued
PtS60
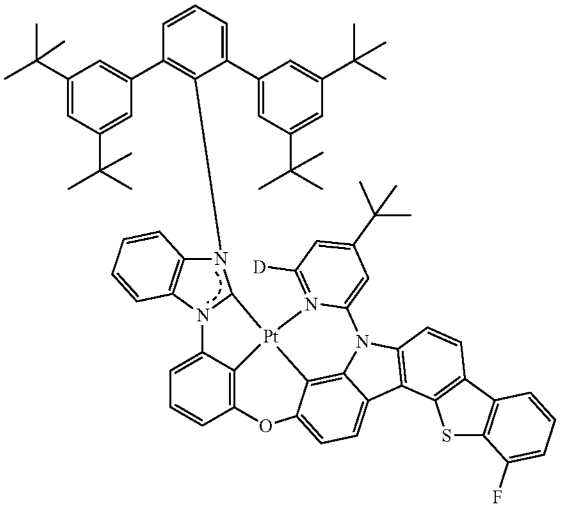
PtS61
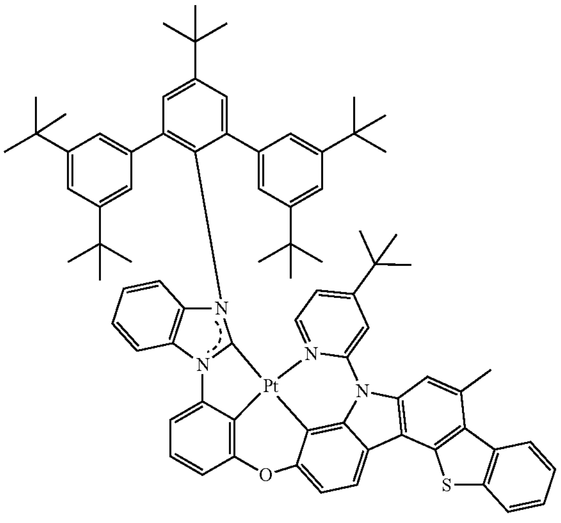
PtS62
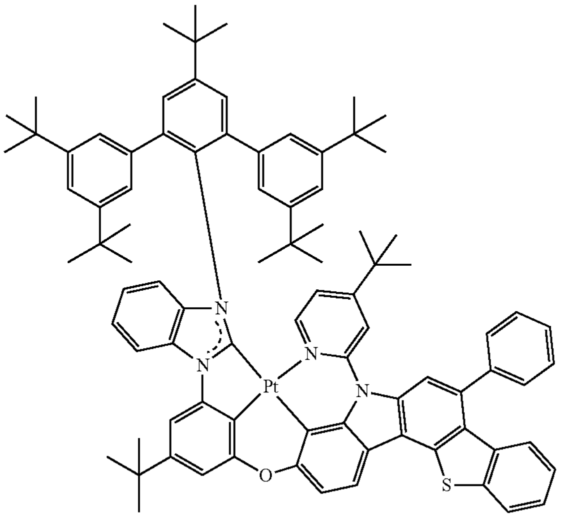
-continued
PtS63
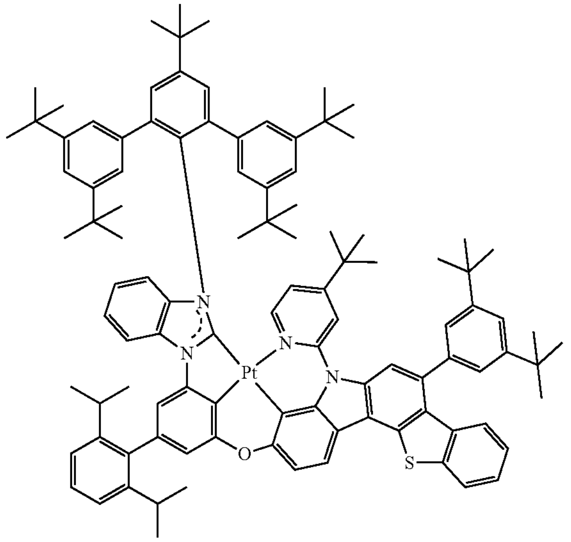
PtS64
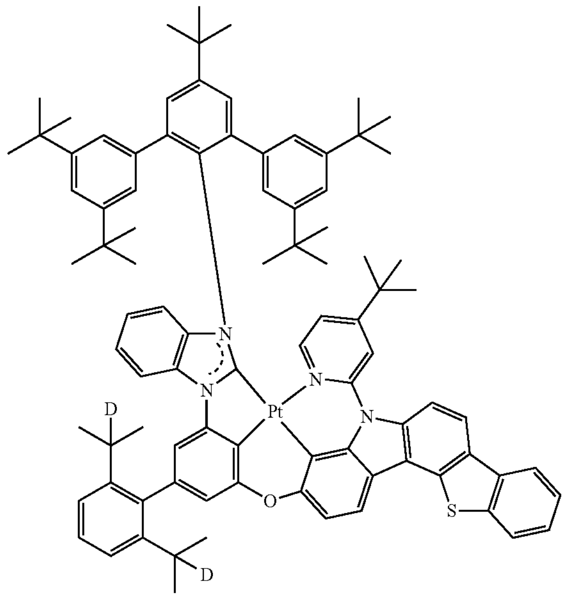
PtS65
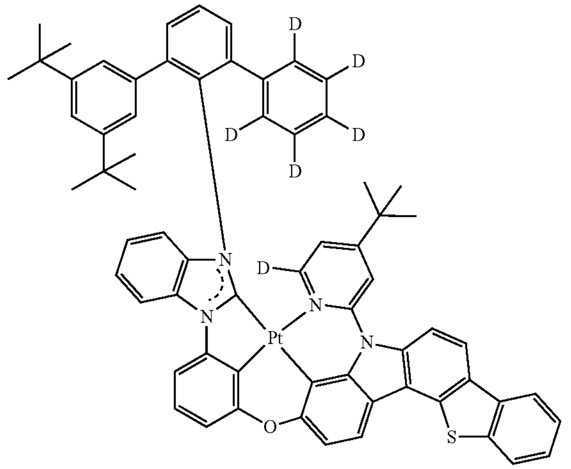

-continued
PtS66
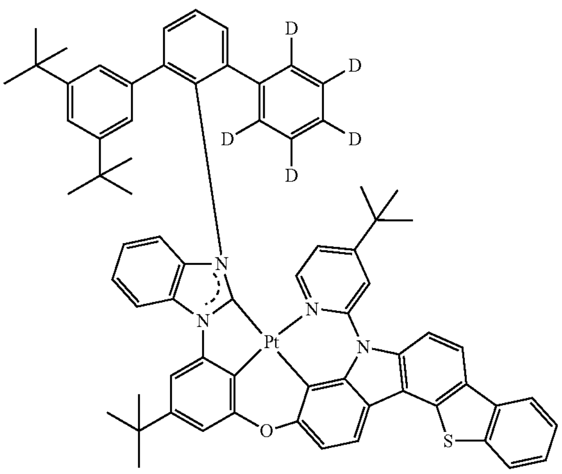
PtS67
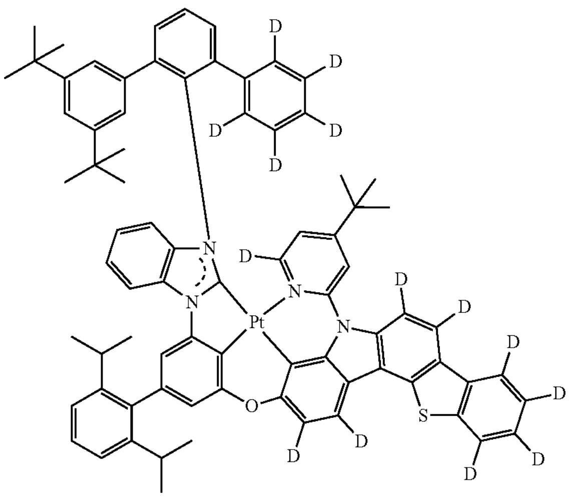
PtS68
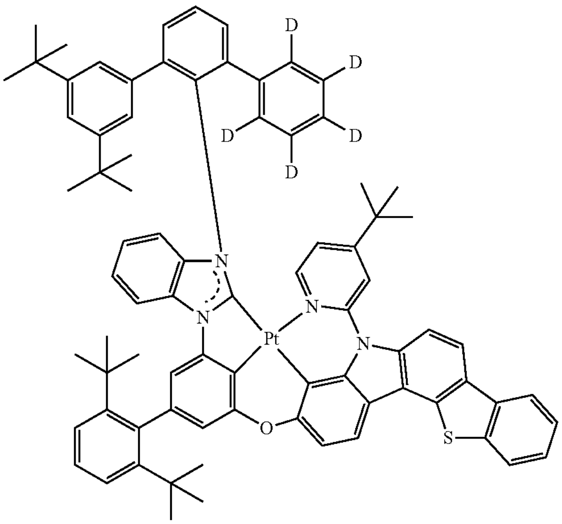
-continued
PtS69
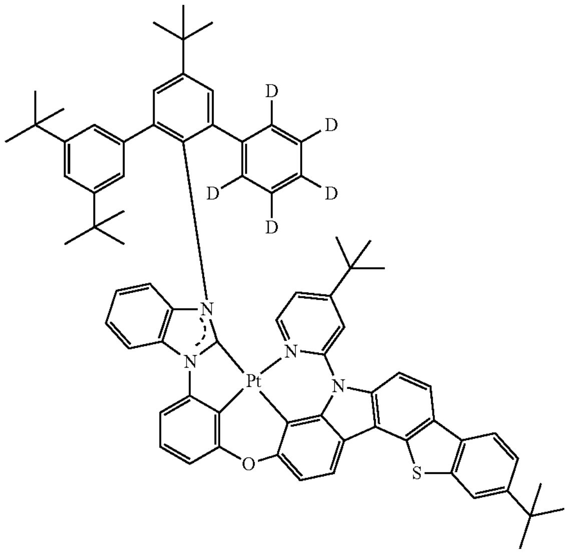
PtS70
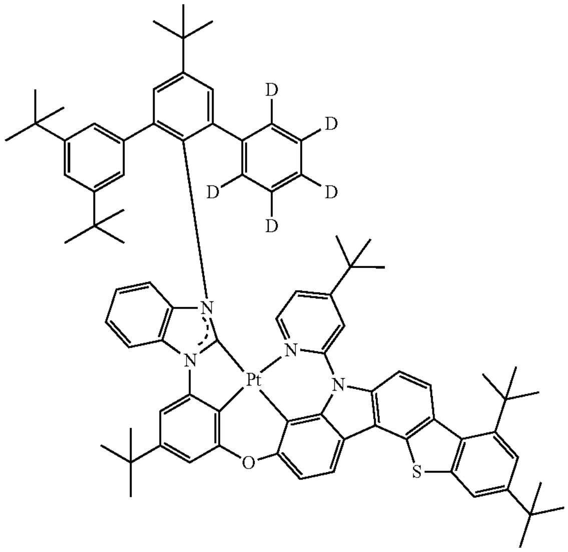

PtS71
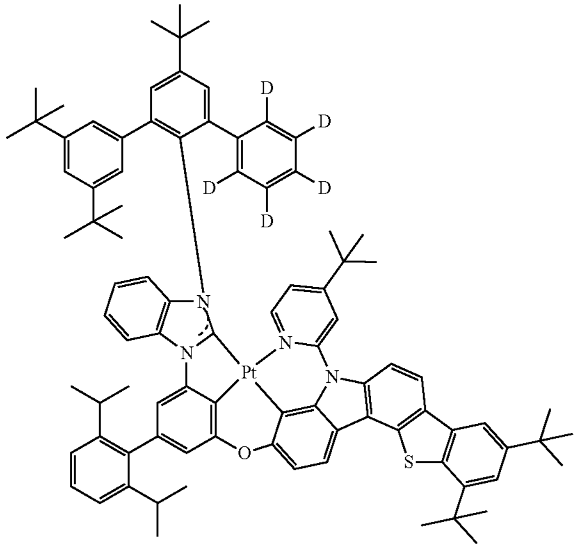
PtS73
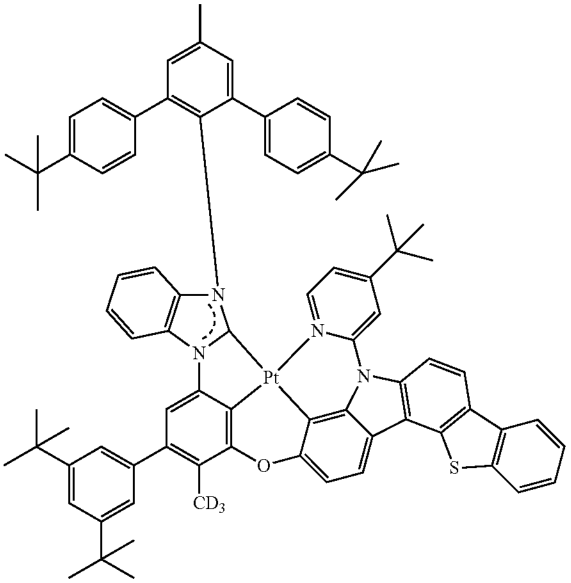
PtS72
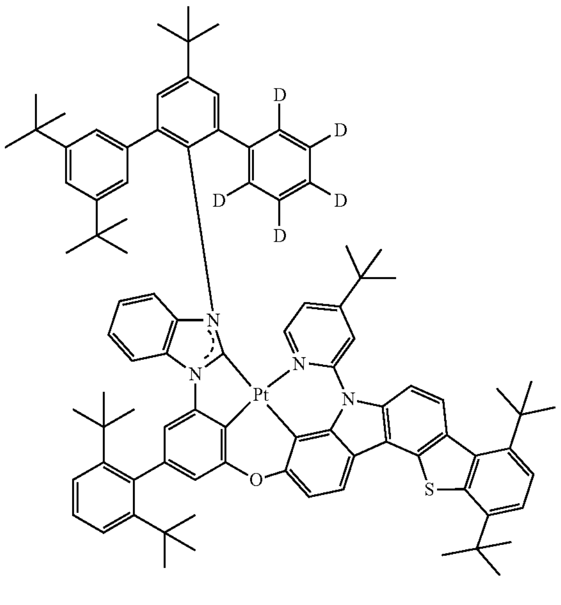
PtS74
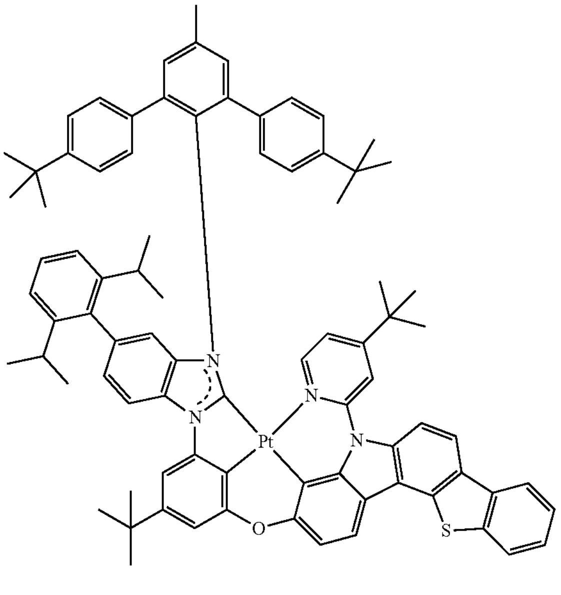

-continued
PtS75
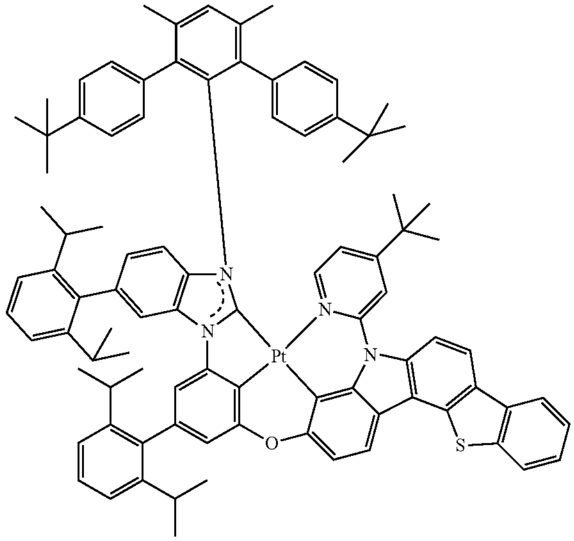
PtS76
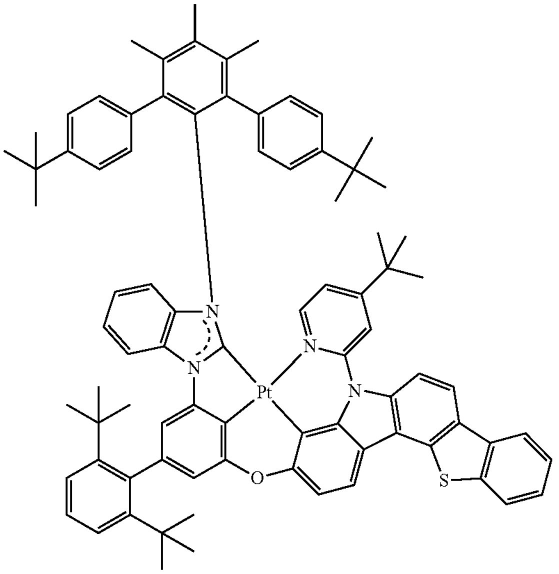
PtS77
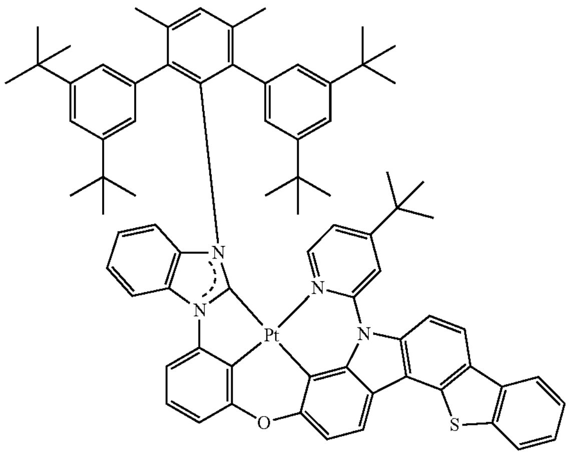
-continued
PtS78
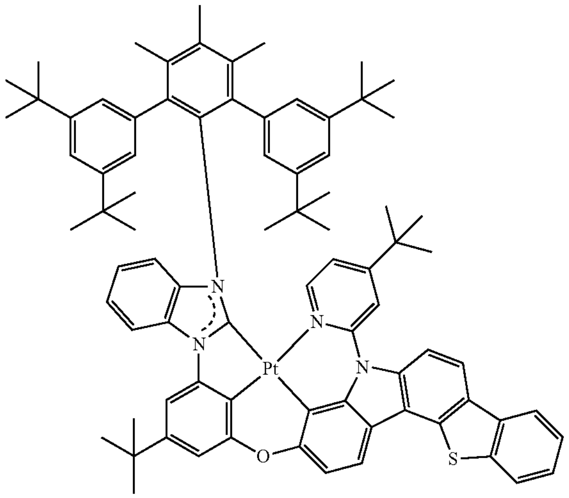
PtS79
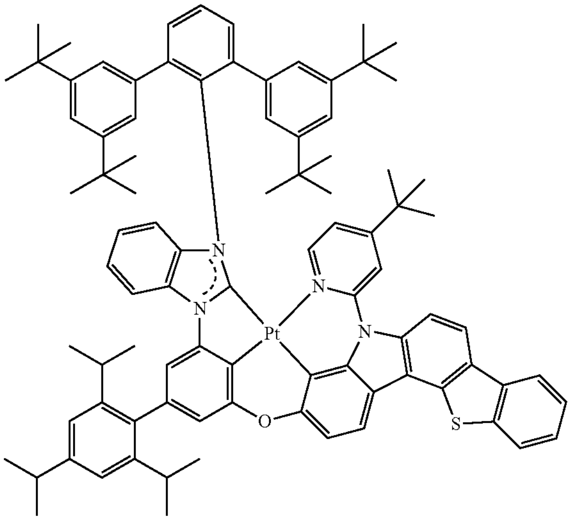
PtS80
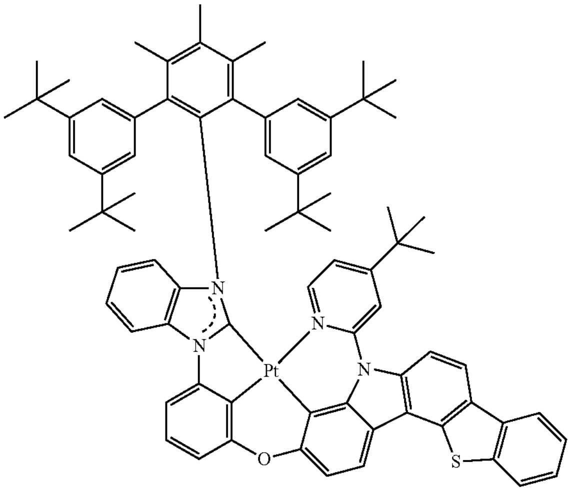

-continued
PtS81
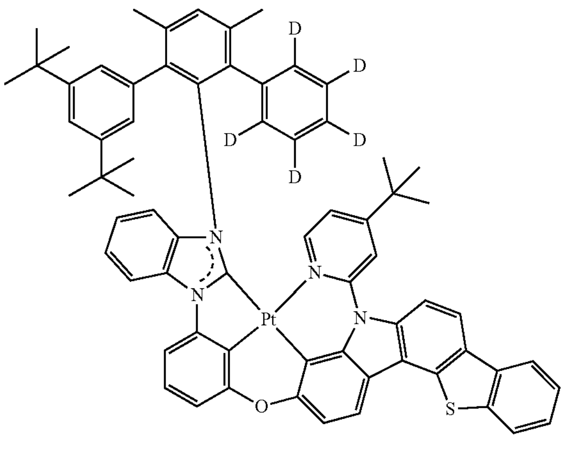
PtS82
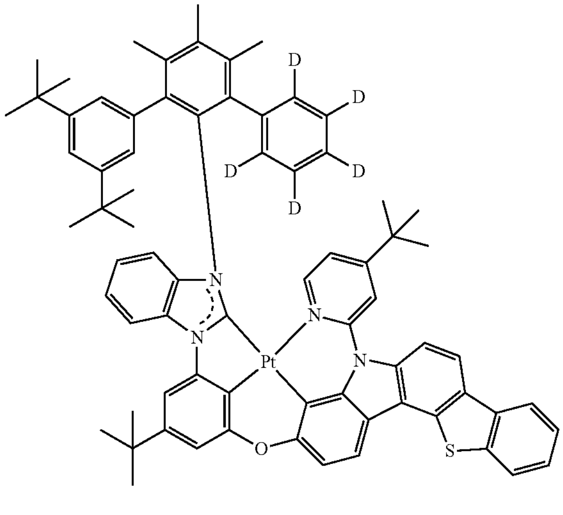
PtS83
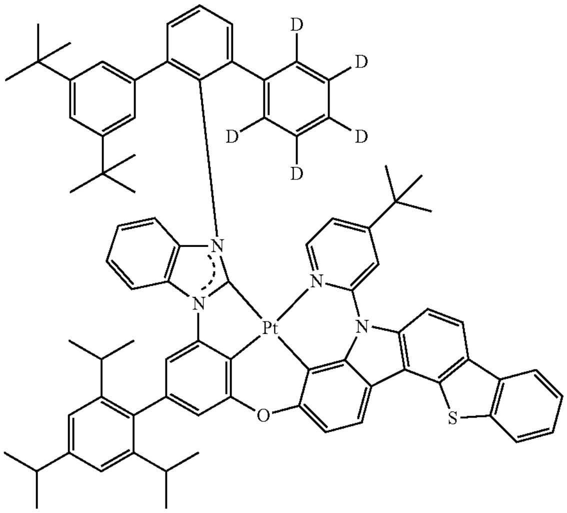
-continued
PtS84
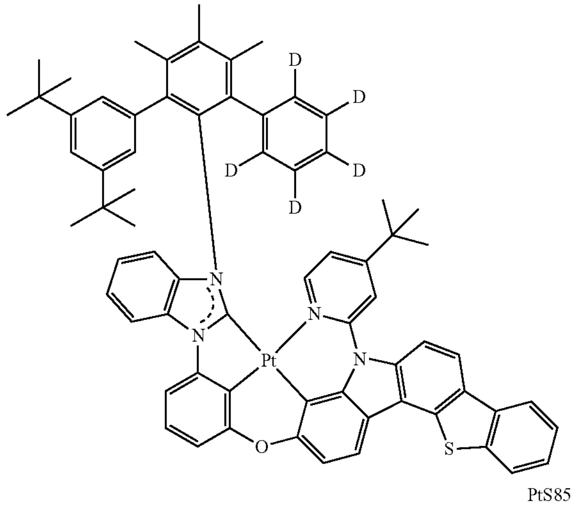
PtS85
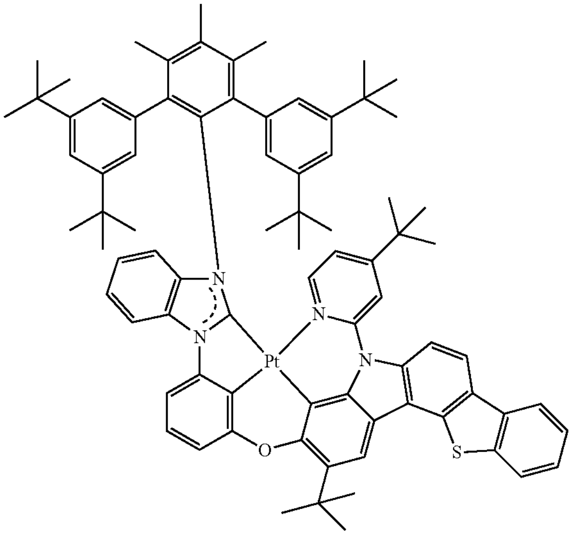
PtS86
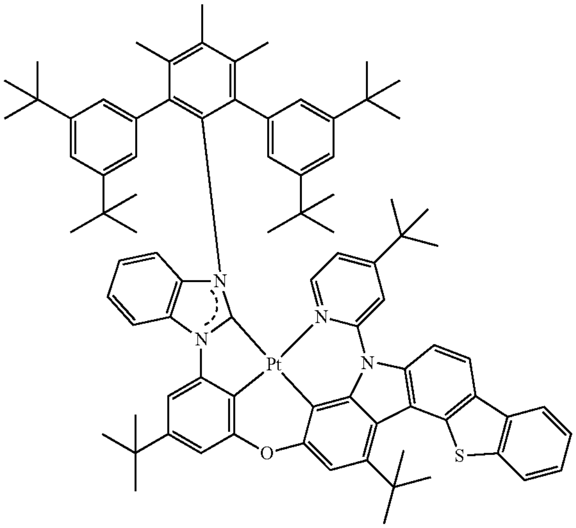

-continued
PtS87
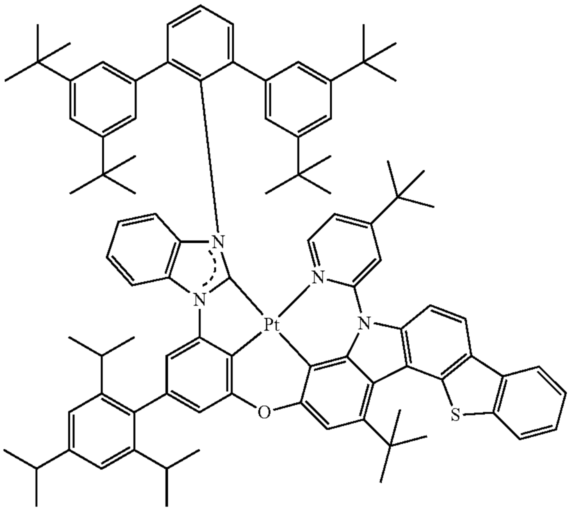
PtS88
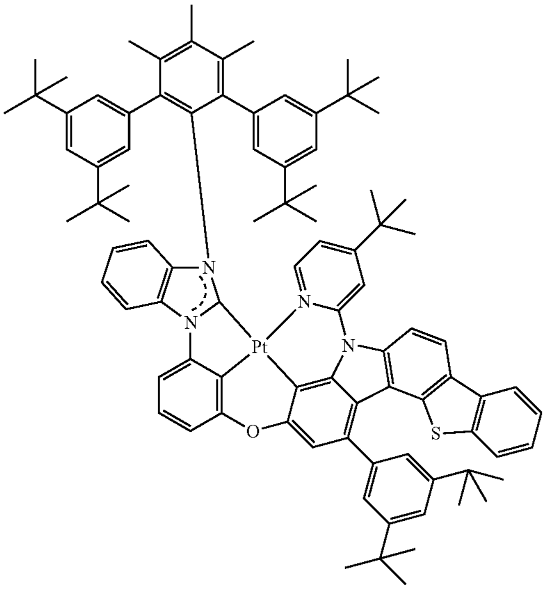
PtS89
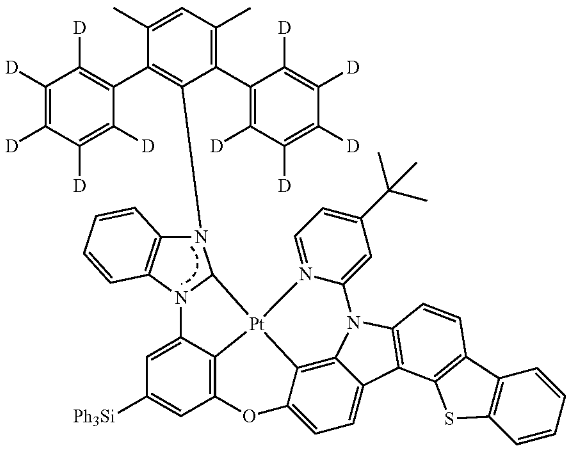
-continued
PtS90
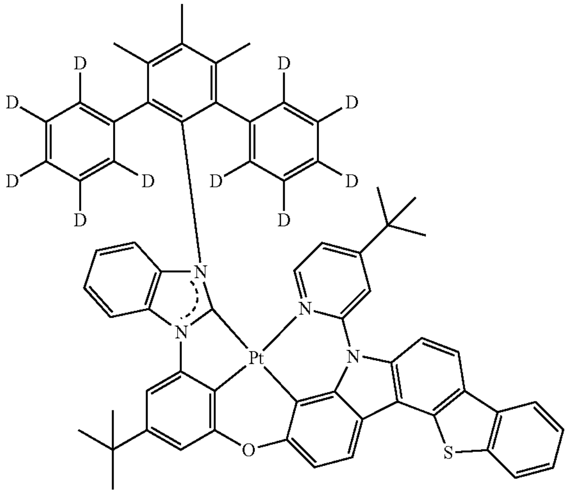
PtS91
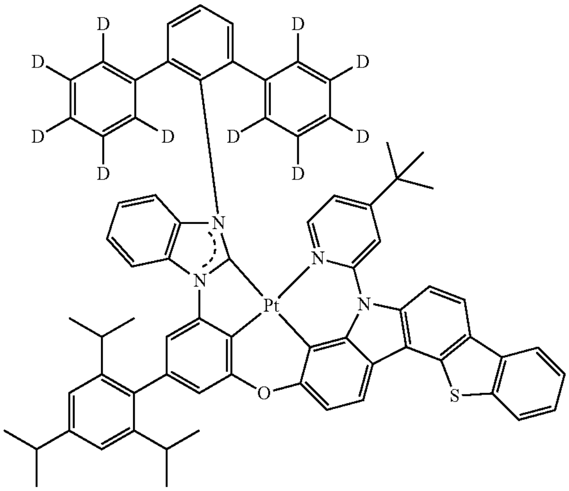
PtS92
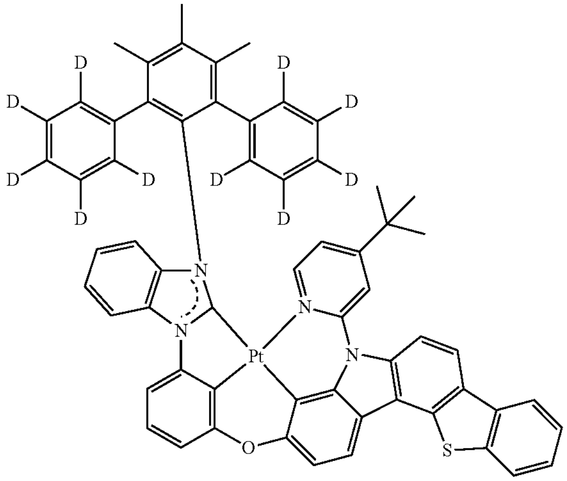

-continued
PtS93
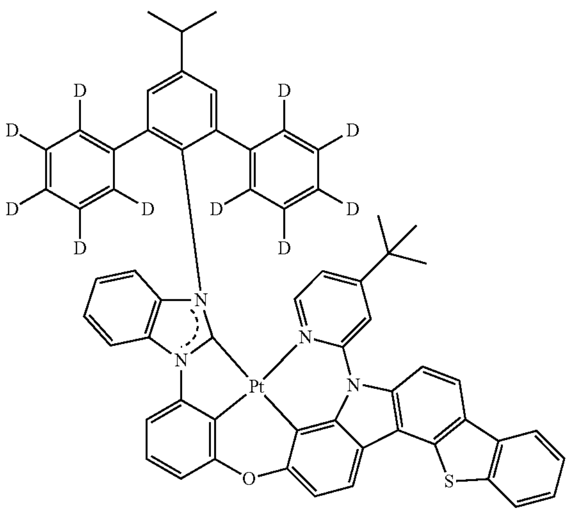
PtS94
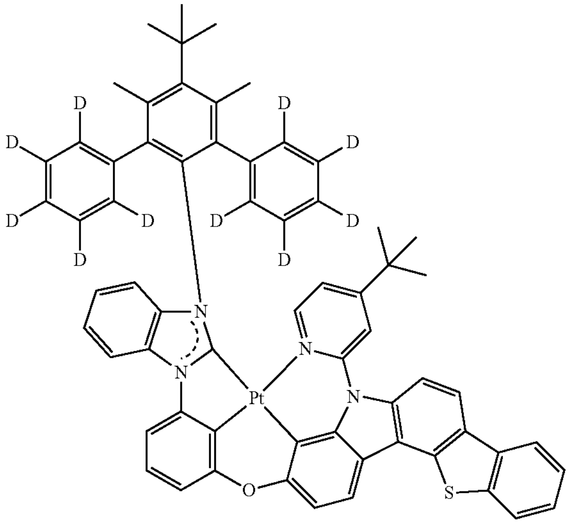
PtS95
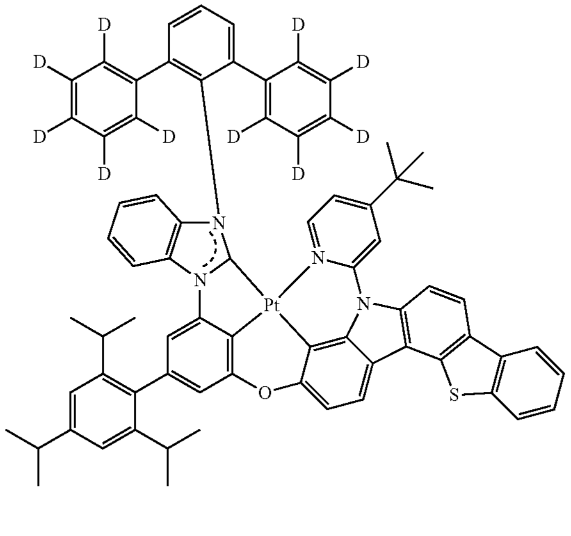
-continued
PtS96
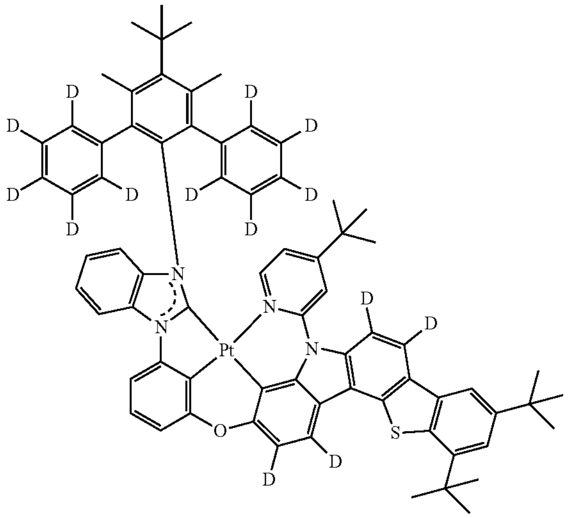
PtS97
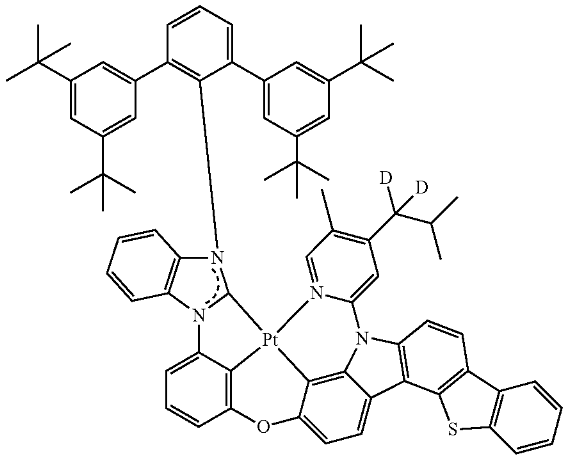
PtS98
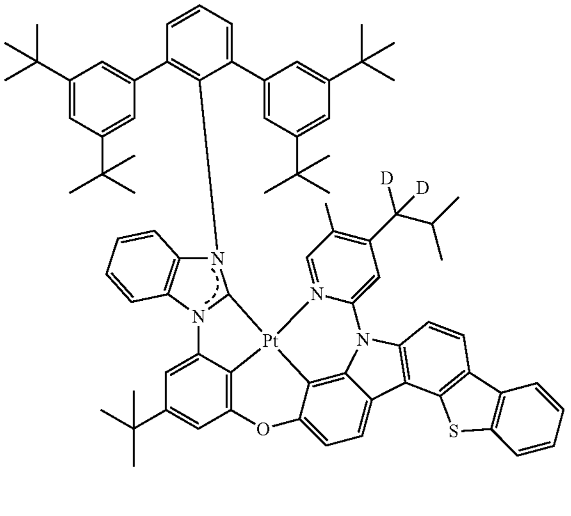

-continued
PtS99
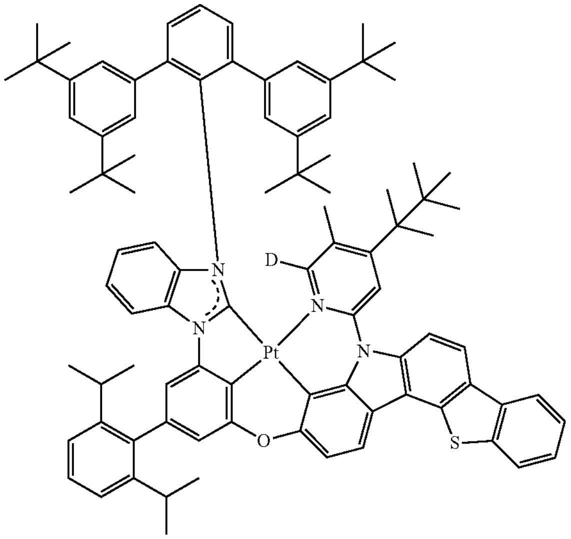
PtS100
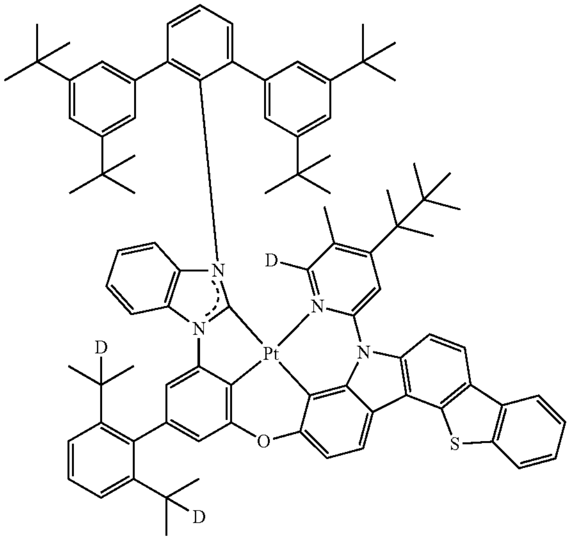
PtS101
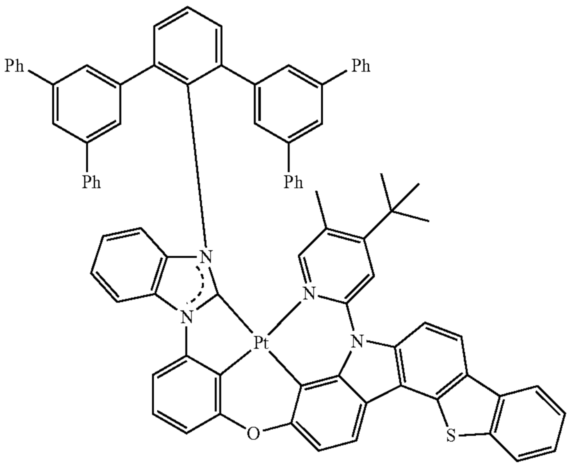
-continued
PtS102
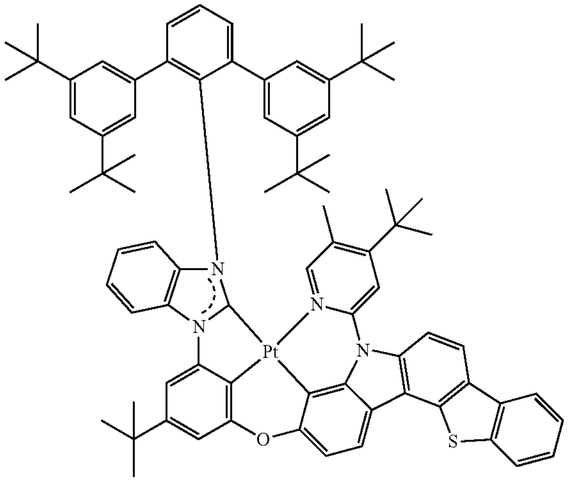
PtS103
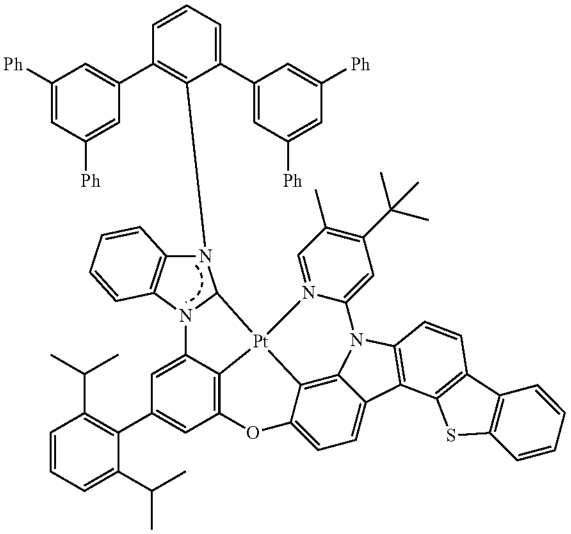
PtS104
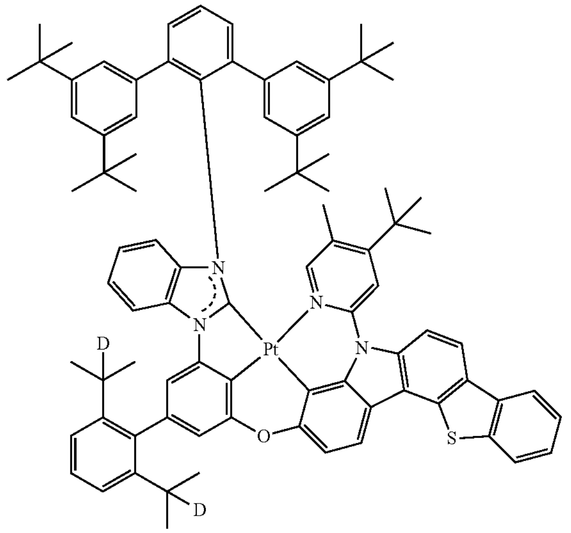

-continued
PtS105
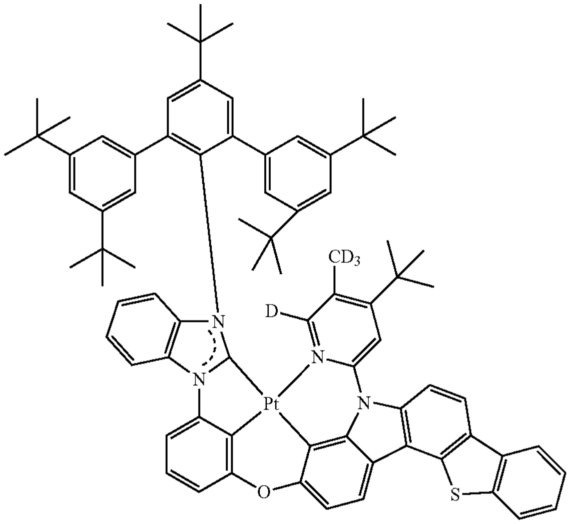
PtS106
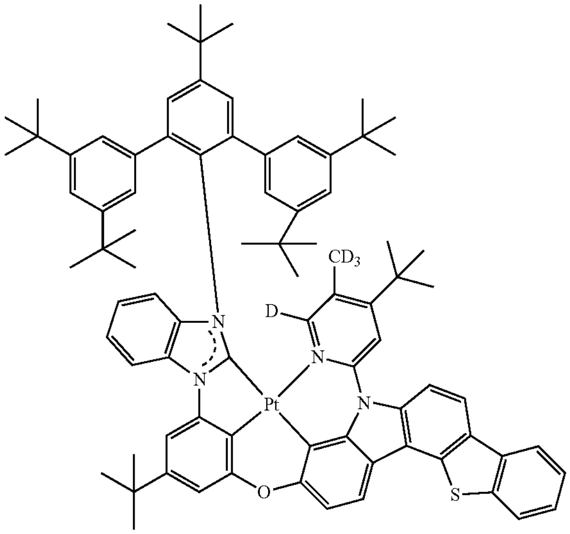
-continued
PtS107
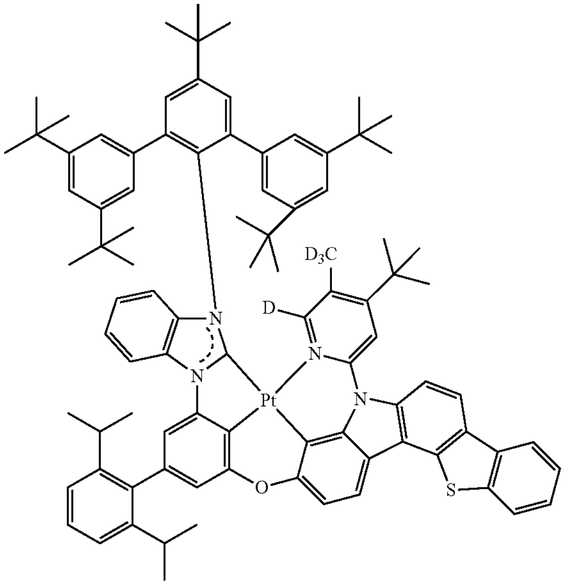
PtS108
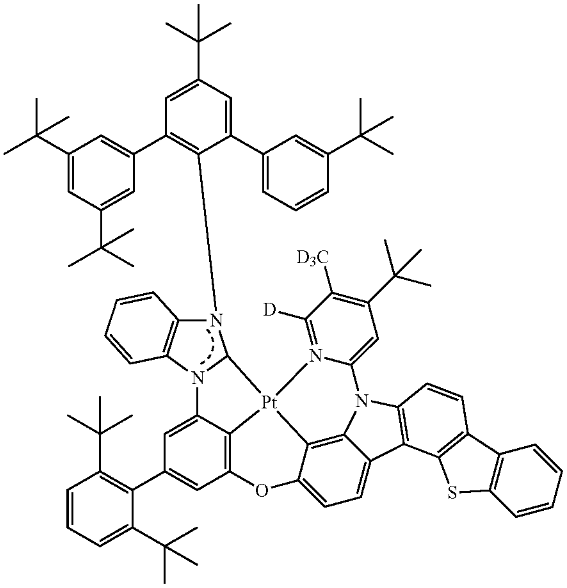

-continued
PtS109
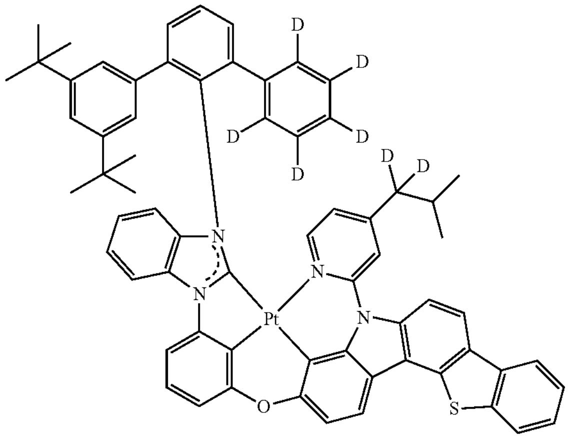
PtS110
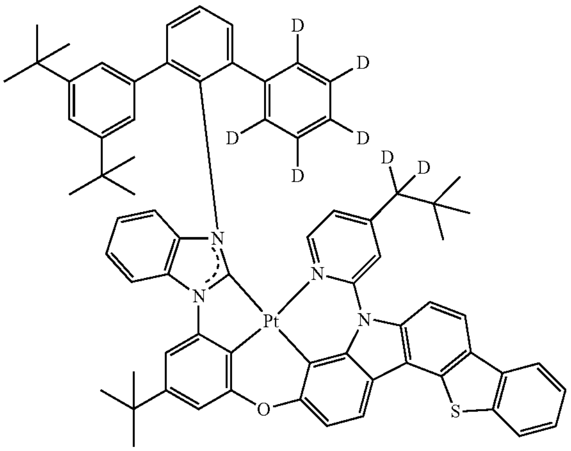
PtS1101
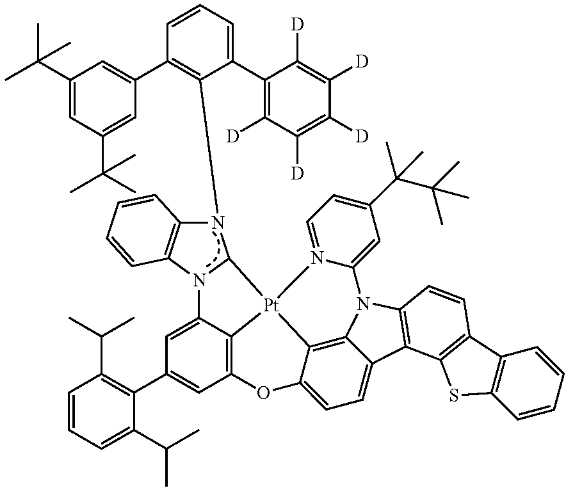
-continued
PtS1102
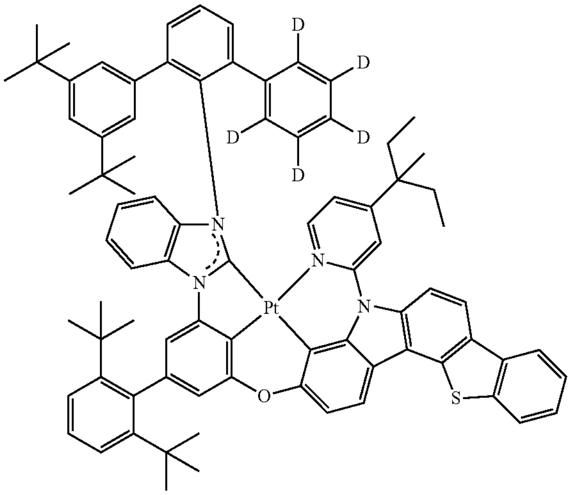
PtS1103
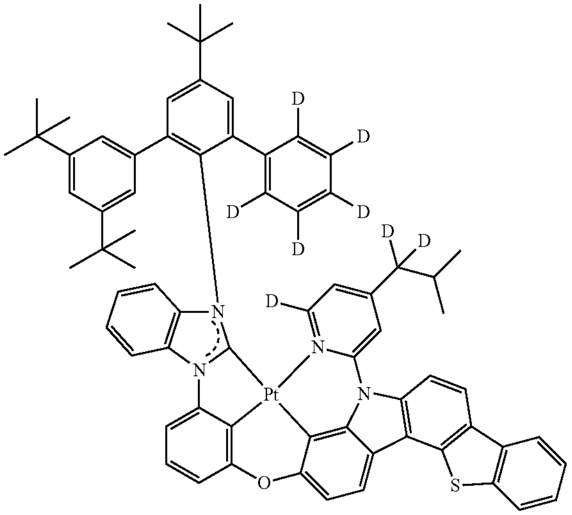
PtS1104
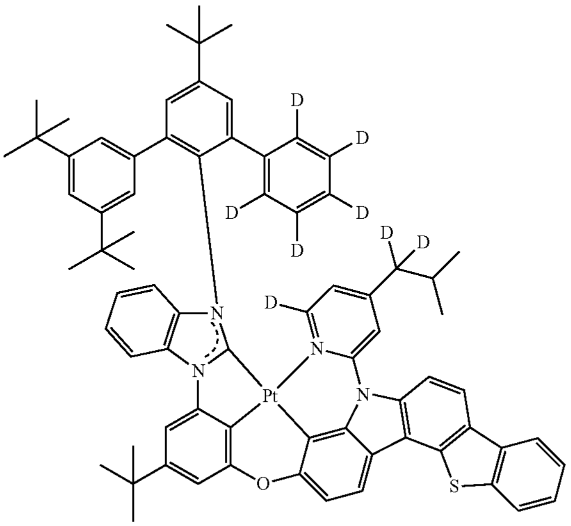

-continued
PtS1105
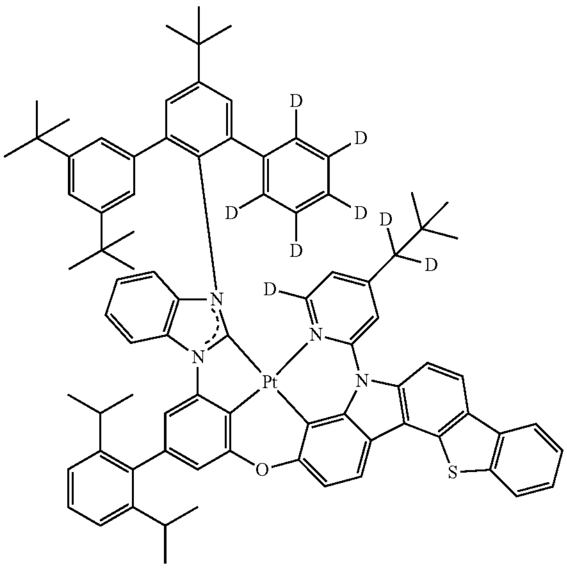
-continued
PtS1107
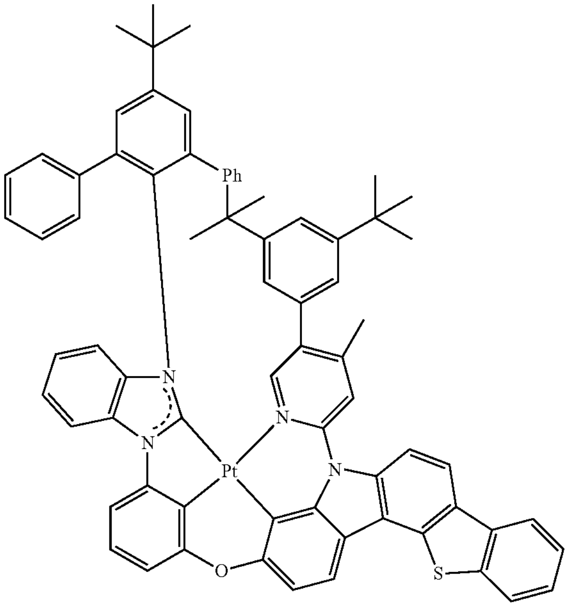
PtS1106
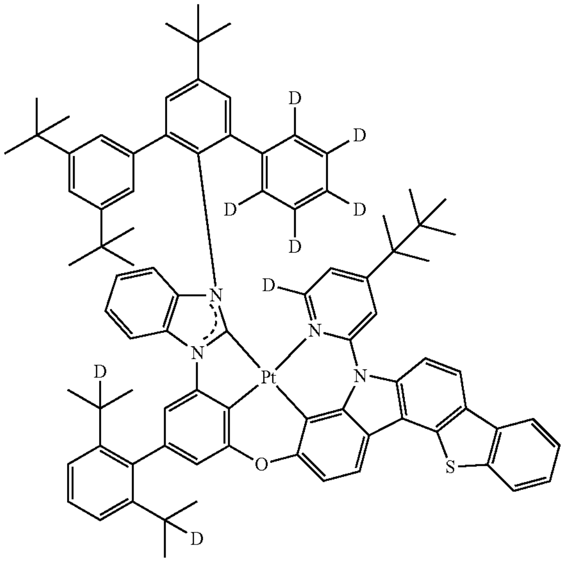
PtS1108
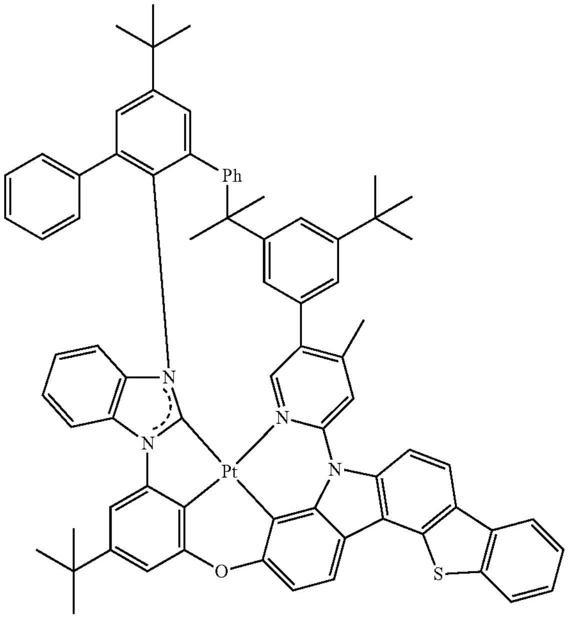

-continued
PtS1109
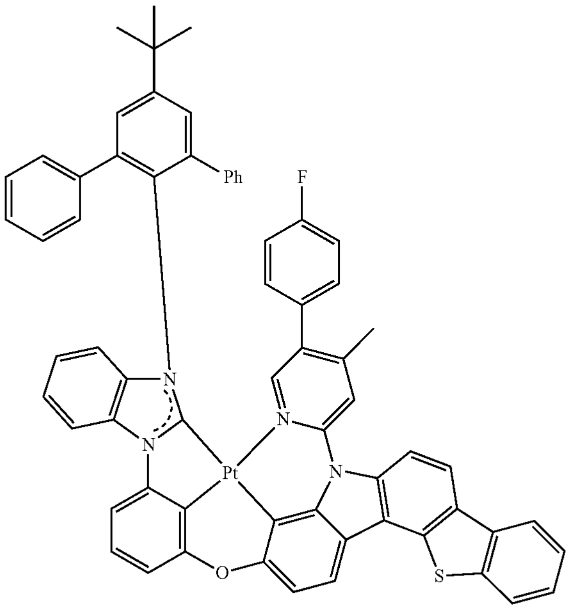
PtS1110
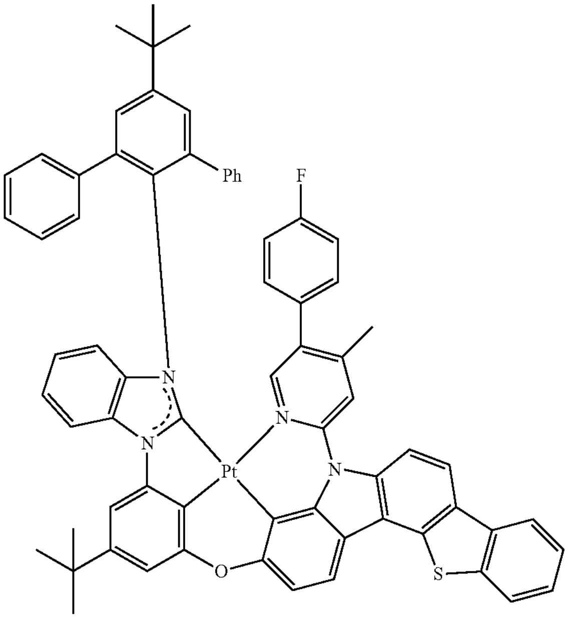
PtS111
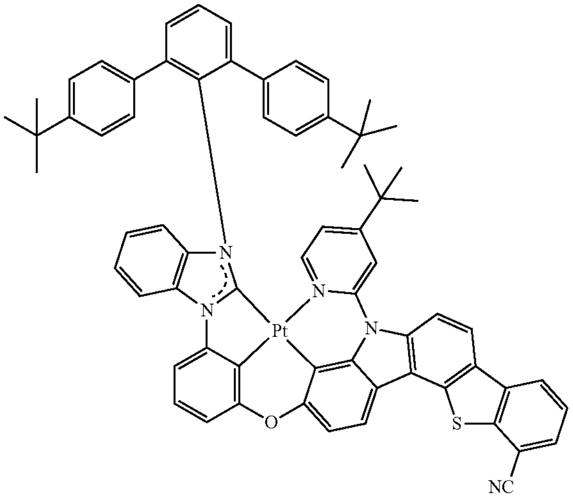
PtS112
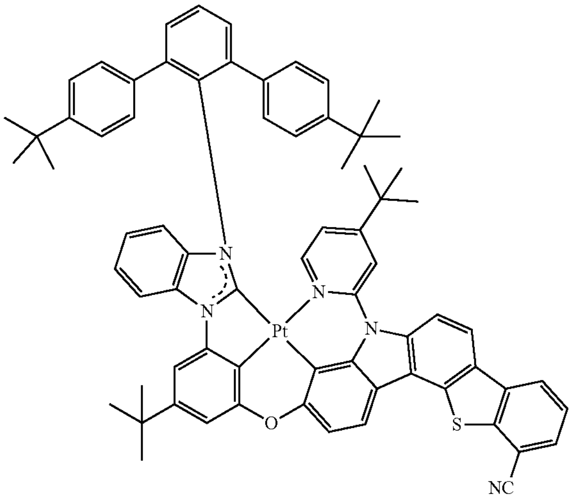
PtS113
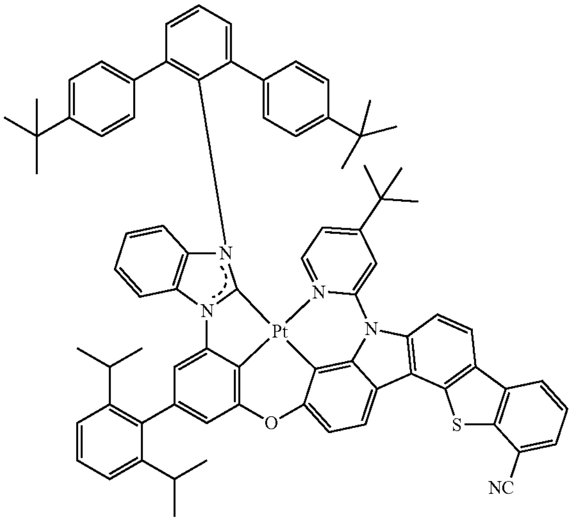

-continued
PtS114
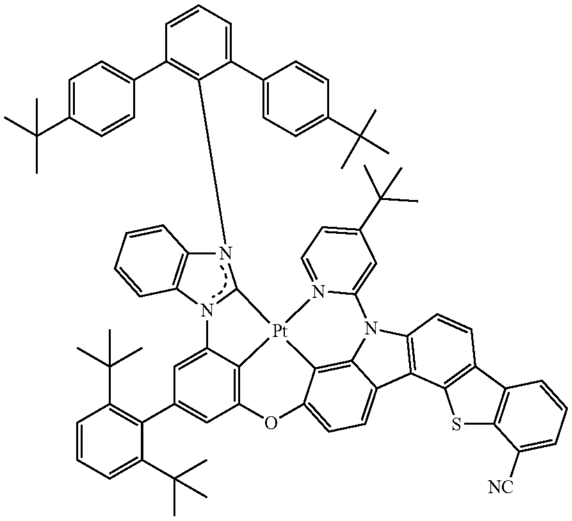
PtS115
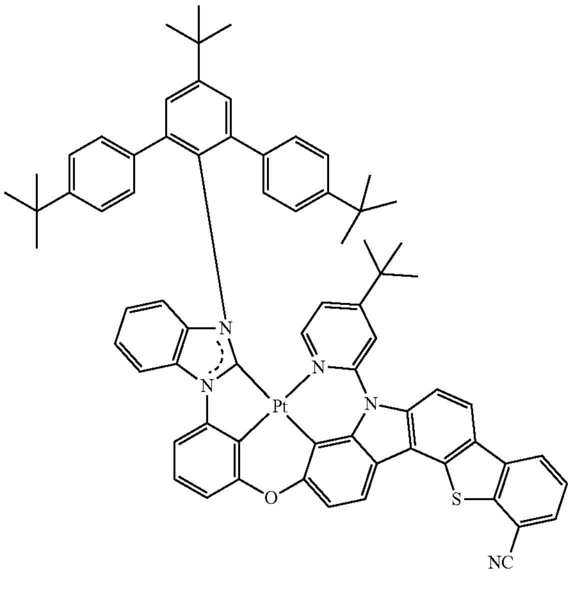
-continued
PtS116
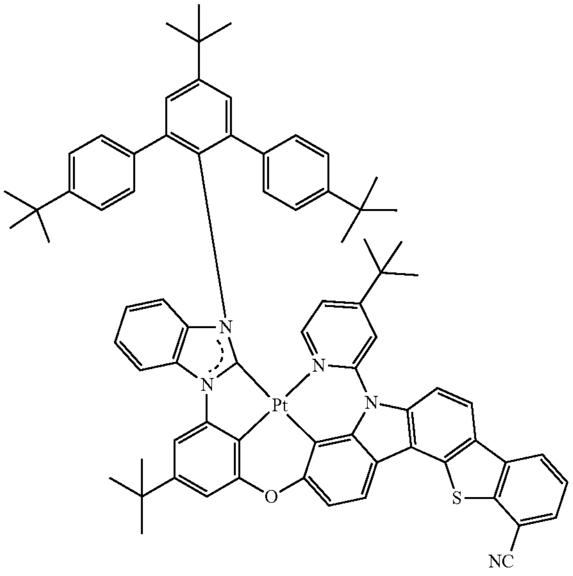
PtS117
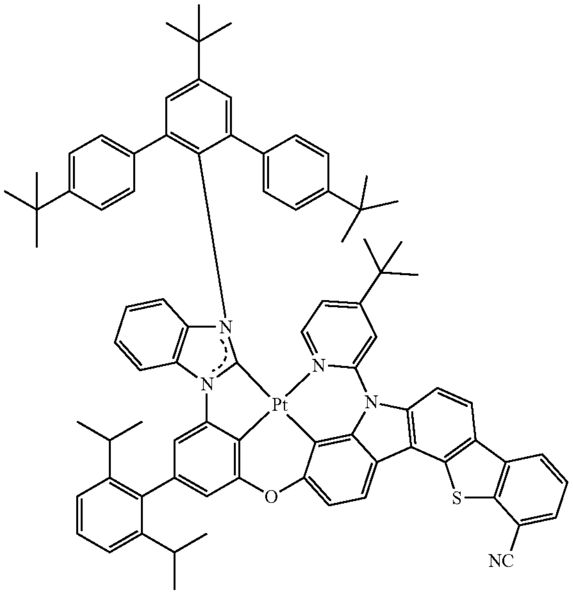

-continued
PtS118
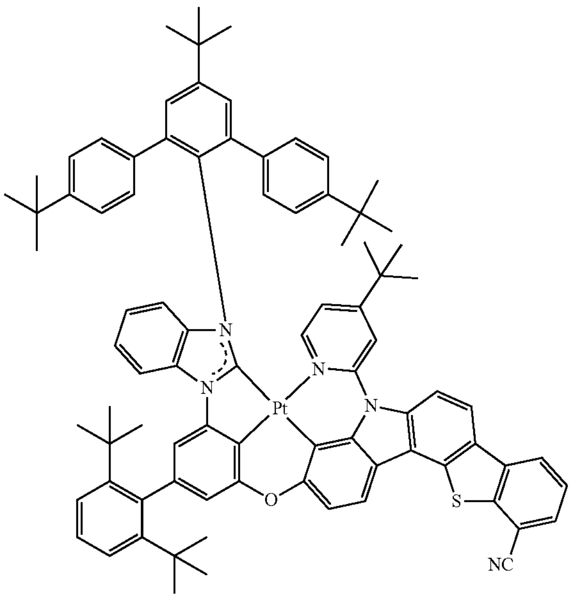
PtS119
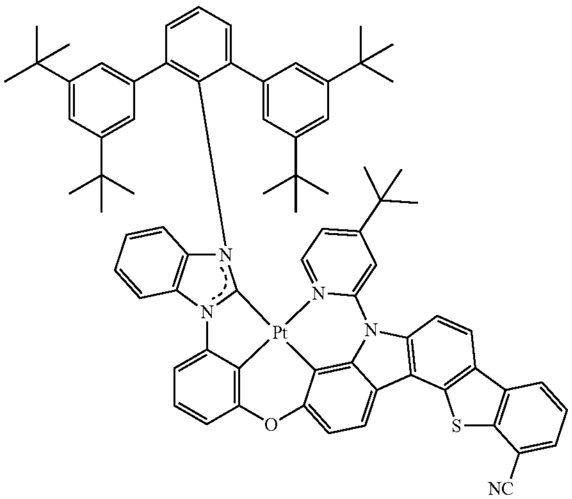
PtS120
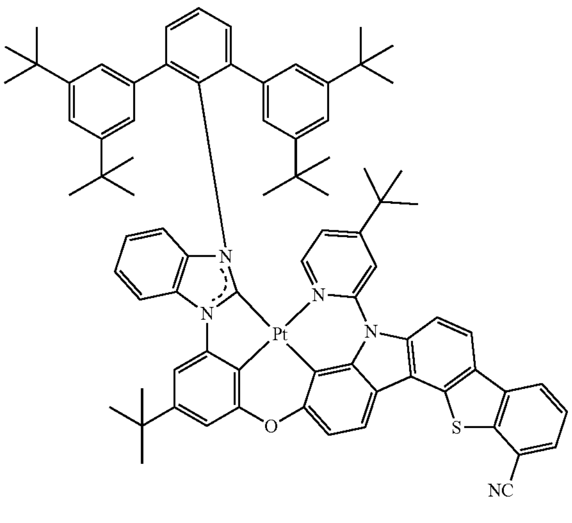
-continued
PtS121
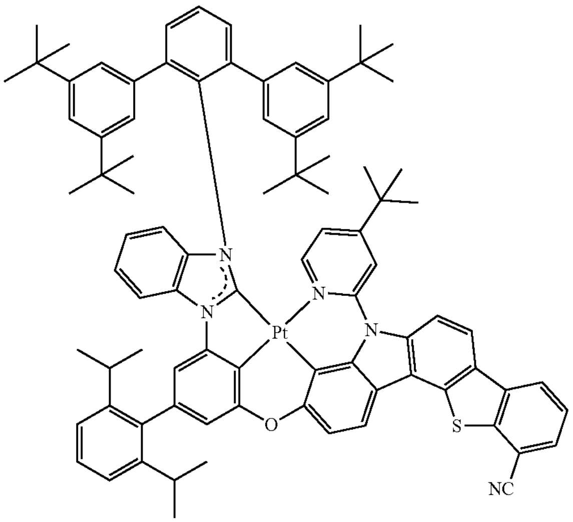
PtS122
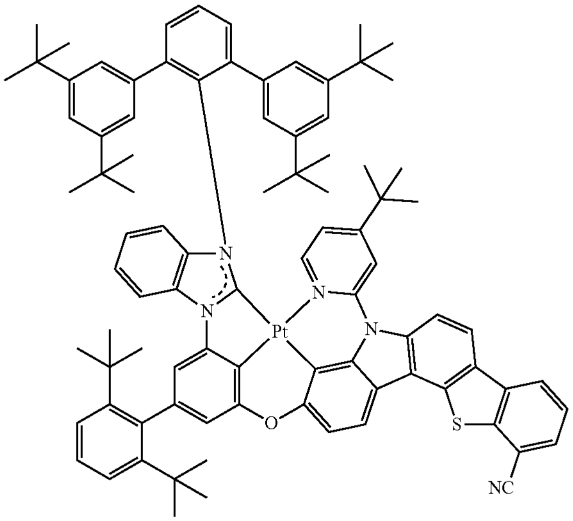

PtS123
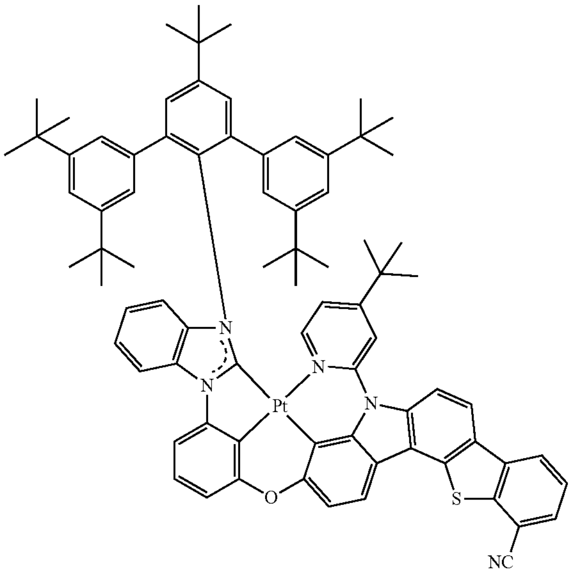
PtS124
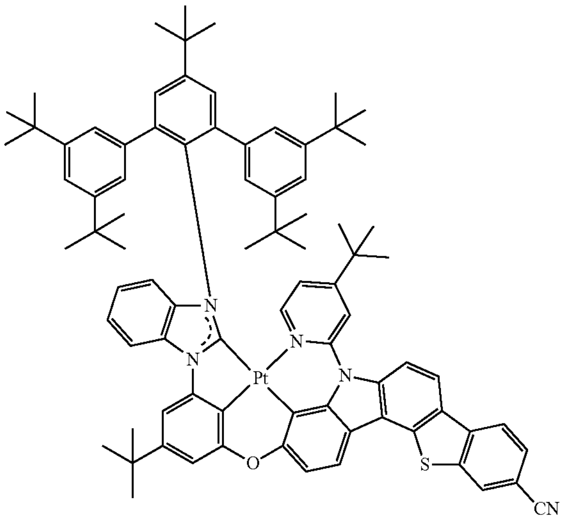
PtS125
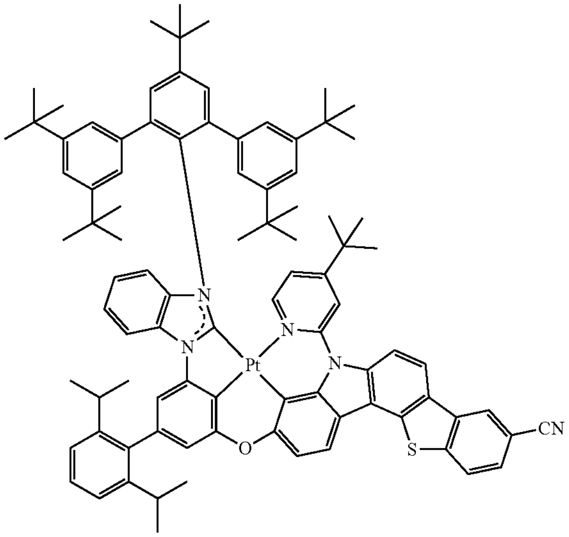
PtS126
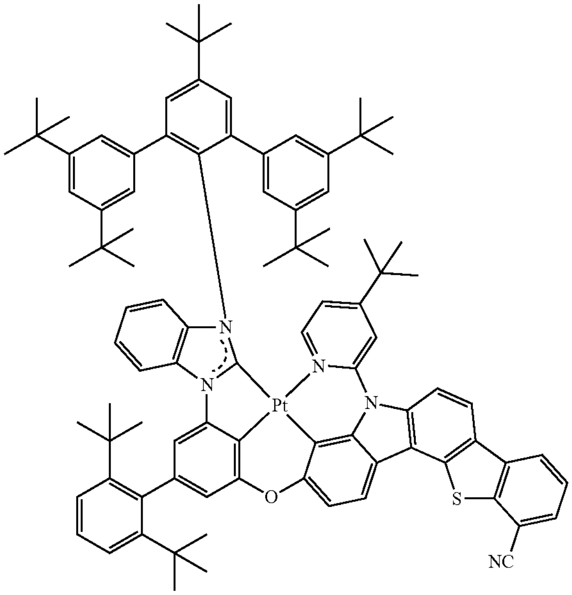

PtS127
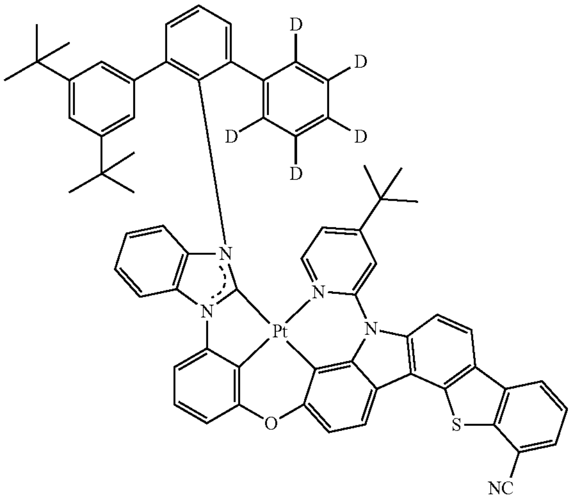
PtS128
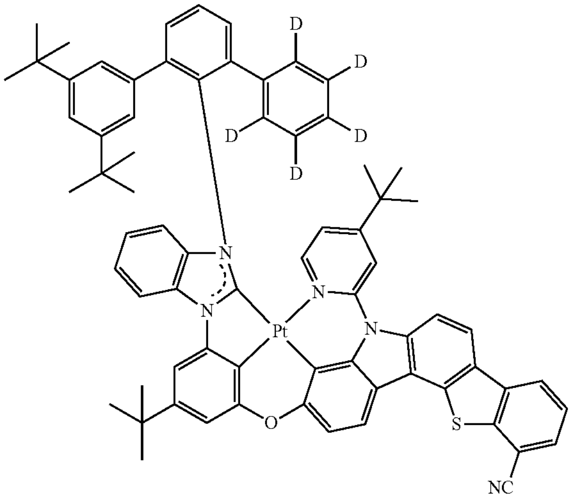
PtS129
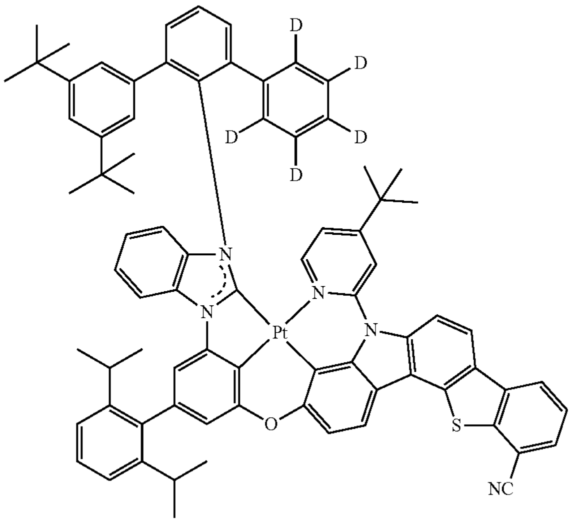
PtS130
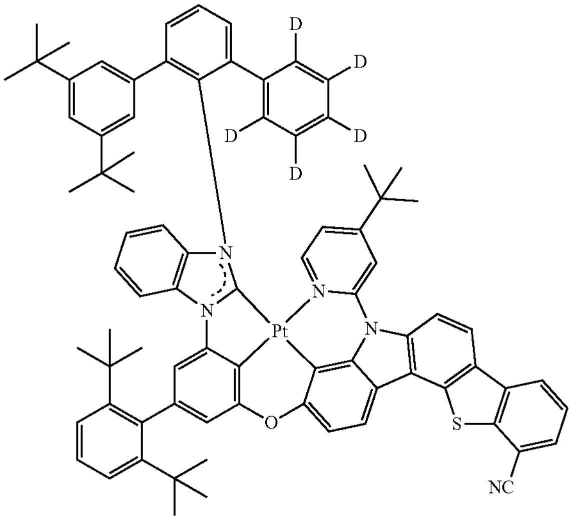
PtS131
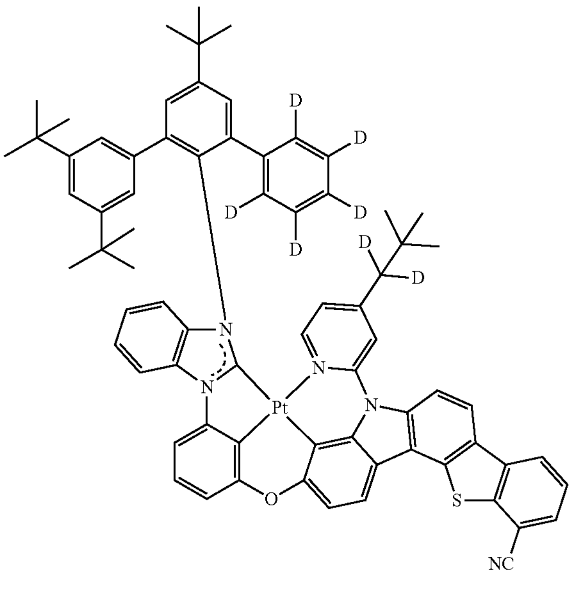

-continued
PtS132
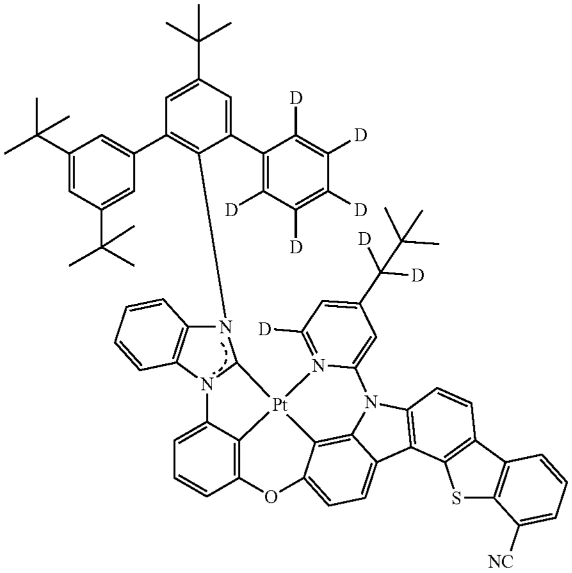
PtS133
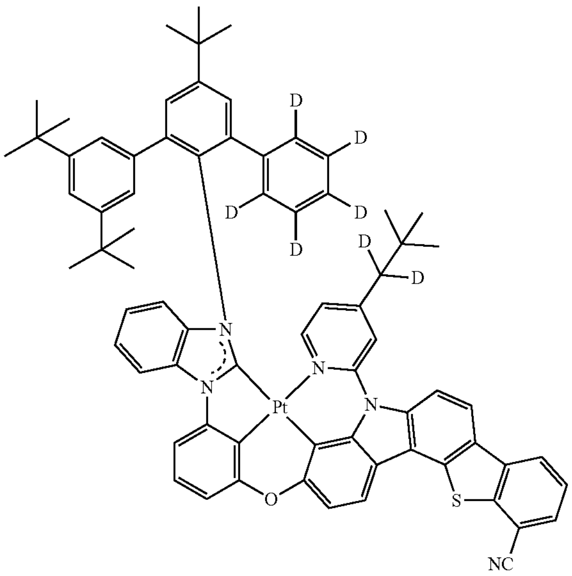
-continued
PtS134
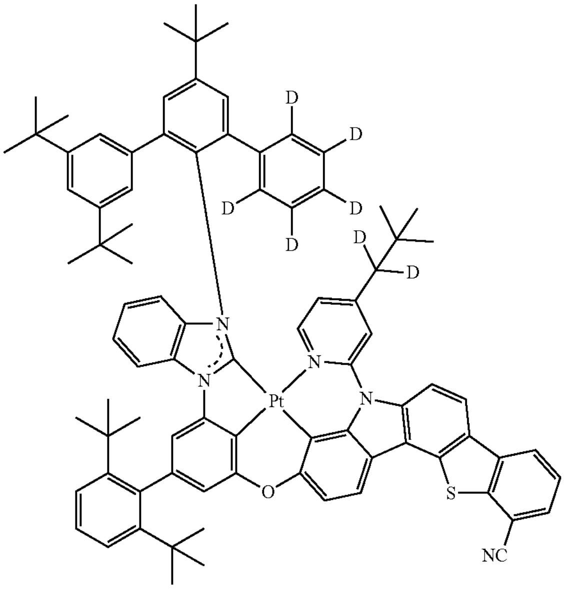
PtS135
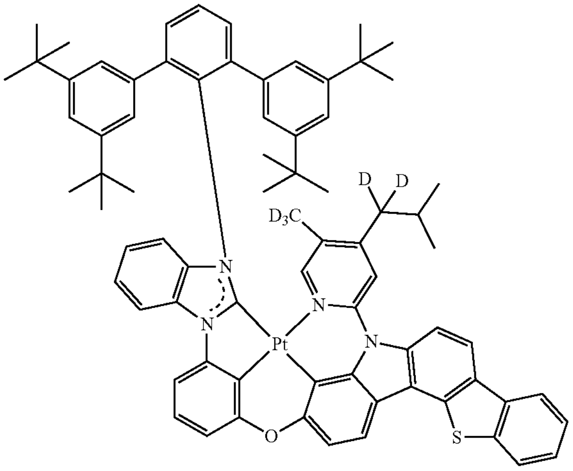
PtS136
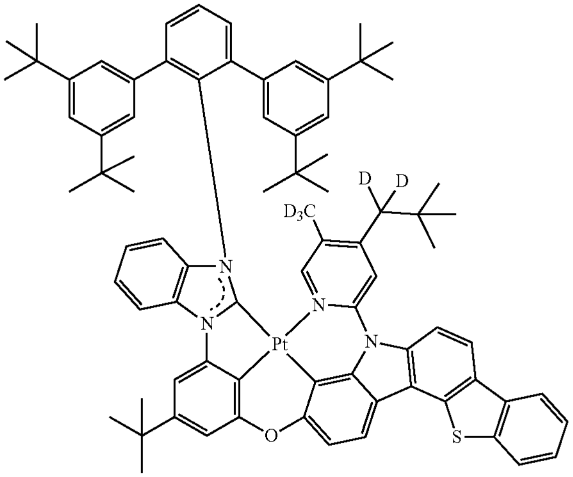

-continued
PtS137
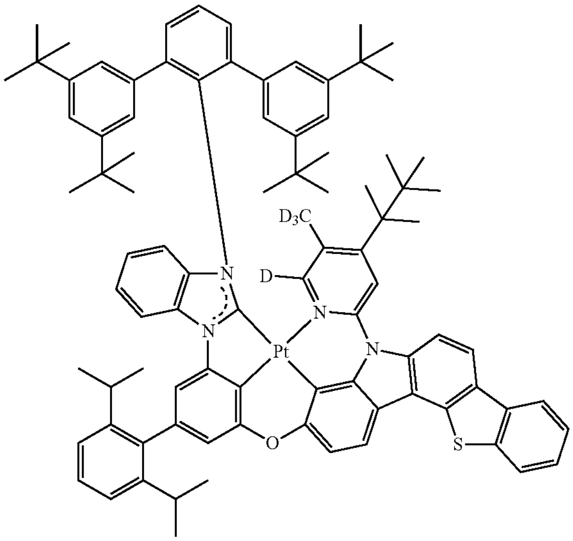
PtS138
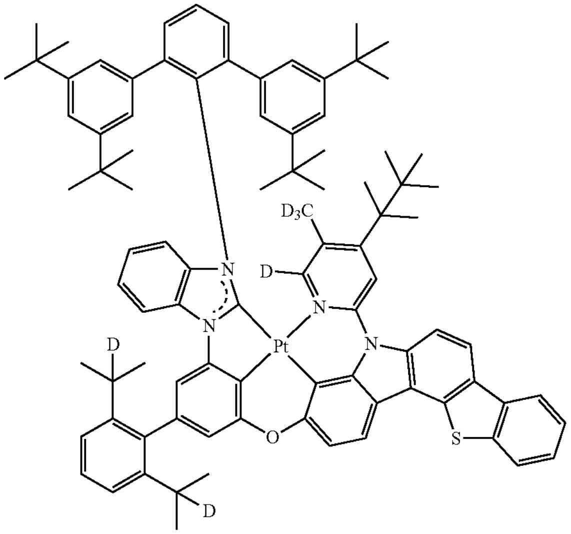
PtS139
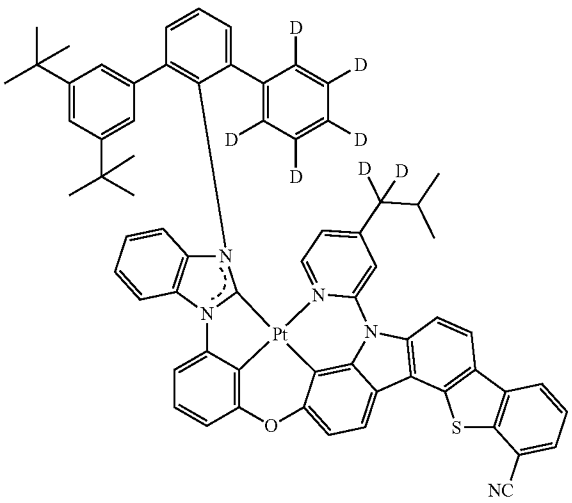
-continued
PtS140
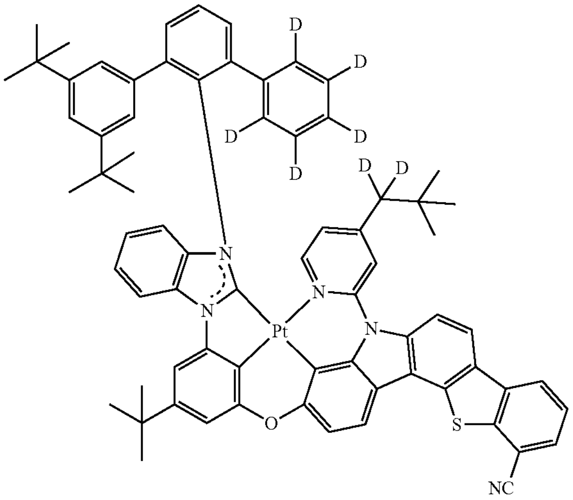
PtS141
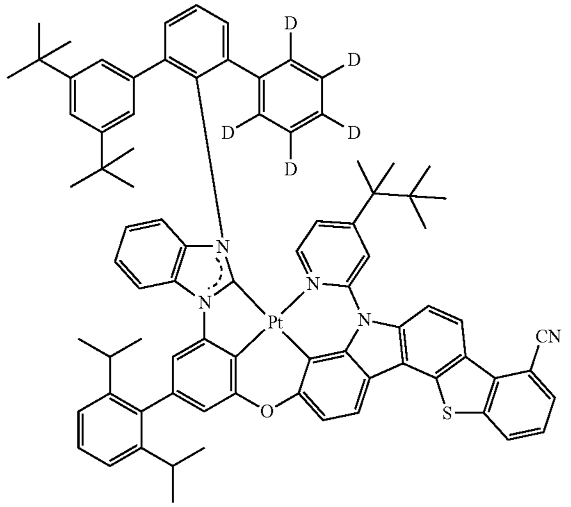
PtS142
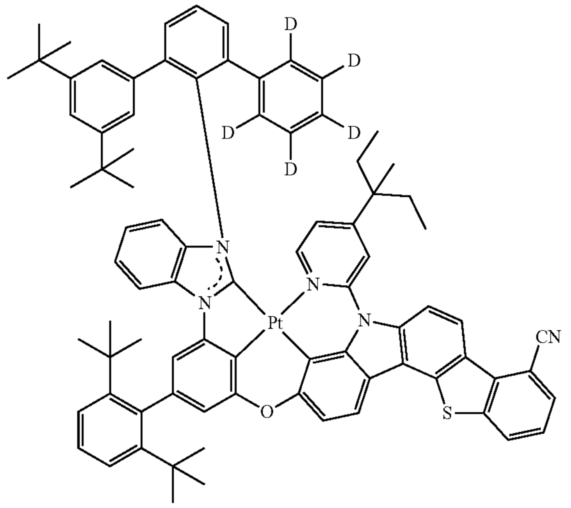

-continued
PtS143
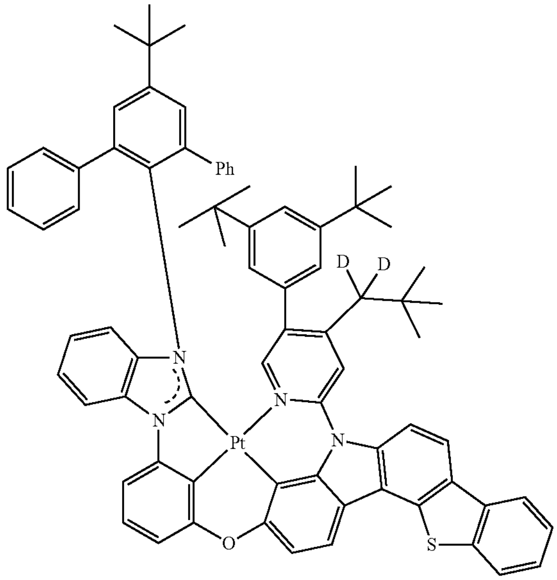
PtS145
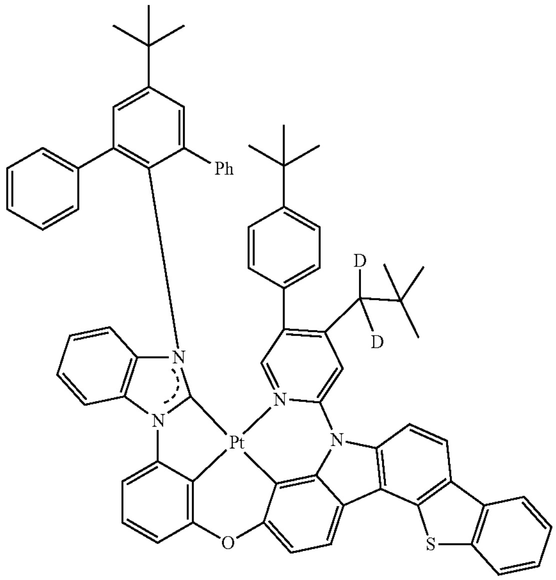
PtS144
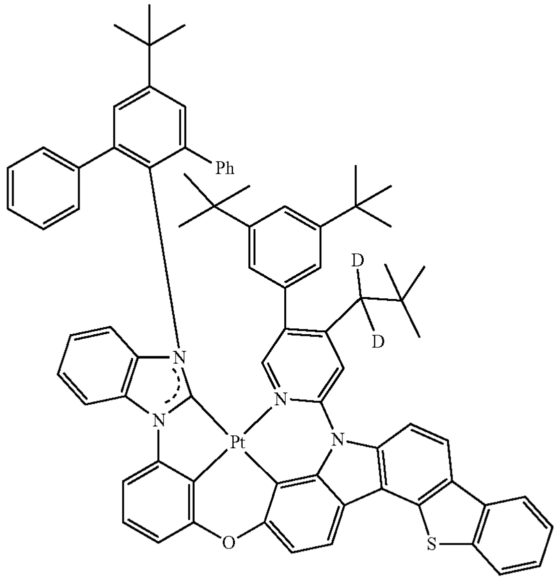
PtS146
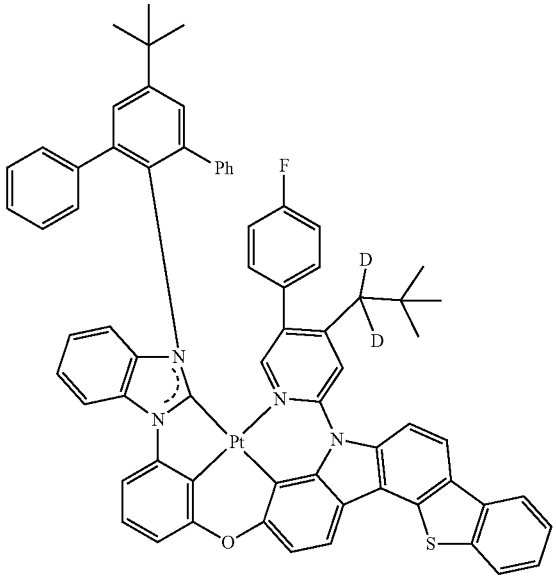

-continued
PtS147
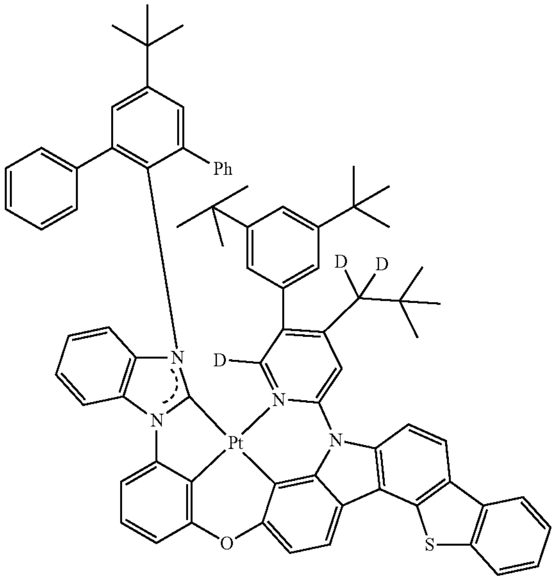
PtS148
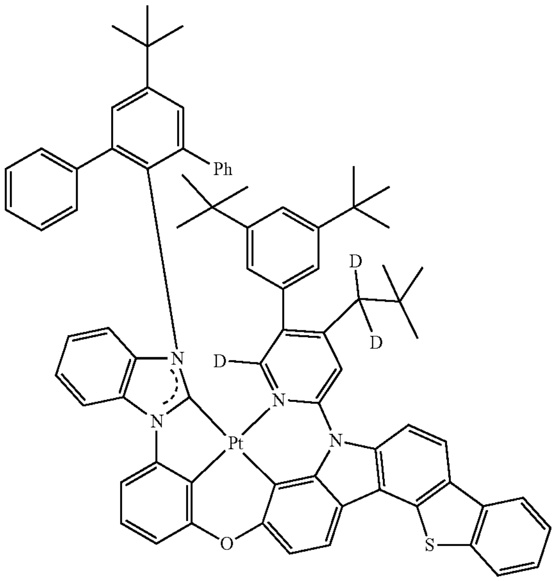
-continued
PtS149
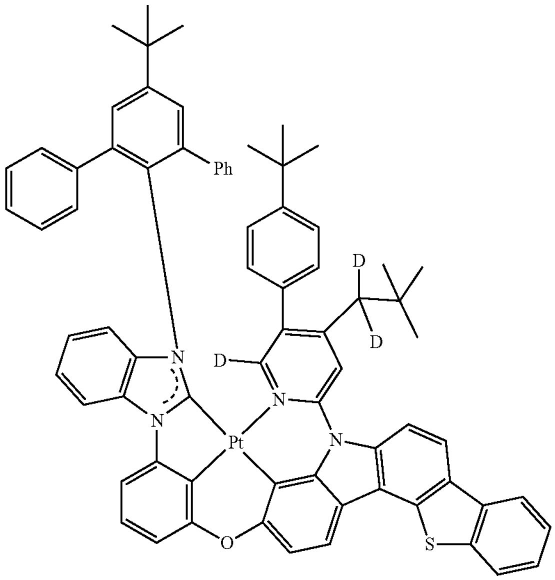
PtS150
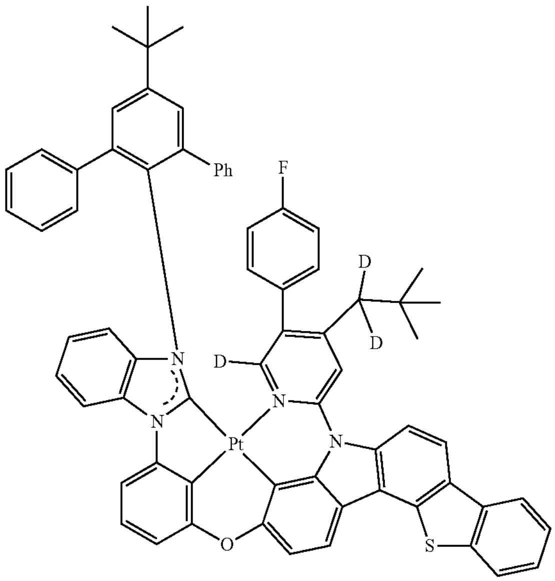

-continued
PtS151
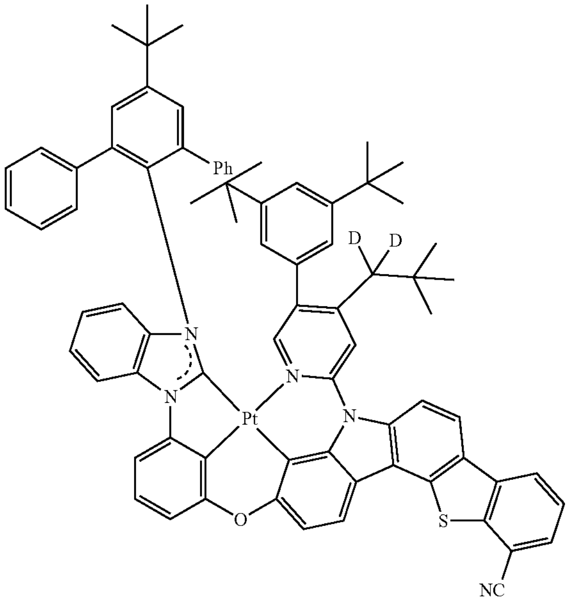
PtS153
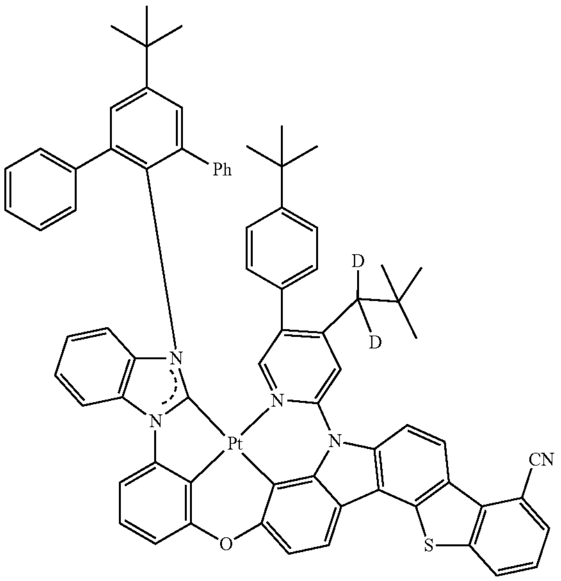
PtS152
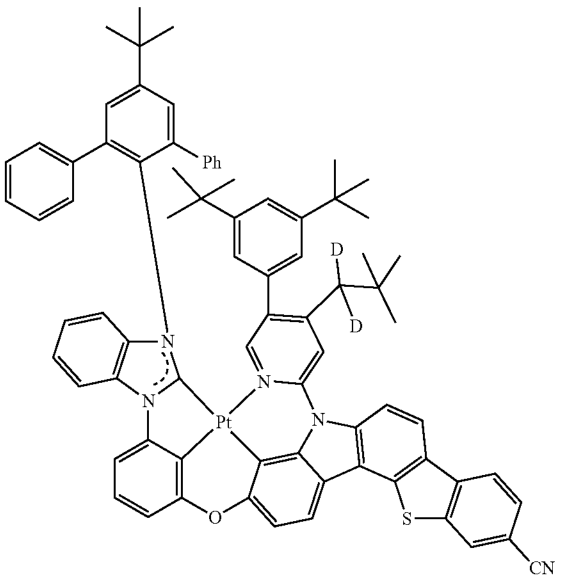
PtS154
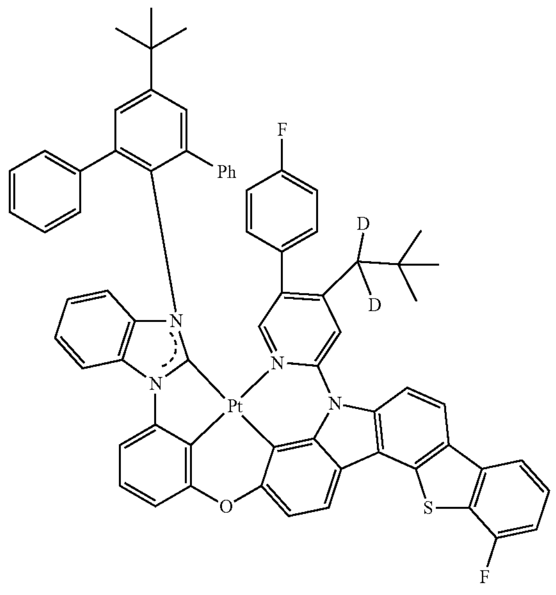

-continued

PtS155

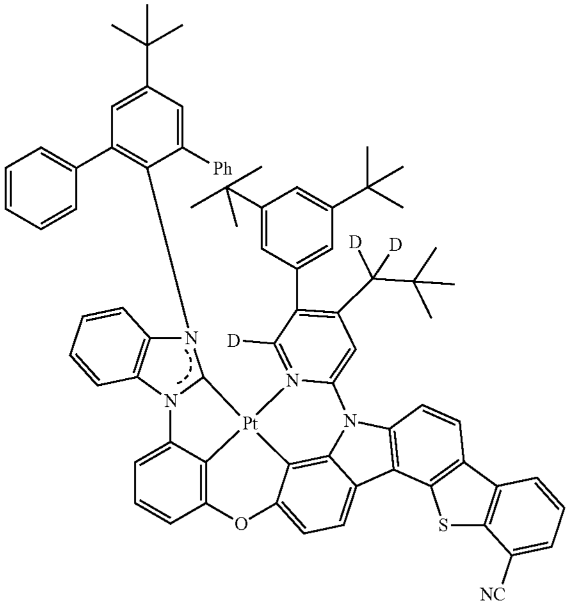

PtS156

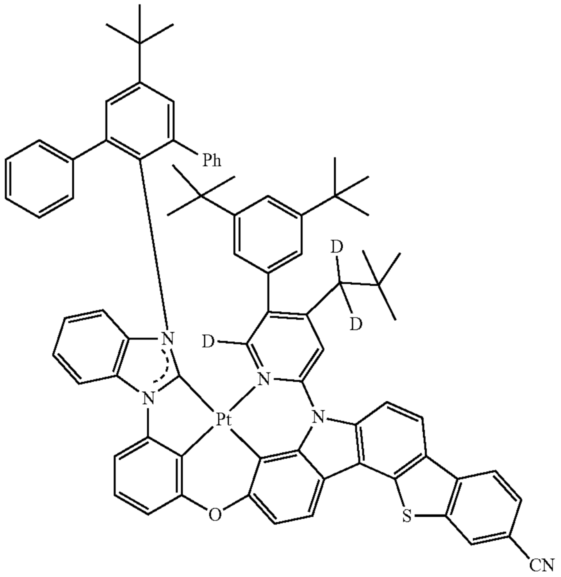

-continued

PtS157

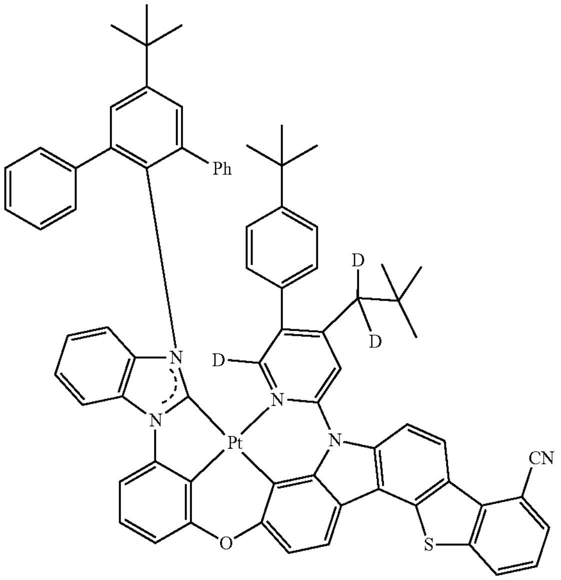

PtS158

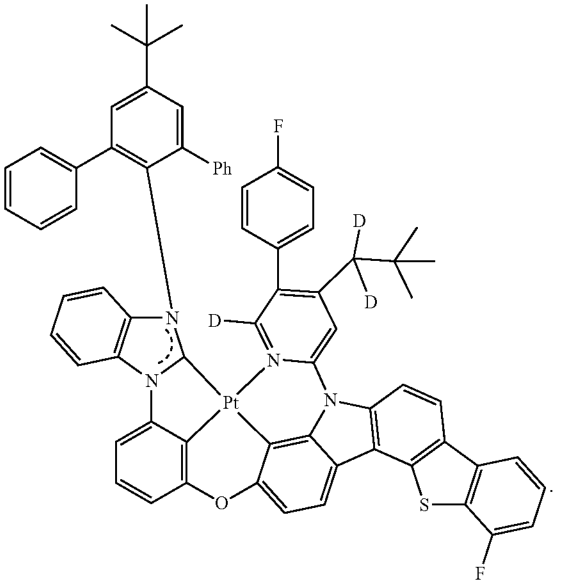

6. Use of the fused ring carbazole tetradentate metal platinum (II) complex according to claim 1 in an electronic device comprising one or more of an organic electroluminescence device, an organic integrated circuit, an organic field effect transistor, an organic thin film transistor, an organic light emitting transistor, an organic solar cell, an organic optical detector, an organic photoreceptor, an organic field quench device, a light emitting electrochemical cell, or an organic laser diode.

7. An organic electroluminescence device, comprising a cathode, an anode, and an organic functional layer therebetween; the organic functional layer comprising the fused ring carbazole tetradentate metal platinum (II) complex according to claim 1.

8. The organic electroluminescence device according to claim 7, wherein the organic functional layer comprises a light emitting layer containing the fused ring carbazole tetradentate metal platinum (II) complex according to claim 1.

9. The organic electroluminescence device according to claim 8, wherein, the light emitting layer further comprises a fluorescent doping material, and the fluorescent doping material is a boron-containing compound.

10. An organic photoelectric device, comprising: a substrate layer; a first electrode on the substrate; an organic light emitting functional layer on the first electrode; a second electrode on the organic light emitting functional layer; wherein the organic light emitting functional layer comprises the fused ring carbazole tetradentate metal platinum (II) complex according to claim 1.

11. The organic photoelectric device according to claim 10, wherein, the organic light emitting functional layer further comprises a fluorescent doping material, and the fluorescent doping material is a boron-containing compound.

12. A composition, comprising the fused ring carbazole tetradentate metal platinum (II) complex according to claim 1.

13. A formulation, comprising the fused ring carbazole tetradentate metal platinum (II) complex according to claim 1.

14. A display or lighting device, comprising one or more of the organic electroluminescence device according to claim 7.

* * * * *